US011469205B2

(12) United States Patent
Williams et al.

(10) Patent No.: US 11,469,205 B2
(45) Date of Patent: Oct. 11, 2022

(54) UNIVERSAL SURFACE-MOUNT SEMICONDUCTOR PACKAGE

(71) Applicant: Adventive Technology Ltd., Hong Kong (CN)

(72) Inventors: Richard K. Williams, Cupertino, CA (US); Keng Hung Lin, Chupei (TW)

(73) Assignee: Adventive International Ltd., Hong Kong (CN)

( * ) Notice: Subject to any disclaimer, the term of this patent is extended or adjusted under 35 U.S.C. 154(b) by 159 days.

(21) Appl. No.: 16/841,651

(22) Filed: Apr. 6, 2020

(65) Prior Publication Data

US 2020/0273838 A1 Aug. 27, 2020

Related U.S. Application Data

(63) Continuation-in-part of application No. 16/041,765, filed on Jul. 21, 2018, now Pat. No. 10,615,146, (Continued)

(51) Int. Cl.
*H01L 21/56* (2006.01)
*H01L 23/00* (2006.01)
(Continued)

(52) U.S. Cl.
CPC ............ *H01L 24/96* (2013.01); *H01L 21/268* (2013.01); *H01L 21/31058* (2013.01); *H01L 21/4825* (2013.01); *H01L 21/4828* (2013.01); *H01L 21/4842* (2013.01); *H01L 21/56* (2013.01); *H01L 21/561* (2013.01); *H01L 21/565* (2013.01); *H01L 21/78* (2013.01); *H01L 23/3107* (2013.01); *H01L 23/3114* (2013.01); *H01L 23/4952* (2013.01); *H01L 23/49513* (2013.01); *H01L 23/49551* (2013.01); *H01L 23/49555* (2013.01); *H01L 23/49562* (2013.01); *H01L 23/49568* (2013.01); *H01L 23/49582* (2013.01); *H01L 24/37* (2013.01); *H01L 24/40* (2013.01); *H01L 24/97* (2013.01); *H01L 24/06* (2013.01); *H01L 24/32* (2013.01); *H01L 24/41* (2013.01); *H01L 24/45* (2013.01); *H01L 24/49* (2013.01); *H01L 24/73* (2013.01);
(Continued)

(58) Field of Classification Search
None
See application file for complete search history.

(56) References Cited

U.S. PATENT DOCUMENTS 4,935,803 A 6/1990 Kalfus et al.
5,043,791 A 8/1991 Stokes et al.
(Continued)

FOREIGN PATENT DOCUMENTS

CN 101719759 A 6/2010
CN 102468292 A 5/2012
(Continued)

*Primary Examiner* — Daniel Whalen
(74) *Attorney, Agent, or Firm* — Patentability Associates

(57) ABSTRACT

A variety of footed and leadless semiconductor packages, with either exposed or isolated die pads, are described. Some of the packages have leads with highly coplanar feet that protrude from a plastic body, facilitating mounting the packages on printed circuit boards using wave-soldering techniques.

20 Claims, 212 Drawing Sheets

Related U.S. Application Data which is a continuation of application No. 15/415,108, filed on Jan. 25, 2017, now Pat. No. 10,032,744, which is a continuation of application No. 14/797,056, filed on Jul. 10, 2015, now Pat. No. 9,576,932, which is a continuation-in-part of application No. 14/703,359, filed on May 4, 2015, now Pat. No. 9,620,439, and a continuation-in-part of application No. 14/056,287, filed on Oct. 17, 2013, now Pat. No. 9,576,884.

(60) Provisional application No. 61/775,540, filed on Mar. 9, 2013, provisional application No. 61/775,544, filed on Mar. 9, 2013.

(51) Int. Cl.

| | |
|---|---|
| ***H01L 21/48*** | (2006.01) |
| ***H01L 21/3105*** | (2006.01) |
| ***H01L 21/268*** | (2006.01) |
| ***H01L 21/78*** | (2006.01) |
| ***H01L 23/31*** | (2006.01) |
| ***H01L 23/495*** | (2006.01) |

(52) U.S. Cl.

CPC ...... *H01L 24/84* (2013.01); *H01L 2224/0603* (2013.01); *H01L 2224/16245* (2013.01); *H01L 2224/32245* (2013.01); *H01L 2224/37147* (2013.01); *H01L 2224/40245* (2013.01); *H01L 2224/4111* (2013.01); *H01L 2224/45124* (2013.01); *H01L 2224/45144* (2013.01); *H01L 2224/45147* (2013.01); *H01L 2224/4846* (2013.01); *H01L 2224/48091* (2013.01); *H01L 2224/48247* (2013.01); *H01L 2224/48464* (2013.01); *H01L 2224/49111* (2013.01); *H01L 2224/49171* (2013.01); *H01L 2224/73257* (2013.01); *H01L 2224/73265* (2013.01); *H01L 2224/83* (2013.01); *H01L 2224/8485* (2013.01); *H01L 2224/84801* (2013.01); *H01L 2224/85* (2013.01); *H01L 2224/92247* (2013.01); *H01L 2224/97* (2013.01); *H01L 2924/00011* (2013.01); *H01L 2924/00014* (2013.01); *H01L 2924/01005* (2013.01); *H01L 2924/01033* (2013.01); *H01L 2924/1305* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 5,332,864 | A | 7/1994 | Liang et al. | |
| 6,307,755 | B1 | 10/2001 | Williams et al. | |
| 6,891,256 | B2 * | 5/2005 | Joshi | H01L 23/49568 257/784 |
| 7,838,339 | B2 | 11/2010 | Tsui et al. | |
| 8,513,787 | B2 | 8/2013 | Williams et al. | |
| 8,575,006 | B2 | 11/2013 | Xue et al. | |
| 9,576,884 | B2 * | 2/2017 | Williams | H01L 23/49805 |
| 9,620,439 | B2 * | 4/2017 | Williams | H01L 21/4828 |
| 2007/0284720 | A1 | 12/2007 | Otremba et al. | |
| 2008/0017907 | A1 | 1/2008 | Otremba | |
| 2009/0298232 | A1 | 12/2009 | Burghout et al. | |
| 2010/0187663 | A1 | 7/2010 | Celaya et al. | |
| 2011/0115069 | A1 | 5/2011 | Teh et al. | |
| 2012/0025227 | A1 | 2/2012 | Chan et al. | |
| 2013/0043572 | A1 | 2/2013 | Williams et al. | |
| 2013/0043574 | A1 * | 2/2013 | Williams | H01L 23/49568 257/676 |
| 2014/0306330 | A1 | 10/2014 | Williams | |

FOREIGN PATENT DOCUMENTS

| | | |
|---|---|---|
| JP | 11-233683 | 8/1999 |
| JP | 2000-114426 | 4/2000 |
| WO | 2013025603 A1 | 2/2013 |

* cited by examiner

| Package Type | Package Size | Lead Pitch | Exposed Pad Size | Max Die Size | Lead Width | Inner Lead Length | Outer Lead Length |
|---|---|---|---|---|---|---|---|
| STQFN Package | 3x3mm-12L | 0.65mm | 1.70x1.70mm | 1.65x1.65mm | 0.30mm | 0.40mm | No |
| Footed Package | 3x3mm-12L | 0.65mm | 1.45x1.45mm | **1.40x1.40mm** | 0.30mm | 0.275mm | 0.125mm |

| Package Type | Package Size | Lead Pitch | Exposed Pad Size | Max. Die Size | Lead Width | Inner Lead Length | Outer Lead Length |
|---|---|---|---|---|---|---|---|
| QFN Package | 4x4mm-16L | 0.80mm | 2.70x2.70mm | 2.65x2.65mm | 0.30mm | 0.40mm | No |
| Footed Package | 4x4mm-16L | 0.80mm | 2.45x2.45mm | **2.40x2.40mm** | 0.30mm | 0.275mm | 0.125mm |

| Package Type | Package Size | Lead Pitch | Exposed Pad Size | Max Die Size | Lead Width | Outer Lead Length | Soldered Lead Length |
|---|---|---|---|---|---|---|---|
| Punch QFN Package | QFN4x4-24L | 0.500mm | 2.100x2.100mm | 2.145x2.145mm | 0.230mm | 0.40mm | NA |
| Footed Package | QFN4x4-24L | 0.500mm | 2.450x2.450mm | **2.400x2.400mm** | 0.230mm | 0.275mm | 0.125mm |

| Package | Saw Type 4x4 QFN | 4x4 QFF (Footed QFN) | Punch Type 4x4 QFN |
|---|---|---|---|
| PCB Landing | 4x4 QFN PCB Design | | |
| Perspective View | 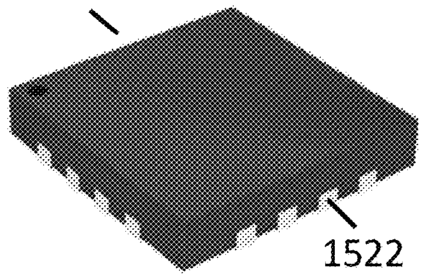  | 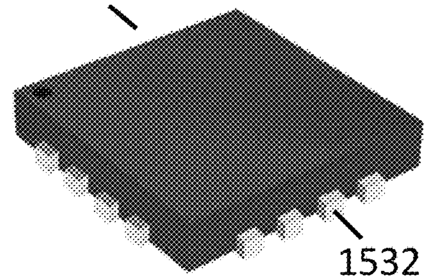  | 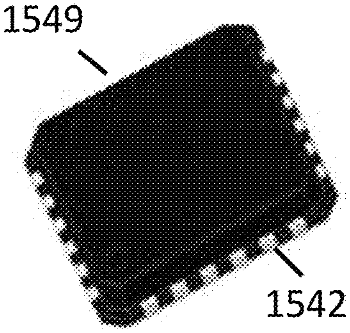  |
| Process | Conv. Leadless or USMP | USMP (Universal) | Conventional Leadless |
| Mold | Block Mold | Block Mold | Block Mold |
| Leadframe | Matrix | Matrix | Matrix |
| Singulation | Saw or USMP Singulation | USMP (Laser) | Punch Singulation |
| PCB Assembly | Reflow Only | Reflow or Wave Solder | Reflow Only |
| PCB Area Eff. | 38 % | 31 % | 25% |
| Die Area Ratio | 0.82 | 1.00 | 1.25 |

Figure 49D

| Package Type | Package Size | Lead Pitch | Exposed Pad Size | Max. Die Size | Lead Width | Inner Lead Length | Outer Lead Length |
|---|---|---|---|---|---|---|---|
| TDFN Package | 5x6mm-8L | 1.27mm | 4.40x4.60mm | 4.35x4.55mm | 0.30mm | 0.40mm | NA |
| Footed Package | 5x6mm-8L | 1.27mm | 4.40x4.35mm | **4.35x4.30mm** | 0.30mm | 0.275mm | 0.125mm |

| Package Type | Package Size | Lead Pitch | Exposed Pad Size | Max. Die Size | Lead Width | Outer Lead Length | Soldered Lead Length |
|---|---|---|---|---|---|---|---|
| TO Package | TO-252 2L | 2.30mm | 5.51x5.33mm | 3.05x4.98mm | 0.60mm | 2.70mm | 1.60mm |
| Footed Package | TO-252 2L | 2.30mm | 5.51x5.33mm | **4.05x4.98mm** | 0.60mm | 1.60mm | 1.60mm |

| Package Type | Package Size | Lead Pitch | Exposed Pad Size | Max. Die Size | Lead Width | Outer Lead Length | Soldered Lead Length |
|---|---|---|---|---|---|---|---|
| TO Package | TO-252 2L | 2.30mm | 5.51x5.33mm | 3.05x4.98mm | 0.60mm | 2.70mm | 1.60mm |
| Footed Package | TO-252 2L | 2.30mm | 5.51x5.33mm | **5.29x4.98mm** | 0.60mm | 0.250mm | 1.60mm |

| Package | TO-252 2L (DPAK) | Footed DPAK (Design A) | Footed DPAK (Design B) |
|---|---|---|---|
| PCB Landing | TO-2522L PCB Design | | |
| Perspective View |  |  |  |
| Process | Conventional TO-252 | USMP (Universal) | USMP (Universal) |
| Singulation | Saw Singulation | USMP (Laser) | USMP (Laser) |
| Mold | Discrete Packages | Block Mold | Block Mold |
| Leadframe | Strip | Matrix (Array) | Matrix (Array) |
| PCB Area Eff. | 23 % | 31 % | 40 % |
| Die Area Ratio | 1.00 | 1.33 | 1.74 |

| Package Type | Package Size | Lead Pitch | Mold Body Size | Max. Die Size | Lead Width | Outer Lead Length | Soldered Lead Length |
|---|---|---|---|---|---|---|---|
| SOT Package | SOT-23 | 0.950mm | 1.600x2.920mm | 0.765x1.706mm | 0.40mm | 0.600mm | 0.200mm |
| Footed Package | SOT-23 | 0.950mm | 2.200x2.920mm | **1.365x1.706mm** | 0.40mm | 0.300mm | 0.300mm |

| Package | SOT-23 (DPAK) | Footed SOT-23 |
|---|---|---|
| PCB Landing | SOT-23 PCB Design | |
| Perspective View | 1609  | 1619  |
| Process | Conventional SOT-23 | USMP (Universal) |
| Singulation | Saw Singulation | USMP (Laser) |
| Mold | Discrete Packages | Block Mold |
| Leadframe | Strip | Matrix (Array) |
| PCB Area Eff. | 13 % | 24% |
| Die Area Ratio | 1.00 | 1.78 |

| Package Type | Package Size | Lead Pitch | Mold Body Size | Max Die Size | Lead Width | Outer Lead Length | Soldered Lead Length |
|---|---|---|---|---|---|---|---|
| TSSOP Package | TSSOP-8L | 0.650mm | 4.400x3.000mm | 2.800x2.000mm | 0.220mm | 1.000mm | 0.600mm |
| Footed Package | TSSOP-8L | 0.650mm | 5.200x3.000mm | 3.800x2.200mm | 0.220mm | 0.600mm | 0.600mm |

| Package Type | Package Size | Lead Pitch | Mold Body Size | Max. Die Size | Lead Width | Outer Lead Length | Soldered Lead Length |
|---|---|---|---|---|---|---|---|
| TSSOP Package | TSSOP-8L | 0.650 mm | 4.400x3.000 mm | 2.800x2.000 mm | 0.220 mm | 1.000 mm | 0.600 mm |
| Footed Package | TSSOP-8L | 0.650 mm | 5.900x3.000 mm | **4.300x2.200 mm** | 0.220 mm | 0.250 mm | 0.600 mm |

| Package | TSSOP-8L | Footed TSSOP-8L (Design A) | Footed TSSOP-8L (Design B) |
|---|---|---|---|
| PCB Landing | TSSOP-8L PCB Design | | |
| Perspective View | 1640  | 1650A  | 1650B  |
| Process | Conventional TSSOP | USMP (Universal) | USMP (Universal) |
| Singulation | Saw Singulation | USMP (Laser) | USMP (Laser) |
| Mold | Discrete Packages | Block Mold | Block Mold |
| Leadframe | Strip | Matrix (Array) | Matrix (Array) |
| PCB Area Eff. | 27 % | 40 % | 45 % |
| Die Area Ratio | 1.00 | 1.49 | 1.69 |

| Package Type | Package Size | Lead Pitch | Mold Body Size | Max. Die Size | Lead Width | Outer Lead Length | Soldered Lead Length |
|---|---|---|---|---|---|---|---|
| SOP Package | SOP-8L | 1.270mm | 3.912x4.902 mm | 2.213x3.102 mm | 0.406 mm | 1.050 mm | 0.660 mm |
| Footed Package | SOP-8L | 1.270mm | 4.692x4.902 mm | **3.285x4.102 mm** | 0.406 mm | 0.660 mm | 0.660 mm |

| Package Type | Package Size | Lead Pitch | Mold Body Size | Max. Die Size | Lead Width | Outer Lead Length | Soldered Lead Length |
|---|---|---|---|---|---|---|---|
| SOP Package | SOP-8L | 1.270 mm | 3.912x4.902 mm | 2.213x3.102 mm | 0.406 mm | 1.050 mm | 0.660 mm |
| Footed Package | SOP-8L | 1.270 mm | 5.512x4.902 mm | **3.792x4.102 mm** | 0.406 mm | 0.250 mm | 0.660 mm |

| Package | SOP-8L | Footed SOP8 (Design A) | Footed SOP8 (Design B) |
|---|---|---|---|
| PCB Landing | SOP-8L PCB Design | | |
| Perspective View | 1650  | 1670A  | 1670B  |
| Process | Conventional SOP | USMP (Universal) | USMP (Universal) |
| Singulation | Saw Singulation | USMP (Laser) | USMP (Laser) |
| Mold | Discrete Packages | Block Mold | Block Mold |
| Leadframe | Strip | Matrix (Array) | Matrix (Array) |
| PCB Area Eff. | 31 % | 40 % | 47 % |
| Die Area Ratio | 1.00 | 1.96 | 2.27 |

| Package Type | Package Size | Lead Pitch | Mold Body Size | Max. Die Size | Lead Width | Outer Lead Length | Soldered Lead Length |
|---|---|---|---|---|---|---|---|
| LQFP Package | LQFP7x7-32L | 0.800 mm | 7.000x7.000 mm | 3.560x3.560 mm | 0.350 mm | 1.000 mm | 0.600 mm |
| Footed Package | LQFP7x7-32L | 0.800 mm | 7.800x7.800 mm | **6.350x6.350 mm** | 0.350 mm | 0.600 mm | 0.600 mm |

| Package Type | Package Size | Lead Pitch | Mold Body Size | Max. Die Size | Lead Width | Outer Lead Length | Soldered Lead Length |
|---|---|---|---|---|---|---|---|
| LQFP Package | LQFP7x7-32L | 0.800 mm | 7.000x7.000 mm | 4.950x4.950 mm | 0.350mm | 1.000 mm | 0.600mm |
| Footed Package | LQFP7x7-32L | 0.800 mm | 8.500x8.500 mm | **6.750x6.750 mm** | 0.350mm | 0.250 mm | 0.600mm |

| Package | LQFP7x7-32L (Design A) | LQFP7x7-32L (Design B) | QFF7x7-32L (Design A) | QFF7x7-32L (Design B) |
|---|---|---|---|---|
| PCB Landing | LQFP PCB Design | | | |
| Leadframe Design | 1700A  | 1700B  | 1719A  | 1719B  |
| Process | LQFO Process | | USMP (Universal) | |
| Singulation | Saw Singulation | | USMP (Laser) | |
| Mold | Discrete Packages | | Block Mold | |
| Leadframe | Strip or Matrix | | Matrix (Array) | |
| PCB Area Eff. | 18 % | 23 % | 38 % | 43 % |
| Die Area Ratio | 0.52 | 1.00 | 1.65 | 1.86 |

UNIVERSAL SURFACE-MOUNT SEMICONDUCTOR PACKAGE

CROSS-REFERENCE TO RELATED APPLICATIONS

This application is a continuation of application Ser. No. 15/415,108, filed Jan. 25, 2017, now U.S. Pat. No. 10,032,744, issued Jul. 24, 2018, which is a continuation of application Ser. No. 14/797,056, filed Jul. 10, 2015, now U.S. Pat. No. 9,576,932, issued Feb. 21, 2017. Application Ser. No. 14/797,056 is a continuation-in-part of application Ser. No. 14/056,287, filed Oct. 17, 2013, now U.S. Pat. No. 9,576,884, issued Feb. 21, 2017, and a continuation-in-part of application Ser. No. 14/703,359, filed May 4, 2015, now U.S. Pat. No. 9,620,439, issued Apr. 11, 2017. Application Ser. No. 14/056,287 claims the priority of Provisional Applications Nos. 61/775,540 and 61/775,544, both filed Mar. 9, 2013. Each of the foregoing applications is incorporated herein by reference in its entirety.

FIELD OF THE INVENTION

This invention relates to semiconductor packaging including methods and apparatus designed to fabricate and use surface mount packages in printed circuit board assembly.

BACKGROUND OF THE INVENTION

Semiconductor devices and ICs are generally contained in semiconductor packages comprising a protective coating or encapsulant to prevent damage during handling and assembly of the components during shipping and when mounting the components on printed circuit boards. For cost reasons, the encapsulant is preferably made of plastic. In a liquid state, the plastic "mold compound" is injected into a mold chamber at an elevated temperature surrounding the device and its interconnections before cooling and curing into a solid plastic. Such packages are commonly referred to as injection molded using a method known as "transfer molding".

Interconnection to the device is performed through a metallic leadframe, generally of copper, conducting electrical current and heat from the semiconductor device or "die" into the printed circuit board and its surroundings. Connections between the die and the leadframe generally comprise conductive or insulating epoxy to mount the die onto the leadframe's "die pad", and metallic bond wires, typically gold, copper, or aluminum, to connect the die's surface connections to the leadframe. Alternatively, solder balls, gold bumps, or copper pillars may be used to attach the topside connections of die directly onto the leadframe.

While the metallic leadframe acts as an electrical and thermal conductor in the finished product, during manufacturing the leadframe temporarily holds the device elements together until the plastic hardens. After plastic curing, the packaged die is separated or "singulated" from other packages also formed on the same leadframe by mechanical sawing or by mechanical punching. The saw or punch cuts through the metal leadframe and in some instances through the hardened plastic too.

In "leaded" semiconductor packages, i.e. packages where the metallic leads or "pins" protrude beyond the plastic, the leads are then bent using mechanical forming to set them into their final shape. In other instances the metallic contacts to the semiconductor occur through conductors only accessible on the underside of the package. Such devices are known as "leadless" packages. Regardless of leaded or leadless construction, after manufacturing, finished devices are packed into tape and reels ready for assembly onto customers' printed circuit boards (PCBs).

Leaded Packages

One example of a conventional leaded package is shown in cross section in FIG. 1A, where a metallic leadframe, typically of copper, comprises at least two conductors 1A and 1B electrically isolated from one another and held together by molded plastic 6. Conductor 1A, the die pad, has semiconductor die 4 mounted on it and attached mechanically and electrically by die attach layer 10 typically comprising epoxy, conductive epoxy, or solder. Die pad comprising conductor 1A then extends outside of molded plastic 6 into a conductive lead mechanically bent to form bent portion 2A and flat portion 3A. Solder 8A, covering flat portion 3A and electrically connecting conductor 1A and semiconductor die 4 to PCB conductive trace 7A formed in PCB 9.

The surface of semiconductor die 4 includes one or more exposed metallized areas for electrical connections (not shown), electrically connected by bond wire 5 and possibly others (not shown), comprising gold, copper, aluminum or conductive metallic alloys. In this example, bond wire 5 connects a portion of semiconductor die 4 to conductor 1B. Conductor 1B extends laterally outside of molded plastic 6 and through bent portion 2B and flat portion 3B onto conductive trace 7B in PCB 9. Solder 8B electrically and mechanically connects flat portion 3B of conductor 1B to PCB conductive trace 7B.

Manufacturing of the device involves mechanically bending leads to form bent portions 2A and 2B such that the bottom of flat portions 3A and 3B are coplanar for mounting on a flat surface, i.e. PCB 9. Packages with bent leads on two or more package edges are commonly referred to as "gull wing" packages owing to their curved lead shape. Unfortunately, mechanical processes are imperfect and subject to unavoidable variability. Attempts to scale gull wing packages to thin dimensions, i.e. to manufacture low profile gull wing packages, fail below 1 mm heights because the mechanical variability becomes and intolerable percentage of the total package height. As such, gull wing packages are not able to serve the market for thin products and such packages have been completely eliminated from cell phone and tablet designs. Other products where gull wing packages persist because of their relatively low cost are, however, unable to be miniaturized in part because of the minimum height restrictions of gull wing packages.

Aside from issues with scaling gull wing packages to below 0.8 mm for low profile applications, such IC packages do not normally include a thick exposed die pad to act as a heat sink and without special design modifications are therefore unable to dissipate any significant power or spread heat effectively. Despite its limitation in profile height, poor lead coplanarity, and lack of heat sinking, one advantage of gull wing packages is their compatibility with low-cost "wave-solder" PCB assembly methods. Wave-solder based PCB manufacturing is significantly easier and cheaper than reflow assembly used in high tech PCB factories for cell phones and tablets, offering a cost advantage per PCB area of 2× to 4× over reflow assembly. In consumer electronics large PCBs such as those used in HDTV backlighting, the PCB cost per board area is a dominant economic consideration overriding concerns or the limitations in lead coplanarity, package height, and power dissipation suffered by gull wing packages.

Gull wing type packages include small outline or “SO” packages such as the eight-lead SOPS, the sixteen-lead SOP16, etc.; the three pin small outline transistor or “SOT” package such as the SOT23; the thin small outline package or TSOP package such as the six-lead TSOP6; the thin super small outline package such as the sixteen lead TSSOP16, the quad leaded flat pack such as the 24-lead QFP24, and the low-profile quad leaded flat pack such as the 28 lead LQFP. The term “low-profile” is historic as compared to other gull wing packages of the day and still requires at least a 2 mm minimum height, i.e. not low profile by today’s standards for low-profile meaning package heights ranging from 0.4 mm to 0.8 mm.

FIG. 1B illustrates the cross section of another type of surface mount package unable to scale to thin dimensions. The package, known as the transistor outline or “TO” type package, is used for power packages needed for dissipating and spreading heat from a power semiconductor device or voltage regulator into a printed circuit board. Popular TO packages include the leaded TO-220 for through hole mounting and its surface mount versions, the TO-252 also known as the DPAK, and the TO-263 or D2PAK. Such power packages rely on die pad 1C with an exposed back side as a heatsink in order to achieve heat spreading, improve package power dissipation, and lower the package’s thermal resistance. Also known as a heat slug, die pad 1C may include an additional heat tab 1D extending laterally from die pad 1C beyond molded plastic 6. Power semiconductor die 4 is attached to die pad 1C using die attach 10 which generally comprises conductive epoxy or solder.

Unlike the previously illustrated integrated circuit package, in power applications both current and heat are conducted out of the package from the bottom of semiconductor die 4. As such, the backside of semiconductor die 4 generally includes a backside metal such as a tri-metal sandwich of titanium, nickel and silver or gold to form a solderable backside. The tri-metal sandwich is deposited on the backside of the die during wafer fabrication after mechanical and chemical thinning and roughening of the substrate. The roughening is required both for good adherence as well as to insure good ohmic contact, i.e. low contact resistance, between the metal and the semiconductor.

As in the IC package shown in FIG. 1B, the surface of semiconductor die 4 includes one or more exposed metallized areas for electrical connections (not shown), connected electrically to conductive lead 1B by bond wire 5 and possibly others (not shown), comprising gold, copper, aluminum or conductive metallic alloys. In this example, bond wire 5 connects a portion of semiconductor die 4 to conductor 1B. Conductor 1B extends laterally outside of molded plastic 6 and through bent portion 2B and flat portion 3B onto conductive trace 7B in PCB 9. Solder 8B electrically and mechanically connects flat portion 3B of conductor 1B to PCB conductive trace 7B. Manufacturing of the device involves mechanically bending leads to form bent portion 2B and others (not shown) such that the bottom of flat portion 3B is coplanar with the exposed bottom surface of die pad 1C for mounting on a flat surface, i.e. PCB 9. Unfortunately, mechanical processes are imperfect and subject to unavoidable variability, leading to mismatches between the bottom of flat portion 3B and die pad 1C.

In PCB 9 board assembly, solder 8B, typically formed by wave-soldering easily covers package lead flat portion 3B but as shown by solder 8A is unable to cover heat tab 1D. As a result, a layer of additional solder 11 must be place atop PCB conductor 7A before mounting the power package, using wave-soldering. The operation of placing solder onto the PCB is generally performed one package at a time, using pick and place machines, or in low cost factories, manually, using low-cost factory workers. Aside from its poor coplanarity between the bottom of leads and the back of an exposed die pad and its inability to scale to thin package profiles, the need for manual placement of the solder under the heat tab is another disadvantage of conventional surface mount power packages.

FIG. 2 illustrates a flow chart of a process for manufacturing leaded surface mount packages. Both packages start with copper sheet 20. The width of the sheet is matched in width to the machines intended to handle and process the strip in assembly. The thickness of the copper is typically 200 µm for ICs and 500 µm for power packages. In the case of ICs, as indicated in step 21B, a one side masked etch is optionally performed to define the die pad, leads, as well as the leadframe rail and tie bars used to hold everything together during processing. In the case of power packages, as indicated in step 21A, the leadframe must be selectively thinned to distinguish the leads from the thick die pad. A second etch is then required to define the die pad, leads, as well as the leadframe rail and tie bars used to hold everything together during subsequent processing. As an alternative process, a punch can be used to define the die pad, leads and support, then a stamp can be used selectively to squeeze metal locally to thin it. This mechanical process, while faster than etching, creates several problems. First, compressed metal exhibits mechanical stress not present in etched leadframes. Stress can lead to cracking of plastic or silicon die contacting the stressed metal. As a further complication, in leads mechanically thinned by stamping, the excess metal squeezes out the sides of the thinned lead and must be removed by trimming.

In either case, after the leadframe is etched or mechanically formed, the leadframe is now ready for die attach 22 comprising either epoxy for ICs or conductive epoxy or solder for power packages. After die attach (step 22), wire bonding 23A is performed using gold or copper wire for ICs and using copper or aluminum wire for power packages. Alternatively, for power devices, after bonding the gate wire in step 23A, the clip lead is attached for the high current connection to the device’s topside in step 23B.

In step 24, leadframe specific molding 24 is performed, meaning each leadframe requires its own customized leadframe cavity design to insure the plastic is located only around specific regions containing the semiconductor, wire bonds and portions of the leadframe, but not containing the lead extensions, tie bars and leadframe rails. After the plastic is melted to form the individual packages, deflash operation in step 25 removes excess plastic using mechanical or chemical processes. Next, to enable improved solderability and prevent oxidation of the copper leadframe, the post-molded copper leadframe is plated with tin, nickel, zinc, or palladium and then chemically etched to remove any excess plating material (step 26). Lastly the leads are bent and cut in step 27, separating each packaged die and its corresponding leads from others manufactured on the same leadframe. This final step, also referred to as singulation or trim and dejunk, results in individually packaged IC or power devices ready for electrical test. The remainder of the leadframe, including tie bars, rails, etc., is then recycled to recover the copper for future use.

One major disadvantage of leaded package technology is that each package needs its own mold, commonly requiring an initial investment of over $100,000 USD. Manufacturers must consider this initial cost when performing calculations regarding their expected financial return on investment of ROI, and the TTR, i.e. the time required for recouping their investment. The unintended consequence of high initial investment is that companies become more cautious about releasing new packages into the market, new package technology and capability become commercially available at a slower pace, and consequentially innovation and advancement slow to a snail's pace. These factors explain why power packages have progressed very little over the last five decades.

Another consideration in manufacturing is affect of UPH or units per hour throughput on unit cost. Unit cost comprises material and labor costs plus the initial investment divided by the UPH. High initial investment and low UPH both adversely contribute to product cost. While UPH for molding machines is high, productivity is sacrificed every time the factory switches packages. To change from one package to another, a mold machine must be taken out of service and the mold cavity tool, the machined steel blocks that define where the plastic goes, must be manually changed. The mold machine must be reheated, and recalibrated often with some test runs to confirm that it is working well before running any production material through it. Down time for changing the mold tool can be an hour or longer, reducing the average throughput and increasing production net cost per unit. As much as possible, factory management will choose to avoid changing the mold tool during a work shift, delaying a specific customer's production for one or more shifts, or even for days to maximize factory throughput, even at the expense of customer service.

An example of a leaded surface mount package leadframe, before and after molding, is shown in FIG. 3A. Photo 30A illustrates IC leadframe 33A prior to molding including conductive leads 33A and die pad 33B. In the example shown the lead frame comprises 22 leads on each of two sides of the plastic body thereby comprising a 44 lead, also known as a 44-pin, surface mount package. After molding, as shown in photo 30B, the die pad, semiconductor die and bond-wires are encapsulated by plastic, leaving only the exterior portion of conductive leads 33B exposed. During manufacturing, every die pad is covered by its own separately molded plastic, as defined by a mold cavity tool uniquely for the specific package type. After singulation, i.e. separating the package from the leadframe, the resulting package is shown in perspective drawings 33A and 33B. The number of conductive leads may vary considerably, with dual-sided packages having from two to seven dozen leads on each side. Common dual-side packages include 3, 4, 6, 8, 12, 16, 18, 20, 24, 28, 32, 36, 40, 44 and 48 leads in total.

FIG. 3B illustrates several examples of small outline or "SO" type packages including the ubiquitous SO-8, a small outline package with 8-leads 33E shown in perspective view 31E from above and from underneath in view 32E. As shown, package 31F has 10-leads 33F, and package-31G includes 16-leads 33F. The package shown in topside view 31D includes 20-leads 33D. The underside view 32D of the same package illustrates exposed die pad 34D used to improve thermal conduction. Guaranteeing coplanarity between exposed die pad 34D and the bottom of leads 33D in manufacturing however remains problematic. Therefore most SO type packages such as the 36-lead package shown in topside view 31C and underside view 32C do not include an exposed die pad and are not intended for power applications.

Low pin count packages such as those shown in FIG. 3C are commonly used for single transistors, dual transistors, or small analog integrated circuits such as voltage regulators, provided that the component's power dissipation is limited. Such packages may include the small outline transistor or SOT23 package 31K having three leads 33K, the thin small outline package or TSOP including a 5-lead version 33H shown in topside and underside views 31H and 32H, 6-lead version 33L shown in topside view 31L, and the improved area efficiency J-lead wide-body package known as the TSOP-JW shown in topside and underside views 31J and 32J. Leads 33J bend underneath the package to accommodate a larger package body and die area than conventional gull wing packages. While the name suggests the package lead has a J shape, the process of mechanical lead bending actually produces an inverse gull wing, essentially the same as other gull wing packages except the leads are bent under the package body instead of outside.

Higher pin count packages utilize the placement of gull wing shaped leads on all four sides of a package, and are therefore referred to as leaded quad flat packs or LQFP packages. As shown in FIG. 3D topside and underside views 31M and 32M illustrate a 32-lead LQFP having 8 gull-wing leads 33M on each side of the package while topside and underside views 31N and 32N illustrate a 48-lead LQFP having 16 gull-wing leads 33N per side. Topside and underside views 310 and 320 illustrate a LQFP with gull wing leads 330 and exposed die pad 340. As in the previous SO package description, maintaining good coplanarity between the bottom of exposed die pad 340 and leads 330 is problematic since the alignment is entirely mechanical and subject to unavoidable manufacturing variability. This variability is especially severe in low profile packages so LQFP packages with exposed die pads typically have heights of 1 mm or greater.

Another class of packages comprising bent and stamped metal leadframes are those used in transistor outline or "TO" type power packages such as the aforementioned DPAK and D2PAK as shown in top perspective views 31P and 35P and top view 31Q in FIG. 3E. The conductive leads 33P and 33Q are bent into place during manufacturing ideally to be coplanar with the bottom of heat tab 36Q. Leads 33Q as shown, vary in width being slightly wider in the middle of the lead. This extra metal is left over from tie bars used to hold the leadframe together during manufacturing. The leadframe construction of view 30R shown prior to trimming and singulation illustrates the location of tie bar 37R connected to leads 33R as well as die pad 34R and heat tab 36R. While the top view appears coplanar, the actual leadframe is mechanically stamped into a multi-planar construction shown in perspective view 30S, where die pad 34S and heat tab 36S are stamped and compressed to a height below that of leads 33S and tie bar 37S.

In contrast to the traditional DPAK and D2PAK of the prior illustration, FIG. 3F illustrates various alternative packages comprising a combination of DPAK-like heat sink design with an eight lead package similar in outline to the SOPS. In top view 38A, the power device sits atop a die pad connected to four leads 40A and where bond wires 39A connect the die's top metallization to three leads used to carry high current and to another lead for the transistor's gate or input. In top view 38B, the power device sits atop a die pad connected to four leads 40B and a bond wire connects to the gate input lead but the power-carrying bond wires have been replaced with copper clips 39B. Top views 38C and 38E illustrate alternate designs for clip leads 39C and 39E. Top view 38D illustrates the use of a large number of gold or copper wires 39D to achieve a low package resistance while eliminating the need for large diameter bond wires or clips. Finally perspective view 38F illustrates an alternate clip lead design 39F where even the gate lead is connected by a copper clip. As clearly illustrated even in clip lead designs, the copper clip comprises leads that are mechanically bent in portion 41F so that the bottom of the clip lead 40F is designed to be coplanar with the back of heat tab 42F.

In manufacturing however, maintaining coplanarity remains problematic especially in low-profile package designs. The issue of coplanarity is revealed in the SEM cross sections shown in FIG. 3G, where the back of the exposed die pad and heat tab 42F should be coplanar with flat portion 40F of lead 41F after bending. Too much bending will result in the lead 41F and its flat portion 40F extending below die pad and heat tab 42F, while too little bending has the opposite effect, causing below die pad and heat tab 42F to extend below lead 41F and its flat portion 40F. As shown solder 44F wets onto the side of lead 41F but because of the thickness of lead 40F and flat portion 41F the solder is unable to cover the lead thoroughly. As such additional solder 43F must be manually positioned onto a PCB before mounting the device in order to insure solder 43F solders lead 41F and exposed die pad and heat tab 42F to board reliably. Examples of a SOP type small power packages are shown in the photographs of FIG. 3H illustrating the underside view 45G of a package with four leads 40G not connected to the die pad and one exposed die pad 42G with a connected heat tab. Underside view 45H illustrates a design where exposed die pad 42H does not connect to a heat tab but instead connects to four additional leads other than leads 40H not connected to die pad 42H.

Lastly in FIG. 3J, and number of leaded power packages such as TO220 and variants thereof are shown. While these packages are not surface mount devices in the sense that the package leads do not solder flat onto a PCB, the heat tab may be attached or surface mounted onto a heat sink for additional cooling. Top view 45J and underside view 46J illustrate one such package with two through-hole leads 40J. A similar package is shown in top perspective view 45N and underside view 46N. Top-view 45K illustrates another package with two long through-hole leads 40K and heat tab 42K. Top view 45L and underside view 46L illustrate one such package with three long through-hole leads 40L and heat tab 42L. Perspective view 45O illustrates a long lead package with seven leads 400 and heat tab 420. Top perspective views 46P and 45O reveal a package with heat tab 42P and complex lead bending resulting in leads 40P bent into two distinct rows. Mounting of packages with two rows of bent leads 40M is shown in side perspective view of power package 45M mounted on a PCB.

Leadless Packages

Another class of surface mount semiconductor package is the "leadless" or "no lead" package. Unlike leaded packages where the conductor connecting the semiconductor die to the outside world protrudes out the sides of the package's protective plastic body, in a leadless package, the conductors connected to the device or IC are available for connection to a PCB only on the underneath side of the package and not through leads protruding from the package.

Because no leads protrude from the package, leadless packages have several unique properties, some advantageous and some restrictive. Being leadless, the areal efficiency of leadless packages is significantly improved compared to leaded packages. Package area efficiency, the maximum die size divided by the external footprint, i.e. the lateral extent of the leads or plastic whichever is larger, is poor for leaded packages because a lot of space is wasted by the need to bend the lead down to the PCB surface. Package area efficiencies of 20% to 30% or worse are not uncommon for small packages like SOT and TSOP packages where significant portions of the package's area and volume are "wasted" by plastic and metal available for the semiconductor die. In contrast, leadless package can have area efficiencies in the 70% to 80% range. And because no metal extends from the sides of the leadless package, there is less risk of electrical shorts to neighboring components. As a result other components on a PCB can be put closer to a leadless package than to a leadless one, i.e. leadless packages don't require as large of keep-out zone on the PCB. The benefit of a smaller "keep-out" is a higher PCB areal efficiency, meaning it is possible to pack more semiconductor die area in the same PCB space. So leadless packages offer both better package areal efficiency and PCB areal efficiency than leaded packages.

Another benefit of leadless packages is they are intrinsically coplanar. As an artifact of its manufacturing process, the bottom of every electrical connection appearing on the underside of a leadless package are, by definition, in the same geometric plane as all the others because they constitute a common piece of copper. No lead bending is involved in forming the pins so no mechanical variability is present in forming the package's exposed conductors, also known as outer leads or "lands".

Moreover, since the die pad is formed from the same uniformly thick common copper sheet as the exposed conductors comprising the package's electrical connections or conductive lands, the bottom of the die pad is intrinsically coplanar with all the package's connections. Consequently, the die pad of a leadless package is naturally exposed on the package's underside, i.e. not isolated from the PCB, as an unavoidable artifact of its manufacturing process. If an isolated or unexposed die pad is desired, extra-steps must be incurred in the leadless package fabrication sequence to insure plastic fully encapsulates the die pad during molding.

The upper drawing in FIG. 4 illustrates the cross section of a leadframe 50 showing multiple products being manufactured concurrently. As shown, semiconductor die 54A is attached to exposed die pad 51A using either conductive or insulating epoxy. Bond wire 55A electrically connects semiconductor die 54A to conductive land 51B, and bond wire 55B electrically connects semiconductor die 54A to conductive land 51C. The entire device including the leadframe, die, and bond wires is encapsulated in molded plastic 56. In an adjacent section of leadframe 50, semiconductor die 54B is attached to exposed die pad 51D and electrically connected to landing pad 51E by bond wire 55C and other connections (shown only in part). Separate products are defined by saw lines 59, so although conductive lands 51B and 51E, and similarly conductive lands 51C and 51F actually comprise common pieces of copper, during sawing they are separated into different products.

During singulation, sawing, or optionally mechanical punching, cuts are made through both molded plastic 56 and the copper leadframe to separate one product from its neighbors and to cut away any connection to the leadframe rails or tie bars. The resulting singulated product is shown by example in the lower drawing of FIG. 4 for the product containing semiconductor die 54A. Because sawing along line 51B cuts both copper and plastic, the lateral extent of conductive land 51B and molded plastic 56 are coincident with vertical saw line 59, forming a vertical sidewall to the leadless package. Because of its manufacturing process, no lead can protrude laterally beyond the plastic giving the package its description as "leadless".

To mount a leadless package onto a printed circuit board, electrically connecting conductive lands 51C and 51B and exposed die pad 51A to PCB conductive traces 7, a layer of solder or solder paste 61 must be applied before placing the package onto the PCB. This means solder or solder paste 61 must be printed or screened onto the PCB in select places as part of PCB manufacturing. After the product is positioned on top of the solder paste, the PCB is run through a "reflow oven" or belt furnace to heat the solder paste past its melting point and electrically and mechanically connect the product's conductive lands 51C and 51B and exposed die pad 51A to the PCB conductive traces 7. Because, however, the solder paste must be screened onto the PCB in advance, and an expensive temperature regulated reflow oven or belt furnace is required, manufacturing cost for reflow PCB manufacturing can be twice to four times the cost of simple wave-soldering, where the PCB and components are simply dipped in solder. This higher PCB assembly cost represents one of the major disadvantages of leadless packaging.

The manufacturing process for leadless packages is illustrated in the flow chart shown in FIG. 5, where a copper sheet (step 60) is either etched or stamped (step 61) to define the leadframe's die pad, conductive lands, tie bars, and rails, then plated with a solderable metal (step 62) such as tin, nickel, etc. to inhibit oxidation of the copper. Once the lead frames are prepared, product manufacturing may commence comprising die attach (step 63), wire bonding (step 64), molding (step 65), sawing or punching for singulation (step 66), and deflash etching (step 67) to remove any plastic residue leftover from sawing or punching.

Unlike leaded packages, where each individual part requires its own predefined mold cavity to isolate the plastic around a single product, in leadless package manufacturing entire matrices or arrays of products are assembled and then molded into one common block of plastic. This process is illustrated pictorially in FIG. 6A where one common leadframe 70A prior to molding comprises the die pads and conductive lands for hundreds of distinct and separate products 71A on a single leadframe. The leadframe after molding 72A however contains only a few large blocks of molded plastic 73A, each block containing dozens of products to be separated by sawing or punching. As such different size products can be manufactured simply by changing the leadframe with no change required in the molding machine or mold cavity tools. This feature, the ability to make different sized products represents an important benefit of leadless package manufacturing and one compelling advantage explaining the broad success and ubiquity of the package today.

A variety of four sided leadless packages made using the aforementioned process are illustrated in FIG. 6B. Using a nomenclature borrowed from four-sided leaded packages, i.e. the LQFP or the leaded quad flat pack, four-sided leadless packages are referred to as quad flat no-lead packages or QFN packages. The term four-sided or quad means that electrical connections are present on all four edges of the package but are not necessarily limited to having the same number of conductive landings on each edge. For example, the QFN shown in bottom view 75B has a total of 20 conductive landings 76B comprising 6 conductive landings on two edges and four conductive landings on the other two edges. It also has an exposed die pad 77B, which may electrically be connected to one of the conductive landings.

The top perspective view 74B clearly reveals no leads are evident on the package or protruding from its sides. Only small pieces of metal, saw-cut flush with the plastic package sidewall, reveal the location of the conductive landings. While constituting a visibly identifiable feature, the exposed metal on the package vertical sidewall is not sufficient in area for soldering. Instead, electrical connection must be made underneath the package, directly to conductive landings 76B. Similarly, underside view 75C illustrates a package with 48 conductive landing pads 76C, sixteen on each edge as well as an exposed die pad 77C. The top view 74C shows no protrusions identifying the presence of conductive leads. Underside view 75D illustrates a underside view of a QFN type leadless package with an exposed die pad 77D and 40 conductive landings 76D, ten on each edge and its corresponding topside view. Another QFN package design also with 40 conductive landings 76E is shown in underside view 75E except that die pad 77E is larger than that of die pad 77D in the previous design.

Four-sided QFN leadless packages are commercially available in fixed mm increments, e.g. 2×2, 3×3, 4×4, 5×5, 6×6, etc. While the package dimensions may be standardized, there is no corresponding standardized size for the exposed die pad. For example, underside view 74F in FIG. 6C illustrates a package with 48 landing pads 76F, sixteen on each of four sides, but with an exposed die pad 77F comprising only a small fraction of the total package area and footprint. Variations in die pad design are especially evident in smaller QFN packages such as contrasted by the package with underside view 75L having a large die pad 77L with 16 conductive landings versus the package of underside view 75J having a relatively large die pad 77J with 12 conductive landings.

As shown in FIG. 6D, leadless packages are also available in selected rectangular versions, generally with low aspect ratios, e.g. 2×3, 3×5, etc. For example, a rectangular QFN shown in top perspective view 74Q and underside view 75Q comprises 38 conductive landings 76Q, combining 12 conductive landings positioned along the package's long edges with 7 conductive landings located on the short edge. Exposed die pad 77Q may be electrically connected to one or more of the conductive landings or be electrically isolated, enabling the package to support 39 distinct electrical connections.

In another variation in leadless package design, conductive landings are located on only two of the package's edges instead of all four. Such packages are referred to as DFN packages, where DFN is an acronym for dual-sided flat no-lead packages. Examples include the DFN package shown in underside view 75P comprising elongated die pad 77P and six conductive landings 76P and package shown in underside view 75T also comprising 6 conductive landings 76T and an alternately shaped die pad 77T. As in the prior examples, die pad 77T may be electrically shorted to one or more of the conductive landings or may be electrically independent. In the design shown in underside perspective view 75R, a rectangular DFN comprises exposed die pad 77R with 7 conductive landings on each long edge of the package.

In the extreme, the DFN design can be adapted for as little as two conductive landings 76K as shown in the package with underside view 75K as shown in FIG. 6E. Exposed die pad 77K functions as a third electrode making the package shown in topside perspective view 74K suitable for single transistors. Another leadless package for transistors is shown in the underside view 75S comprising two conductive landings 76S and small die pad 77S.

Leadless package manufacturing for QFN and DFN packages can also support dual die designs using two separated die pads as illustrated by the rectangular package shown in FIG. 6F. For example, in topside perspective view 74G and corresponding underside view 75G, a QFN package comprises two distinct exposed die pads 77G, six evenly spaced conductive landings 76G on the package's two short edges and seven unevenly spaced conductive landings on both of its long edges. Despite its unique dual die pad design, topside perspective view 74G appears identical to a single pad package of the same dimensions. Another dual die pad package shown in above perspective view 74H and in underside view 75H has two distinct exposed die pads 77H with six conductive landings 76H, three on each of two edges. A longer aspect ratio design is illustrated by the package with underside view 75U with 8 conductive landings 76U and two separate die pads 77U. In PCB assembly care must be taken to prevent shorts between the two die pads by insuring sufficient spacing.

As illustrated in FIG. 6G, leadless packages can also be manufactured without any exposed die pad. For example the DFN package with underside view 75N comprises eight conductive landings 76N three each on opposing edges while the underside view 75O represents a package with ten conductive landings 76O. As stated previously, in the leadless fabrication sequence described, extra processing steps must be included to eliminate the exposed die pad.

Lastly in FIG. 6H, a QFN with a curved edge is illustrated where conductive landings 76M and the width of the base of the package shown in underside view 75M is larger in dimension than the top of the package shown in topside perspective view 74M. Such a package cannot be manufactured in the standard process described for QFN and DFN fabrications because sawing or punching unavoidably results in a perfectly vertical edge sidewall to the package with all the plastic and metal cut flush by the saw cutline. Instead, such a package requires a separate mold cavity tool for each unique package much like the manufacturing of leaded packages like the SOP, SOT, and DPAK. This method of manufacturing, defining the plastic location by the molding process rather than by sawing, eliminates one of the major advantages of leadless package manufacturing—the elimination of custom package-specific mold cavity tools.

Summary

Leadless packages offer unique advantages in flexible package manufacturing, coplanarity, low-profile capability, and the elimination of the need for expensive package-specific mold cavity tools. For all of its advantages, one major disadvantage of the QFN/DFN leadless package is its inability to be used in wave-solder PCB factories. Because no metal lead protrudes laterally from the package, wave-soldering cannot penetrate beneath the package to solder the die pad and the conductive landings onto the PCB conductors. Instead, the solder must be screened using a mask onto the PCB before component placement. Also, solder flow must be performed in expensive reflow ovens or belt furnaces making the entire PCB assembly process 2 to 4 times more expensive than that of simple wave-solder factory based production. Moreover, visual inspection of leadless packages soldered to a PCB using simple automated camera inspection is impossible because the solder cannot be confirmed from the top view. Instead expensive X-ray inspection equipment is required, adding cost and safety risk into reflow PCB manufacturing.

In contrast, leaded packages such as the SOP and SOT offer a cost advantage in PCB assembly because they are wave-solder compatible and easily assembled onto low cost PCBs manufactured in fully depreciated PCB factories dating back to the 1950's. Nevertheless, despite its benefit in PCB manufacturing, the actual package manufacturing of leaded packages suffers from many issues including poor lead coplanarity, poor manufacturing control in the lead bending process, risk of plastic cracking during lead bending, risk of delamination between the plastic and leads, and inability to be scaled into low profile package, especially for package heights below 1 mm.

Poor coplanarity also renders leaded packages difficult to heat sink using exposed die pads because the package's bent leads do not consistently align with the bottom of the die pad or heat slug. Because of long lead dimensions required to perform clamping during lead bending, the length of the conductive leads results in poor package and PCB areal efficiencies and results in excessive lead inductance, adversely affecting switching performance especially in power applications. The mounting of power devices is especially problematic because special two-step soldering is required, first to solder the exposed die pad and heat tab to the PCB, and then to wave-solder the leads. Variability in the lead-bending process combined with natural stochastic variations in the intervening solder thickness placed beneath the die pad result in unpredictable misalignments between the bottom of the bent leads and the PCB conductor, leading to poor connections, cold solder joints, intermittent contact, and degraded reliability.

Another disadvantage of leaded packages is their manufacturing inflexibility. Several manufacturing steps required in leaded package manufacturing demand the use of dedicated machinery and hardware, including a package-specific mold cavity tool, package-specific leadframe trim-and-bending machinery, package-specific dedicated handlers, package-specific dejunk and deflash hardware, and more. While equipment can generally be converted to accommodate different packages, the resulting factory downtime to convert a line from one package to another results in lost productivity and a lower UPH, thereby increasing per unit manufacturing costs.

The following table summarizes these and other considerations when comparing existing package technologies.

| Package Class | Leaded IC Package | Leaded Power Package | Leadless Package |
|---|---|---|---|
| Example Packages | LQFP, SOP, TSOP, SOT | TO (DPAK, D2PAK) | QFN, DFN |
| Pkg Manufacturing | Package Specific | Package Specific | Flexible, Interchangeable |
| Height | Thick (>1 mm) | Very Thick (>2 mm) | Low Profile (<0.8 mm) |
| Lead Coplanarity | Difficult | Difficult | Superior |
| Power Dissipation | Poor | Superior | Good |
| PCB Factory | Wave-Solder | 2-Pass | Reflow |
| PCB Cost | Low | Moderate | High |
| Inspection | Optical Camera | Optical, Some X-ray | Requires X-ray |

Clearly from the above, no existing package meets the combined needs of the market. Moreover, each class of surface-mount package used today requires completely different semiconductor package factories for manufacturing, forcing packaging companies to choose their markets with little chance to expand into new markets without incurring significant additional capital costs.

What is needed is a single package design and manufacturing process that is able to produce surface-mount packages flexibly for both wave-solder and reflow assembly, facilitate superior coplanarity among the die pad and conductive leads, achieve low package height, provide good thermal power dissipation, minimize package inductance, and eliminate the need for package specific equipment such as mold cavity tools and leading equipment.

SUMMARY OF THE INVENTION

The process of this invention utilizes a leadframe that is preferably, but not necessarily, fabricated in accordance with the methods described in the above-referenced U.S. application Ser. No. 14/056,287. The leadframe comprises a plurality of die pads and leads. Each of the die pads and its associated leads generally correspond to a finished package, although some packages may include two or more die pads. Some of the leads and die pads are connected together, the leads to be included in adjacent packages may be connected together across "streets" where the packages will eventually be separated, and for additional stability during fabrication tie bars and rails may be used to connect the die pads and leads to each other.

The leads may be Z-shaped when viewed in a vertical cross section and, if so, they each comprise a vertical column segment, a cantilever segment and a foot. The cantilever segment projects horizontally inward towards the die pad at the top of the vertical column segment, and the foot projects horizontally outward at the bottom of the vertical column segment. The vertical column segment typically forms right angles and sharp corners with the cantilever segment and with the foot. The bottom surface of the foot is coplanar with a bottom surfaces of the feet of other leads and with a bottom surface of the die pad, if exposed. In other embodiments, the lead does not comprise a foot, and it is also possible that the lead does not comprise a cantilever segment. A lead may be attached to a die pad. In some embodiments, a heat slug extends from the die pad to improve thermal conduction, and the heat slug may terminate in a foot.

The leadframe may be fabricated using a process that comprises forming a first mask layer on a backside of a metal sheet and then partially etching the metal sheet through openings in the first mask layer in areas where the cantilever segments of the leads are to be located, and where gaps between the leads and the die pads and between the leads themselves, are to be located, and in the areas between adjacent packages. If the die pads are to be isolated, there are also openings in the first mask layer where the die pads are to be located. If the die pads are to be exposed, the mask layer covers where the die pads are to be located, and those areas are not etched. The partial etch through the openings in the first mask layer does not cut through the entire metal sheet, and a thinned layer of metal remains in the etched areas.

The process further comprises forming a second mask layer on a front side of the metal sheet, the second mask layer having openings overlying the gaps between the die pads and the leads and between the leads, the areas where the feet of the leads, if any, are to be located, and the areas between adjacent packages.

The metal sheet is then etched through the openings in the second mask layer. This etch is continued until the metal is completely removed in the areas where the gaps between the die pads and the leads and between the leads are to be located and in the areas separating adjacent packages, but the metal is only partially removed in the area where the feet of the leads, if any, are to be located. The openings in first mask layer under the cantilever segments of the leads and the openings in the second mask layer overlying the feet of the leads, if any, are vertically offset from each other such that segments of the metal sheet between the cantilever segments and the feet remain unaffected by either of the etch processes. These un-etched segments will become the vertical column segments of the leads. If the die pads are to be exposed, the areas in which are the die pads are to be formed remain un-etched.

Alternatively, a metal stamping process may be used in lieu of the etch processes described above. A first metal stamp is applied to the first side of the metal sheet to compress and thin the metal sheet where the cantilever segments of the leads and the gaps between the die pads and the leads and between the adjacent packages are to be located (and optionally where the die pads are to be located). A second metal stamp is applied to the second side of the metal sheet to sever the metal sheet where the gaps between the die pads and the leads and between adjacent packages are to be located and to compress and thin the metal piece where the feet of the leads, if any, are to be located.

Whether an etching or stamping processes is used, the result is typically a leadframe with multiple die pads, each die pad being associated with a plurality of leads. If the package is to have leads only on two opposite sides of the die pad (a "dual" package), the die pad is typically held in place in the leadframe by means of at least one tie bar. The leads on the contiguous sides of adjacent packages typically extend across a "street" where the packages will be separated, or "singulated," and are typically connected together by rails. If the package is to have leads on four sides of the die pad (a "quad" package), the die pad is sometimes left connected to at least one of the associated leads, that is, no gap is formed between the die pad and the at least one of the associated leads in the above-described etching or stamping processes. Whether by a tie bar, an attached lead, or both, the die pad remains connected to the leadframe.

Semiconductor dice are then mounted on their respective die pads, and the appropriate electrical connections are made between the dice and the leads, typically using wire bonding or flip-chip techniques. The backsides of the dice may or may not be electrically and/or thermally connected to the die pads.

In accordance with the invention, rather than using separate molds to form the plastic capsules for each package, a single mold is used to form a single plastic block over a plurality of die pads, and their associated leads, tie bars and rails in the leadframe. The packages are then singulated using one or more laser beams.

In many embodiments, the plastic block is separated into plastic protective capsules for each of the packages using a first laser beam, which is normally moved in a series of parallel adjacent scans in the areas between the packages. Typically, the scans are performed in two sets, orthogonally related to each other, to separate the plastic into individual capsules.

After the plastic block has been separated into capsules for each of the packages, a second laser beam is used to remove the metal conductors that typically connect adjacent packages and any rails that may connect the metal connectors together. Again, this is normally performed in a series of parallel adjacent scans in the "streets" between the packages.

By varying the total, combined width of the laser scans of the first laser beam, a wide variety of different types of packages may be fabricated. For example, if the laser scans of the first laser bean extend to the top surfaces of the cantilever segments of the leads, the sidewalls of the plastic capsules will be located there, and the leads will protrude from the sidewalls of the plastic capsule. If the laser scans of the first laser bean extend to the top surfaces of the column segments of the leads, the sidewalls of the plastic capsules will be located there, and the outer sidewalls of the column segments will remain exposed. If the laser scans of the first laser bean extend to the top surfaces of the feet of the leads, the sidewalls of the plastic capsules will be located there, and the feet will extend from the sidewalls of the plastic capsule but the outer sidewalls of the column segments of the leads will remain covered by the plastic capsule. If the scans of the first laser beam cover only the “street” to be formed by the scans of the second laser beam, the sidewalls of the plastic capsules will be coplanar with the ends of the leads, and a leadless package will be formed.

Preferably, the wavelength and other characteristics of the first laser beam will be such that the first laser beam does minimal damage to the metal conductors embedded in or underlying the plastic block.

According to another aspect of the invention, a solder layer is printed on the bottom surfaces of the die pad, if exposed, and/or the bottom surfaces of the leads. After singulation, a package treated in this way can be attached to a PCB by merely placing the package on top of the PCB and heating the package and PCB so as to melt the solder layer. If desired, the package may also to subjected to a wave-solder process to attach leads on which a solder layer has not been formed to appropriate traces or contacts on the PCT.

The techniques of this invention thus allow a wide variety of different types and sizes of semiconductor packages to be fabricated without the need for specialized equipment. This is attained by essentially varying the patterns of openings in the mask layers applied to the backside and front side surfaces of a metal sheet and by varying the combined width of the laser scans used to separate the plastic block into capsules for each package. Where footed packages are used, the bottom surfaces of the feet are assured of being coplanar, and the difficulties inherent in the bending of leads to form gull-wing packages are avoided.

As a result, a semiconductor package manufacturer can produce packages designed to meet its customers' specific needs economically and without undue delays.

BRIEF DESCRIPTION OF THE DRAWINGS

In the drawings listed below, components that are generally similar are given like reference numerals.

Figure 27A:
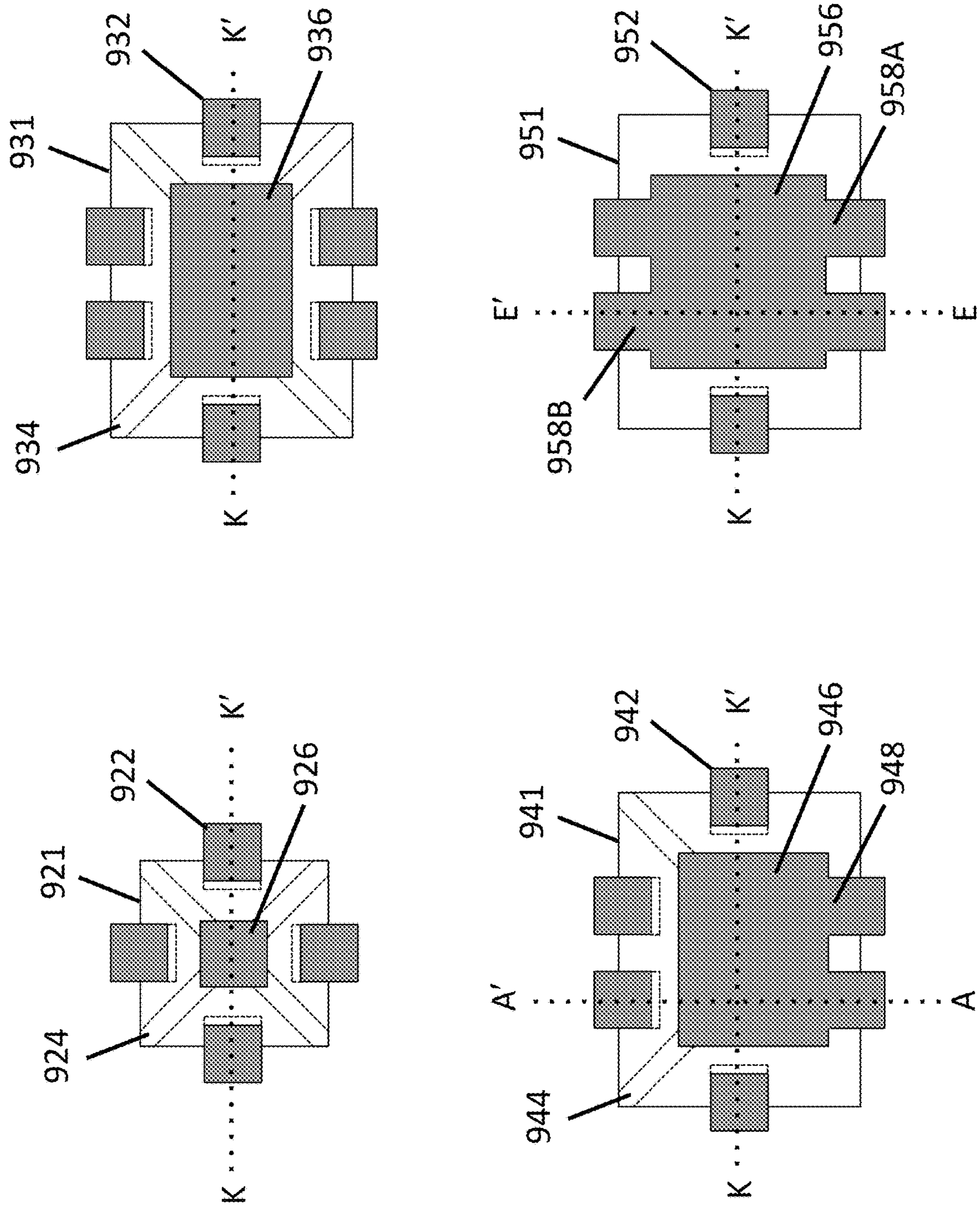
FIG. 27A comprises underside views of 4 and 6-footed quad USMPs with exposed die pads.
Figure 27B:
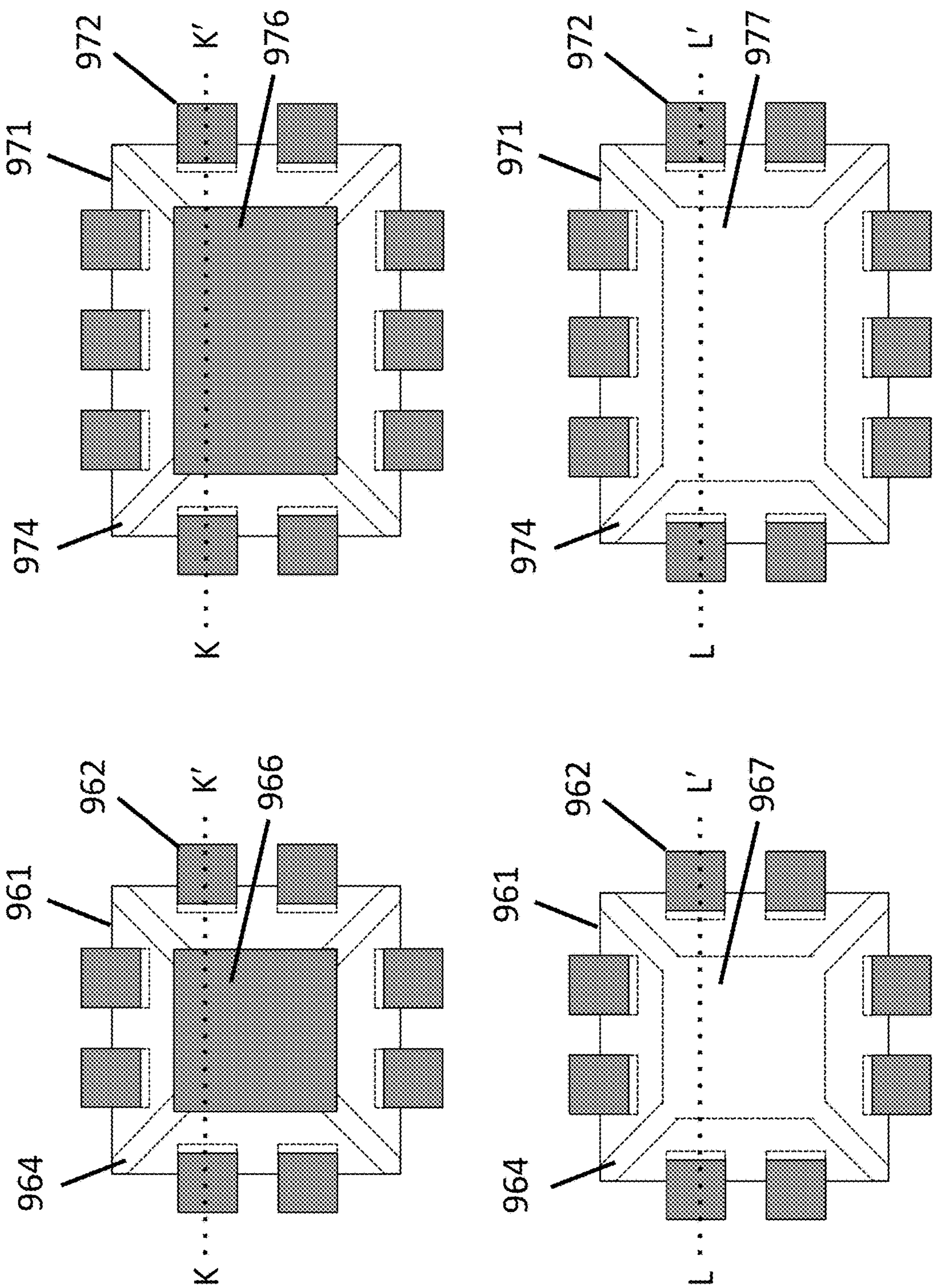
FIG. 27B comprises underside views of 8 and 10-footed quad USMPs with exposed and isolated die pads.
Figure 27C:
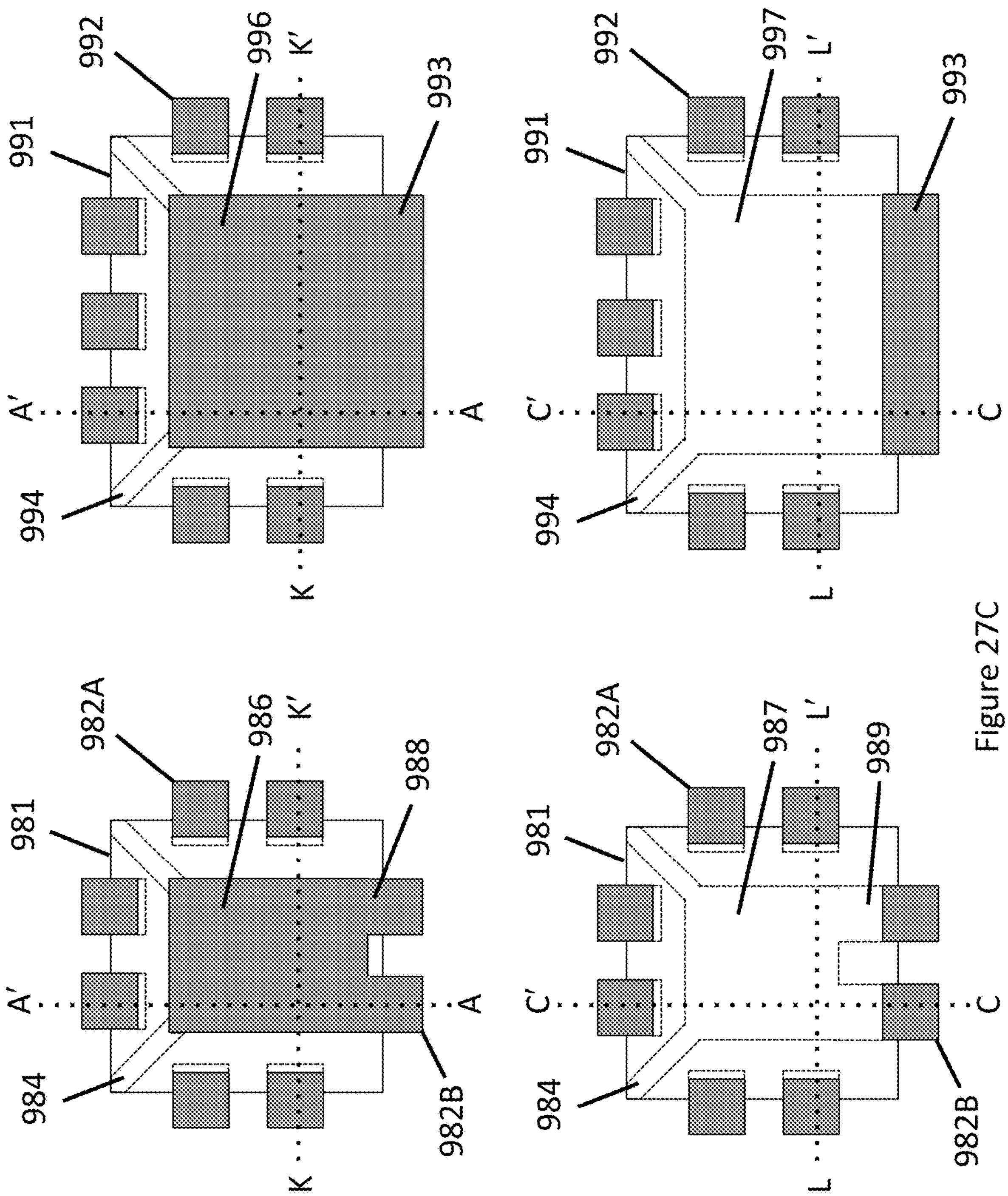
FIG. 27C comprises underside views of 8-footed quad USMPs with exposed and isolated die pads and die-pad attached feet.
Figure 27D:
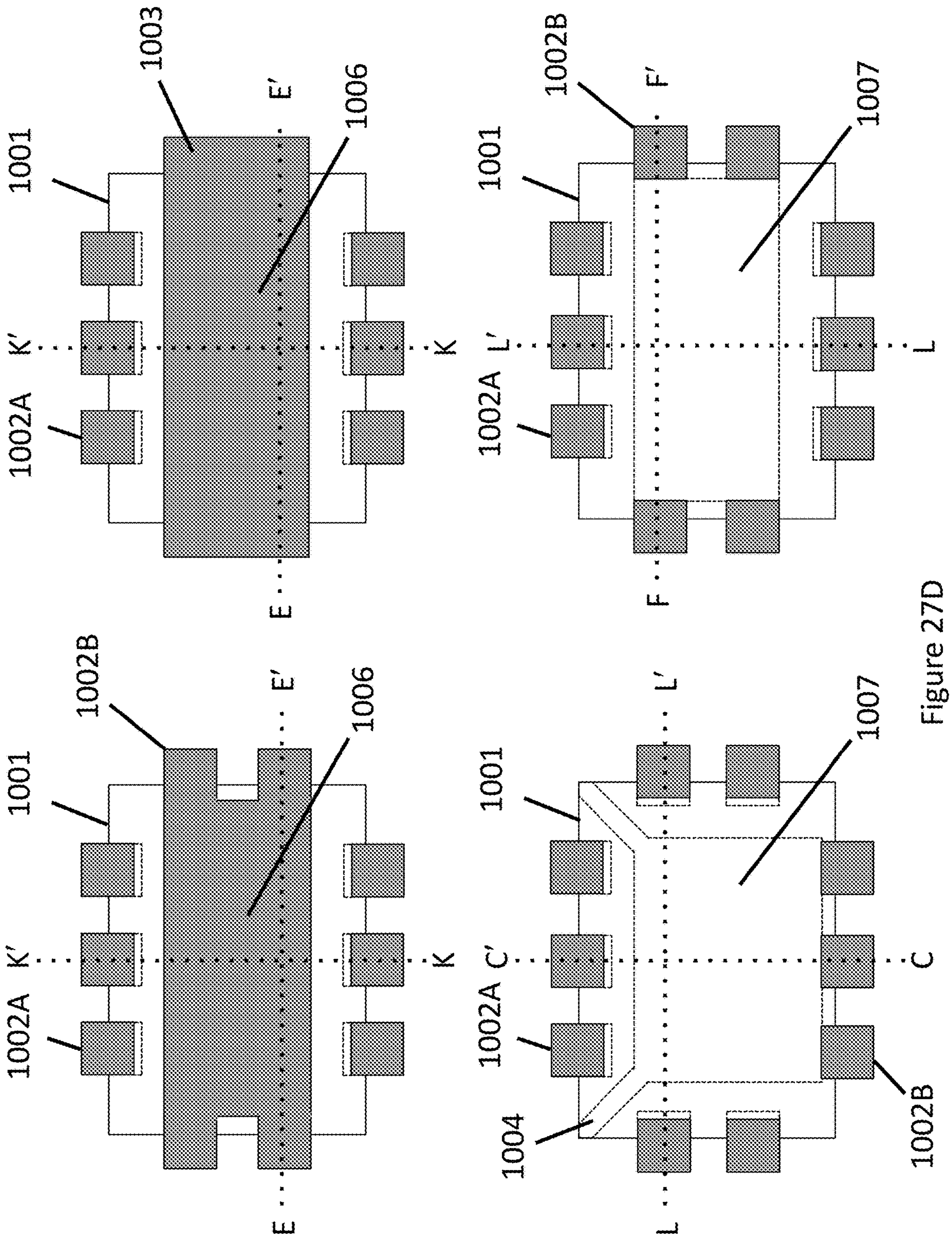

FIG. 27D comprises underside views of 8 and 10-footed rectangular-shaped quad USMPs with exposed and isolated die pads.

Figure 28A:
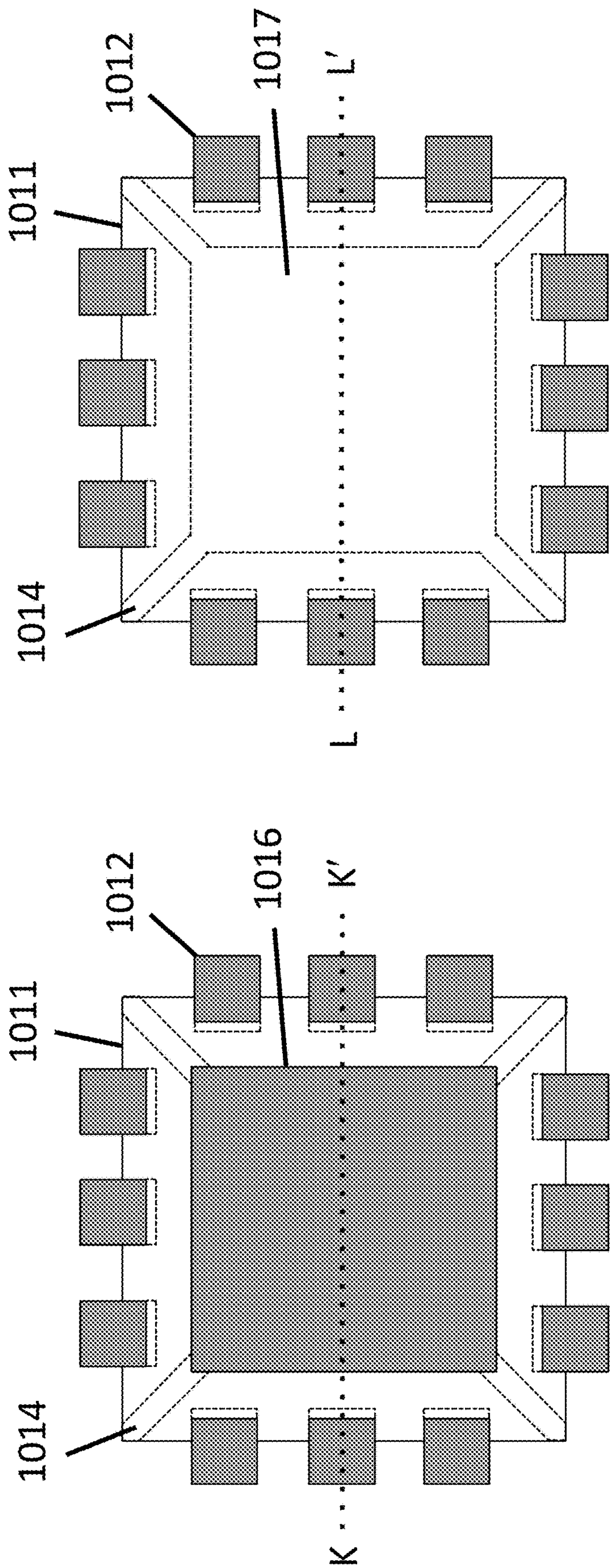

FIG. 28A comprises underside views of 12-footed quad USMPs with exposed and isolated die pads.

Figure 28B:
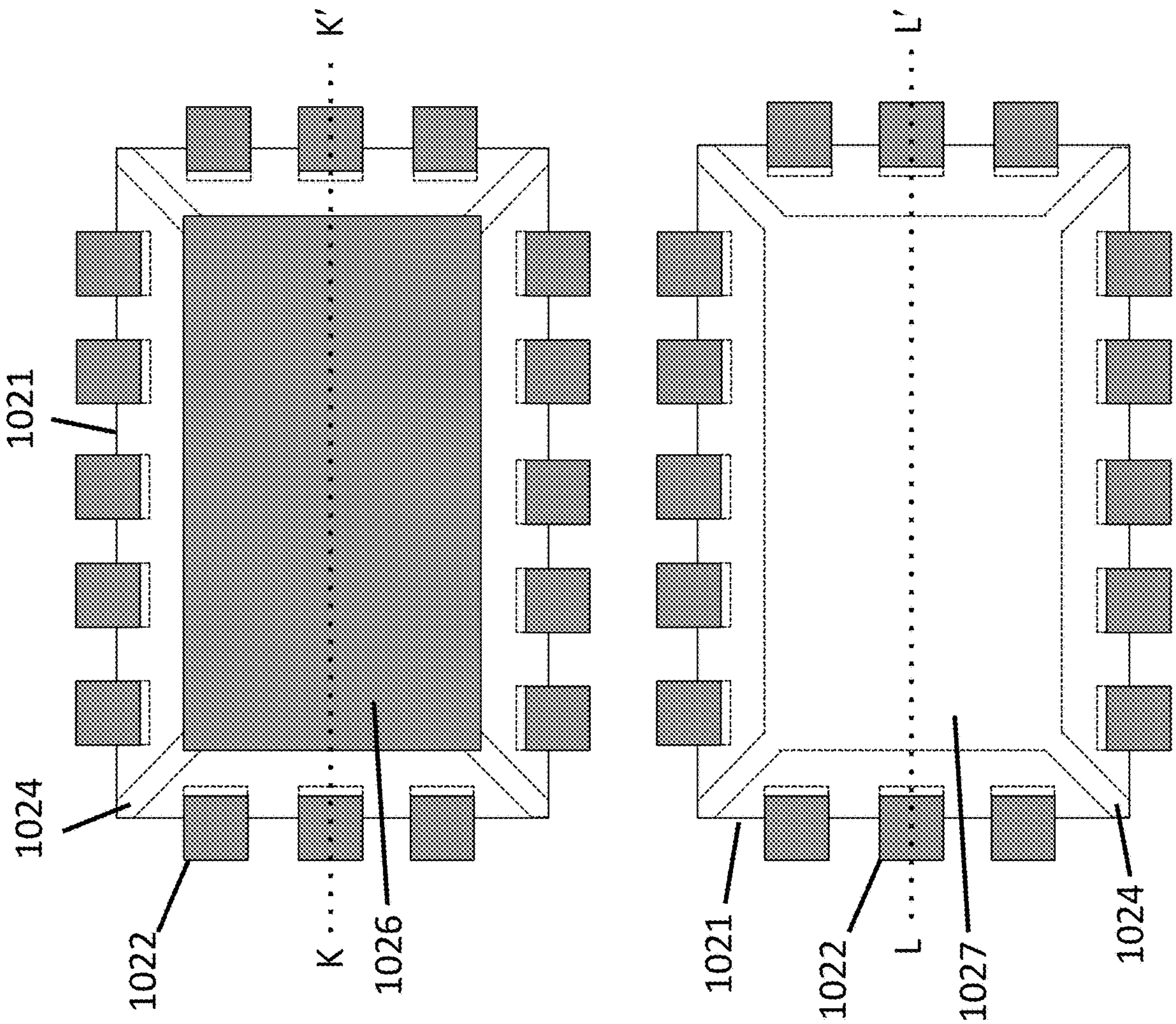

FIG. 28B comprises underside views of 16-footed rectangular-shaped quad USMPs with exposed and isolated die pads.

Figure 29A:
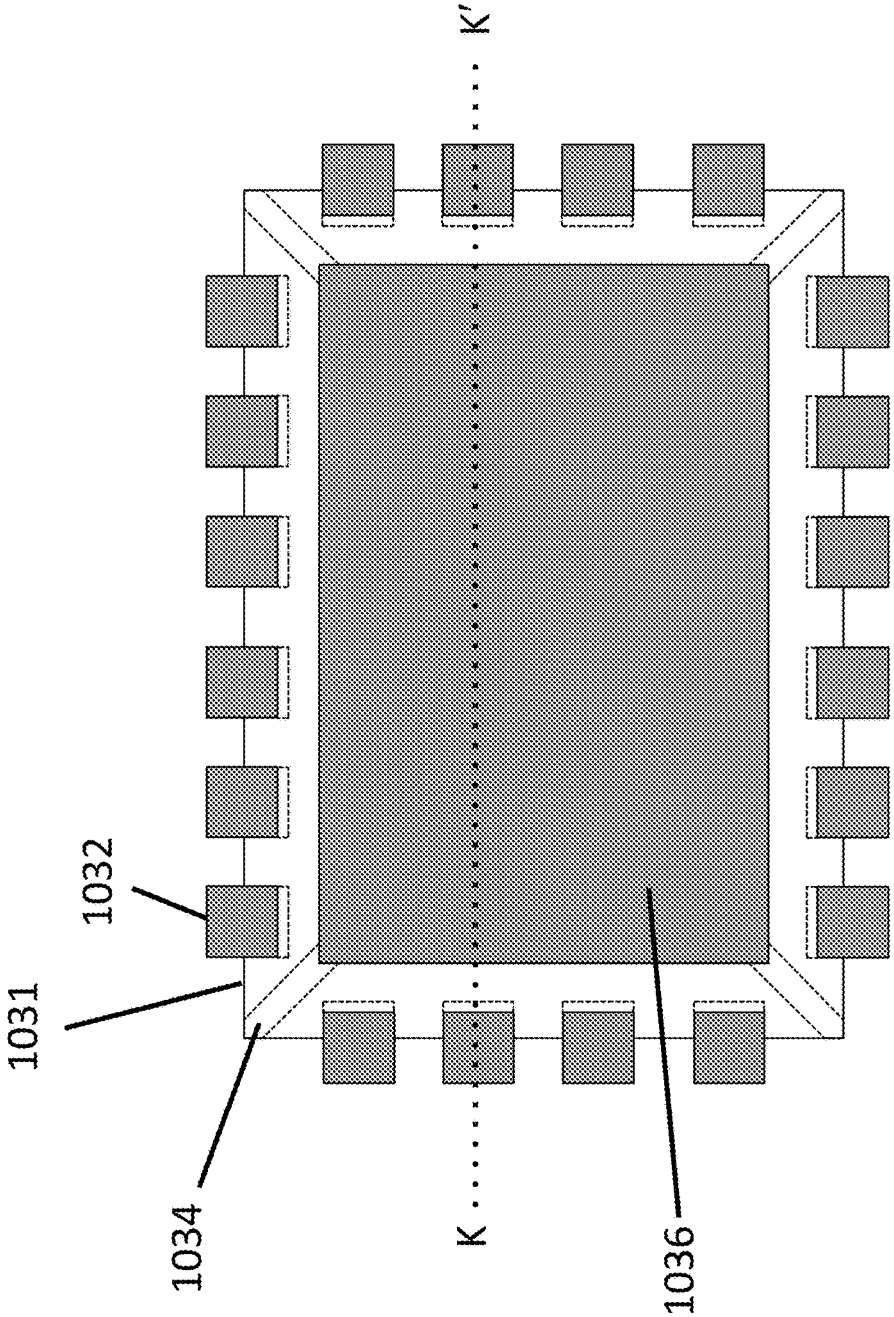

FIG. 29A comprises an underside view of a 20-footed rectangular-shaped quad USMP with an exposed die pad.

Figure 29B:
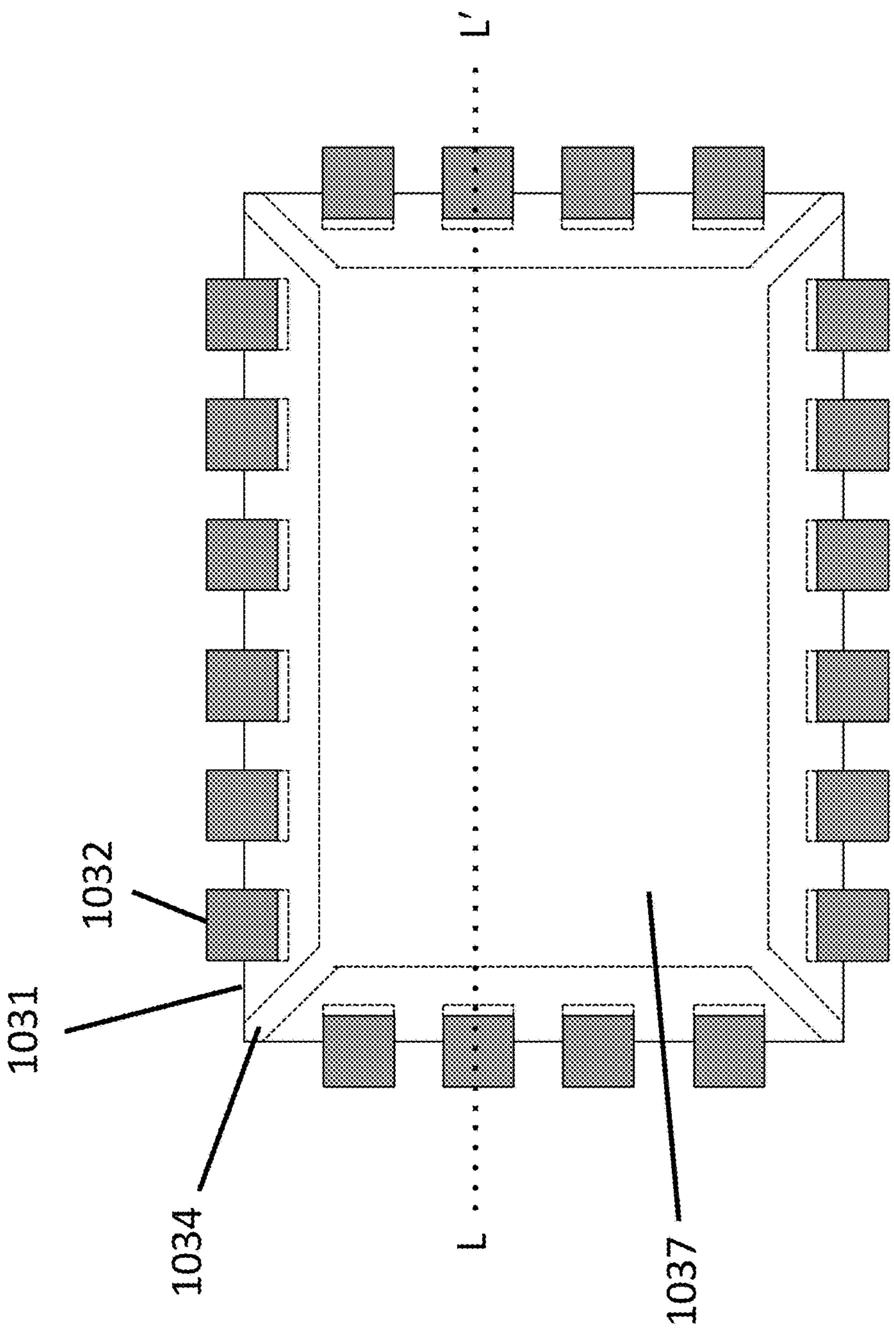

FIG. 29B comprises an underside view of a 20-footed rectangular-shaped quad USMP with an isolated die pad.

Figure 30A:
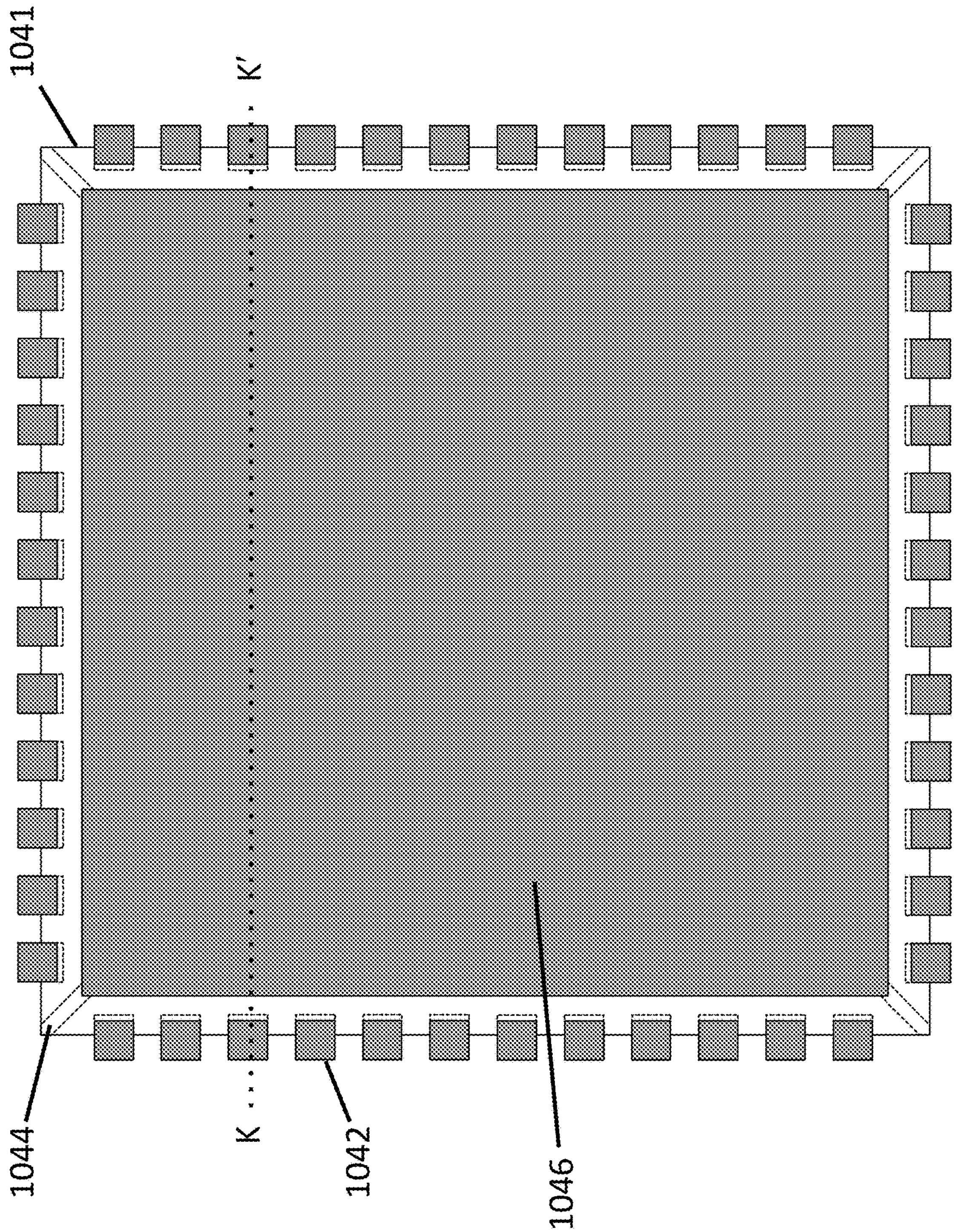

FIG. 30A comprises an underside view of a 48-footed quad USMP with an exposed die pad.

Figure 30B:
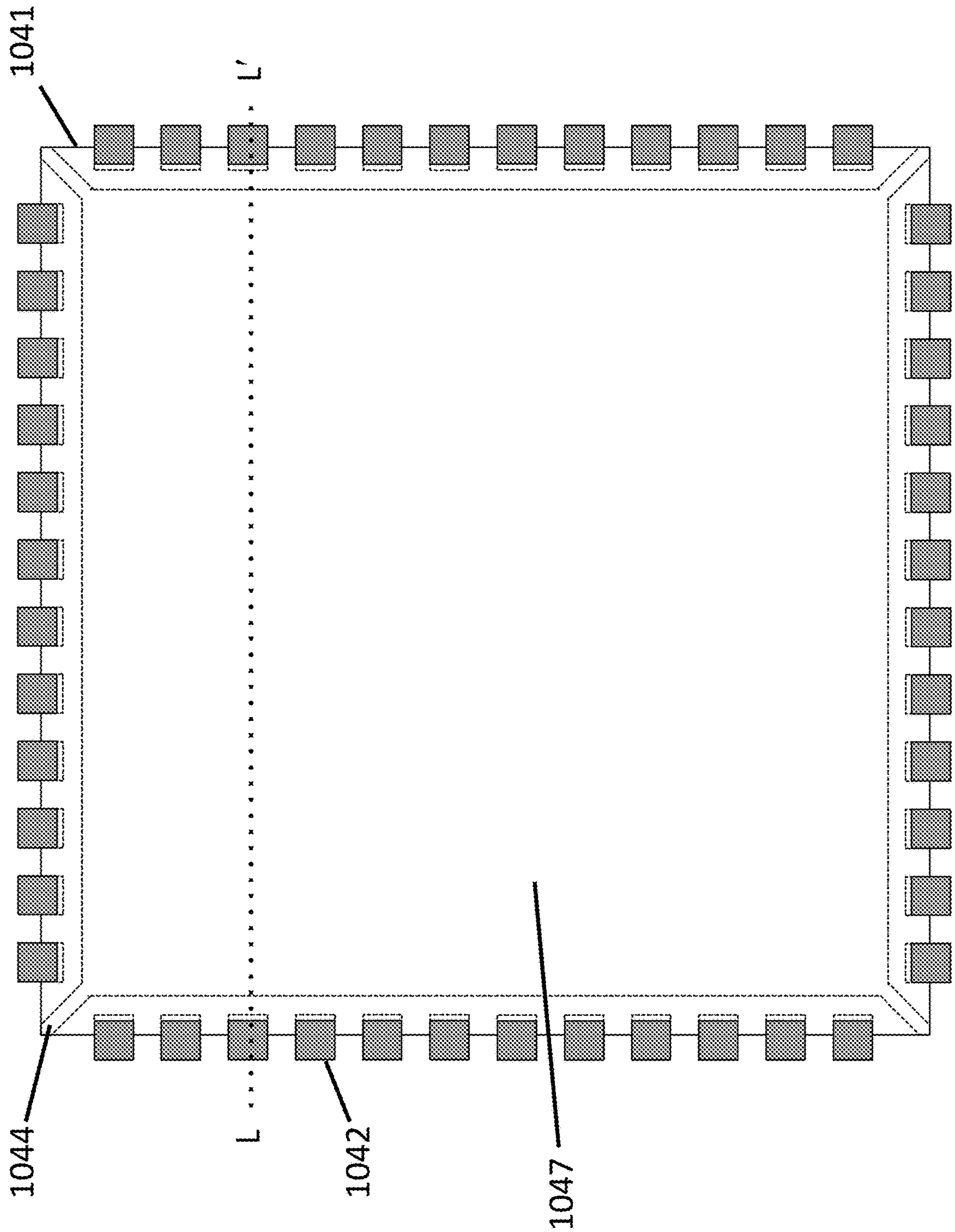

FIG. 30B comprises an underside view of a 48-footed quad USMP with an isolated die pad.

Figure 30C:
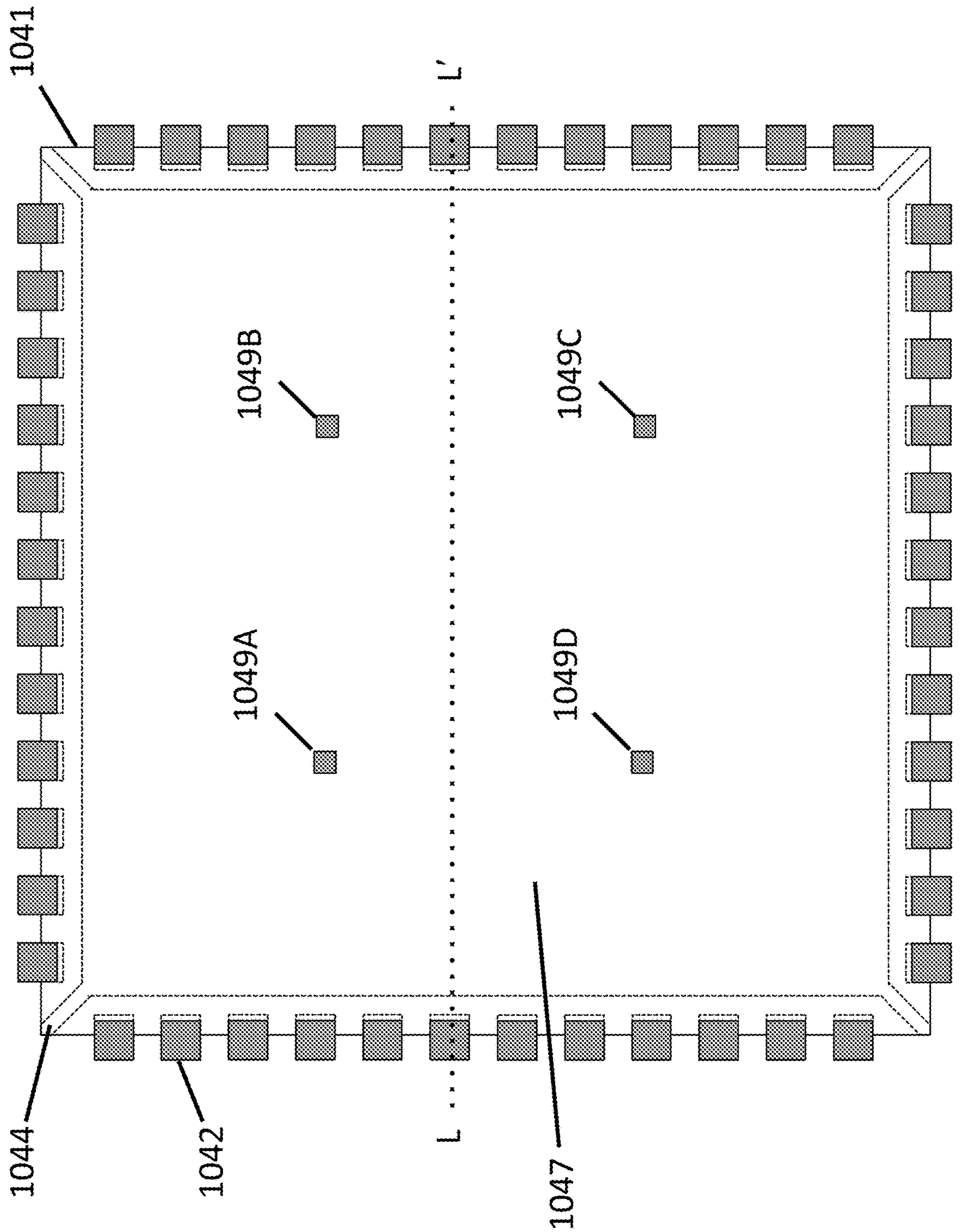

FIG. 30C comprises an underside view of an alternate embodiment of a 48-footed quad USMP with an isolated die pad.

Figure 31:
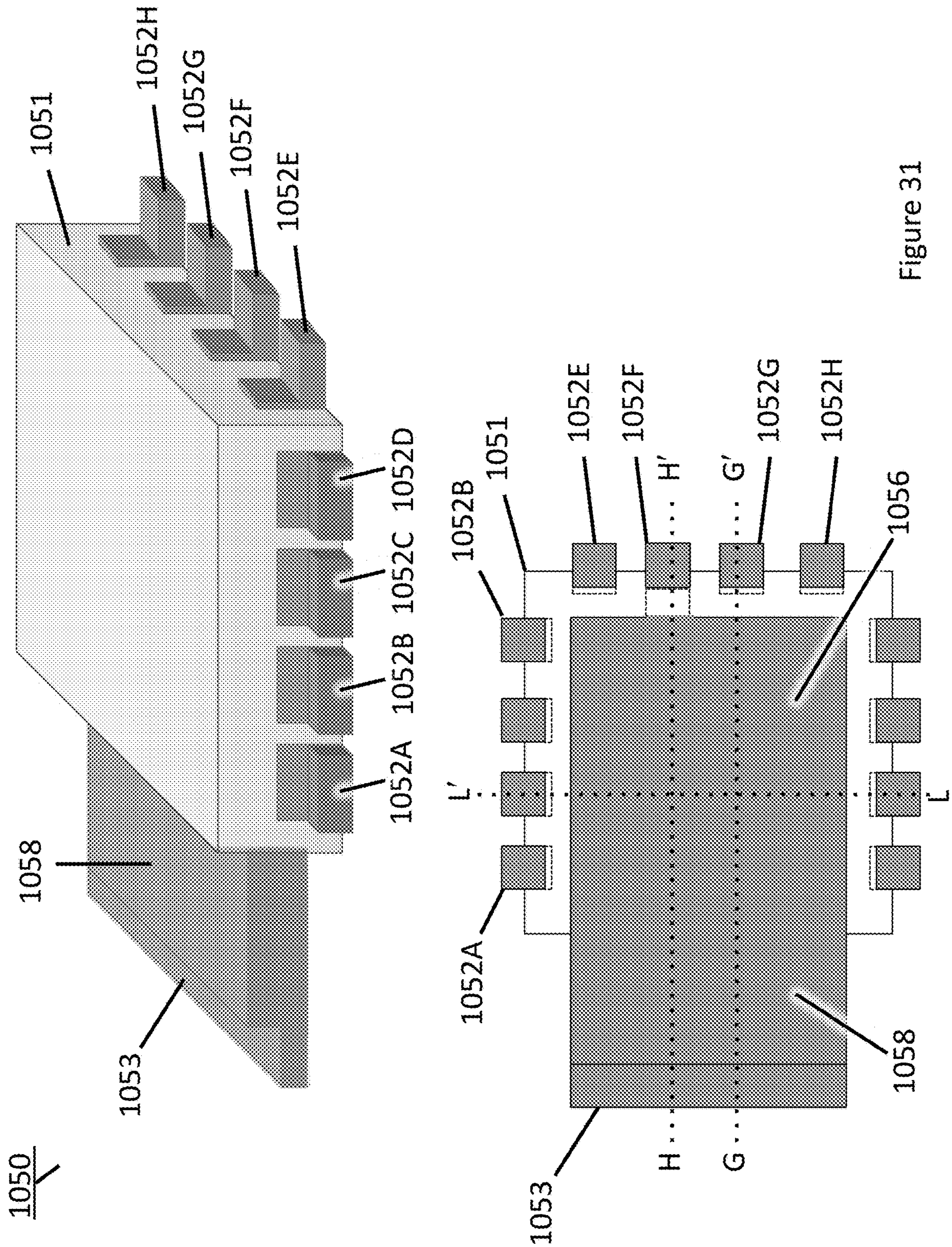

FIG. 31 comprises various views of a power USMP integrating a multi-foot package with an extended heat tab.

Figure 32A:
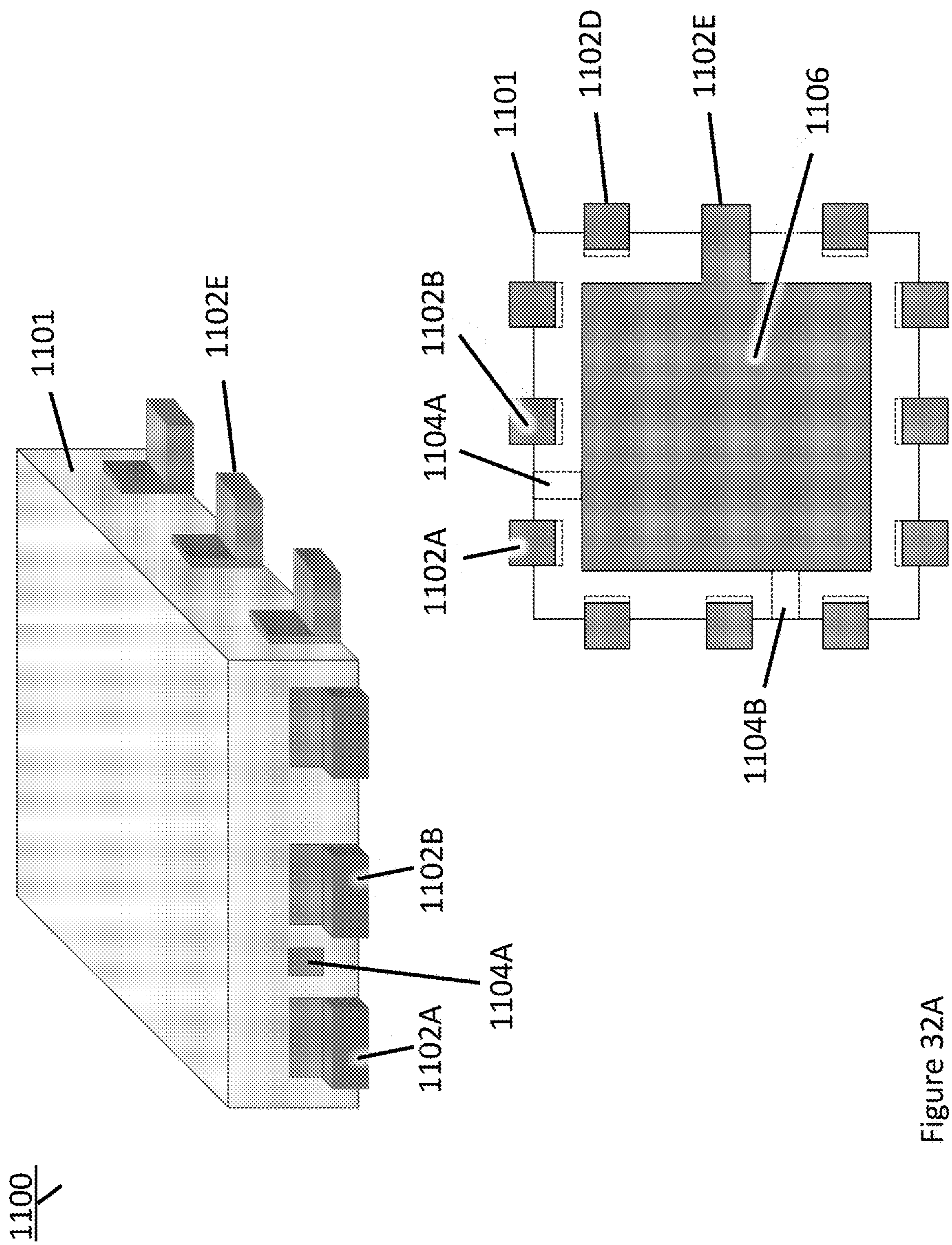

FIG. 32A comprises various views of a USMP including intra-lead tie bars.

Figure 32B:
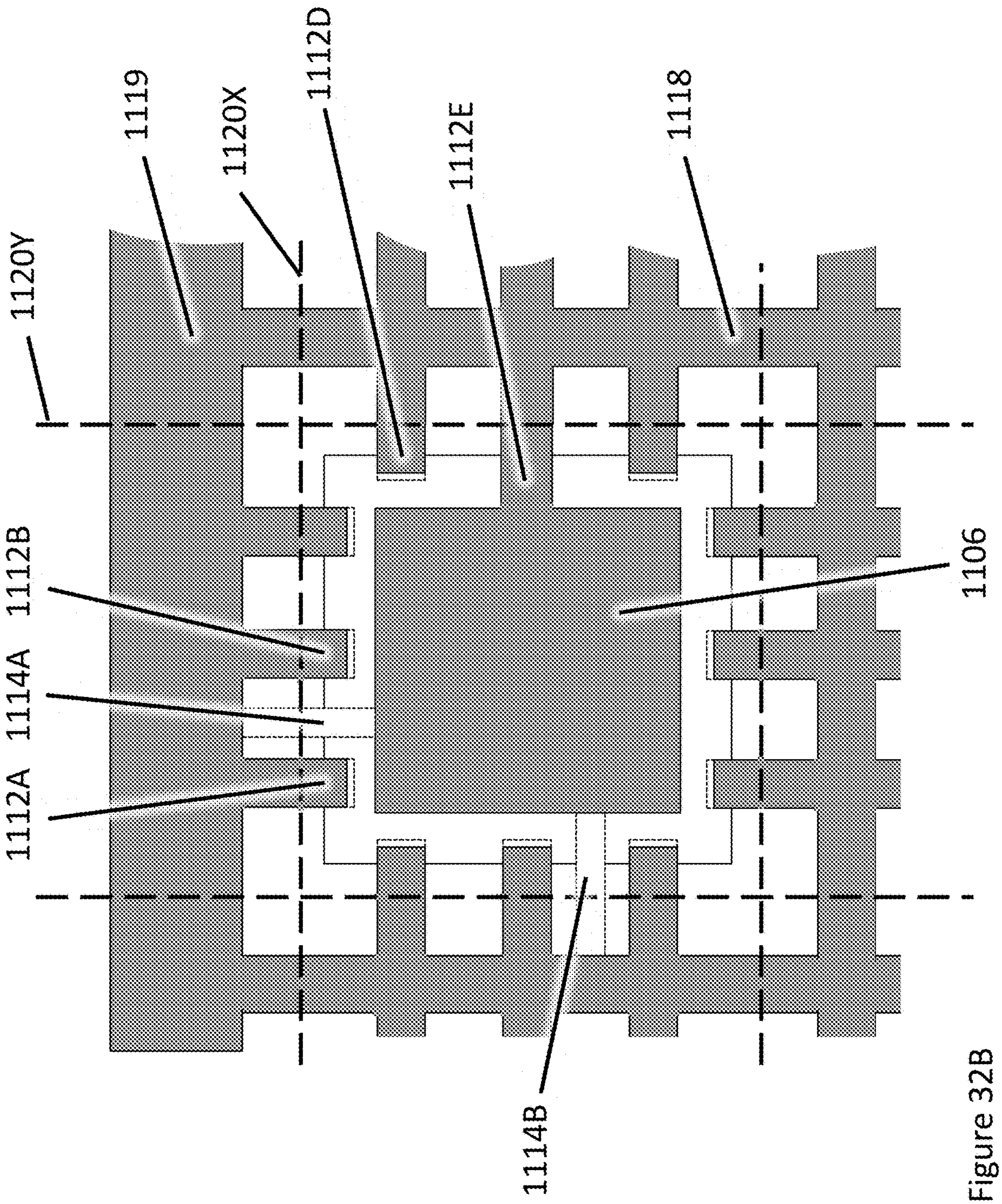

FIG. 32B comprises an underside view of a USMP leadframe with intra-lead tie bars.

Figure 32C:
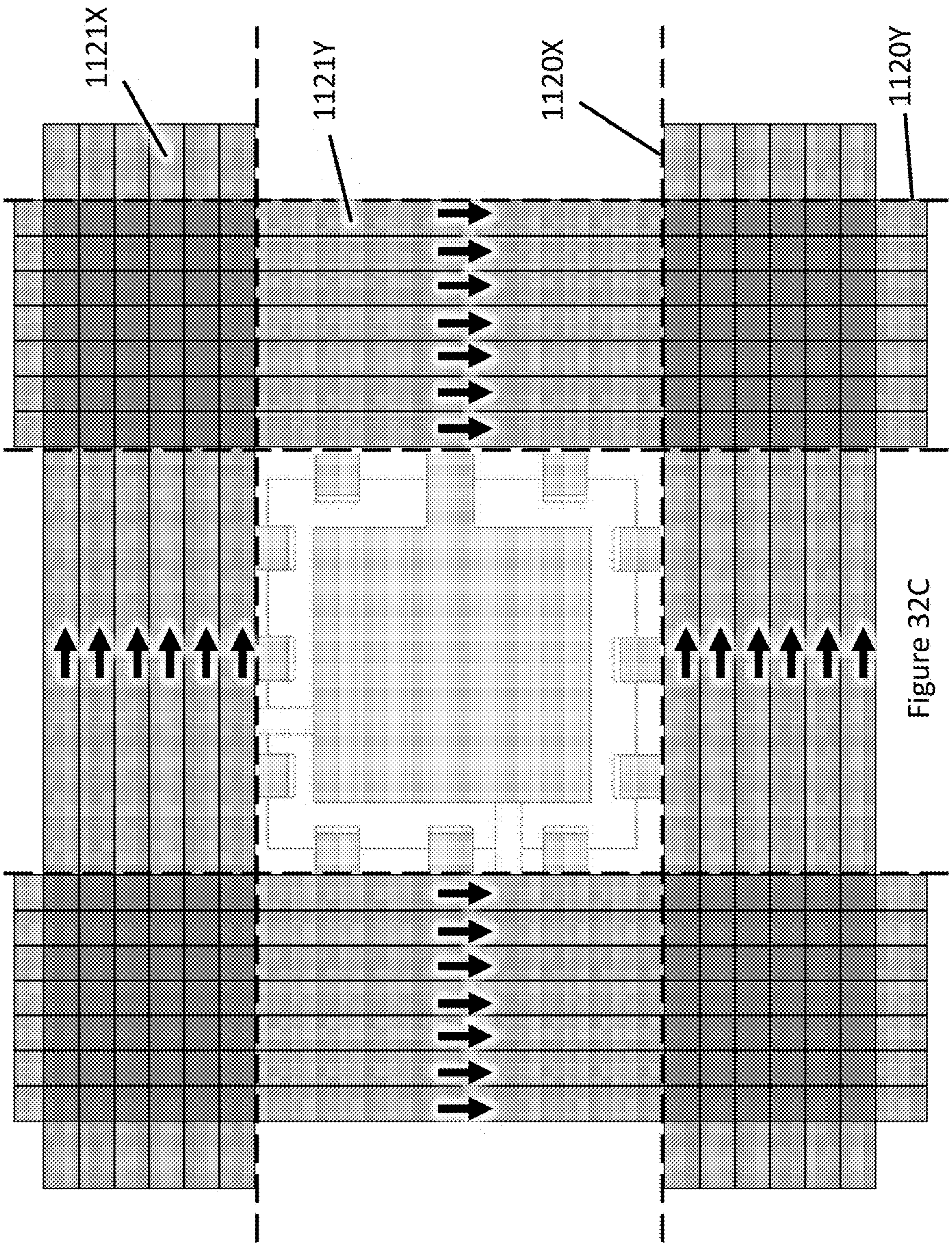

FIG. 32C illustrates the primary laser paths for defining package leads and performing singulation of a quad USMP.

Figure 32D:
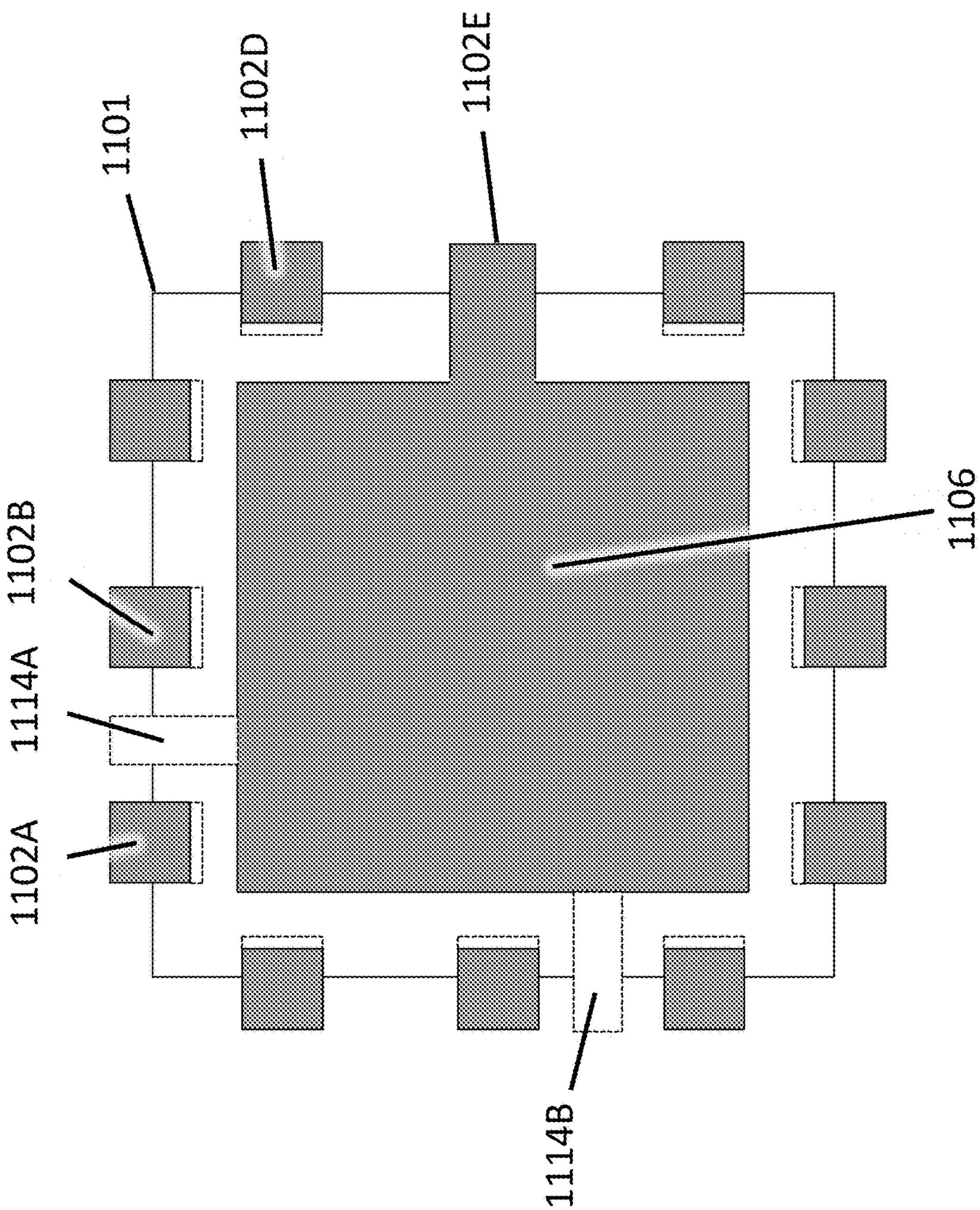

FIG. 32D comprises an underside view of a USMP package with intra-lead tie bars after singulation.

Figure 32E:
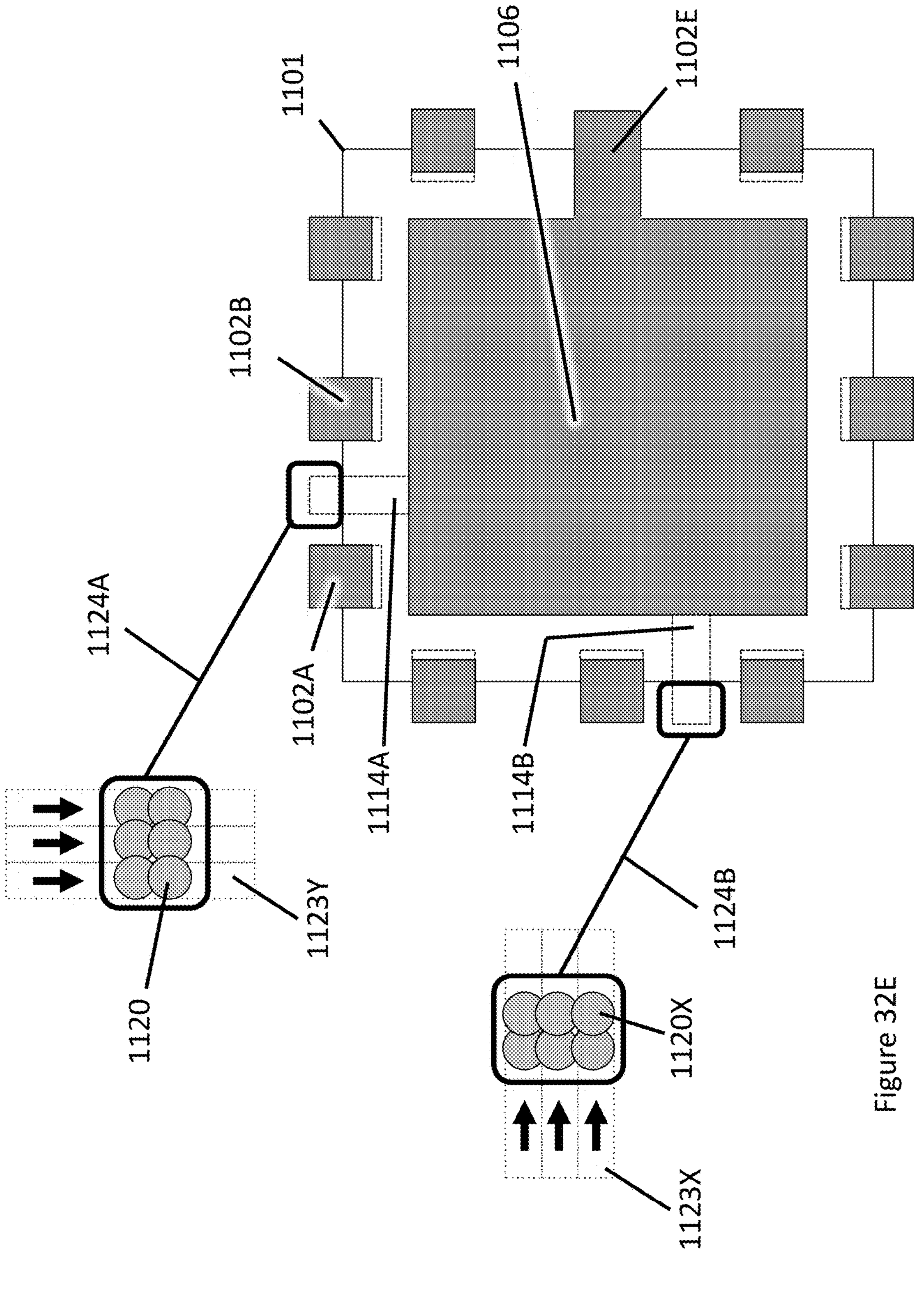

FIG. 32E illustrates an underside view of a quad USMP illustrating laser tie bar removal.

Figure 33A:
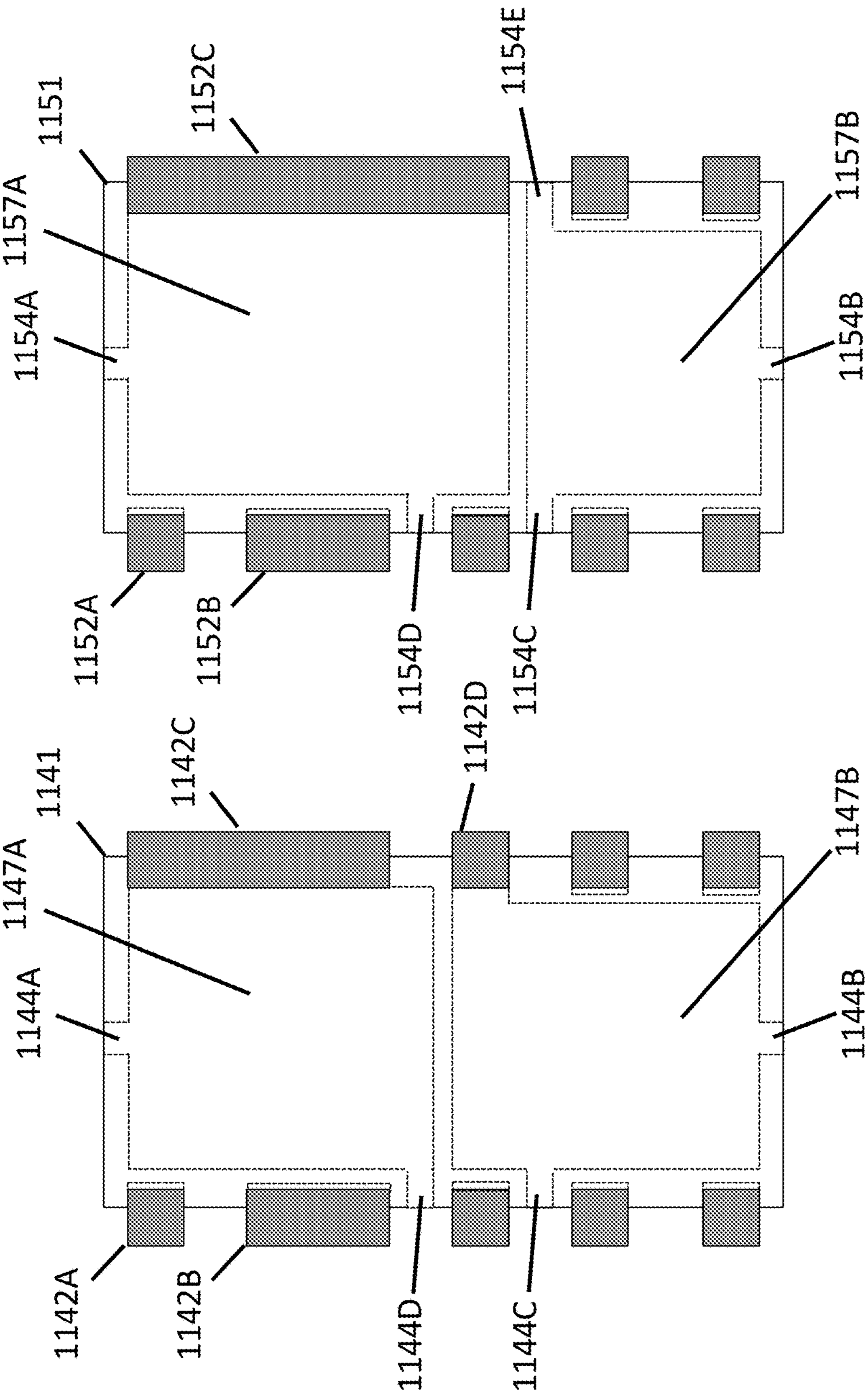

FIG. 33A comprises an underside view of dual isolated pad USMPs utilizing intra-lead tie bars.

Figure 33B:
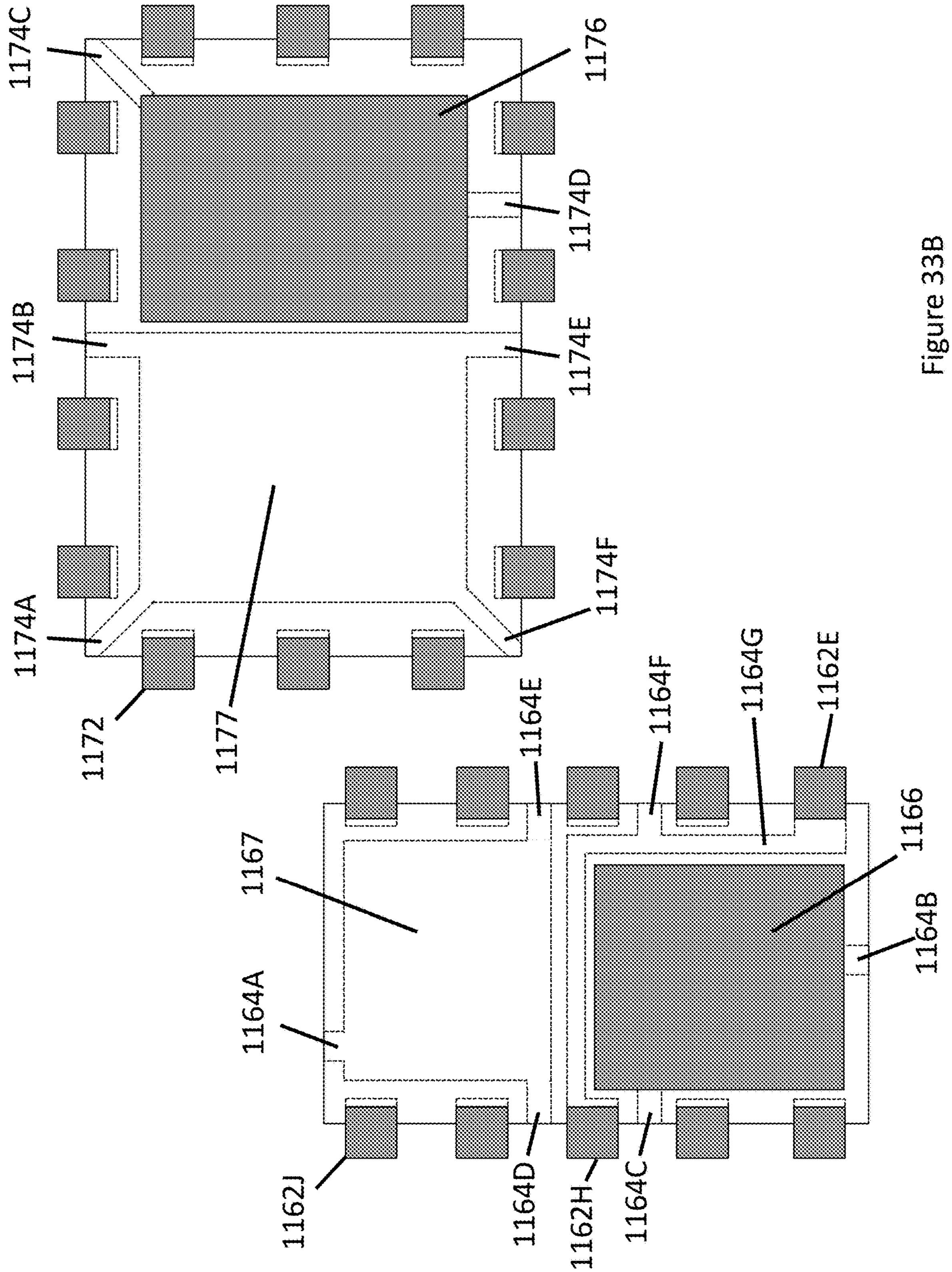

FIG. 33B comprises an underside view of alternative embodiments of dual isolated pad USMPs utilizing intra-lead tie bars and isolated interconnects.

Figure 34A:
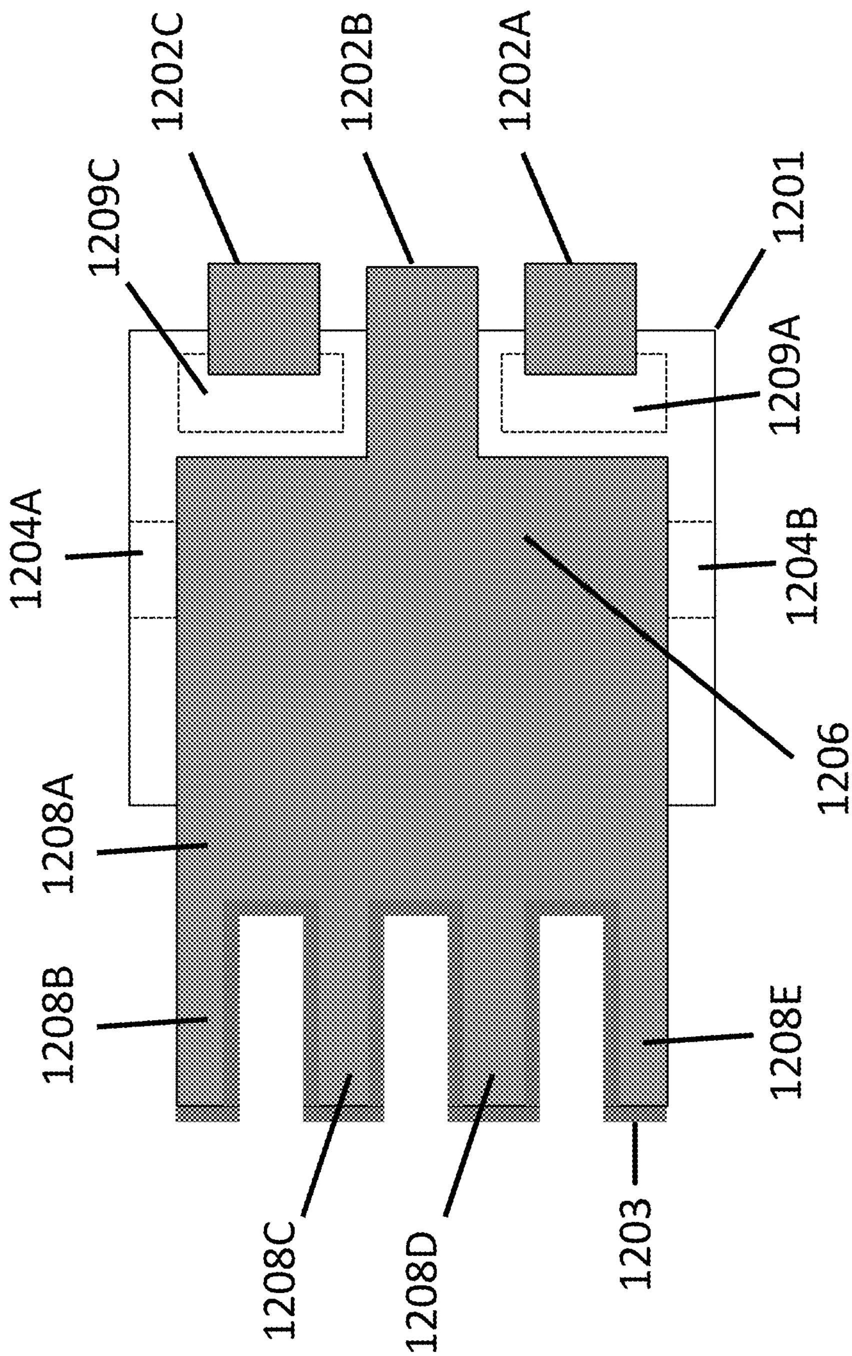

FIG. 34A comprises an underside view of a wave-solderable heat tab power USMP including a thermal comb.

Figure 34B:
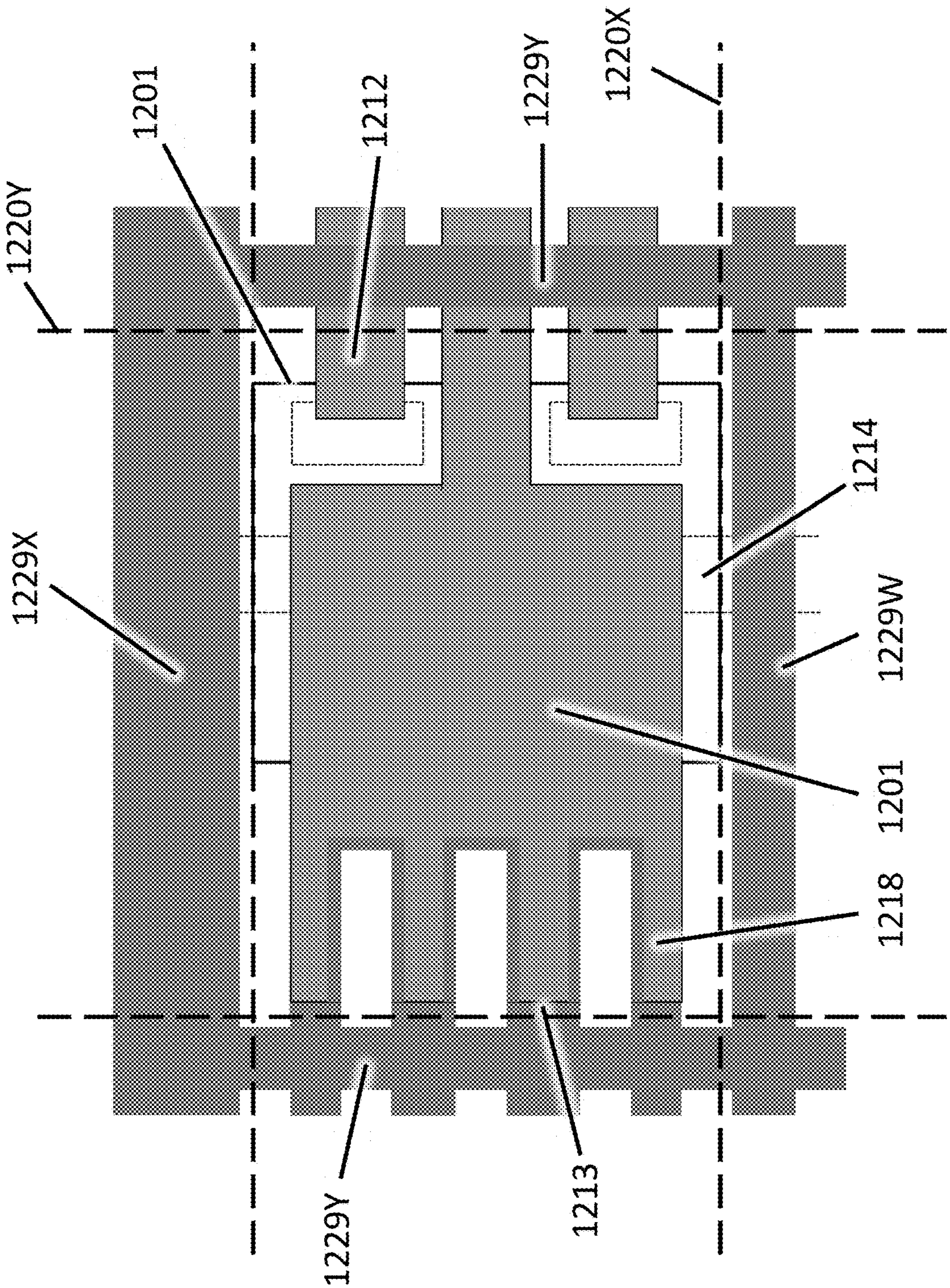

FIG. 34B comprises an underside view of a wave-solderable heat tab power USMP leadframe including a thermal comb.

Figure 34C:
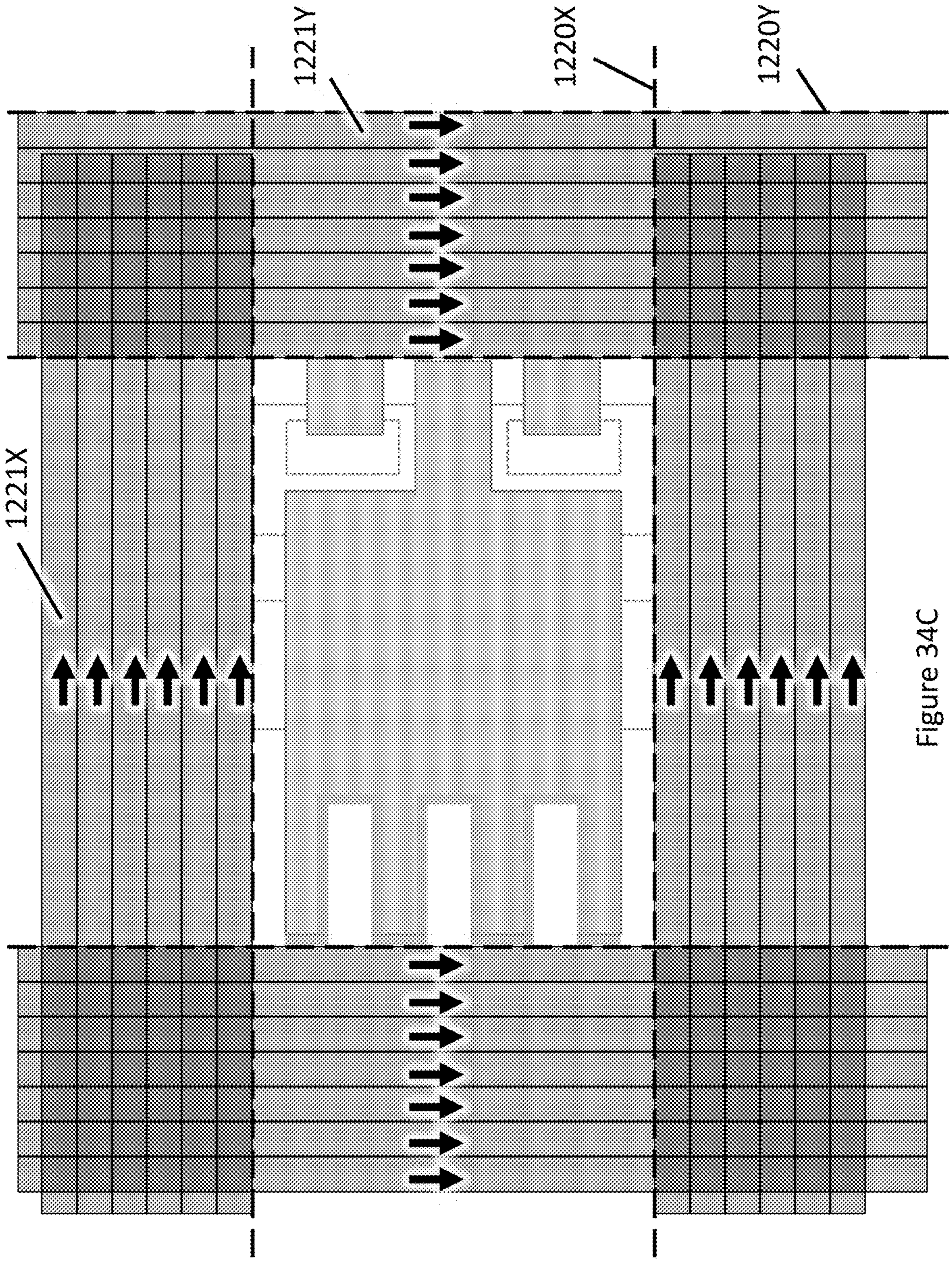

FIG. 34C illustrates the primary laser paths for defining package leads and performing singulation of a power USMP with a heat tab.

Figure 35A:
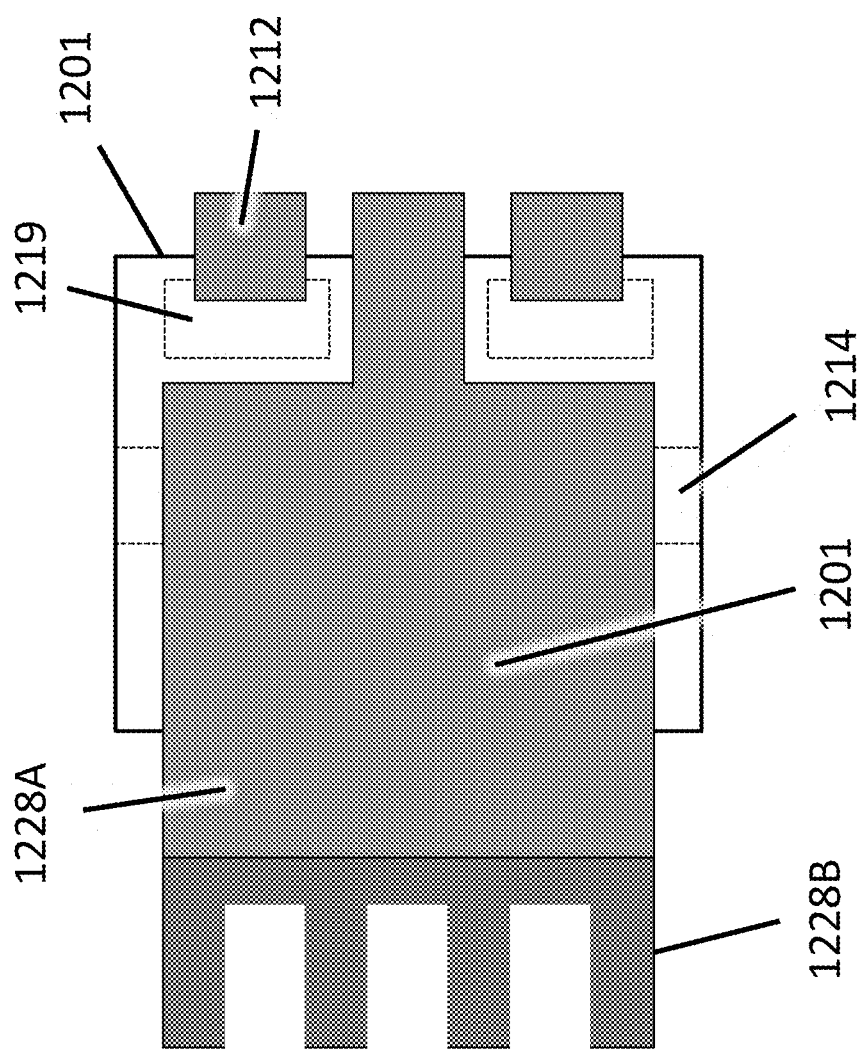

FIG. 35A comprises an underside view of an alternative embodiment of a wave-solderable heat tab power USMP with a thermal comb.

Figure 35B:
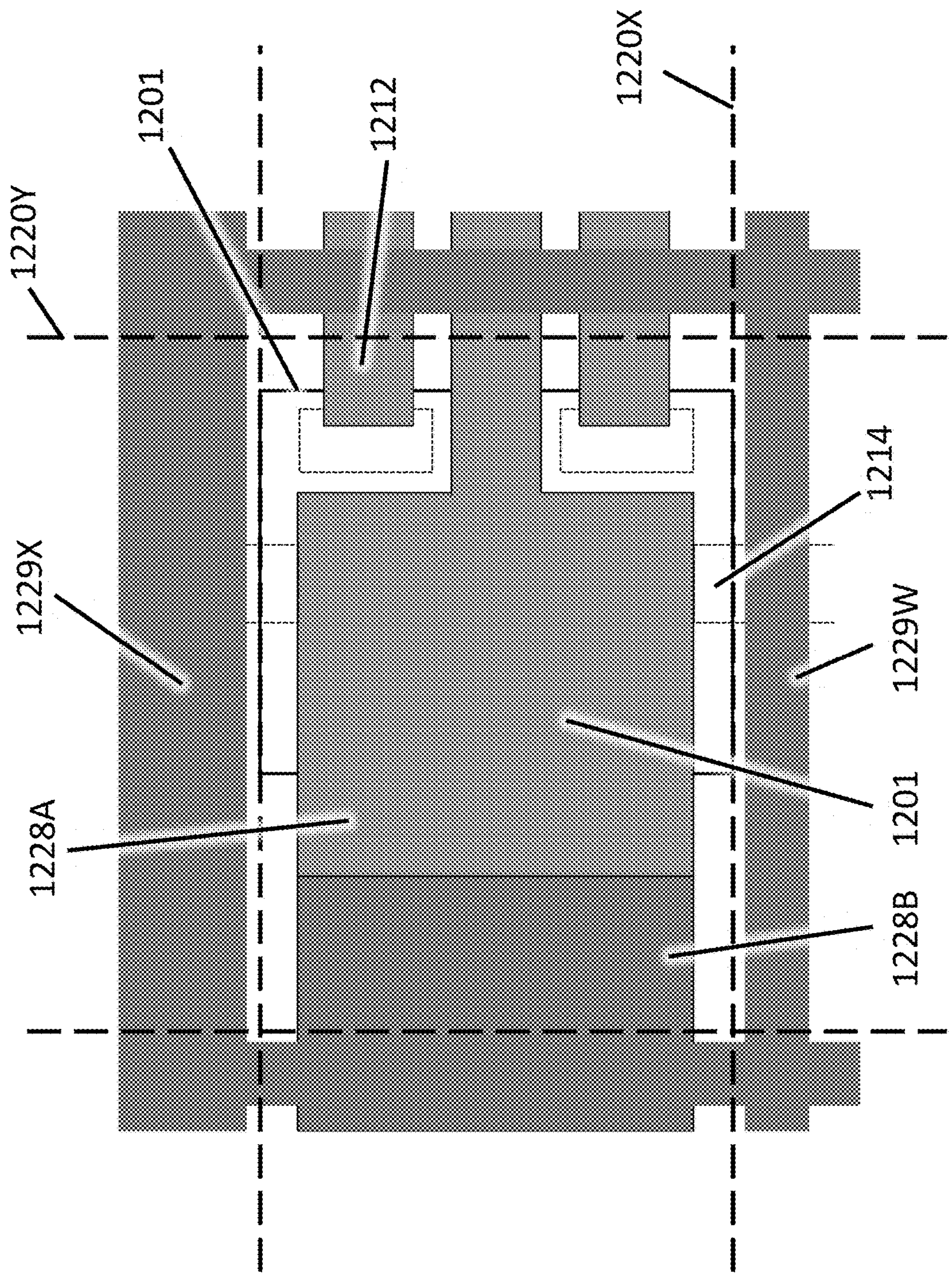

FIG. 35B comprises an underside view of an alternative embodiment of a wave-solderable heat tab power USMP leadframe.

Figure 35C:
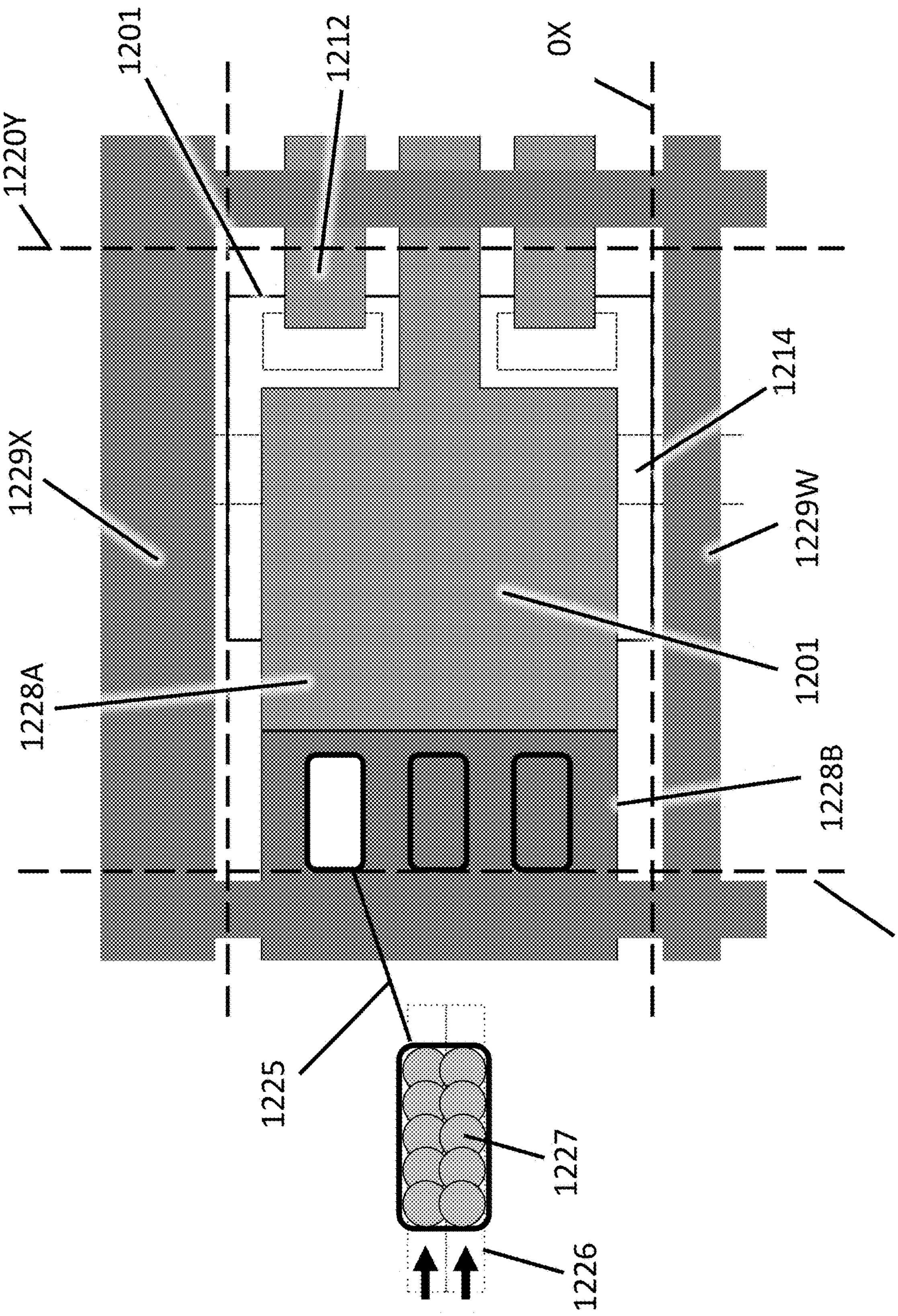

FIG. 35C comprises an underside view of a USMP power package illustrating laser formation of a thermal comb.

Figure 36A:
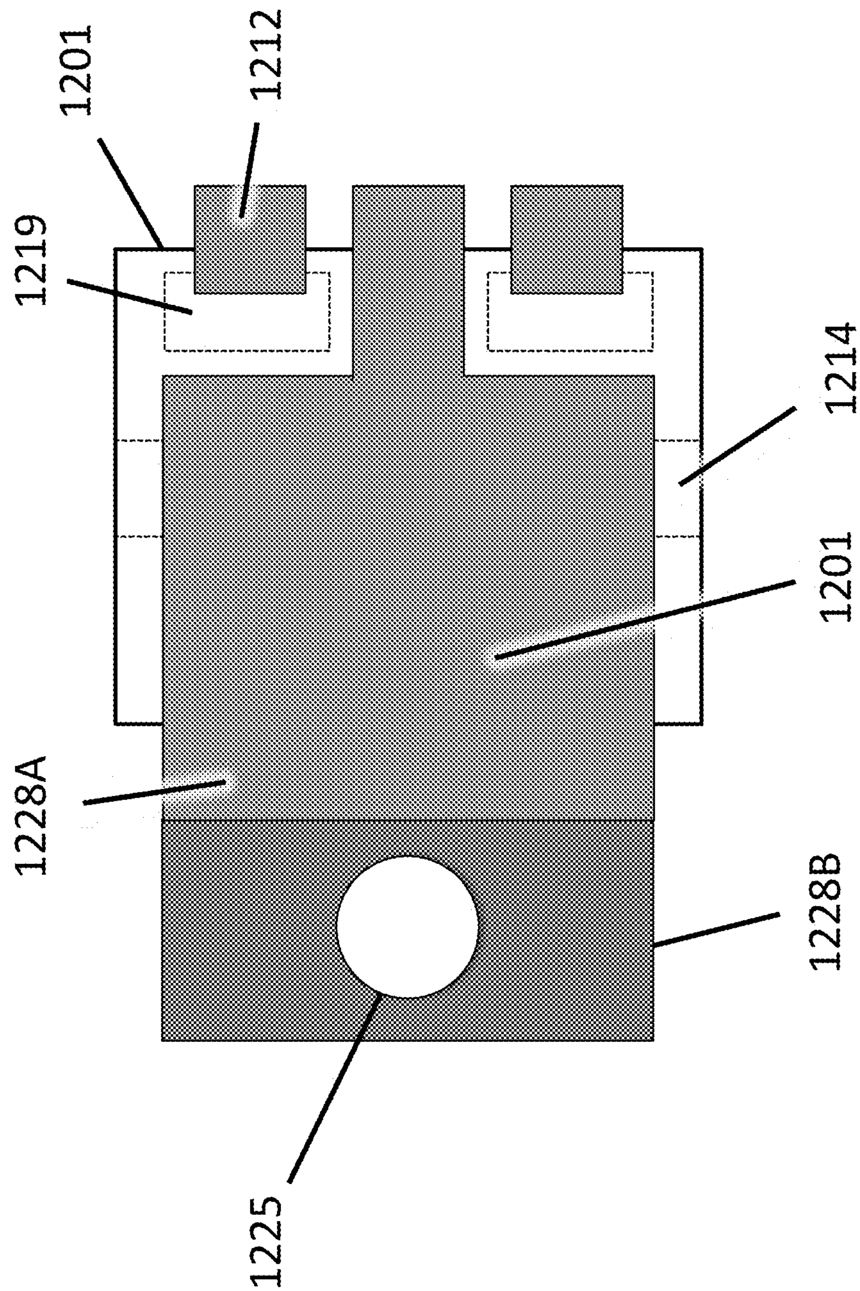

FIG. 36A comprises an underside view of a wave-solderable heat tab power USMP with a bolt-hole.

Figure 36B:
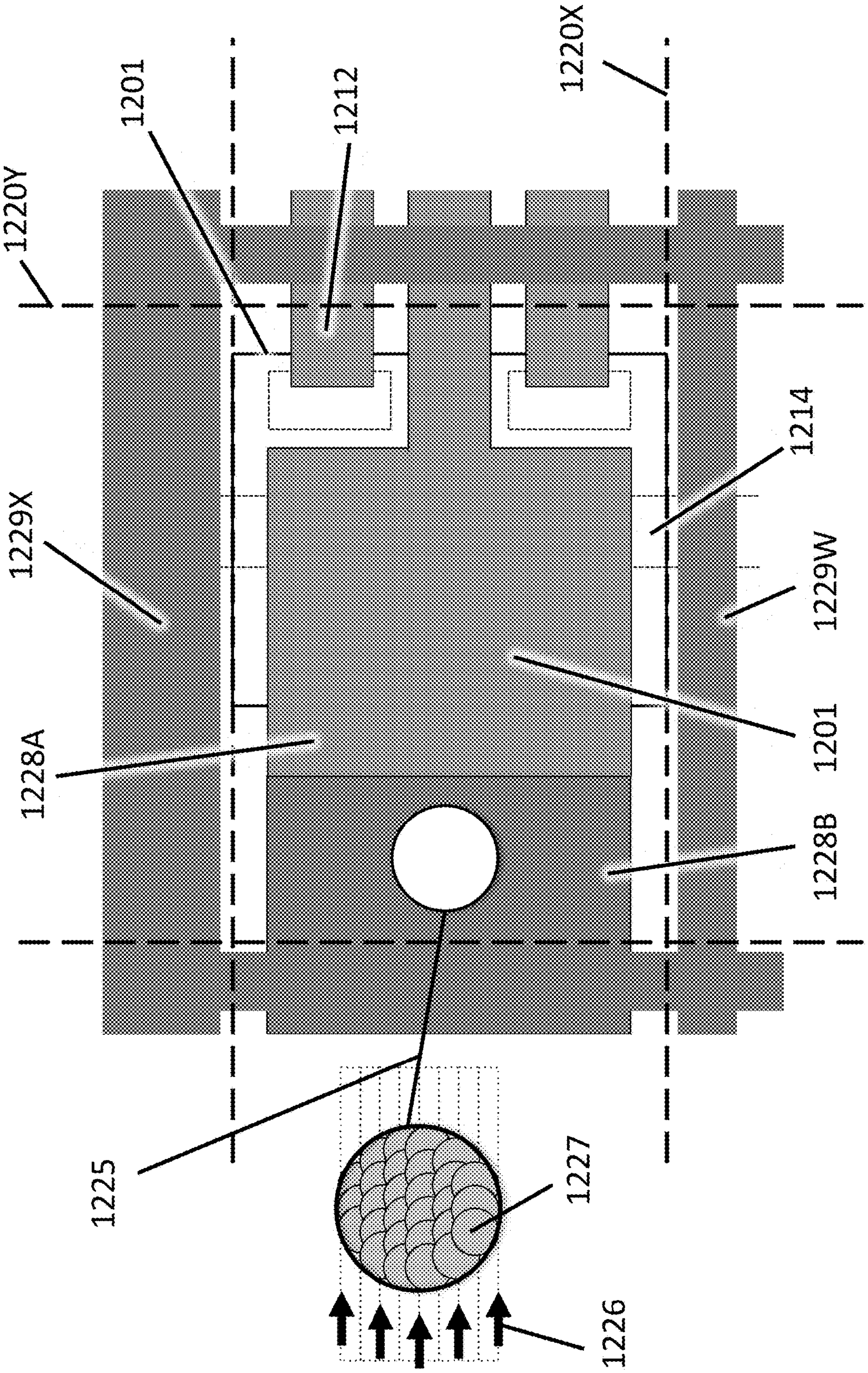

FIG. 36B illustrates laser paths for forming a bolt hole in a wave-solderable heat tab power USMP.

Figure 37:
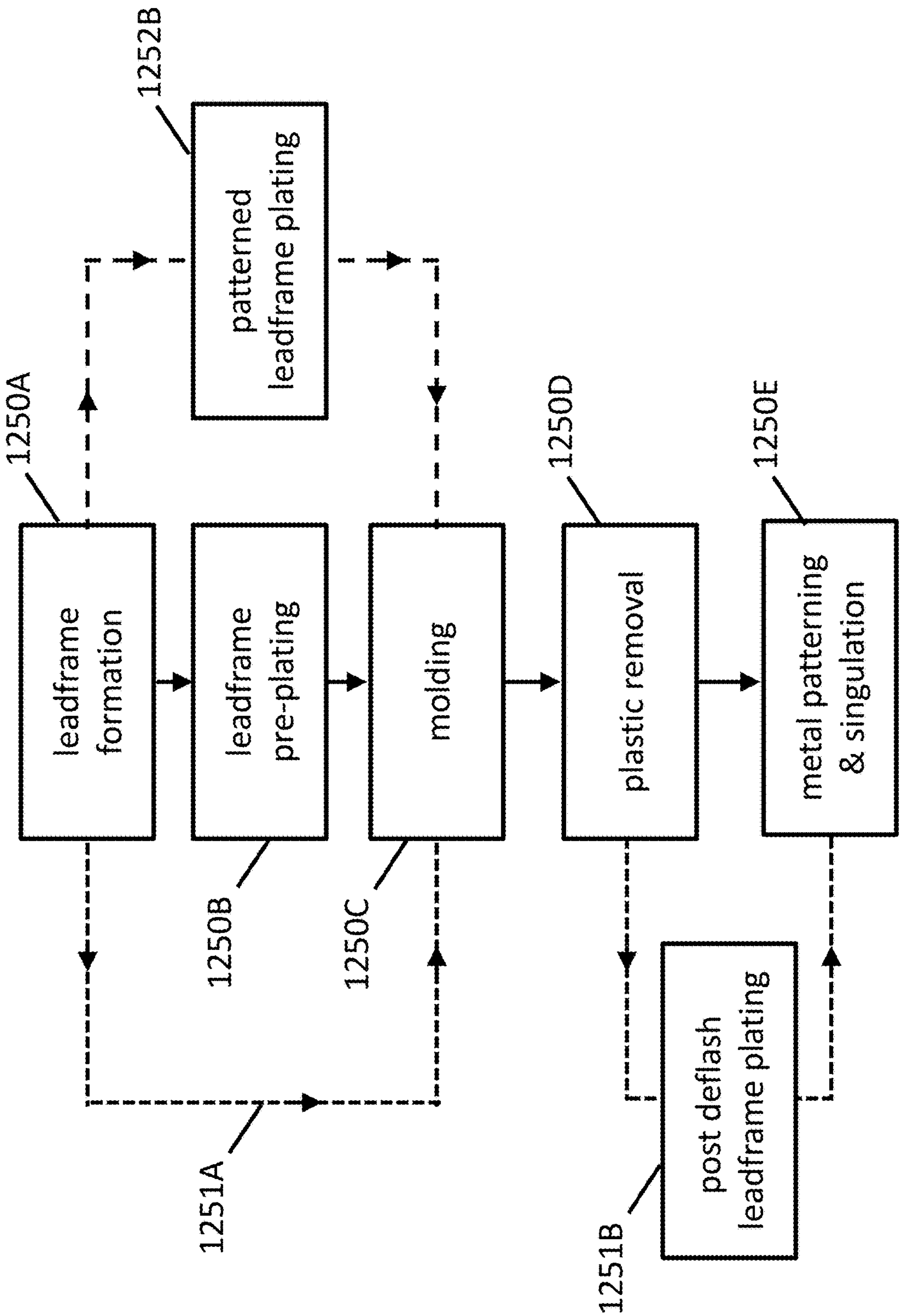

FIG. 37 illustrates a block diagram of various manufacturing flows for USMP leadframe plating.

Figure 38:
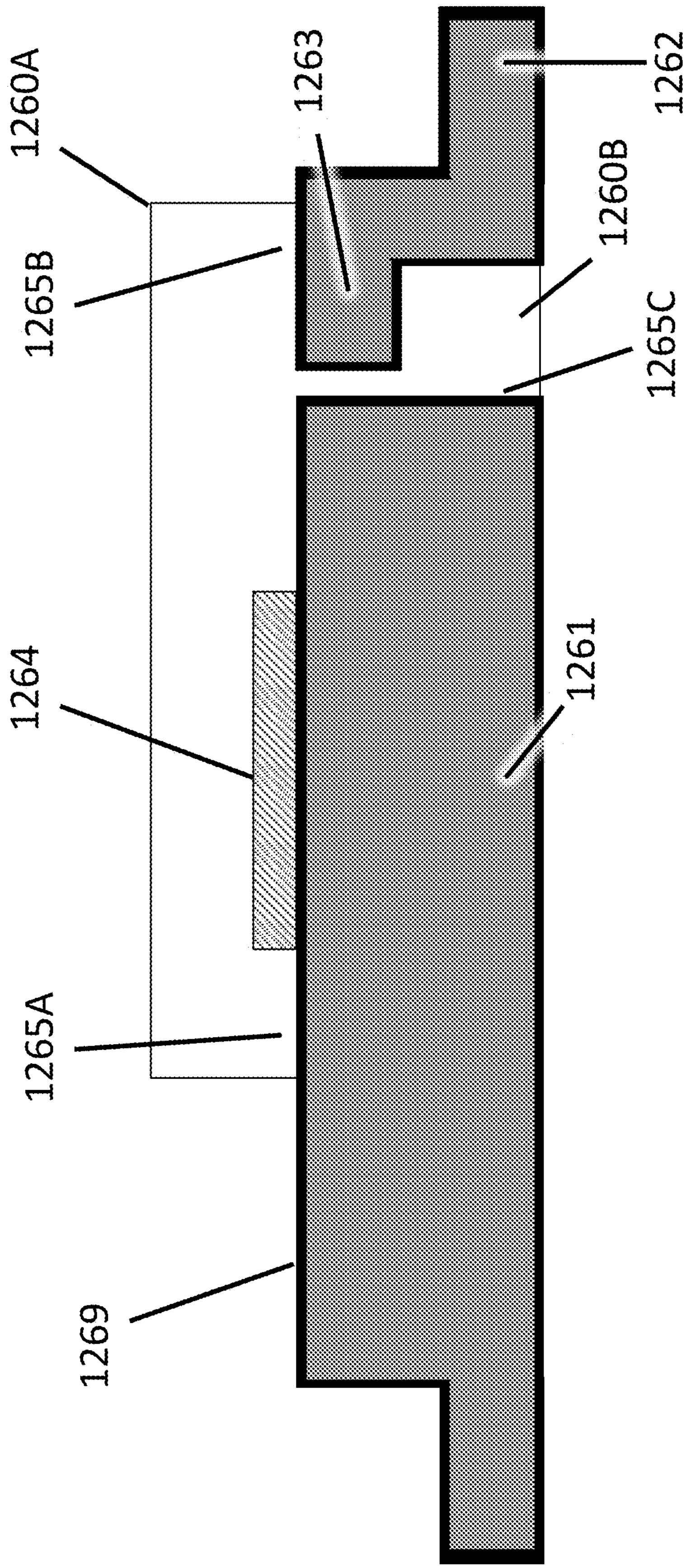

FIG. 38 illustrates a cross sectional view of a USMP pre-plated power package leadframe.

Figure 39:
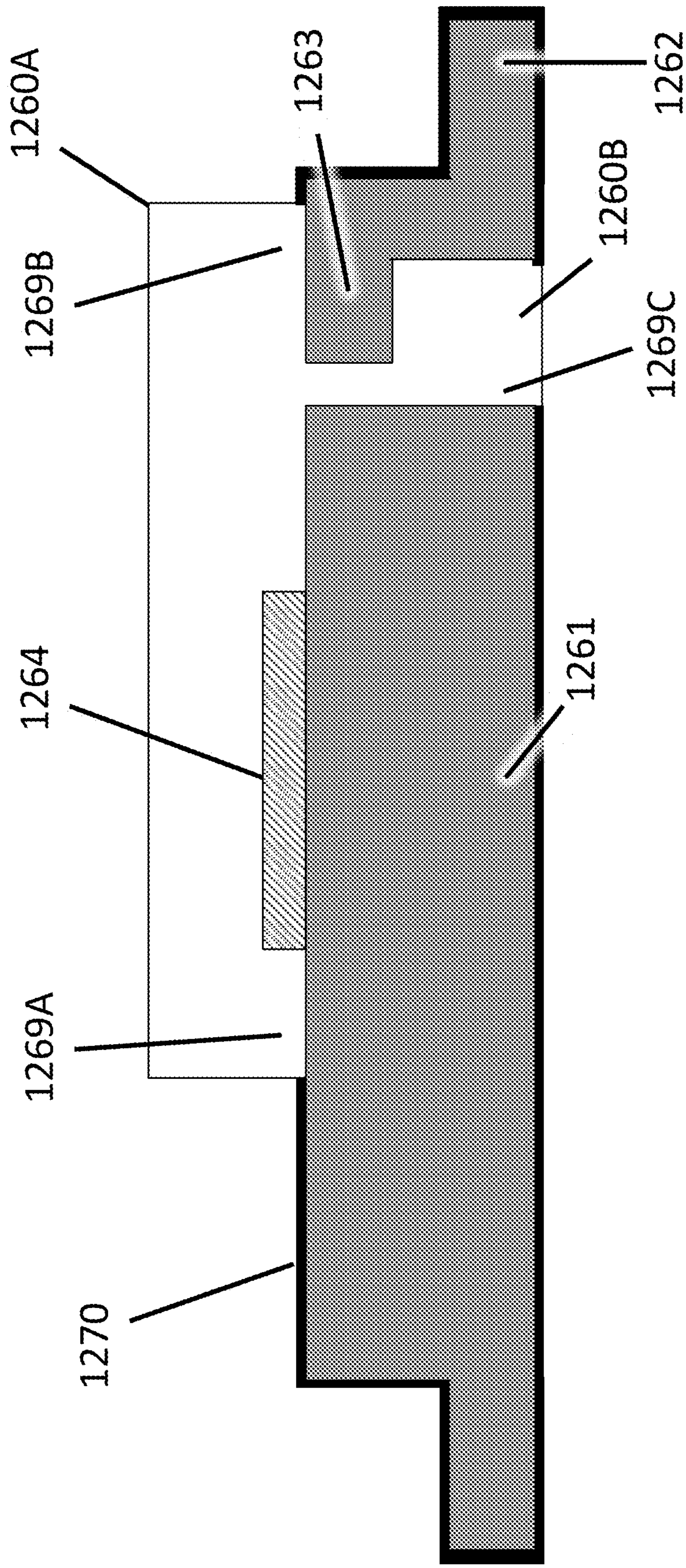

FIG. 39 illustrates a cross sectional view of a USMP formed using plating after molding.

Figure 40:
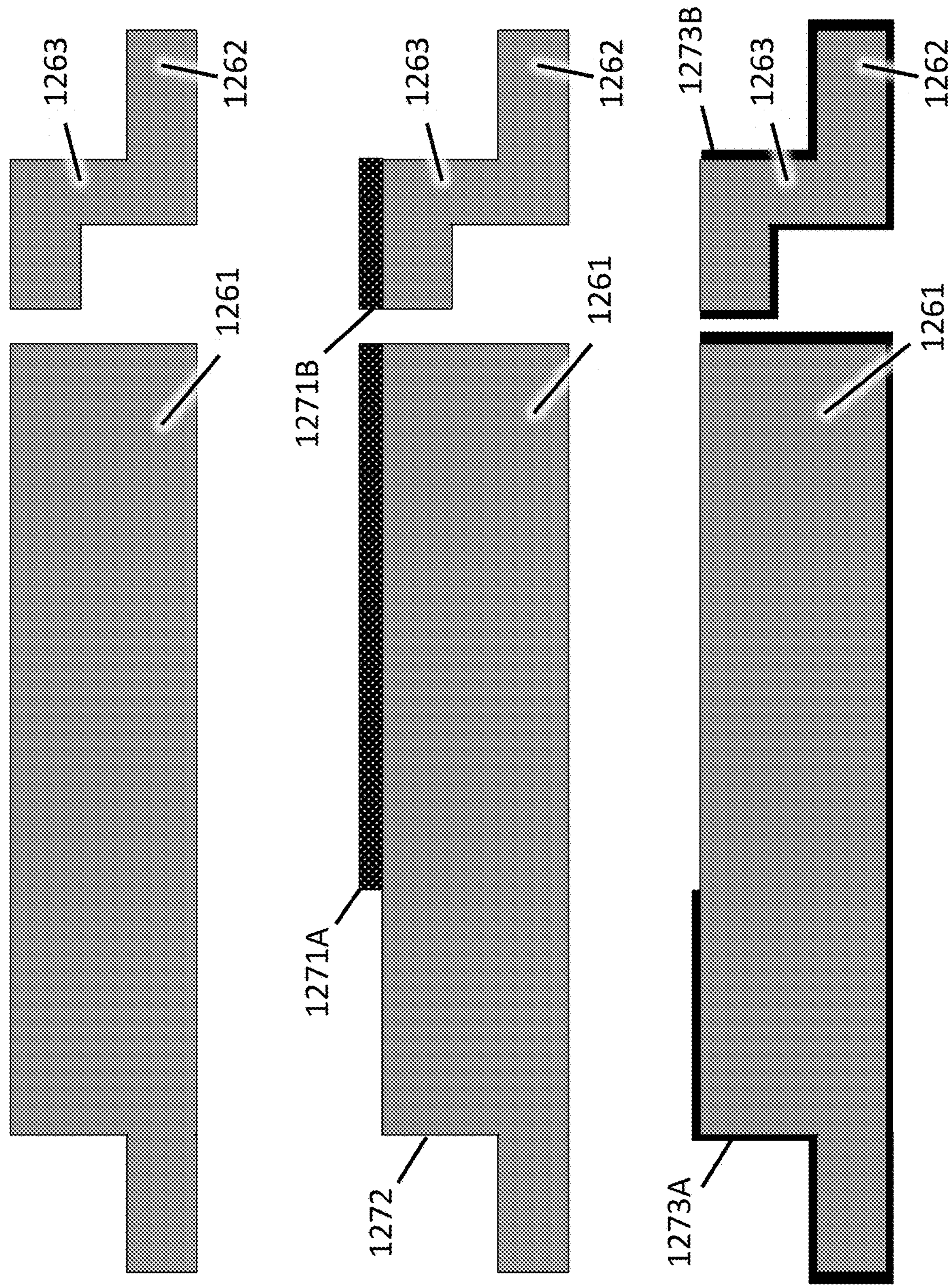

FIG. 40 illustrates sequential cross-sectional views of USMP fabrication comprising selective leadframe plating.

Figure 41A:
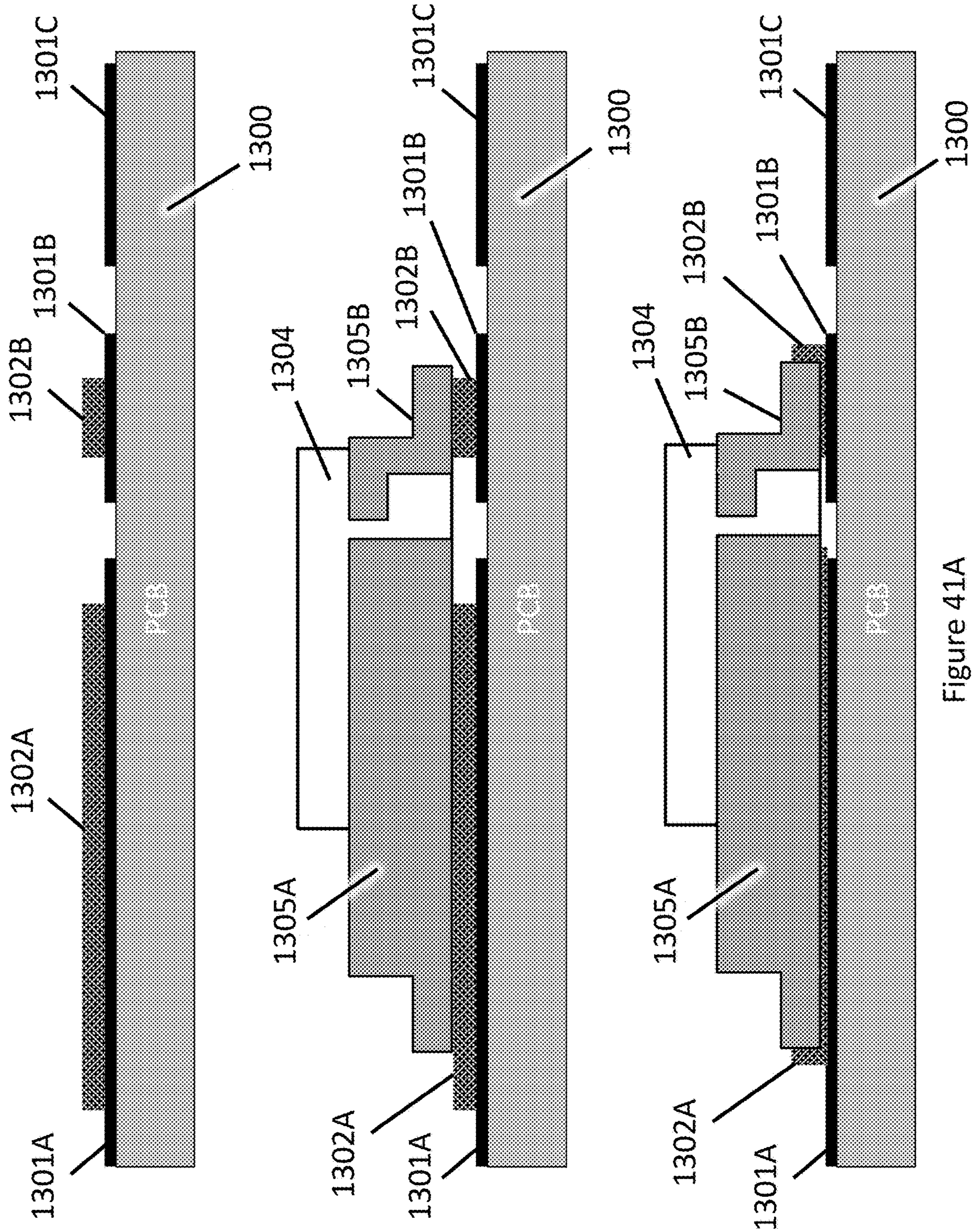

FIG. 41A illustrates sequential cross-sectional views of PCB assembly of a USMP utilizing PCB solder printing.

Figure 41B:
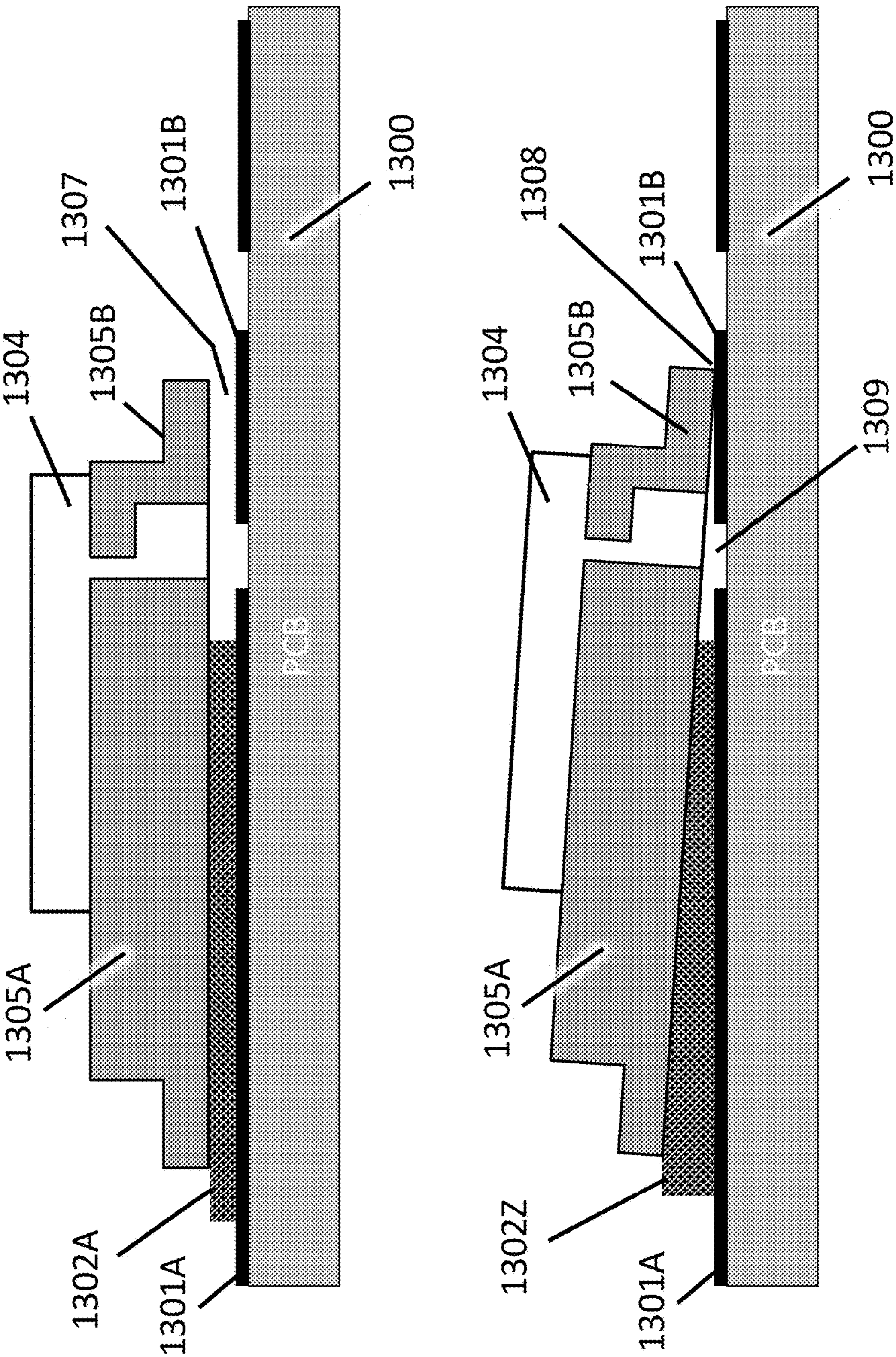

FIG. 41B illustrates cross sections depicting potential manufacturing issues involving die tilt during USMP assembly.

Figure 42A:
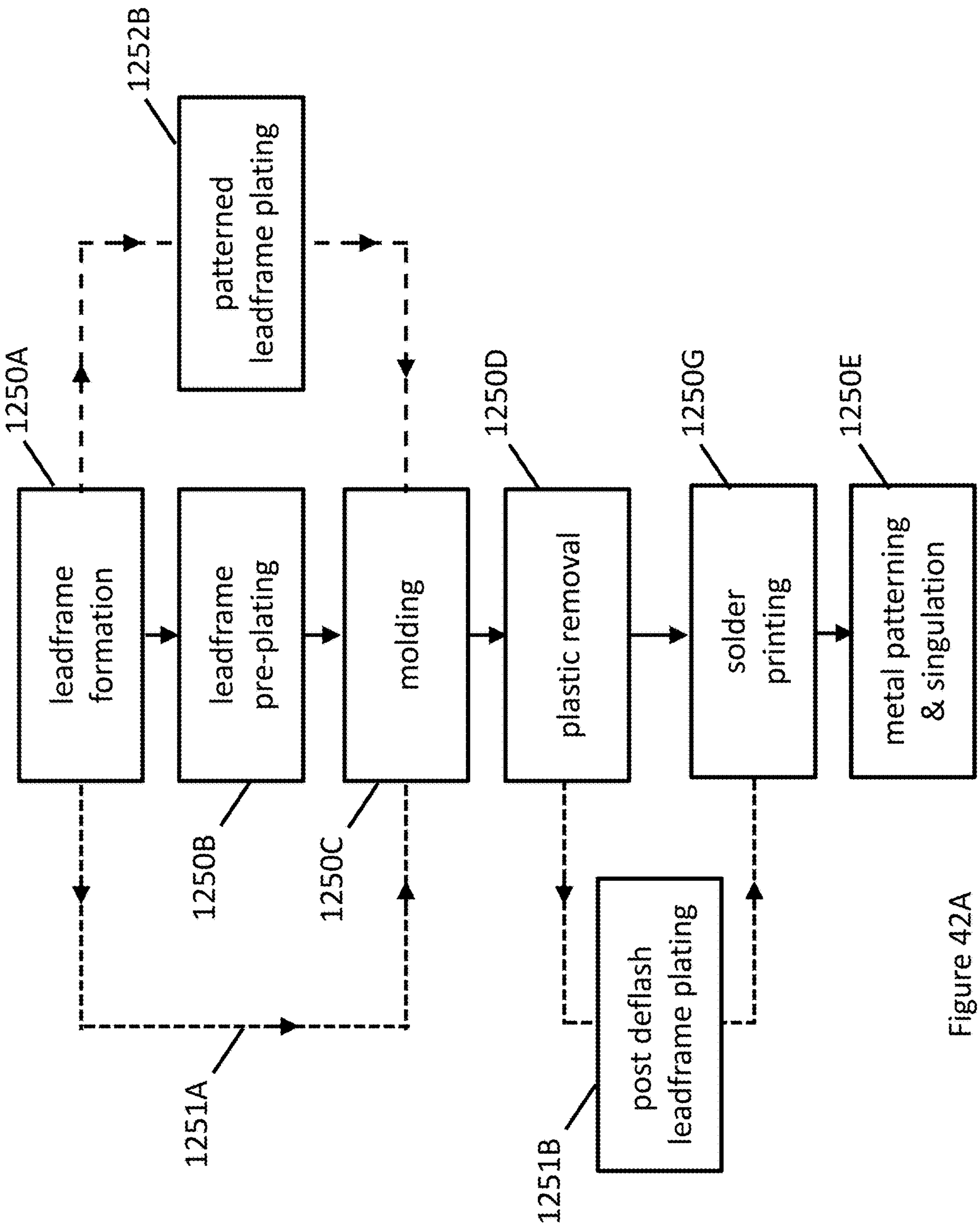

FIG. 42A illustrates a block diagram of various manufacturing flows for USMP fabrication including solder printing.

Figure 42B:
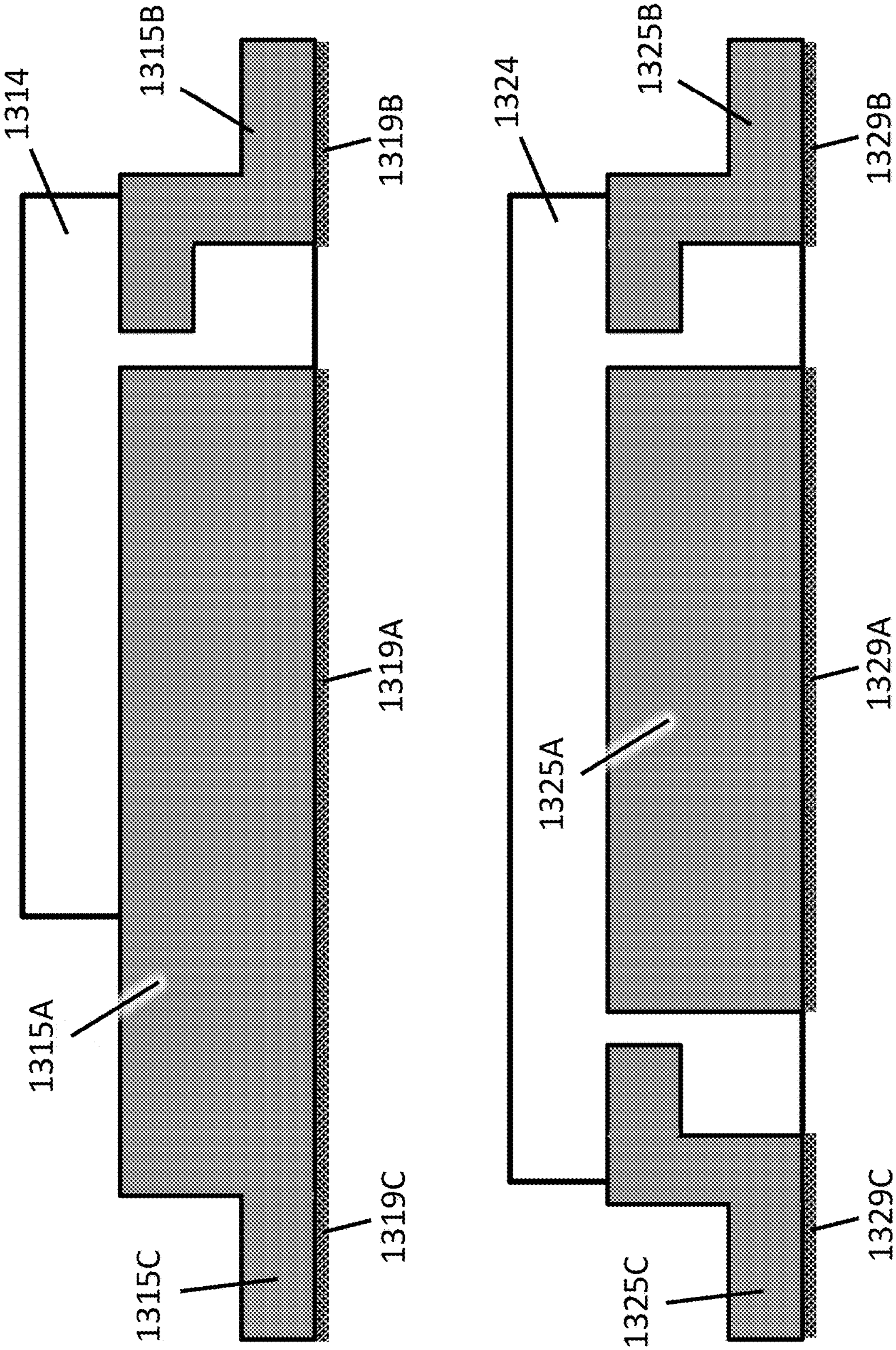

FIG. 42B illustrates USMP cross sections of power and exposed die pad IC packages utilizing USMP pre-printed solder.

Figure 43A:
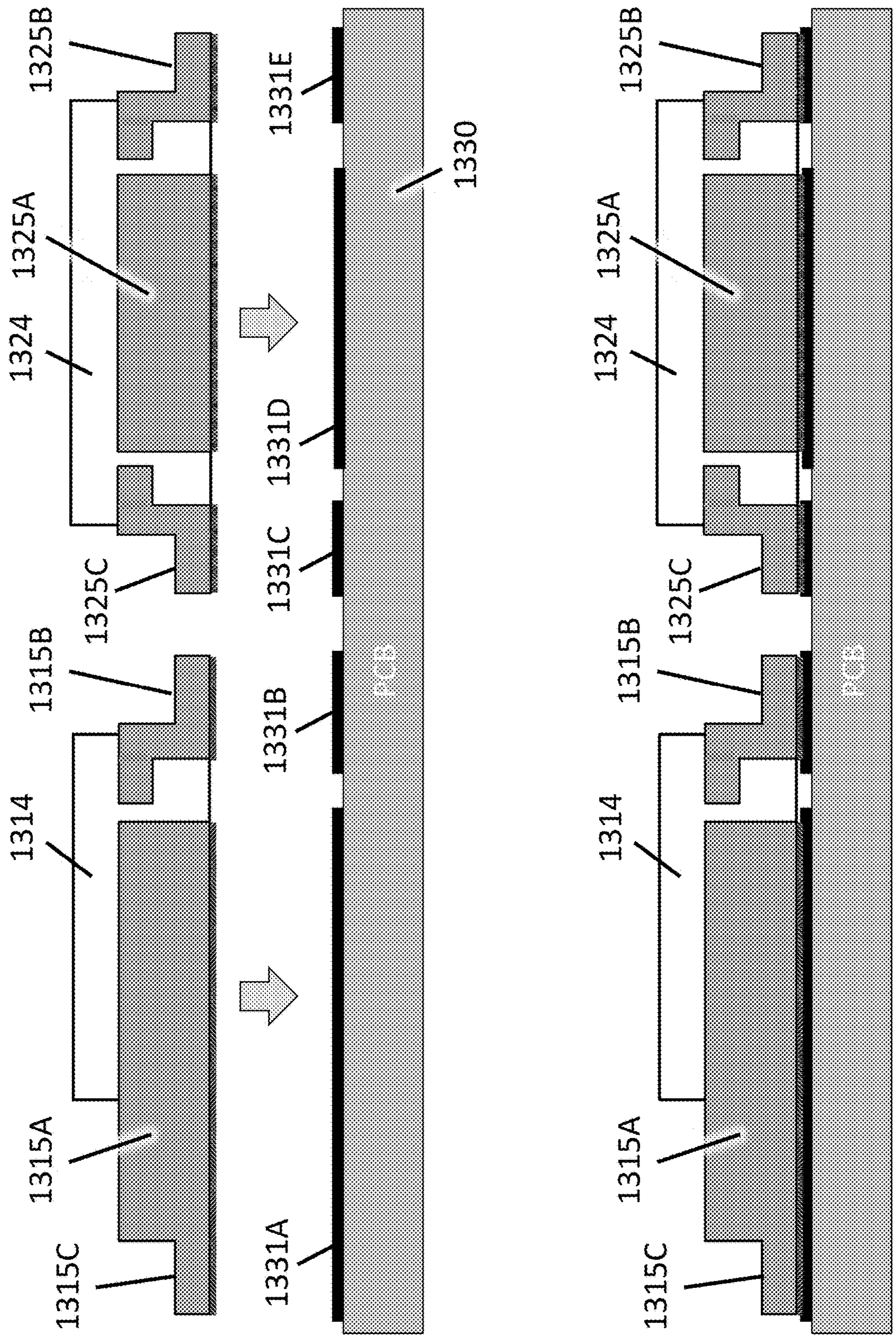

FIG. 43A illustrates a cross sectional representation of PCB USMP assembly steps utilizing USMP pre-printed solder.

Figure 43B:
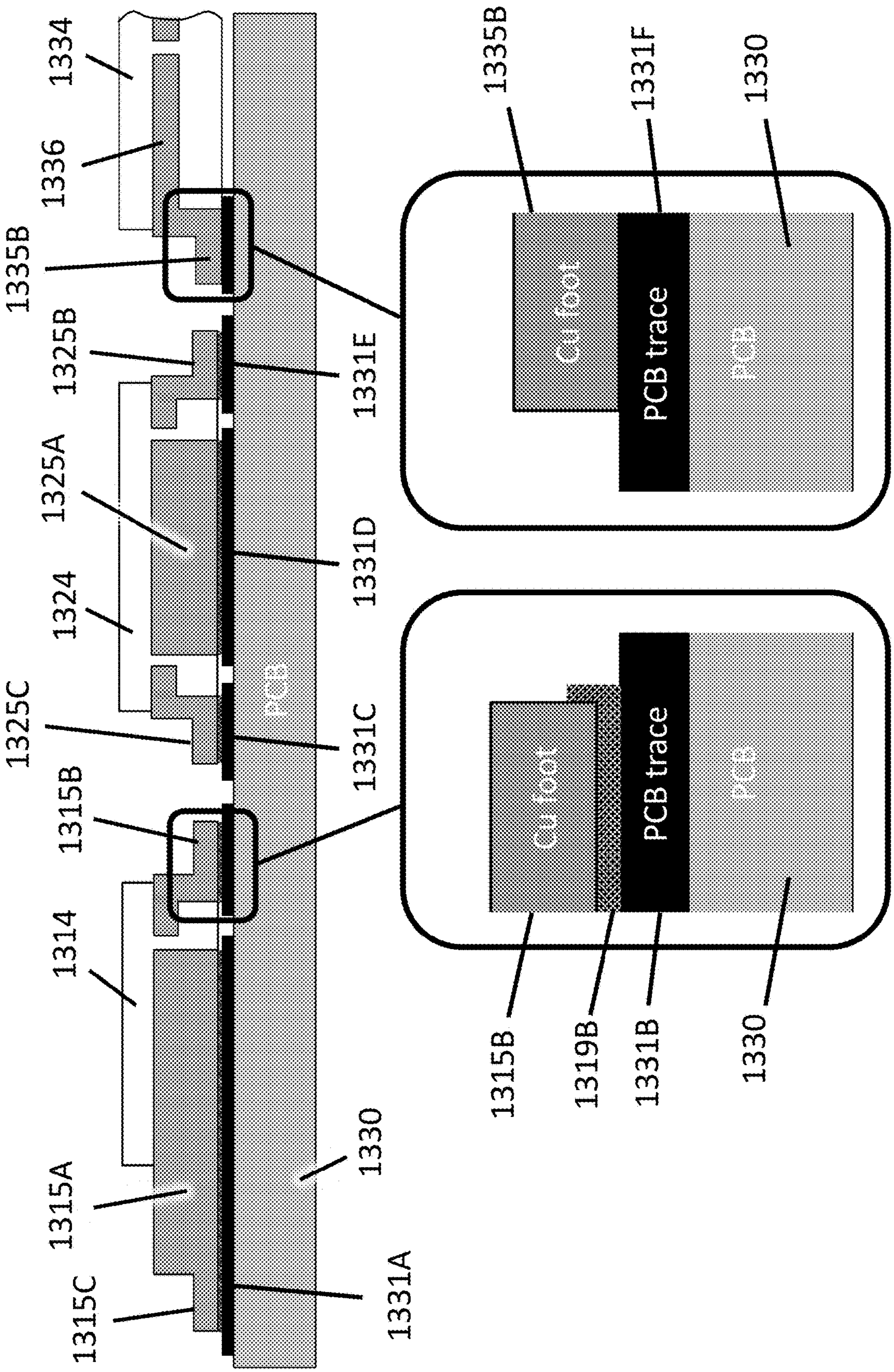

FIG. 43B illustrates a cross sectional representation of PCB assembly prior to wave-soldering, including both USMP power packages and USMP IC packages.

Figure 43C:
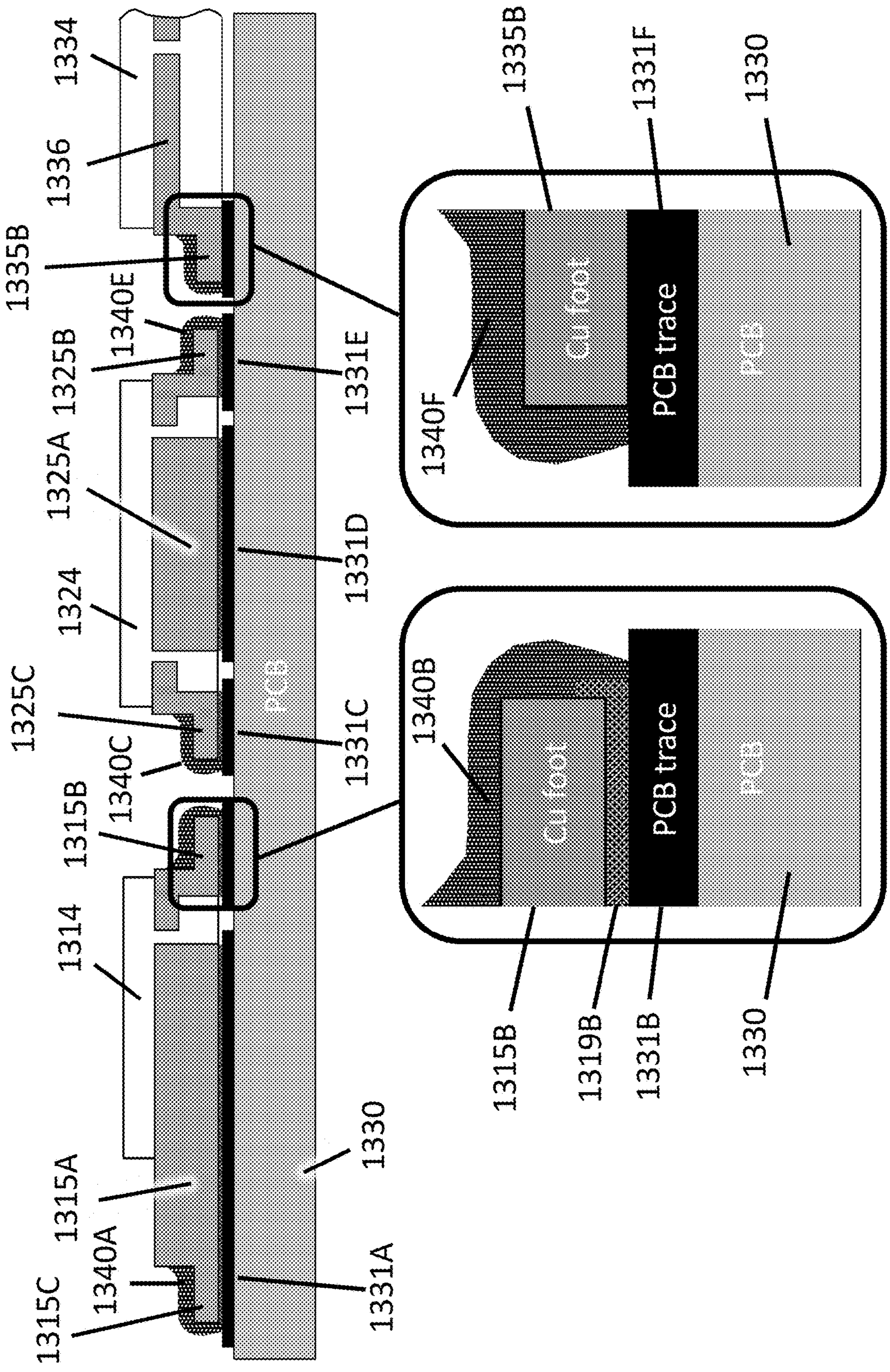

FIG. 43C illustrates a cross sectional representation of PCB assembly after wave-soldering, including both USMP power packages and USMP IC packages.

Figure 44A:
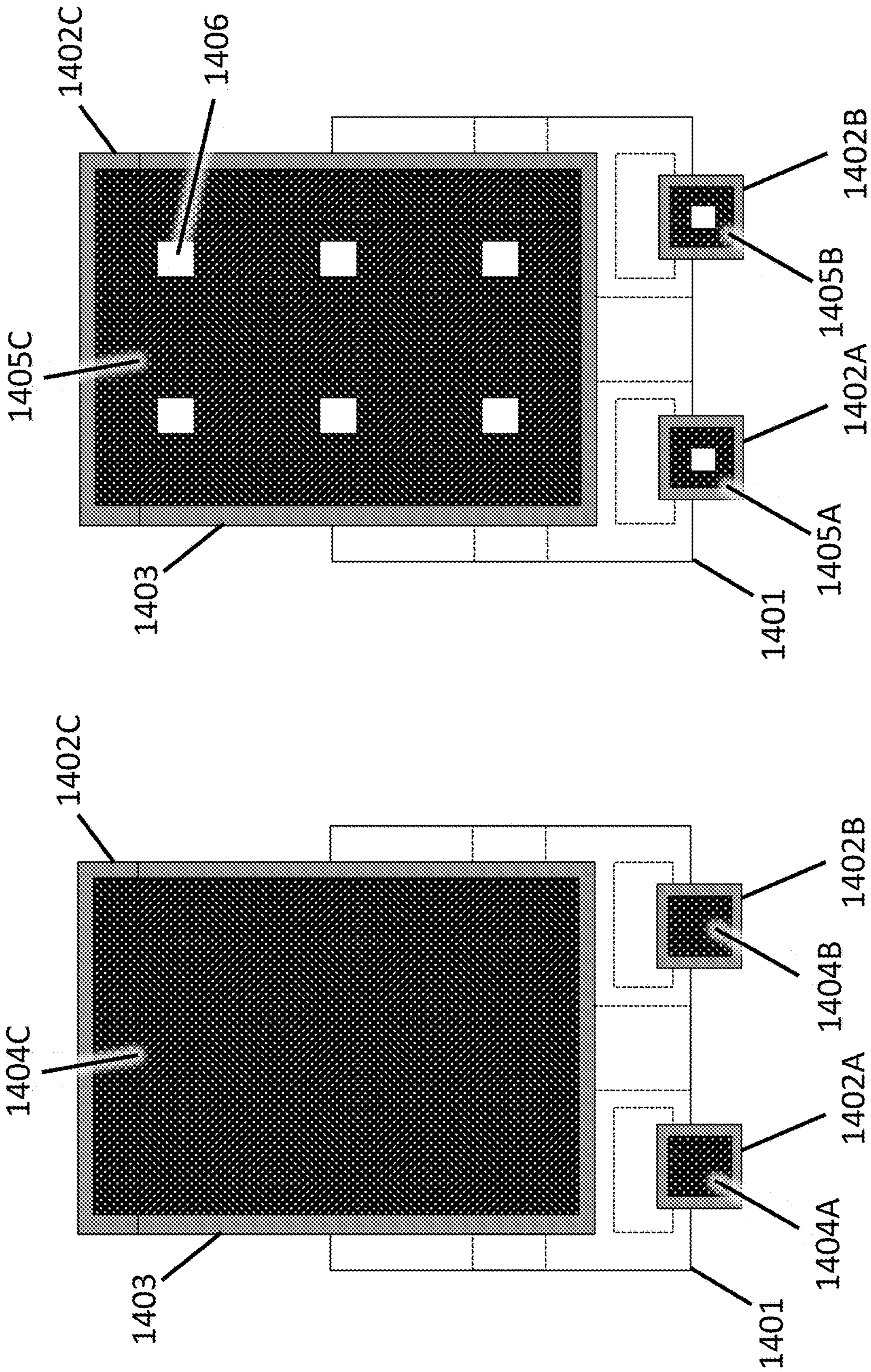

FIG. 44A illustrates USMP power packages with uniform and patterned pre-printed solder.

Figure 44B:
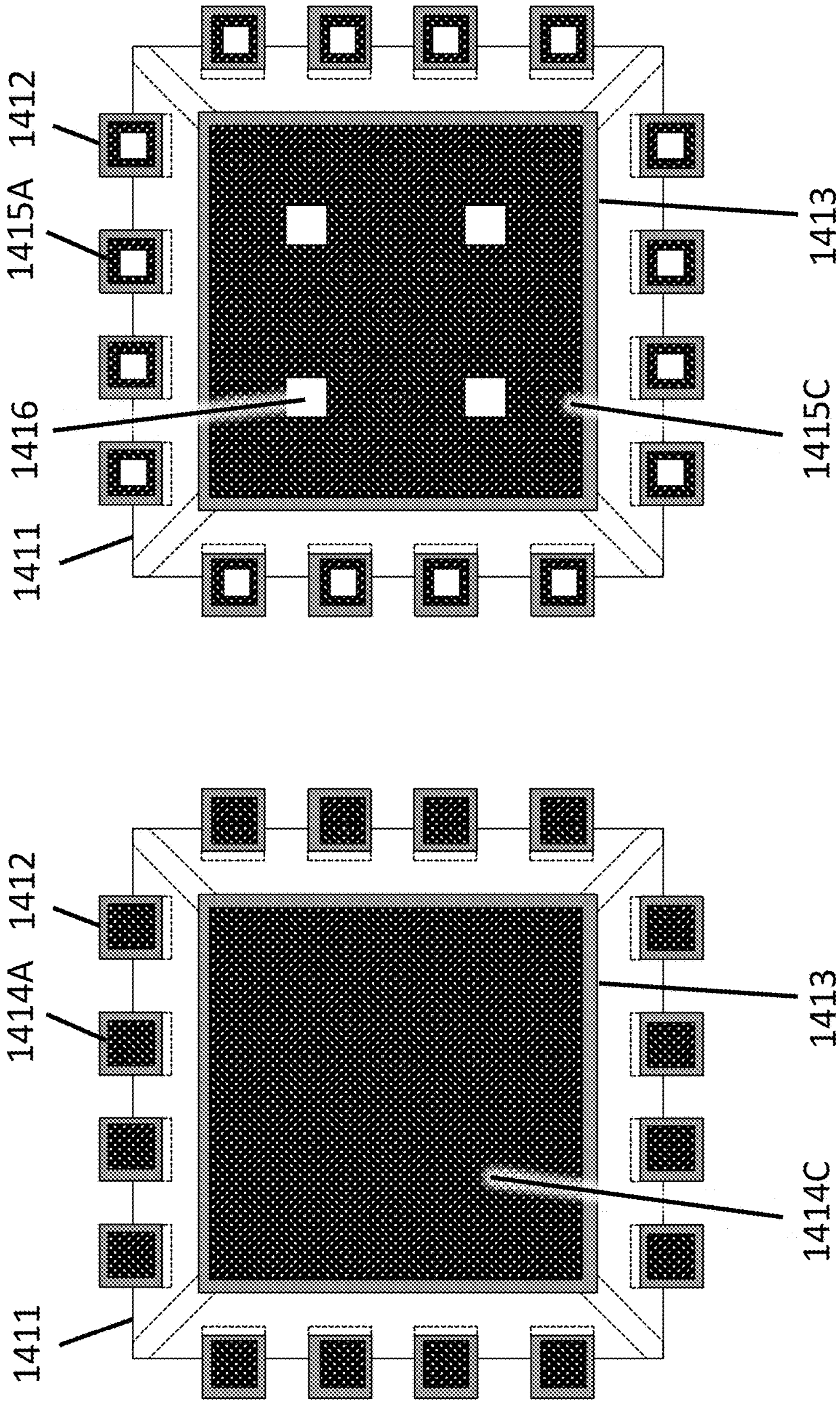

FIG. 44B illustrates USMP integrated circuit quad packages, both with uniform and patterned USMP pre-printed solder.

Figure 44C:
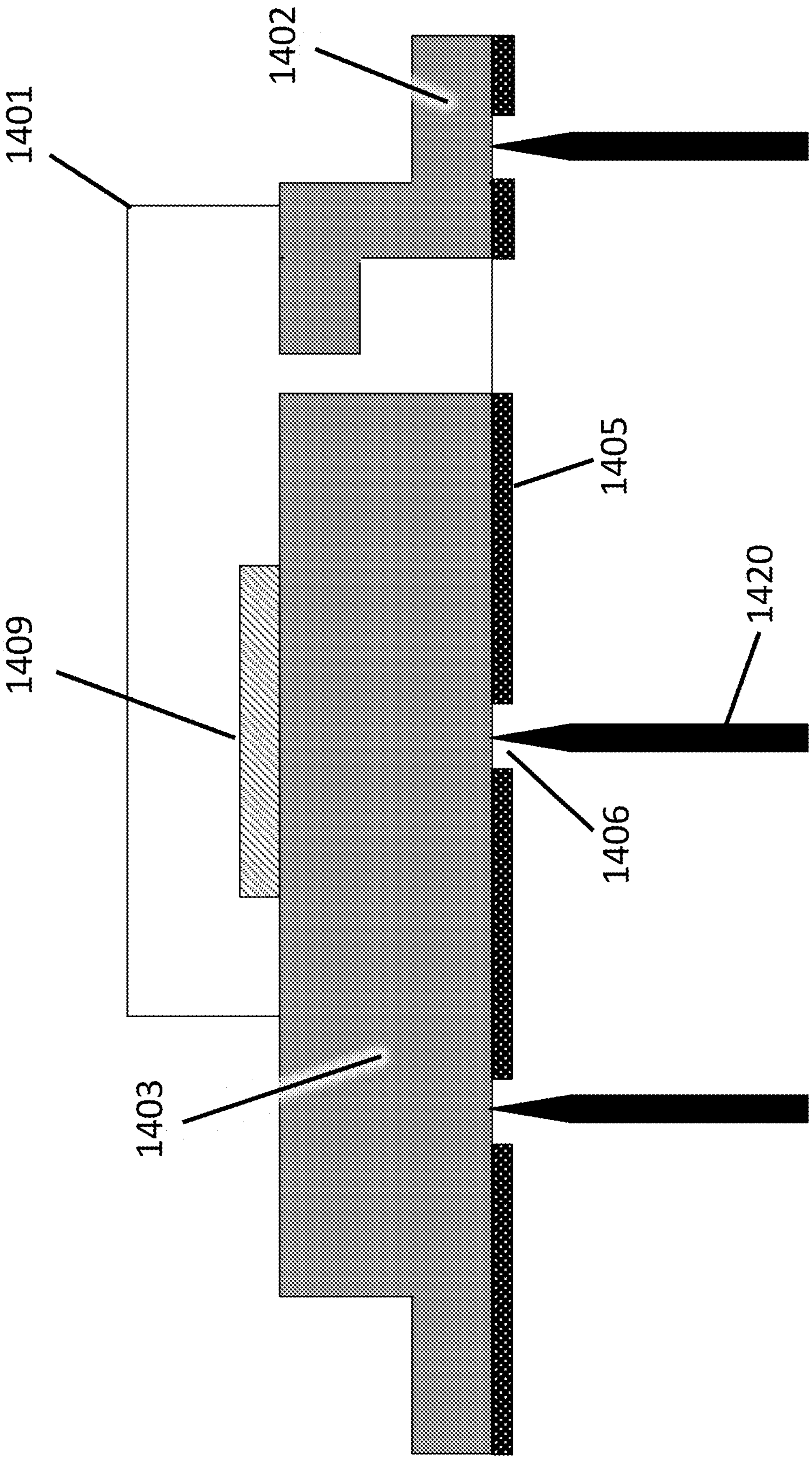

FIG. 44C illustrates test probe placement using pre-printed solder of USMP fabricated packages.

Figure 45:
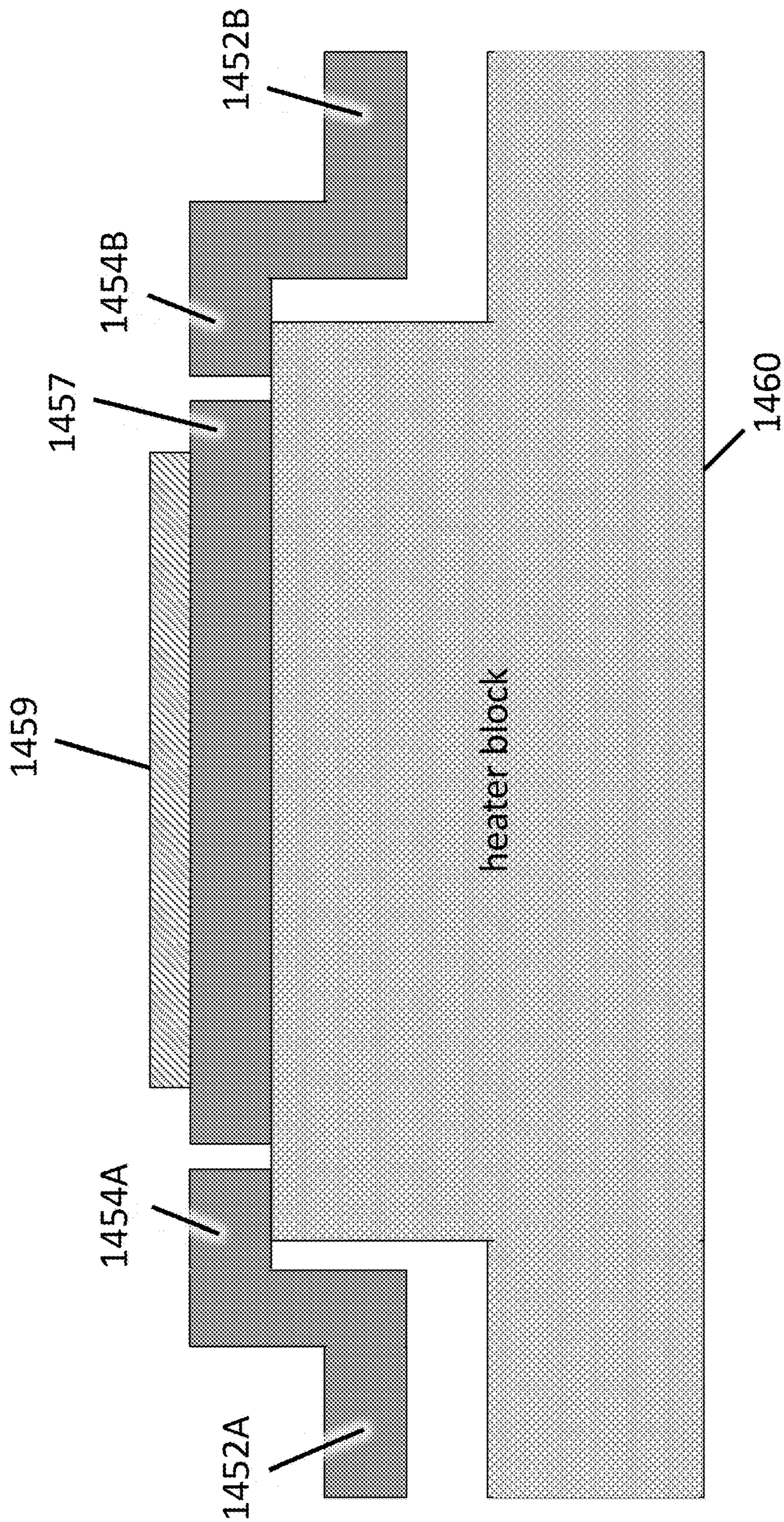

FIG. 45 illustrates a cross section of an isolated die pad with customized conformal heater blocks required in USMP manufacturing.

Figure 46:
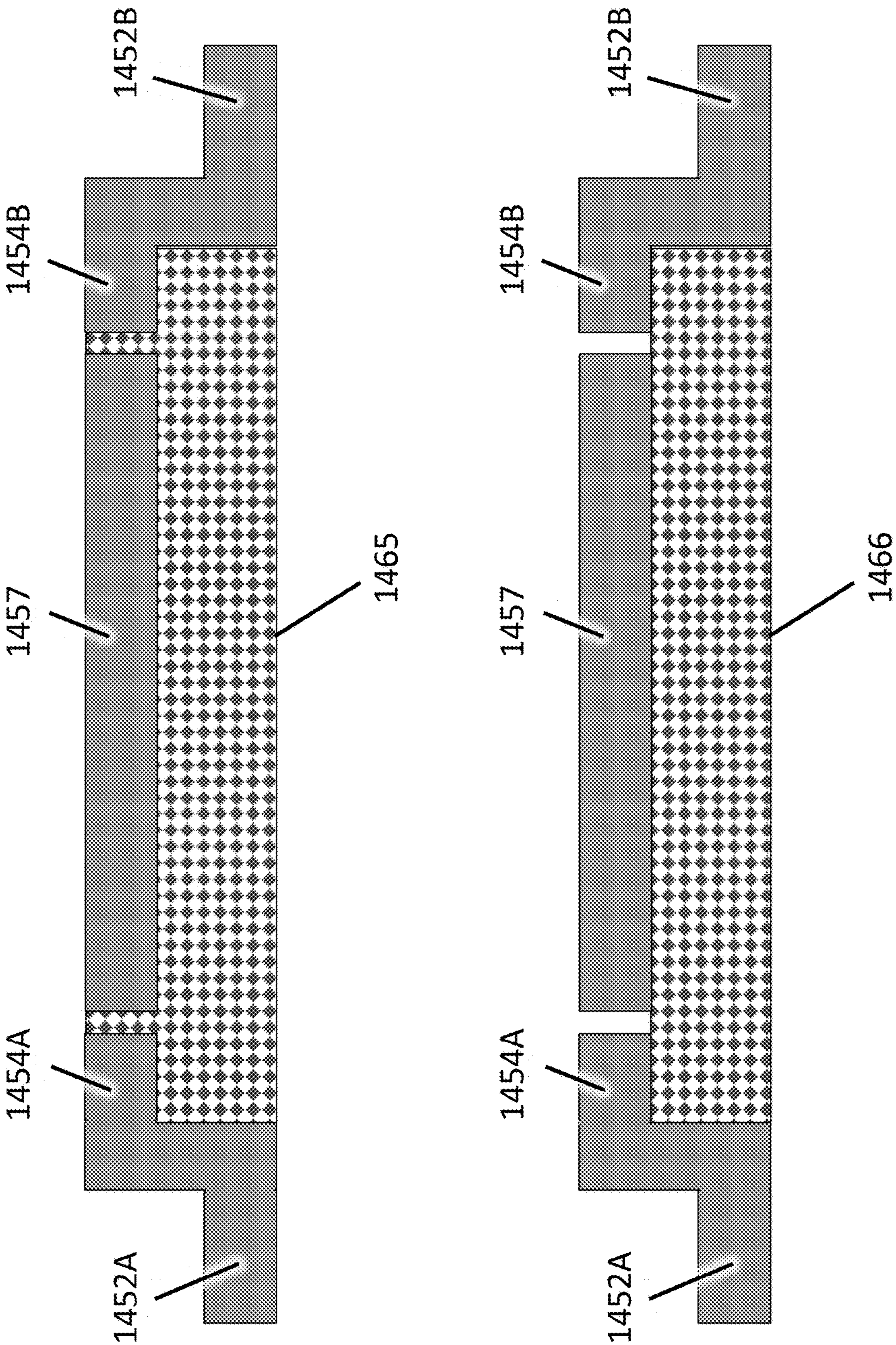

FIG. 46 illustrates cross sections of two variants of isolated die pad USMPs utilizing a thermally conductive electrically insulating pre-mold compound.

Figure 47:
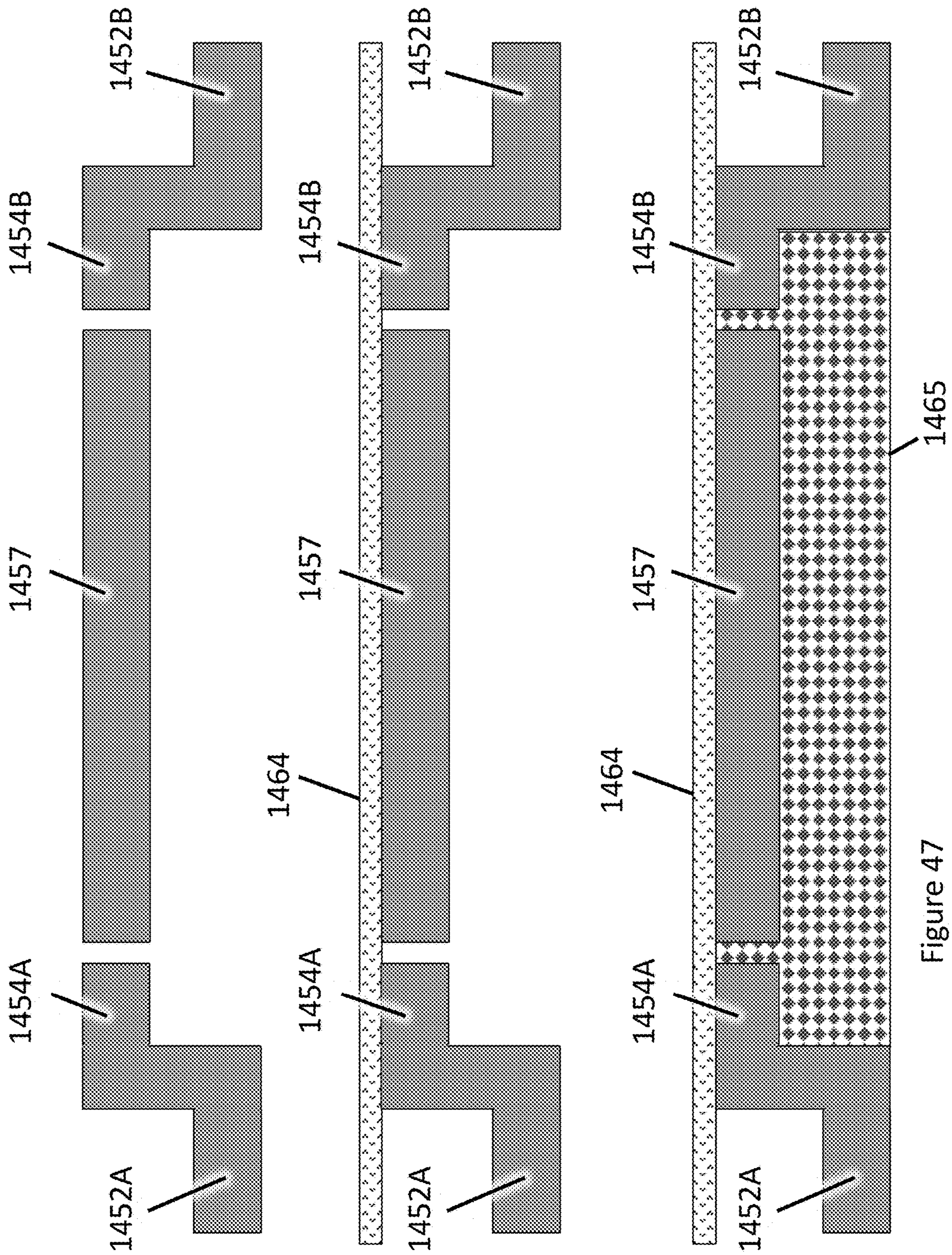

FIG. 47 illustrates the fabrication flow chart of an isolated die pad USMP with a thermally conductive electrically insulating pre-mold compound.

Figure 48:
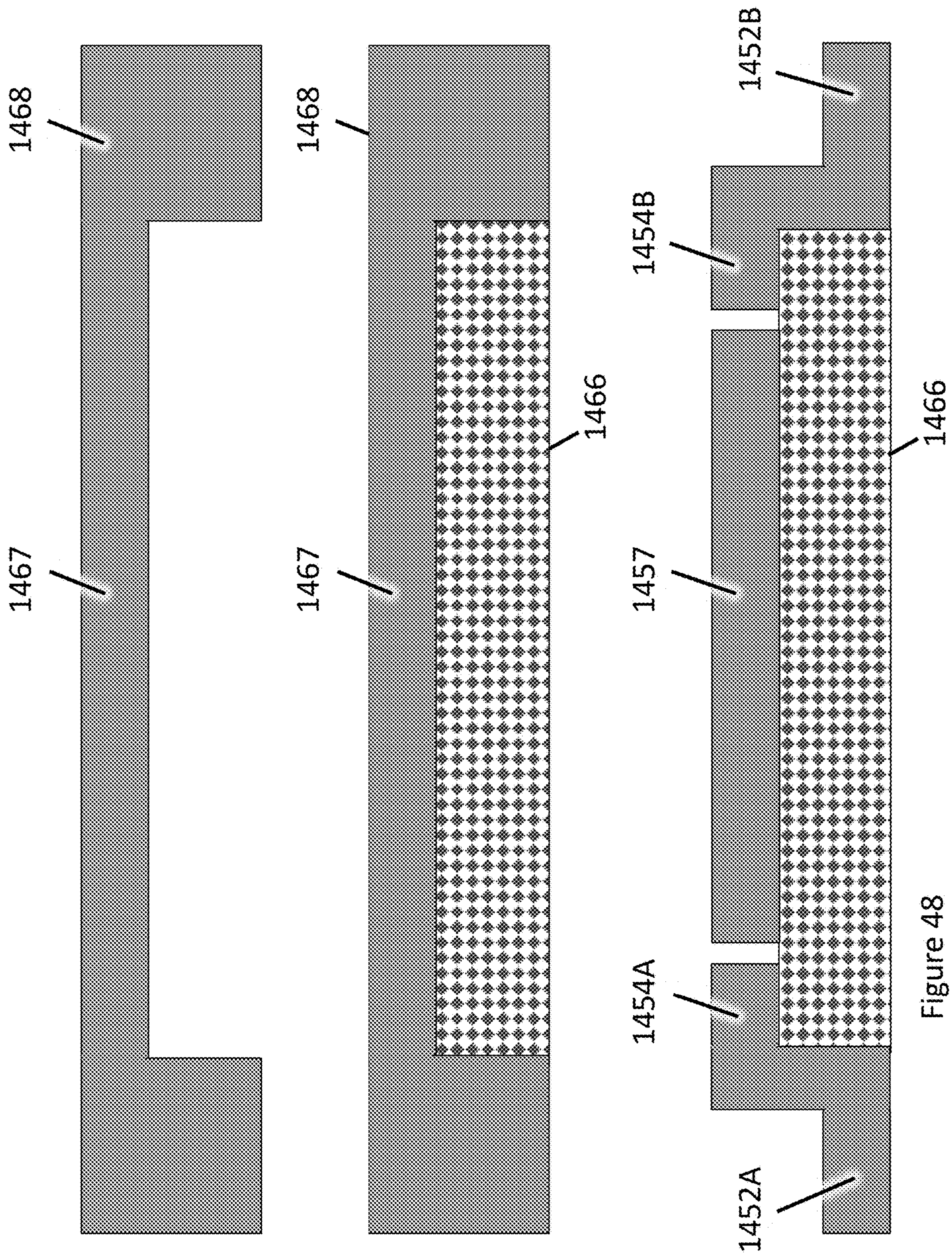

FIG. 48 illustrates an alternative embodiment of isolated die pad USMP fabrication utilizing thermally conductive electrically insulating pre-mold compound.

Figure 49A:
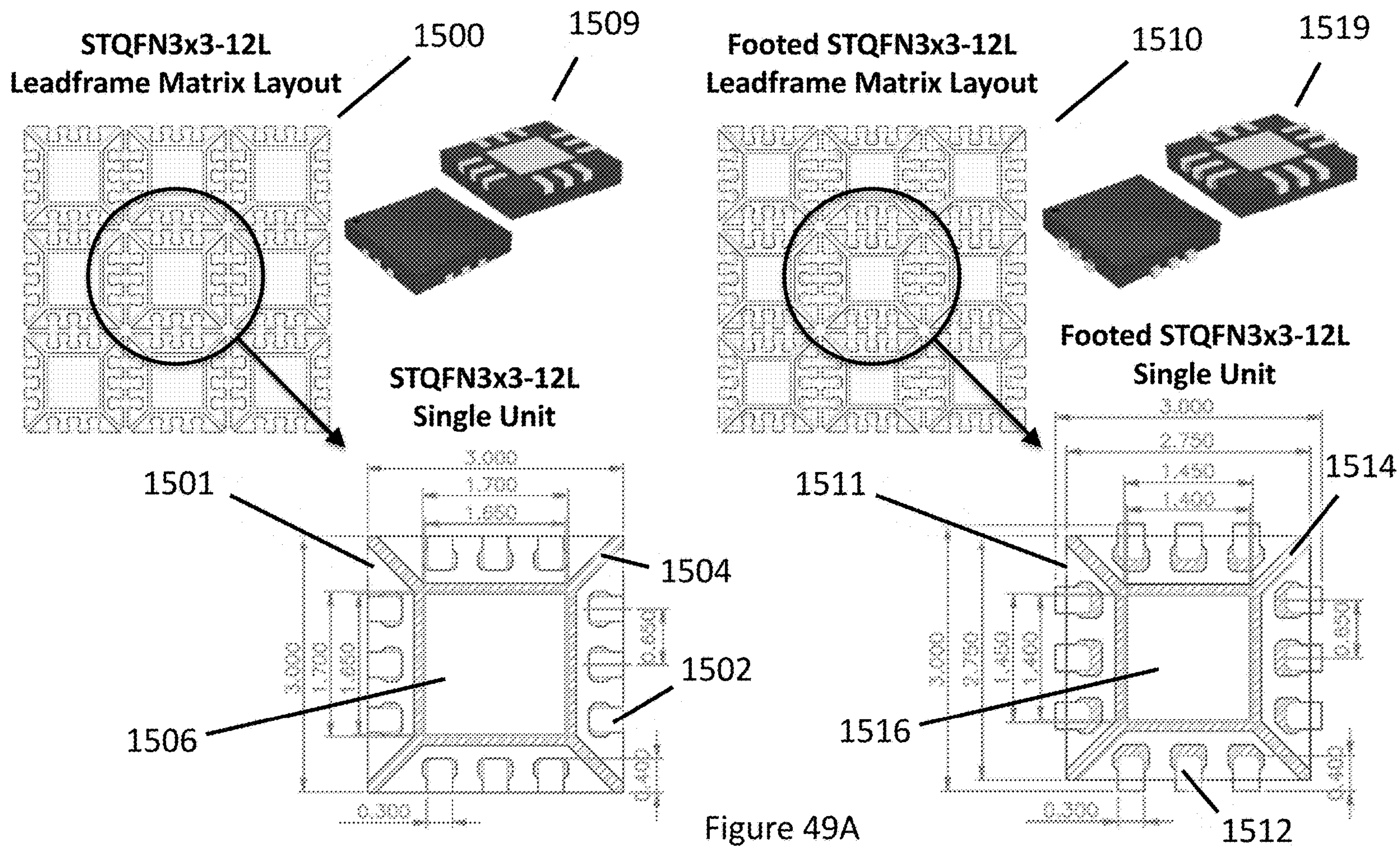

FIG. 49A illustrates an overhead view of a saw type QFN3×3-12L leadframe and its corresponding footed USMP equivalent.

Figure 49B:
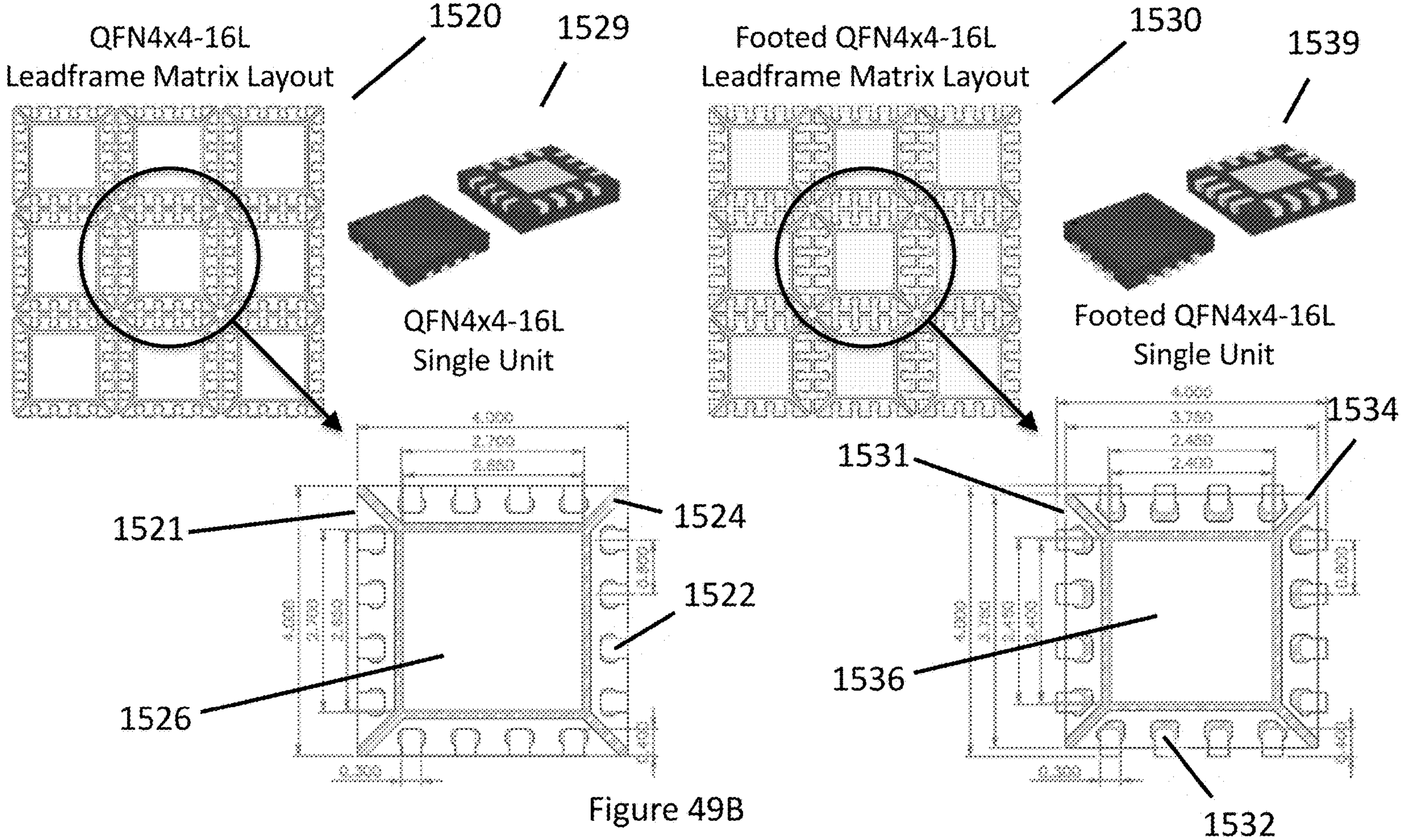

FIG. 49B illustrates an overhead view of a saw type QFN4×4-16L leadframe and its corresponding footed USMP equivalent.

Figure 49C:
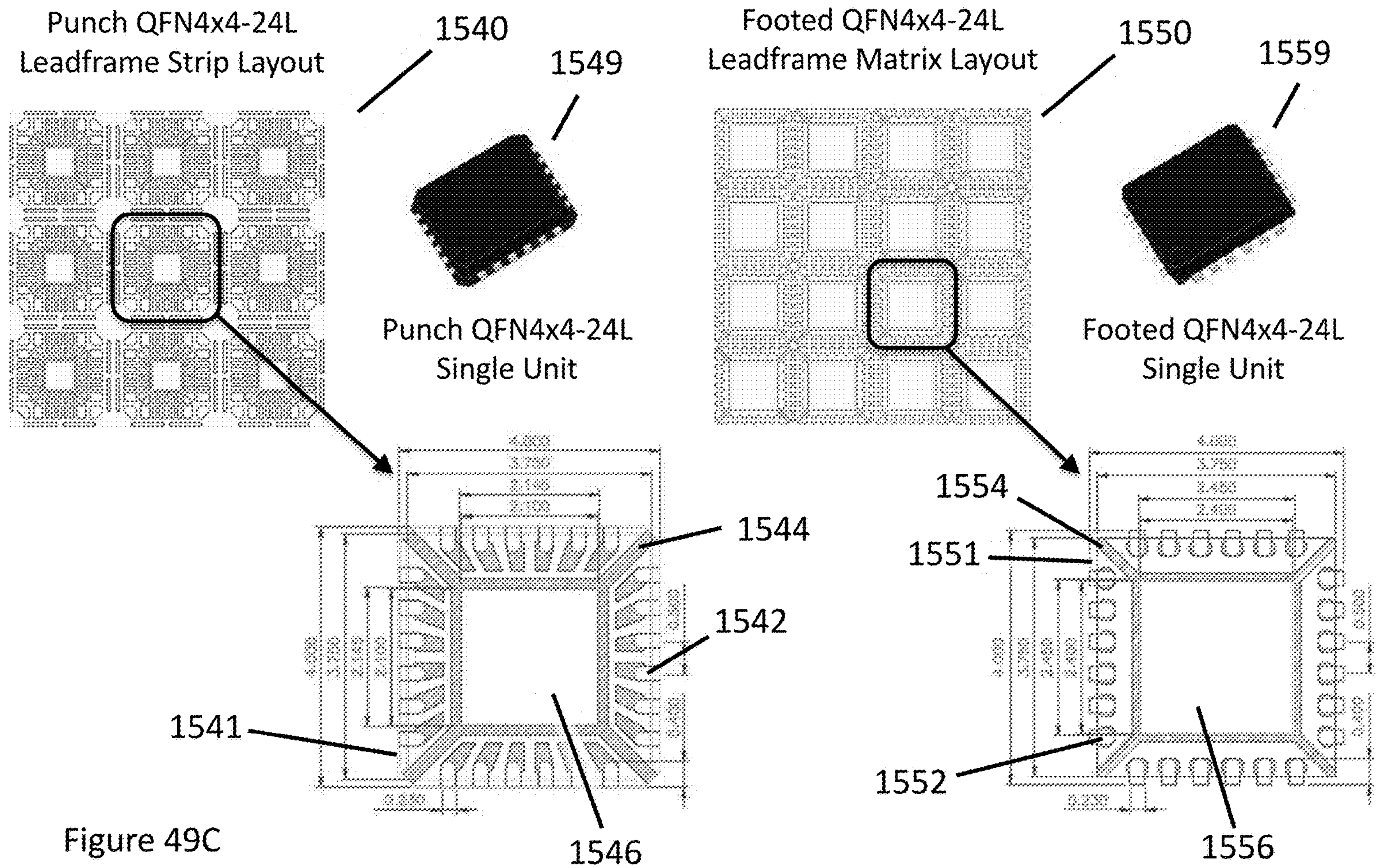

FIG. 49C illustrates an overhead view of a punch type QFN4×4-24L leadframe and its corresponding footed USMP equivalent.

Figure 49E:
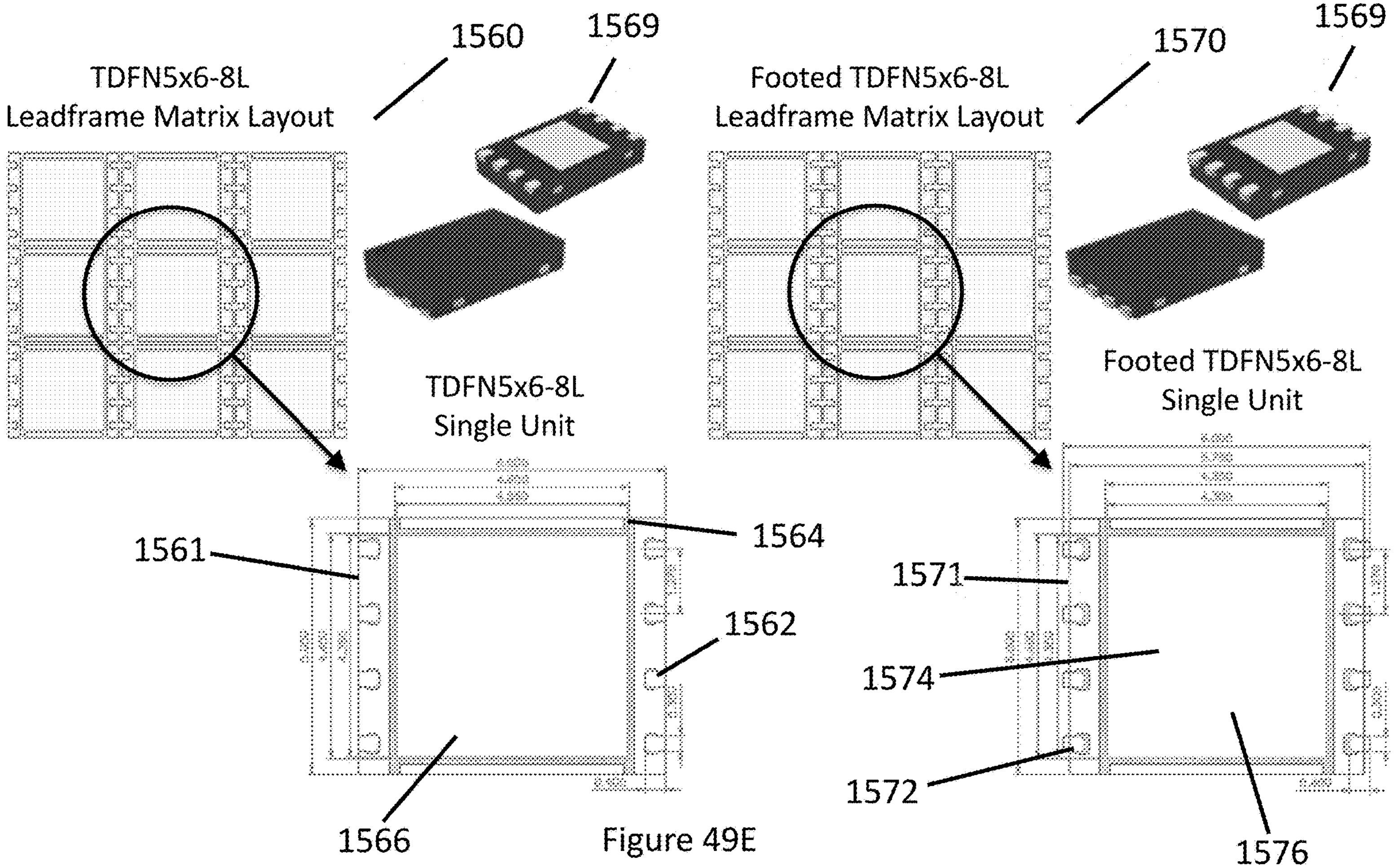

FIG. 49D illustrates a table comparing saw type and punch 4×4 QFN leadless packages with the 4×4 QFF footed package FIG. 49E illustrates an overhead view of a saw type TDFN5×6-8L leadframe and its corresponding footed USMP equivalent.

Figure 50A:
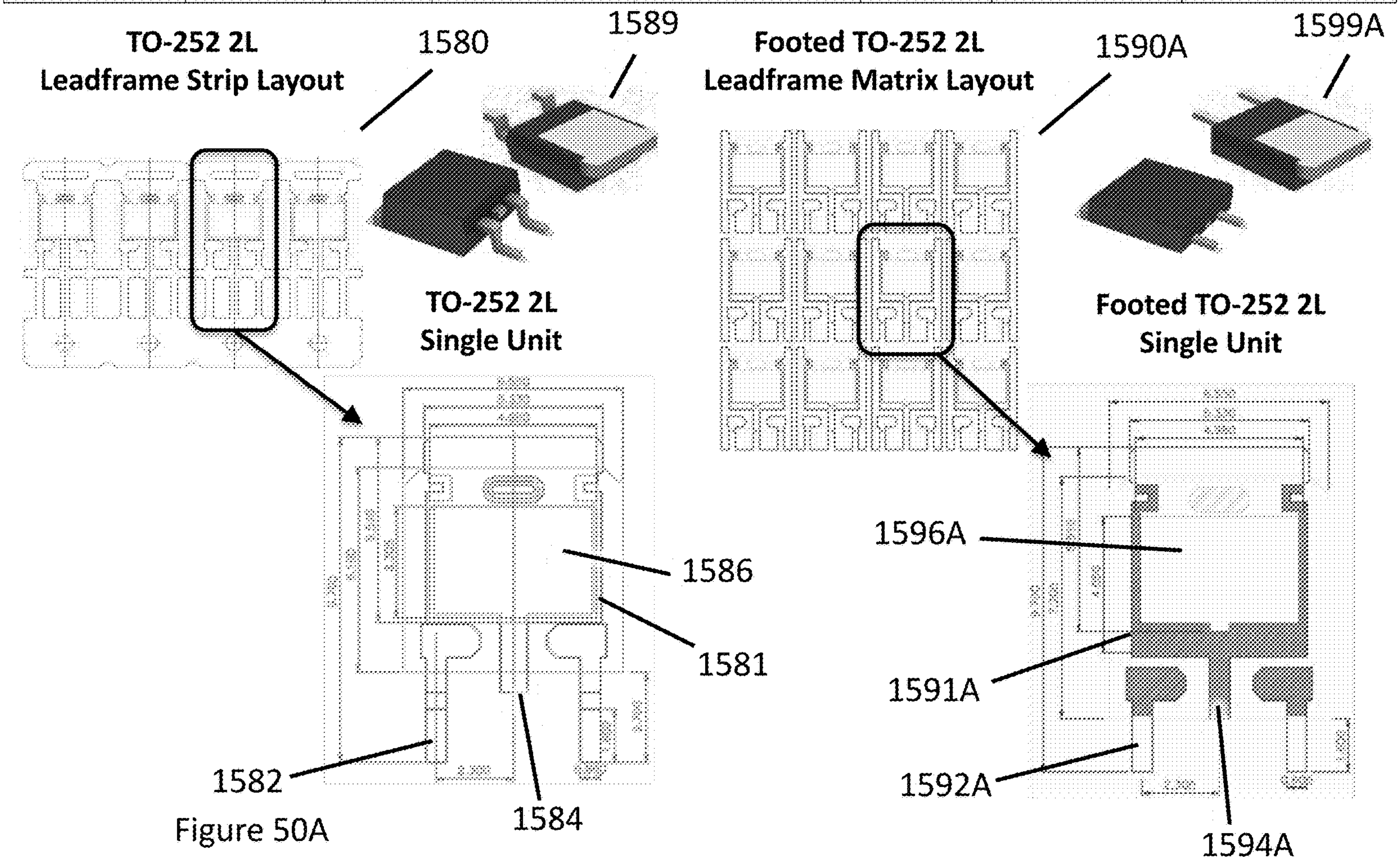

FIG. 50A illustrates an overhead view of a conventional TO-252 (DPAK) leadframe and its corresponding footed USMP equivalent.

Figure 50B:
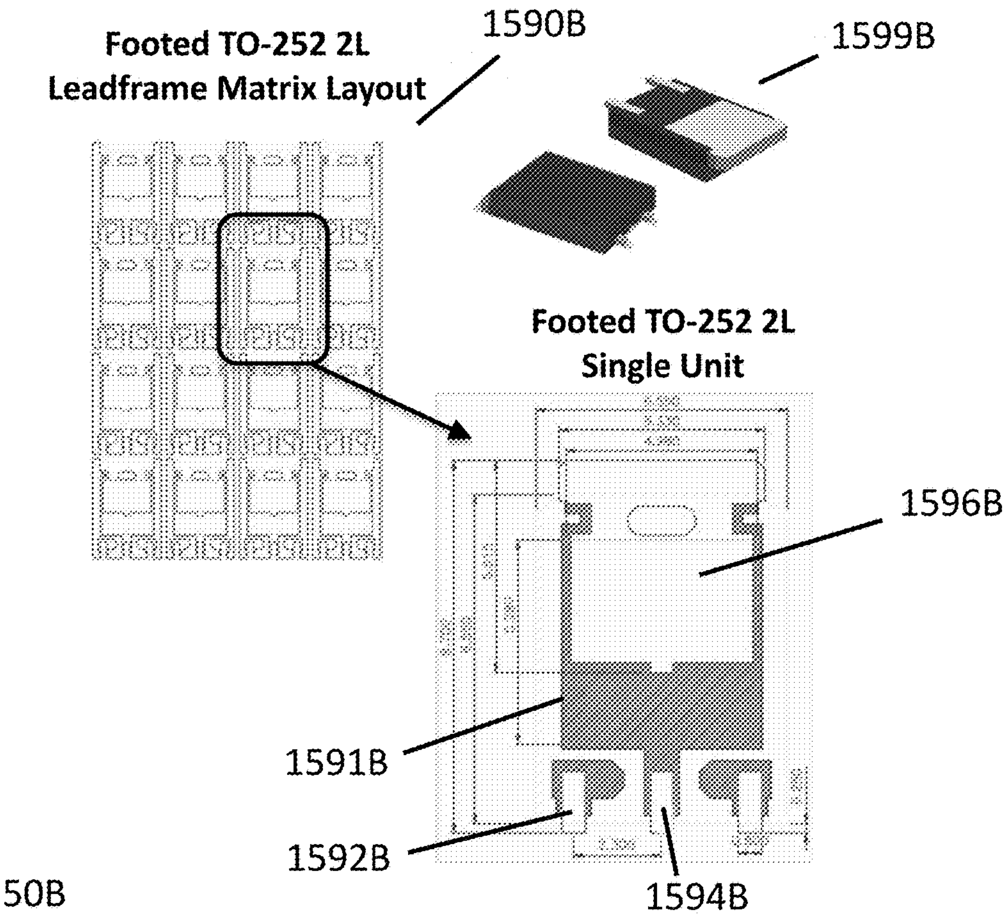

FIG. 50B illustrates perspective and underside views of an alternative embodiment of a footed DPAK.

Figure 50C:
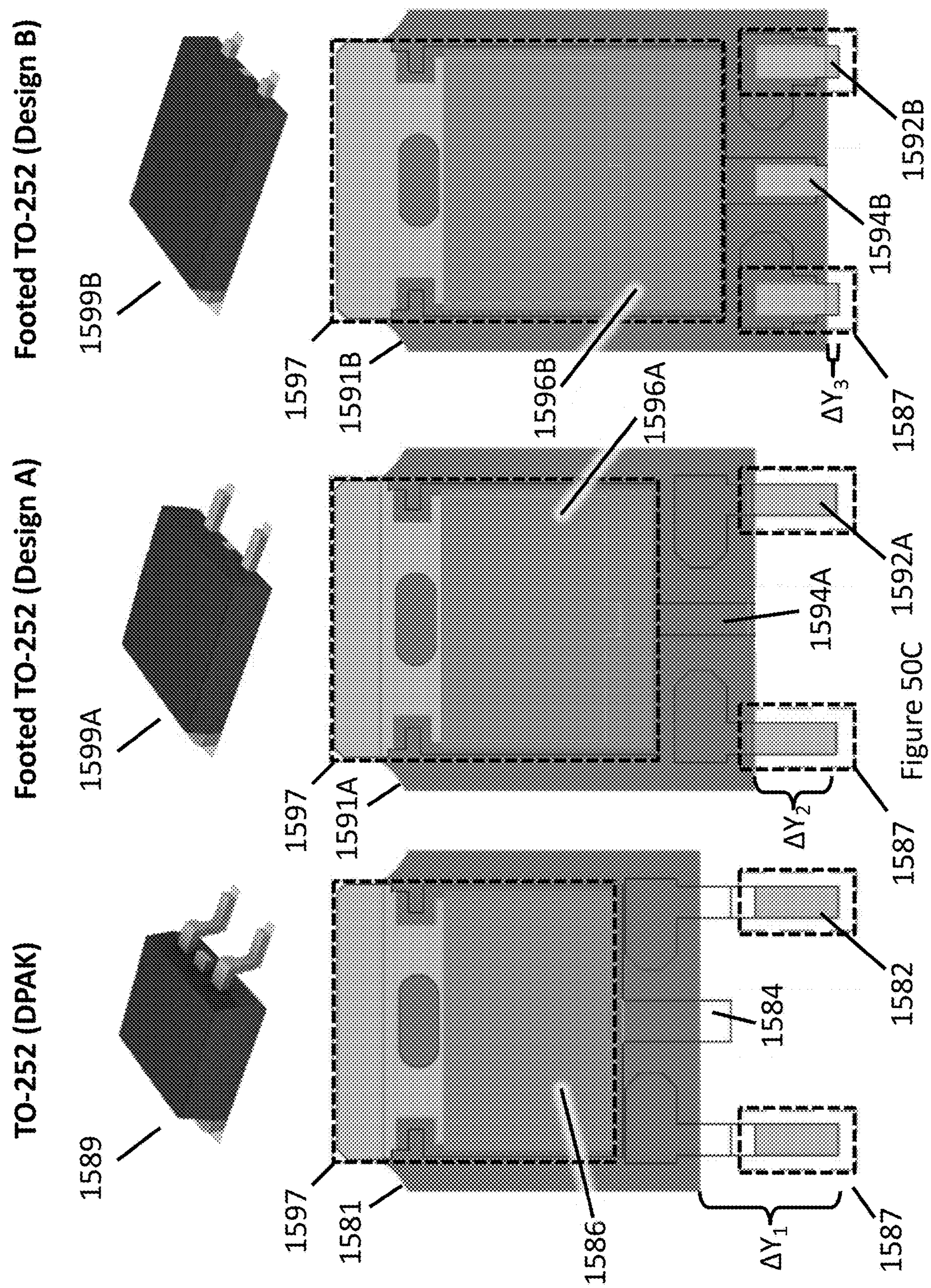

FIG. 50C illustrates perspective and underside views comparing conventional and footed DPAK packages.

Figure 50D:
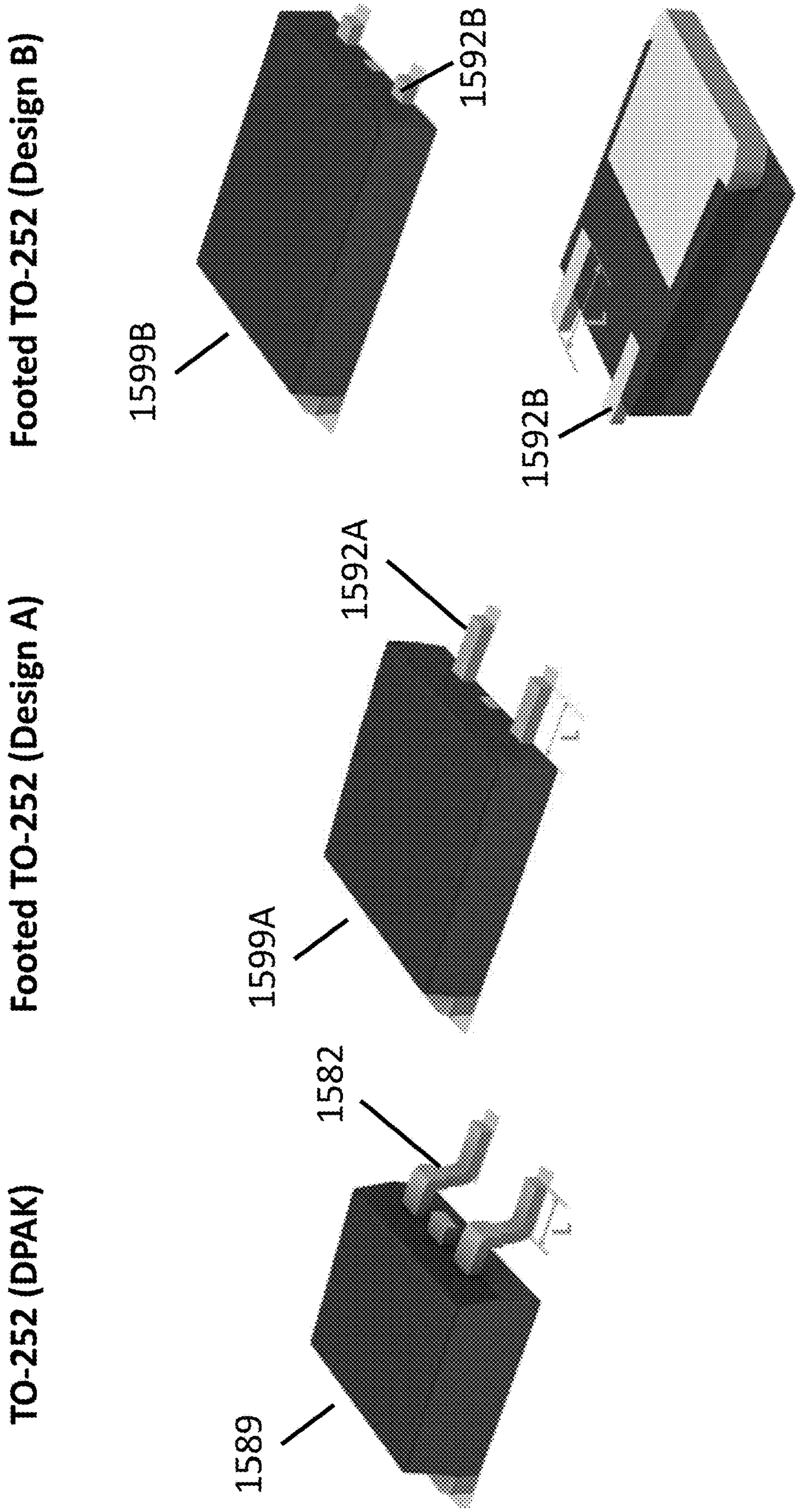

FIG. 50D illustrates perspective views and one underside view of conventional and footed DPAK packages.

Figure 50E:
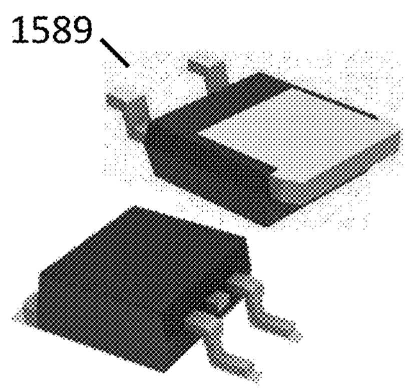
Figure 50E:
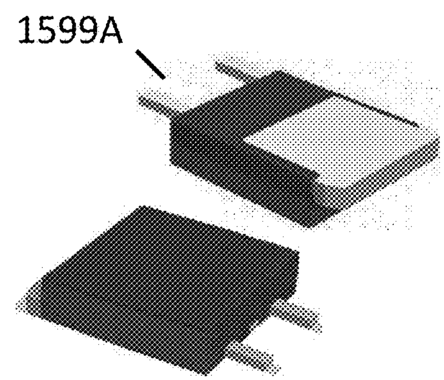
Figure 50E:
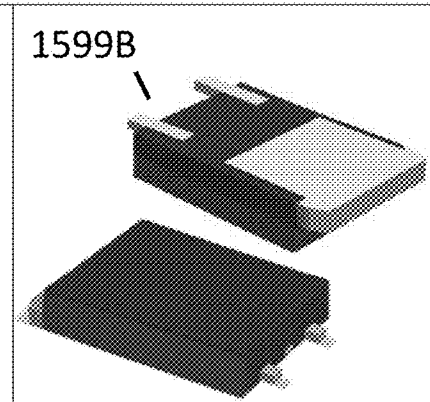

FIG. 50E illustrates a table comparing a conventional leaded DPAK to two footed DPAK packages.

Figure 51A:
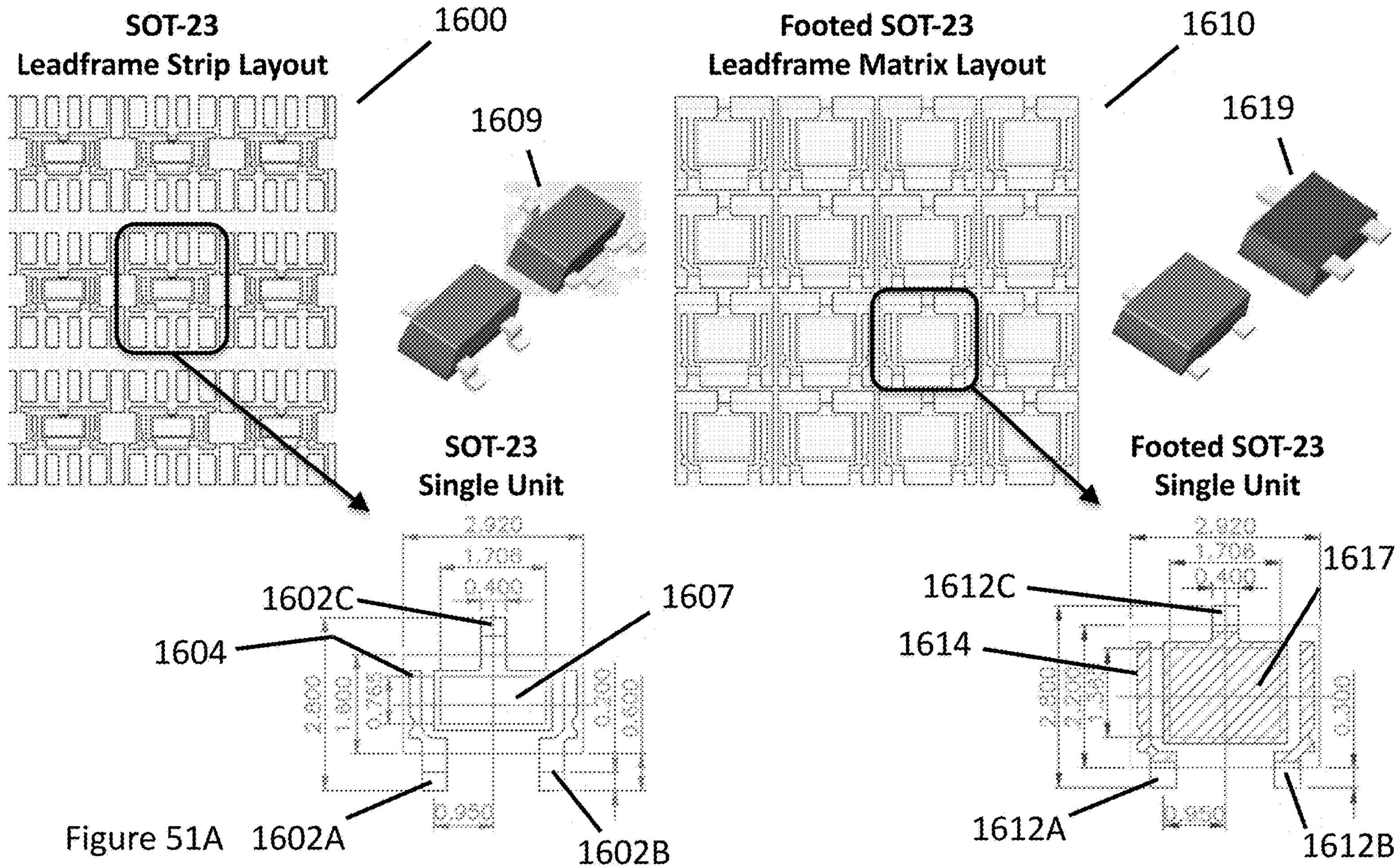

FIG. 51A illustrates an overhead view of a conventional SOT23 leadframe and its corresponding footed USMP equivalent.

Figure 51B:
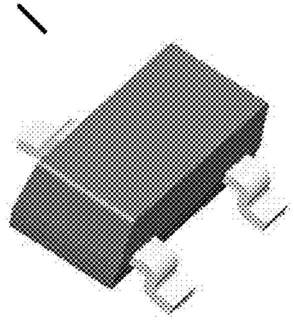
Figure 51B:
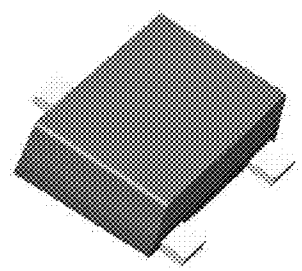

FIG. 51B illustrates a table comparing conventional and footed SOT23 packages.

Figure 52A:
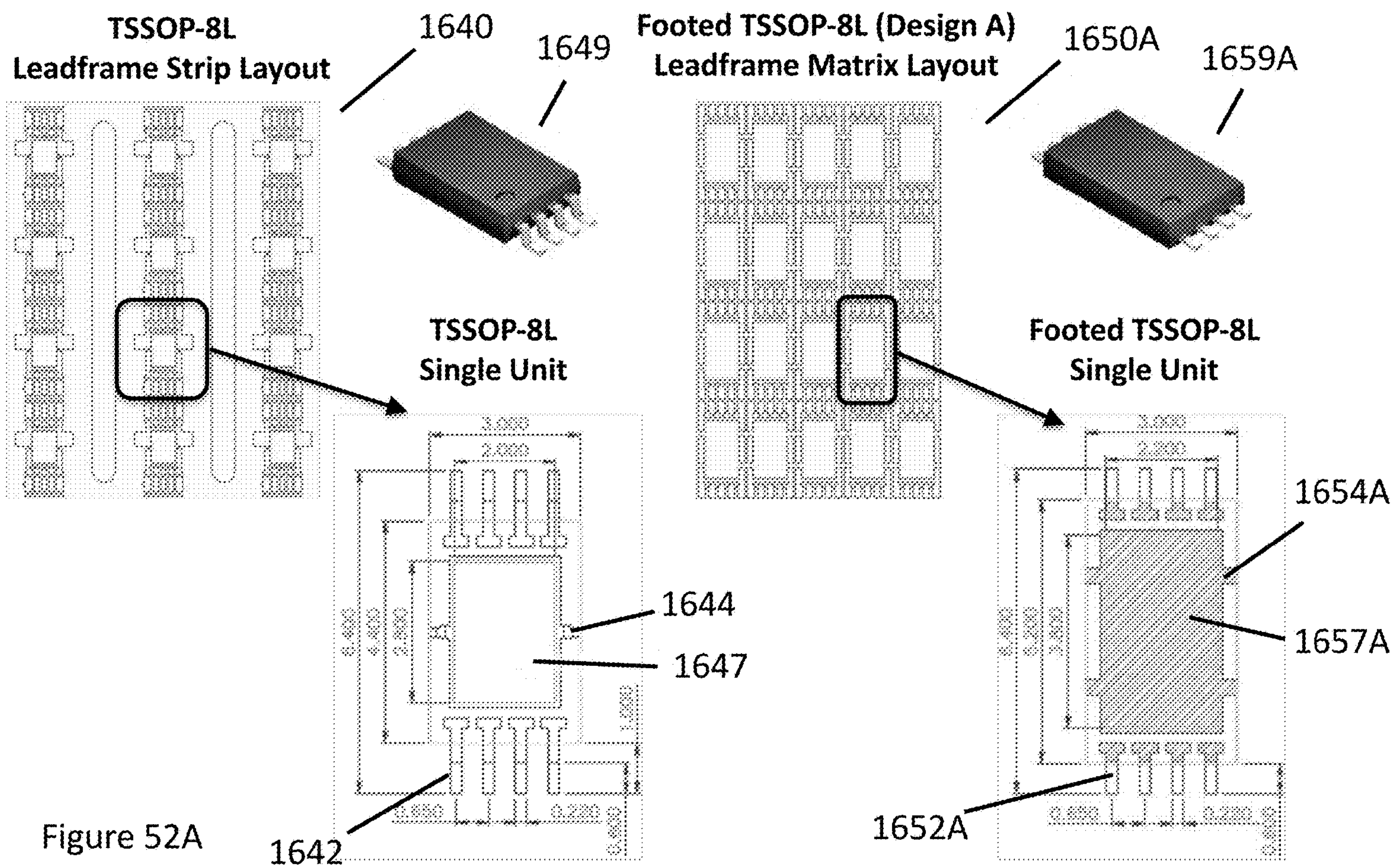

FIG. 52A illustrates an overhead view of a conventional TSSOP-8L leadframe and its corresponding footed USMP equivalent.

Figure 52B:
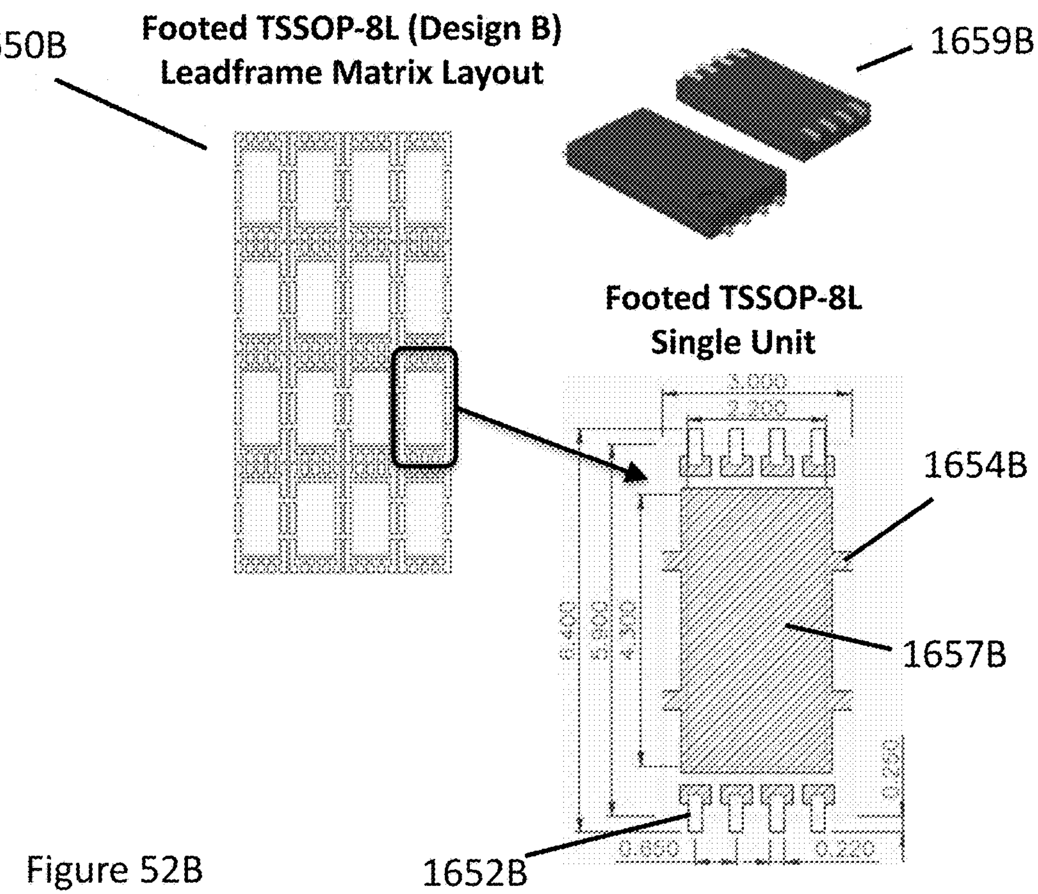

FIG. 52B illustrates an overhead view of an alternative embodiment of a footed TSSOP-8L leadframe and package.

Figure 52C:
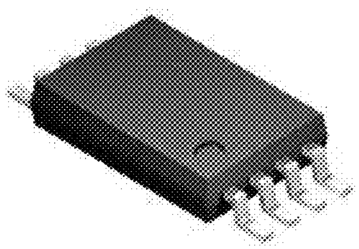
Figure 52C:
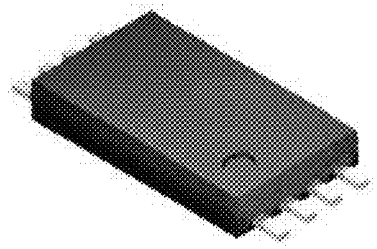
Figure 52C:
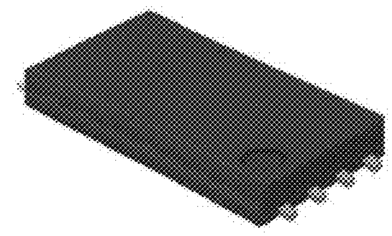

FIG. 52C illustrates a table comparing conventional and footed TSSOP-8L packages.

Figure 53A:
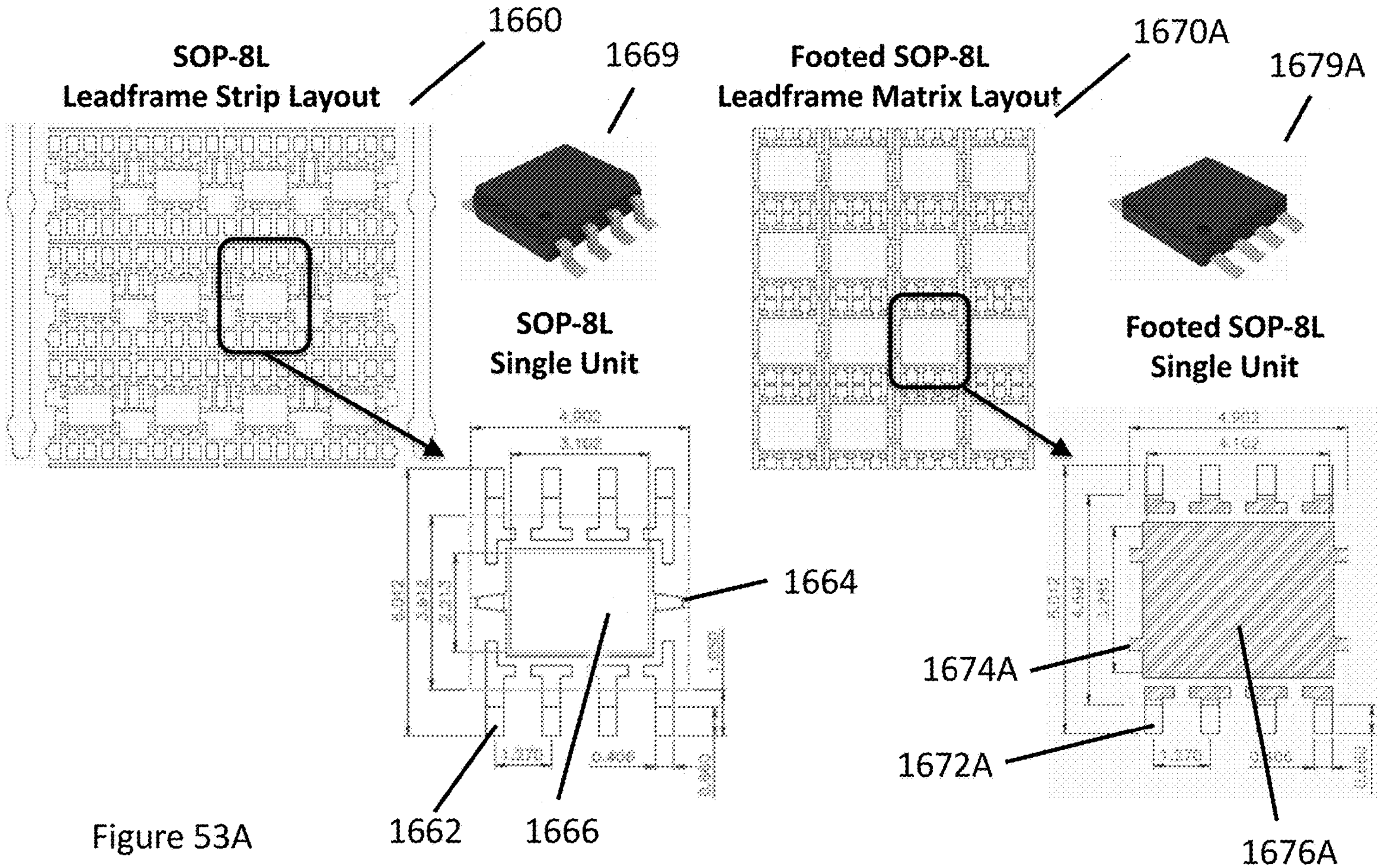

FIG. 53A illustrates an overhead view of a conventional SOP-8L leadframe and its corresponding footed USMP equivalent.

Figure 53B:
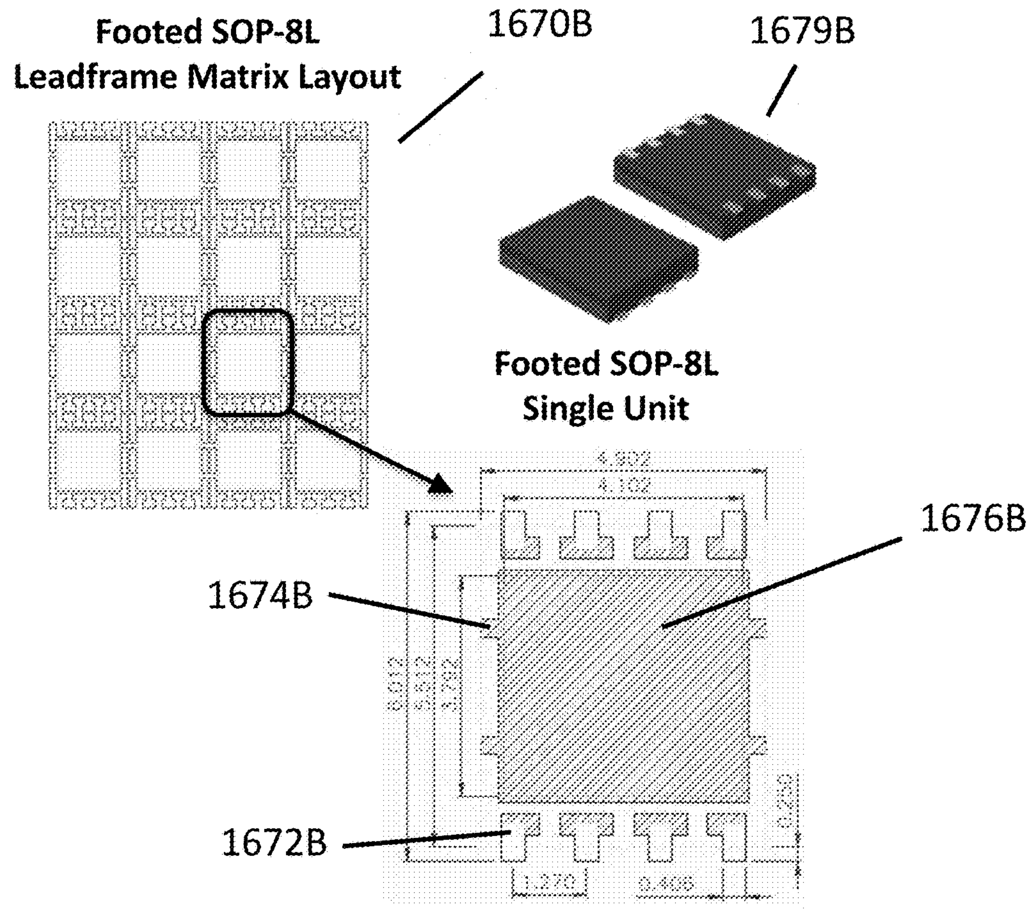

FIG. 53B illustrates an overhead view of an alternative embodiment of a footed SOP-8L leadframe and package.

Figure 53C:
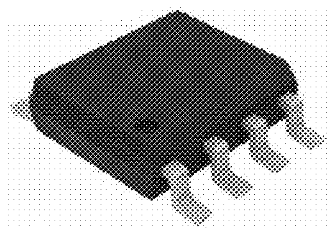
Figure 53C:
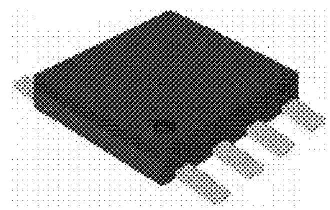
Figure 53C:
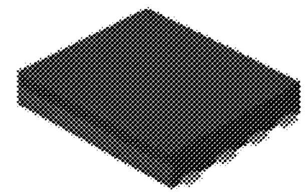

FIG. 53C illustrates a table comparing conventional and footed SOP-8L packages.

Figure 54A:
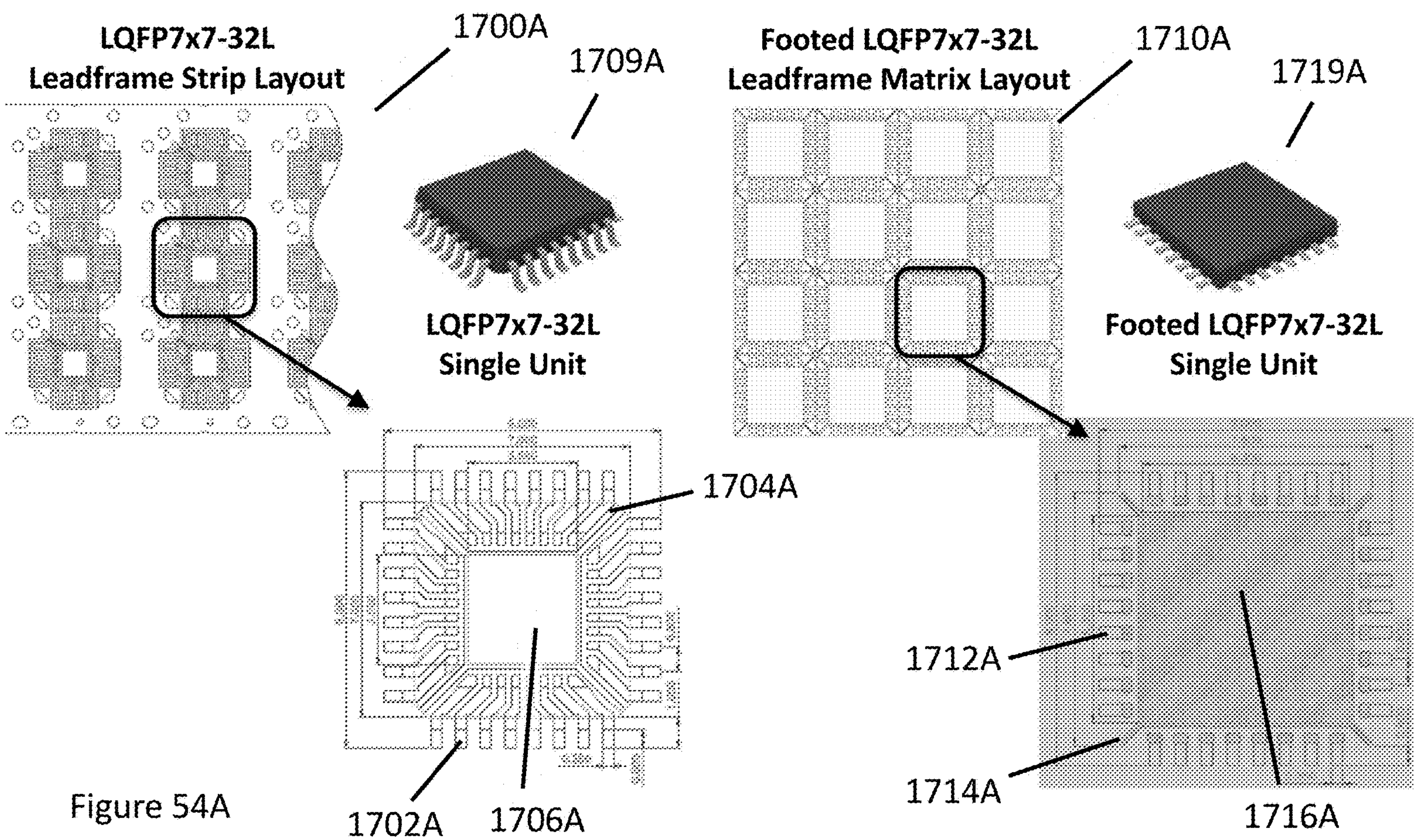

FIG. 54A illustrates an overhead view of a conventional LQFP7×7-32L leadframe and its corresponding footed USMP equivalent.

Figure 54B:
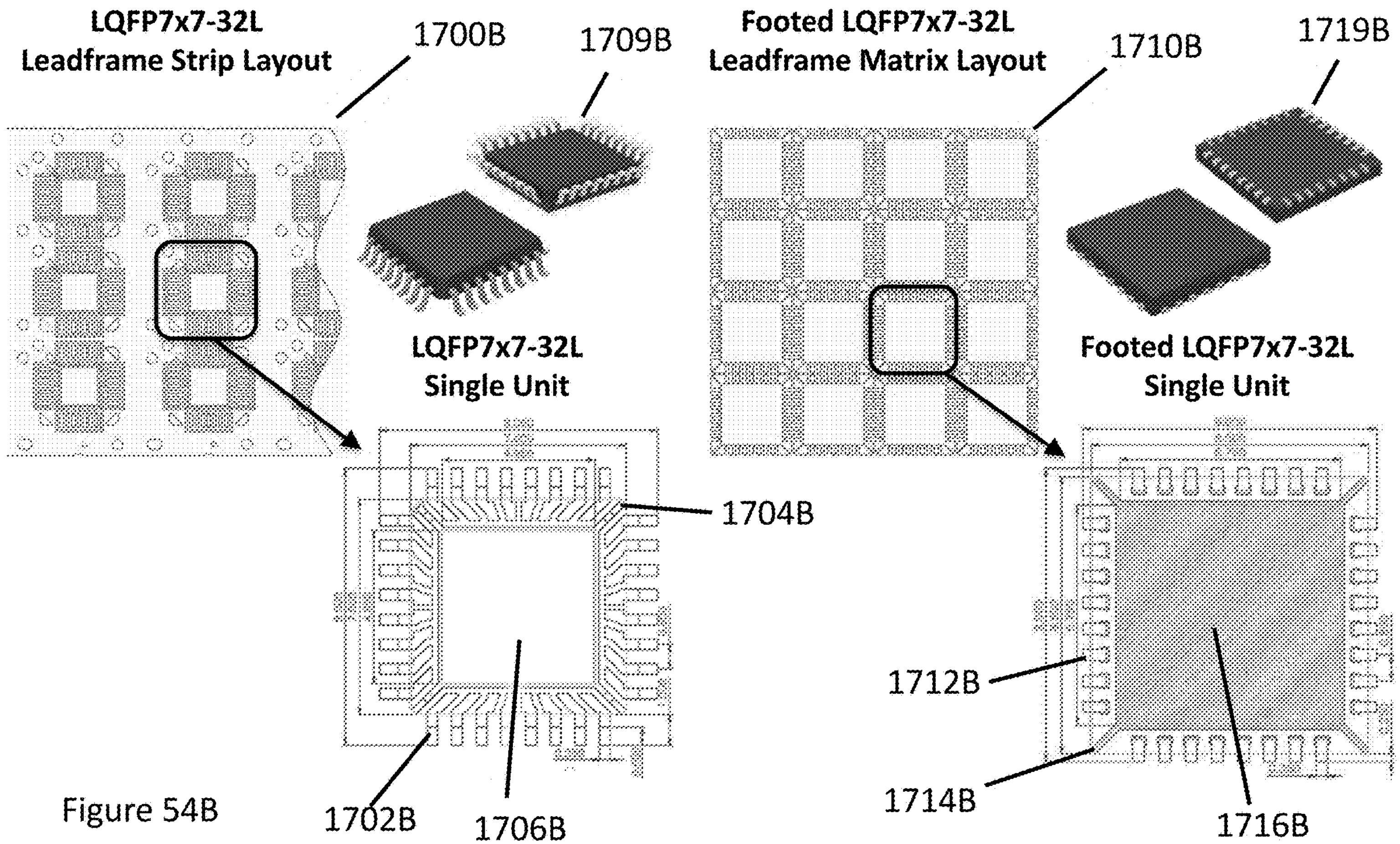

FIG. 54B illustrates an overhead view of an alternative embodiments of conventional and footed LQFP7×7-32L leadframes and packages.

Figure 54C:
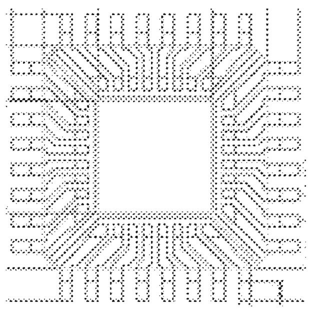
Figure 54C:
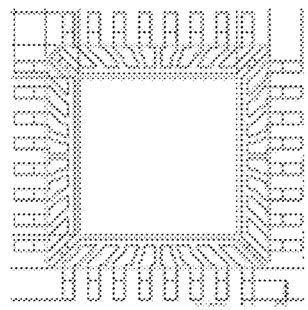
Figure 54C:
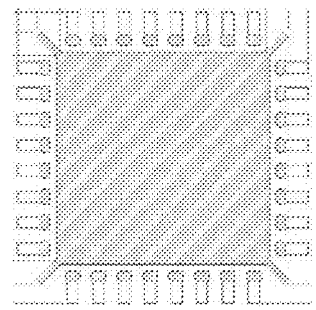
Figure 54C:
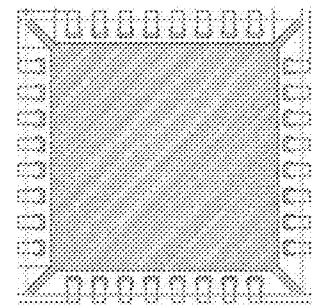

FIG. 54C illustrates a table comparing conventional and footed LQFP7×7-32L leadframes and packages.

Figure 55:
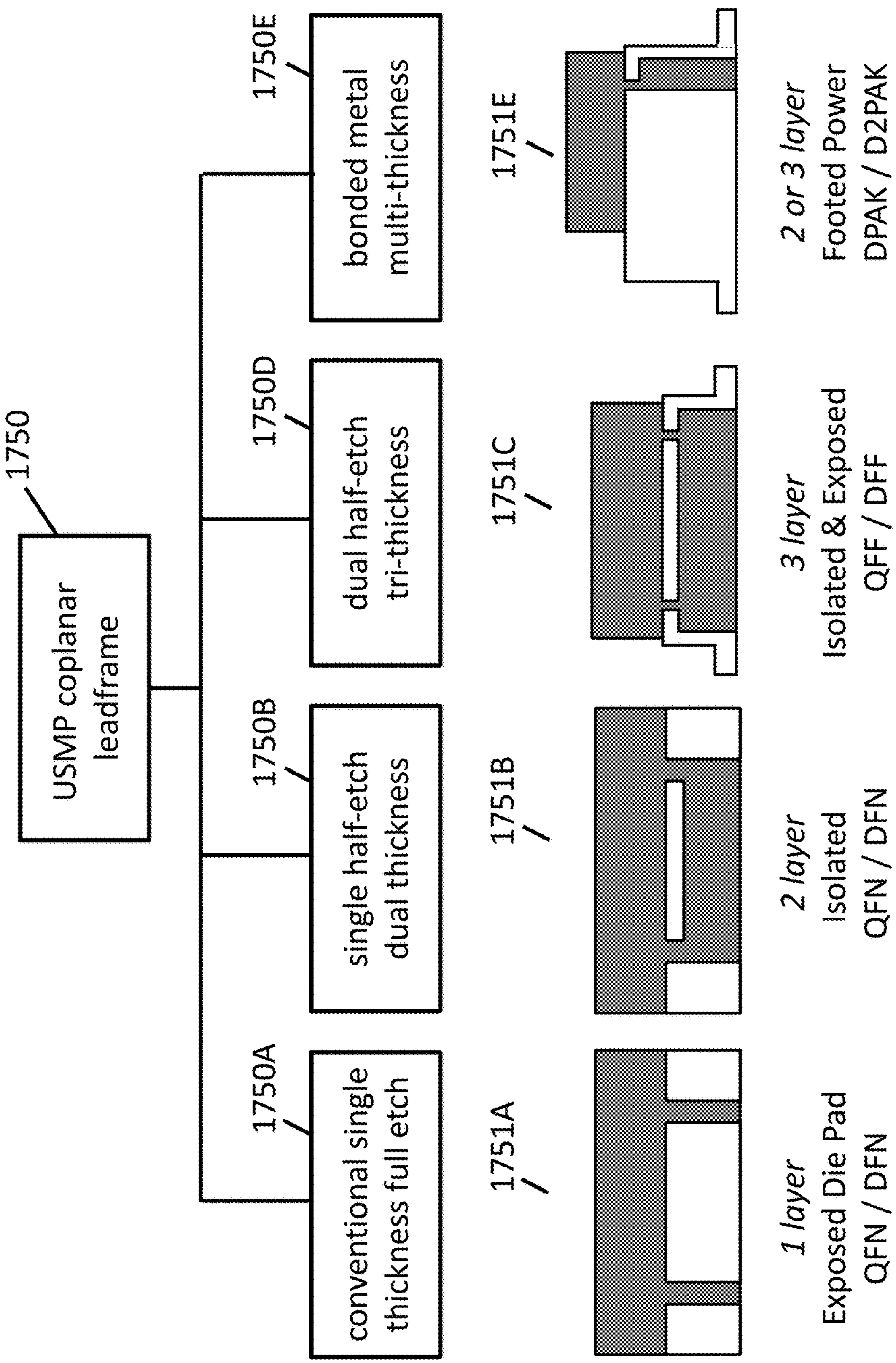

FIG. 55 illustrates types of leadless and footed packages manufacturable using the USMP coplanar leadframe process flow and subsets thereof.

Figure 56A:
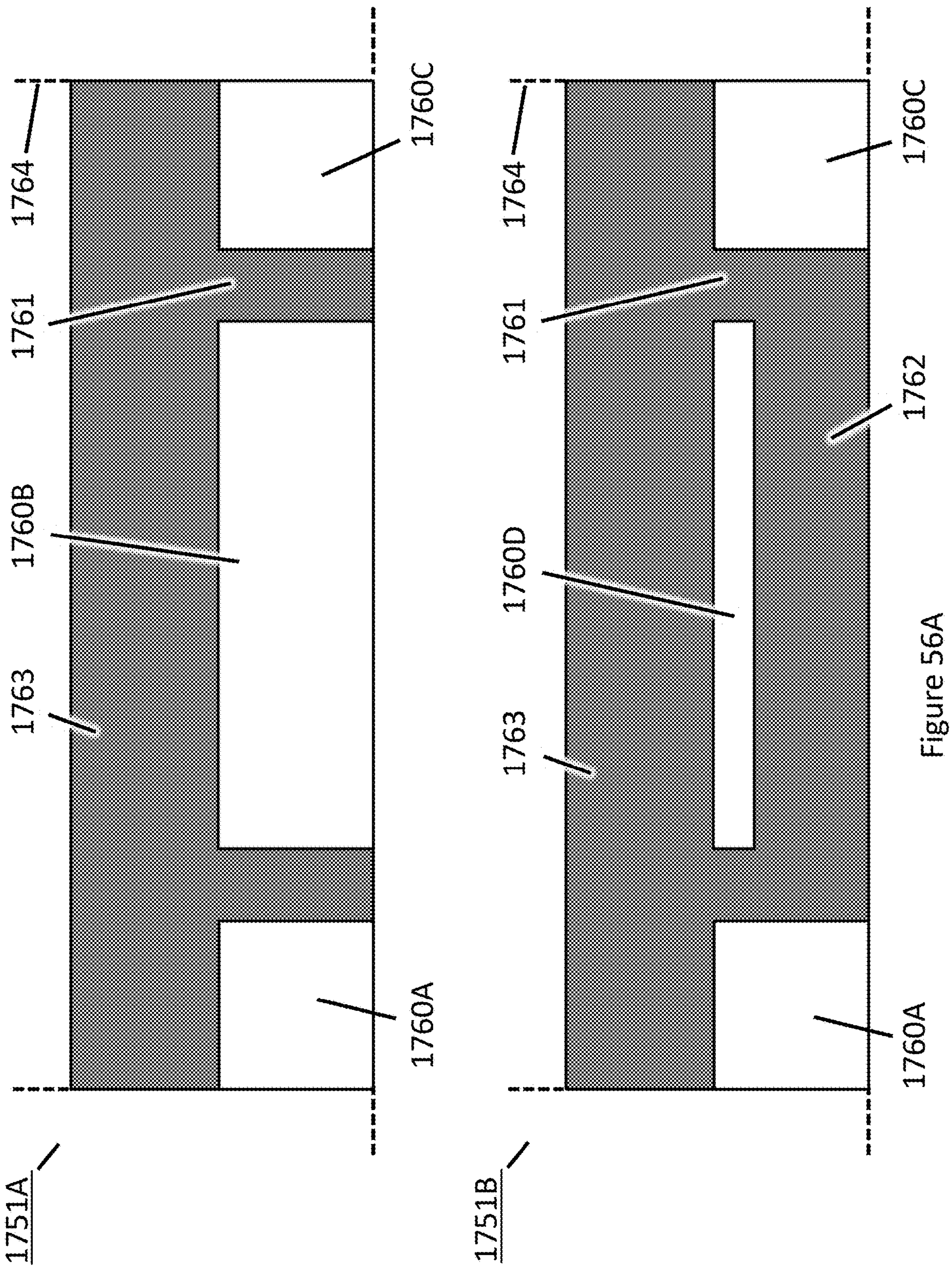

FIG. 56A illustrates cross sections of isolated and non-isolated leadless packages manufacturable using ta subset of the USMP coplanar leadframe process.

Figure 56B:
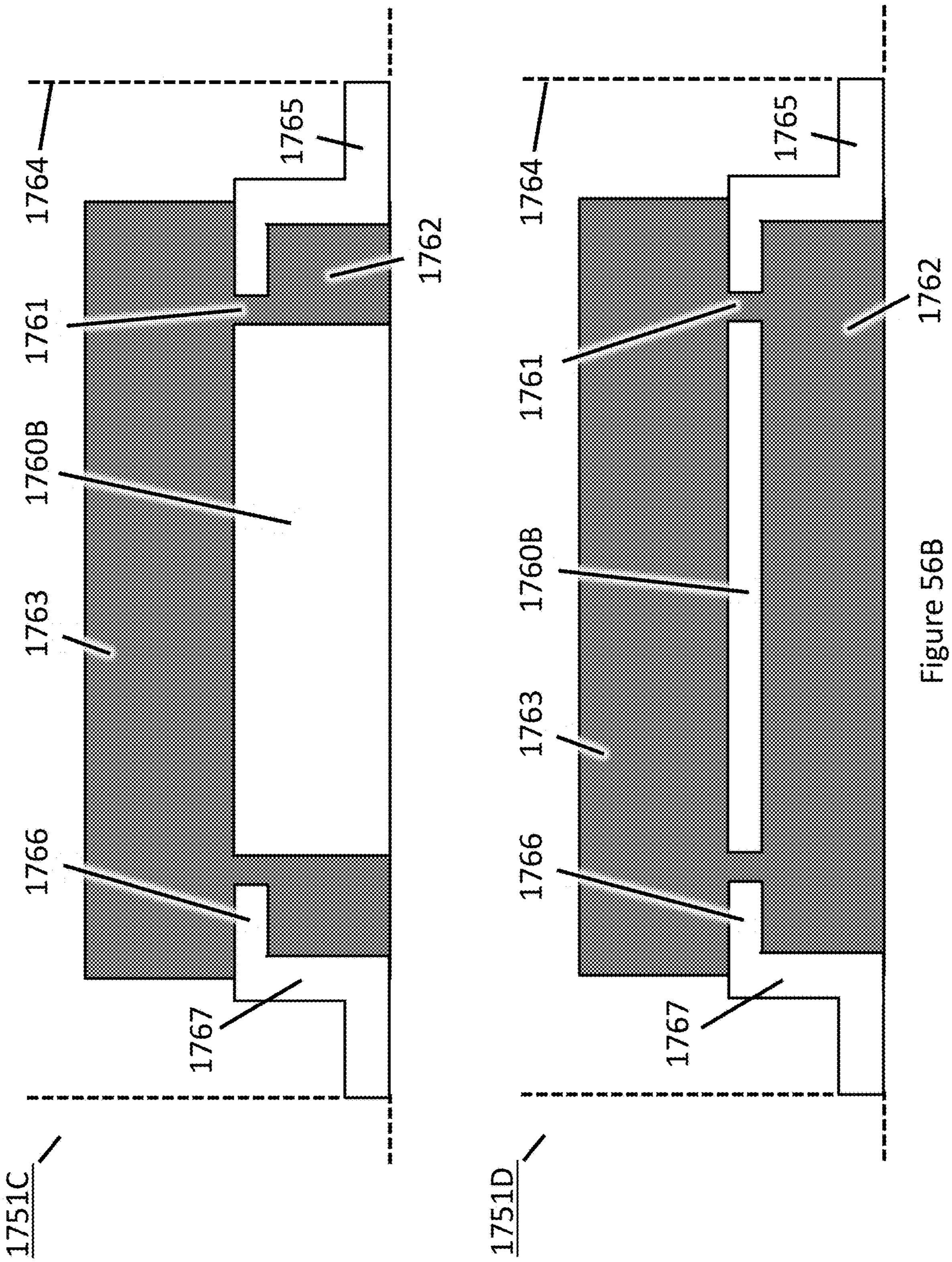

FIG. 56B illustrates cross sections of isolated and non-isolated leadless footed packages manufacturable using ta subset of the USMP coplanar leadframe process.

Figure 57A:
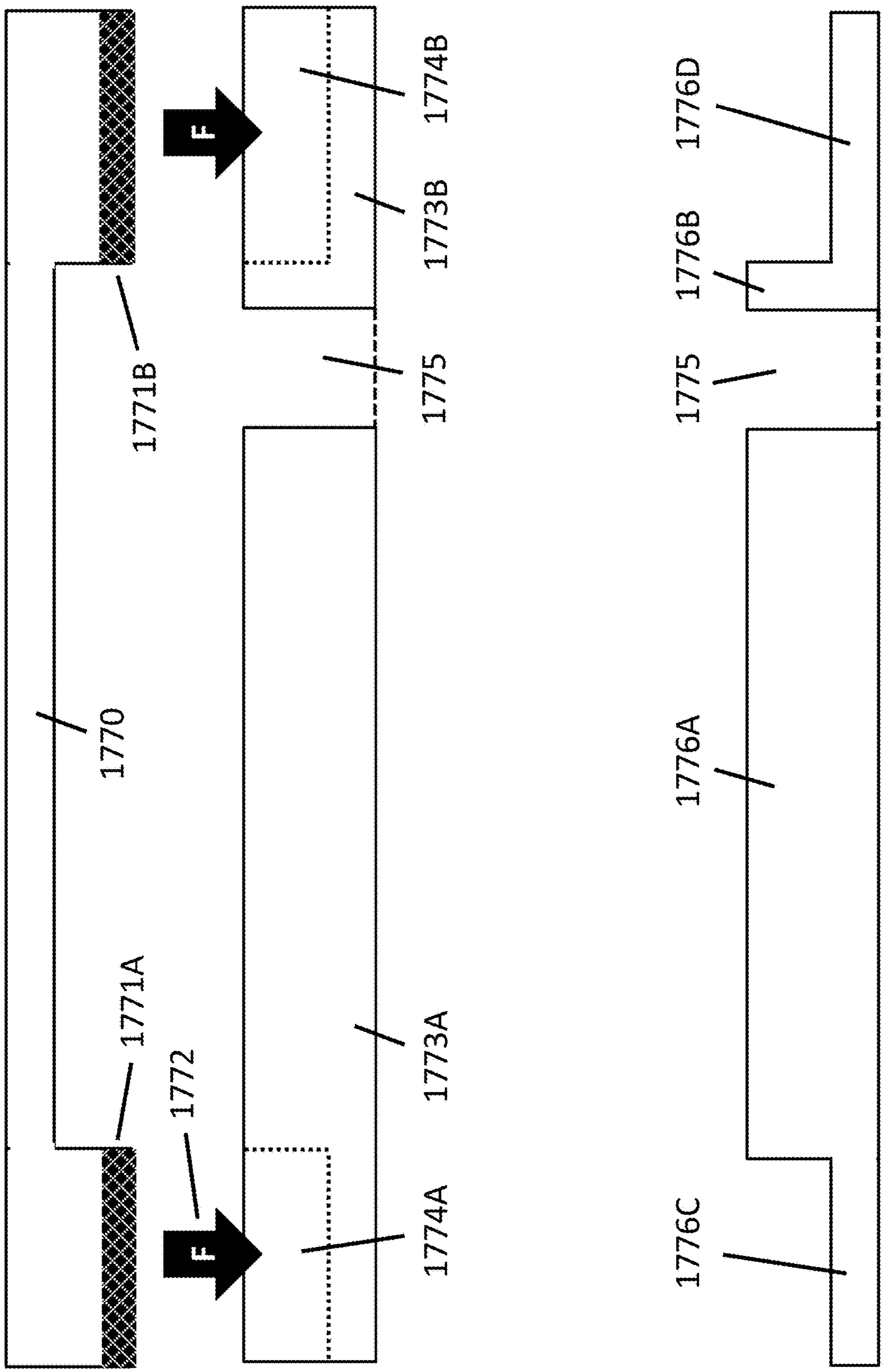

FIG. 57A illustrates use of a stamping process in the fabrication of a coplanar footed power package.

Figure 57B:
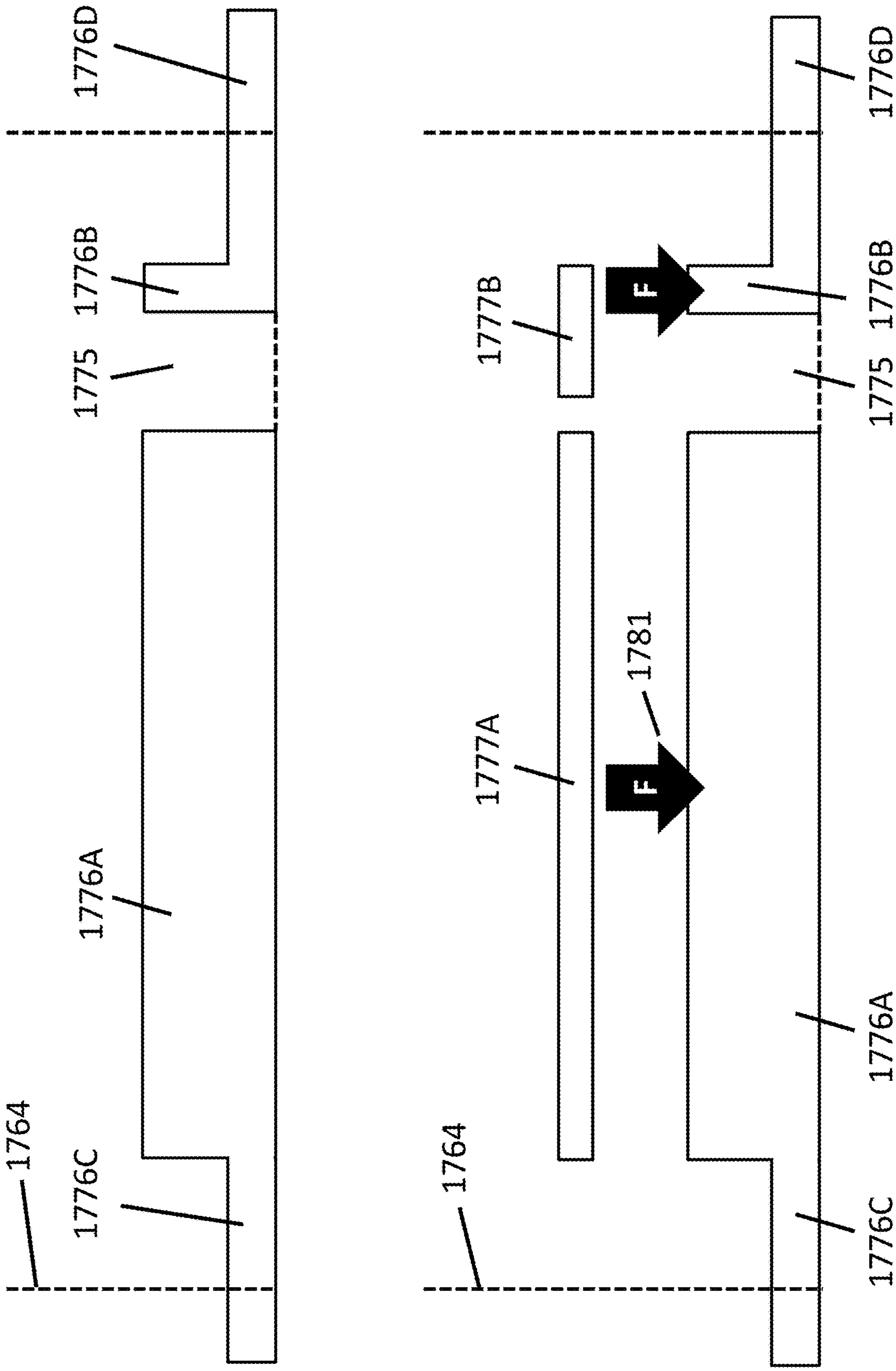

FIG. 57B illustrates use of a metal leadframe bonding in the fabrication of a coplanar footed power package.

Figure 57C:
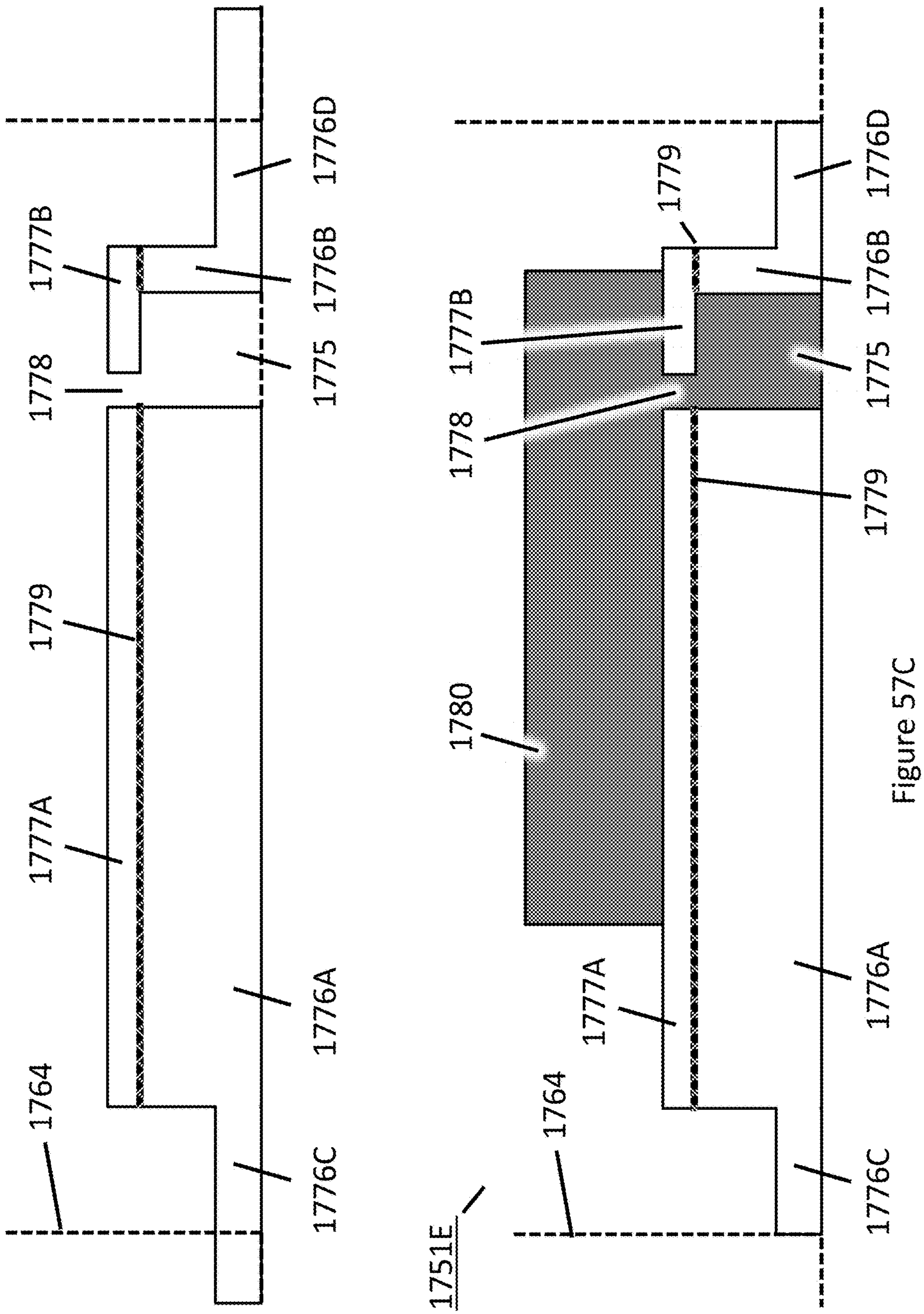

FIG. 57C illustrates molding and singulation of a metal bonded leadframe in the fabrication of a coplanar footed power package and the resulting package cross section.

Figure 58A:
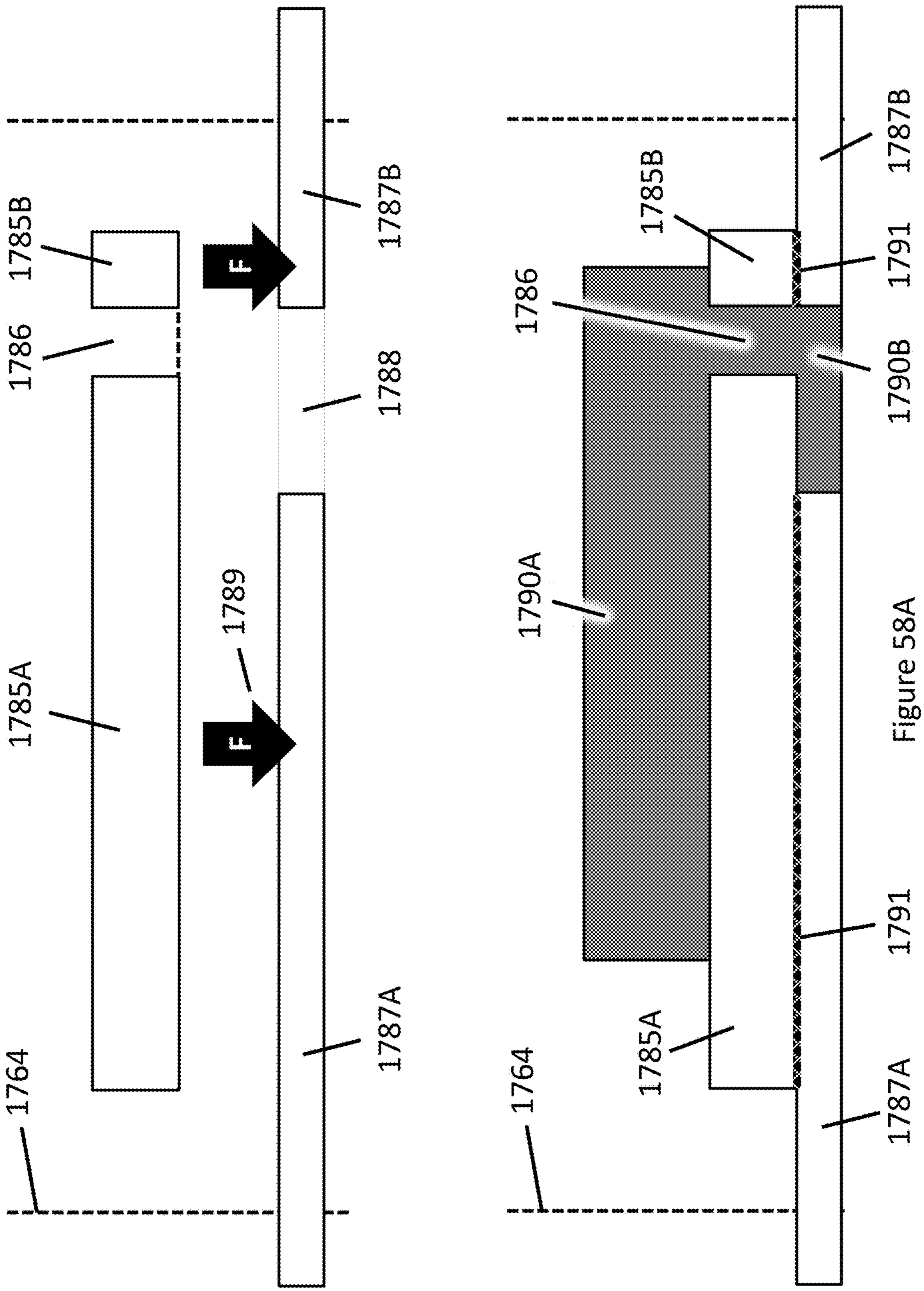

FIG. 58A illustrates an alternate process for metal leadframe bonding in the fabrication of a coplanar footed power package.

Figure 58B:
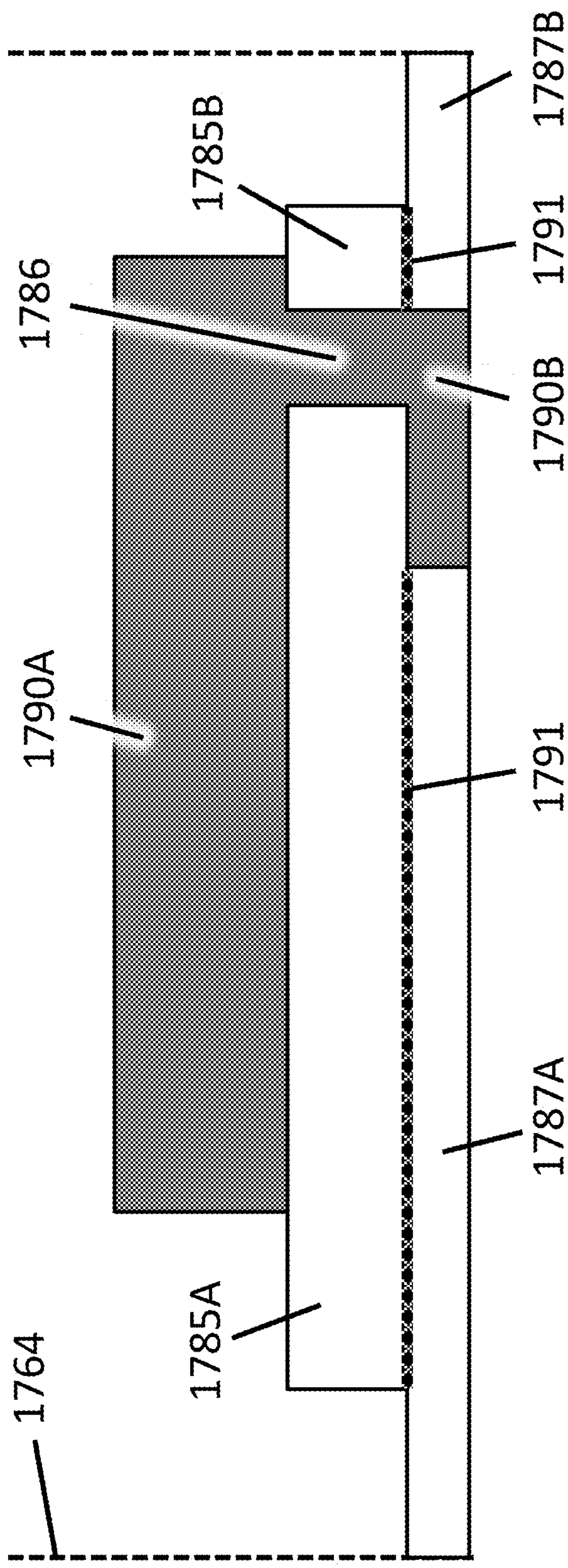

FIG. 58B illustrates the cross section of a coplanar footed power package using an alternate fabrication sequence.

Figure 59:
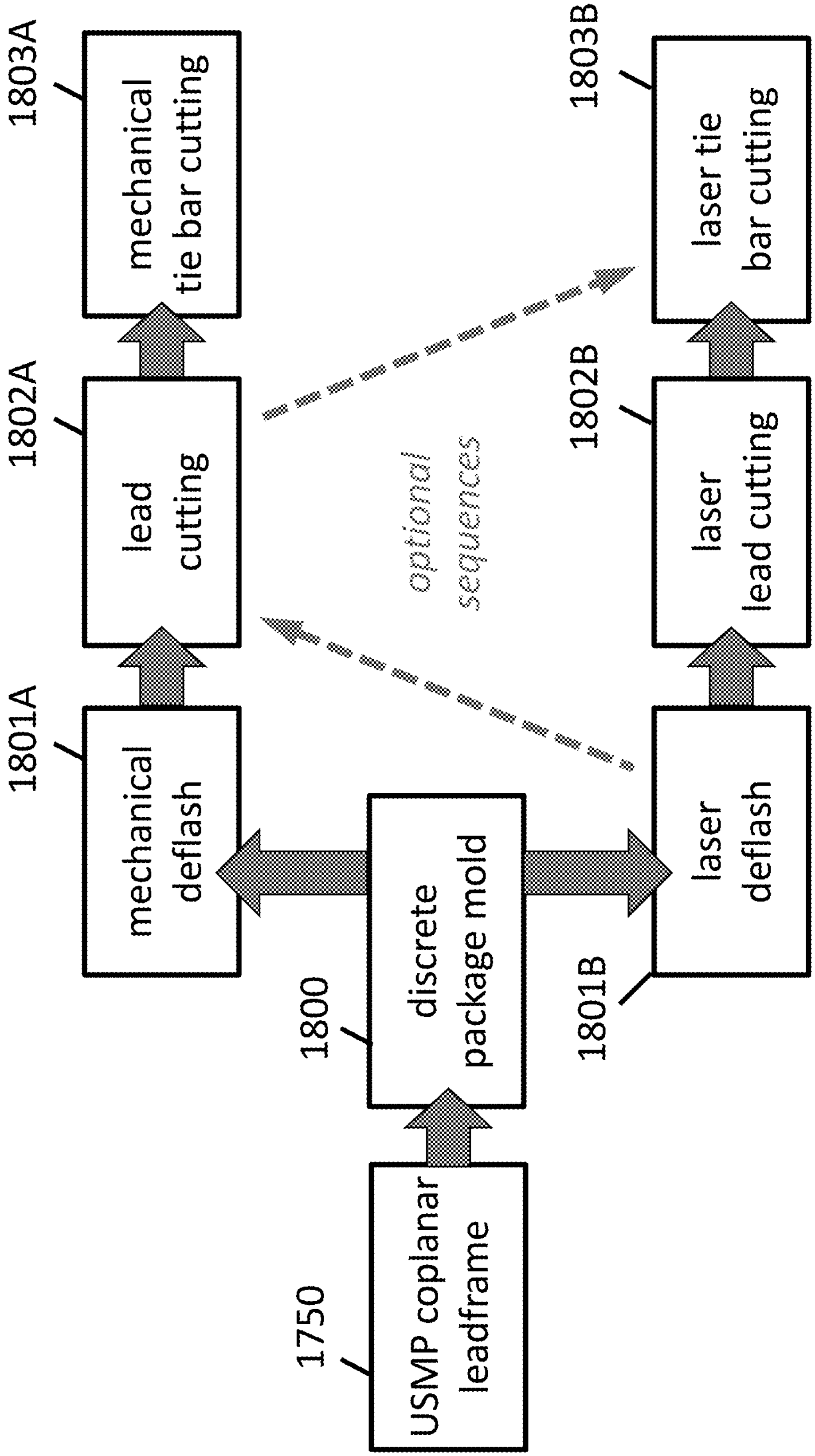

FIG. 59 illustrates several USMP process flows capable of fabricating coplanar packages replacements for conventional leaded packages.

Figure 60:
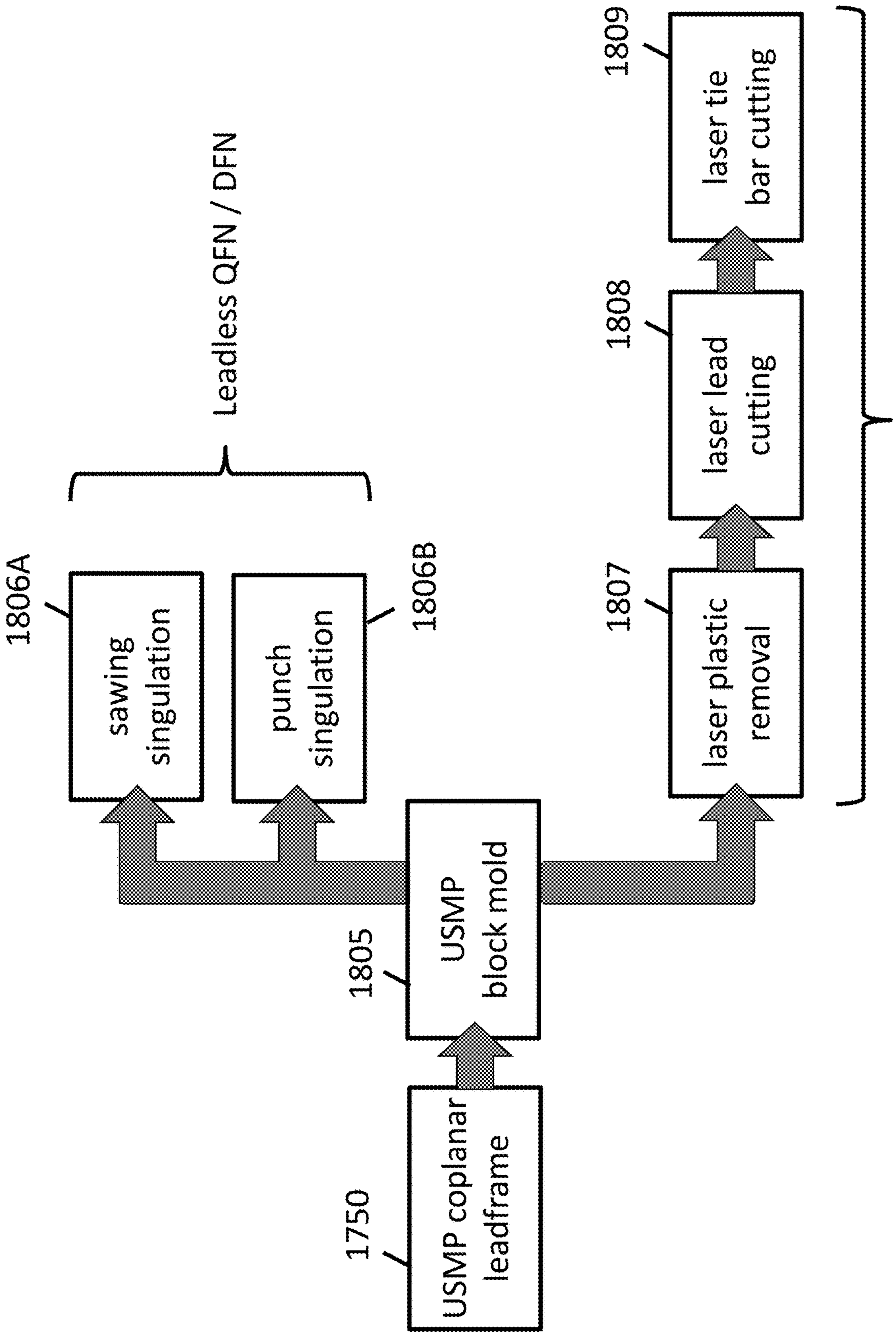

FIG. 60 illustrates several USMP process flows capable of fabricating coplanar leadless and footed packages.

Figure 61:
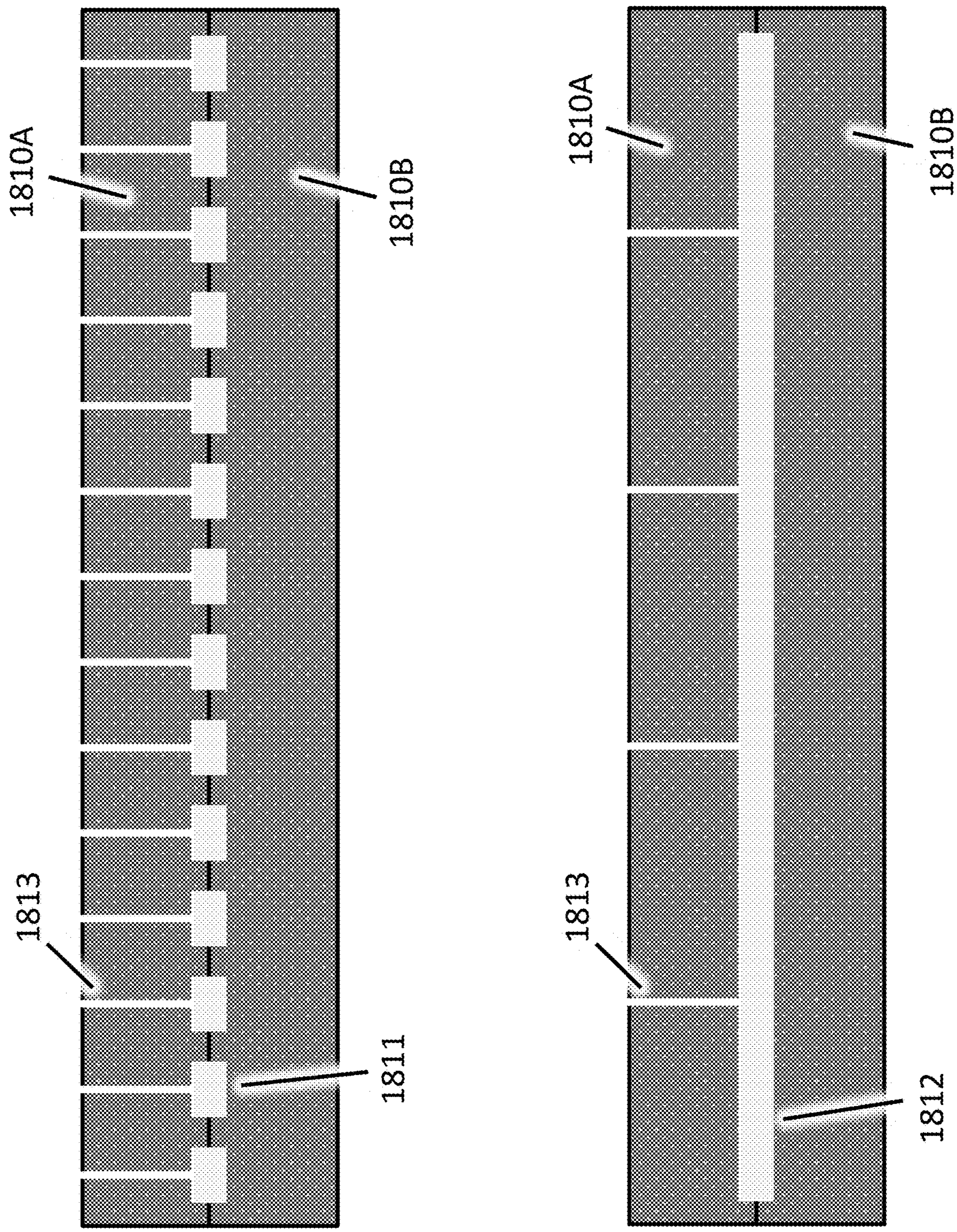

FIG. 61 illustrates the mold chaise design cross sections comparing a single-block mold cavity to one comprising multiple discrete-package mold cavities.

Figure 62:
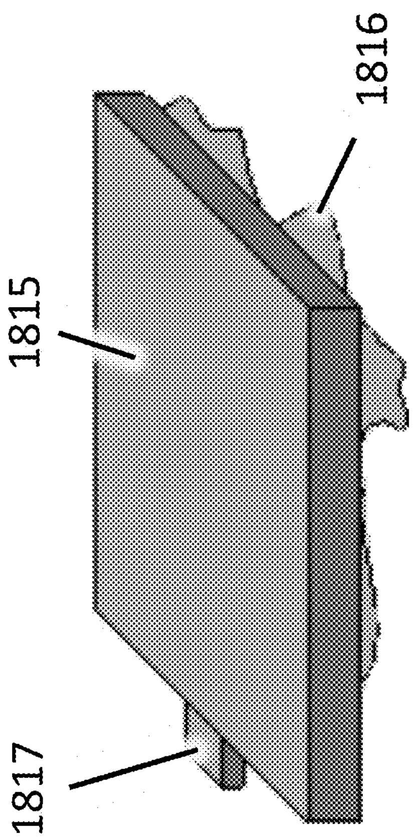

FIG. 62 illustrates a perspective view of a molded plastic package before removal of excess plastic flash.

Figure 63A:
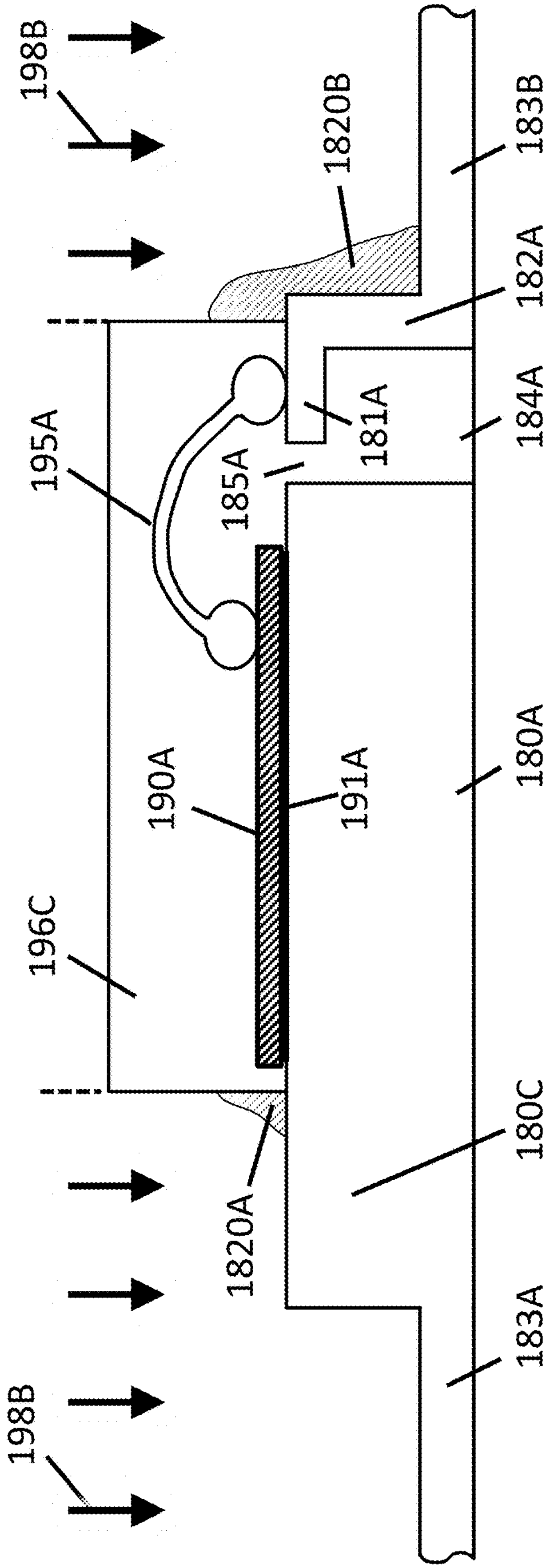

FIG. 63A illustrates a perspective view of a USMP coplanar power package during removal of excess plastic flash.

Figure 63B:
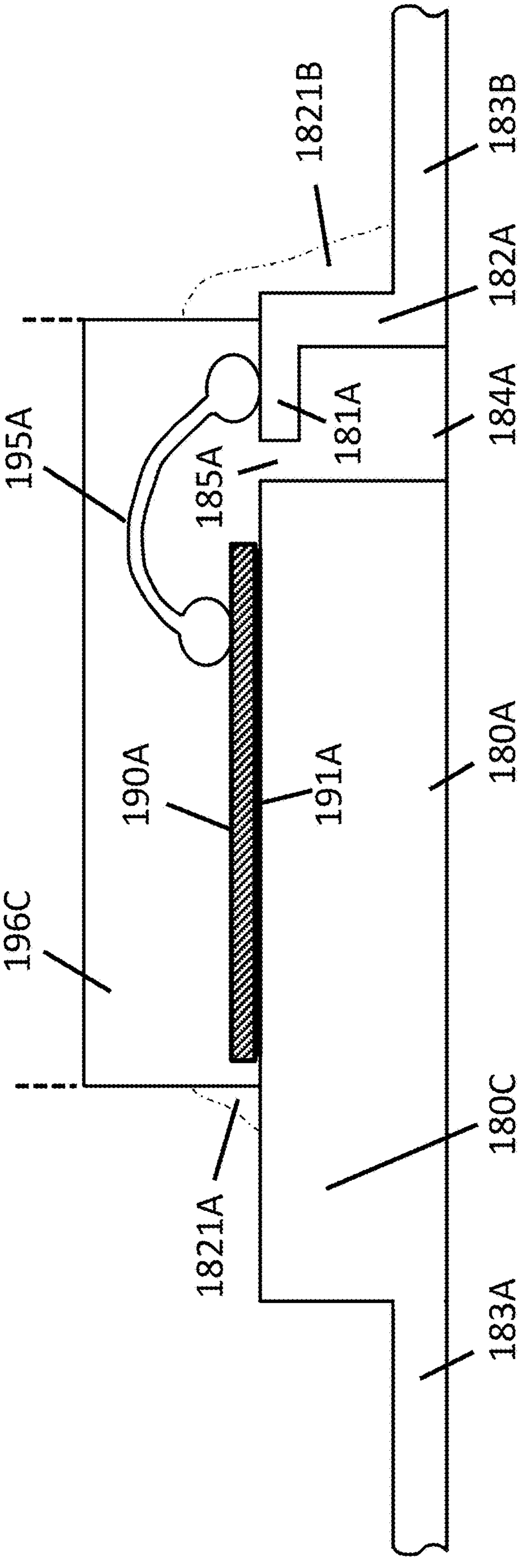
Figure 63C:
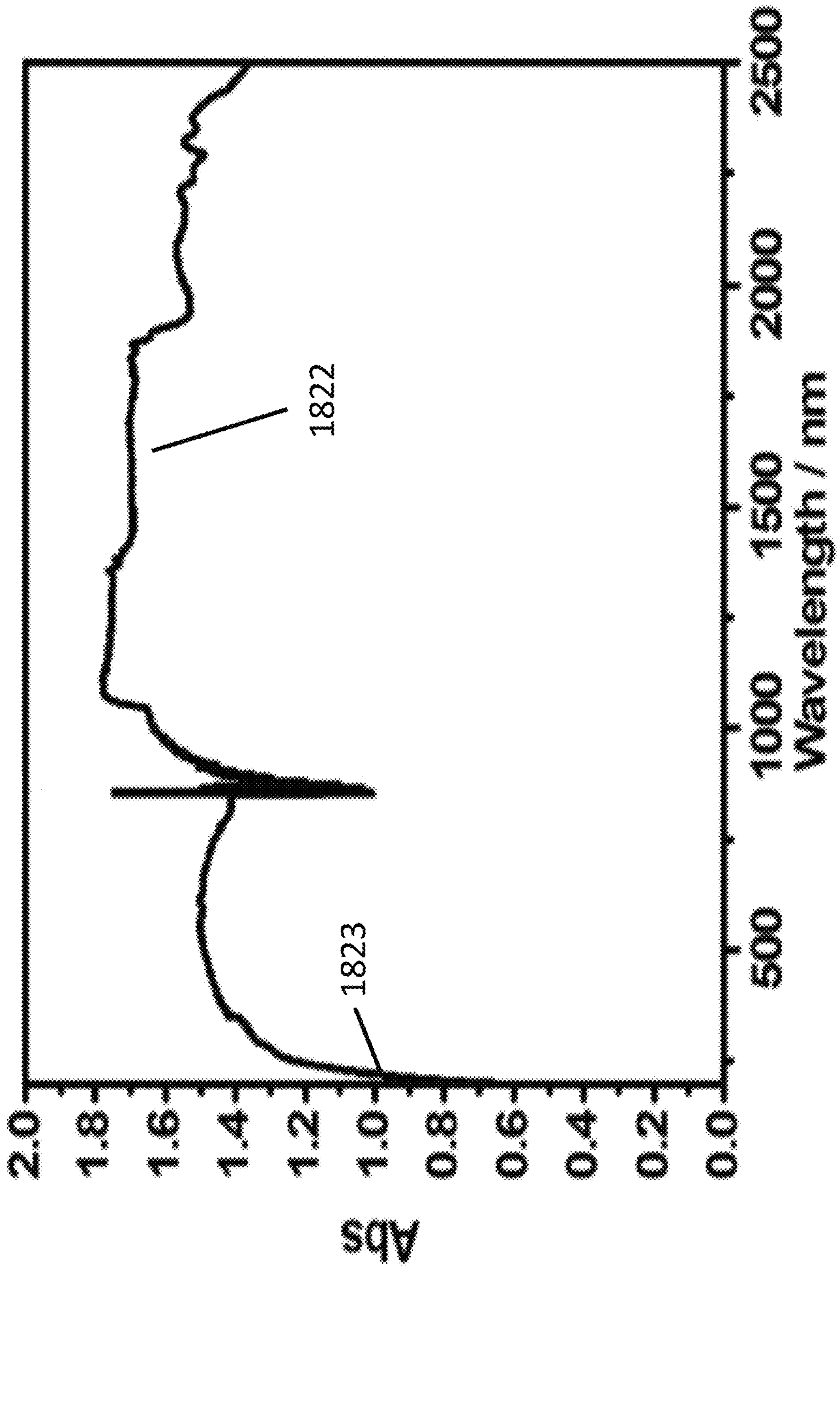

FIG. 63B illustrates a perspective view of a USMP coplanar power package after removal of excess plastic flash FIG. 63C is a graph of the light absorption spectrum of carbon black commonly contained in plastic mold compound.

Figure 64:
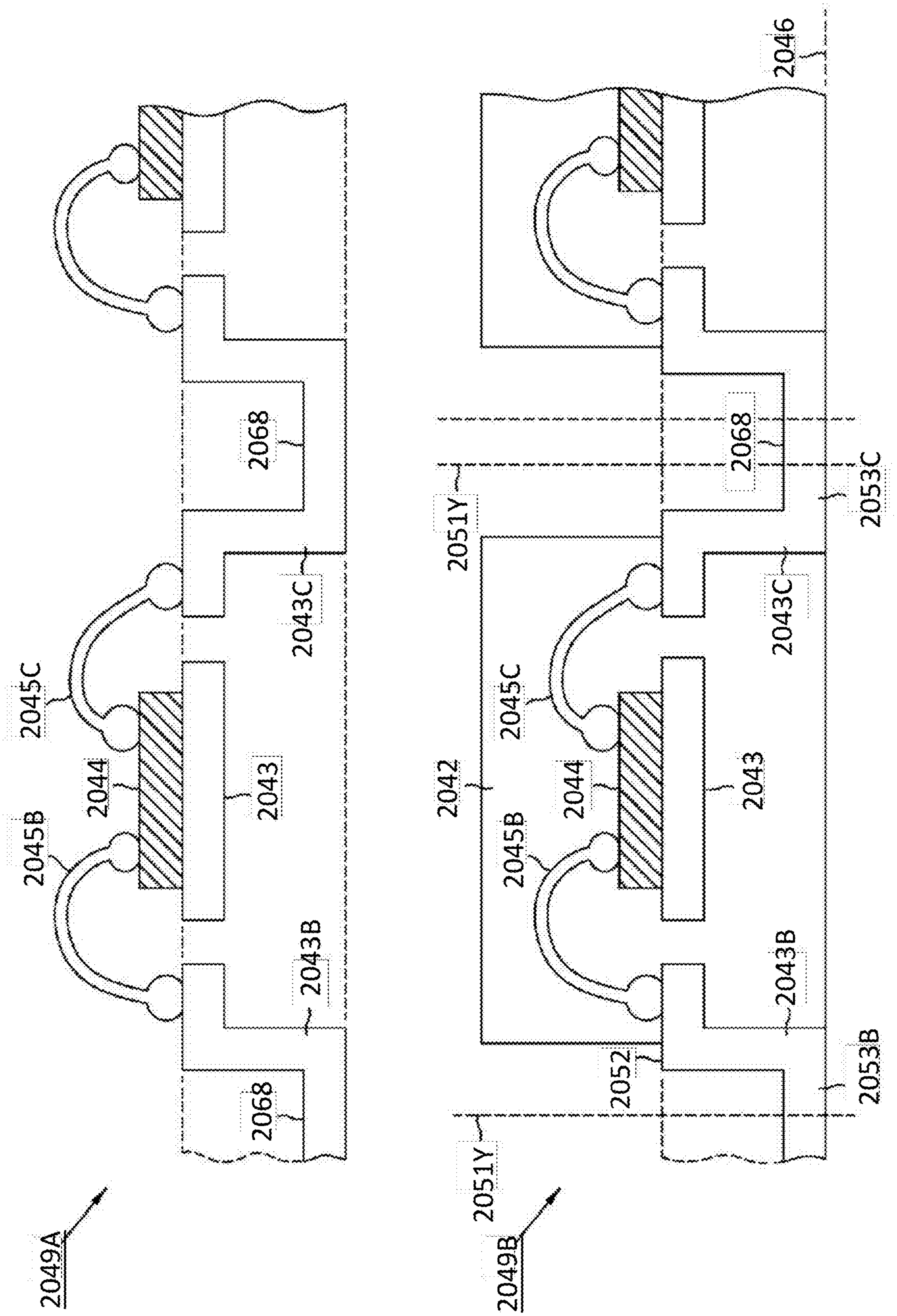

FIG. 64 is the cross-sectional view of a low-profile footed package using a coplanar leadframe prior to singulation.

Figure 65:
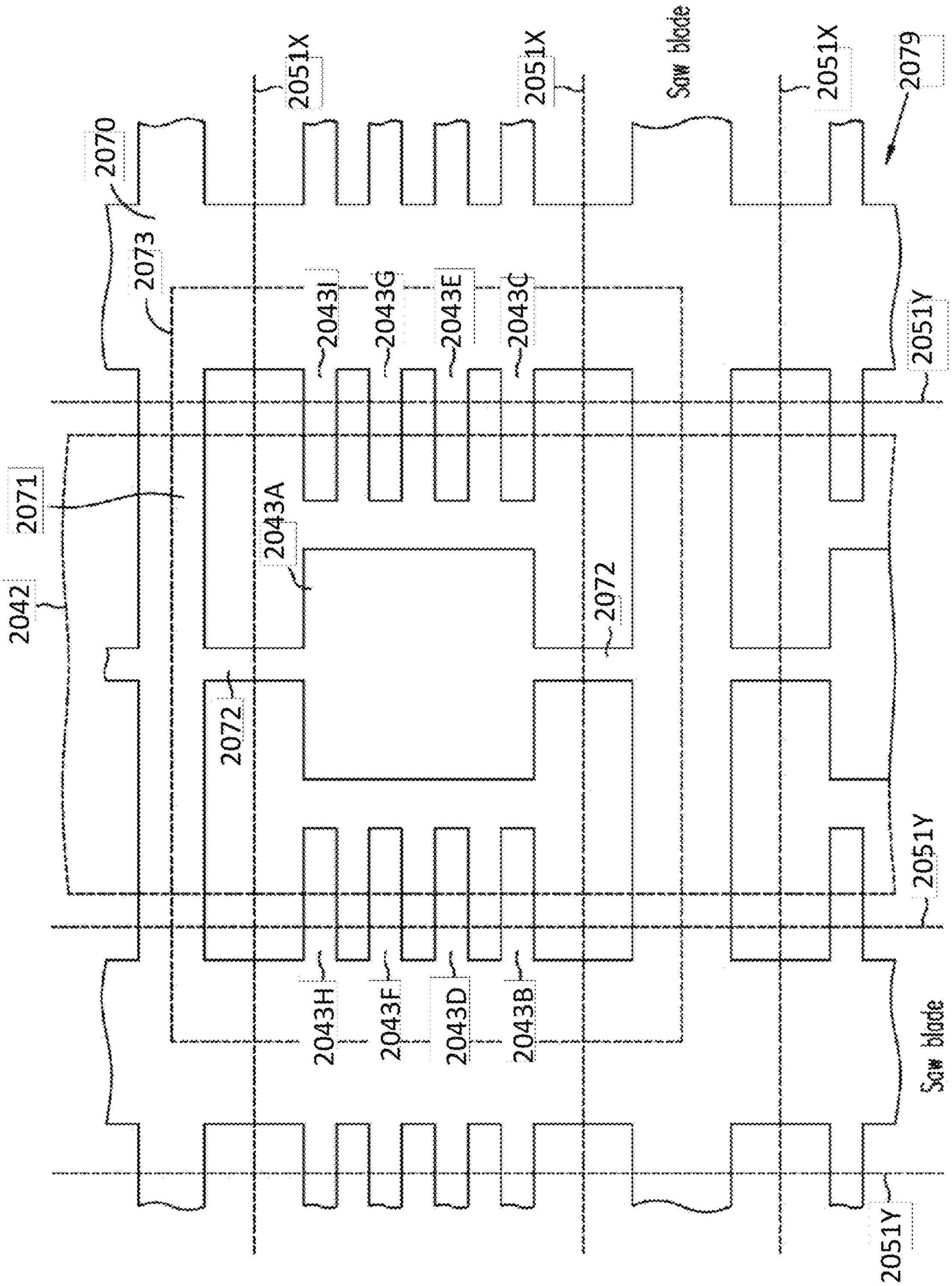

FIG. 65 is the top view of a low-profile footed package using a coplanar leadframe prior to assembly.

Figure 66:
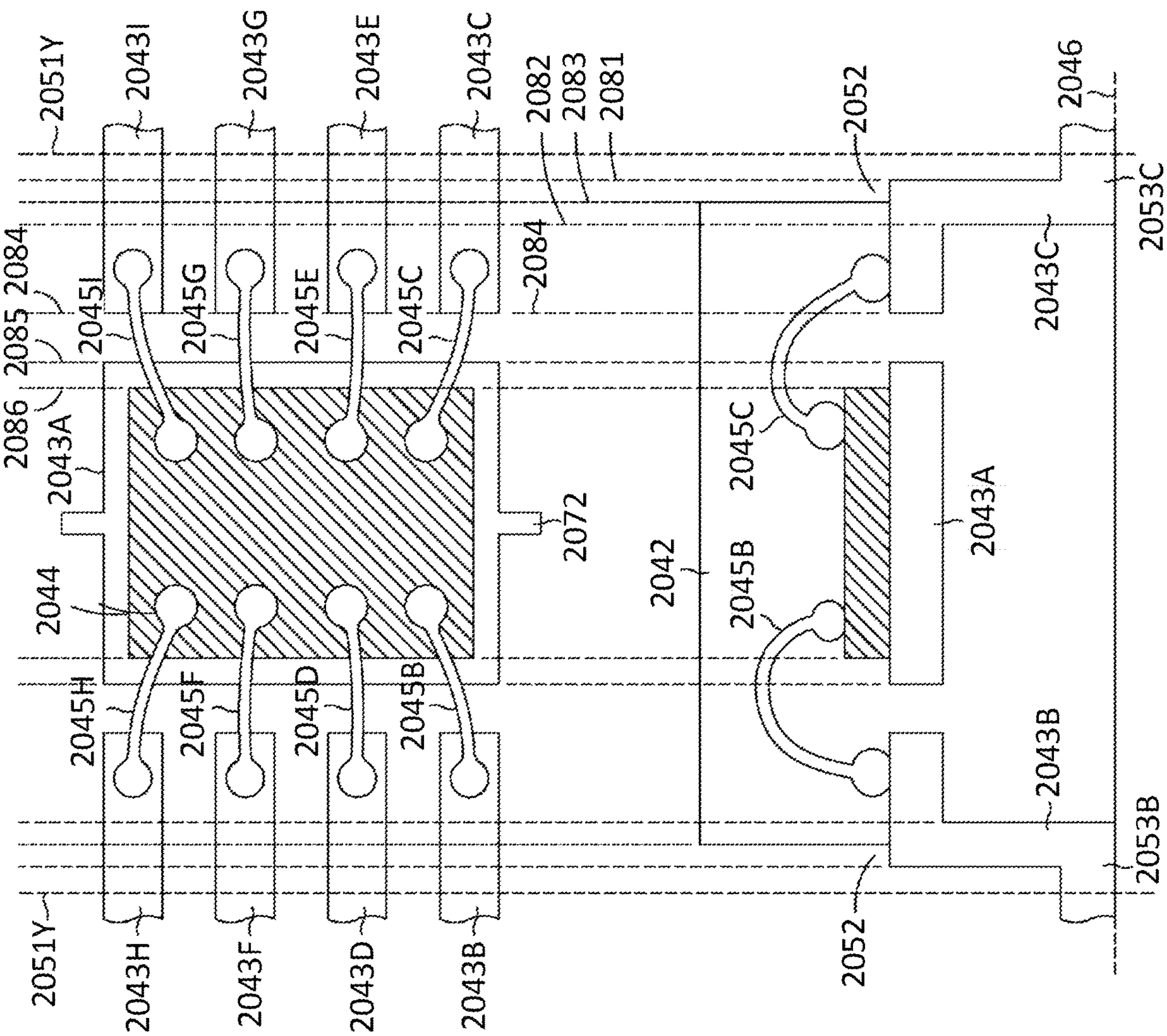

FIG. 66 is the top view of a low-profile footed package using a coplanar leadframe after assembly and molding.

Figure 67:
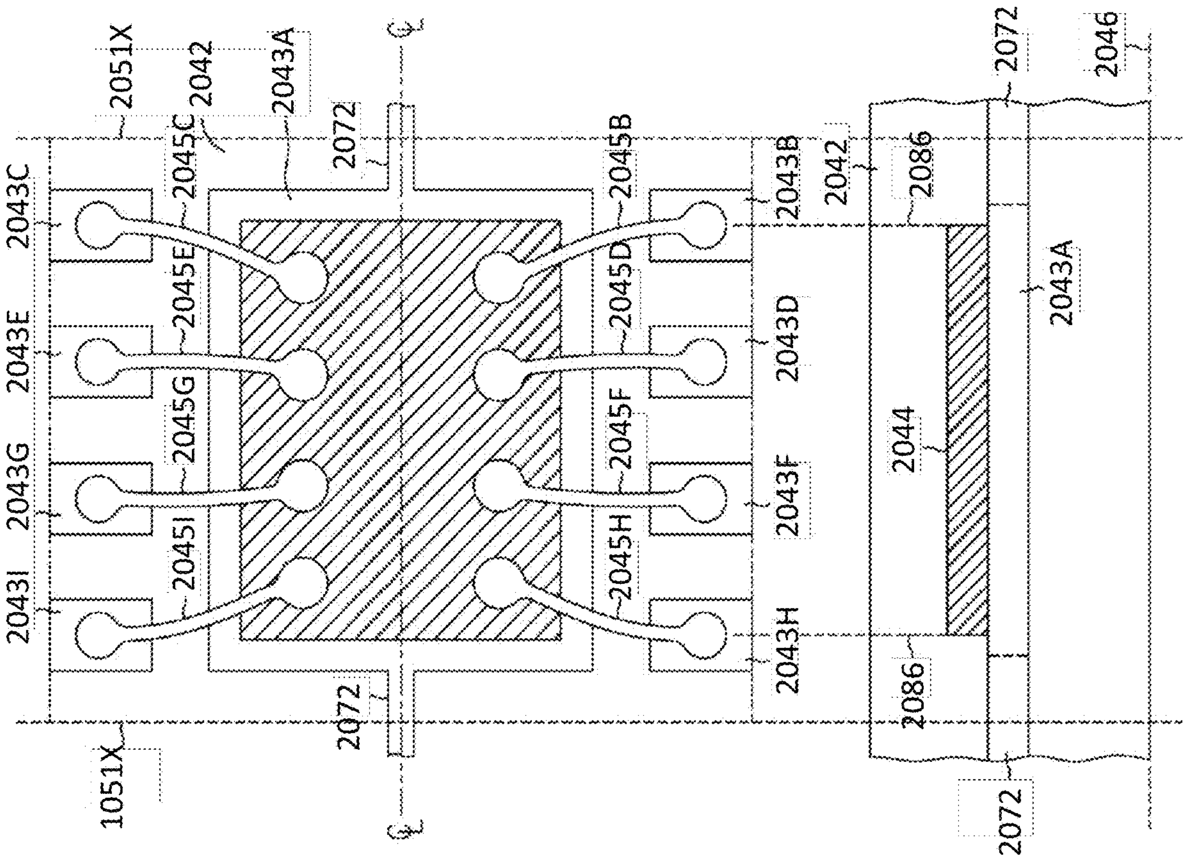

FIG. 67 is the top view of a low-profile footed package using a coplanar leadframe after lead cutting but prior to tie-bar cutting.

Figure 68:
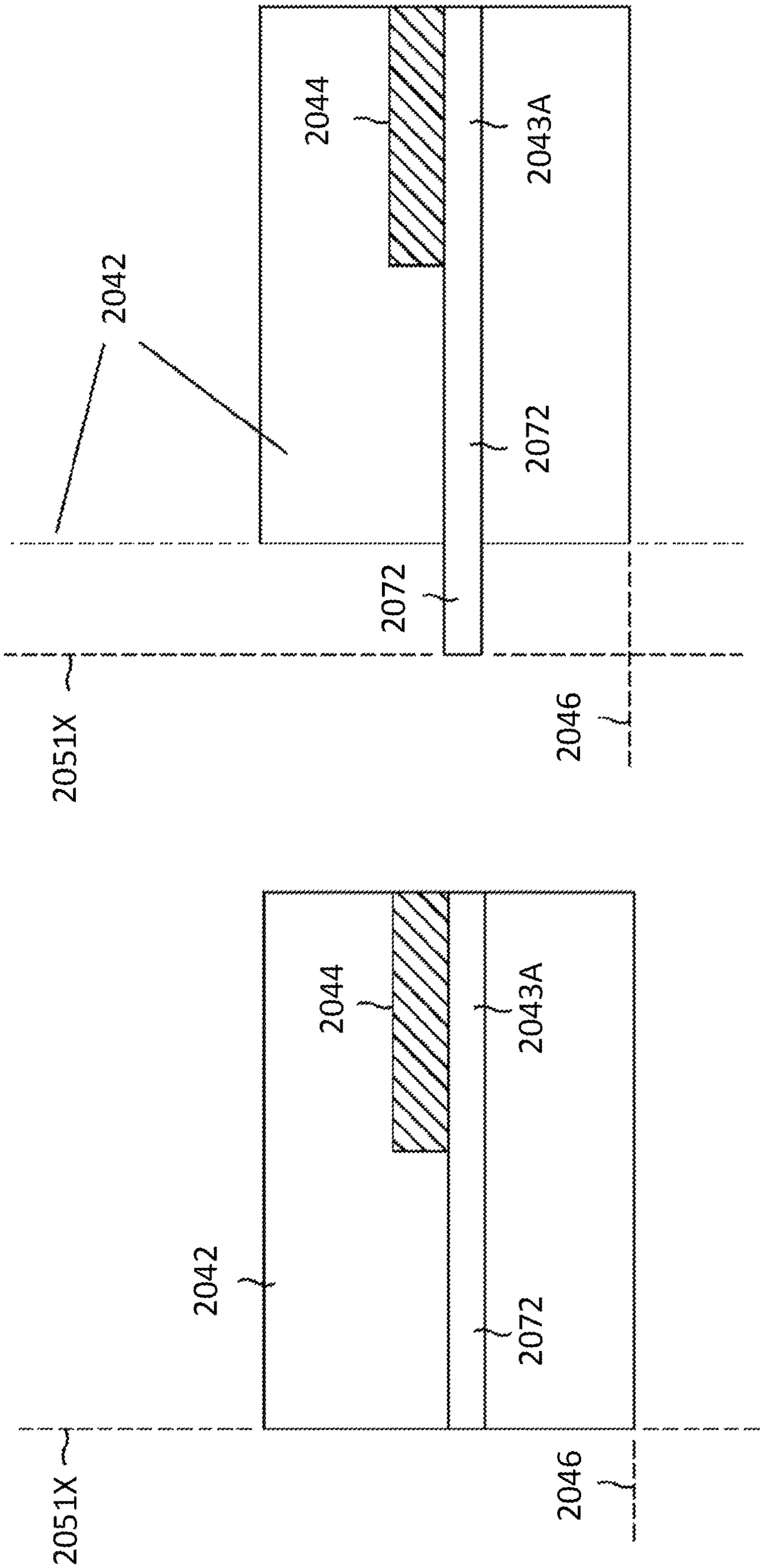

FIG. 68 is the cross-sectional view of a leadframe prior to and after tie bar cutting.

Figure 69:
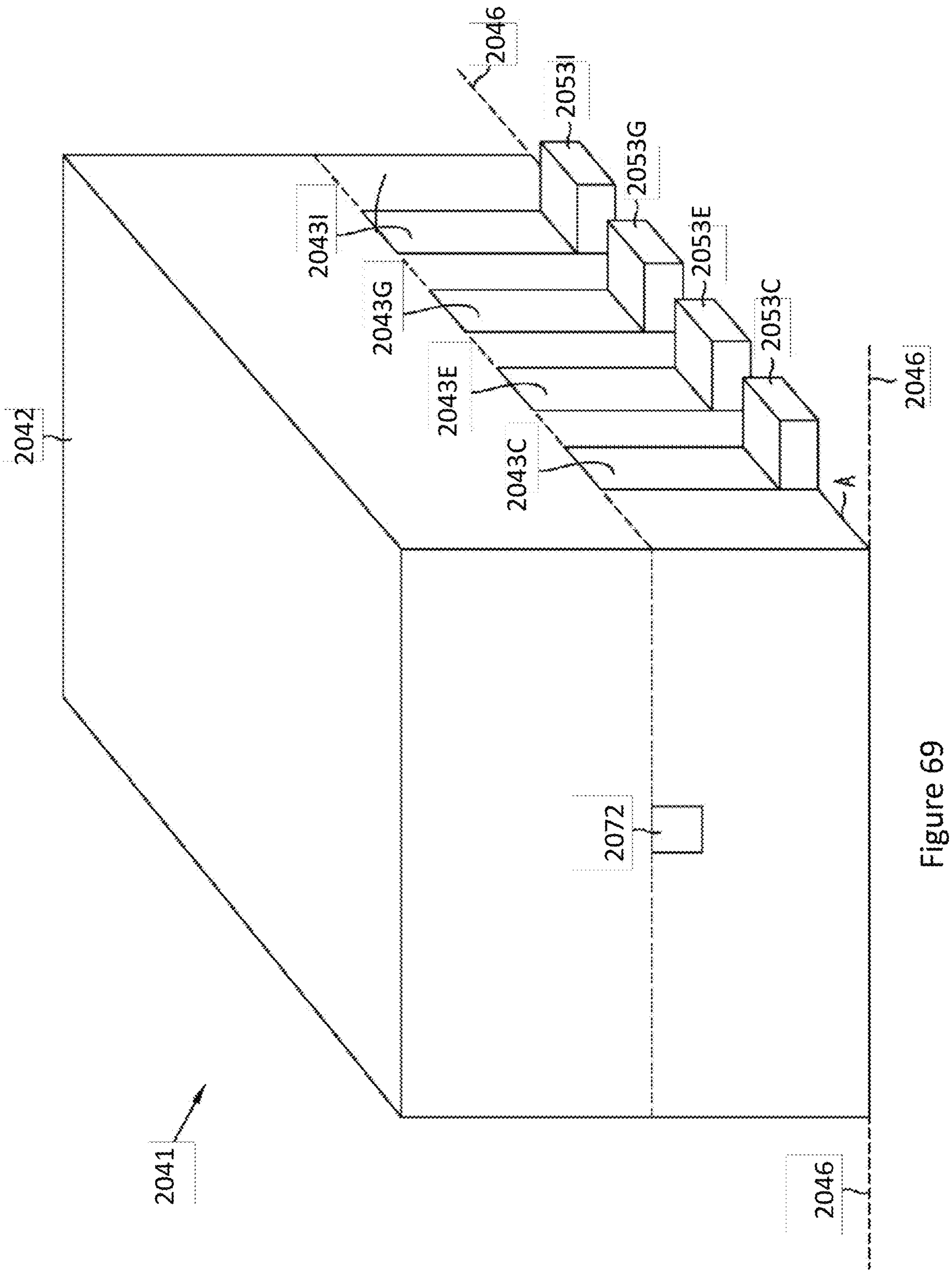

FIG. 69 is the perspective prior of a low-profile package after lead and tie bar cutting.

Figure 70:
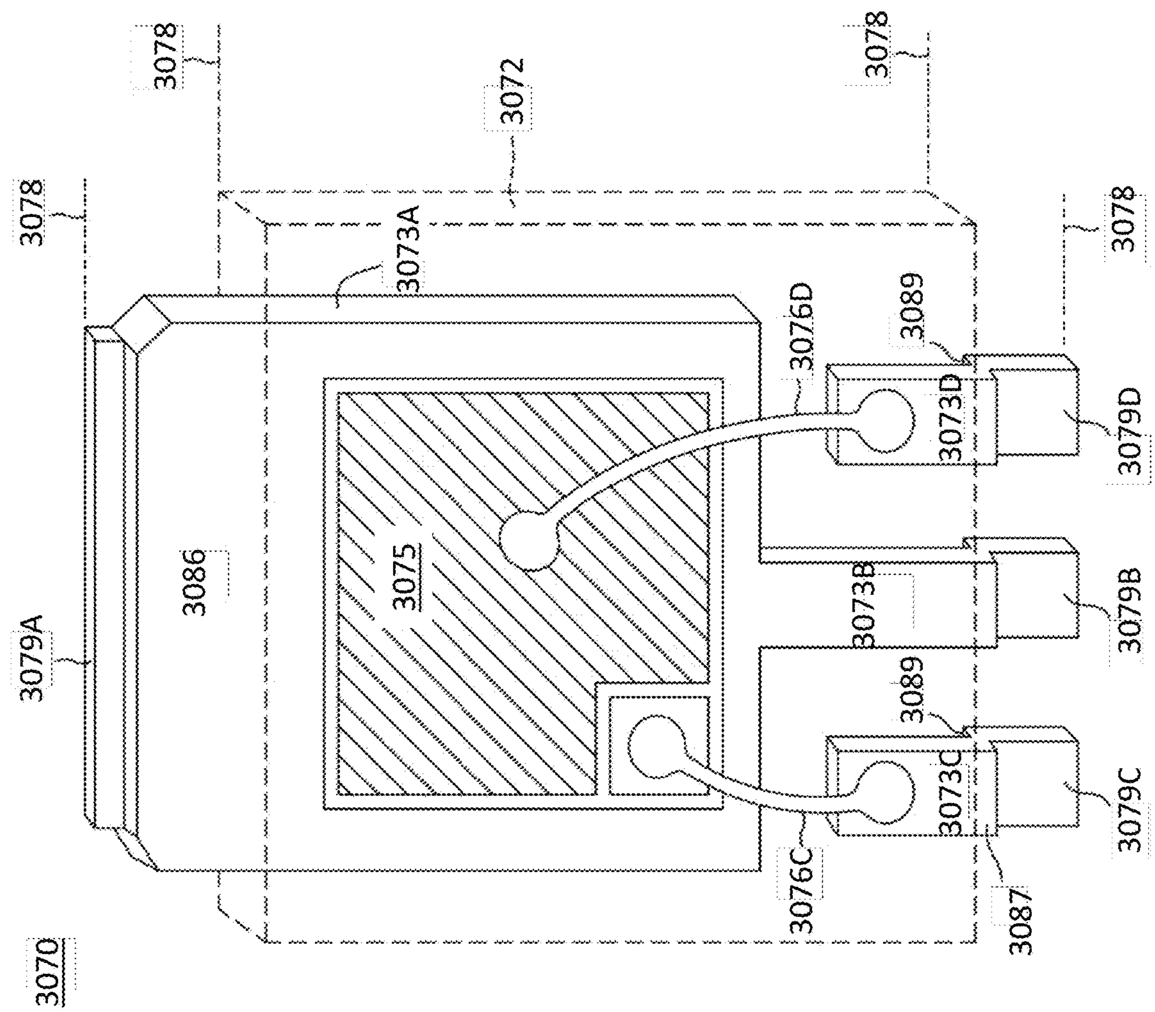

FIG. 70 is the top view of a low-profile footed power package using a coplanar leadframe and wire bonding after completed fabrication.

Figure 71:
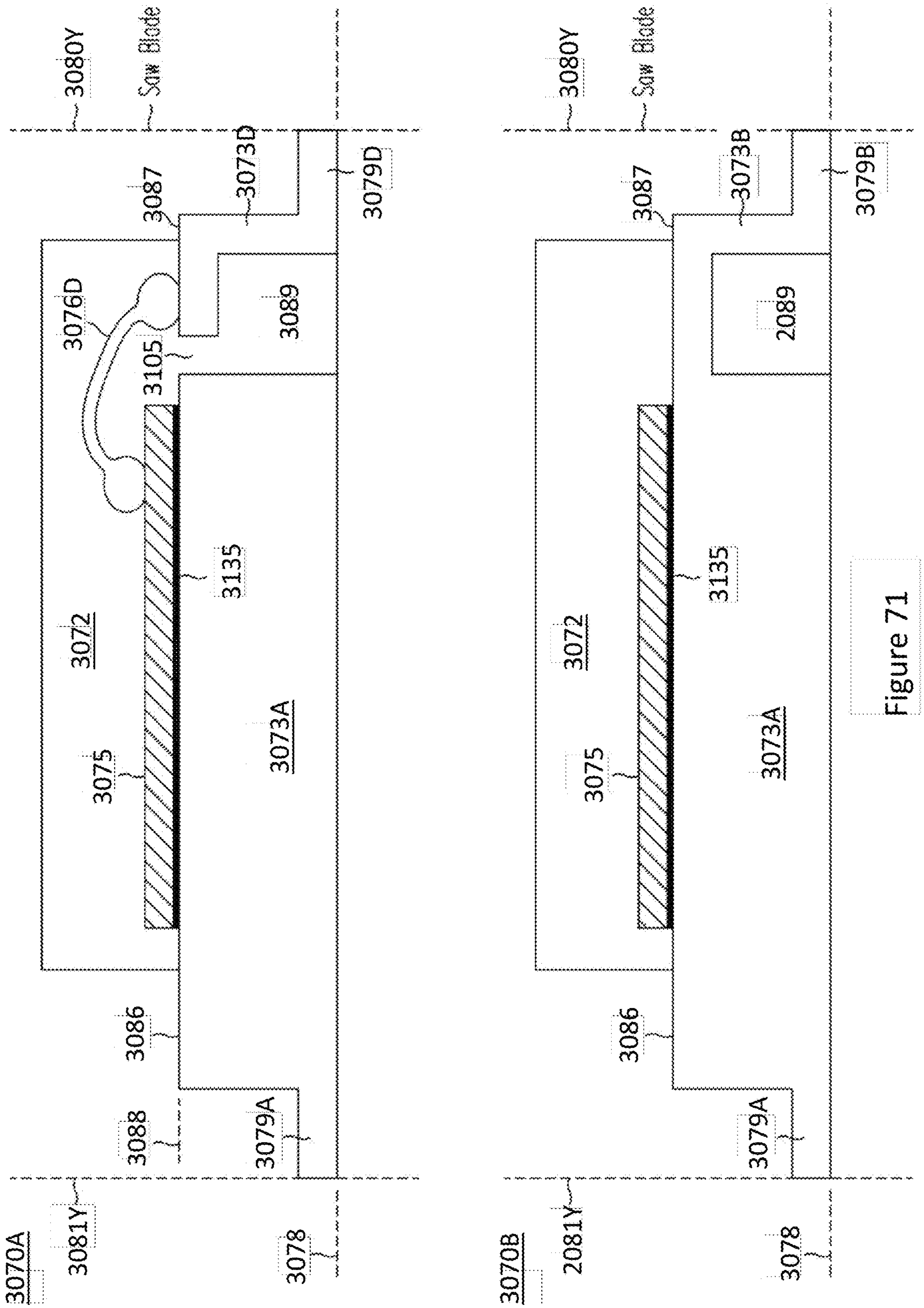

FIG. 71 are various cross-sectional views of a low-profile footed power package using a coplanar leadframe and wire bonding after completed fabrication.

Figure 72:
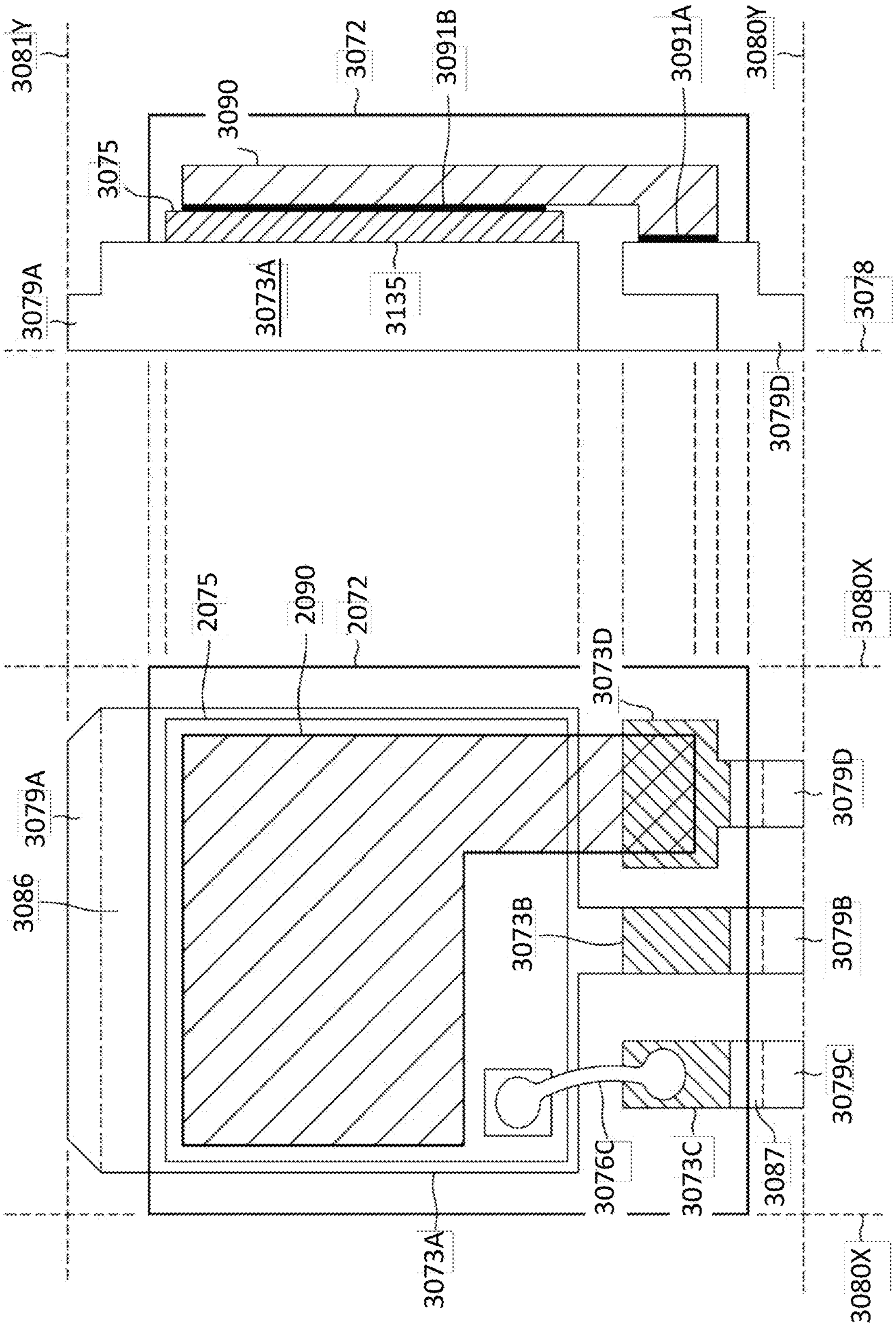

FIG. 72 are top and side views of a completed low-profile footed power package using a coplanar leadframe and a pick-and-place positioned bonded clip-lead.

Figure 73:
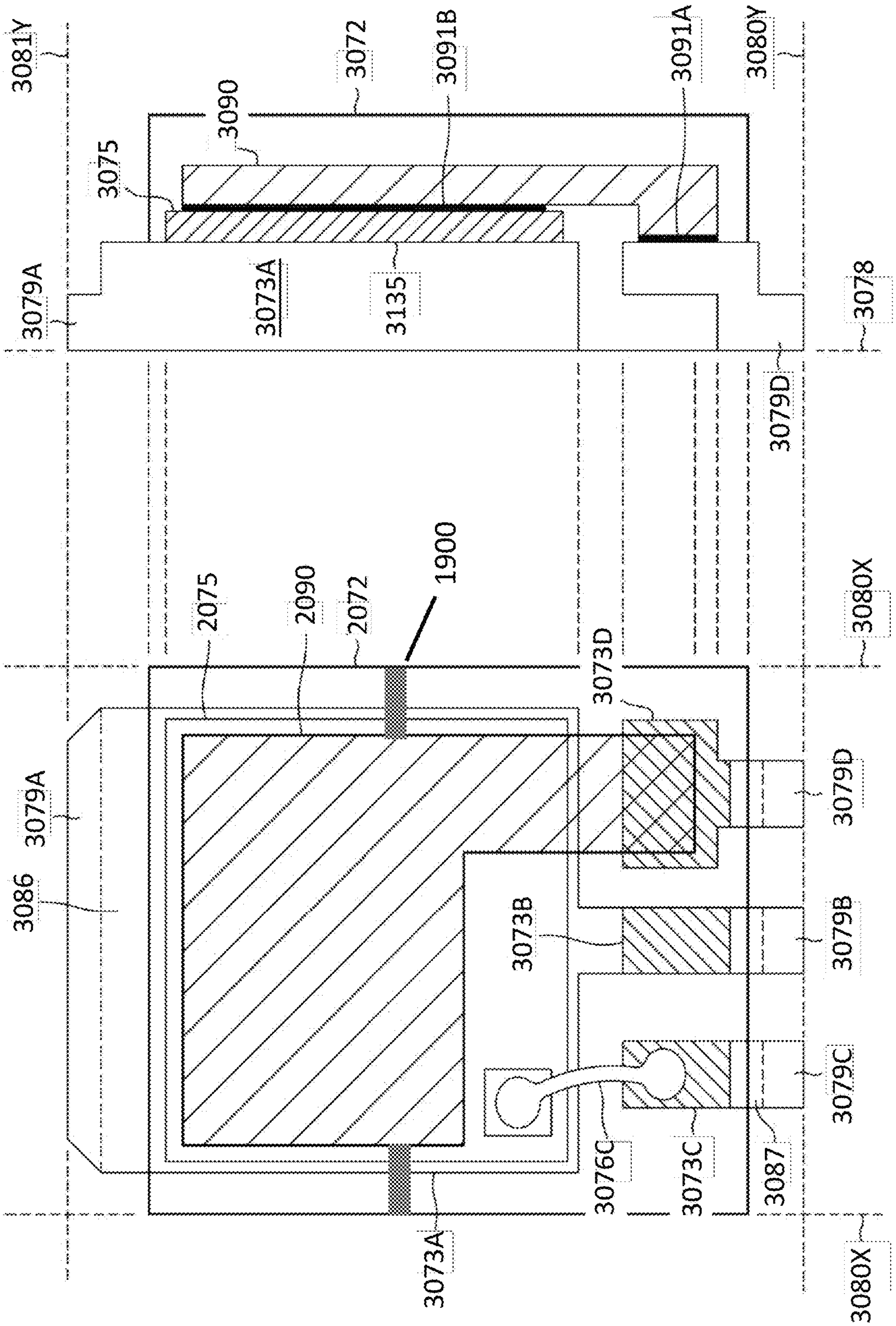

FIG. 73 are top and side views of a completed low-profile footed power package using a coplanar leadframe and a leadframe positioned bonded clip-lead.

Figure 74A:
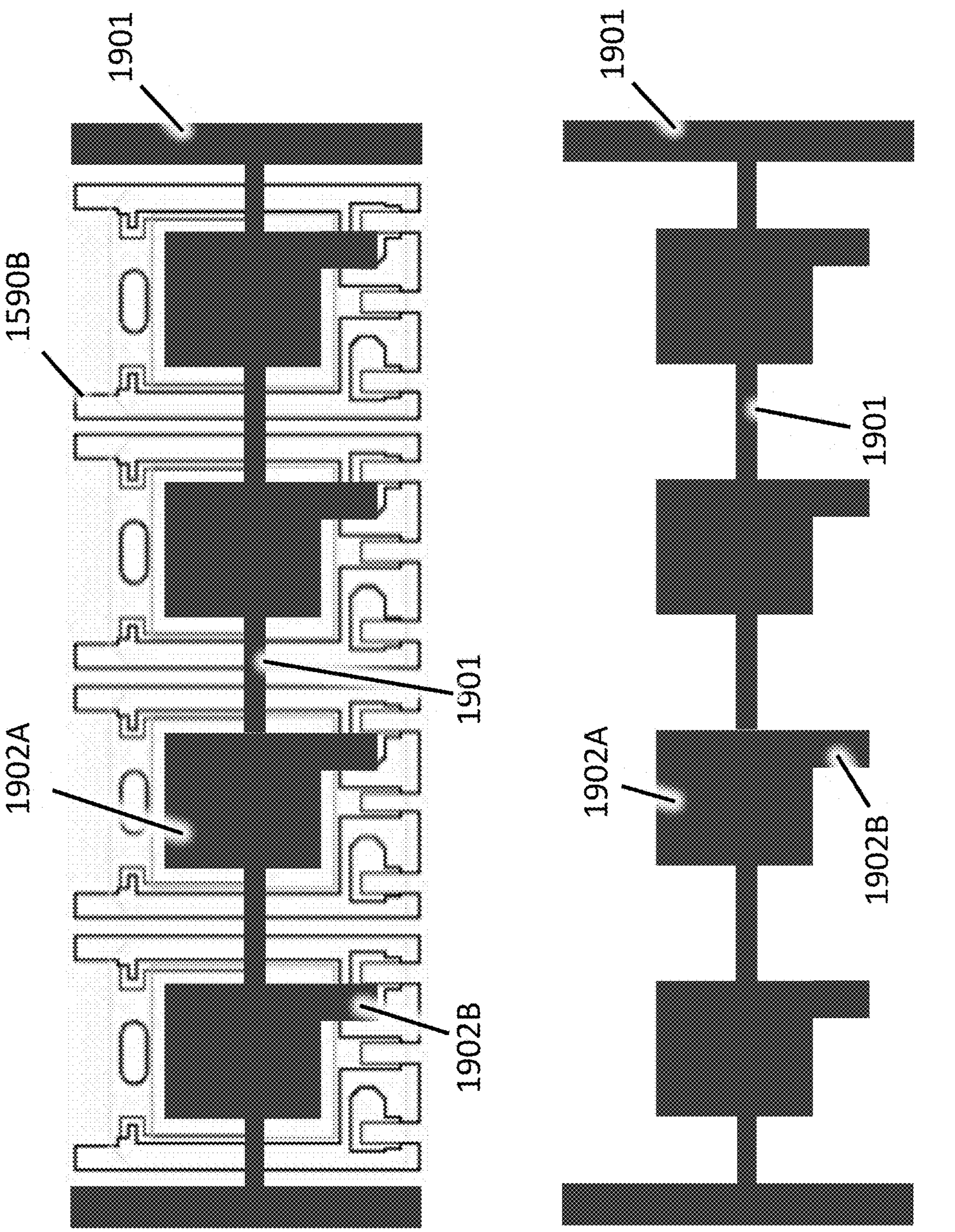

FIG. 74A are top views of a clip-lead leadframe before and after bonding onto a and assembled power package leadframe.

Figure 74B:
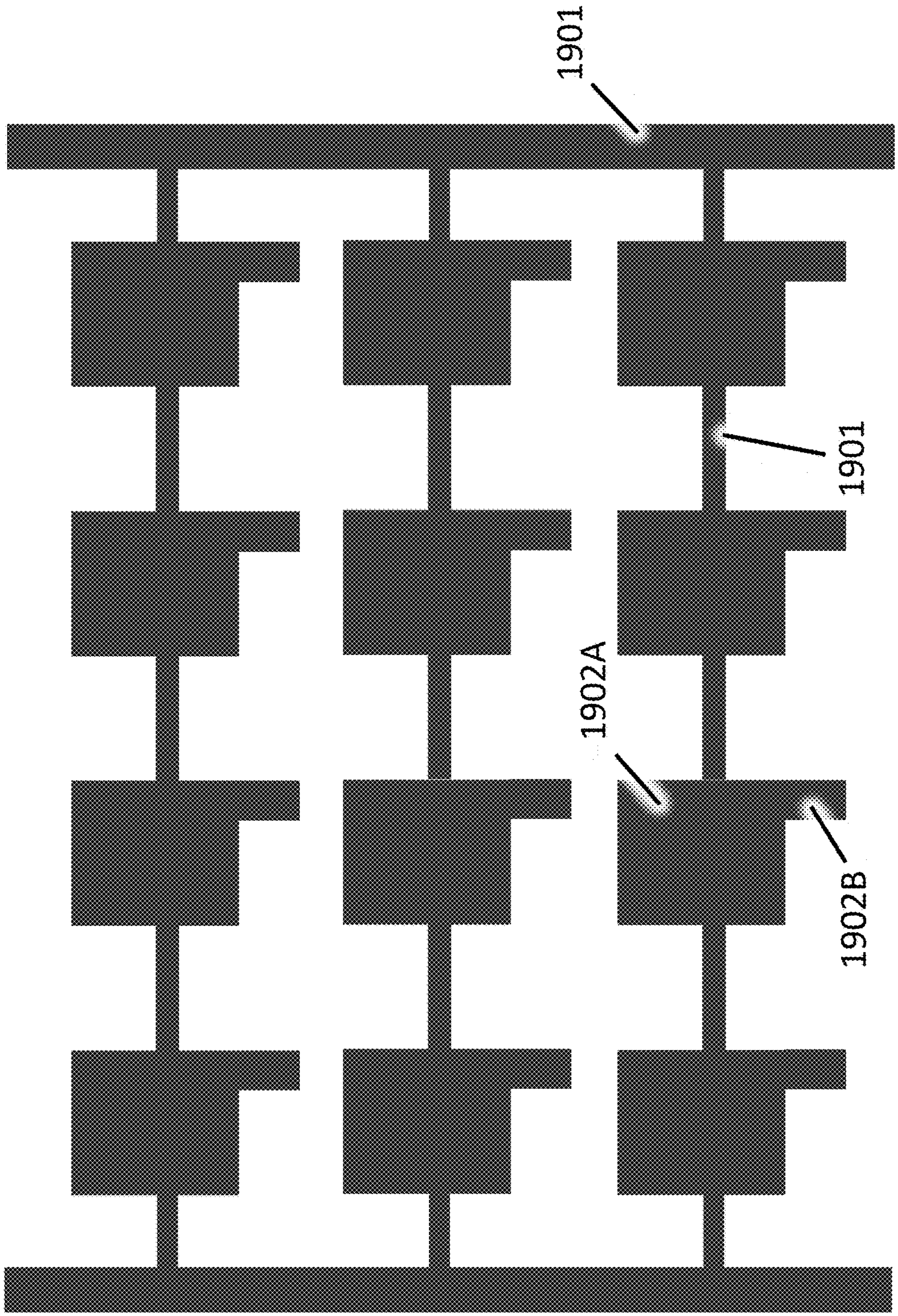

FIG. 74B are top views of a clip-lead leadframe matrix.

Figure 74C:
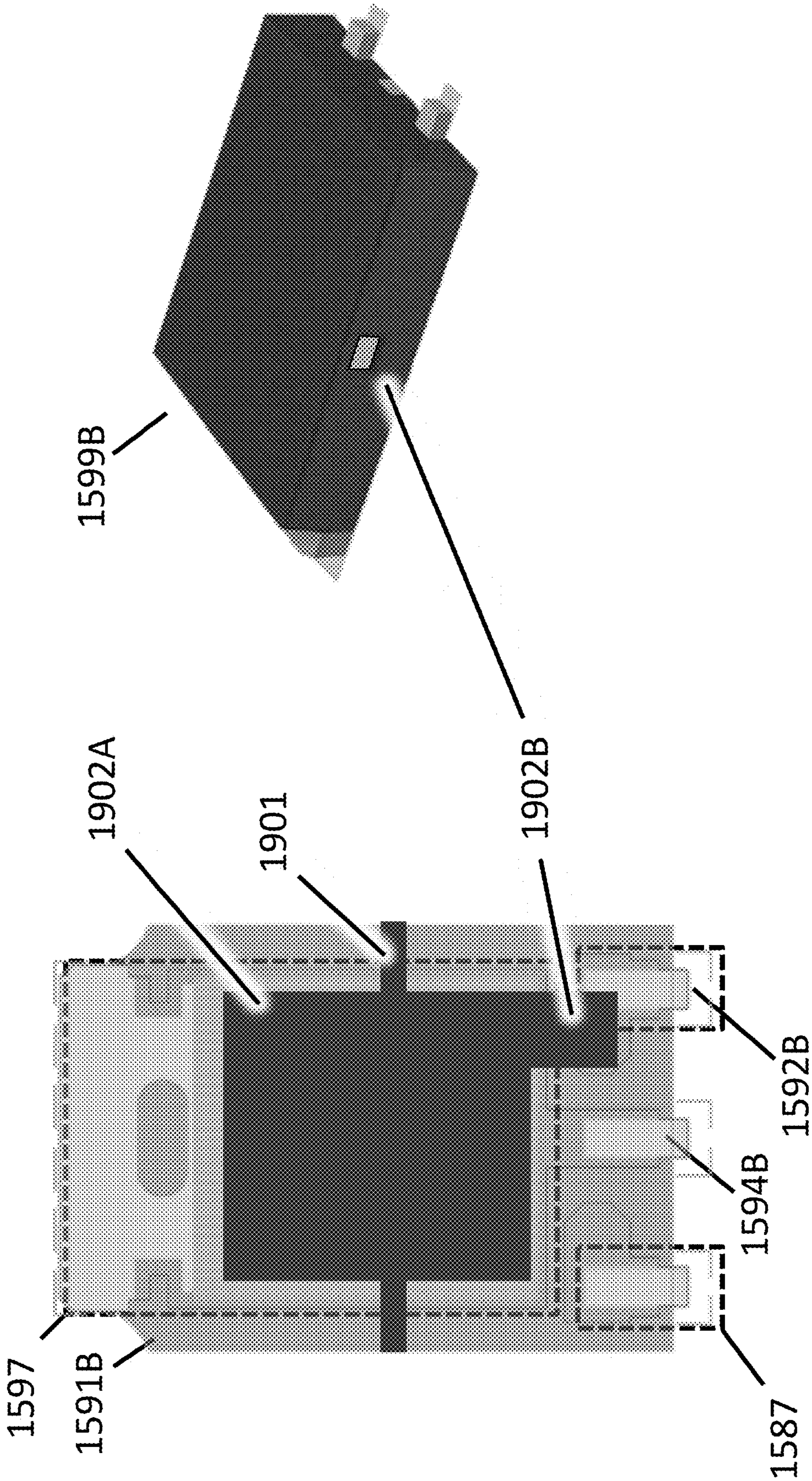

FIG. 74C are top and perspective views of a clip-lead matrix assembled power package, after clip-lead tie bar cutting.

DESCRIPTION OF THE INVENTION

The above-referenced application Ser. No. 14/056,287 and Provisional Applications Nos. 61/775,540 and 61/775,544 relate to inventive methods to make low profile wave-solder compatible semiconductor packages for integrated circuits. These patent applications disclose methods to manufacture low-profile footed packages in the same semiconductor IC packaging facilities presently used to fabricate gull wing leaded packages such as the SOP8 or SOT23. The patent applications also disclose methods to manufacture low-profile footed packages in facilities today used to manufacture leadless packages such as the QFN and DFN.

The above-referenced application Ser. No. 14/703,359 relates to inventive methods to make low profile wave-solder compatible power semiconductor packages for discrete power devices such as the DPAK and D2PAK and other custom leaded packages adapted for power integrated circuits using the same factories used today to manufacture thick, i.e. high profile, packages with thick mechanically bent leads.

From these patent applications, low-profile wave-solder compatible "footed" packages can be manufactured in present day factories with minimal or investment, pursuant to the following limitations:

- Leaded IC package factories producing gull wing packages such as the SOP8 and the SOT23 can be adapted to produce low profile footed versions of the same packages, but cannot be used to produce leadless packages or power packages without incurring significant expense for new equipment and tooling.
- Leadless IC package factories producing leadless packages such as the DFN and QFN can be adapted to produce low profile "footed" versions of the same packages compatible with wave-soldering to replace leaded IC packages of the same footprint (leadless packages are not), but cannot be used to produce power packages without incurring significant expense for new equipment and tooling.
- Power package factories producing discrete power packages such as the DPAK and D2PAK and power IC packages such as a power SOP8 can be adapted to produce low profile "footed" versions of the same packages but cannot be used to produce leaded or leadless IC packages without incurring significant expense for new equipment and tooling.

The above bullet points highlight the fact that leaded package factories are fundamentally incapable of fabricating a diverse range of packages because each package uses machine tools specific to a particular package. Package-specific equipment and tooling include:

- Stamping, punching, and trimming machines used in leadframe manufacturing
- The mold cavity tool (and possibly the transfer mold machine itself)
- Trim and form tools for lead bending, singulation, cutting, and dejunking, i.e. eliminating tie bars, rails, etc. after fabrication is complete
- Handling tools specific to each leadframe
- Pick and place machines to pick up and pack the singulated packages All the above listed machines are specific to a particular package and generally incapable of being used to manufacture other package types. This inflexibility forces each package vendor to choose specific packages to serve a particular segment of the market and that if opportunity or demand arises for a different package it is unlikely, if not impossible, for them to adapt their factory to accommodate the new package.

Even in the unlikely event that a specific production line can be adapted to support another somewhat similar package, for example converting a SOT23 line to a SOT223 line, the process is complex. To convert one package to another all the mold cavity tools must be swapped, the handlers must be changed, the trim and form machine must be converted, and even the mold machine temperature must be recalibrated. The effect of all these modifications is a loss of productivity during the equipment conversion process, lowering overall throughput, i.e. the factory's UPH or units per hour is reduced by the downtime. In economic terms, lower UPH means the cost per unit is higher, and the package company's profitability and competitiveness is adversely impacted.

So although the aforementioned patent applications disclose methods to upgrade leaded packages to low-profile footed packages offering absolute coplanarity for improved PCB manufacturing, and likewise provide a means to produce wave-solderable footed packages in a factory previously incapable of producing anything but leadless packages, the disclosures do not facilitate a means to produce a plethora of packages in the same factory and with minimal or no cost in converting factory machinery and tooling.

The method disclosed herein overcomes this package-specific manufacturing inflexibility by combining the following features:

- Dual-sided etched leadframe
- Shared "block" mold for multiple packages and leadframes
- Laser plastic and lead definition Together these elements enable a single factory to manufacture a virtually unlimited combination of leaded, leadless, and power packages. Because of its ability to produce any number of different package types including Footed IC surface mount packages
Leadless IC surface mount packages
Footed power surface mount packages
Leaded IC packages
Leaded power packages As such, the package disclosed herein is referred to as a "universal surface mount package" or USMP.

Dual-Sided Etched Leadframe

Figure 7A:
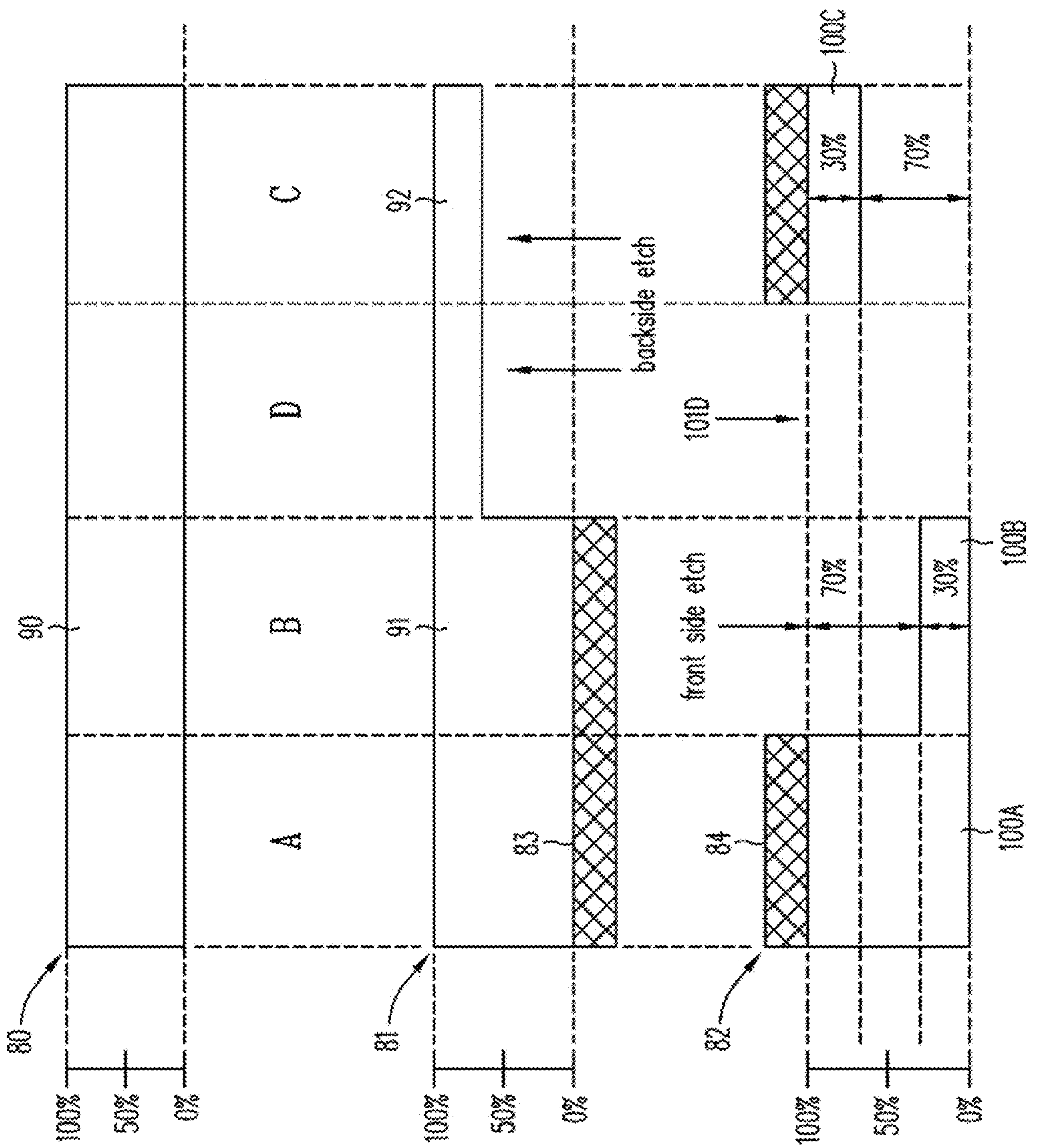
FIG. 7A is a cross sectional representation of universal surface mount package (USMP) leadframe regions during double etching fabrication.

A package of this invention may be fabricated from a leadframe with dual-side etching. Cross-sectional view 80 in FIG. 7A illustrates a copper sheet 90, having a thickness of 200 μm or 500 μm, used to form the USMP leadframe. Through etching, or alternatively through stamping, the copper sheet is modified into four geometric pieces, or segments.

Copper sheet 90 is subdivided into four segments A, B, C and D. In cross-sectional view 81 of FIG. 7A, a mask 83 protects segments A and B but exposes segments D and C to a backside etch, typically a liquid acid solution for etching copper. After etching, copper sheet 90 is reduced in thickness to produce cantilever section 92 while section 91 retains its full thickness. Alternatively, if the topside of copper sheet 90 is also exposed to a copper-etch, the entire sheet 90, including section 91, is reduced in thickness but cantilever section 92 is reduced proportionately.

In cross-sectional view 82 in FIG. 7A, a mask 84 protects segments A and C but exposes sections B and D to a frontside etch. During etching, segment B in section 91 is thinned to form a foot 100B while segment D is completely cleared of all copper. If the etching occurs on only the frontside, section 100A in segment A and cantilever 100C in segment C remain unaffected. If however the etching occurs in an acid bath and the backside of the copper leadframe 90 is unprotected, all sections are thinned proportionally.

The result of the fabrication sequence is four distinct segments. Segment A comprises the full thickness of the copper sheet, i.e. 100%. Segment C comprises etched copper cantilever 100C having a thickness at a fraction of the total thickness of copper sheet 90, e.g. 30%, having a top surface coplanar with the top of segment A. Segment B comprises etched copper having a thickness at a fraction of the total thickness of copper sheet 90, e.g. 30%, having a bottom surface coplanar with the bottom of segment A. Segment D comprises opening 101D completely clear of metal.

Figure 7B:
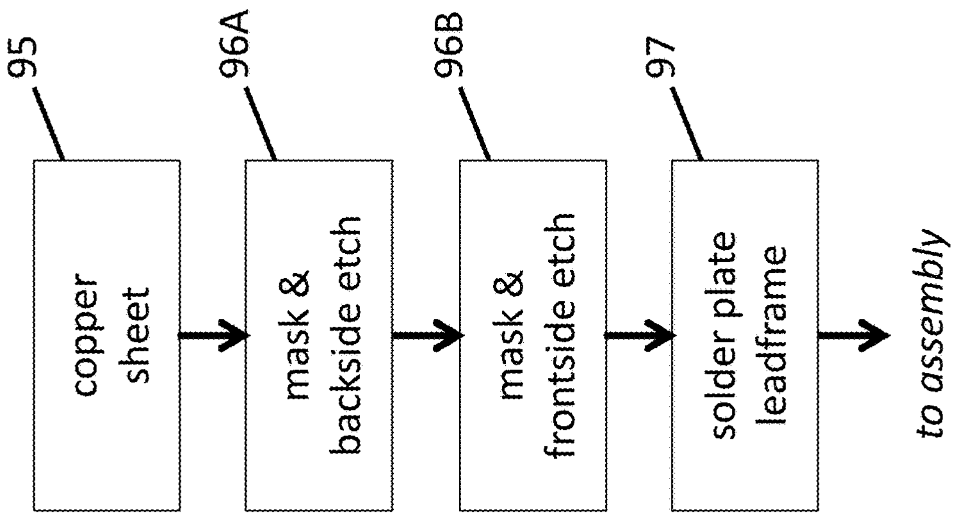
FIG. 7B is one possible flow chart for USMP leadframe fabrication.

The process flow for leadframe fabrication is shown in FIG. 7B, starting with copper sheet 90 (step 95) followed by mask and backside etch (step 96A), mask and frontside etch (step 96B), and finally the solder plating of the leadframe (step 97), where the leadframe is plated with tin, silver, nickel, palladium, or other solderable metals.

Figure 8A:
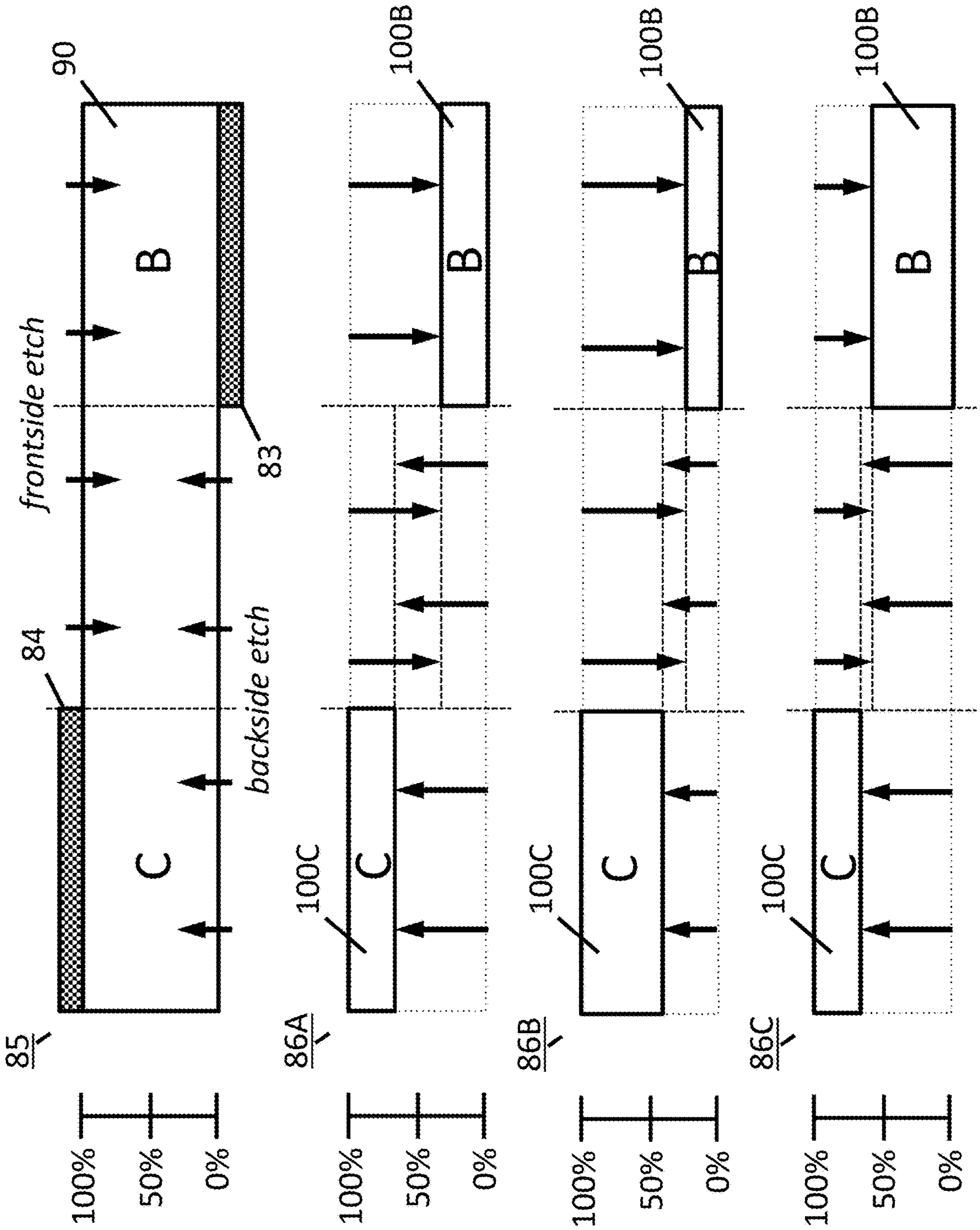
FIG. 8A is a cross sectional illustration of a leadframe manufactured using a viable USMP fabrication sequence.

FIG. 8A illustrates the design parameters for etching copper sheet 90, shown in cross-sectional view 85. In order to preserve copper in cantilever section C and foot section B while clearing all the metal in section D, the sum of the frontside etch and backside etch must exceed 100%, preferably with a 10% overetch. For example, in cross-sectional view 86A the front-side-etch removes 70% of the copper to form foot 100B while backside etch removes 70% of the copper to form cantilever 100C. This embodiment of the invention produces equally thick cantilever and feet sections.

Alternatively the front-side-etch removes more than the backside. As shown in cross section 86B, the front-side-etch removes 70% of the copper to form foot 100B while backside etch removes 40% of the copper to form cantilever 100C. This version produces a thick cantilever 100C and a thin foot 100B. In another embodiment the backside etch removes more than the front-side. As shown in cross section 86C, the front-side-etch removes 40% of the copper to form foot 100B while backside etch removes 70% of the copper to form cantilever 100C. This version produces a thin cantilever 100C and a thick foot 100B.

Figure 8B:
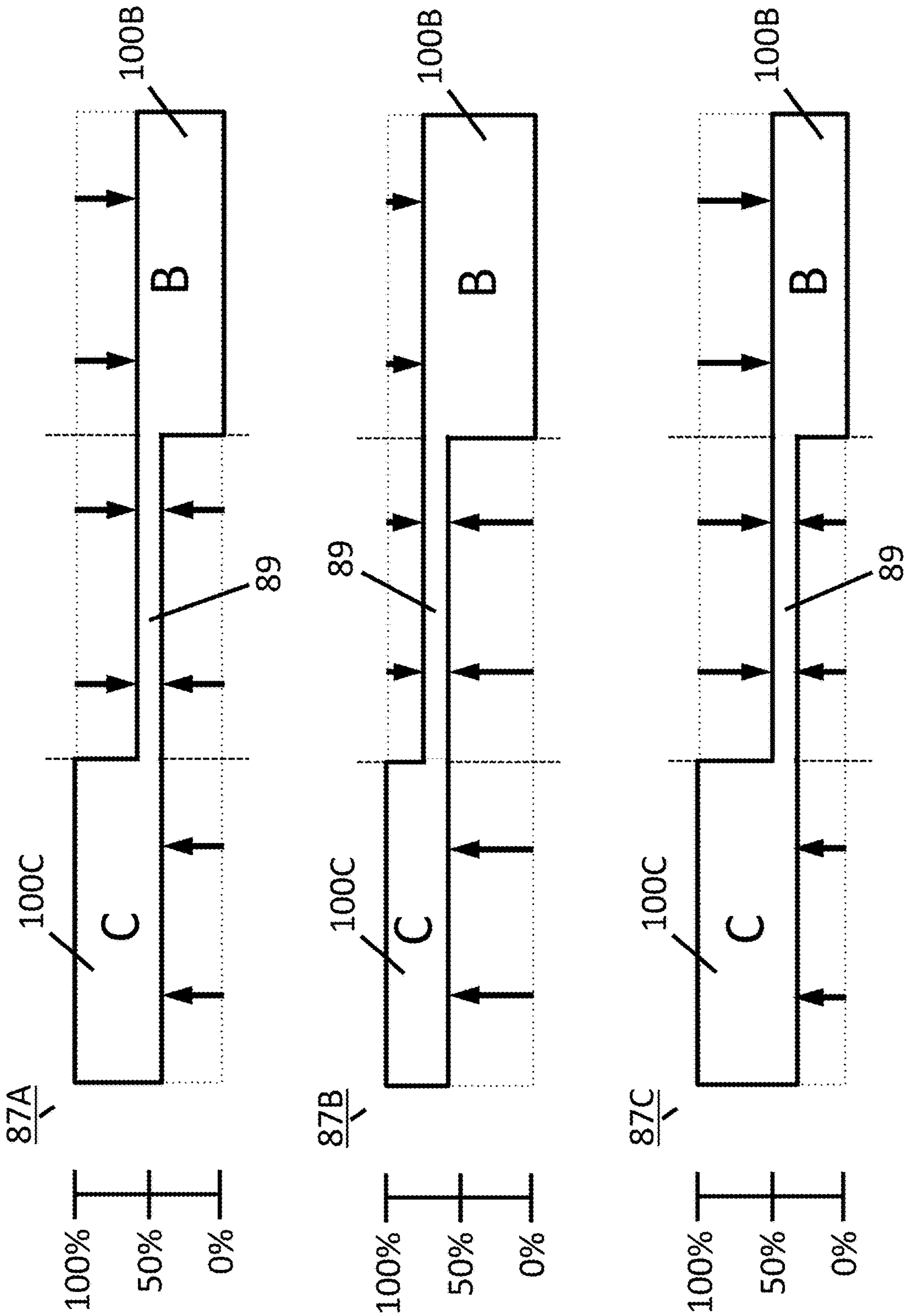
FIG. 8B is a cross sectional illustration of a leadframe manufactured using a problematic USMP fabrication sequence.

To insure the copper clears in sections where it should be removed the sum of the front and back etches must exceed 100% of the copper thickness. If the two etches are similar in time but do not exceed 100% of the starting copper thickness, unintended metal bridge 89 results as shown in cross-sectional view 87A of FIG. 8B. If the top etch is of short duration and the backside etch is of a long duration but together the etches do not exceed 100% of the starting copper thickness, unintended metal bridge 89 results, as shown in cross-sectional view 87B. If the top etch is of a long duration and the backside etch is of a short duration but together the etches do not exceed 100% of the starting copper thickness, unintended metal bridge 89 results, as shown in cross-sectional view 87C.

Figure 9A:
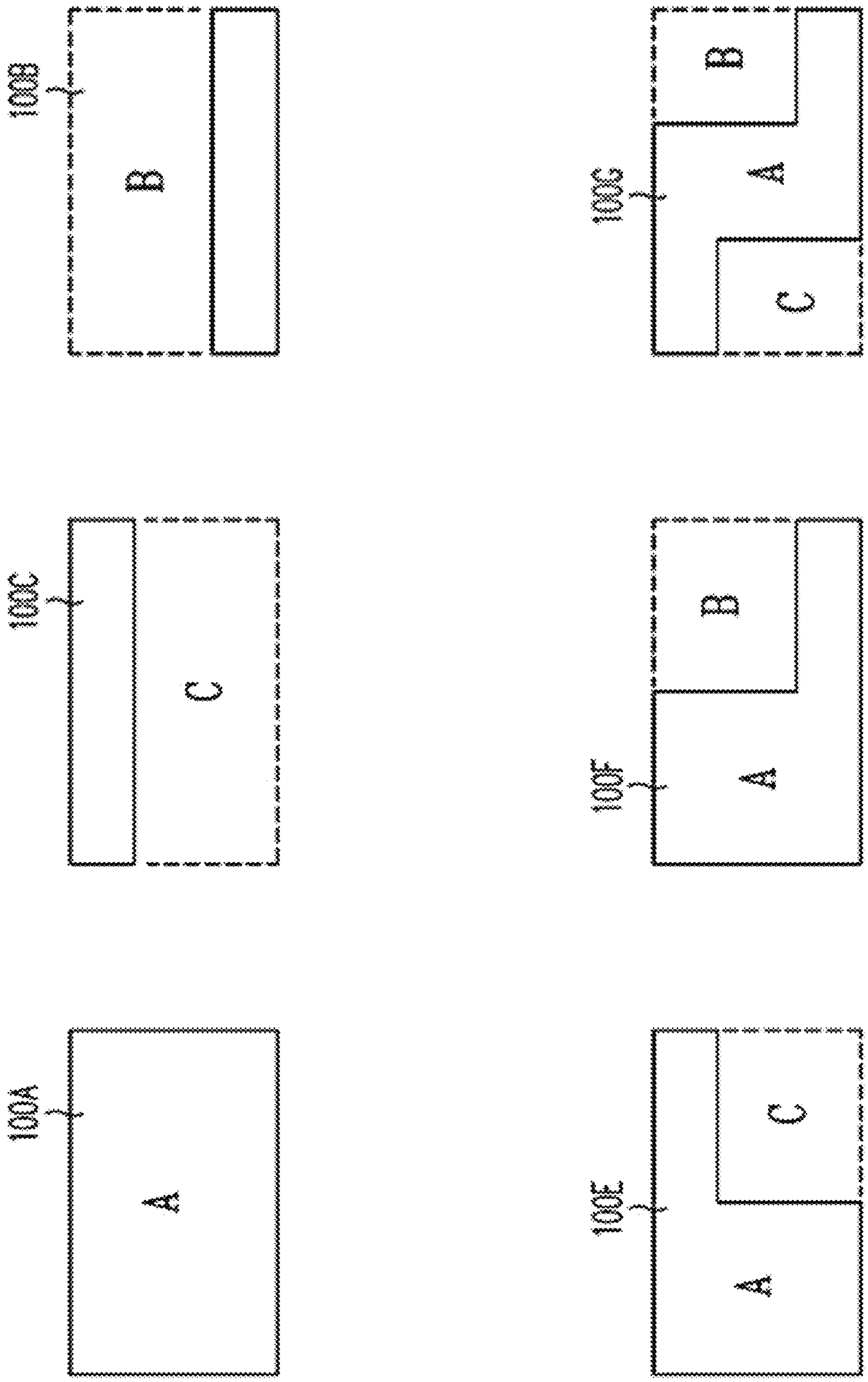
FIG. 9A is a cross sectional illustration of various two and three region geometric leadframe elements resulting from the disclosed USMP leadframe fabrication sequence.
Figure 9B:
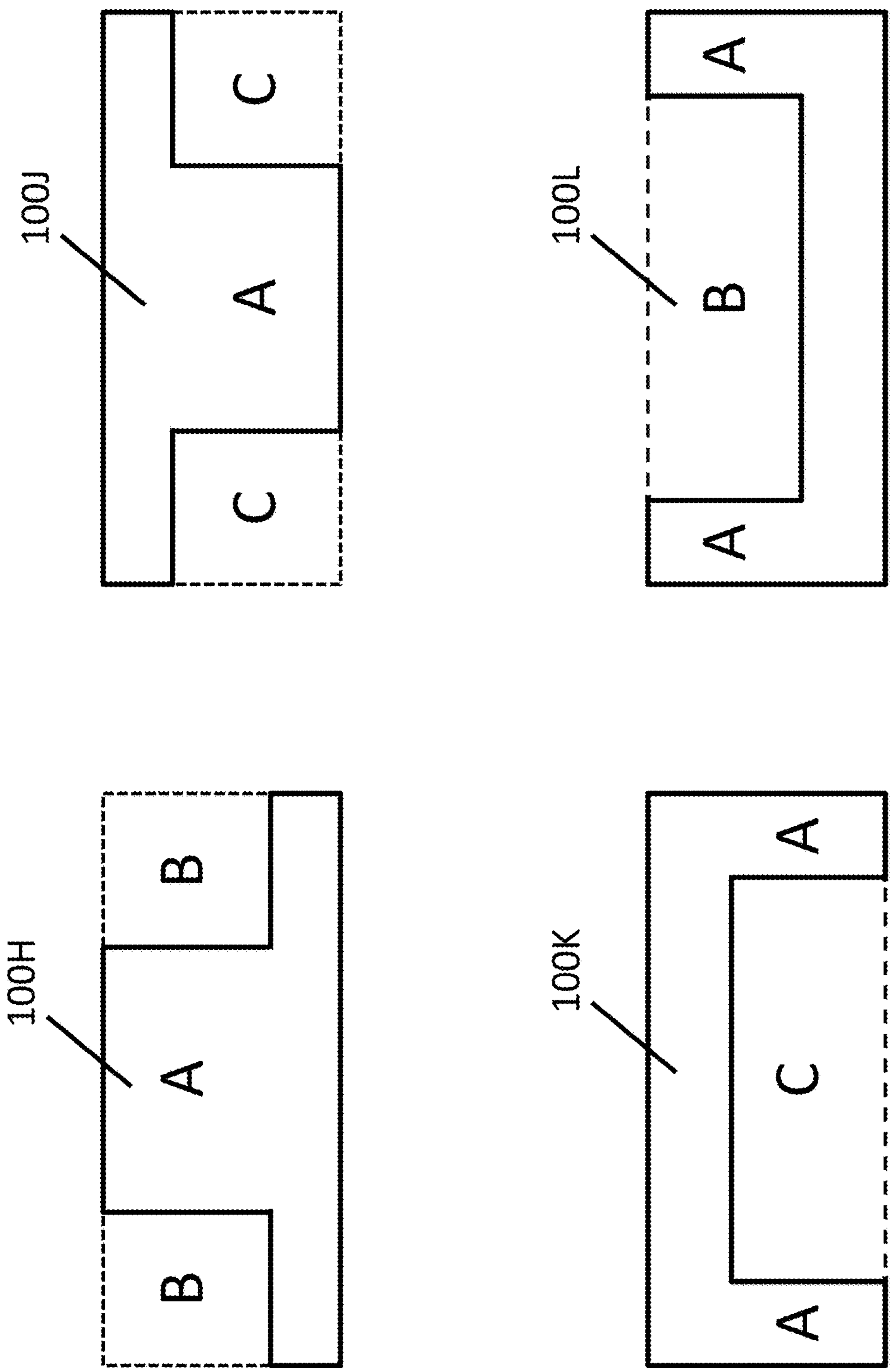
FIG. 9B is a cross sectional illustration of various three region geometric leadframe elements resulting from the disclosed USMP leadframe fabrication sequence.

The process of leadframe manufacture in accordance with this invention enables a variety of useful geometries to be fabricated shown in FIG. 9A, including a column 100A comprising segment A; a foot 100B comprising segment B; a cantilever 100C comprising segment C; a half-T-shape 100E comprising the combination of segments A and C; an L-shape 100F comprising the combination of segments A and B; and also a Z-shape 100G comprising the combination of segments C, A, and B. Other useful geometries shown in FIG. 9B include an inverse T-shape 1004 comprising the combination of segments B, A, and B; a T-shape 100J comprising the combination of segments C, A, and C, a U-shape 100L comprising the combination of segments A, B, and A; and also an inverse U-shape 100K comprising the combination of segments A, C, and A.

Figure 9C:
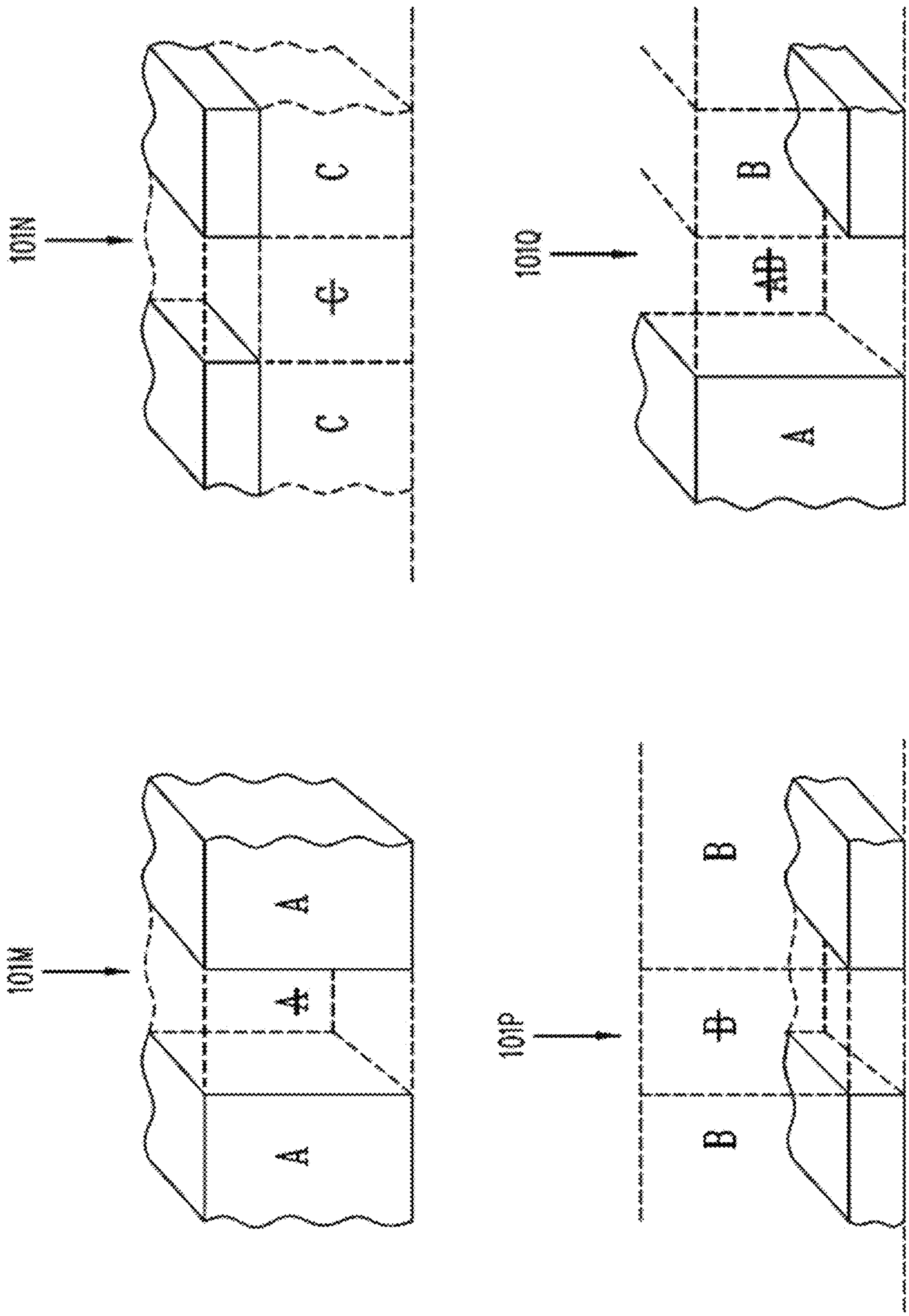
FIG. 9C is a cross sectional illustration of various USMP geometric leadframe elements including fully etched portions.
Figure 9D:
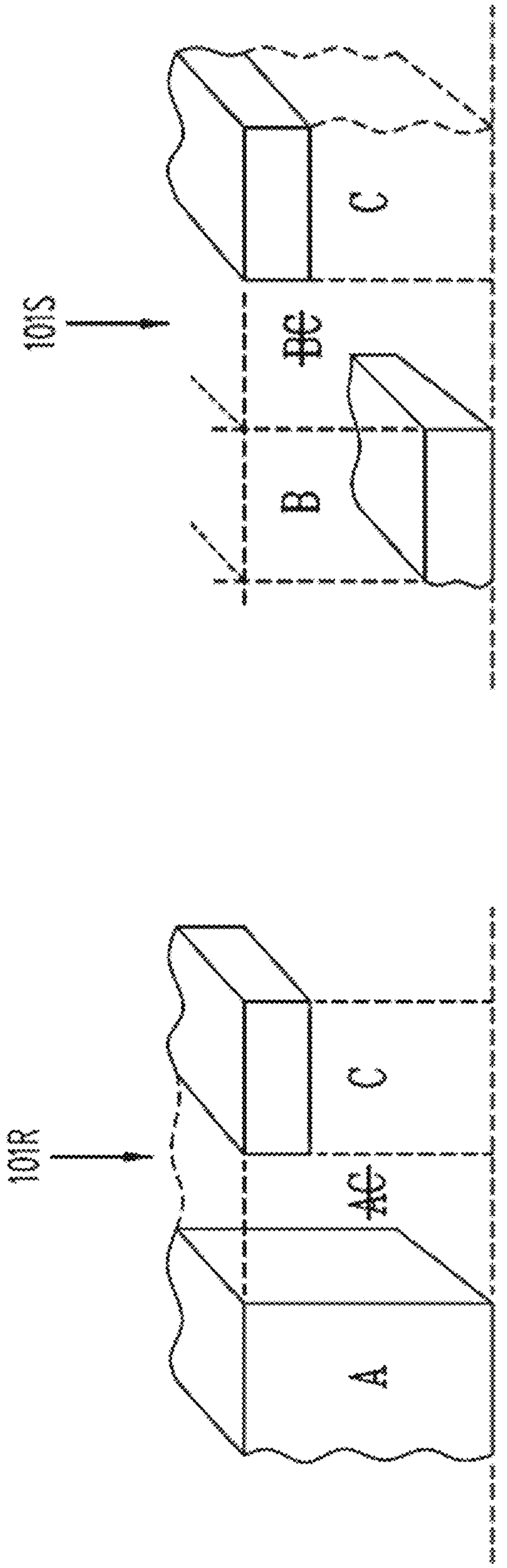
FIG. 9D is a cross sectional illustration of various USMP geometric leadframe elements including fully etched portions.

Other useful geometric shapes fabricated by the disclosed process and shown in FIG. 9C combining copper elements and intervening gaps include geometry 101M comprising columns A and intervening gap 4; geometry 101N comprising cantilevers C and intervening gap; geometry 101P comprising feet B and intervening gap; and also geometry 101Q comprising column A, foot B, and intervening gap. Similarly in FIG. 9D, geometry 101R comprises column A, cantilever C, and intervening gap; while geometry 101S comprises foot B, cantilever C, and intervening gap. These various geometric elements are used to construct the leadframe and package features as disclosed herein.

Block Molding for Leaded & Leadless Packaging

Another important element of the USMP is the elimination of the need for package-specific mold cavity tools. Instead of localizing the plastic molding around each specific product, in the USMP process plastic is used to encapsulate all the products in a common leadframe or divided portions thereof, i.e. "block" molding. By encapsulating large blocks of a leadframe concurrently, the need for package-specific mold tools is eliminated. As a result, many products may be manufactured on a single leadframe concurrently from a common mold cavity tool, one shared with other package types and leadframes.

Figure 10A:
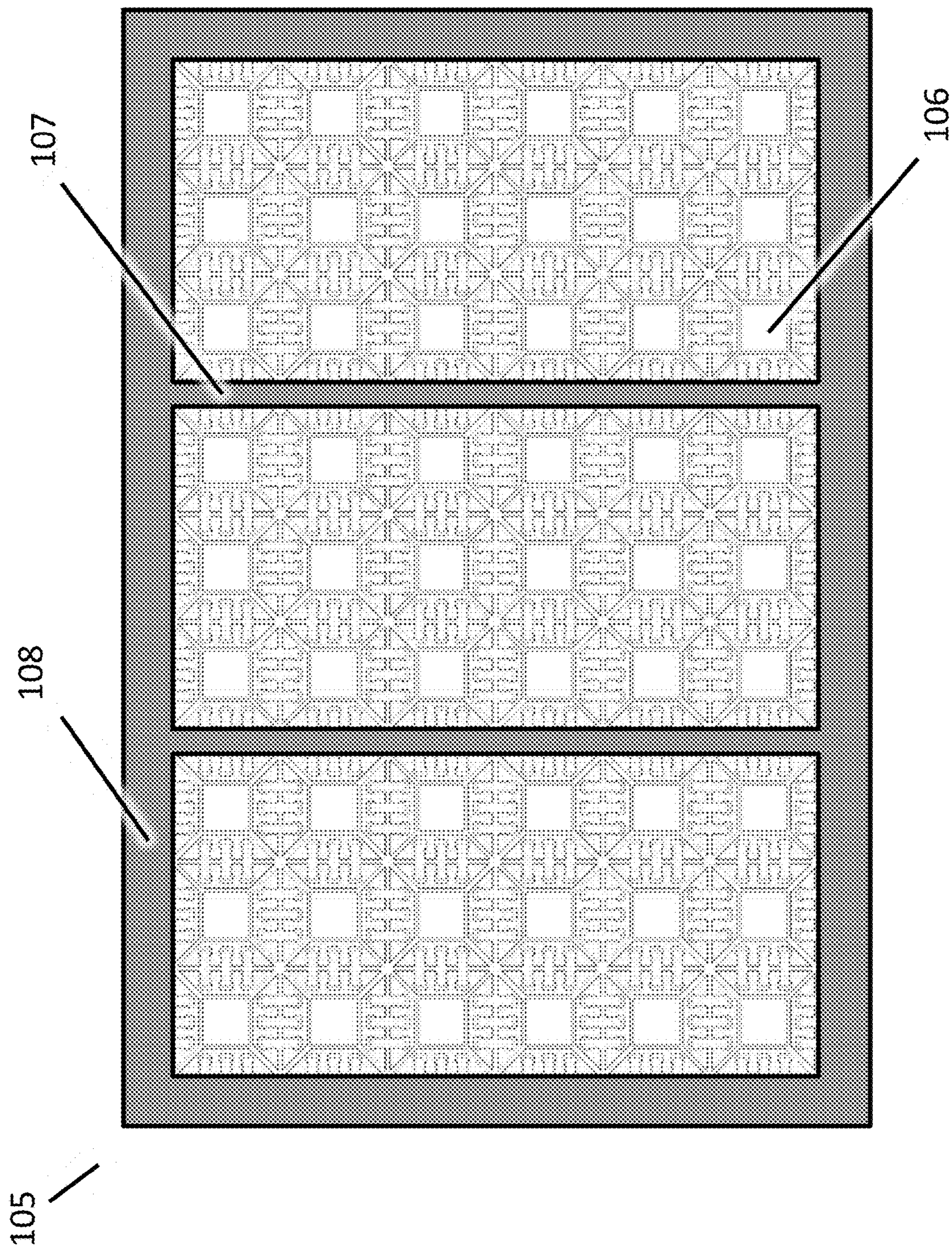
FIG. 10A is a plan view of a USMP IC leadframe before molding.
Figure 10B:
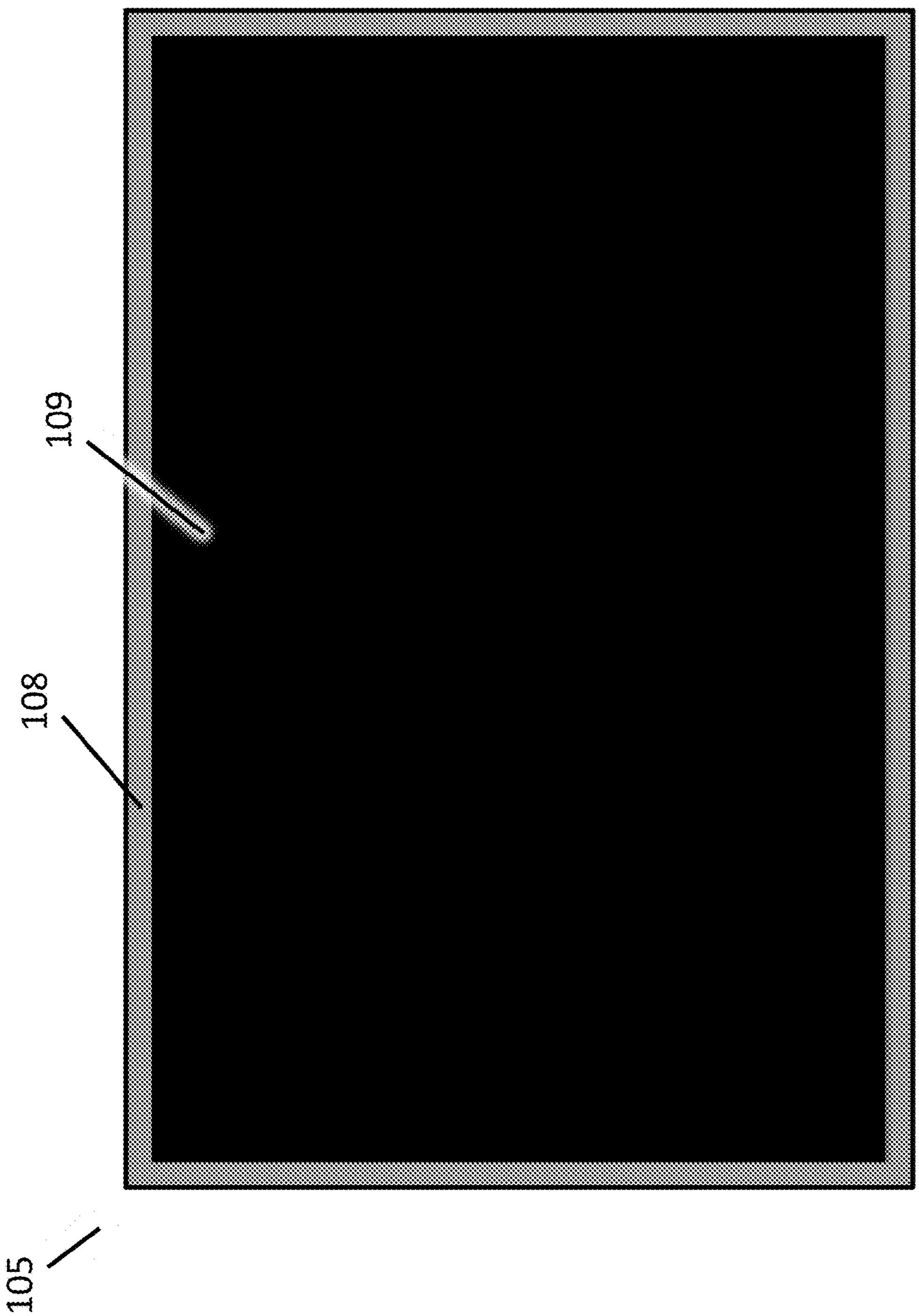
FIG. 10B is a plan view of a block molded leaded IC leadframe.
Figure 10C:
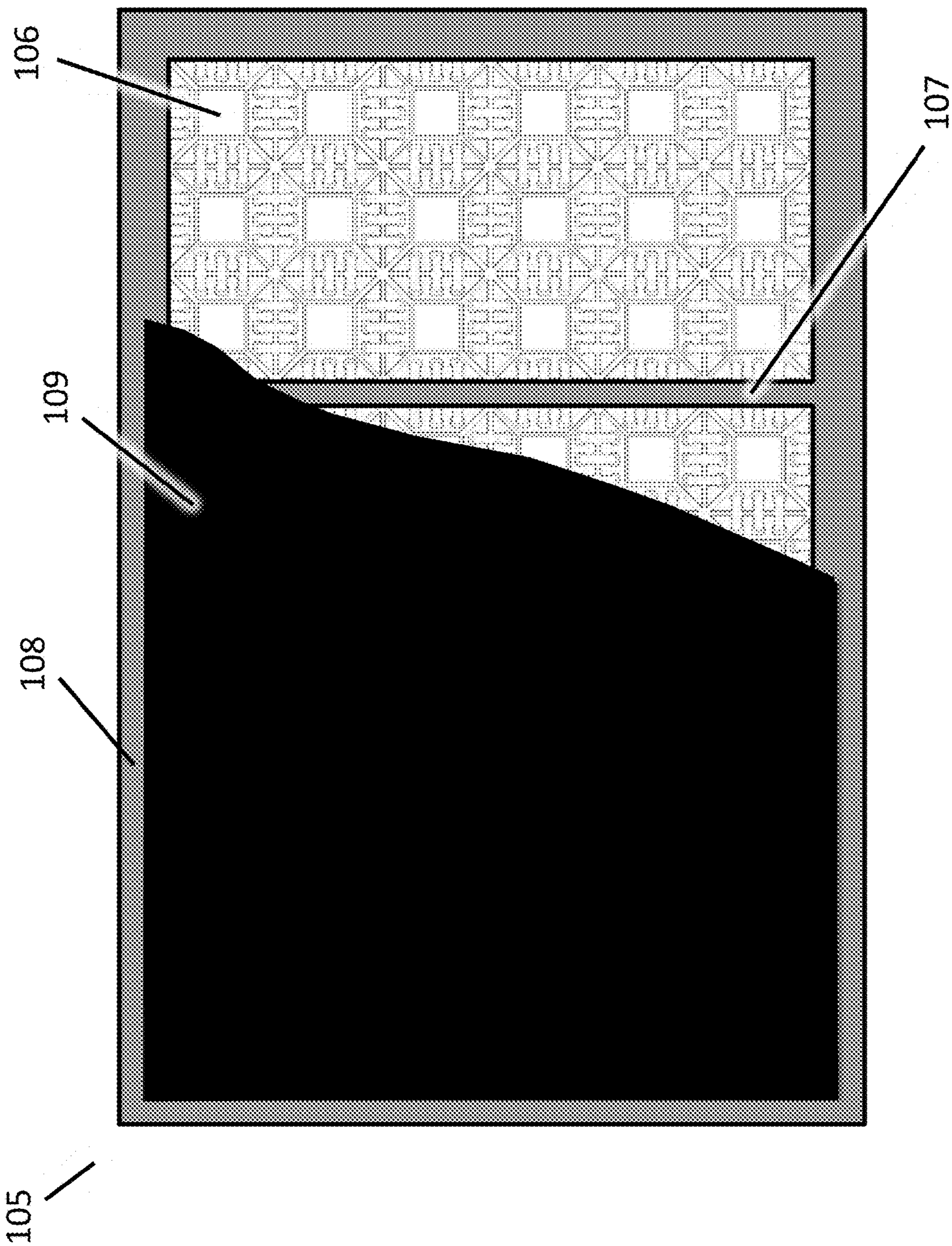
FIG. 10C is a cutaway view of a block molded leaded IC leadframe.
Figure 10D:
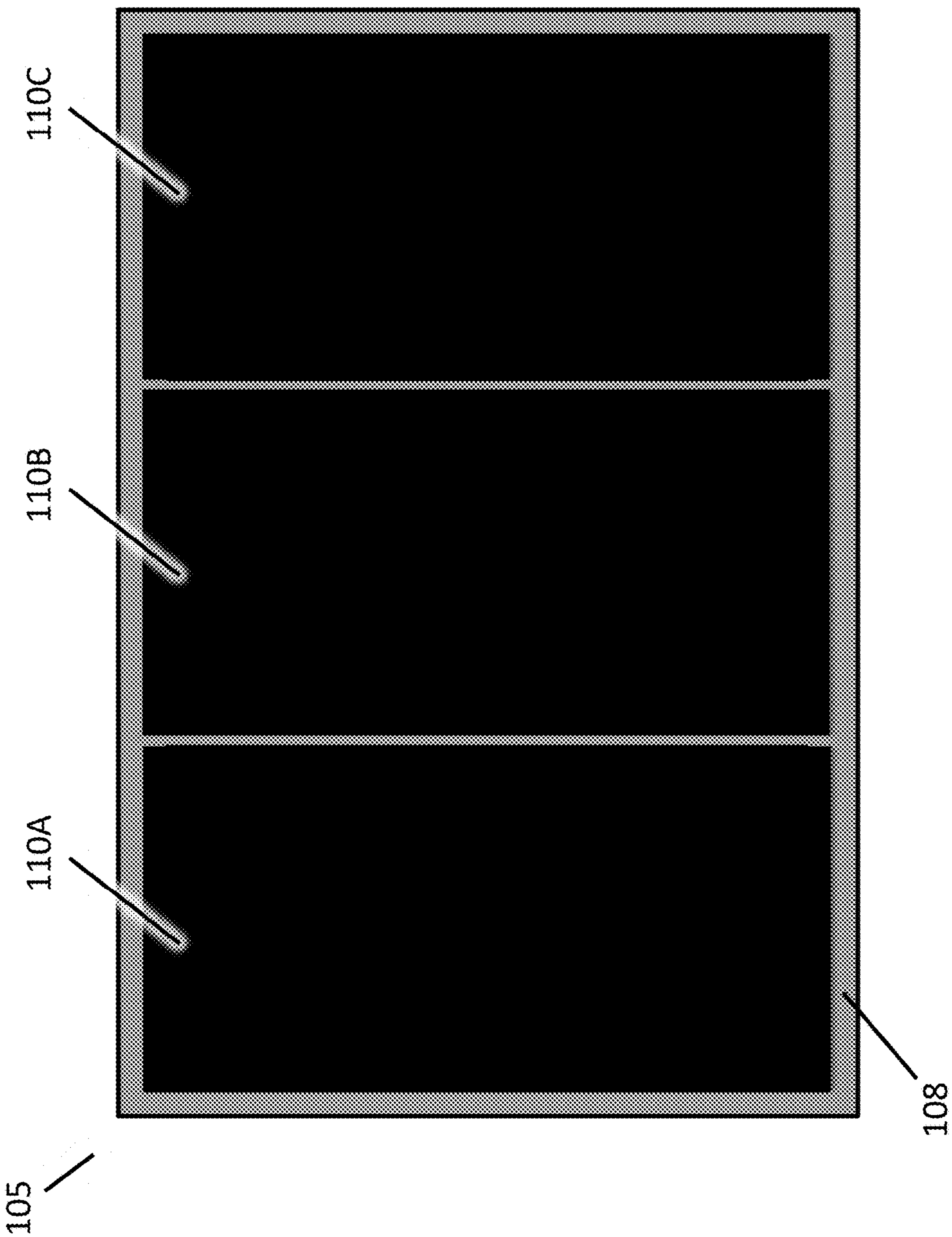
FIG. 10D is a plan view of a segmented block molded leaded IC leadframe.

For example, FIG. 10A illustrates an IC leadframe 105 designed for USMP fabrication comprising IC dice and individual leadframe patterns 106, leadframe rails 108, and leadframe cross rails 107. FIG. 10B illustrates USMP leadframe 105 encapsulated by a single plastic block mold 109. FIG. 10C illustrates USMP leadframe 105 and block mold 109 in cutaway view revealing multiple arrays of IC dice and individual leadframe patterns 106 contained within. FIG. 10D illustrates USMP leadframe 105 covered by three distinct blocks of plastic 110A, 110B and 110C collectively comprising a USMP segmented block mold. Depending on the laser plastic removal and singulation process, the same leadframe can be used to fabricate either footed or leadless IC packages.

Figure 10E:
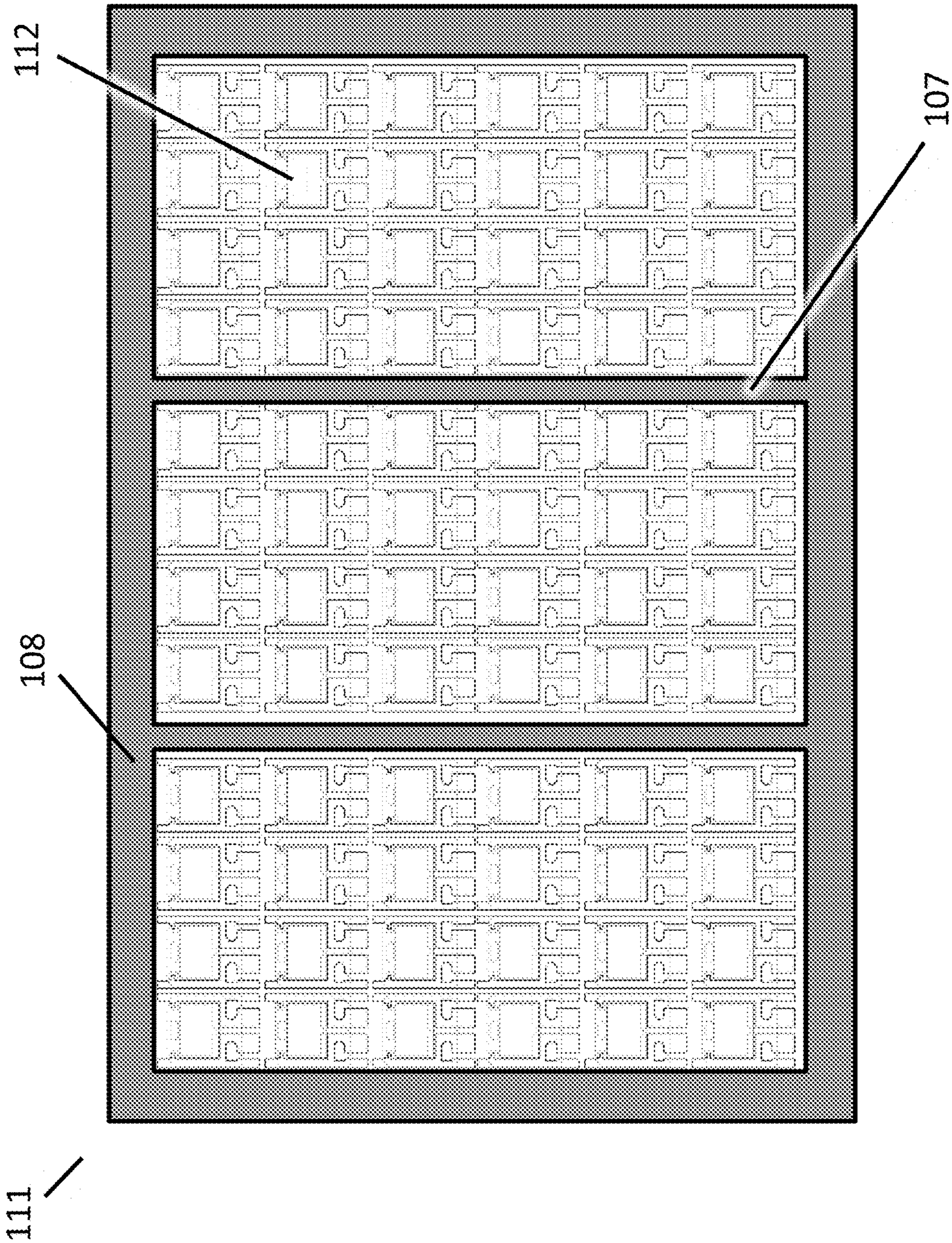
FIG. 10E is a plan view of a USMP DPAK leadframe before molding.
Figure 10F:
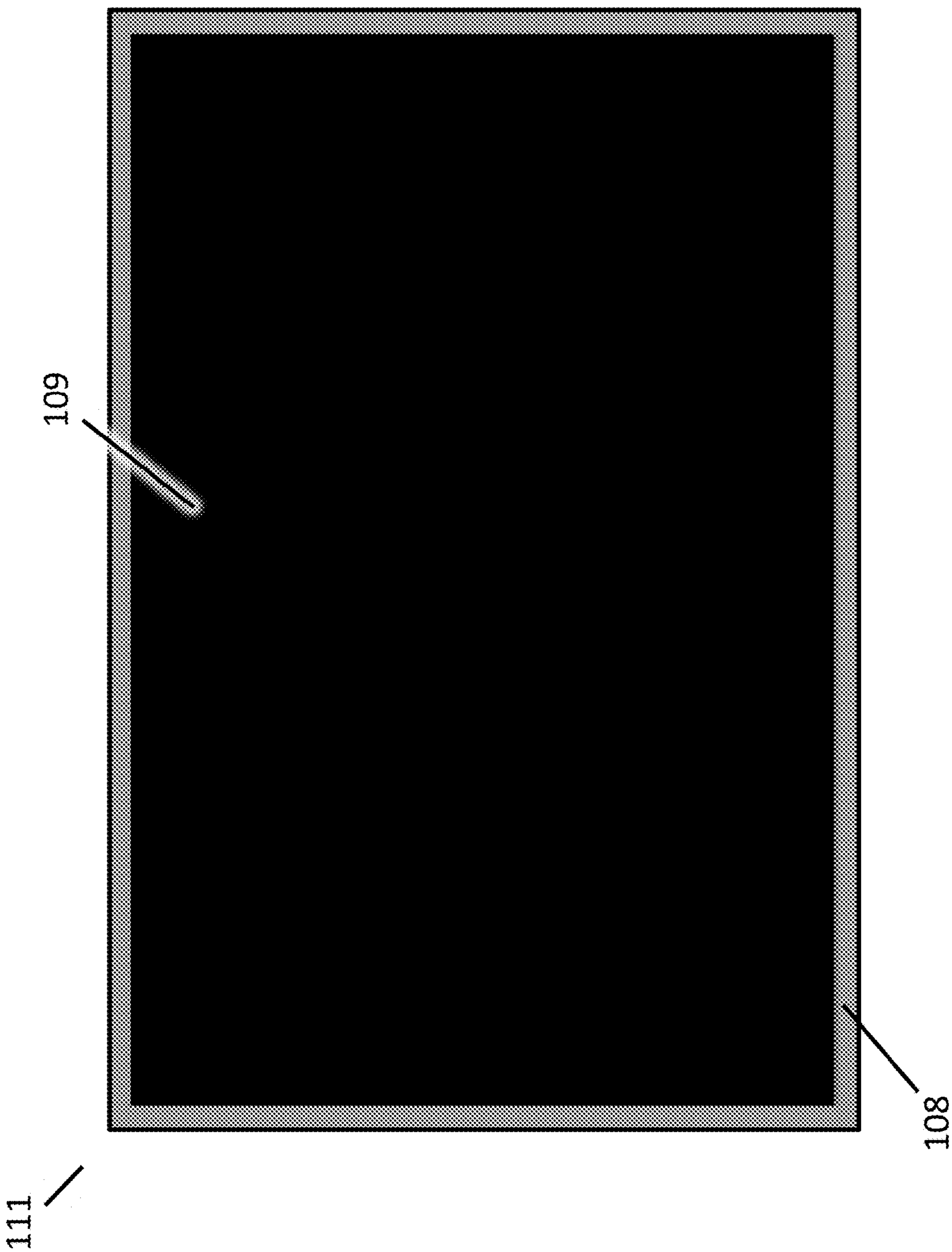
FIG. 10F is a plan view of a block molded DPAK leadframe.
Figure 10G:
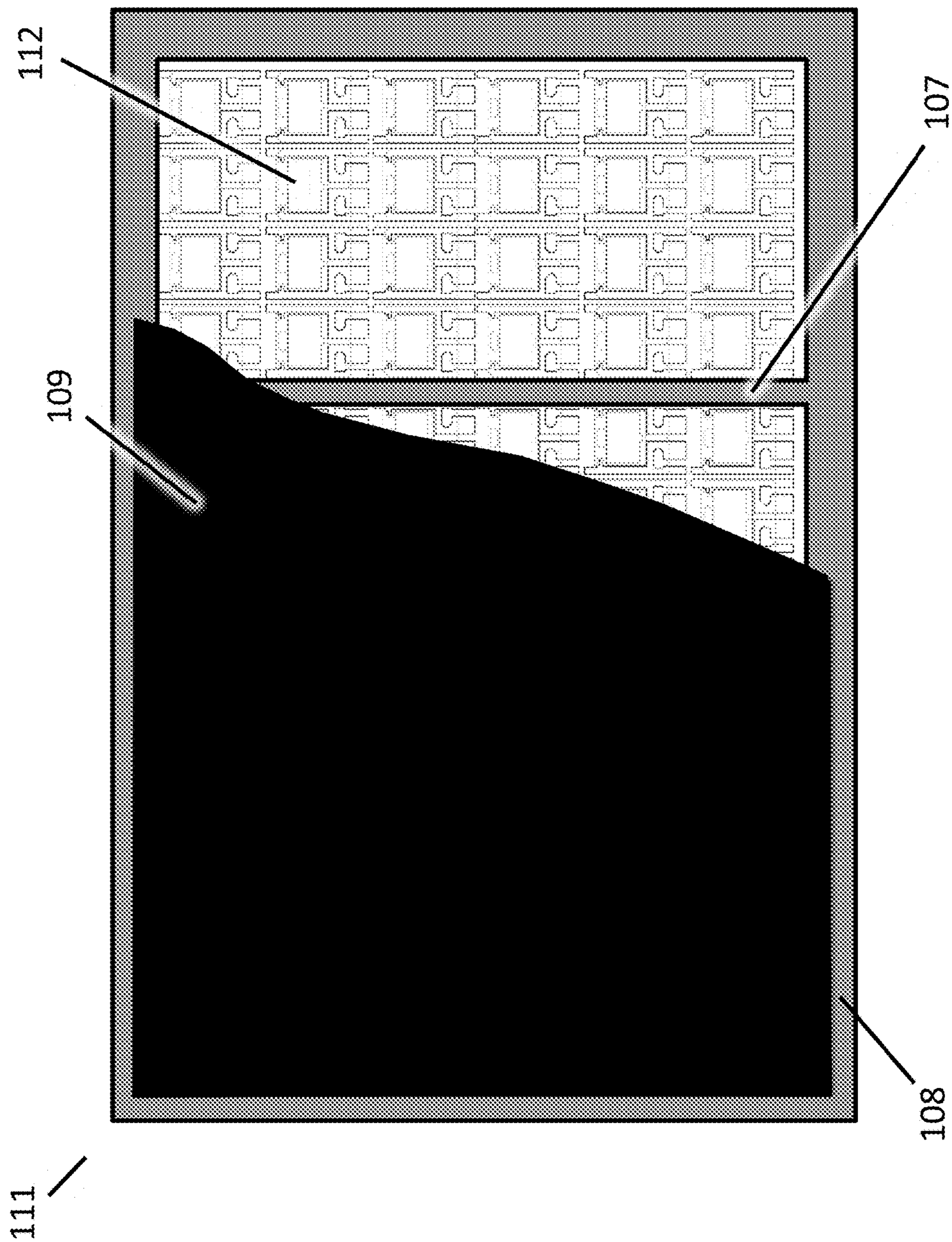
FIG. 10G is a cutaway view of a block molded DPAK leadframe.
Figure 10H:
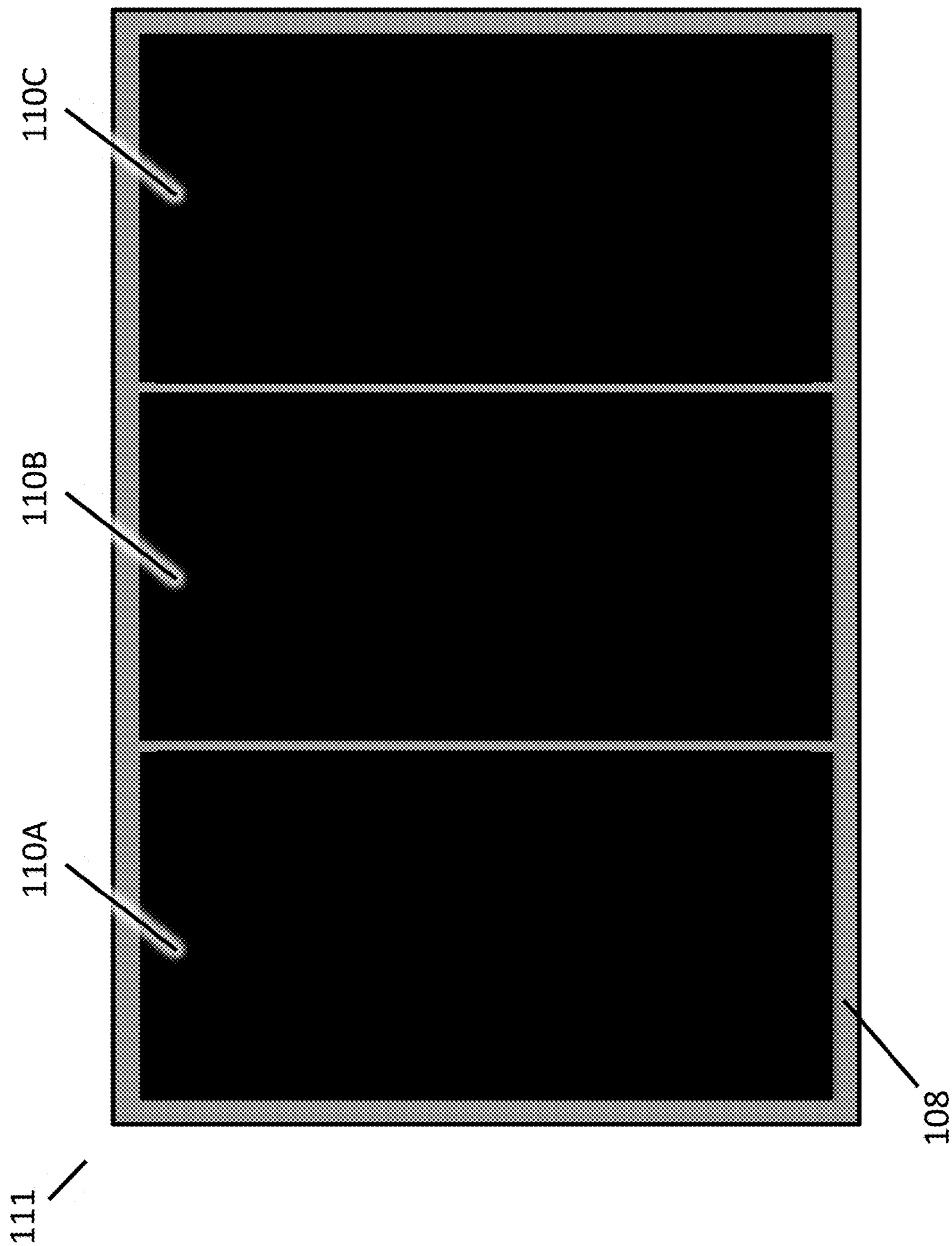
FIG. 10H is a plan view of a segmented block molded DPAK leadframe.

Using the USMP process and methods, the same leadframe used for ICs can be adjusted to fabricate power packages as well. For example, FIG. 10E illustrates an USMP power discrete leadframe 111 comprising power semiconductor dice and individual leadframe patterns 112, leadframe rails 108, and leadframe cross rails 107. FIG. 10F illustrates USMP leadframe 111 encapsulated by a single plastic block mold 109. The drawing of FIG. 10G illustrates USMP leadframe 111 and block mold 109 in cutaway view revealing multiple arrays of power semiconductor dice and individual leadframe patterns 112 contained within. FIG. 10H illustrates USMP leadframe 111 covered by three distinct blocks of plastic 110A, 110B and 110C collectively comprising a USMP segmented block mold for manufacturing power packages.

While block molding is used in leadless QFN manufacturing, except for the USMP process disclosed herein, block molding is fundamentally incompatible with leaded IC packages and power packages.

Laser Plastic and Lead Definition, Singulation

One adverse consequence of block molding in prior art package technology is that there is no means to produce a leaded package, i.e. the process of singulation on a block mold invariably results in a leadless package, one where no leads protrude laterally past the plastic's edge. In other words, in present day packaging, conventional methods used to rapidly remove plastic from the street naturally and unavoidably cuts the metal leads as well and vice versa. For example, during punch singulation, the sharp edges of a mechanical die punch cuts entirely through both the plastic and the copper leads, severing each package from its neighbors and leaving the vertical sidewalls of metal and plastic flush with one another. Similarly during saw singulation, the saw blade cuts completely through both the plastic as well as through the copper leads, severing each package from its neighbors and leaving the vertical sidewalls of metal and plastic flush with one another. Practically speaking there is no way to employ mechanical means to remove plastic without cutting the metal.

While conceivably, wet chemical means to remove plastic without etching the metal leads may be possible, the process of wet etching plastic is slow, imprecise, and expensive. The corrosive chemicals needed to perform the plastic etching also can damage, oxidize, or corrode the metal leads, affecting package reliability and lead solderability. Ionic chemical byproducts of the etching process can seep into the package, affecting the electrical stability of the package device or integrated circuit. As an alternative, plasma etching, i.e. dry etching, of a finished package product can cause ionic charges to accumulate in the package and on the semiconductor dice, affecting device operation and electrical characteristics. Moreover, chemical etching, whether wet or dry, requires added costs involving masking to define where the plastic is to be etched and where it is to be removed. Aside from its adverse expense, masking a molded leadframe is not performed today and an entirely new set of tools and processes would have to be developed before such methods could be applied. As such, chemical and mechanical methods to etch a package street are not practiced, and singulation by saw or punch represents a standard method.

In the disclosed USMP process flow, however, unwanted plastic is removed from the street between die by a laser process wherein the energy of a laser is precisely controlled to facilitate plastic removal without damaging or cutting the copper leadframe. After laser removal of the plastic, the copper leads may then be cut by punch, saw, or in a preferred embodiment, also removed by laser. If a laser is used for both plastic removal and copper lead cutting, then the laser's positioning can be adjusted to create either leadless, leaded, or power packages in the same manufacturing line.

Figure 11A:
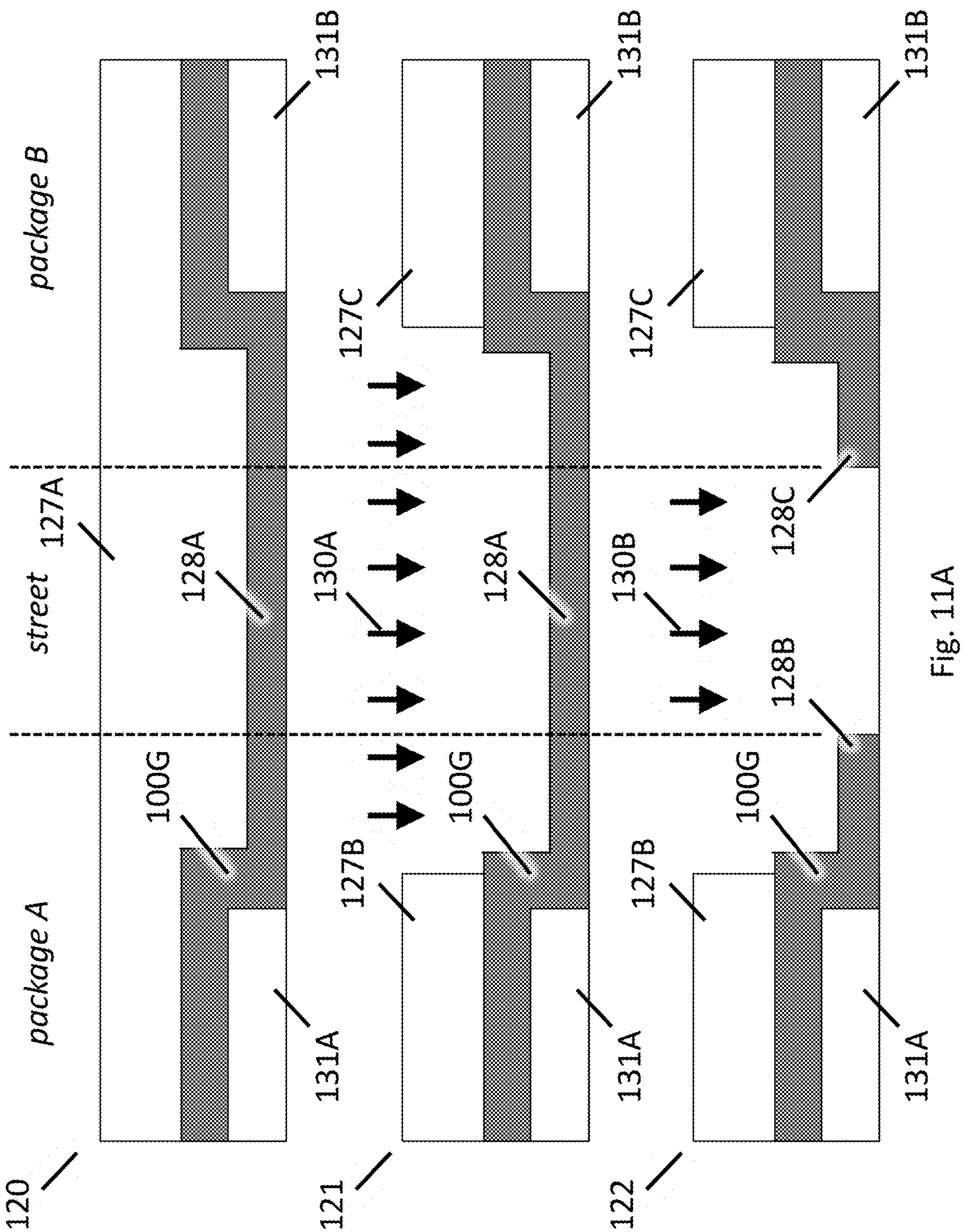
FIG. 11A is a cross sectional illustration of USMP package street fabrication steps for a footed package.

One example of the USMP process for plastic removal and lead cutting, i.e. "street fabrication", is illustrated in FIG. 11A. The three cross-sectional views illustrate packages for two adjacent dice, i.e. package A and package B and the intervening street between them delineated by dashed lines, during three successive fabrication steps. Cross-sectional view 120 illustrates the step just after molding where plastic-127A and copper conductor 128A extend between package-A and package-B through the intervening street. Plastic also fills the visible underside portion 131A of package A and 131B of package B The second drawing, cross-sectional view 121, illustrates the use of a laser beam 130A to remove the portion of plastic 127A from the street, i.e. between the dashed lines, and in addition to remove portions of plastic 127A on both sides of the street, i.e. atop copper conductor 128A within package A and within package B, while the plastic encapsulating the die is retained and remains unaffected, i.e. a plastic capsule 127B survives the process and continues encapsulating package-A, and a plastic capsule 127C survives, encapsulating package-B. To control what plastic is removed and what plastic is left undisturbed, laser 130A is optically scanned.

Optical scanning involves parametrically controlling the locations to be lased, adjusting the power and pulse frequency of the laser, and varying the scan rate and number of repeated laser scans performed on a given area. The peak laser power needed for plastic removal varies from κ W to 20 W. For any given peak power setting, the average laser power delivered is controlled by pulsing the laser for a prescribed duration $t_{on}$ at a fixed frequency f, resulting in duty factor D where $D=t_{on}\cdot f_{pulse}$ and where the average powered delivered $P_{ave}$ is given by $P_{ave}=P\cdot D=P\cdot(t_{on}\cdot f_{pulse})$. For example a 20 W laser running at 20 kHz pulse rate and a 50% duty factor, has an on time of 25 μsec for every 50 μsec pulse period, delivering an average power of 10 W.

The laser's wavelength is adjusted to maximize its absorption by the material being removed. In the case of black colored plastic, virtually any infrared, visible light, or ultraviolet laser of sufficient power, e.g. in the 10 W to 20 W range, may be used to melt and evaporate the relatively low melting point of the plastic mold compound. When removing plastic sitting atop copper, however, it is beneficial to employ a laser wavelength that is absorbed by plastic but less so by the underlying copper leadframe metal, meaning at lower power levels, plastic can selectively be removed from the street without melting, burning, or scarring the underlying metal. Compared to black plastic, because of the relatively optical low absorption by copper and other "yellow" metals, laser wavelengths attractive for selective plastic removal made in accordance with this invention include infrared gas lasers such as $CO_2$ at 10.6 μm, or infrared solid-state or fiber lasers such as YAG at 1064 nm.

To further avoid scarring of the underlying copper during laser plastic removal, the required laser power may be reduced by rapidly and repeatedly scanning the same area with the laser, whereby the total energy $E_{scan}$ delivered to one specific "slice" of plastic to be removed is equal to the average laser power $P_{ave}$, described previously, times the time required to scan across the slice $t_{scan}$ times the number of times a given slice is scanned $n_{scan}$, i.e. $E_{scan}=n_{scan}\cdot P_{ave}\cdot t_{scan}$. By employing the proper wavelength for the material being removed, the number of scans $n_{scan}$ can be minimized, typically from 2 to 5 scans. If however a laser having a wavelength poorly matched to the material being removed is used, from 10 to 30 scans may be required on each lased slice. A large number of repeated scans per slice, i.e. $n_{scan}>5$, is undesirable because it increases processing time, lowering processing UPH, and increasing the risk of scarring the metal or burning of adjacent material in the package. For example, a UV or blue laser used to cut copper may require only 3 or 4 scans to remove a 200 μm copper leadframe, while an infrared laser such as YAG or $CO_2$ may require 10 or more scans, resulting in burn marks on the leadframe.

The scanning rate $f_{scan}=1/t_{scan}$ should not be confused with the aforementioned laser pulse frequency $f_{pulse}$ and the laser pulse duration $t_{on}$, which occur at rates at least one or two orders-of-magnitude faster than laser scanning. In micromachining, laser pulses are controlled electronically in the microsecond range, while optical scanning of lasers is performed using motors and movable mirrors. One-dimensional scanning, i.e. producing a cutline along a straight line, can be performed with a single mirror system while two-dimensional scanning requires either using a single mirror rotated on two axis, or by employing two mirrors—one for determining the x-axis position control and the other for y-axis control. Mirror positioning can be accomplished using precision adjustments with stepper motors or using continuous drive rotating motors with the laser pulses occurring only when the mirrors are directed toward the area to be lased. Importantly, because the laser and its operating settings are tuned for plastic removal, after plastic removal, copper conductor 128A continues to hold all dice in place in the leadframe, undisturbed by laser 130A.

To estimate the process throughput, laser scan rates must be considered. Linear scan rates can reach 5,000 mm/s but for precision is slowed to around 400 to 500 mm/s. For a 40 mm wide plastic block, this means a single scan across the width of the block mold takes approximately 0.1s. By repeating 4 scans on one slice and breaking a street into 7 slices, a total of approximately 30 scans can clear one street in the width-wise direction, i.e. requiring roughly 3 seconds to clear the plastic from each street. If a 40 mm wide block is roughly 40 mm long, then a 3×3 mm product results in a molded block comprising 15 horizontal and 15 vertical streets, or 30 streets in total. At 3 seconds per street, the block can be cleared of plastic in 90 seconds, i.e. in 1.5 minutes. Assuming four blocks per leadframe, a total of 6 minutes are required for plastic removal. Smaller packages take longer because there are more streets to clear for any given block's area. Conversely, larger packages may be processed in shorter times in proportion to the lower street density.

In the third step, shown in cross-sectional view 122 of FIG. 11A, a different laser process, laser 130B, is optically scanned to remove copper conductor 128A from the street, i.e. between the dashed lines. After lasing, copper lead 128B extends under plastic capsule 127B while copper lead 128C extends under plastic capsule 127C. Leads 128B and 128C are separated by the street. These and other copper conductors protruding from the plastic package body (but not shown in this particular cross section) collectively comprise the conductive feet of the disclosed footed package. The conductive leads have the same Z shape as the aforementioned geometry 100G. As shown, plastic capsules 127B and 127C cover the top portions of these leads but not the sidewall or feet, which are exposed. By removing metal 128A from the street, not only are the conductive feet formed but also the packages are mechanically separated from the leadframe and from one another. Laser 130B, therefore fabricates the package feet as well as performing product singulation.

To minimize the power and duration during metal cutting by improving optical absorption by yellow metals such as copper, laser 130B ideally comprises a shorter wavelength than laser 130A. Short wavelength lasers, comprising solid-state or fiber lasers, include yellow-orange lasers at 593.5 nm, green lasers at 532 nm, blue lasers at 473 nm, blue-violet lasers at 405 nm, or ultraviolet lasers at 375 nm, 355 nm, 320 nm, or 266 nm. While excimer lasers, utilizing excited dimers of noble gases such as xenon, krypton, fluorine, and argon to realize ultraviolet wavelengths are commonly employed in semiconductor manufacturing and delicate surgeries, such precision and higher associated costs are not generally justified for package fabrication. Using the appropriate wavelength laser, throughput of metal removal and package singulation can be even faster than plastic removal.

In an alternative embodiment, laser 130B is replaced by mechanical sawing. In this alternative fabrication sequence, laser 130A is still used to remove the plastic from the street and to uncover the feet, but mechanical sawing defines the length of the feet and performs singulation. This version of the process, while able to re-use existing mechanical sawing equipment, is less accurate than the laser process, and subjects the products to greater mechanical stress during processing. The resulting package is inferior, having greater variability in the length of the conductive feet, and greater risk of plastic cracking. Moreover, care must be taken to control the saw rate and to replace the saw blade frequently, or the saw may damage the metal and bend the feet.

Figure 11B:
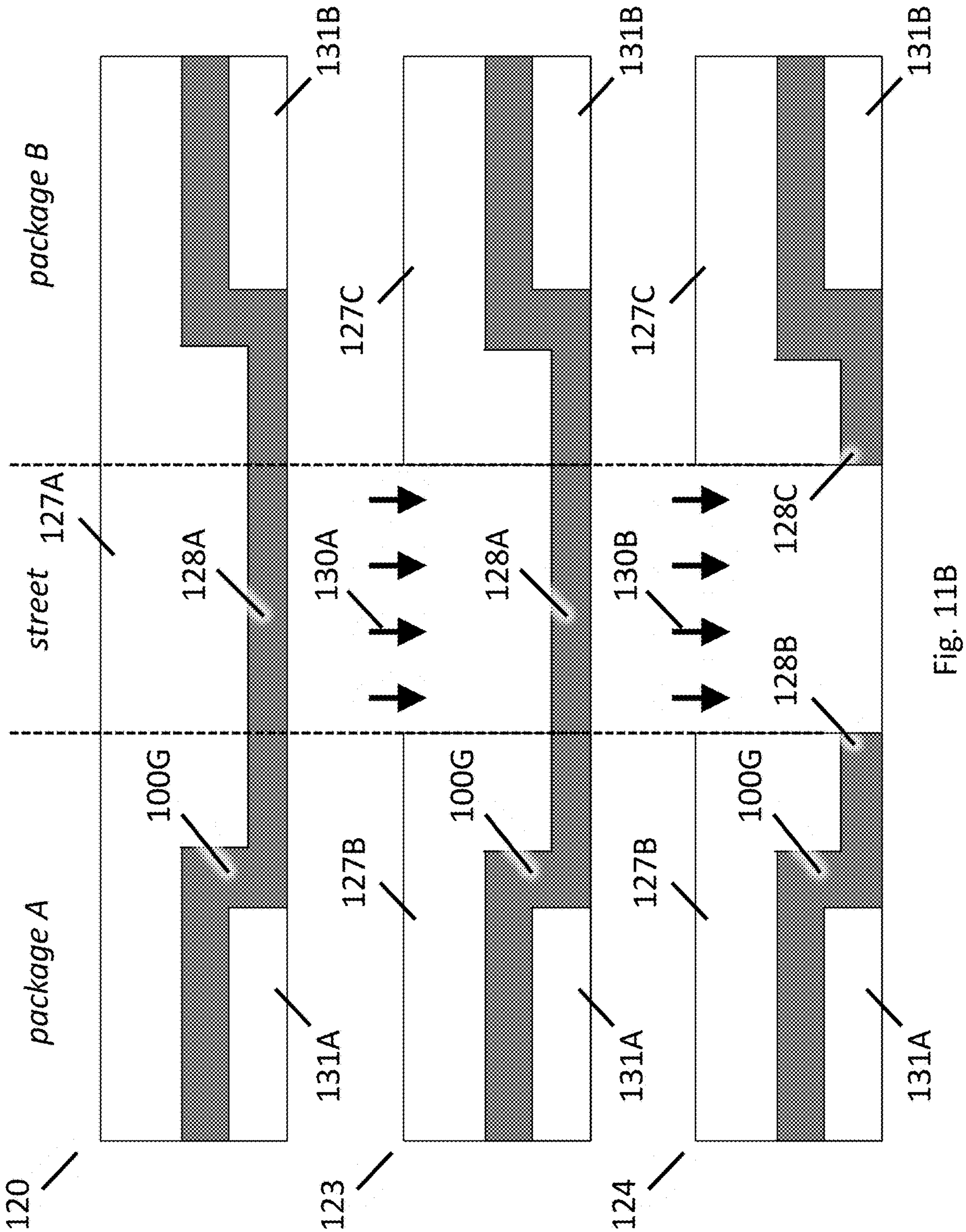
FIG. 11B is a cross sectional illustration of USMP package street fabrication for a leadless package.

Although the disclosed two-laser process for street fabrication can be utilized to produce footed packages as shown in the prior drawing, FIG. 11B illustrates the technology can also be applied to produce leadless packages. Starting with the same cross-sectional view 120 immediately after molding, in cross-sectional view 123, laser 130A is used to remove plastic only from the street. After laser 130A processing, plastic capsule 127B encapsulates die-A and plastic capsule 127C encapsulates die-B but conductive copper 128A is uncovered only in the street. As in the previous example, plastic 127A is removed only in the street by controlling the laser positioning during scanning.

In cross-sectional view 124, a second laser process, laser 130B typically having a higher power and energy rating than laser 130A, is used to cut and remove copper conductor 128A from the street. Because plastic removal by laser 130A and metal removal by laser 130B both have the same edge as defined as the edge of the street, then the resulting plastic and metal form a flush vertical wall at the package edge. As shown, conductive copper lead 128B is flush with plastic capsule 127B defining the vertical edge of die-A, identical in cross section to a conventional sawed leadless QFN or DFN package. Similarly, conductive copper lead 128C is flush with plastic capsule 127C defining the vertical edge of die-B. Street fabrication and die singulation in the USMP process using lasers is superior to sawing in conventional QFN fabrication because of improved accuracy, reduced stress on the package plastic, reduced risk of plastic cracking, smoother package edges, and reduced risk of metal-to-plastic delamination.

Beyond its improved quality and manufacturability, the USMP process is able to fabricate both footed and leadless packages in the same factory and manufacturing line with no retooling required. The USMP process is universal because it can make both wave-solder compatible leaded, i.e. "footed", packages as well as leadless QFN and DFN packages using a flexible block mold process. In contrast, the conventional saw or punch type QFN process can only manufacture leadless packages—packages incompatible with low cost wave-solder based PCB factories.

Figure 11C:
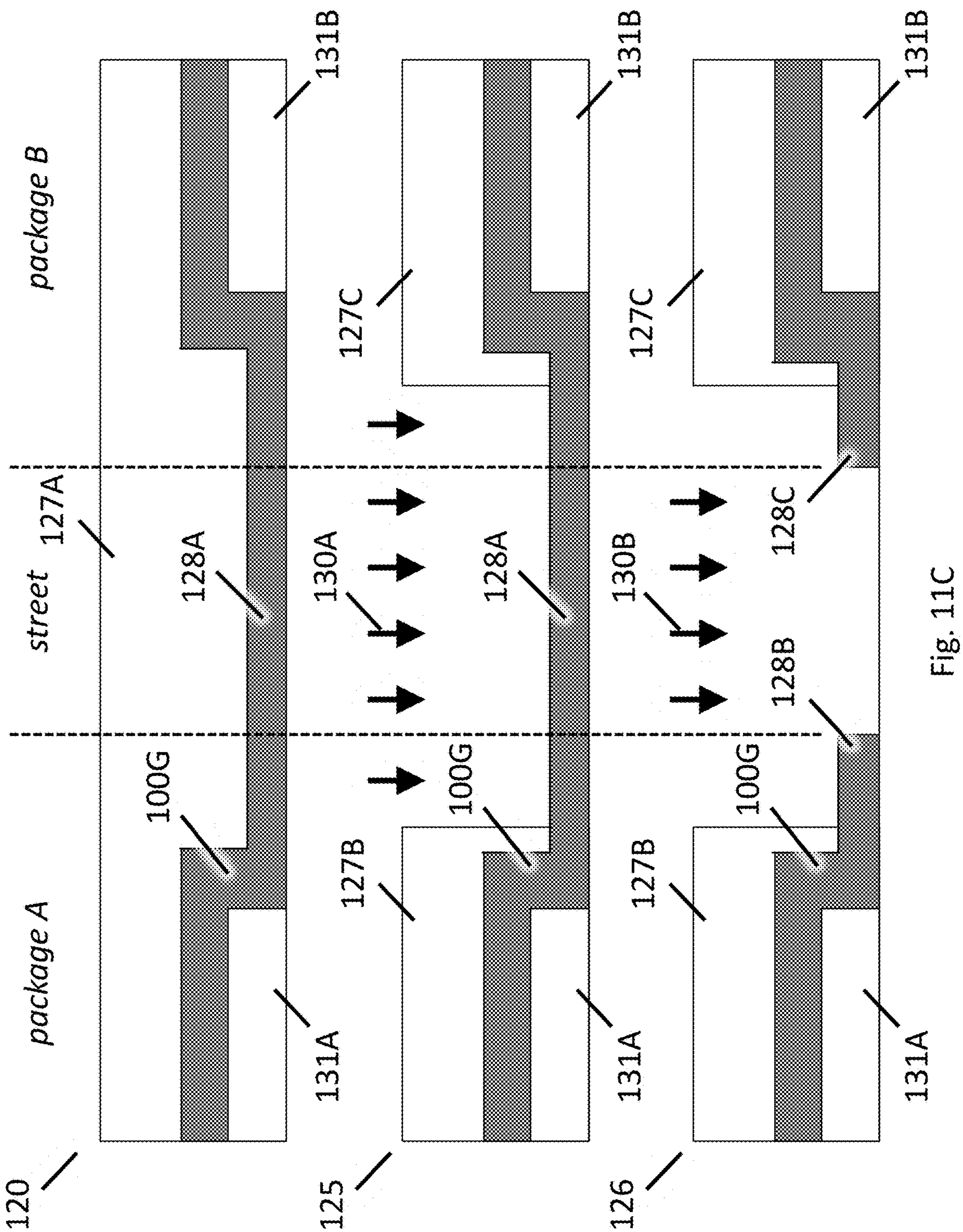
FIG. 11C is a cross sectional illustration of USMP package street fabrication for an alternate footed package.

Simply by changing the location and scanning of the lasers, one common manufacturing line can fabricate a wide variety of street and capsule edge designs for footed and leadless packages. For example, in FIG. 11C, an alternate capsule edge design where plastic covers the sidewalls of the Z-shaped leads 100G is possible. Starting with the same cross-sectional view 120 after molding laser 130A is used to remove plastic from the street and exposing the foot portion of conductive copper 128A but not the vertical sidewall of Z-shape geometry 100G (view 125). Laser 130B then cuts the portion of conductor 128A in the street but preserves a foot of conductive lead 128B in die-A and a foot of conductive lead 128C in die-B (view 126).

Figure 12A:
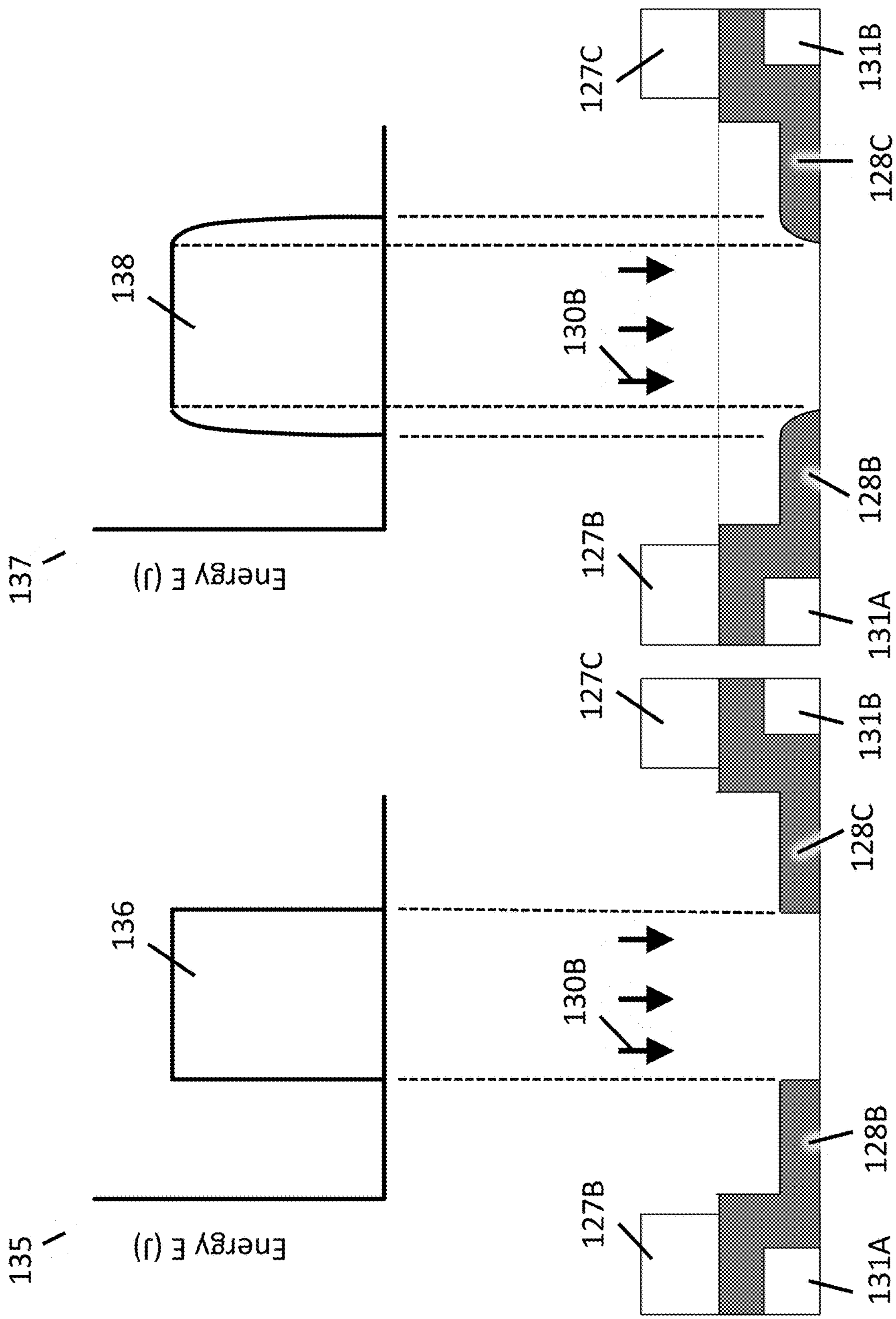
FIG. 12A is a cross sectional illustration of USMP laser singulation and foot formation.

As illustrated in FIG. 12A, by controlling the lateral energy profile of laser 130B, the resulting shape of the feet of conductive leads 128B and 128C can be adjusted. For example if a square energy profile 136 of energy E versus position y shown in graph 135 is used, the resulting feet will retain a square shape. If however, a smooth-edged energy profile 138 shown in graph 137 is used, the edges of the feet of leads 128B and 128C will be rounded 129, facilitating easier solder wicking during PCB assembly. The energy E is a combination of the average pulse power and the number of repetitive scans rastered across the same location. More scans in the same location, higher power during lasing, longer pulse durations or higher duty factors increase the delivered energy while fewer scans, lower power, shorter pulses or lower duty factors decrease the delivered energy. By controlling the power and energy the removal of metal ions by the laser is a controllable parameter, a benefit not possible using prior art punch and sawing techniques.

As stated previously, black plastic used in semiconductor packaging is readily absorbed by the entire spectrum of light wavelengths ranging from UV to infrared. Copper and other yellow metals, however, reflect various wavelengths, poorly absorbing the impinging laser beam. In manufacturing, poor laser absorption causes a large number of scans resulting in a low UPH throughput. Reflection is also dangerous, risking damage to the laser head from the reflected beam, and in badly designed equipment even posing a safety hazard to operators.

Figure 12B:
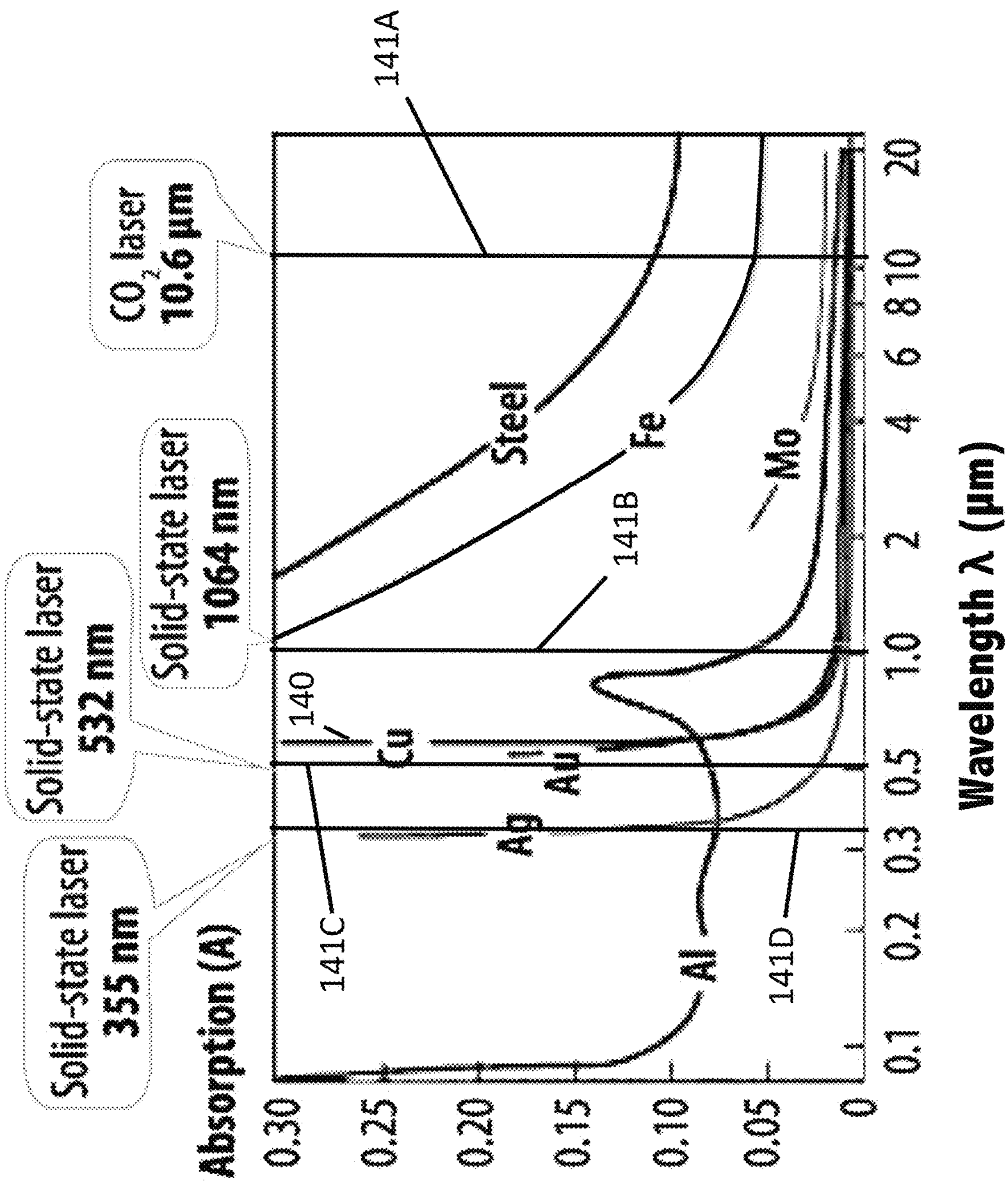
FIG. 12B is graph of the optical absorption spectra of various metals.

FIG. 12B illustrates the absorption spectra, i.e. a plot of absorption on the y-axis versus light wavelength on the x-axis, for a variety of common metals. Infrared lasers such as $CO_2$ gas laser wavelength 141A at 10.6 μm and YAG fiber laser wavelength 141B at 1064 nm are contrasted to visible solid-state laser wavelength 141C at 532 nm and UV solid-state laser wavelength 141D at 355 nm. As shown, steel and iron (Fe) are easily absorbed in the infrared spectra over 1 μm. In contrast, yellow metals including copper 140, gold, and silver absorb poorly in the infrared, with high absorption of light shorter than 600 nm, i.e. in the UV and short visible spectrum. Using this graph, the USMP process can be optimized whereby

- Plastic is removed using infrared laser over e.g. with a YAG fiber laser at 1064 nm, resulting in evaporation of plastic with minimal absorption by the underlying copper leadframe
- Metal is removed for defining package feet, singulating die, and de-junking of tie bars using a solid state UV or visible light laser having a wavelength shorter than 600 nm, e.g. a yellow-orange laser at 593.5 nm, green at 532 nm, blue at 473 nm, blue-violet at 405 nm, or ultraviolet lasers at either 375 nm, 355 nm, 320 nm, or 266 nm.

Figure 12C:
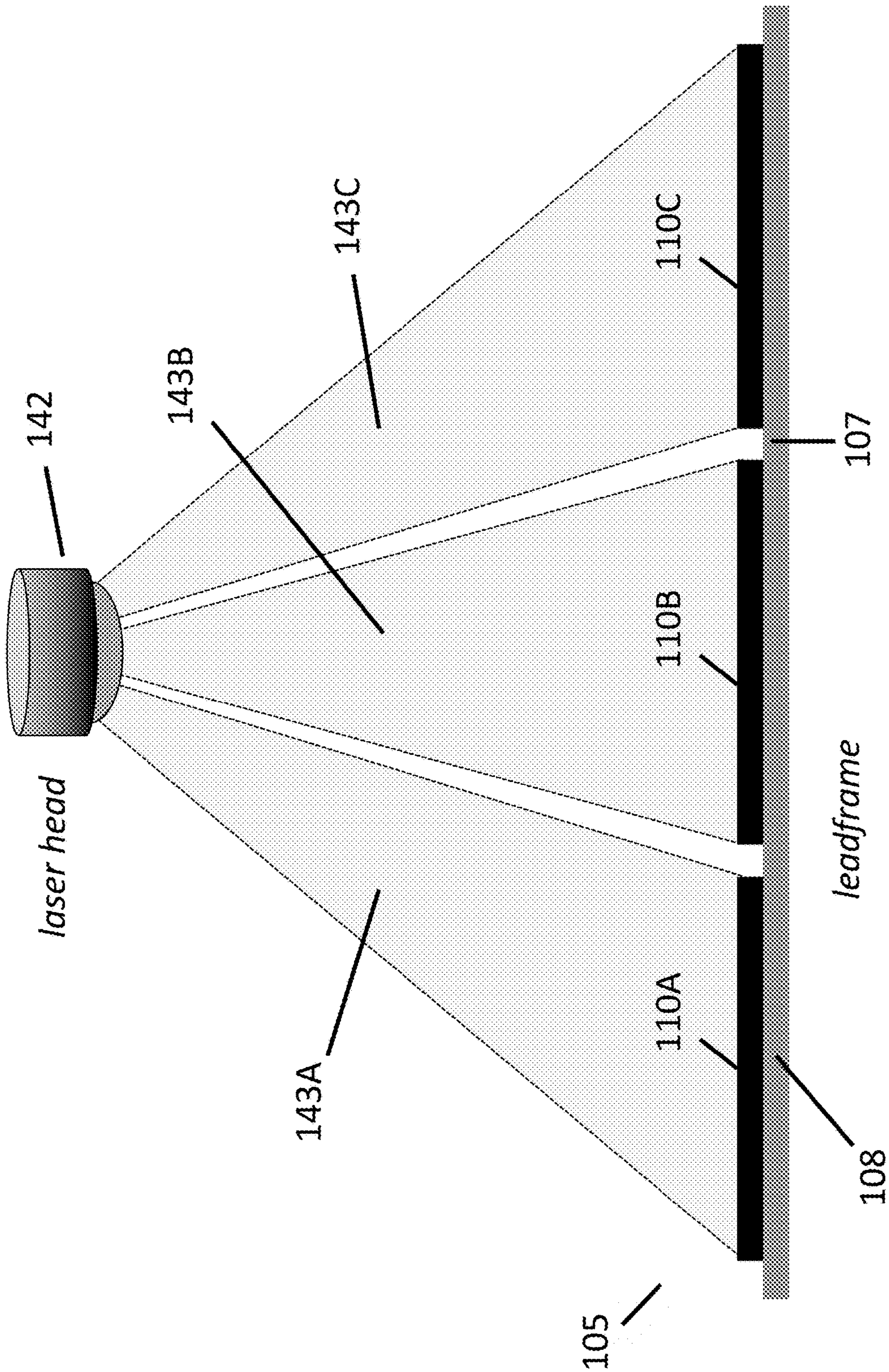
FIG. 12C is a schematic representation of a laser system for USMP street fabrication.

Using precision servo-controlled mirrors at a sufficient distance from the stage holding the leadframe to be processed commercially, available lasers are able to cover large areas without moving the laser head or the stage. So although it is possible to process a leadframe in blocks and then advance the stage mechanically, it is not necessary. By scanning the beam in accordance with USMP method, after loading, an entire leadframe 80 mm by 250 mm can be processed without moving the laser head or the stage. Laser processing of a leadframe is illustrated in FIG. 12C where laser head 142 scans a laser beam across leadframe 105 comprising copper leadframe 108 and three block molds comprising plastic blocks 110A, 110B and 110C. The intervening regions 107 represent the support rails 107 of the leadframe.

In the example shown, each block is lased in succession, starting with block 110A processed by laser scan 143A, secondly with block 110B processed by laser scan 143B, and lastly for block 110C processed by laser scan 143C. If different types of lasers are employed for plastic and copper removal, it is necessary to unload the processed leadframe from one laser first for plastic removal and transfer it to another for lead definition, copper removal, singulation, and tie bar de-junking. So the entire process of laser patterning each block mold in succession will occur twice, once for plastic removal, and a second time for metal removal.

The size of a block is arbitrary, based on providing adequate mechanical support to the leadframe with rails and cross-rails to prevent sagging or bowing of the leadframe during manufacturing and handling. While the number of blocks may vary from 1 to any number, typically 3 to 12 blocks are sufficient to provide adequate support yet manufacture most package types with a large number of units per leadframe. If the blocks are too small, the block may not be an even increment of the package dimension, i.e. pitch, and useful leadframe area will be lost. Each block may take from 1 to 15 minutes to process depending on the size of the block and the pitch of the package being fabricated. Finer pitch packages contain more streets and take more time to process. Nominally, one leadframe can be processed in 10 to 20 minutes.

Figure 12D:
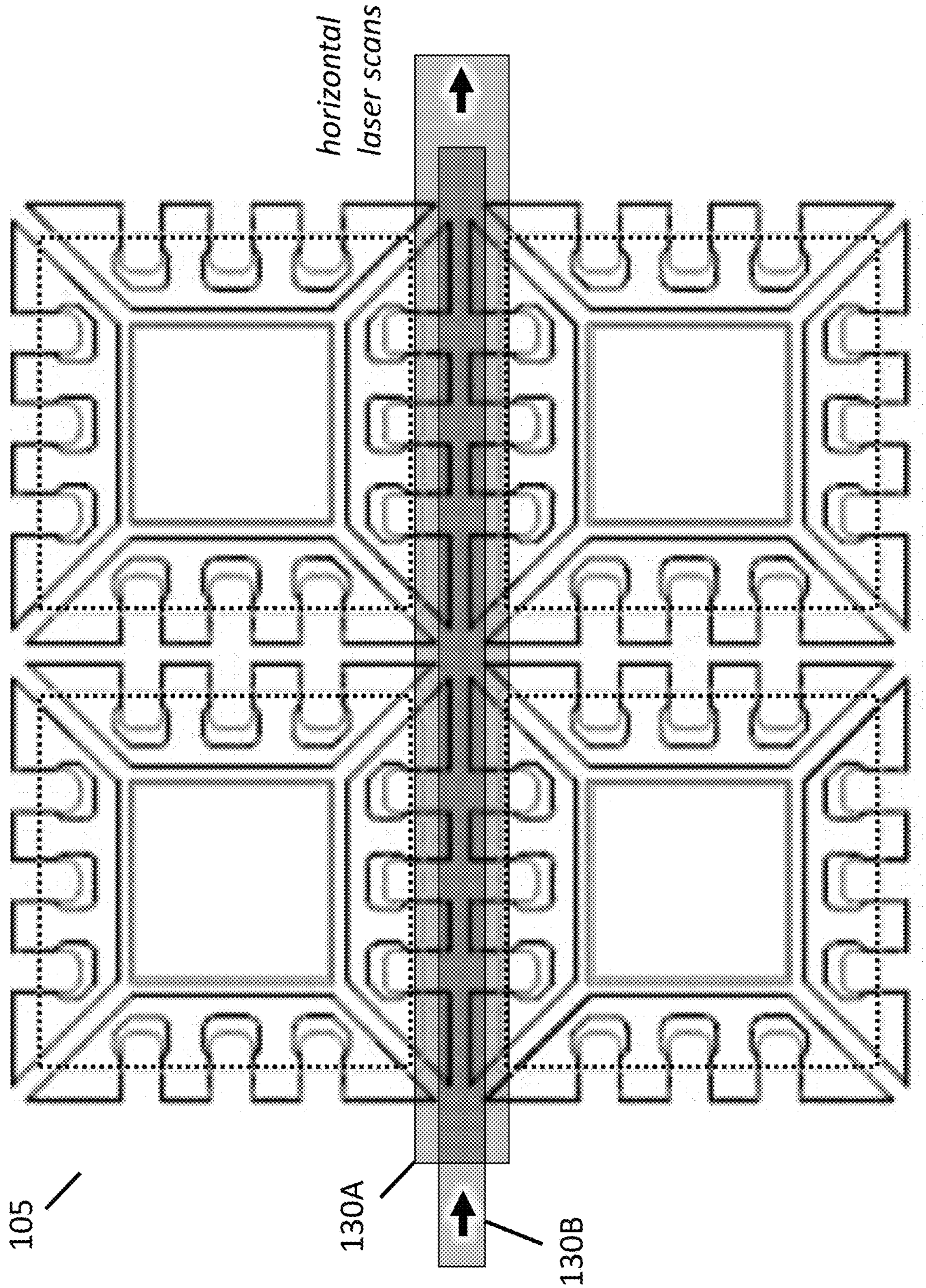
FIG. 12D is a leadframe illustrating USMP horizontal street fabrication.
Figure 12E:
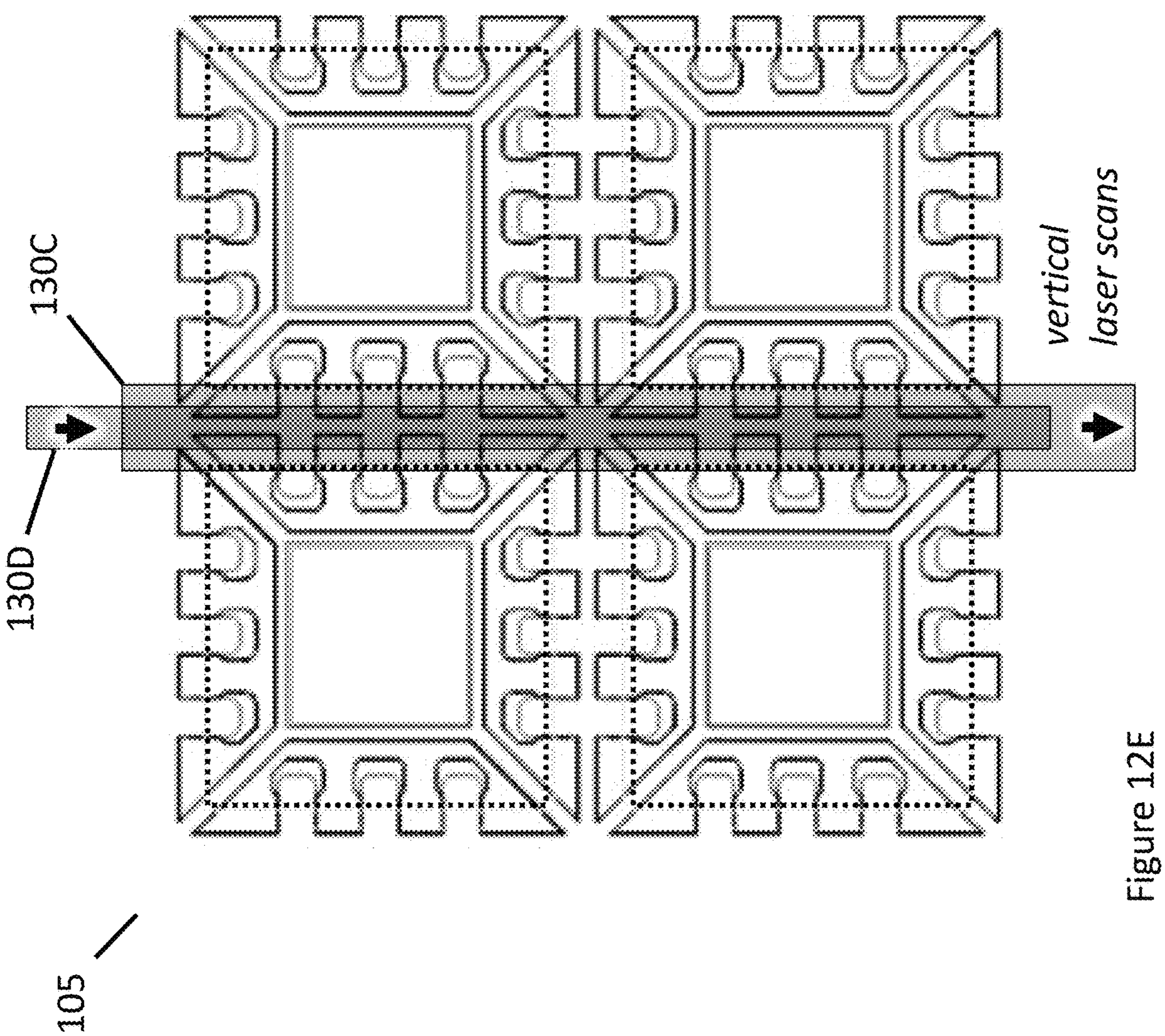
FIG. 12E is a leadframe illustrating USMP vertical street fabrication.

Aside from selecting the proper wavelength lasers for plastic and copper removal, the USMP manufacturing process can be optimized by the scanning algorithm employed in street fabrication. Rastering the laser beam by rows in a manner used by DLP movie projection and LCD TVs is an inefficient method because most of the leadframe retains plastic and does not require laser processing. Instead it is preferable to process only the areas requiring lasing, for example by lasing the horizontal streets first as shown in FIG. 12D, then lasing the vertical streets as illustrated in FIG. 12E. Leadframe 105 illustrates a footed package with 12 feet, three on a side. During plastic removal beam scan 130A removes plastic in the horizontal streets; then beam scan 130C removes the plastic in the vertical streets. After plastic removal, in a similar manner laser removal occurs orthogonally where beam scan 130B removes copper in the horizontal streets; then beam scan 130D removes the copper in the vertical streets.

Figure 12F:
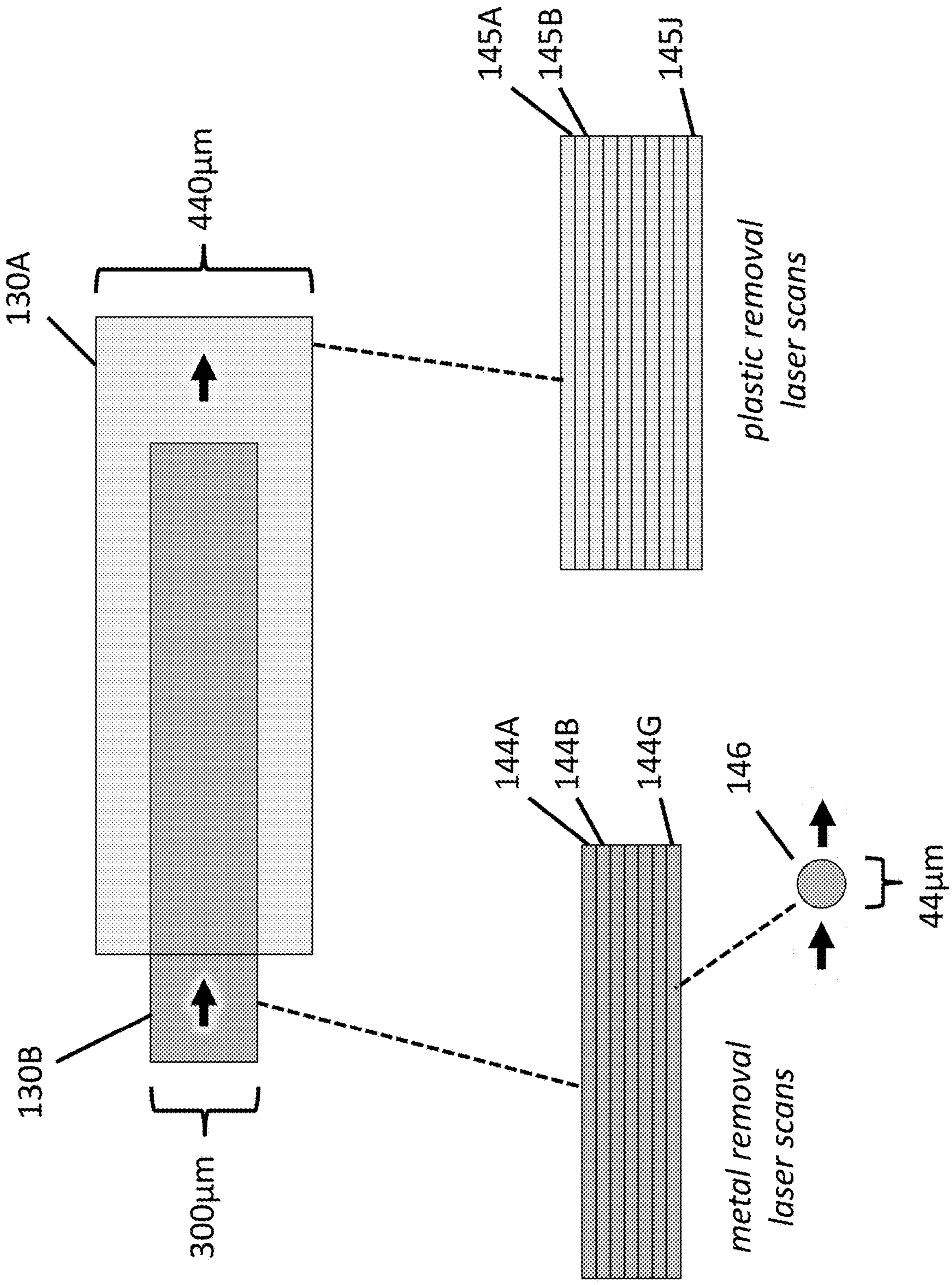
FIG. 12F is a schematic of USMP street fabrication laser scan patterns for plastic and metal removal.

As described previously, in the USMP process the difference in the width of the plastic removal beam scan 130A and the copper removal beam width 130B determines the length of the package's feet. Each laser scan actually comprises multiple horizontally displaced "slices" of the material being scanned. For example as shown FIG. 12F, plastic removal beam 130A comprises 10 separate scans 145A through 145J, and laser copper removal beam 130B comprises 7 separate scans 144A through 144G, each comprising a laser beam having a spot size 146 of 44 μm. While smaller spots are possible, spots of 20 μm to 50 μm are preferable to reduce the number of slices required in laser scanning. Too large a spot size, however, is not preferred because it limits a package's feature resolution. The slices can overlap slightly without any adverse effect, and in fact it is preferable to have them overlap slightly. With no overlap, seven slices each 44 μm wide would result in a plastic cut 308 μm but the total width of copper removal beam 130B is only 300 μm. Non-overlapping laser beams are problematic as residual metal and plastic and metal may survive the street fabrication process and result in defective product.

Figure 12G:
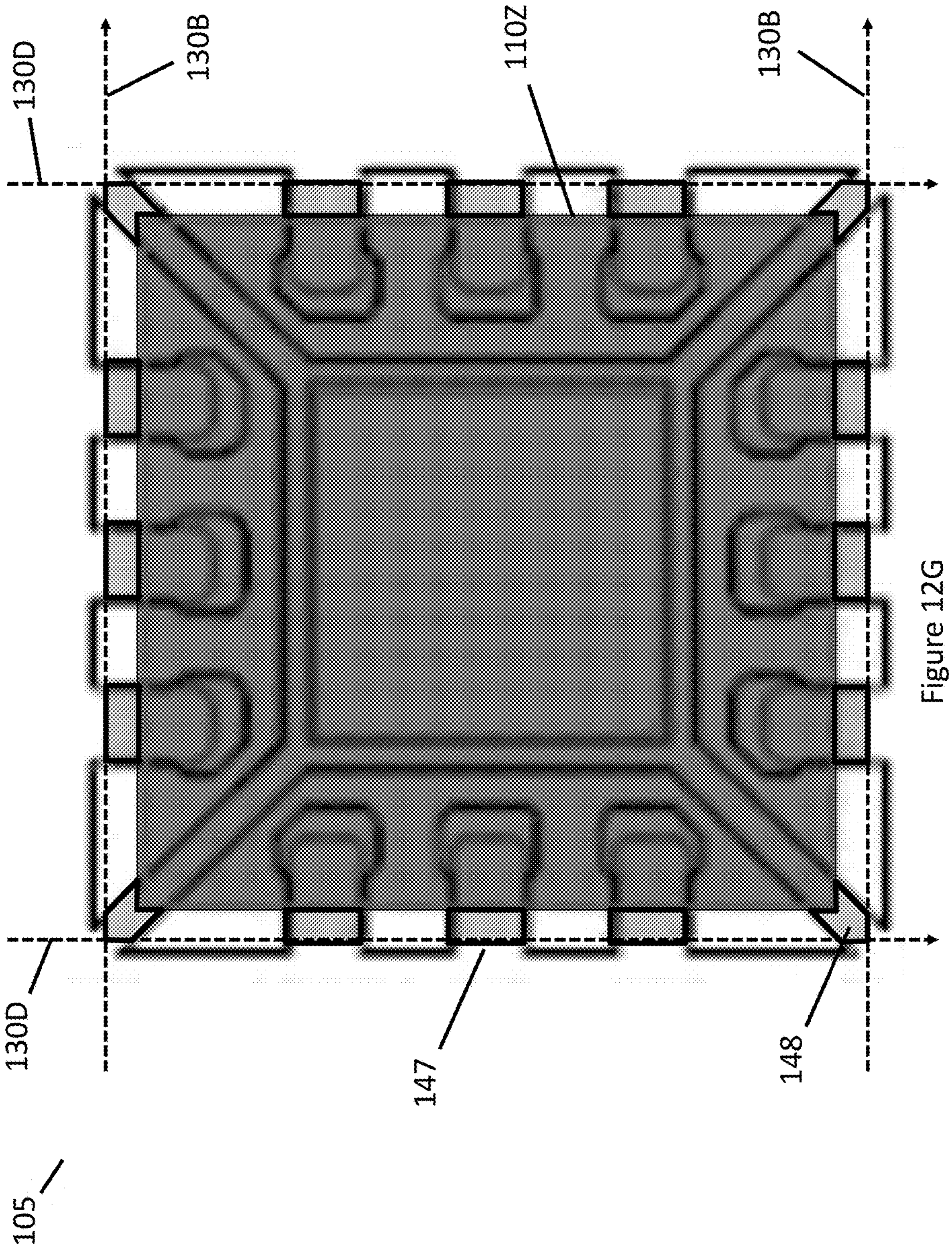
FIG. 12G is a plan view of a USMP fabricated footed package.

The resulting footed package from leadframe 105 is shown in FIG. 12G comprising laser-defined plastic body 110Z and conductive feet 147. For reference, the locations of horizontal laser copper removal beams 130B and vertical laser copper removal beams 130D are included.

Figure 1A:
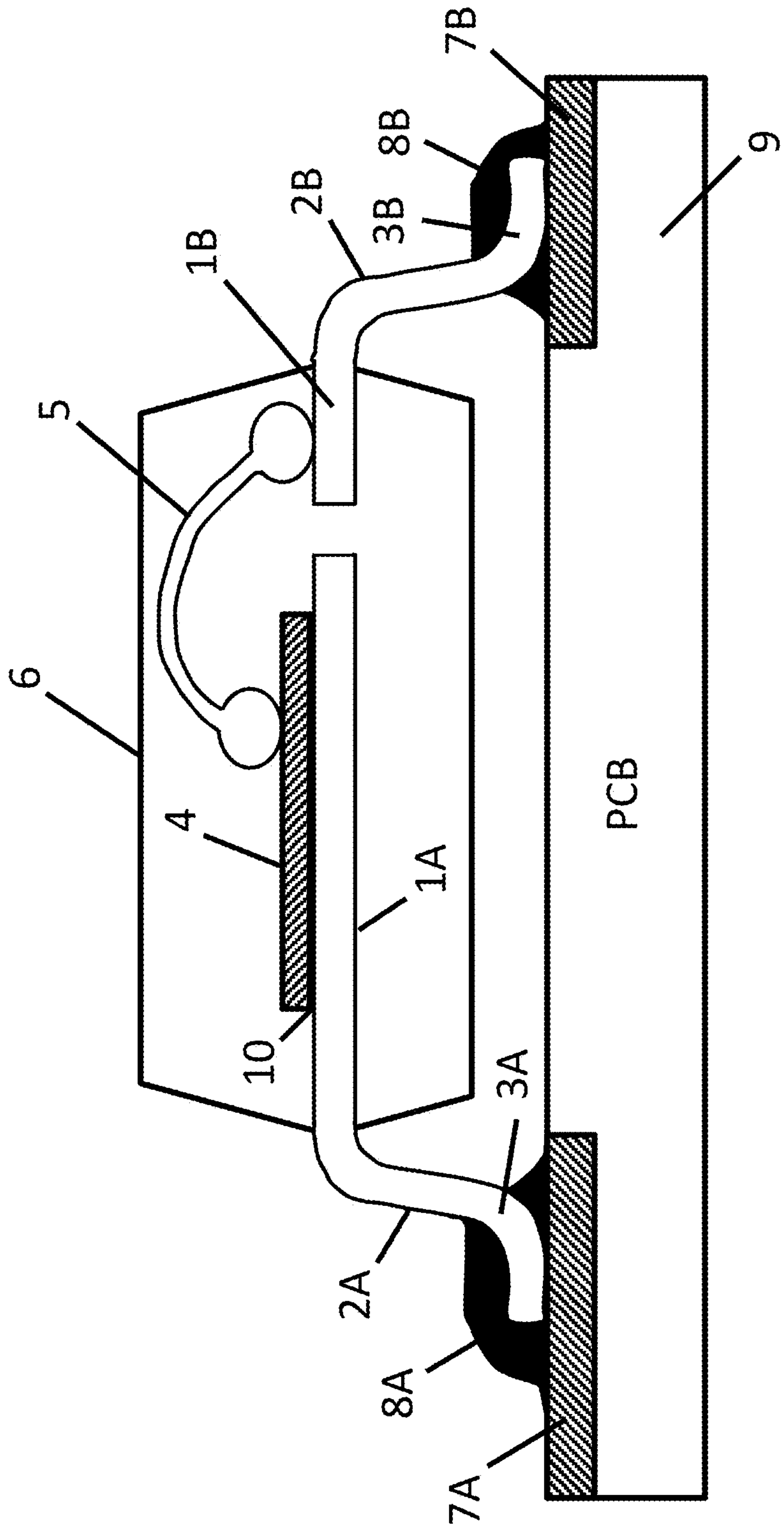
FIG. 1A is a cross-sectional view of a leaded IC surface mount package.
Figure 1B:
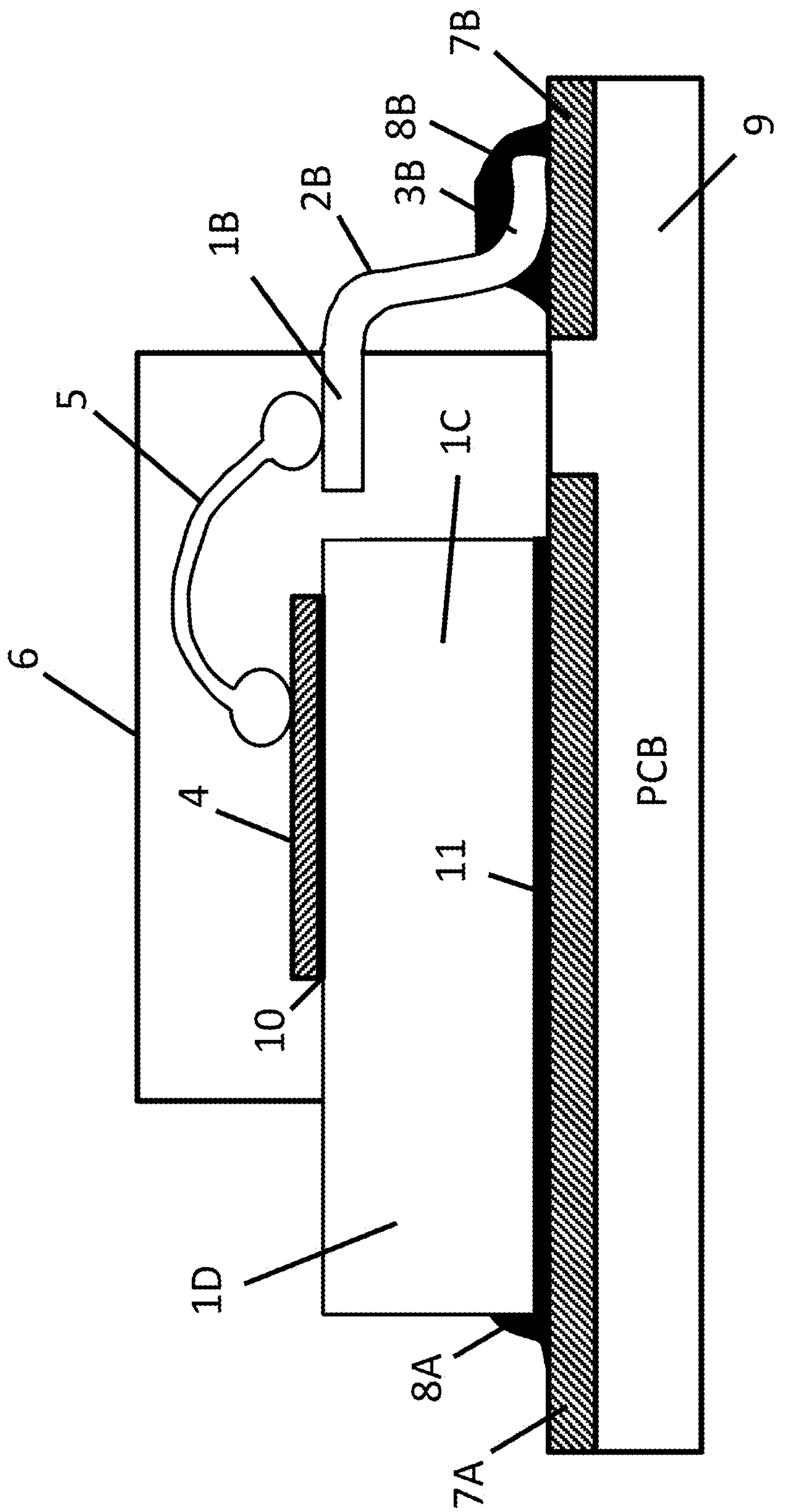
FIG. 1B is a cross-sectional view of a leaded surface mount power package with heat slug.
Figure 2:
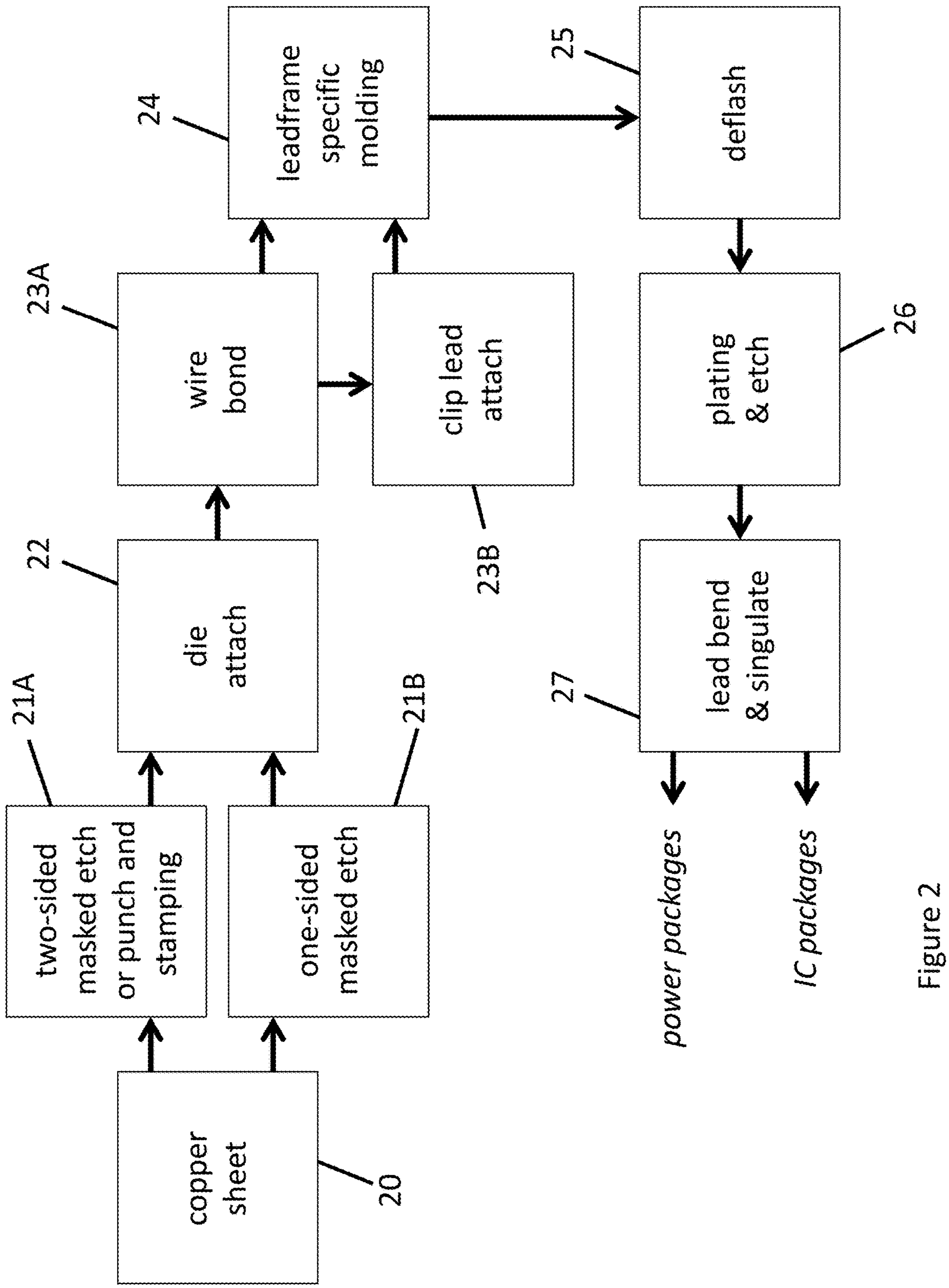
FIG. 2 is a flow chart for leaded surface mount package fabrication.
Figure 3A:
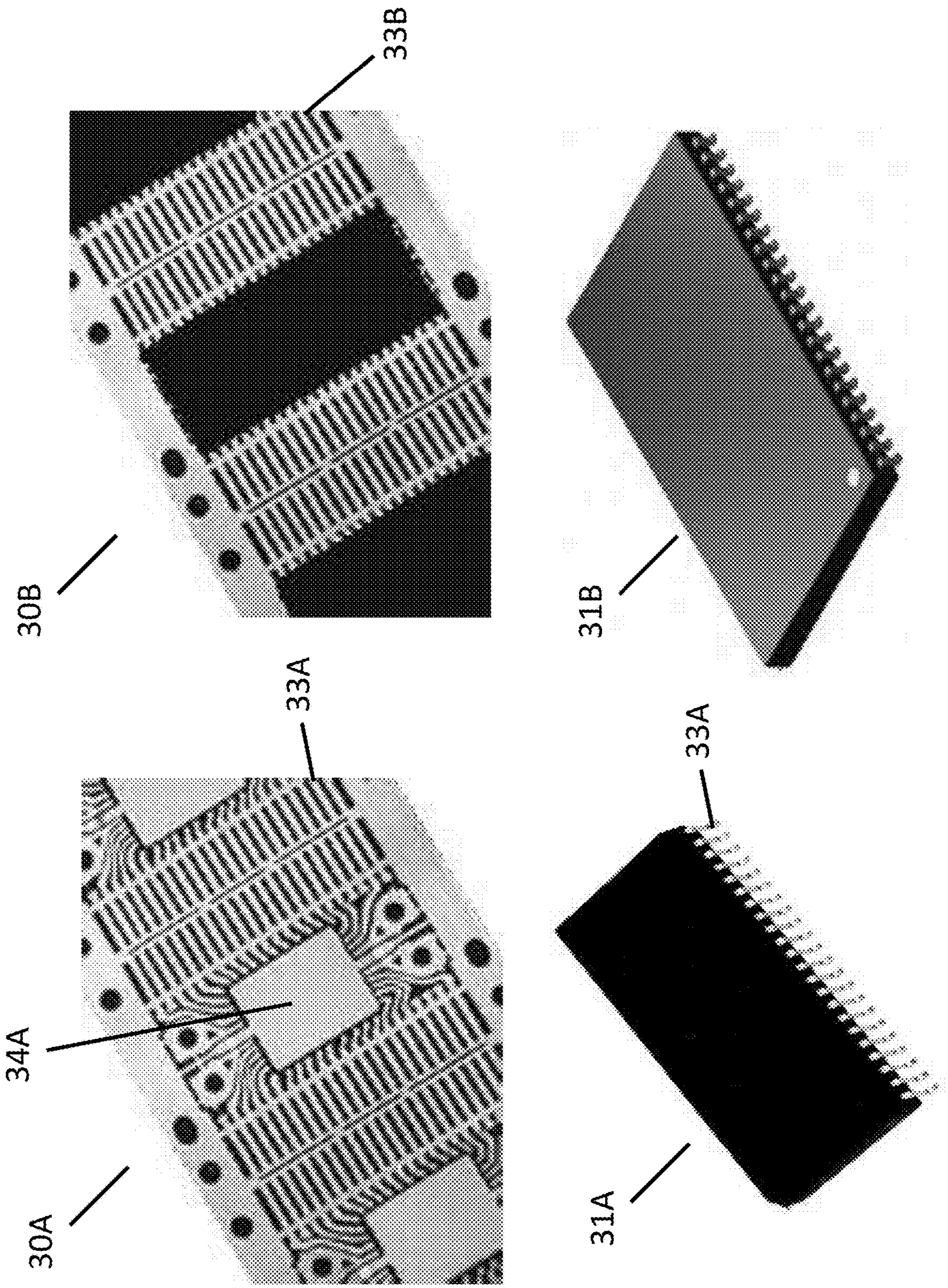
FIG. 3A comprises a topside view of leaded surface mount leadframe and package before and after molding.
Figure 3B:
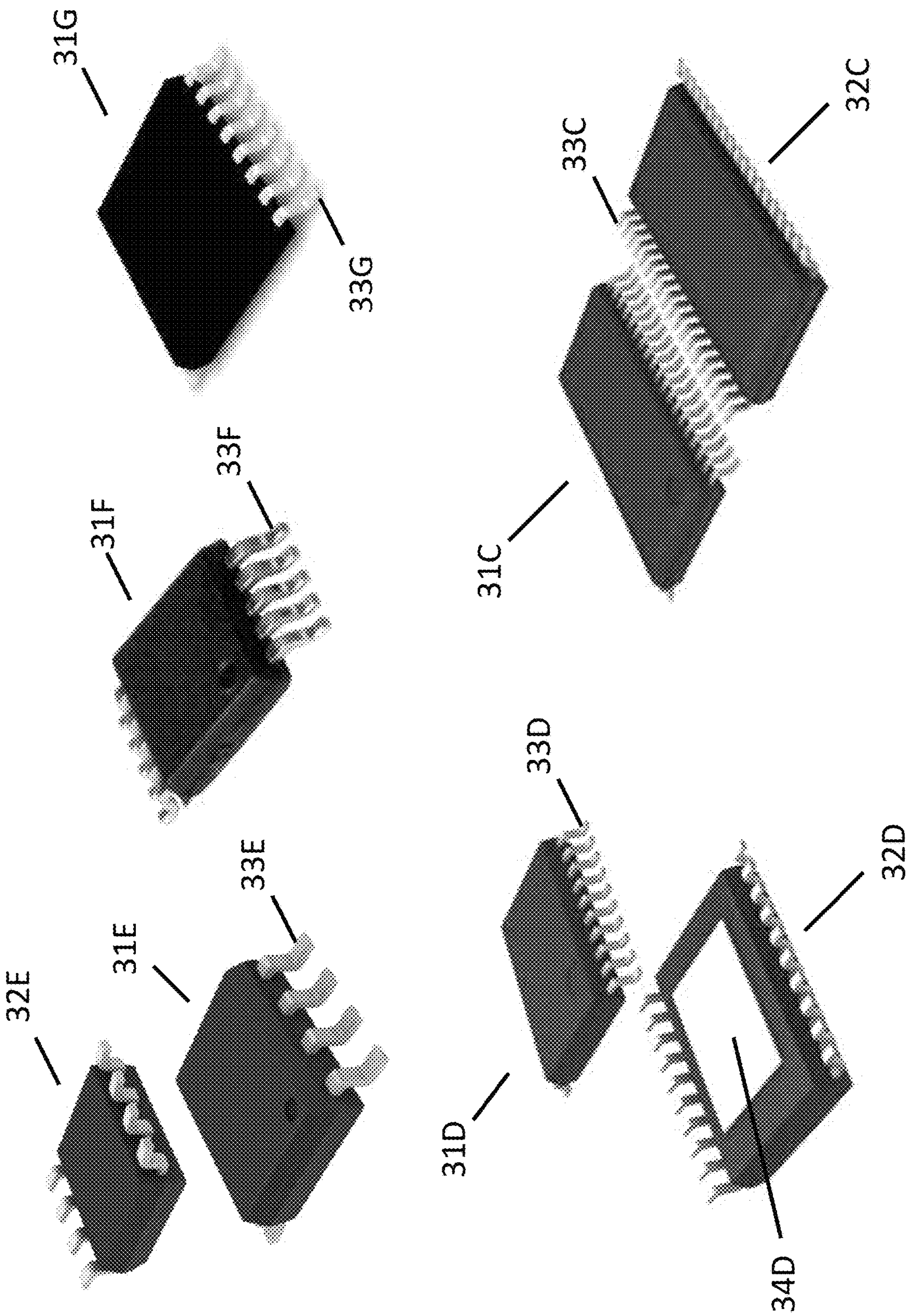
FIG. 3B comprises topside and underside perspective views of various dual-sided leaded IC surface mount packages.
Figure 3C:
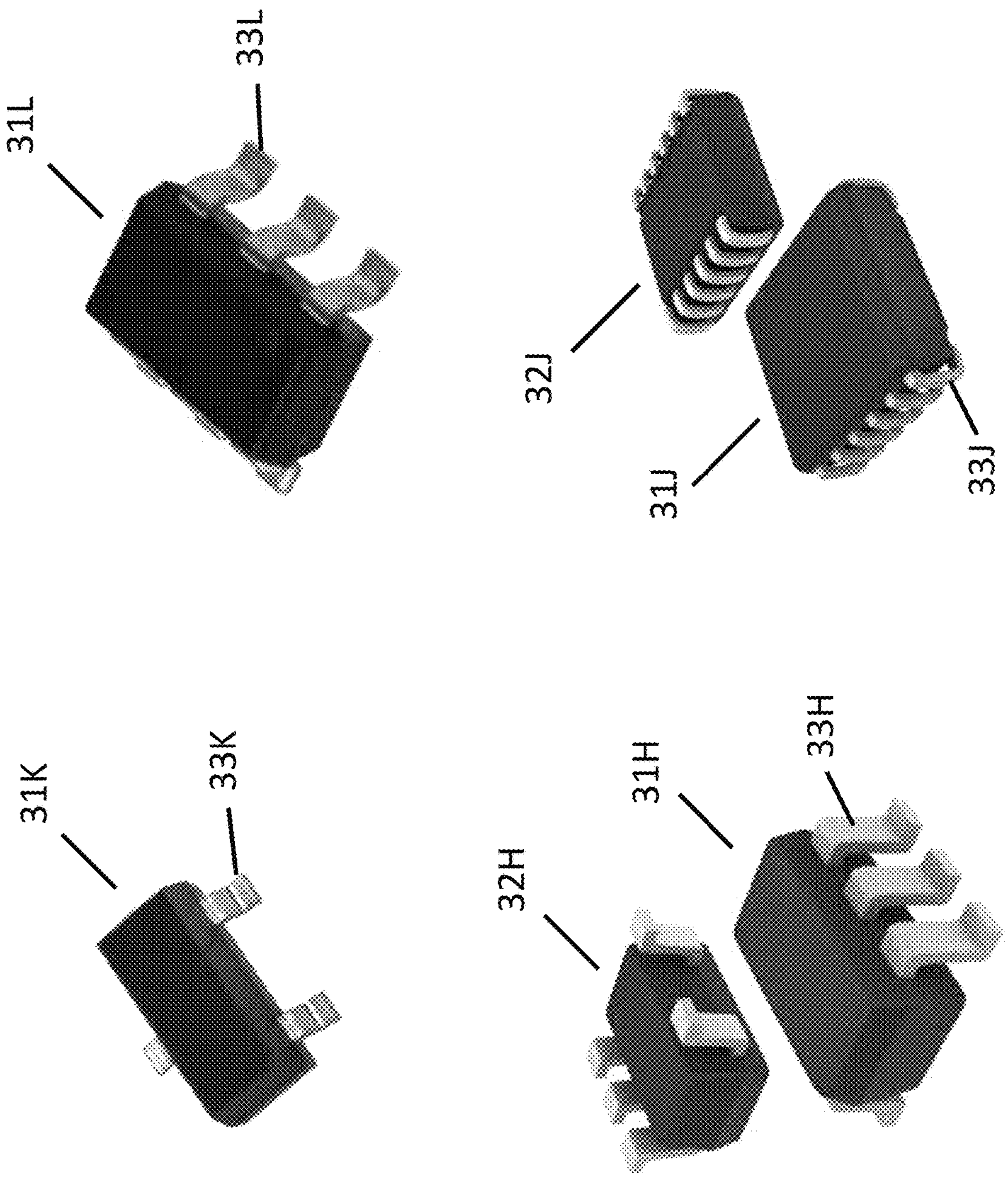
FIG. 3C comprises topside and underside perspective views of various dual sided low-pin-count leaded IC surface mount packages.
Figure 3D:
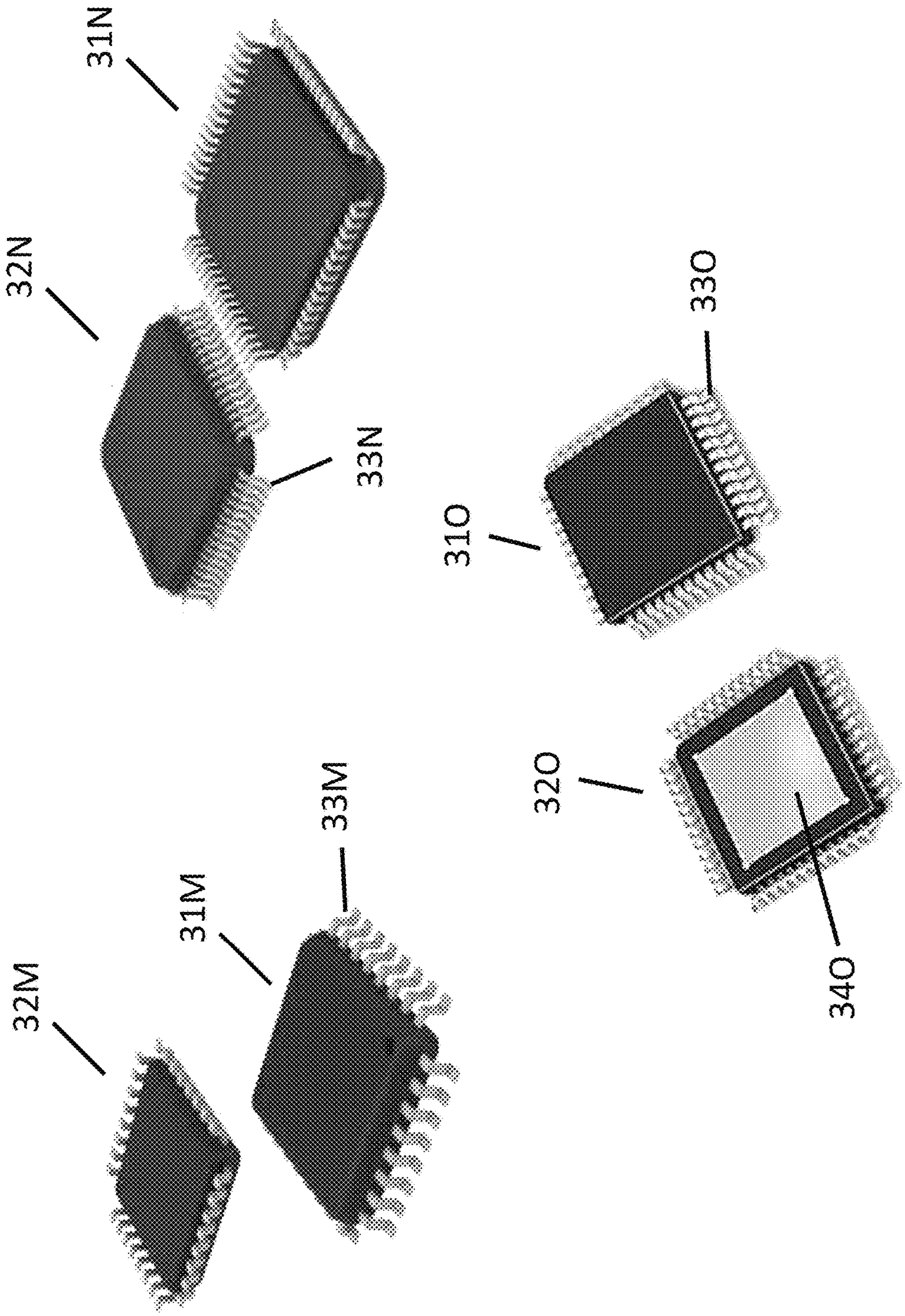
FIG. 3D comprises topside and underside perspective views of various four-sided LQFP leaded surface mount packages.
Figure 3E:
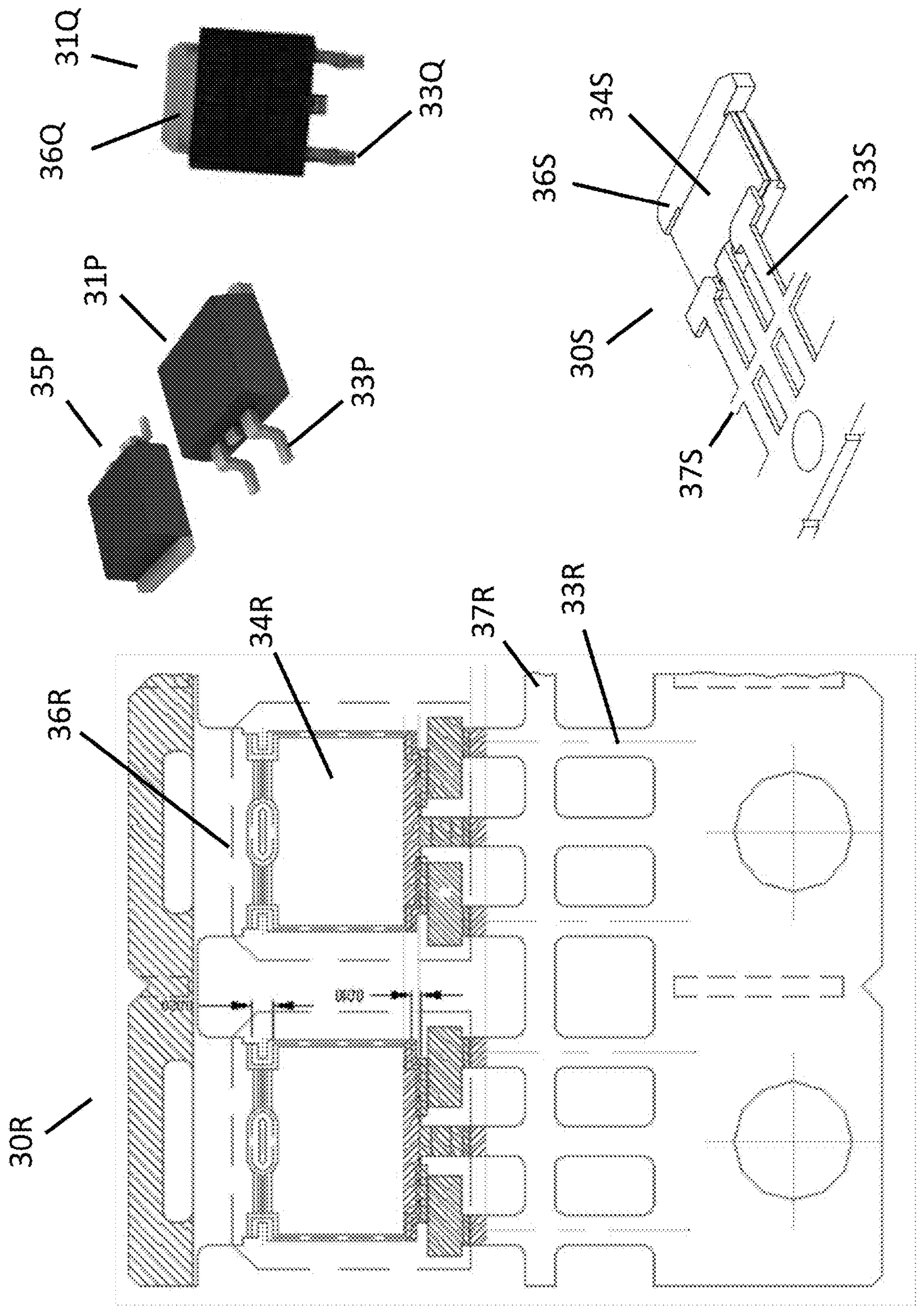
FIG. 3E comprises topside views of leaded surface mounted power packages and leadframes.
Figure 3F:
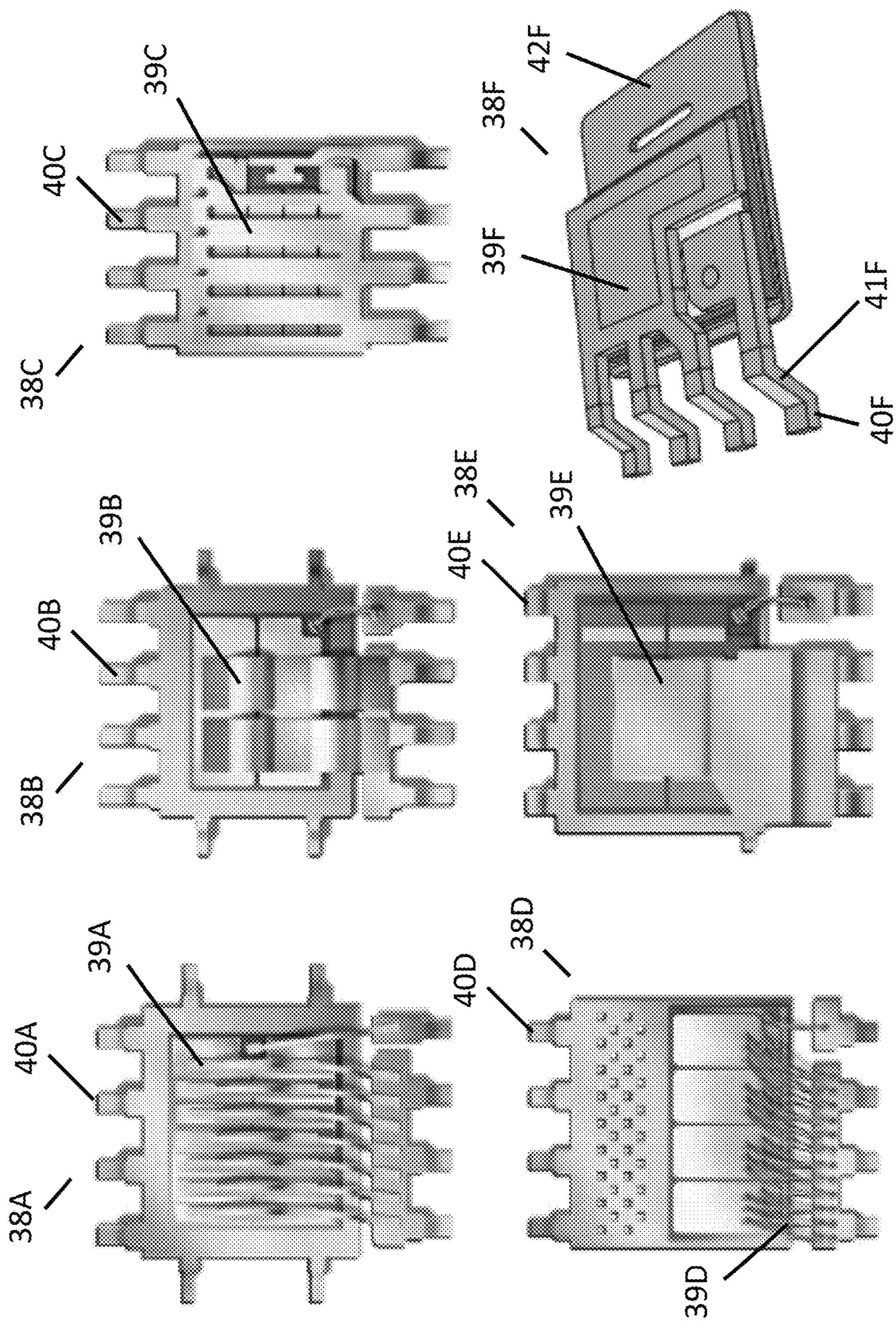
FIG. 3F comprises topside and perspective views of IC surface mount leadframes adapted for power applications.
Figure 3G:
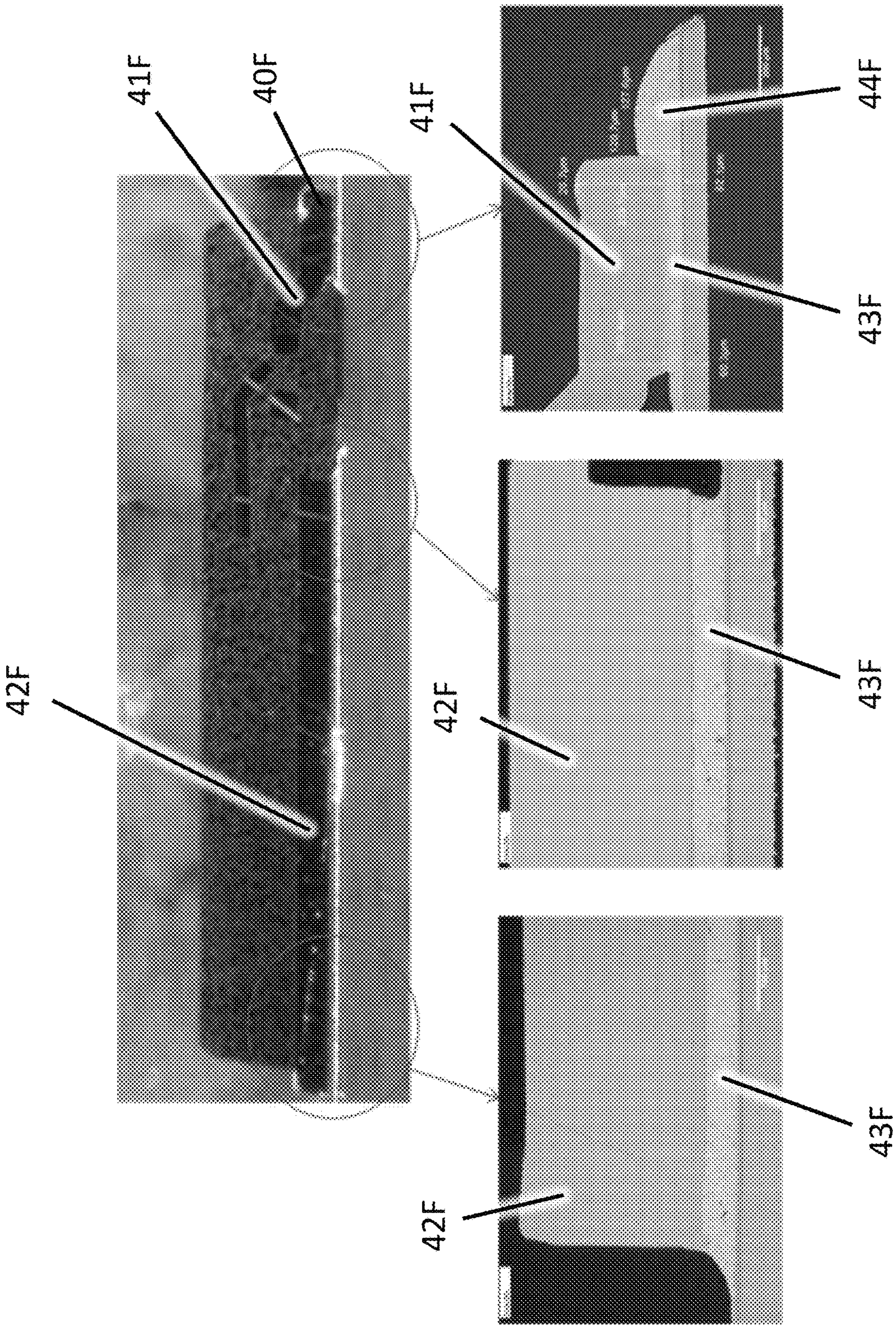
FIG. 3G is a side view of a surface mounted IC leadframe adapted for power applications.
Figure 3H:
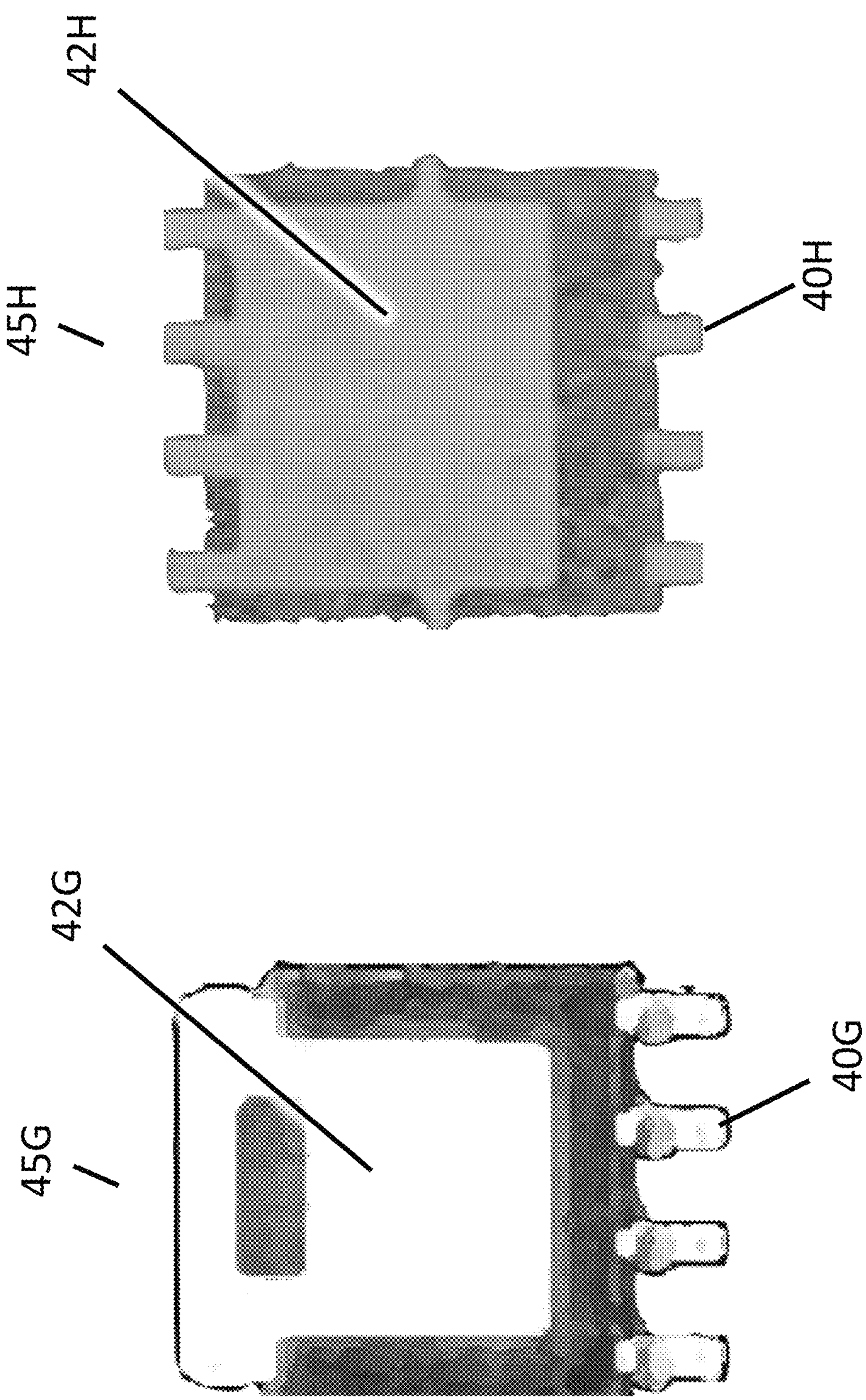
FIG. 3H comprises topside and underside views of IC surface mount packages adapted for power applications.
Figure 3I:
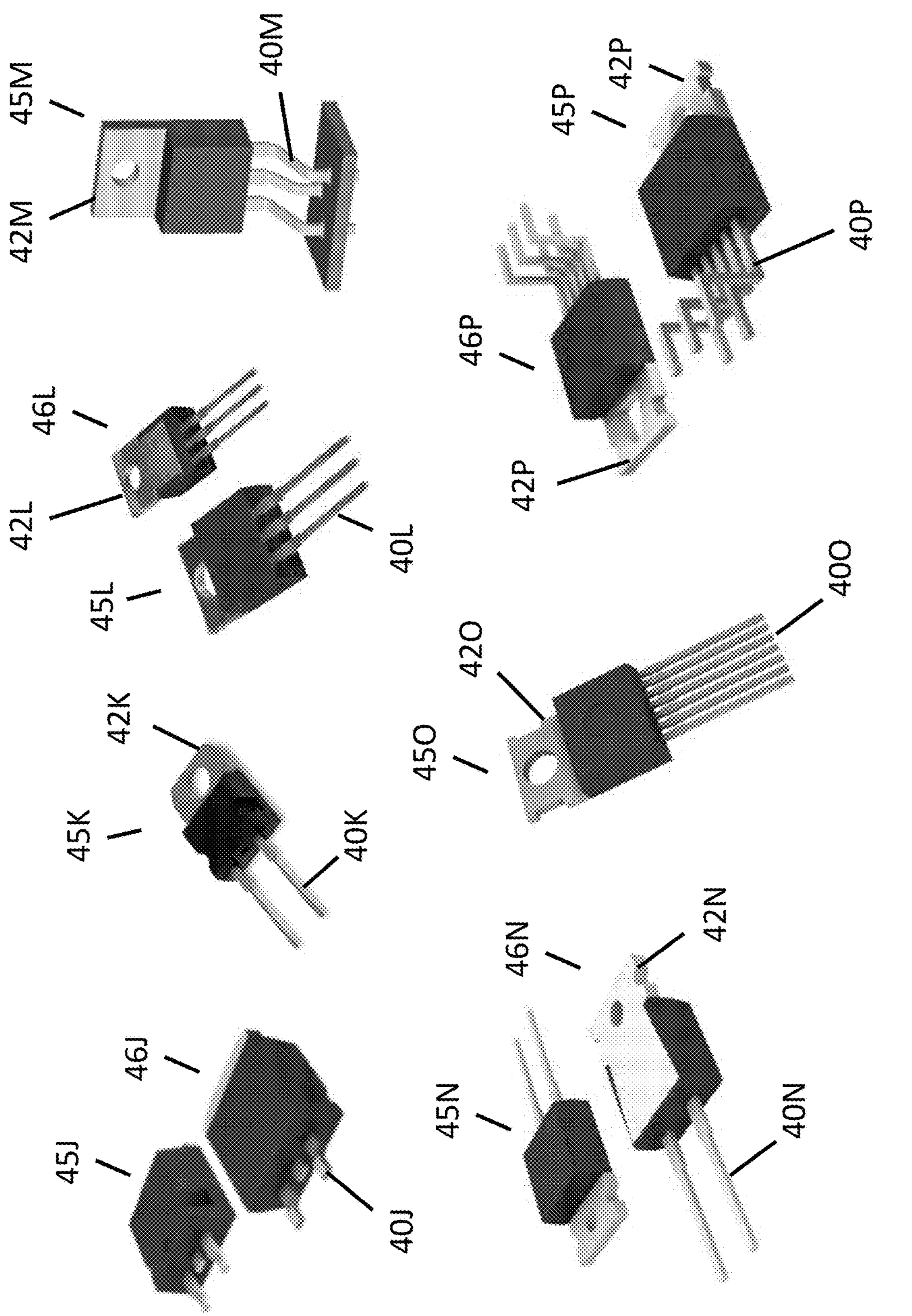
FIG. 3I comprises topside and perspective views various leaded power packages.
Figure 4:
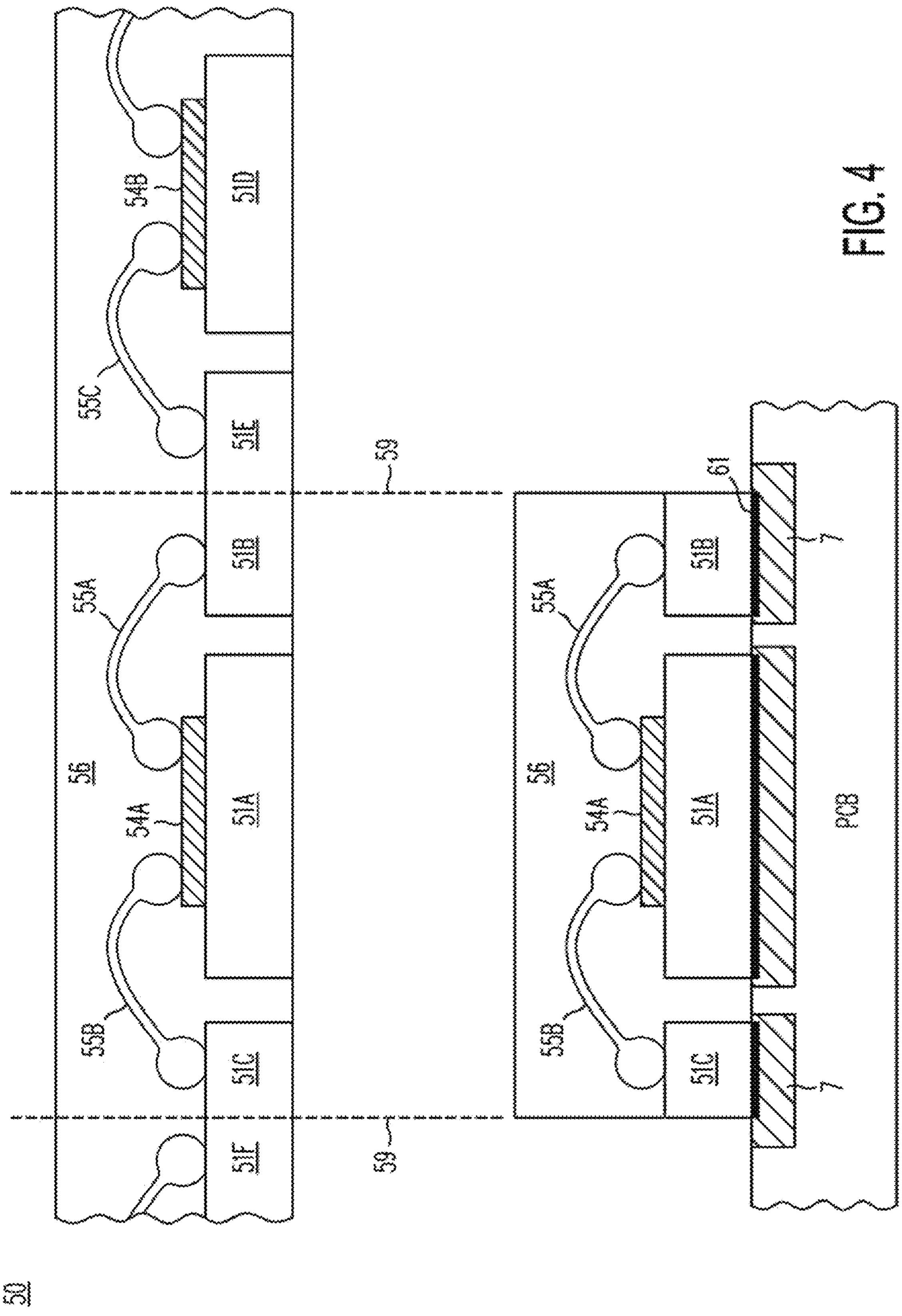
FIG. 4 is a cross sectional comparison of a leadless package before and after singulation.

In manufacturing four sided footed packages special consideration must be given to how to remove tie bars during lead formation and singulation. Tie bars (exemplified by tie bar 148 in FIGS. 12G and 1211), extra pieces of metal used to stabilize the leadframe and to hold the die pad in place during manufacturing naturally protrude from the package's plastic body. In conventional leaded packages, tie bars are mechanically clipped off and the extra pieces metal removed, i.e. "de-junked" during the singulation process. The process, while applicable to the USMP is not preferred because it adds mechanical stress during the manufacturing process, requires additional equipment, and oftentimes results in a small protrusion of metal outside of the plastic potentially as shown in DPAK perspective view 45J shown in FIG. 3I.

Figure 12H:
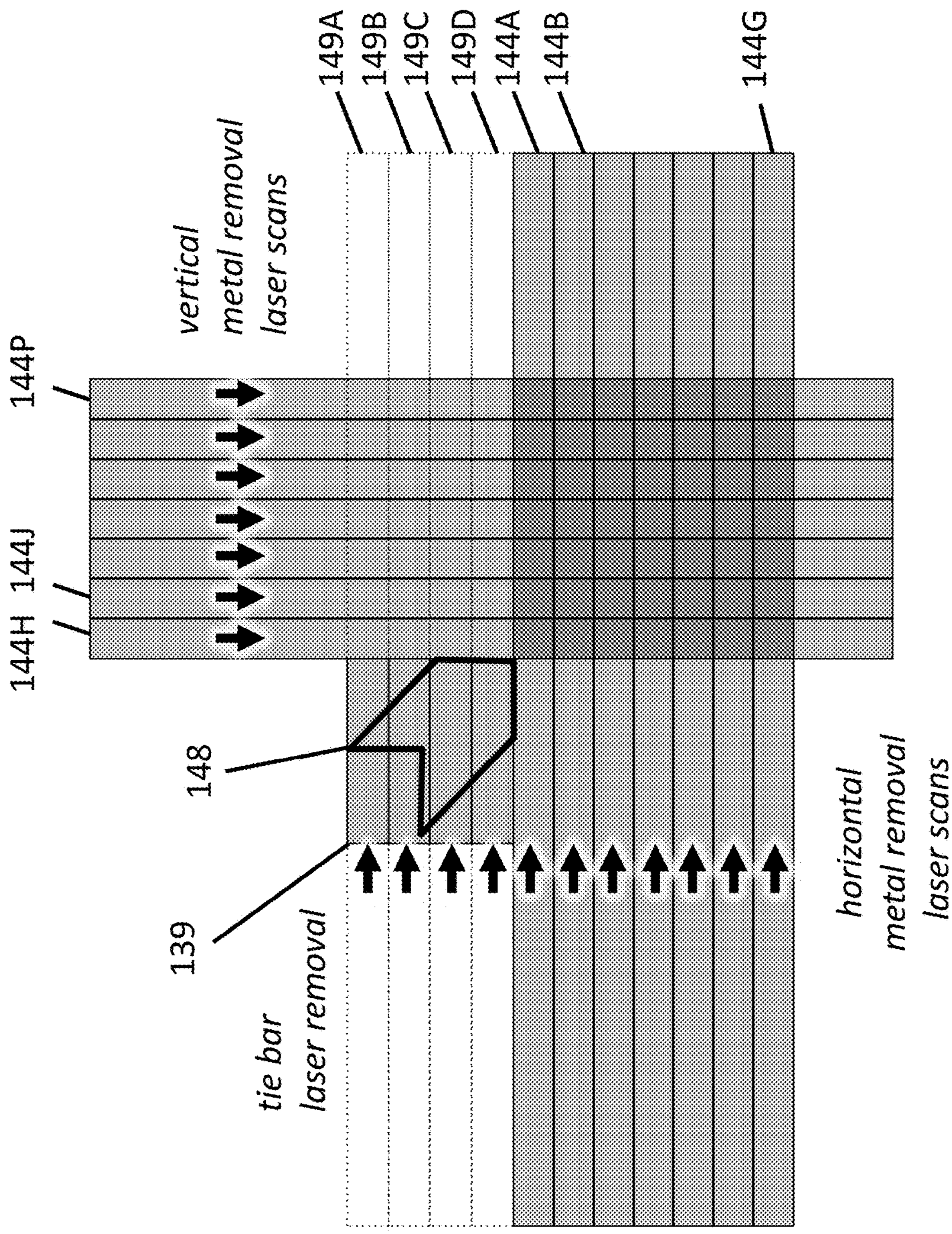
FIG. 12H is a schematic of alternate USMP street fabrication laser scan patterns for eliminating tie bar artifacts.

In the USMP process for fabricating four-sided footed packages, the rectilinear laser algorithm comprising horizontal and vertical slices results in an unwanted artifact, a remaining segment of tie bar 148, which forms a copper cantilever protruding from the die pad's corners. This artifact can be eliminated using the same laser process by augmenting the laser scan pattern. As shown in FIG. 12H augmenting the combination of horizontal laser slices 144A through 144G to include extra slices 149A through 149D removes the tie bar 148 artifact. To protect the package plastic from the laser, this laser scan is not continuous, but lasing occurs only for a short duration so as to direct the laser beam only at the top of tie bar 148. Alternatively, tie bar removal can occur as a step that is separate from the formation of the metal feet.

Concurrent Fabrication of Footed, Power, and Leadless Packages

Figure 13:
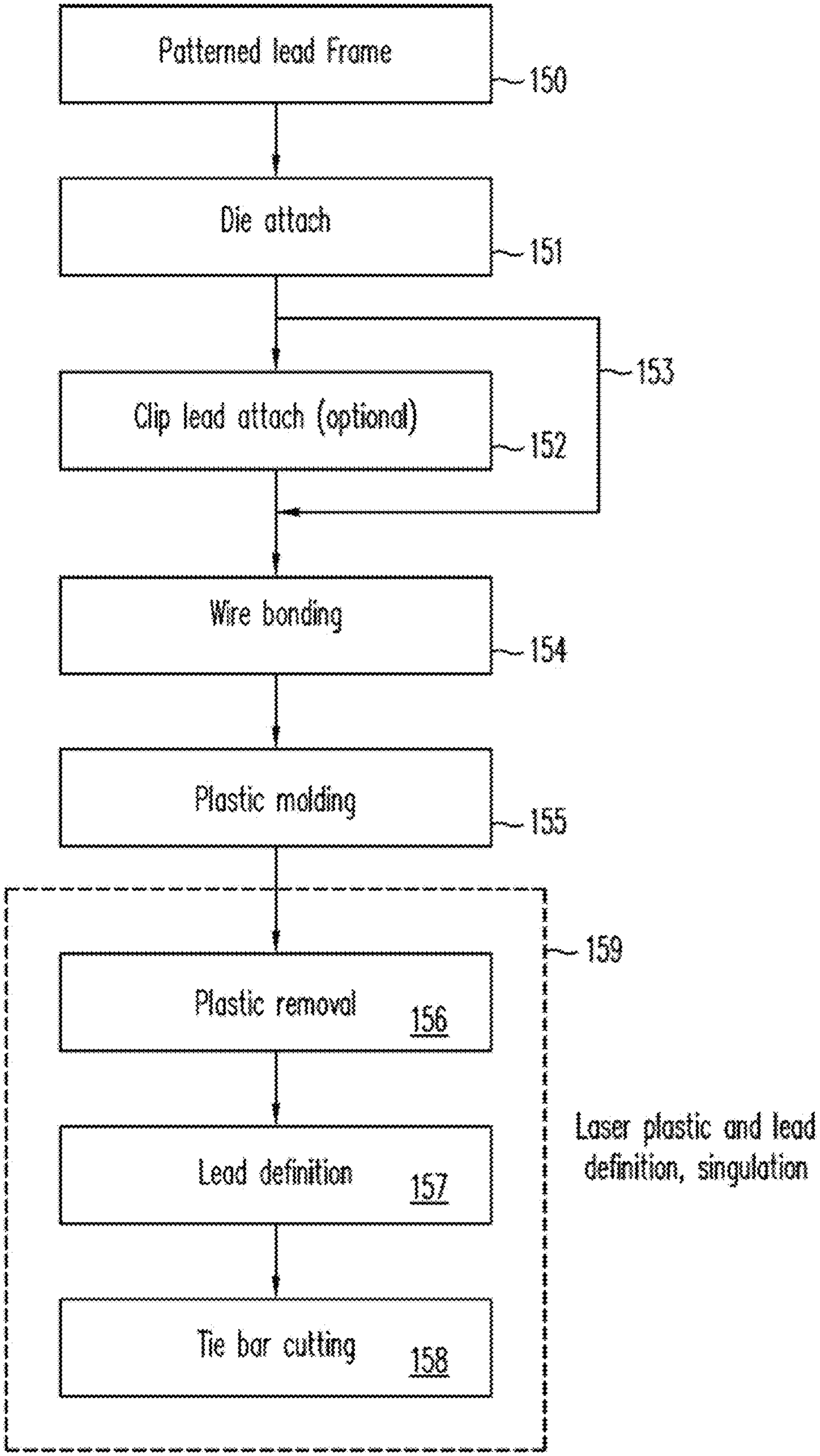
FIG. 13 is a USMP flow chart for footed and leadless package fabrication.

In accordance with the USMP process and packages disclosed herein, both leaded and leadless packages can be fabricated on the same manufacturing line, even concurrently. A block diagram flow chart of the manufacturing process is shown in FIG. 13 comprising the steps starting with a patterned leadframe (step 150) fabricated in a manner disclosed previously in this application, followed by solder or epoxy die attach (step 151), optional clip lead attach process (step 152) and wire bonding (step 154). As shown by path 153, clip-lead process (step 152) may be skipped if the semiconductor is not a high current discrete device. After wire bonding, plastic-molding (step 155) is performed using either separate mold cavities or preferably using block molding, i.e. one mold sheet encapsulating many devices. Following molding, laser plastic and lead definition, singulation (step 159) is performed, comprising selective plastic removal using a laser (step 156), followed by laser lead definition (step 157) and tie bar cutting (step 158). The singulated dice are then ready for a pick and place machine to perform testing and packing onto tape and real or waffle packs as required.

FIG. 14A through FIG. 14J illustrates the concurrent fabrication of a leaded power package, specifically a footed power package, and an IC package comprising either a footed or leadless package using the same USMP process. Provided that a leadframe of the same thickness is used for both leaded and leadless devices, the same USMP process is capable of simultaneously fabricating these dissimilar package types on a common line simply by changing the leadframe design. No other change in processing or mechanical tooling is needed. If the leadframe thickness and plastic mold cavity thickness is changed, etch times must be adjusted accordingly.

Figure 14A:
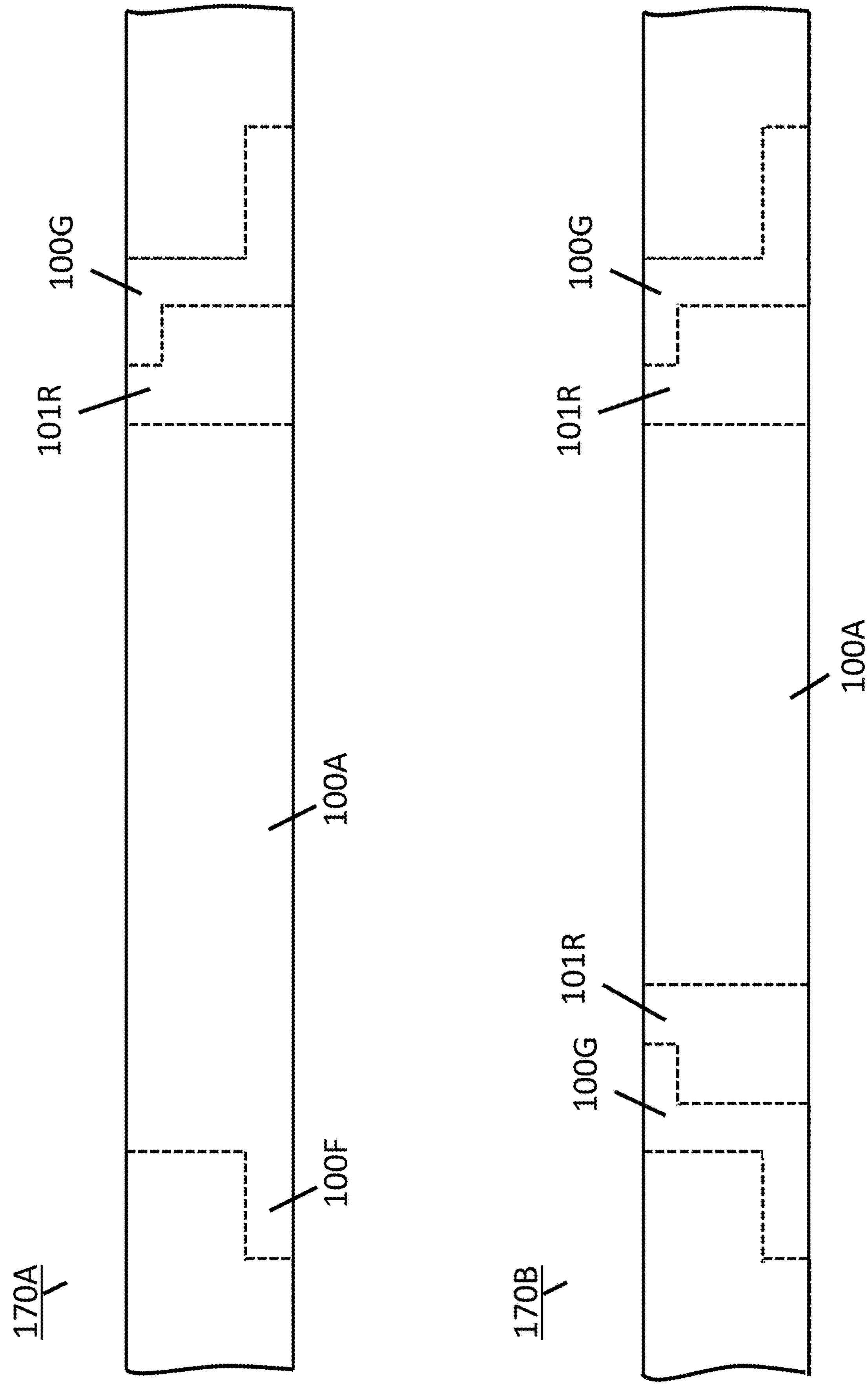
FIG. 14A is a cross sectional view of USMP footed package fabrication illustrating starting copper sheet.

FIG. 14A illustrates a cross-sectional view of two copper sheets, copper sheet 170A shown as the upper illustration used for fabricating a footed power device package and, copper sheet 170B shown as the lower illustration used for manufacturing either a leadless or footed IC package using the USMP method in accordance with this invention. For the sake of illustration, the dotted lines identify the vertical column 100A, later used to form the package's die pad, the L-shaped geometry 100F used to form the foot to a power package's heat tab, the Z shaped geometry 100G used to form the packages' conductive leads and feet, and the etched geometry 101R used to electrically separate the packages' conductive leads from their die pads. The thickness of copper sheet 170A can vary from 200 μm to 700 μm, with 500 μm being a common thickness for good heat spreading. The thickness of copper sheet 170B can vary from 50 μm for smart card applications to 300 μm for power ICs, with 200 μm being a common thickness for most integrated circuits.

Figure 14B:
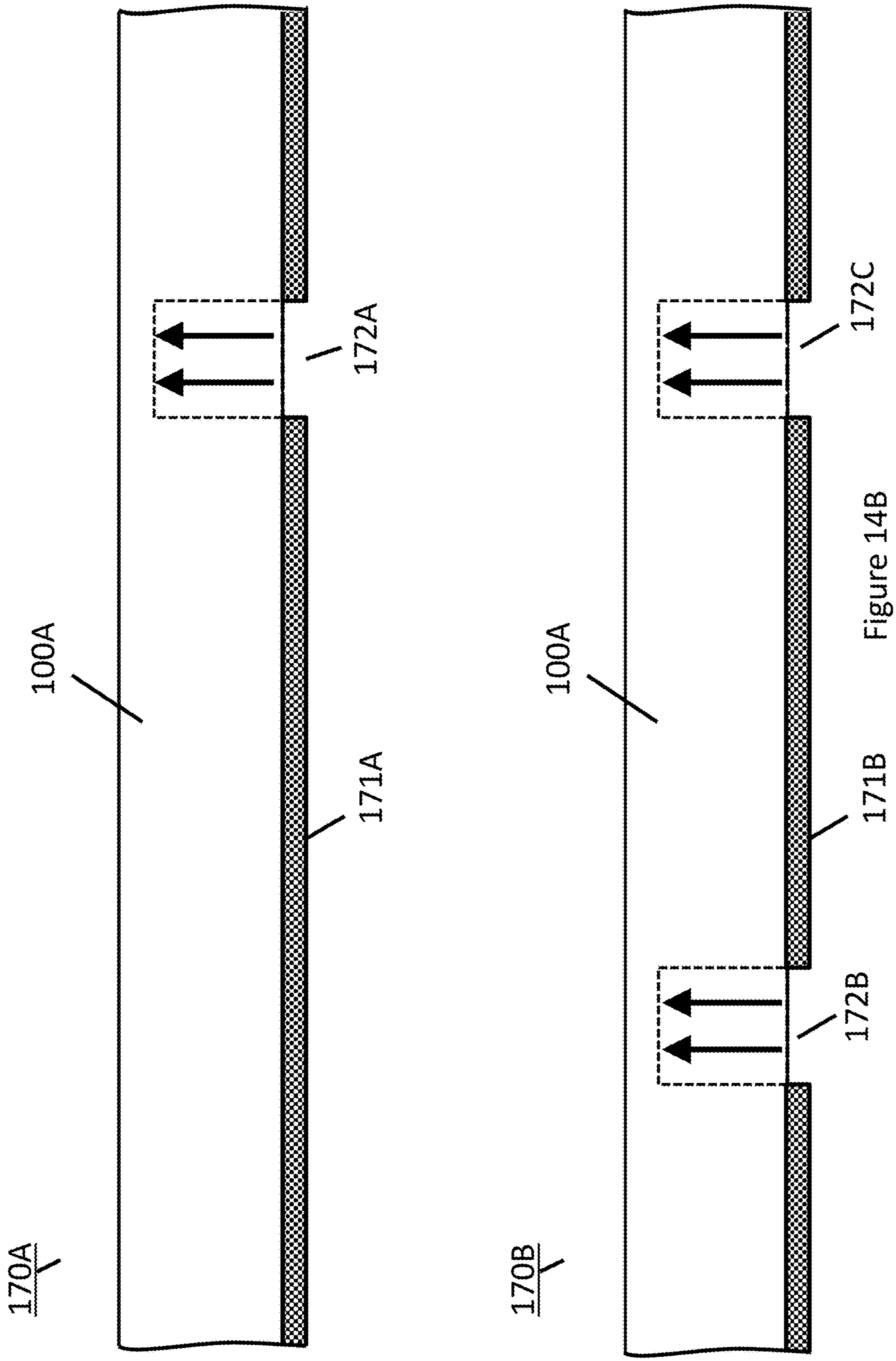
FIG. 14B is a cross sectional view of USMP footed package fabrication illustrating leadframe backside etch masking.

The upper figure of FIG. 14B illustrates backside etching of copper sheet 170A during leadframe fabrication of a footed power package, where mask 171A comprising photoresist or chemical etch resistant coating with window 172A open to define area for copper etching. Similarly the lower figure of FIG. 14B illustrates backside etching of copper sheet 170B during leadframe fabrication of a leadless or footed IC package, where mask 171B comprising photoresist or chemical etch resistant coating includes windows 172B and 172C open to define area for copper etching. The copper is then etched through windows 172A, 172B and 172C using wet chemicals or dry etching as described previously.

Figure 14C:
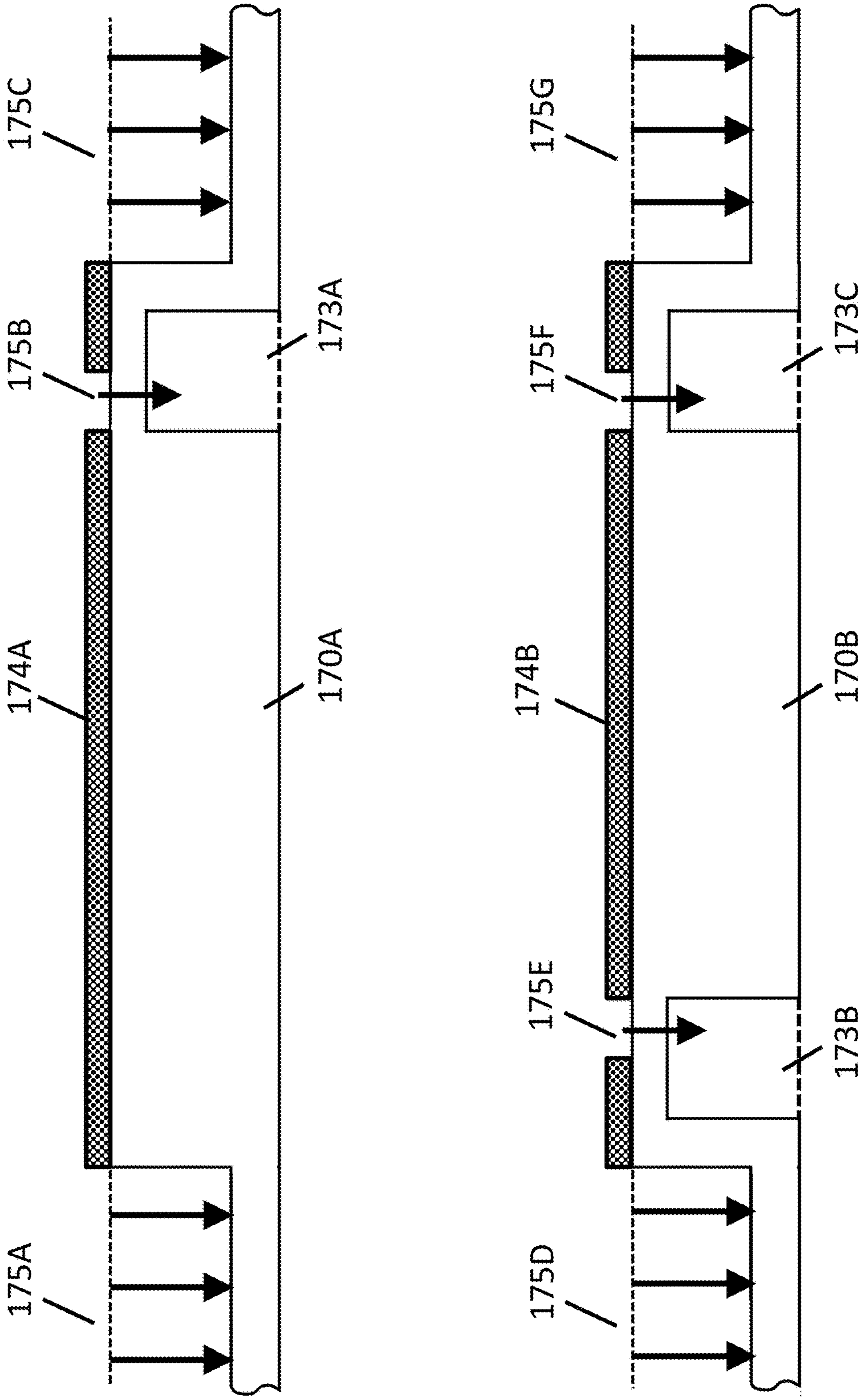
FIG. 14C is a cross sectional view of USMP footed package fabrication illustrating leadframe front side etch masking.

The upper figure of FIG. 14C illustrates copper sheet 170A during leadframe fabrication of a footed power package just prior to front-side etching. As shown copper sheet 170A includes backside etched cavity 173A resulting from the previous backside etch step, coinciding with mask window 172A (FIG. 14B). To define areas for front-side copper etching, mask 174A comprising photoresist or chemical etch resistant coating including windows 175A, 175B, and 175C. Similarly, the lower figure of FIG. 14C illustrates copper sheet 170B during leadframe fabrication of a leadless or footed IC package just prior to front-side etching, including backside etched cavities 173B and 173C resulting from the backside etch process corresponding to previous backside mask features 172B and 172C (FIG. 14B). To define the area for front-side copper etching, mask 174B comprising photoresist or chemical etch-resistant coating includes windows 175D, 175E, 175F and 175G.

Figure 14D:
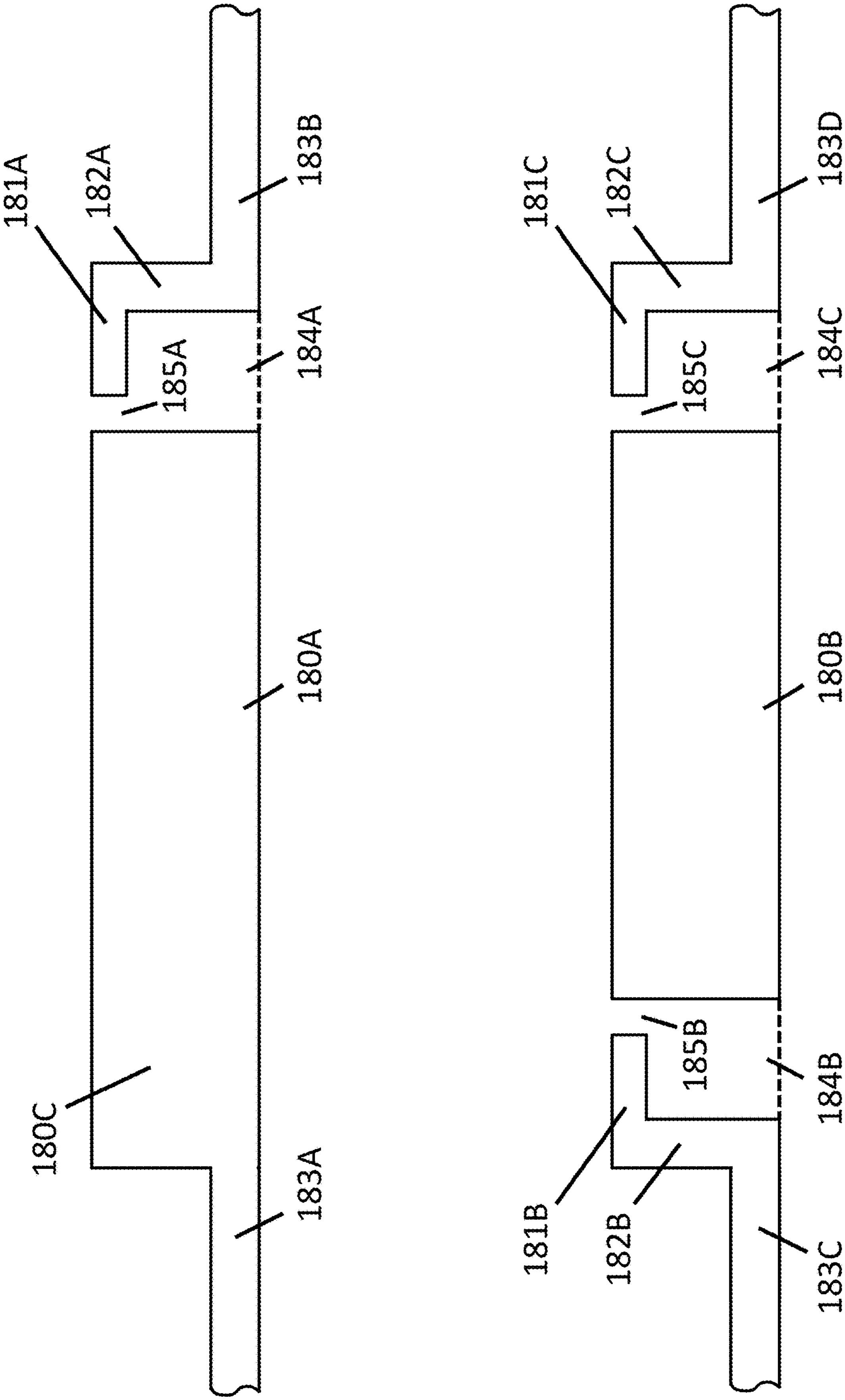
FIG. 14D is a cross sectional view of USMP footed package fabrication illustrating leadframe after front side etching.

After masking, the copper is then etched through windows 175A through 175G using wet chemicals or dry etching as described previously. While the etching sequence is shown with backside etching occurring before front-side etching, the sequence may be reversed without changing the resultant leadframe. Regardless of the sequence, the resultant leadframe is illustrated in FIG. 14D in the top illustration for the footed power package, and for the bottom illustration for a leadless of footed IC package. After front-side copper etching, mask window 175A, 175C, 175D and 175G results in corresponding feet 183A, 183B, 183C and 183D also connecting to other devices in the leadframe to facilitate mechanical support.

Also during front-side etching, openings 175B, 175E, and 175F merge with backside etched cavities 173A, 173B and 173C (FIG. 14C) to form gaps 185A, 185B and 185C, cantilever leads 181A, 181B, and 181C, vertical columns 182A, 182B, and 182C and backside cavities 184A, 184B and 184C. The combination of cantilever 181A, vertical column 182A and foot 183B form the aforementioned Z-shape geometry 100G characteristic of an independent conductive lead electrically disconnected from die pad 180A by gap 185A in a footed power package made in accordance with the USMP process and design.

In an IC package, the combination of cantilever 181B with vertical column 182B and foot 183C, and similarly the combination of cantilever 181C with vertical column 182C and foot 183D, form the same aforementioned Z-shape geometry 100G characteristic of an independent conductive lead electrically disconnected from die pad 180B by corresponding gaps 185B and 185C. While the various leadframe elements in the drawing appear independent from one another, they are all attached to one another as part of a single interconnected leadframe through feet 183A, 183B, 183C, and 183D and other copper pieces not visible in this specific cross section. The feet in turn connect to leadframe rails to secure the entire structure mechanically for processing. In the case of die pad 180B not connected to any conductive leads or feet, the die pad must be held in place through the use of temporary tie bars constructed as cantilevers similar to geometry 100E and cut flush with the package's plastic during singulation.

Figure 14E:
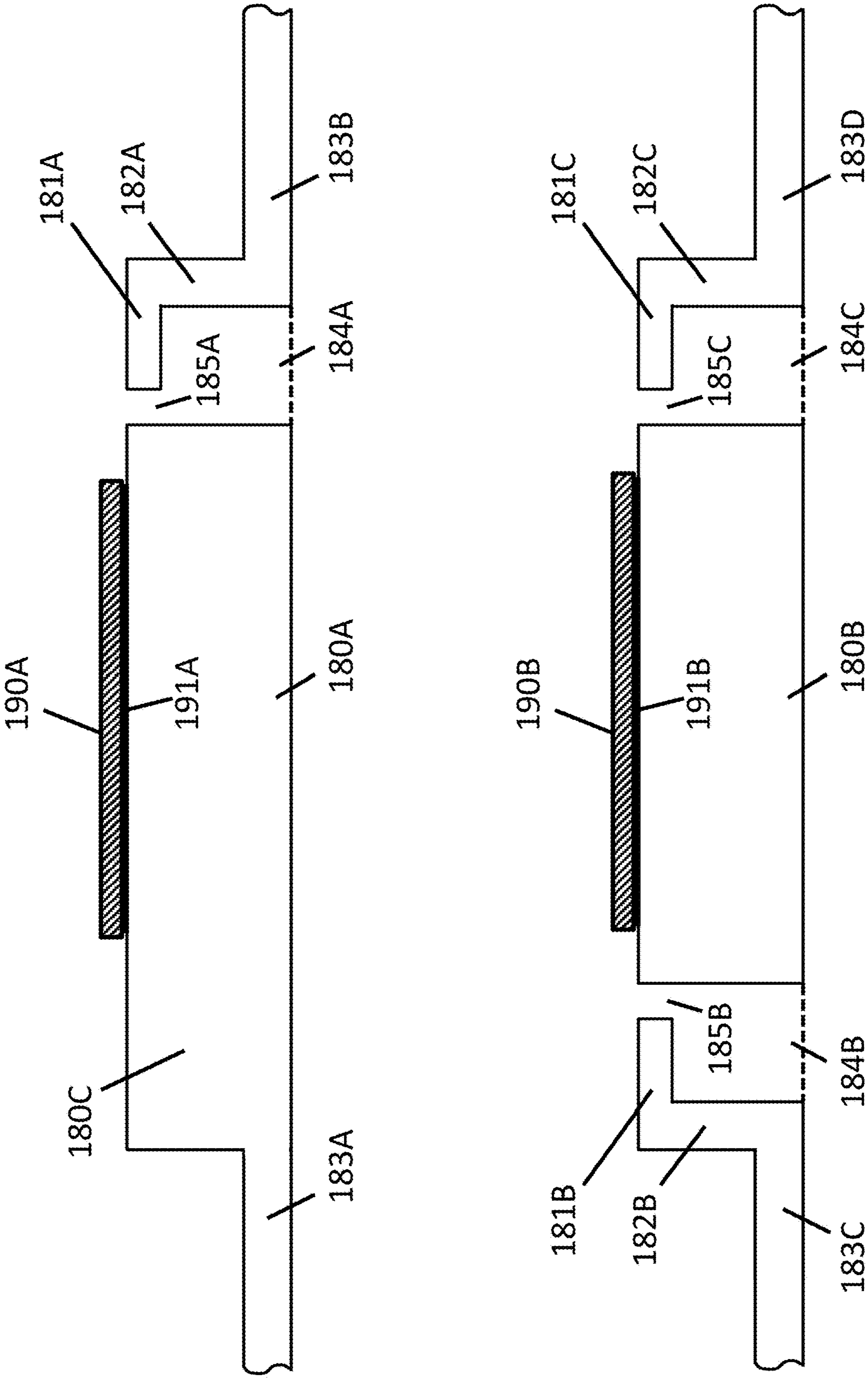
FIG. 14E is a cross sectional view of USMP footed package fabrication illustrating leadframe after die attach.

In FIG. 14E, semiconductor die 190A, comprising a power device or power IC is attached to die pad 180A by conductive epoxy or solder 191A while semiconductor die 190B comprising an IC is attached to die pad 180B through conductive or non-conductive epoxy layer 191B. Unless a device conducts current vertically through the backside of a semiconductor die, it is undesirable to employ solder as a die attach material because the semiconductor die requires backside metal applied to the wafer's backside during fabrication after thinning, adding unnecessary extra cost and complexity into the semiconductor fabrication process.

Figure 14F:
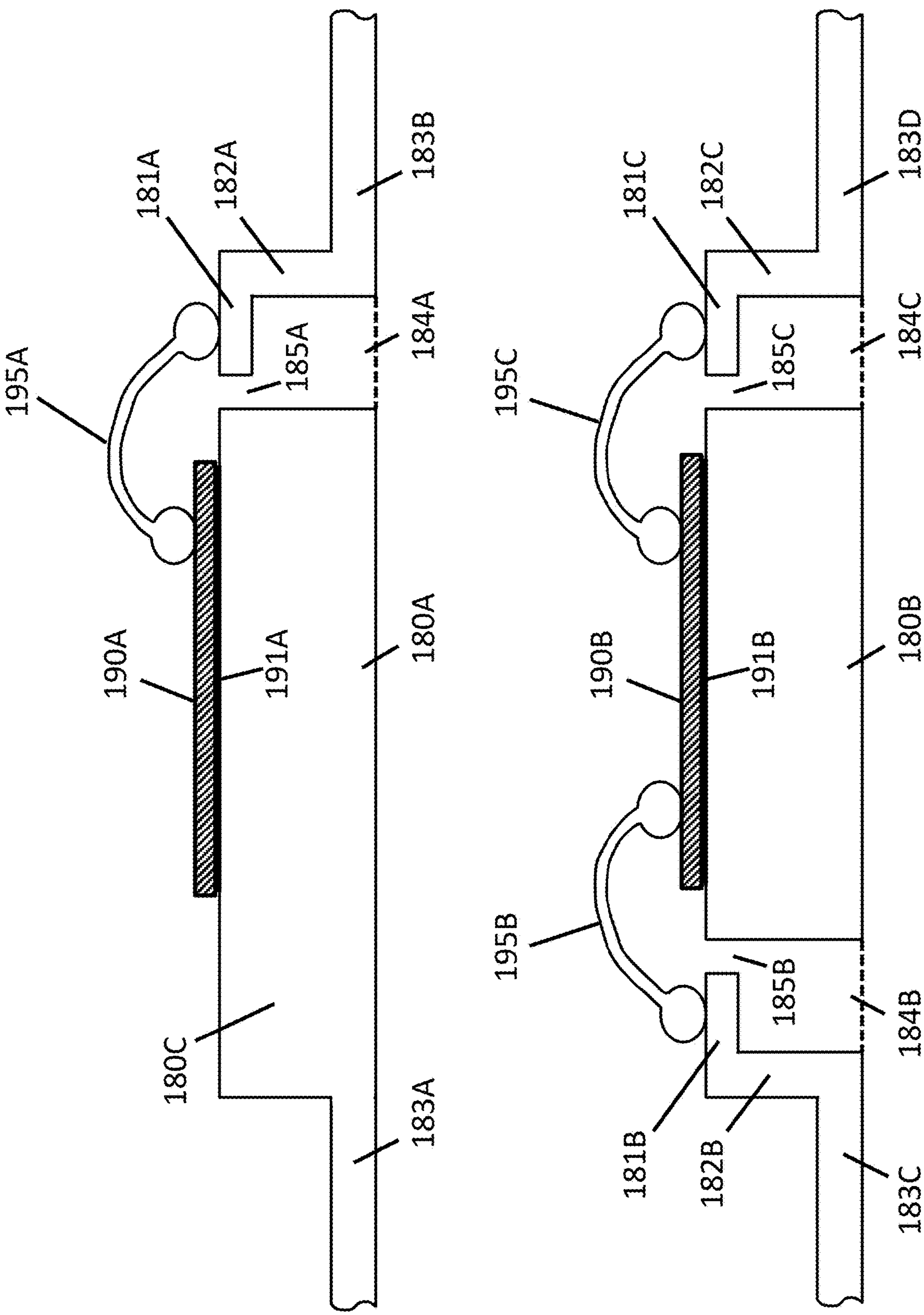
FIG. 14F is a cross sectional view of USMP footed package fabrication illustrating leadframe after wire bonding.

In FIG. 14F, bond wire 195A connects semiconductor die 190A to cantilever 181A; bond wire 195B connects semiconductor die 190B to cantilever 181B, while bond wire 195C connects semiconductor die 190B to cantilever 181C. Other bond wires connect to other conductive leads and feet but are not visible in this particular cross section. While, as shown, more than one bond wire may be attached to the same surface of a semiconductor, the electrical potential, signal or electrode contacted by the bond wire may be the same or may be distinct and different. In the case of power devices conducting very high currents, bond wires may be replaced by a copper clip lead as described previously.

Figure 14G:
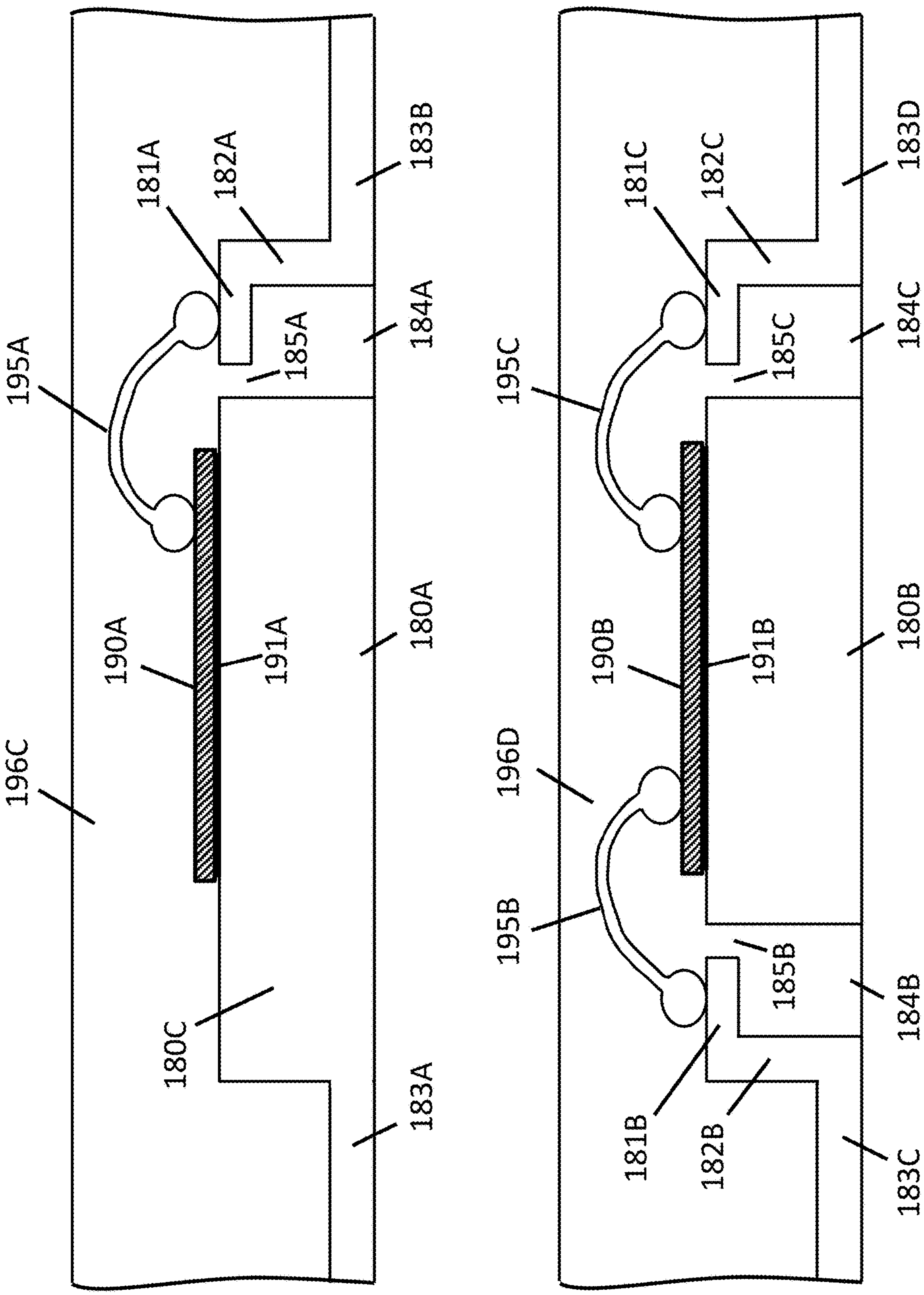
FIG. 14G is a cross sectional view of USMP footed package fabrication illustrating leadframe after molding.

In FIG. 14G, the leadframe is molded with plastic 196A and 196B. Depending on the mold cavity tool, the plastic may be molded around each separate die or preferably using one to five large blocks of plastic containing more than one product per block. Depending on the product's die and package size, the number of products fabricated from one common block mold could range from a few units to thousands. In a block mold the plastic covers the entire block including the street and die edges atop feet 18A, 183V, 183C and 183D as well as filling backside cavities 184A, 184B, and 184C and gaps 185A, 185B, and 185C. The thickness of the plastic must also be sufficiently thick to fully cover and encapsulate any bond wires 195A, 195B and 195C or any copper clip leads.

Figure 14H:
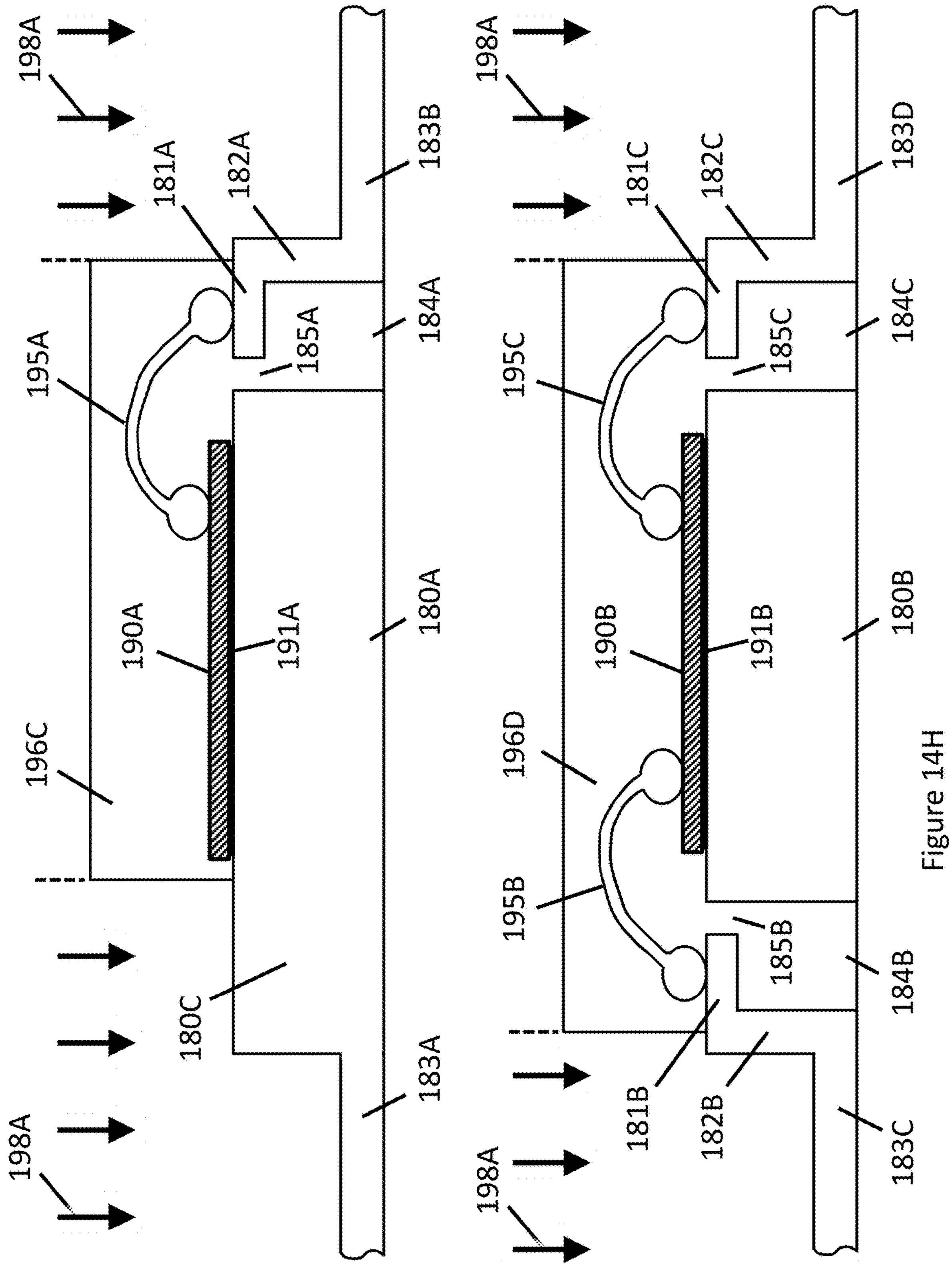
FIG. 14H is a cross sectional view of USMP footed package fabrication illustrating leadframe after laser plastic removal.

In the step of laser plastic removal shown in FIG. 14H, laser beam 198A is scanned to selectively remove portions of plastic 196A and 196B. In the case of a footed power package shown in the upper illustration, the plastic is removed over metal sections atop feet 183A and 183B, over a portion of die pad 180A herein referred to as heat tab 180C, and exposing a small portion of vertical column 182A. In the case of a leadless or footed IC package shown in the lower illustration, the plastic is removed over metal sections atop feet 183A and 183B, the removal area extending onto and exposing a small portion of vertical columns 182B and 182C.

In the case of laser plastic removal on a block mold, the laser and not the mold cavity tool define the lateral dimensions of the package plastic. For example, using different leadframes, a single block mold can be used to fabricate a range of products comprising IC packages at 2×2 mm, 3×3 mm, 6×6 mm, 2×3 mm, 3×5 mm or any package shape with leads on two or more sides, or to produce discrete transistor and power packages such as the SOT23, DPAK, and D2PAK. Alternatively, if a product specific mold is employed, the step of laser plastic removal can be skipped or used to augment the design after molding for purposes of package customization. Provided that the thickness of the plastic thickness 196C and 196D the same laser settings can be used for fabricating both IC and power packages. If, however, the power device has thicker plastic than the IC package, then the power setting for laser plastic removal of the power package must be increased accordingly.

Figure 14I:
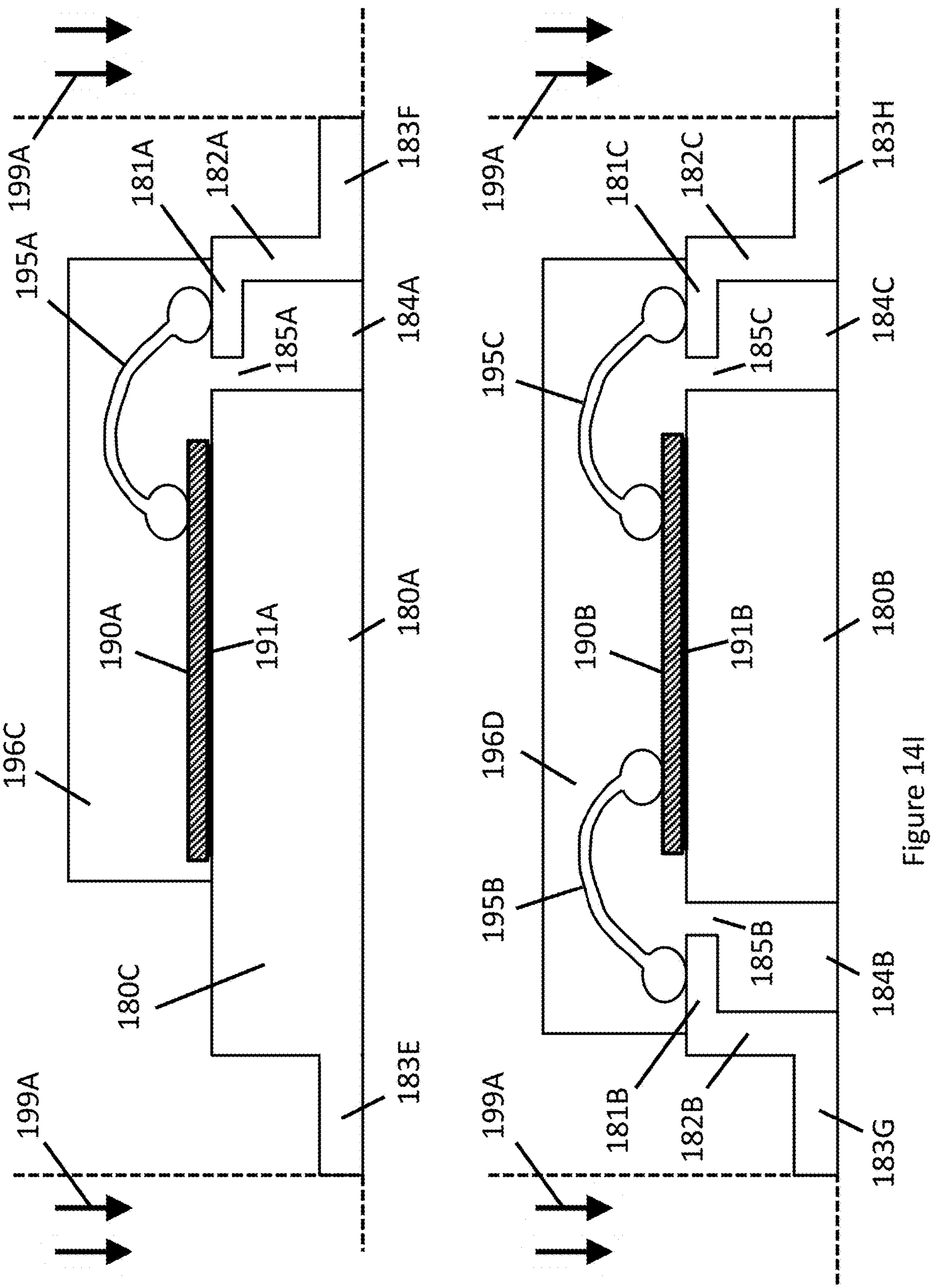
FIG. 14I is a cross sectional view of USMP footed package fabrication illustrating leadframe after laser singulation and foot formation.

Finally, as shown in FIG. 14I, in the step of laser lead definition and singulation, laser beam 199A is used to remove metal feet 183A, 183B, 183C and 183D from the street and to form wave-solder compatible feet of controlled lateral length and shape. For example, in the footed power package in the upper illustration, the length of foot 183F and others (not shown) is defined by laser beam 199A. Also foot 183E extending from heat tab 180C is defined by the same laser beam 199A. Similarly in the IC package shown in the lower illustration as a footed package, laser beam 199A is used to remove all metal from the street and to define the length of feet 183G and 183H. Alternatively, if a mechanical saw or punch is employed, the laser lead definition and singulation can be eliminated by its mechanical equivalent. While compatible with the USMP process flow, mechanical solutions are inferior since they result in die stress leading to plastic cracking and residue, i.e. plastic flash that must be etched off. Mechanical solutions are also subject to mechanical wear, resulting in variability in the foot length.

Provided that the thickness of feet 183E and 183F is the same as the thickness of feet 183G and 183H, the same laser settings can be used for fabricating both IC and power packages. If, however, the power device has thicker metal feet than the IC package, then the power setting for the laser cutting of the metal feet in the power package must be increased accordingly.

Using lasers offers significant advantages over today's conventional mechanical methods because it enables footed and leadless packages to be fabricated in the same manufacturing line. In the universal surface mount package flow as described, a leaded or leadless package is determined by the relative position of the lasers for plastic removal and metal definition. For example if the width of the cut made by laser beam 199A is smaller than the width of the cut made by laser beam 198A, then a footed package will result whereby metal feet extend laterally beyond the plastic edge. If, however, the edges of the respective cuts made by laser beams 198A and 199A are aligned, the plastic and metal will exhibit a vertically aligned flush sidewall with no metal protrusions.

Figure 14J:
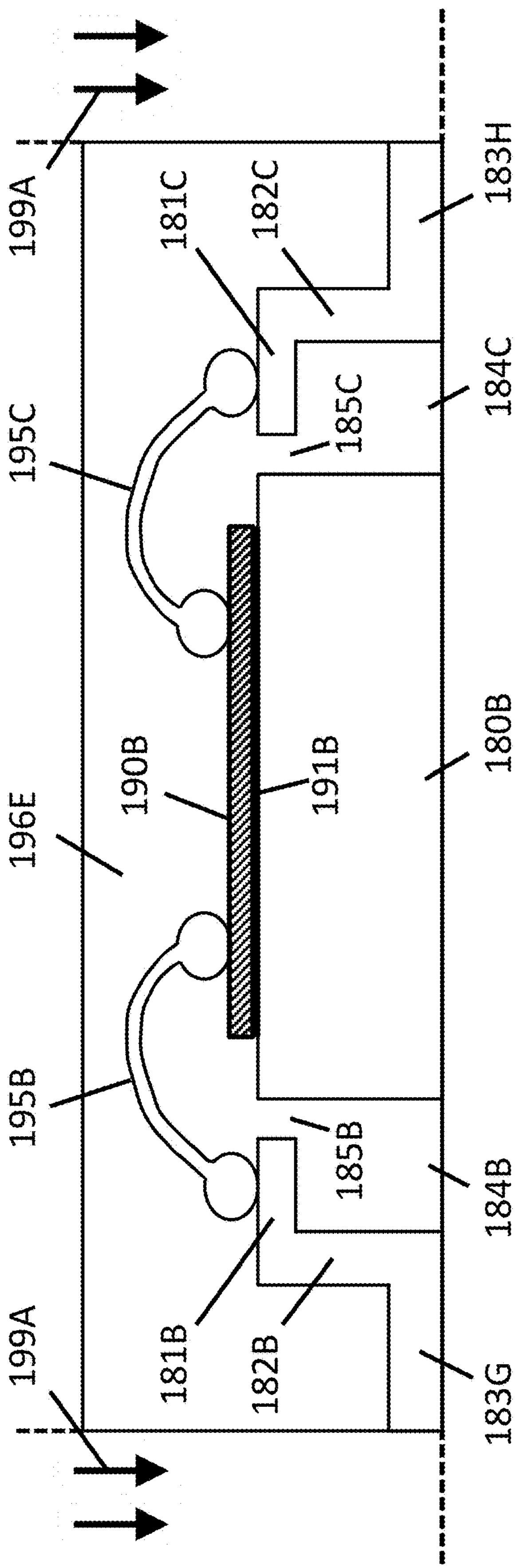
FIG. 14J is a cross sectional view illustrating how the footed package can be converted into a leadless package.

In this manner, the lower illustration shown in FIG. 14I can be converted from a footed package into a leadless package simply by changing the scanning locations of laser beams 198A and 199A, as shown in FIG. 14J.

USMP Packages

The universal surface mount package technology and process disclosed herein facilitates a flexible and diverse range of package types comprising both leadless and footed packages including footed IC packages, footed power IC packages, and footed discrete power packages. Footed USMP IC packages and footed USMP power IC packages share the common feature of having multiple electrical connections or "feet" but differ in the fact that the semiconductor die contained in an IC package normally comprises analog, digital, memory, or microcontroller functions that generally do not carry high current or dissipate substantial amounts of power while power IC packages contain semiconductor dice that do.

Power IC semiconductor dice include analog and/or digital control circuitry combined with arrays of one or more high-voltage or high-current switches, voltage regulators, switching power supplies, current limiters, motor drivers, solenoid drivers, lamp and LED drivers, and other interface products. While in some cases, the footed USMP IC packages may be used for both power and non-power applications, in other cases, power IC specific USMP packages may also be realized by any of a variety of techniques including:

- Increasing the heat sinking and heat spreading capability of the USMP package by using thicker leadframes, exposed die pads, and heat tabs soldered to a PCB
- Reducing on-resistance by eliminating bond wires using clip leads or flip-chip assembly methods
- Reducing thermal resistance by die thinning and conductive epoxy die attach Discrete power devices require the same low thermal and electrical resistance as power ICs and employ the same techniques as described above, except the power discrete devices generally conduct higher currents and lower electrical resistances than their power IC counterparts, achieved using clip leads, larger diameter bond wires, or a greater number of bond wires. Discrete transistor and power packages generally require 2 to 7 electrical connections, with three connections being the most broadly applicable, i.e. with a low current gate or input signal, a high current source or cathode connection connected through bond wires or clip leads, and a drain or anode connection made through the electrically conductive die pad that also serves as a heat sink.

In addition to manufacturing footed and leadless packages, the USMP process and technology disclosed herein is also capable of fabricating leaded packages either for thru-hole or surface mount assembly. The major difference between a footed package and a leaded package fabricated with the USMP process is best illustrated through cross sectional views of various types of USMP packages. The cross sections shown in FIG. 15A through FIG. 15F represent a cutline from any package edge having leads, feet or connections, through the package to the opposing edge.

Figure 15A:
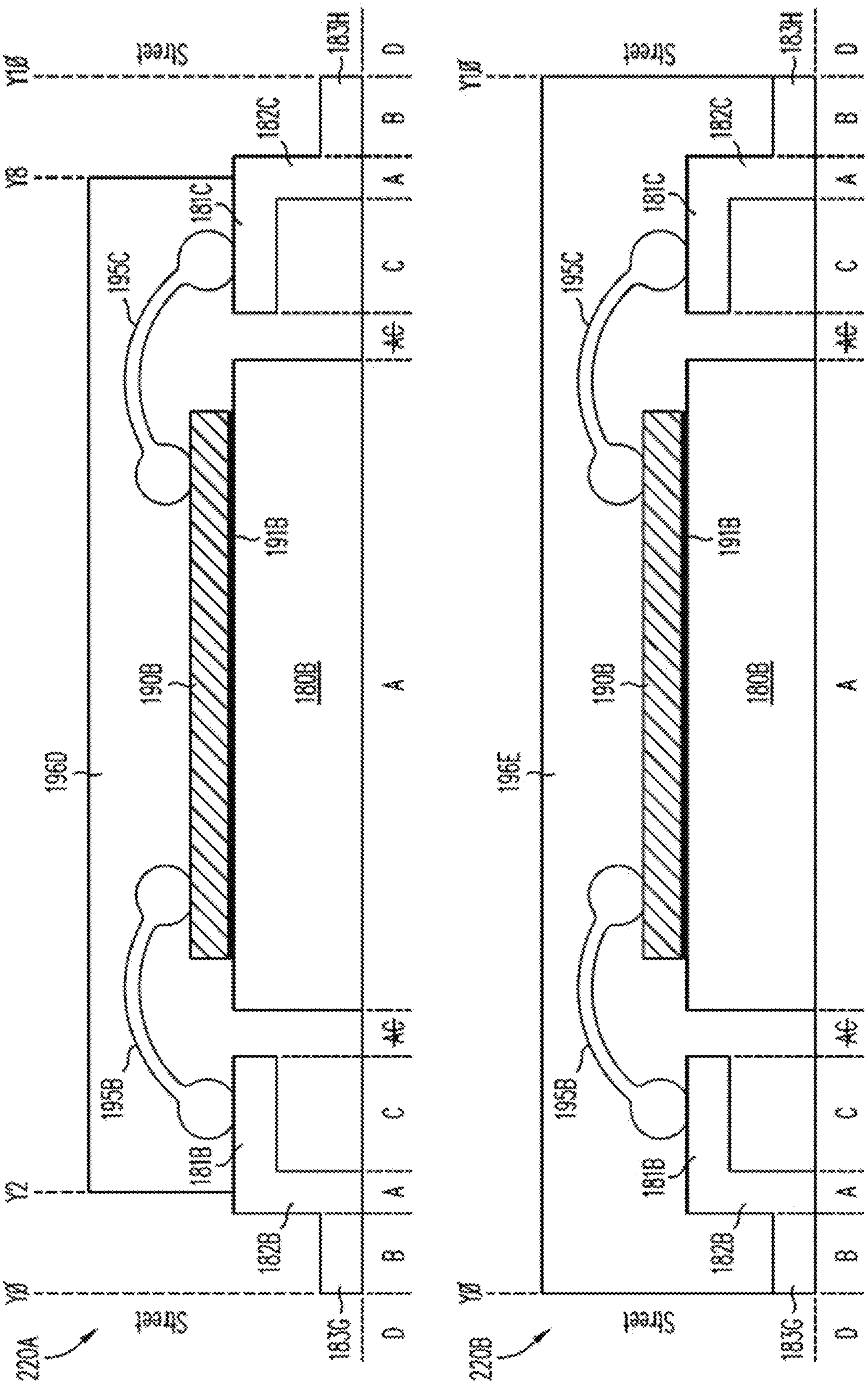
FIG. 15A is a cross sectional view of USMP packages contrasting footed and leadless package types.

FIG. 15A contrasts a footed and leadless USMP fabricated package, each having a lateral length on a PCB extending from Y0 to Y10. Footed package 220A and leadless package 220B include conductive feet 183G and 183H comprising segments B, vertical columns 182B and 182C comprising segments A, cantilevers 181B and 181C comprising segments C, exposed die pad 180B comprising segment A, and an intervening gap between segment A and segments C. Semiconductor die 190B sits atop exposed die pad 180B, attached by intervening die attach 191B. Bond wire 195B electrically attaches to an electrode on a portion of the surface of semiconductor die 190B and connects through cantilever 181B to foot 183G. Bond wire 195C electrically attaches to another electrode on a portion of the surface of semiconductor die 190B and connects through cantilever 181C to foot 183H.

The bottoms of segments A and B are intrinsically coplanar being constructed from a common piece of copper. The tops of segments A and C are intrinsically coplanar being constructed from a common piece of copper. Outside of the die in the street, i.e. laterally at locations below Y0 or beyond Y10, segment D is clear of all plastic and metal. In leadless package 220B, laser-defined plastic 196E extends laterally from street to street, i.e. from Y0 to Y10. In the case of footed package 220A, plastic 196D does not cover the package from street-to-street, but instead extends laterally from Y2 to Y8 atop vertical columns 182B and 182C, with only a portion of the vertical columns being visible beyond the edges of plastic 196D. Plastic 196D and 196E both extend vertically from the bottom edge of the plastic to an upper surface covering bond wires 195B and 195C. In manufacturing, both footed package 220A and leadless package 220B are fabricated identically except the laser used to remove the plastic defines the lateral extent of plastic 196D in footed package 220A between Y2 and Y8 while the lateral extent of plastic 196E in leadless package 220B remains undisturbed between Y0 and Y10.

Figure 15B:
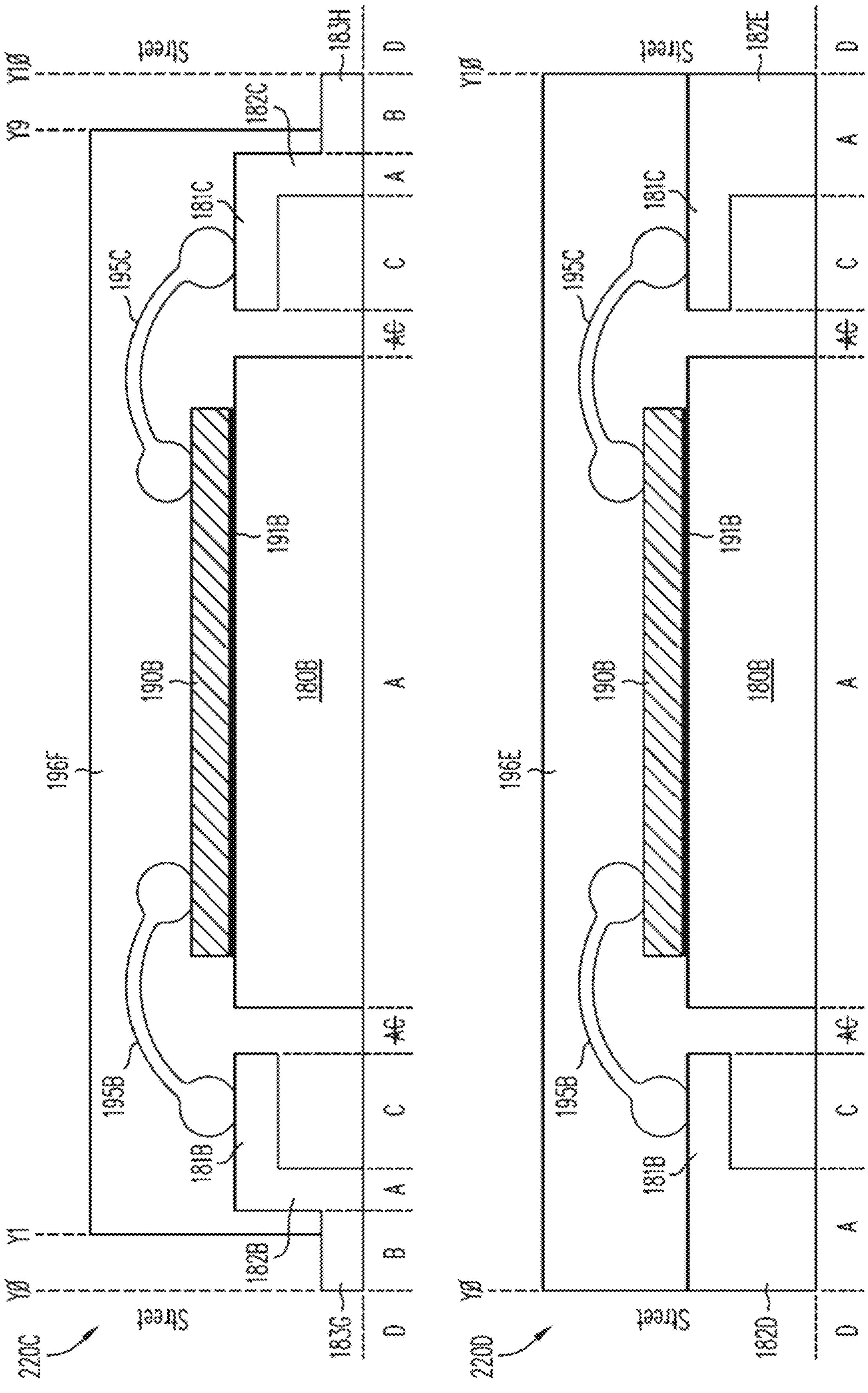
FIG. 15B is a cross sectional view of USMP packages contrasting alternate types of footed and leadless packages.

FIG. 15B illustrates two variants of leadless and footed USMP packages made in accordance with this invention. In footed package 220C, plastic 196F extends from Y1 to Y9 extending atop feet 183G and 183H and completely encapsulating vertical columns 182B and 182C. In leadless package 220D, the foot previously comprising segments B is replaced by vertical columns 182D and 182E comprising segments A.

Figure 15C:
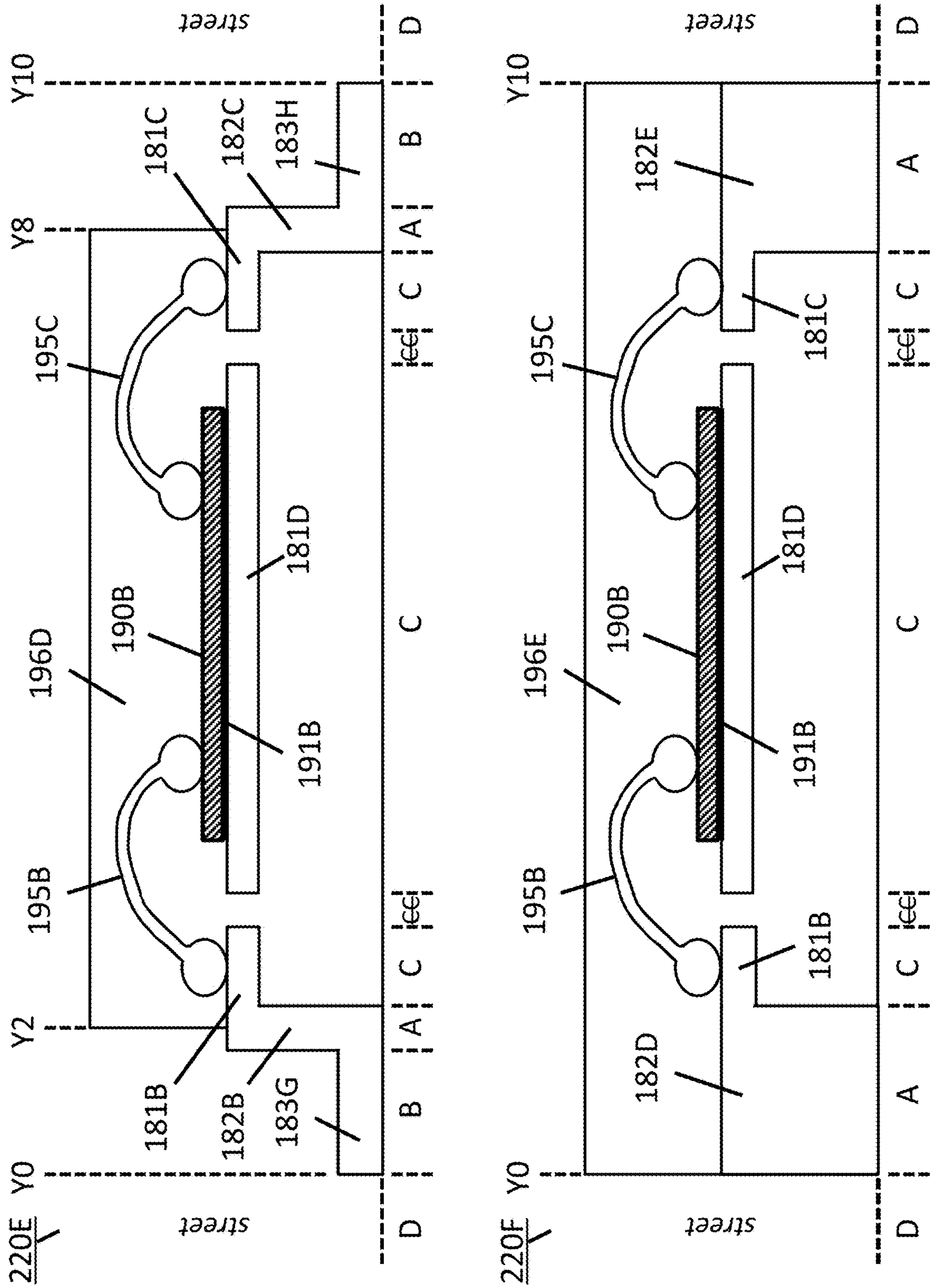
FIG. 15C is a cross sectional view of USMP packages contrasting footed and leadless package types but with isolated die pads.

FIG. 15C illustrates a footed USMP package 220E and a leadless package 220F comprising isolated die pads made in accordance with this invention, specifically where die pad 181D comprises segment C encapsulated on all sides by plastic 196D or 196E.

Figure 15D:
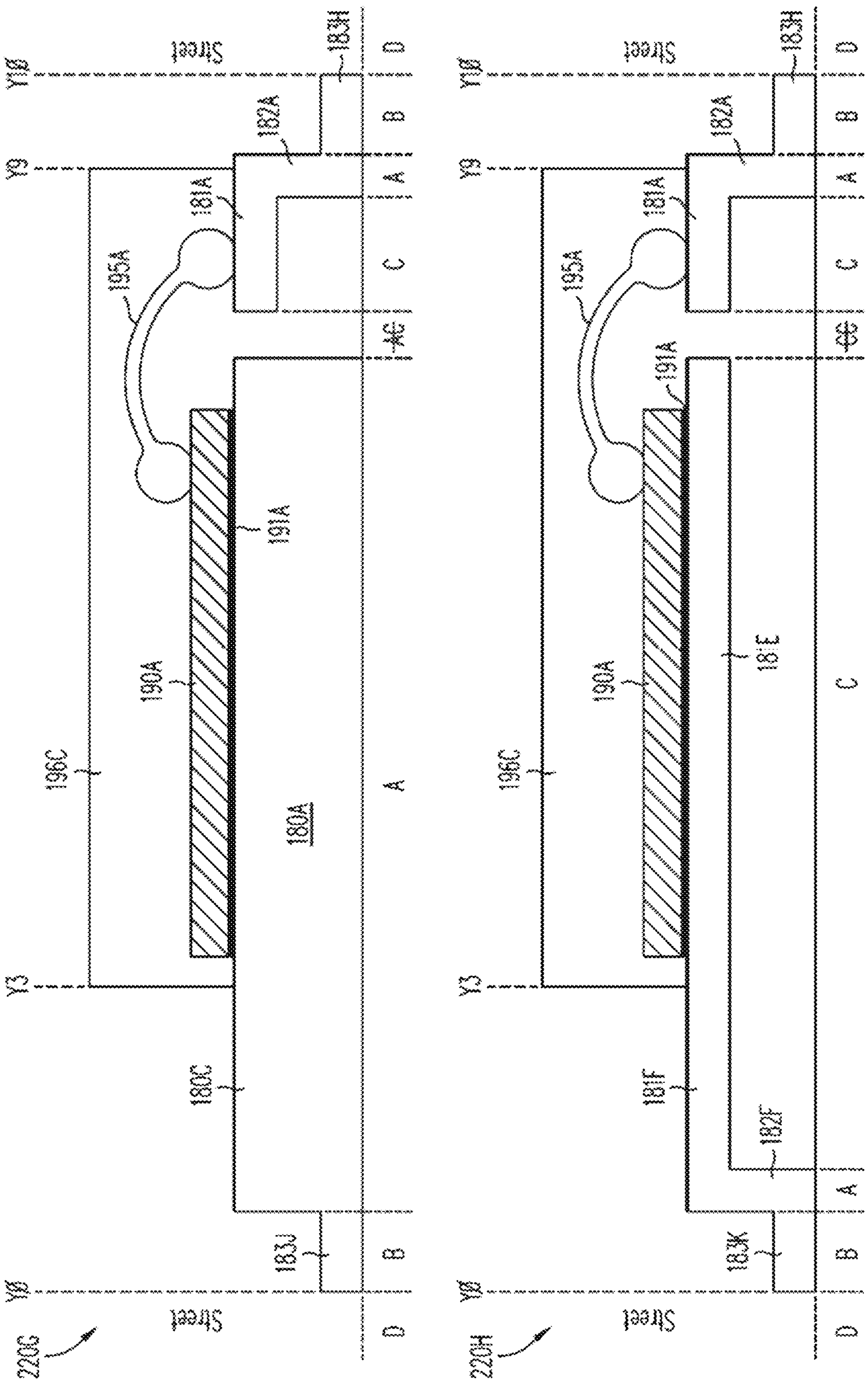
FIG. 15D is a cross sectional view contrasting different types of leaded USMP power packages.

FIG. 15D illustrates two variants of power USMP packages made in accordance with this invention. In footed power package 220G, a semiconductor die 190A comprises a power device mounted atop an exposed die pad 180A encapsulated by plastic 196C, with a conductive die attach 191A. Bond wire 195A electrically connects surface metallization of semiconductor die 190A to cantilever 181A and through vertical column 182A to foot 183H. Exposed die pad 180A and heat tab 180C, along with foot 183J, provide both electrical and thermal conduction. Plastic 196C extends laterally from Y3 to Y9, with plastic between Y0 and Y3 removed from heat tab 180C to improve convective cooling.

Also shown in FIG. 15D, power package 220H includes semiconductor die 190A mounted atop an isolated die pad 181E in segment C and encapsulated by plastic 196C. Thermal energy flows laterally through isolated die pad 181E to exposed die pad 181F and through vertical column 182F into foot 183H. In this manner heat is removed by convection from the surface of heat tab 181F and by thermal conduction into the PCB through foot 183K.

Figure 15E:
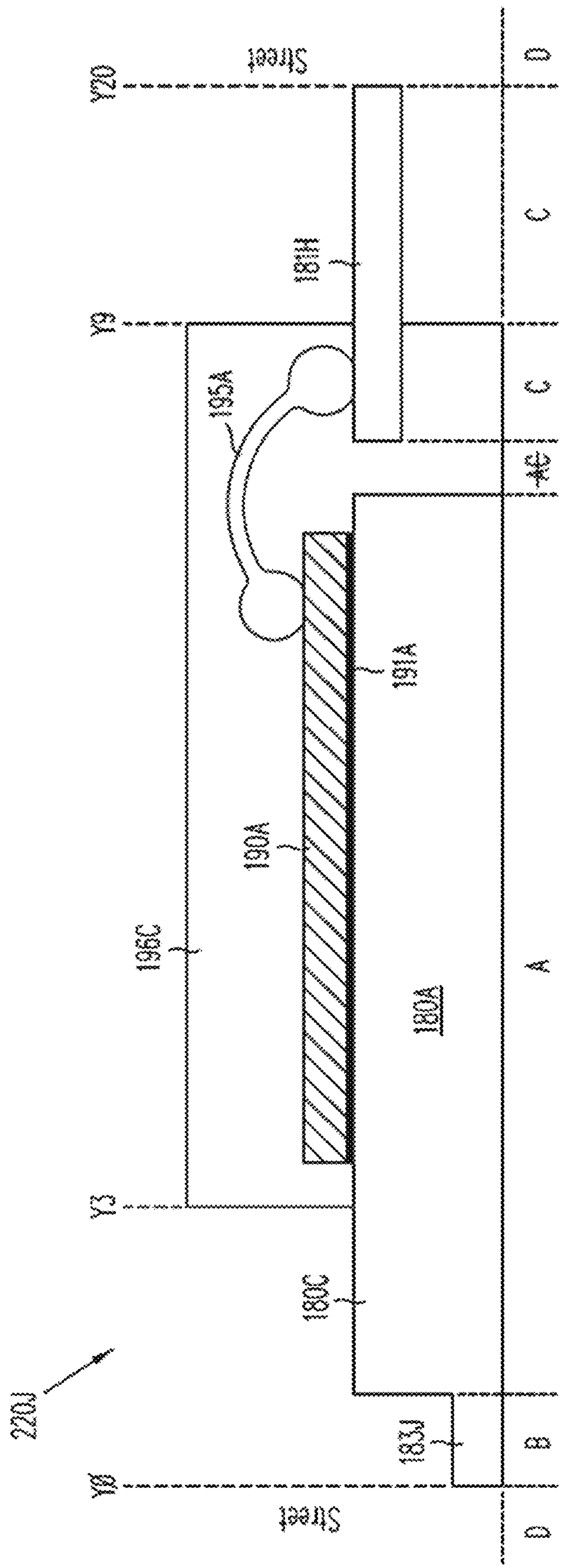
FIG. 15E is a cross sectional view of a leaded power package fabricated using the USMP process.

Although the USMP process disclosed herein is capable of fabricating surface mount packages with intrinsically coplanar die pad and feet, the process is also capable of producing leaded packages for either thru-hole or surface mount PCB assembly. In such packages the cantilever segment C facilitates a lead protruding from the center of the plastic and not coplanar with the backside of an exposed die pad. FIG. 15E illustrates one implementation of a leaded package where cantilever 181H protrudes from plastic 196C for an extended length from Y9 to Y20. In the process of fabricating package 220J, the backside mask layer has an opening that extends throughout section C whereas the topside mask layer extends throughout section C, the result being that the metal sheet is etched only from the backside in section C. As a result, the bottom of cantilever 181H is not coplanar with the bottom of die pad 180A, heat tab 180C, or heat tab foot 183J. In this way the USMP process can be employed to produce leaded packages such as the TO-220, but without requiring mechanical punching, eliminating all mechanical stress.

Figure 15F:
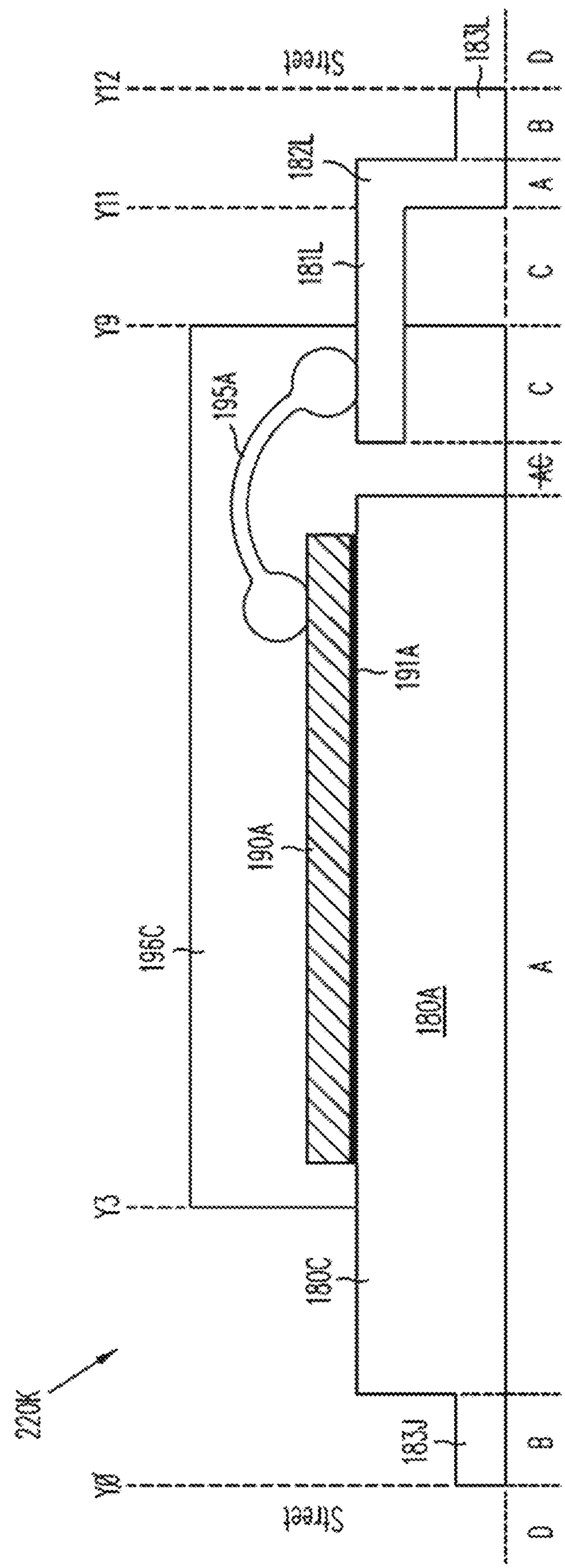
FIG. 15F is a cross sectional view of a leaded surface mount power package fabricated using the USMP process as a gull wing package replacement.

The USMP process can also be used to replace gull wing packages while completely eliminating the need for imprecise mechanical lead bending. An example of a USMP replacement of a gull wing power package 220K is shown in FIG. 15F, where cantilever 181L extends beyond plastic 196C from Y9 to Y11. Beyond Y11, vertical column 180L comprising segment A connects to a foot 183L extending to Y12. Unlike conventional gull wing packages, the length of cantilever from Y9 to Y11 is not constrained by the need to secure a clamp for mechanical lead bending. Moreover, the bottom surface of foot 183L is intrinsically coplanar with the bottom of die pad 108A and foot 183J because they are constructed from the same piece of copper without any mechanical bending or punching. No conventional lead bending process can guarantee coplanarity. While in the embodiment shown a heat tab 180C is located on one edge of the package and lead 181L on the other side, leads may be present on two, three, or four sides of the package, with our without the heat tab as desired.

Figure 16:
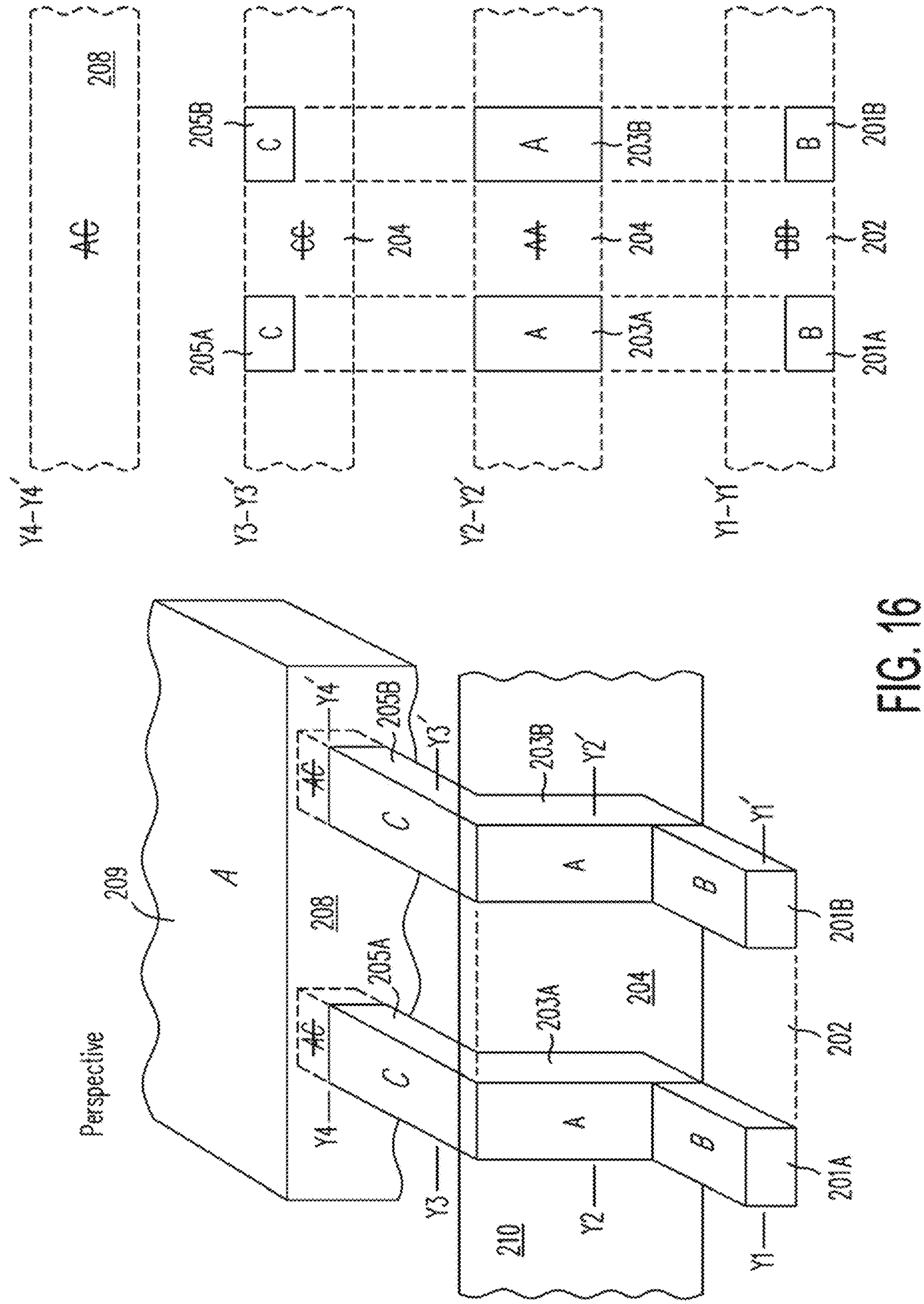
FIG. 16 is a perspective view of lead construction of footed packages fabricated using the USMP process.

The cross sections shown in the prior illustrations represent cross-sectional views taken at cutlines through and in parallel to conductive leads. FIG. 16 illustrates cross-section views taken at several cutlines parallel to the package sides and perpendicular to the conductive leads. The perspective drawing illustrates the locations of the various cross sections shown, where die pad 209 is spaced apart from cantilevers 205A and 205B by a space 208 comprising gaps. Cantilevers 205A and 205B comprising segments C connect to vertical columns 203A and 203B comprising segments A which in turn connect to feet 201A and 201B, which are spaced apart laterally by air gap 202. Vertical surface 210 defines the lateral extent of the package's plastic, where everything in front of vertical surface 210 is exposed and everything behind it is encapsulated. Cross section Y1-Y1' illustrates the cutline through feet 201A and 201B separated by air gap 202. In the plane of vertical surface 210, cross section Y2-Y2' illustrates the cutline through vertical columns 203A and 203B separated by plastic 204 202. Behind the plane of vertical surface 210, cross section Y3-Y3' illustrates the cutline through cantilevers 205A and 205B separated by plastic 204. In gap 208 between the end of cantilever 205A or 205B and die pad 209, cross section Y4-Y4' illustrates only plastic 204 is present.

USMP Package Features

Using the USMP fabrication sequence disclosed herein a wide variety of packages types and diverse package features can be fabricated. While the internal construction of USMP packages may vary, the external package features relevant to PCB assembly fabricated by the USMP process can be identified and grouped into several large taxonomies, namely

- Footed surface mount packages with exposed sidewalls
- Footed surface mount packages with non-exposed sidewalls
- Leadless surface mount packages
- Leaded through hole packages with straight leads
- Leaded surface mount (i.e. gull wing) packages (without lead bending)
- Heat tab power surface mountable packages
- Combinations of the above While the above leaded packages may also utilize lead bending and forming steps to fabricate conventional gull wing shaped leads there is no benefit to do so, as the various USMP options described above are superior to mechanically bent leads both in performance and in manufacturability.

Figure 17A:
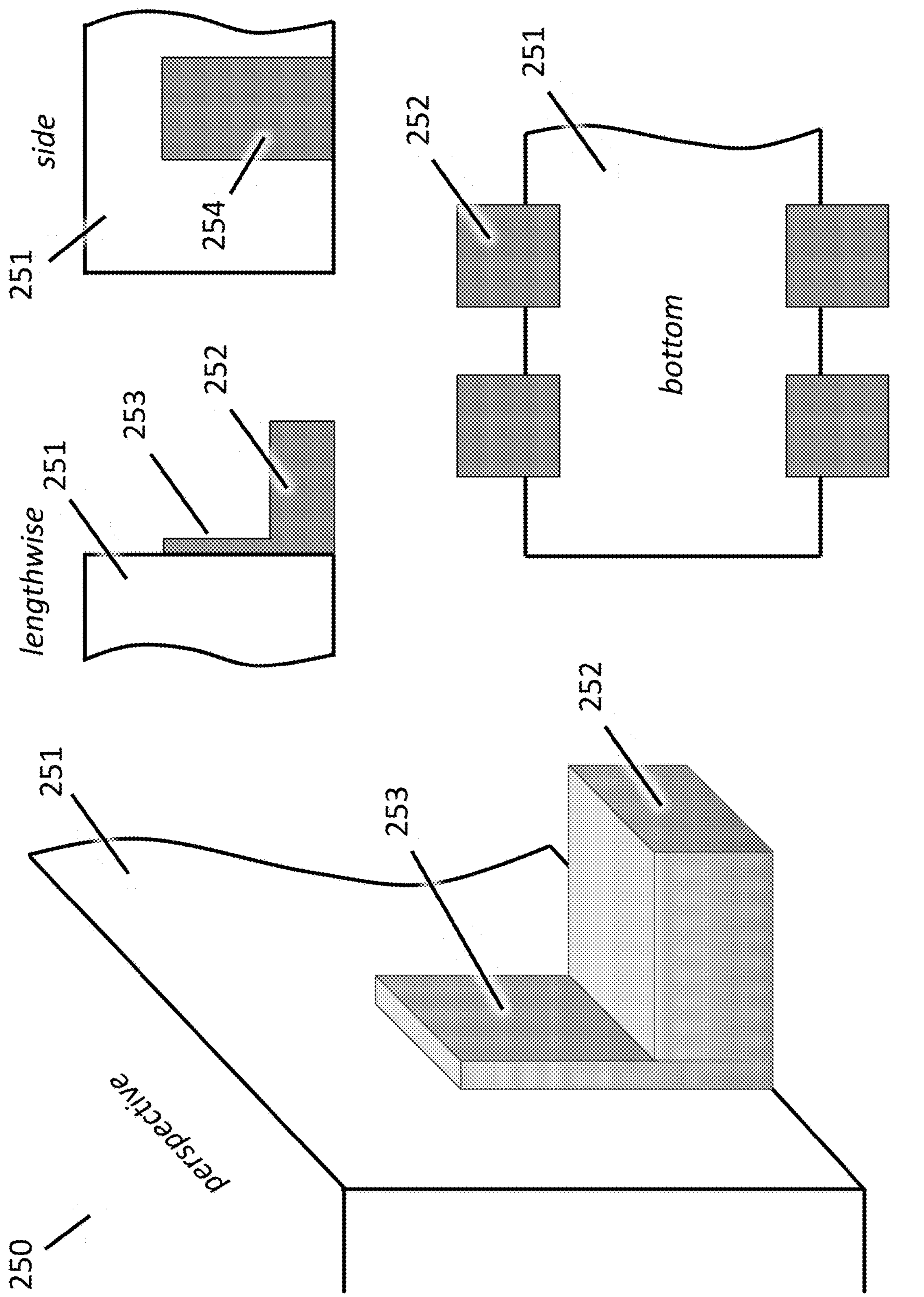
FIG. 17A comprises multiple views of a footed USMP package.

FIG. 17A illustrates perspective, lengthwise, side, and bottom views of a footed surface mount package with exposed sidewalls. In perspective drawing 250, plastic package 251 includes at least one conductive foot 252 protruding from the package body coplanar with the bottom of the package. This foot, comprising copper plated with a solderable metal such as tin, silver, palladium, nickel, etc. is used for soldering the package to a PCB and is compatible with both wave-soldering and solder reflow assembly.

In wave-solder assembly of a footed package, solder is applied from above after the package is affixed or glued to the PCB. The solder, in molten form coats the package and PCB but adheres only to the metal surfaces, i.e. to the exposed foot 252 and possibly also to the exposed sidewall 253. In wave-solder assembly, no solder is applied beneath foot 252 prior to the component's placement. The resulting solder is easily verifiable using automatic optical inspection methods to confirm a proper solder attachment has been achieved.

The footed package shown in FIG. 17A is also compatible with solder reflow assembly processes. In solder reflow assembly, solder is coated onto the PCB prior to component placement and melted into place. The package is then placed atop the hardened solder and held in place on the PCB using glue or mechanical support while the PCB is fed through a furnace or oven, typically on a slow moving conveyor belt. The oven's temperature is chosen to be sufficiently high to re-melt the solder on the PCB as the PCB passes through it. The melted solder then flows in liquid form adhering to the package's conductive 252 foot and possibly wetting onto the sides of the foot by the action of surface tension. Because the solder, melted onto the PCB before component placement, melts a second time, the process is referred to as a solder "reflow" assembly process. Reflow PCB assembly is slower and involves more expensive production equipment than wave-solder assembly. Generally wave-solder assembly requires x-ray inspection to confirm soldering quality.

The footed USMP package is unique in that it is both wave-solder and solder reflow compatible. Specifically the package is wave-solder compatible because the solder easily flows onto foot 253 and partially onto vertical sidewall 253. As shown in the bottom view however, it is evident that feet 252 comprise a conductor larger than that protruding beyond plastic 251. This large metal pad exposed on the package's underside, having a total metal area equal to or greater than today's leadless packages such as the QFN or DFN, provides sufficient area for reliable solder reflow attachment. With proper PCB design, solder during reflow can also redistribute itself via surface tension up onto the top and sides of foot 252, facilitating optical inspection even in solder-reflow assembly lines.

Figure 17B:
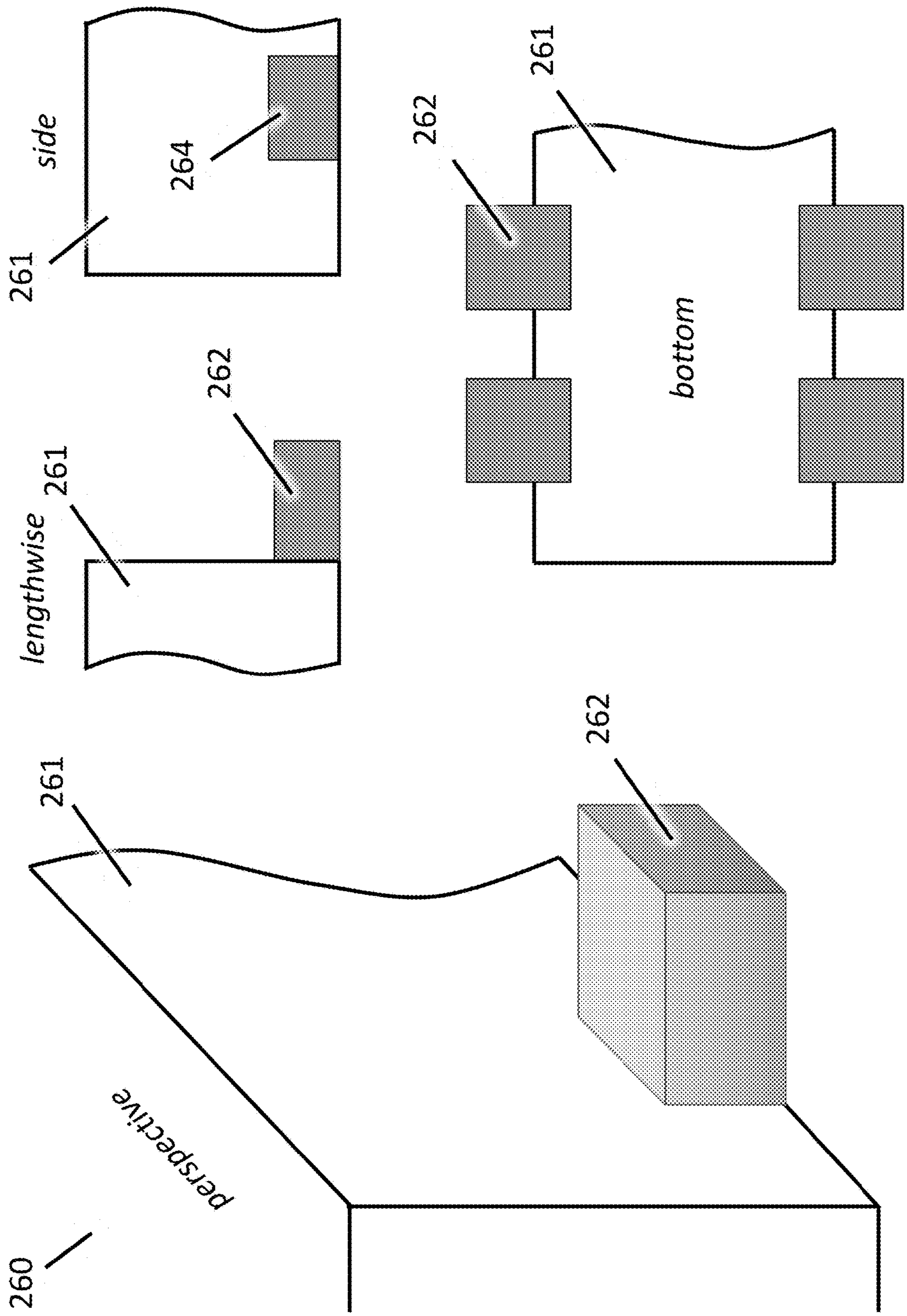
FIG. 17B comprises multiple views of an alternate embodiment of a footed USMP package.

FIG. 17B illustrates perspective, lengthwise, side, and bottom views of a footed surface mount package with non-exposed vertical sidewalls. In perspective drawing 260, plastic package 261 includes at least one conductive foot 262 protruding from the package body coplanar with the bottom of the package but does not include a metallic vertical sidewall for solder to wet onto. Like the previously described package, this variant of the footed package may be assembled onto a PCB using either wave-soldering or solder reflow.

Whether the vertical conductive sidewall is beneficial or not is a matter of preference for the particular PCB assembly house. Eliminating the vertical conductive sidewall may reduce the risk of unintended shorts between the package's feet and any exposed tie bars but with proper design rules, the risk can completely mitigated. The advantage of an exposed vertical sidewall is that it provides additional area for soldering and is easily confirmed by optical inspection, but proper processing of the foot-only package can reliably produce the same performance. So in essence, there is no difference between the two versions of the footed package. Throughout the remainder of the application the footed package illustrations will depict packages with exposed vertical sidewalls, but it should be understood that non-exposed sidewall version may be substituted as desired.

Figure 17C:
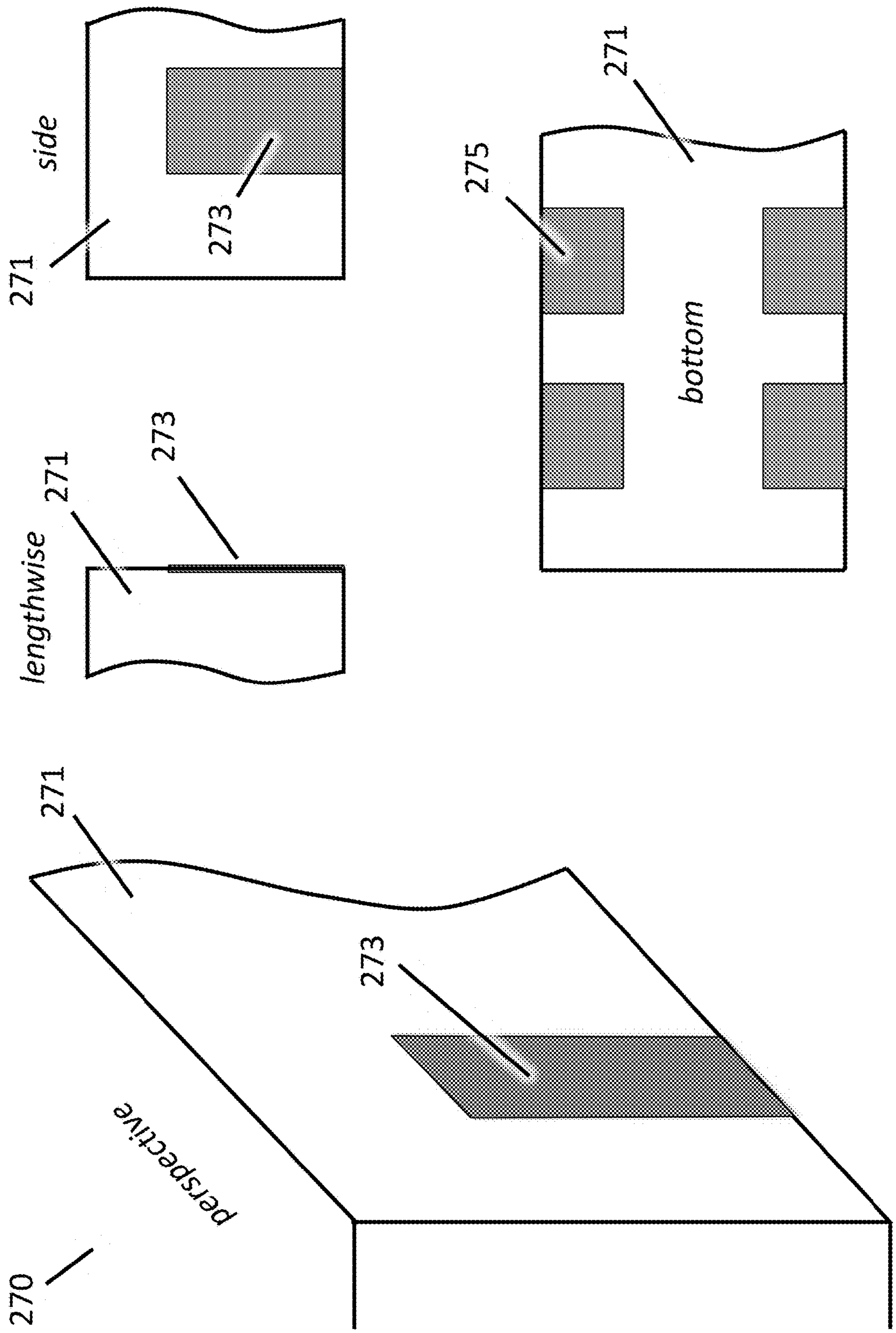
FIG. 17C comprises multiple views of a leadless package fabricated with the USMP process.

FIG. 17C illustrates perspective, lengthwise, side, and bottom views of a leadless surface mount package. In perspective drawing 270, plastic package 271 has no conductive foot or lead protruding from the package body and no metal for solder to reliably attach onto. The vertical conductive sidewall 273, while solderable is not adequate to insure solderability using wave-solder assembly. So unlike the previously described footed packages, this variant of the USMP package can only be assembled onto a PCB using solder reflow. The key point of this graphic is the USMP process is capable of making exact duplicates of existing leadless packages such as the QFN and DFN using the same USMP fabrication sequence capable of making wave-solderable footed packages and even capable of fabricating through-hole leaded packages, hence the package's moniker "universal".

Figure 17D:
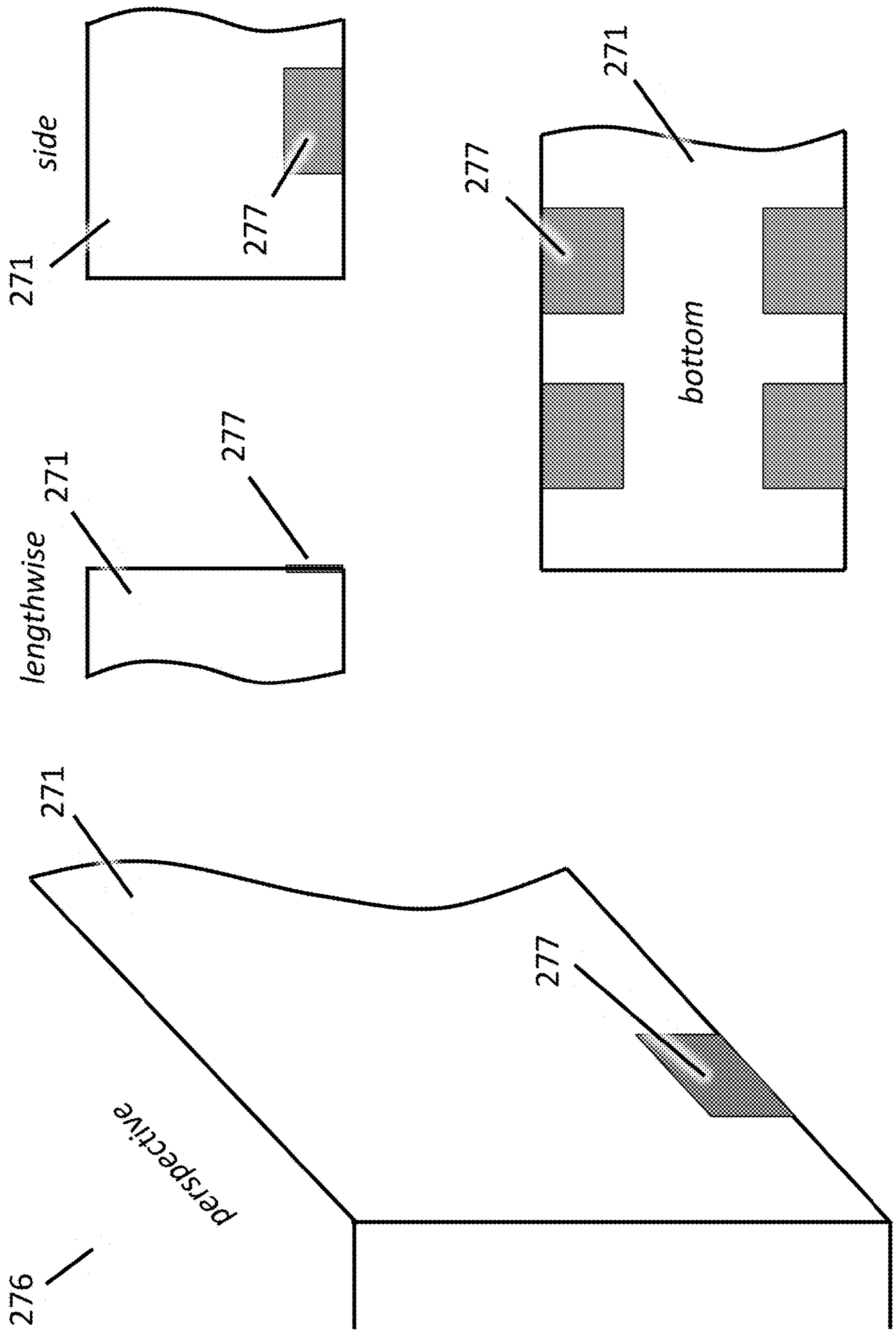
FIG. 17D comprises multiple views of an alternative embodiment of a leadless package fabricated with the USMP process.
Figure 17E:
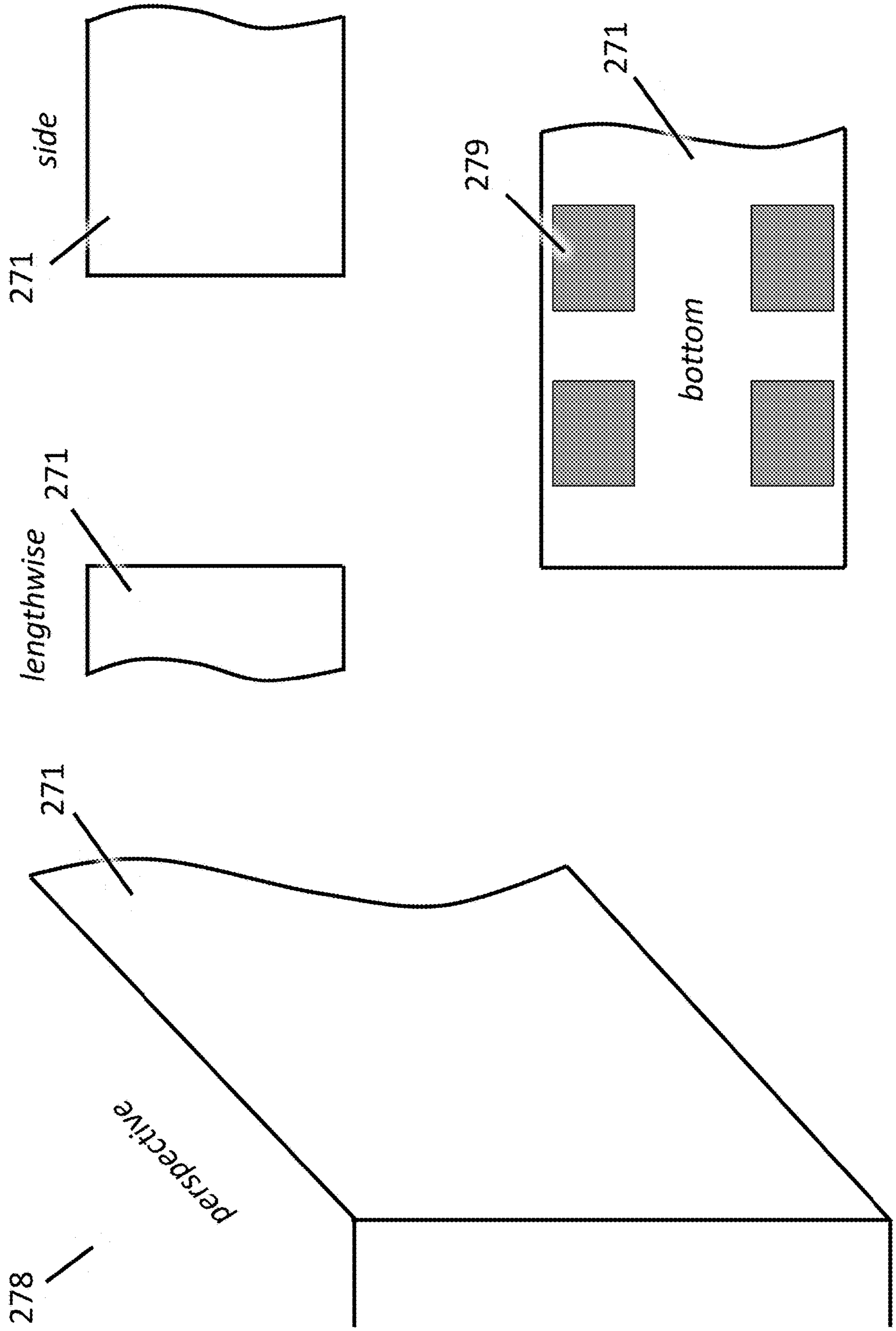
FIG. 17E comprises multiple views of another alternative embodiment of a leadless package fabricated with the USMP process.

A variation of the USMP fabricated leadless package is shown in perspective, lengthwise, side, and bottom views in FIG. 17D. In this version, shown in perspective drawing 276, the leadless landing pad comprises only a foot 277 rather than an entire conductive column so that the exposed vertical sidewall is replaced by the vertical sidewall of foot 277 contained entirely within the plastic 271 except for its sidewall and underside edges. The underside view of this variant is identical to that of feet 275 in the previous illustration. In another alternative embodiment shown in FIG. 17E, foot 279 is inset from plastic body 271 edge, and no metal appears on the package sidewall as depicted in perspective drawing 278.

Figure 18A:
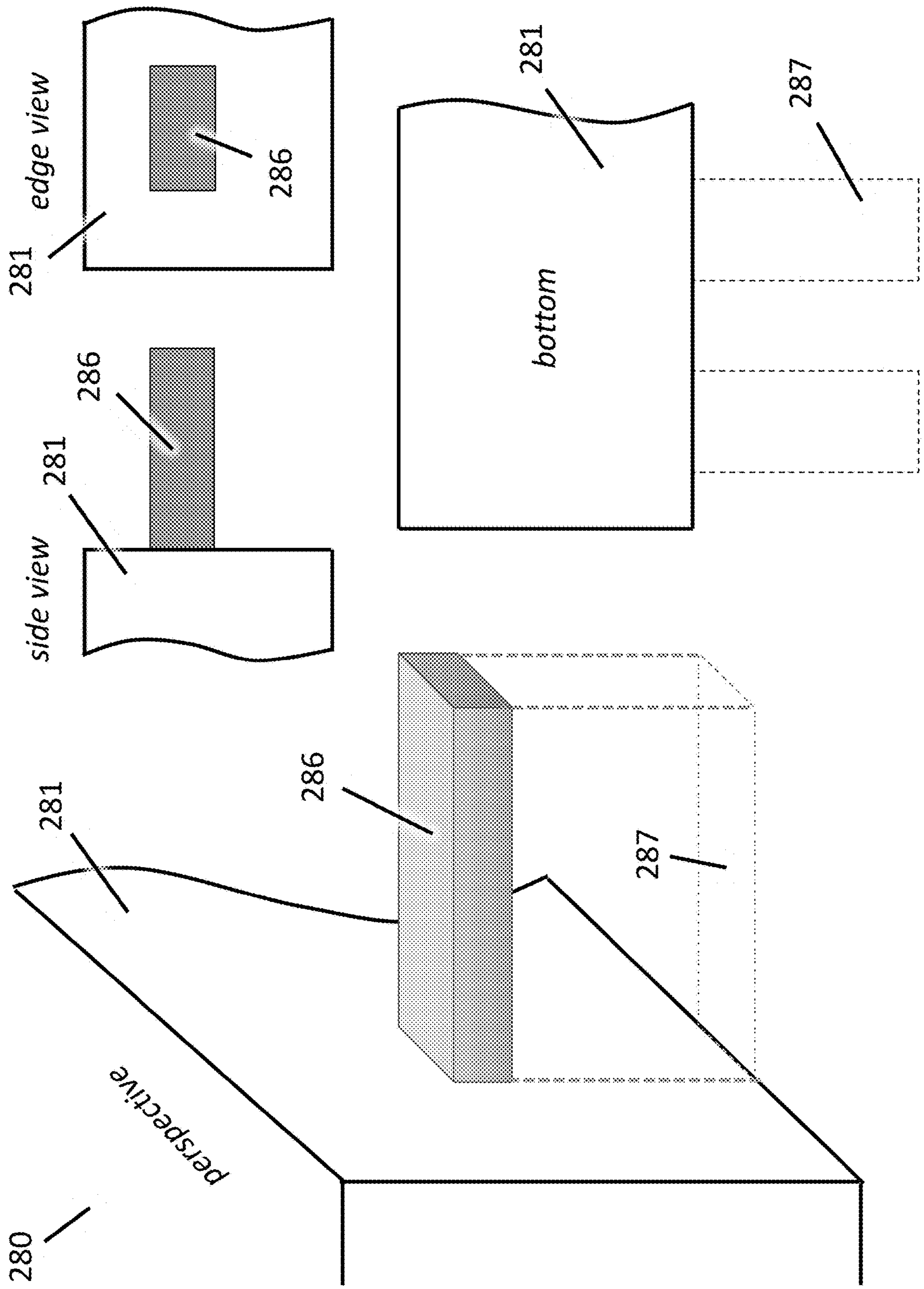
FIG. 18A comprises multiple views of a leaded package fabricated with the USMP process.

An example of a leaded package manufactured using the USMP process is illustrated in FIG. 18A including perspective, lengthwise, side, and bottom views. While the package is fabricated using the USMP process designed for making surface mount packages, the package shown in perspective view 280 is a leaded package designed for through-hole PCB assembly, not for surface mounting. As such lead 286 protrudes from package body 281, near the center of the plastic package's body and not coplanar with the bottom of the package. The shadow or optical "projection" 287 of lead 286 onto the plane defined by the bottom of plastic 281 is shown to clarify the three dimensional location of the lead.

Figure 18B:
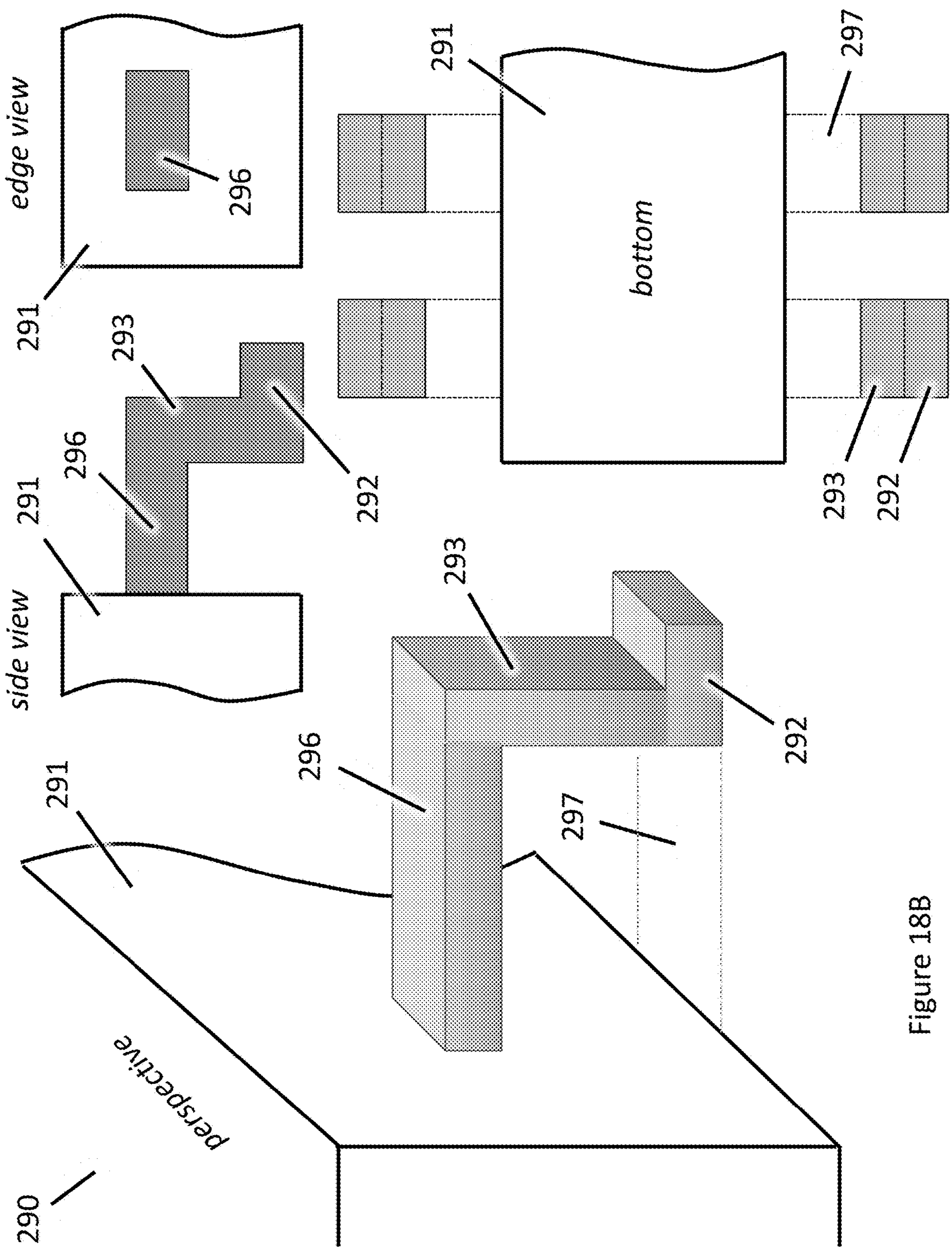
FIG. 18B comprises multiple views of a leaded surface mount package fabricated with the USMP process.

For completeness, the USMP process can be used to fabricate "leaded surface mount packages" similar in shape to gull wing packages but without any need for lead bending. This type of package is illustrated in the perspective drawing 290 of FIG. 18B comprising metal lead 296 protruding from plastic body 291 and intersecting with vertical column 293 connected to foot 292. Foot 292 is precisely coplanar with the bottom of the package and plastic 291 because no bending is involved in fabricating the lead. The shadow or optical "projection" 297 of lead 296 onto the same plane as the bottom of plastic 291 and foot 292 is shown to clarify the three dimensional location of the lead elements.

Figure 18C:
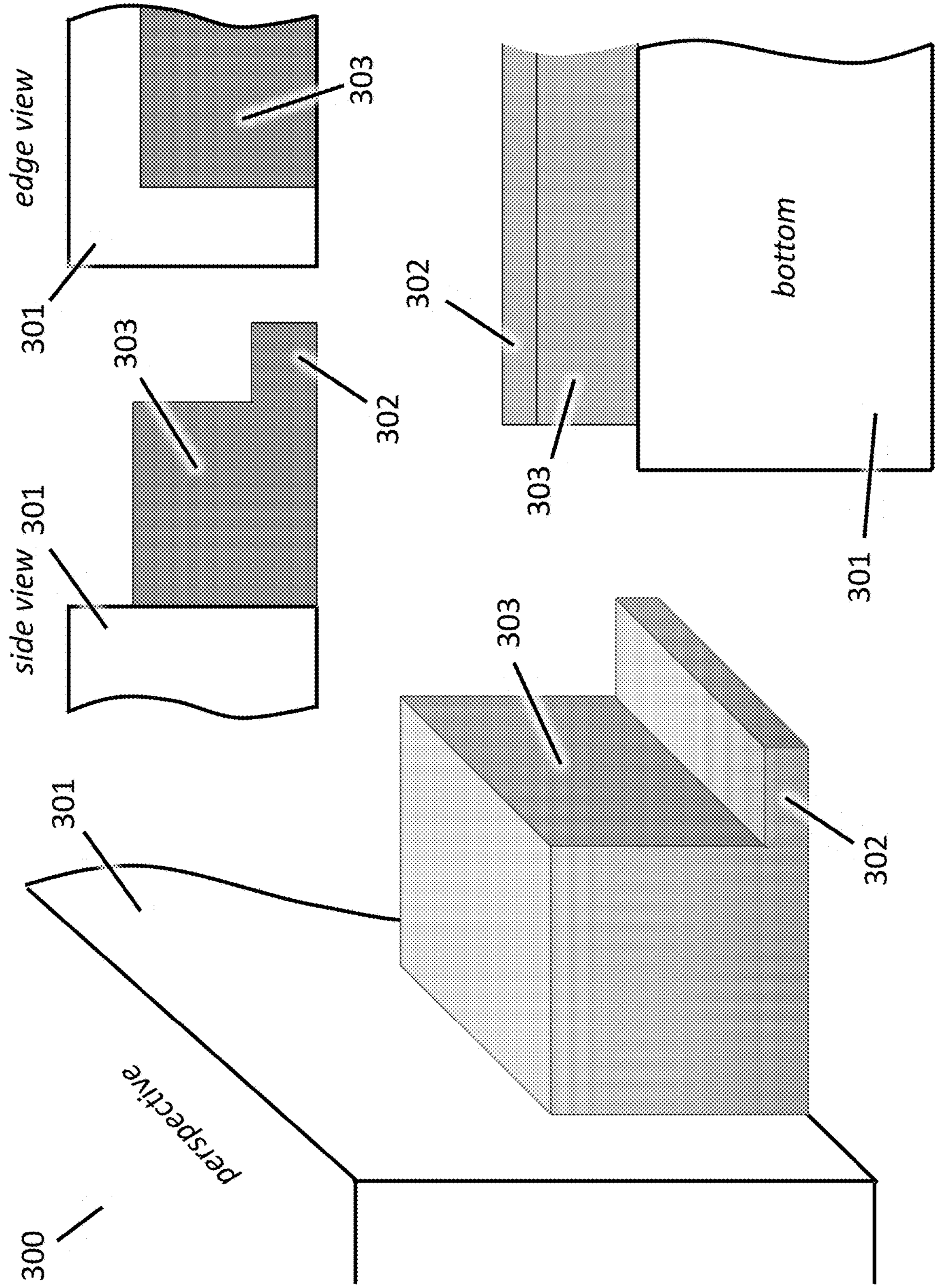
FIG. 18C comprises multiple views of a power package heat tab fabricated with the USMP process.

The USMP process is also capable of fabricating heat tabs used in power packaging. In perspective 300 of FIG. 18C thick metal heat tab 303 protrudes from plastic 301 to facilitate enhanced thermal conduction into the PCB and enhanced convection into the air. As shown, thick metal heat tab 303 is attached to foot 302 to provide wave-solder compatibility, a feature conventionally fabricated heat tabs do not offer. Foot 302 may be located along one edge of heat tab 303 as shown, or may circumscribe the heat tab 303 along its periphery in its entirety or in a portion thereof.

In summary, the visible elements of the various packages that may be fabricated using the USMP process comprise the geometric elements described previously in FIG. 9A through FIG. 9D. Specifically, in footed packages only the foot protrudes beyond the package plastic, in leaded packages the cantilever protrudes from the plastic, in power packages the entire vertical column protrudes beyond the package body, while in leadless packages no metal substantially extends beyond the plastic's exterior edge.

Internal Construction of USMP Fabricated Footed Packages

To demonstrate the versatility of the USMP process in fabricating a wide range of packages, it is beneficial to illustrate the internal construction of exemplary packages by the cross section. In asymmetric packages such as footed DPAK or a footed DFN, the cross sections in the lengthwise direction, i.e. transecting the leads, will be different than the transverse cross sections. In a quad package, the cross sections are typically symmetric with no differentiation between lengthwise and widthwise orientation, except possibly for the package's length in that direction.

Figure 19A:
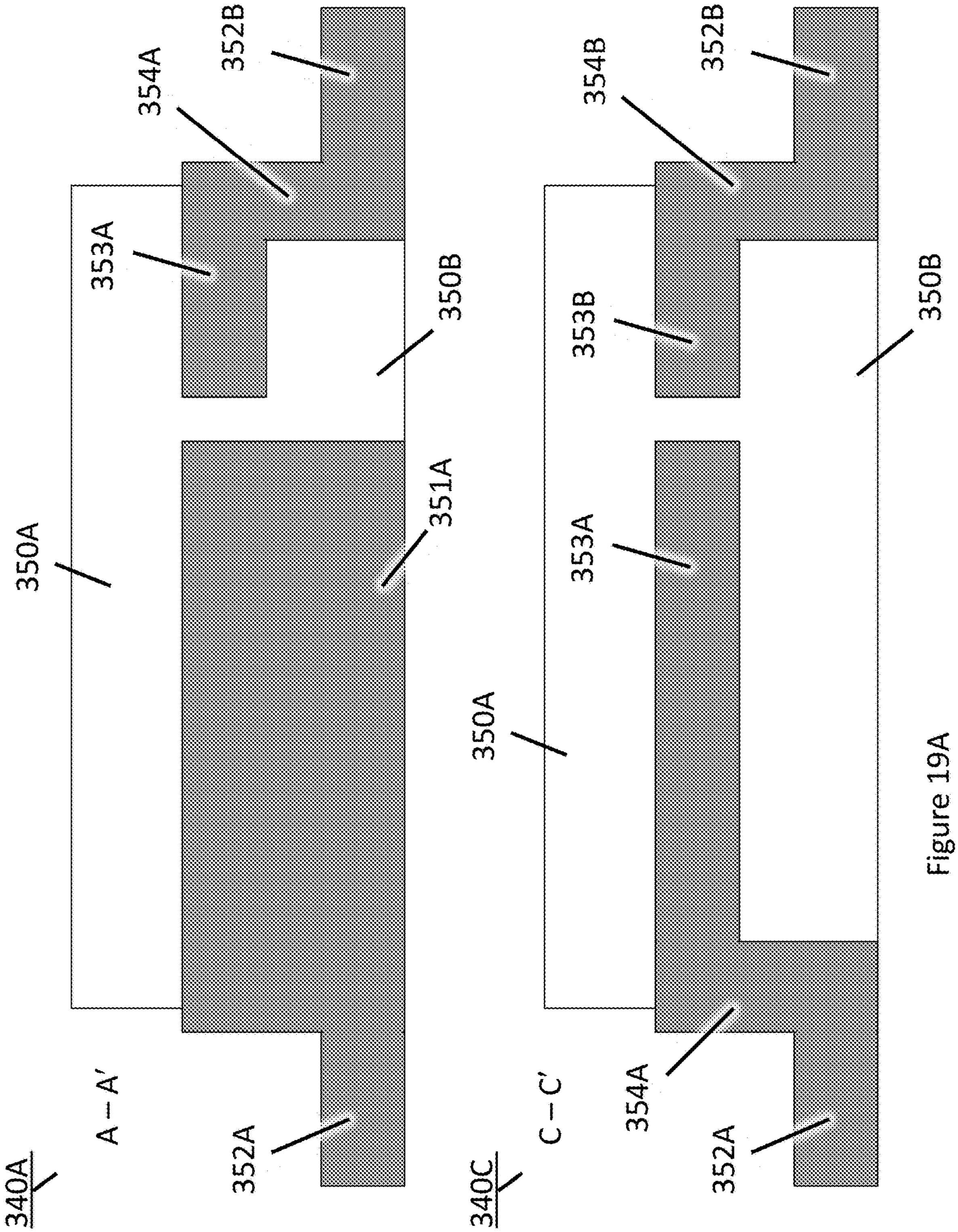
FIG. 19A comprises cross sectional views of exposed and isolated die pad USMP leadframes along a cutline through a die-pad-connected foot and an isolated foot.

FIG. 19A comprises cross-sectional views of exposed and isolated die pad USMP leadframes in the lengthwise package direction, specifically along a cutline through a die-pad-connected foot and an isolated foot. The leadframe cross-sectional views are "asymmetric" with respect to an imaginary center line because the leadframe features are not mirror images on opposite sides of the package's center, i.e.

the left side and right sides are different. Cross-sectional view 340A representing cutline A-A' illustrates an exposed die pad package where die pad 351A connects to foot 352A on one side while cantilever 353A, vertical column 354A and foot 352B form a Z-shaped conductor and foot not connected electrically to die pad 351A. Plastic envelopes the leadframe and semiconductor die (not shown) including a top portion 350A and a lower portion 350B to realize a void-free homogeneous encapsulant. The lower edge of plastic 350B is coplanar with the bottom of feet 352A and 352B, vertical column 354A, and exposed die pad 351A. In cross section 340C representing cutline C-C' exposed die pad 351A is replaced by isolated die pad 353A comprising a cantilever portion of the leadframe.

Figure 19B:
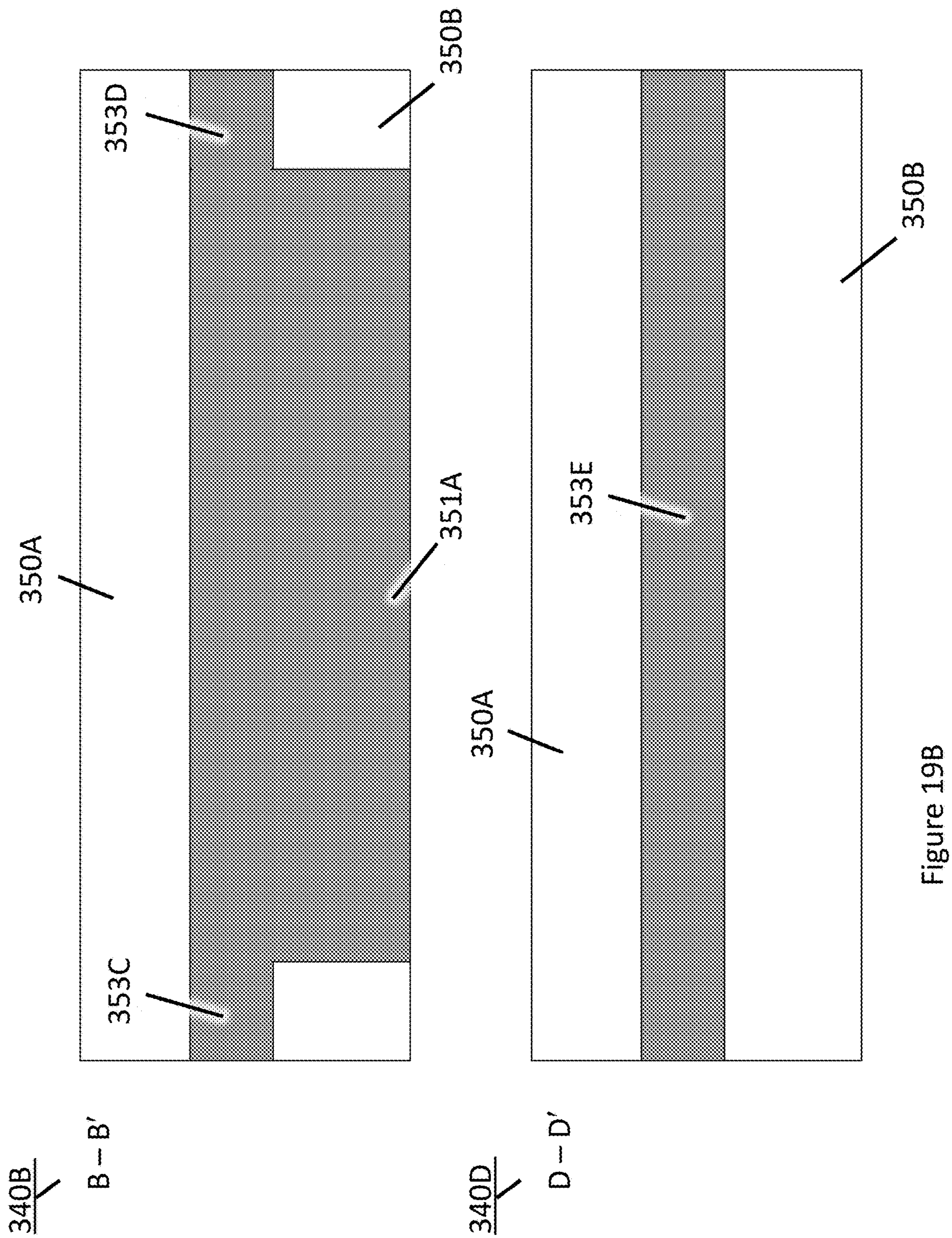
FIG. 19B comprises cross sectional views of exposed and isolated die pad USMP leadframes along a symmetric cutline through die pads and tie bars.

FIG. 19B comprises cross-sectional views of exposed and isolated die pad USMP leadframes, specifically along a symmetric cutline through die pads and tie bars. In cross section 340B representing cutline B-B' exposed die pad 351A includes tie bars 353C and 353D comprising cantilever portions of the leadframe, surrounding by plastic 350A and 350B. The lateral edges of tie bars 353C and 353D do not protrude beyond the edge of the plastic package body. The lower edge of plastic 350B is coplanar with the bottom exposed die pad 351A. In cross section 340D representing cutline D-D', isolated die pad 353E comprises a cantilever portion of the leadframe throughout the plastic body. Because the isolated die pad merges with the tie bars, they are indistinguishable in this cross section.

Figure 19C:
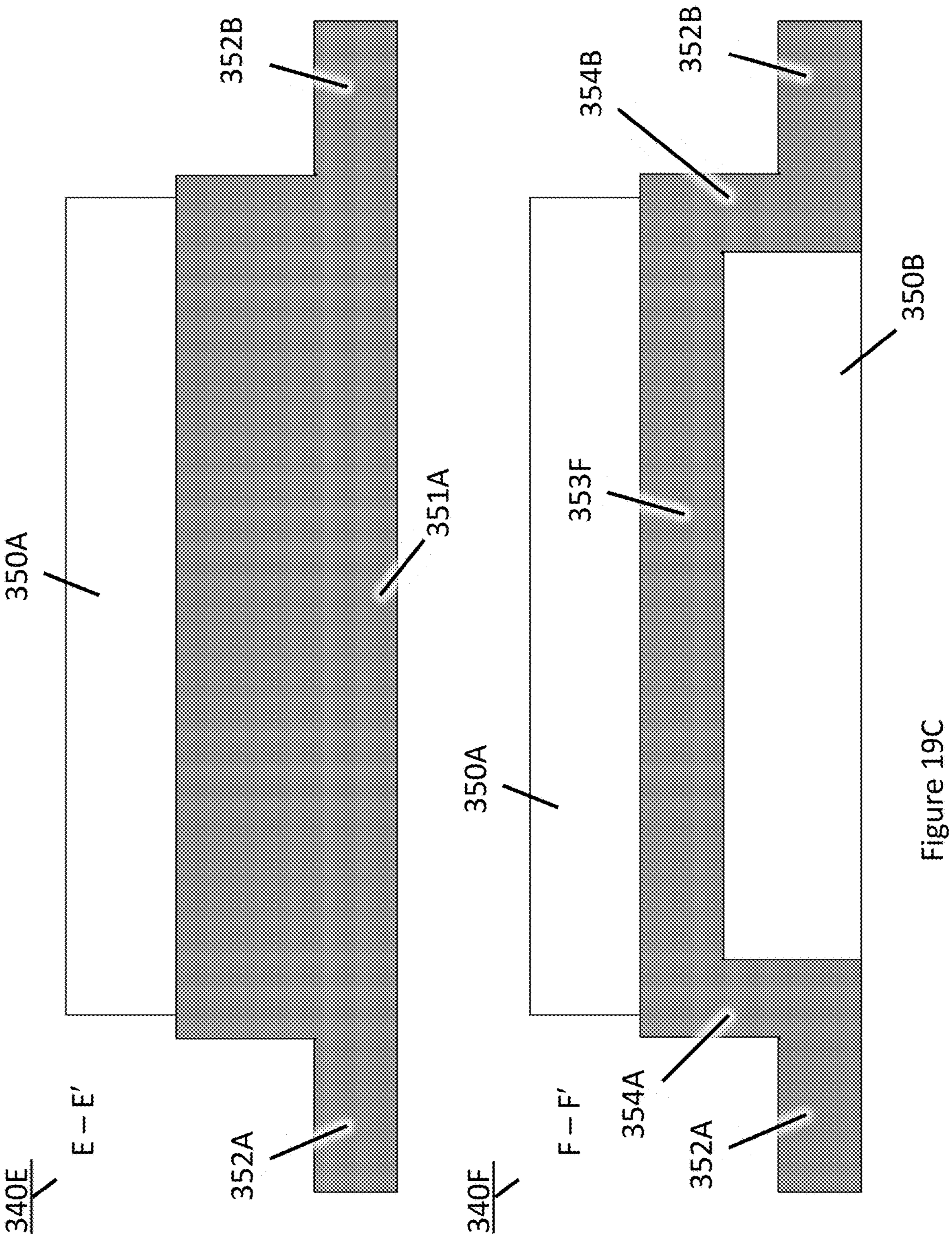
FIG. 19C comprises cross sectional views of exposed and isolated die pad USMP leadframes along a symmetric cutline through die-pad-connected feet.

FIG. 19C comprises cross-sectional views of exposed and isolated die pad USMP leadframes, specifically along a symmetric cutline through die-pad-connected feet. In cross section 340E representing cutline E-E' exposed die pad 351A connects to feet 352A and 352B on opposing sides of the package and is encapsulated on its top surface by plastic 350A. In cross section 340F representing cutline F-F' isolated die pad 353F connects to feet 352A and 352B on opposing sides of the package and is encapsulated by plastic 350A above and 350B below.

Figure 19D:
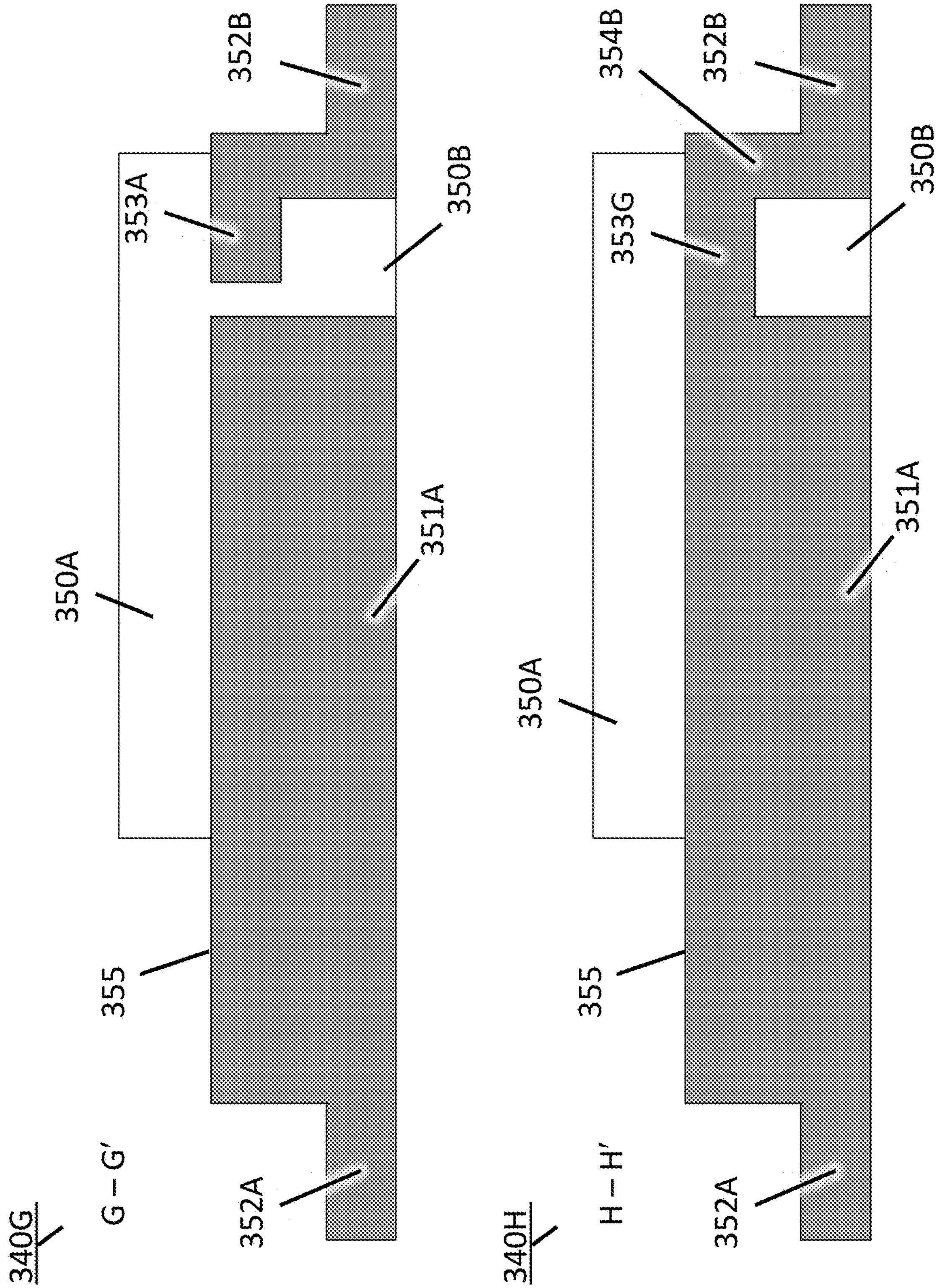
FIG. 19D comprises cross sectional views of exposed die pad USMP leadframes along a cutline through a heat tab and feet.

FIG. 19D comprises cross-sectional views of exposed die pad USMP leadframes for power packaging, specifically representing a cutline through a heat tab and feet. In cross section 340G representing cutline G-G' exposed die pad 351A extends beyond encapsulating plastic 350A to form heat tab 355. Foot 352A is connected to heat tab 355 to facilitate wave-solder capability. On the other edge, cantilever 353A, vertical column 354A and foot 352B form a Z-shaped conductor and foot not connected electrically to die pad 351A. Plastic envelopes the leadframe and semiconductor die (not shown) including a top portion 350A and a lower portion 350B to realize a void-free homogeneous encapsulant. In cross section 340H representing cutline H-H' exposed die pad 351A connects to cantilever 353G, vertical column 354B and foot 352B. Cantilever 353G sits atop plastic 350B. The bottom edge of plastic 350B is coplanar with the bottom edge of feet 352A and 352B, exposed die pad 351A, and heat tab 355.

Figure 19E:
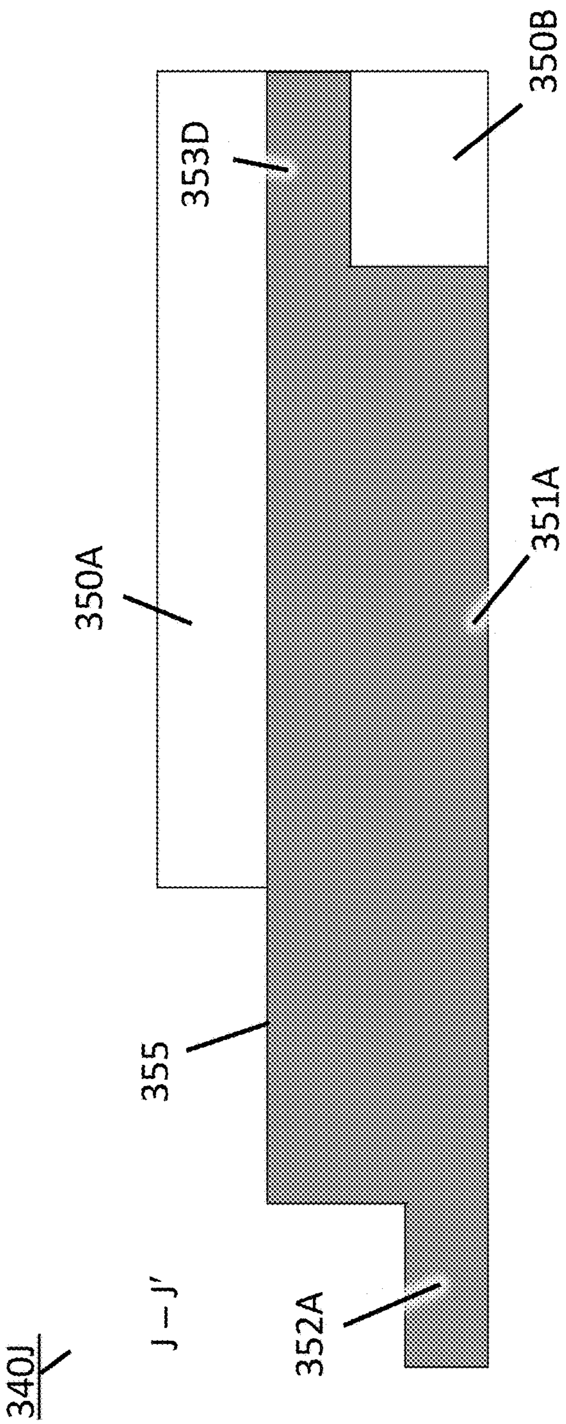
FIG. 19E comprises a cross sectional view of an exposed die pad USMP leadframes along a cutline through a heat tab and tie bar.

FIG. 19E comprises a cross-sectional view of an exposed die pad USMP leadframes along a cutline through a heat tab and tie bar. In cross section 340J representing cutline J-J' exposed die pad 351A connects to heat tab 355 and foot 352A while on the opposing edge cantilever 353D sitting atop plastic 350B extends laterally to the edge of plastic 350A and 350B.

Figure 19F:
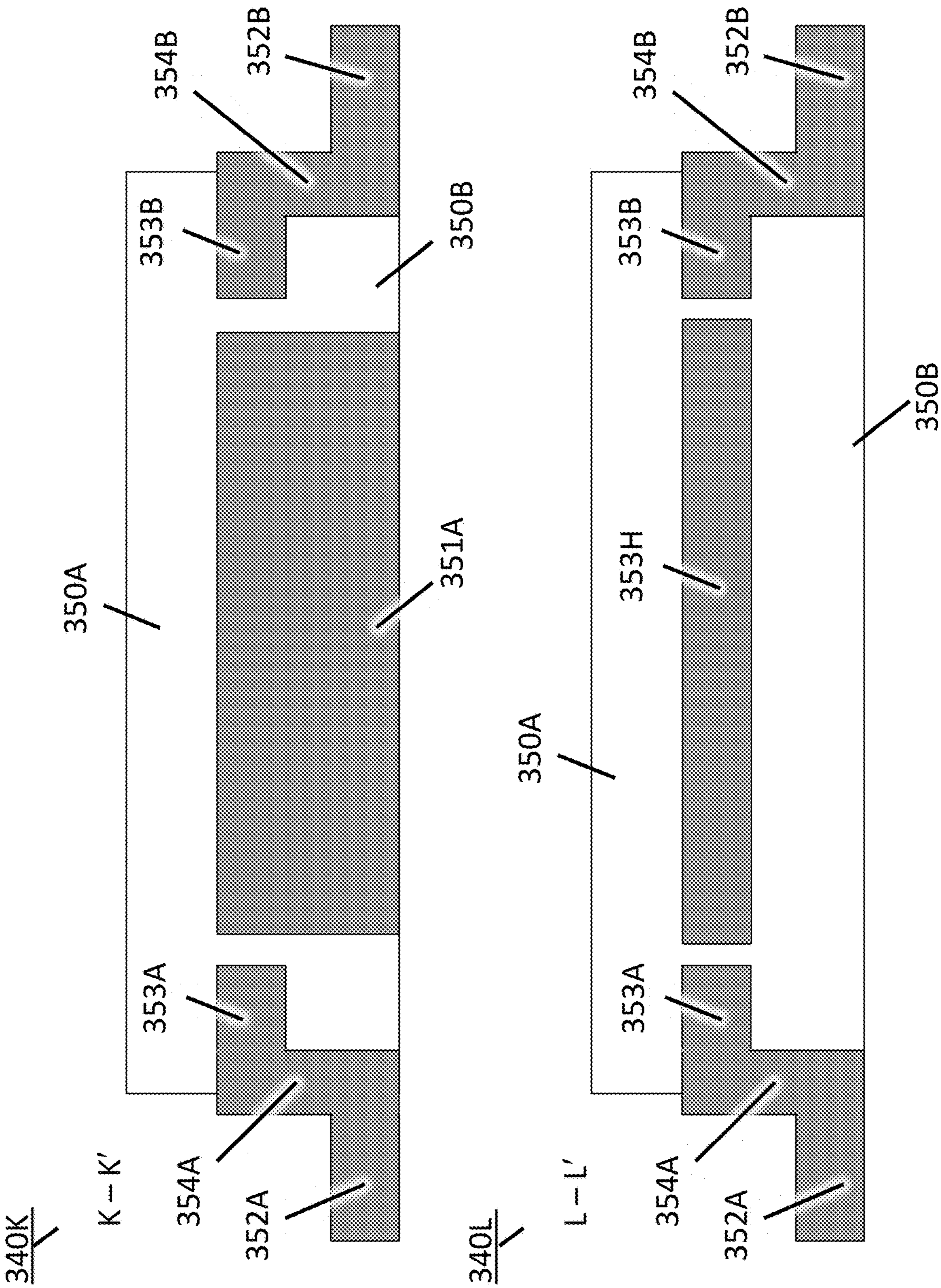
FIG. 19F comprises cross sectional views of exposed and isolated die pad USMP leadframes along a symmetric cutline through feet not connected to the die pad.

FIG. 19F comprises cross-sectional views of exposed and isolated die pad USMP leadframes along a symmetric cutline through feet not connected to the die pad. Specifically, in cross section 340K representing cutline K-K', a Z-shaped conductor and foot comprising cantilever 353A, vertical column 354A, and foot 352A is located adjacent to, but electrically isolated from, exposed die pad 351A. Symmetrically, the package's opposing edge includes another electrically isolated Z-shaped conductor and foot comprising cantilever 353B, vertical column 354B and foot 352B. Plastic envelopes the leadframe and semiconductor die (not shown) including a top portion 350A and a lower portion 350B to realize a void free homogeneous encapsulant. The bottom edge of plastic 350B is coplanar with the bottom edge of feet 352A and 352B, and with isolated die pad 353H comprises a cantilever surrounded on all sides by plastic 350A and 350B. As such die pad 353H is electrically isolated from the package's backside and from any adjacent feet.

Figure 19G:
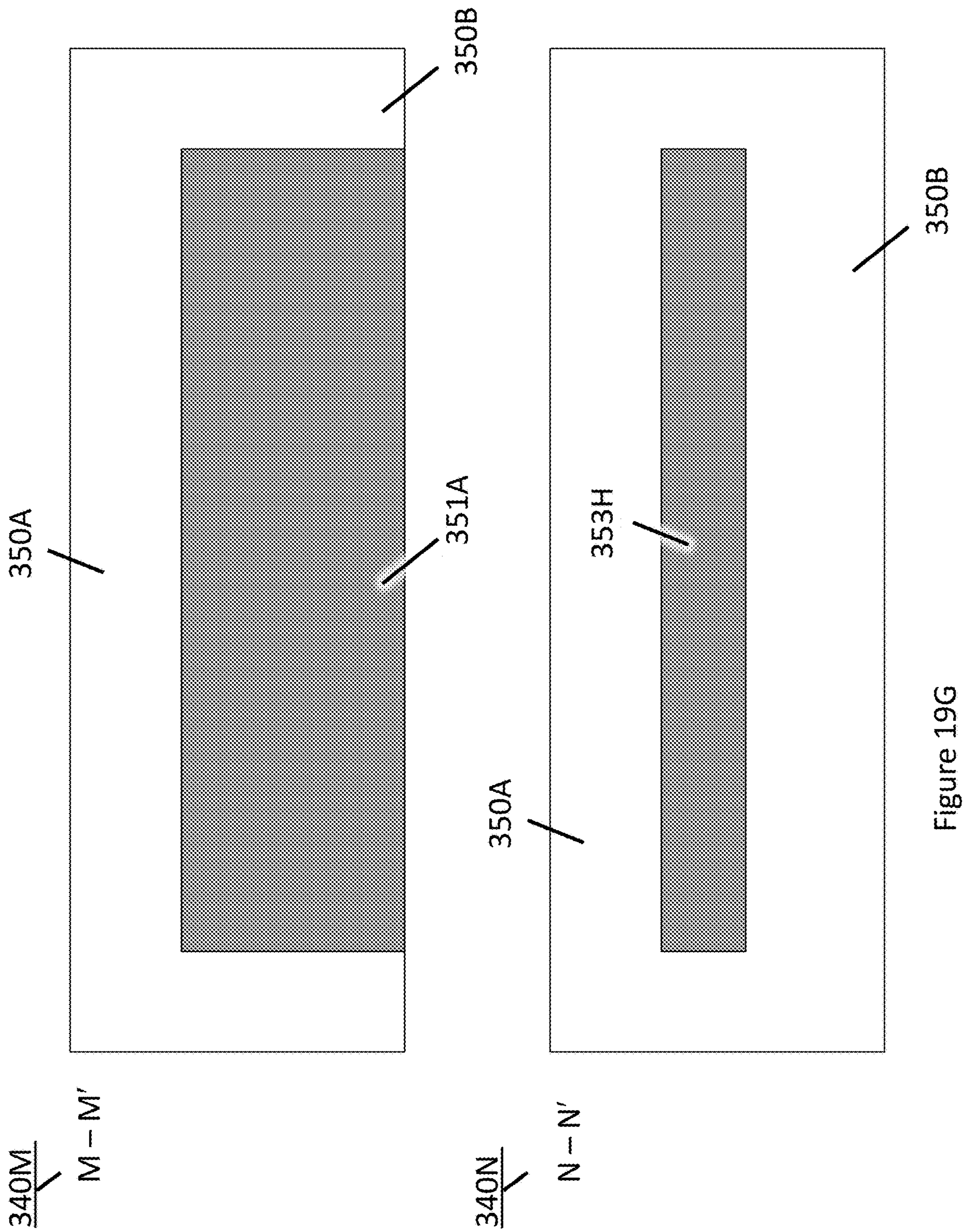
FIG. 19G comprises cross sectional views of exposed and isolated die pad USMP leadframes along a symmetric cutline through die pads.

FIG. 19G comprises cross-sectional views of exposed and isolated die pad USMP leadframes, specifically made along a symmetric cutline through die pads not transecting feet or tie bars. For example, cross section 340M representing cutline M-M' illustrates exposed die pad 351A surrounded by plastic 350A and 350B while cross section 340M representing cutline N-N' illustrates isolated die pad 353H surrounded by plastic 350A and 350B.

Figure 19H:
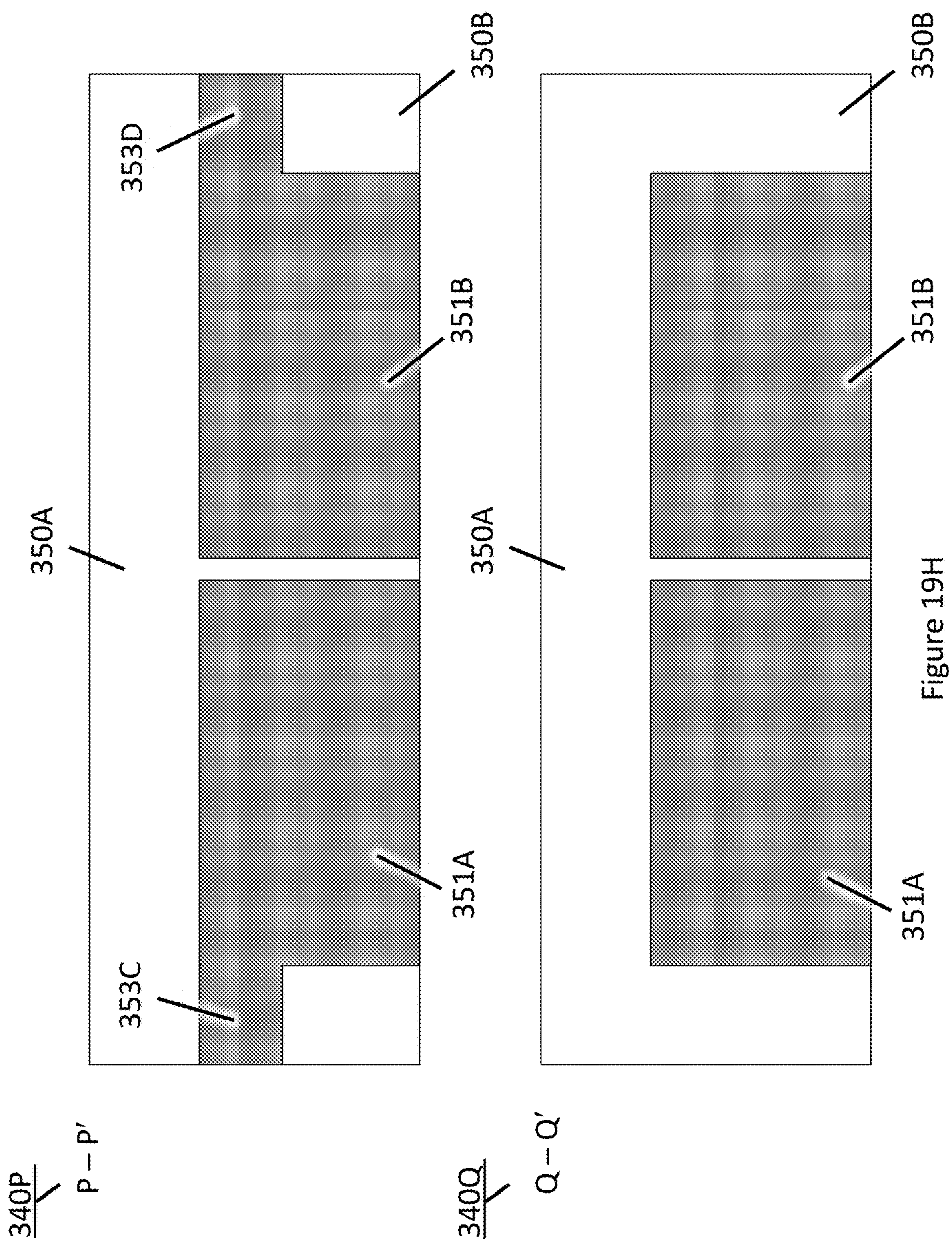
FIG. 19H comprises cross sectional views of exposed die pad USMP leadframes along a symmetric cutline through dual die pads with and without tie bars.

FIG. 19H comprises cross-sectional views of exposed die pad USMP leadframes along a symmetric cutline through dual die pads with and without tie bars. Cross section 340Q representing cutline Q-Q' illustrates two die pads, specifically exposed die pads 351A and 351B surrounded by plastic 350A and 350B. In cross section 340P representing cutline P-P' the two die pads connect to cantilever tie bars extending to the edge of the plastic body, specifically where exposed die pad 351A connects to tie bar 353C and where die pad 1351B connects to tie bar 353D.

Figure 19I:
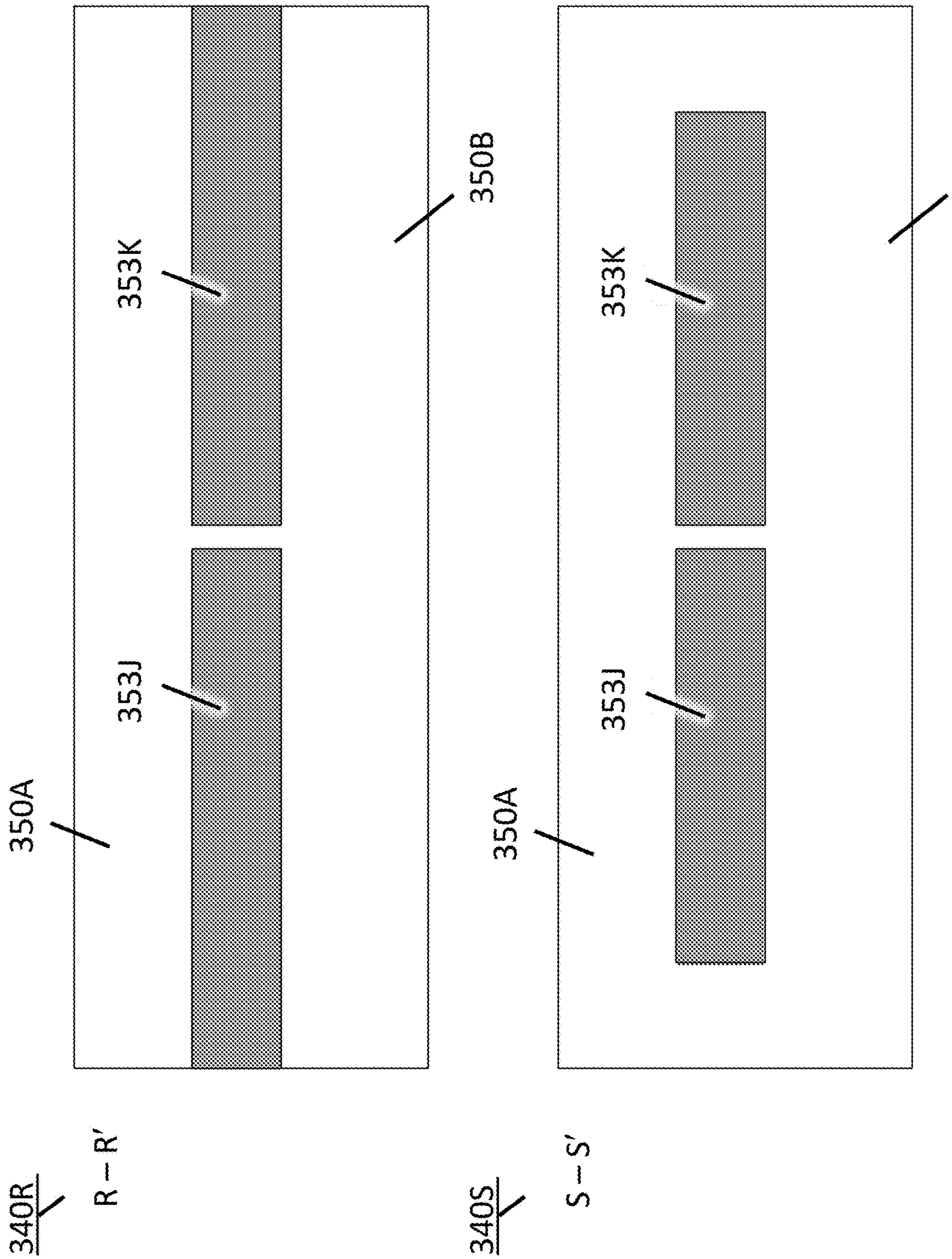
FIG. 19I comprises cross sectional views of isolated die pad USMP leadframes along a symmetric cutline through dual die pads with and without tie bars.

FIG. 19I comprises cross sectional views of isolated die pad USMP leadframes along a symmetric cutline through dual die pads with and without tie bars. Cross section 340S representing cutline S-S' illustrates two die pads, specifically isolated die pads 353J and 353K surrounded by plastic 350A and 350B. In cross section 340R representing cutline R-R' the two die pads connect to cantilever tie bars extending to the edge of the plastic body, but because the cantilever tie and isolated die pad are formed from the same cantilever, they are indistinguishable in the drawing.

Figure 19J:
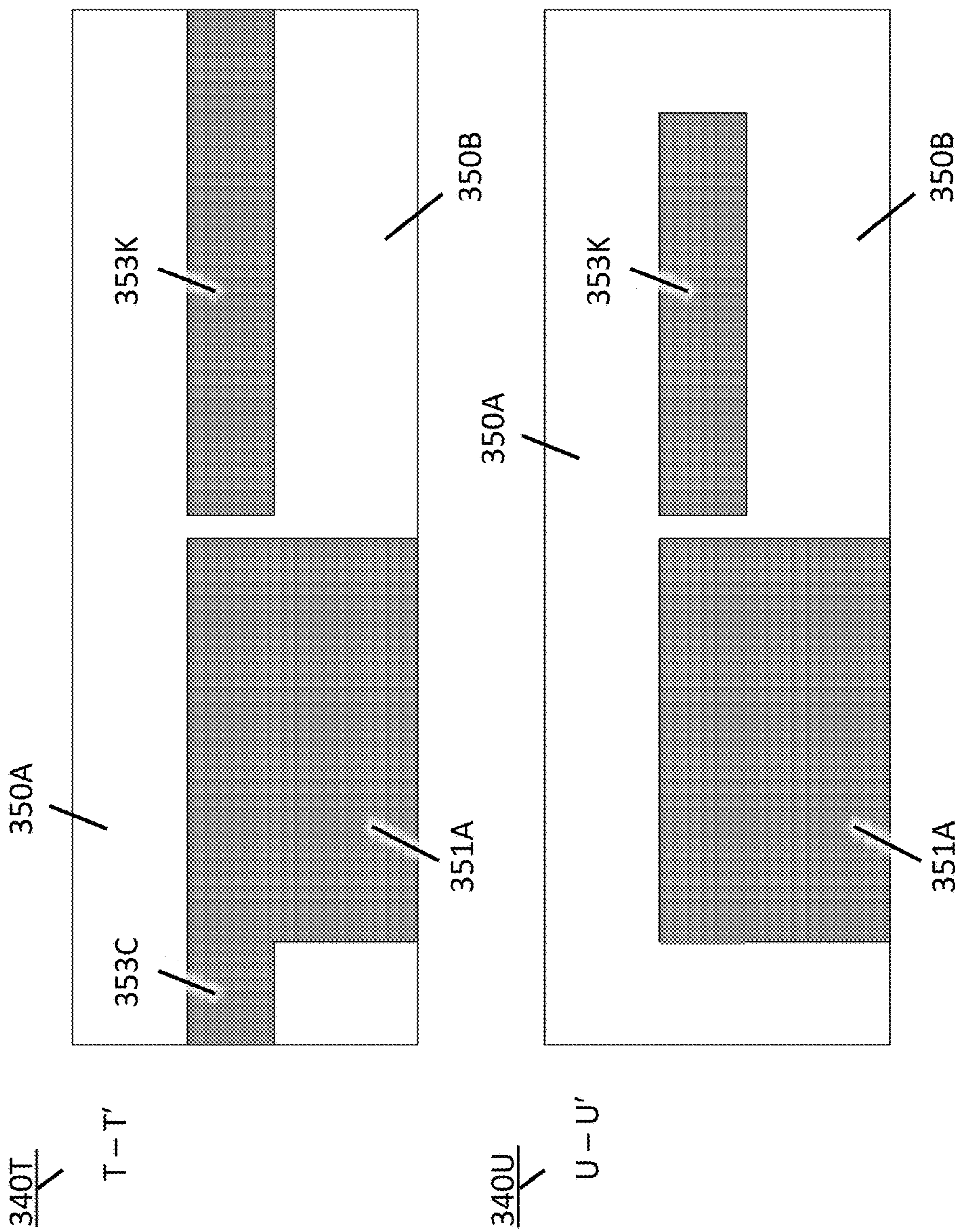
FIG. 19J comprises cross sectional views of mixed isolated and exposed die pad USMP leadframes along a symmetric cutline through dual die pads with and without tie bars.

FIG. 19J comprises cross sectional views of mixed isolated and exposed die pad USMP leadframes along a symmetric cutline through dual die pads with and without tie bars. Cross section 340U representing cutline U-U' illustrates two die pads, specifically exposed die pad 351A and isolated die pad 353K surrounded by plastic 350A and 350B. In cross section 340T representing cutline T-T' the two die pads connect to tie bars extending the edge of the plastic body. As shown, exposed die pad 351A connects to tie bar 353C comprising a cantilever. Isolated die pad 353K similarly connects to a cantilever tie bar but since the die pad is formed from the same cantilever, the isolated die pad and tie bar are indistinguishable in the drawing.

Figure 19K:
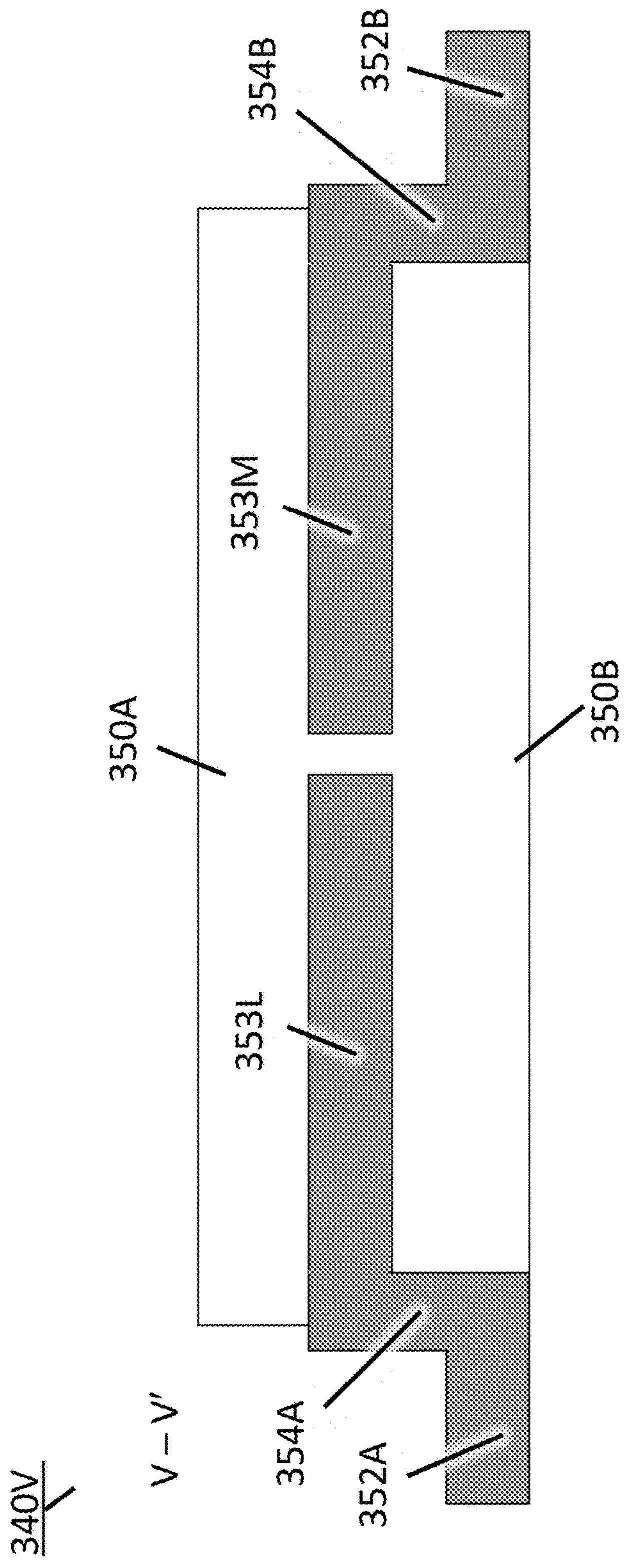
FIG. 19K comprises cross sectional views of isolated die pad USMP leadframes along a symmetric cutline through dual die pads and die-pad connected feet.

FIG. 19K comprises cross sectional view 340V of a dual isolated die pad USMP leadframe, specifically depicting symmetric cutline V-V' through isolated dual die pads 353L and 353M, corresponding vertical columns 354A and 354B, and corresponding die-pad connected feet 352A and 352B.

Figure 19L:
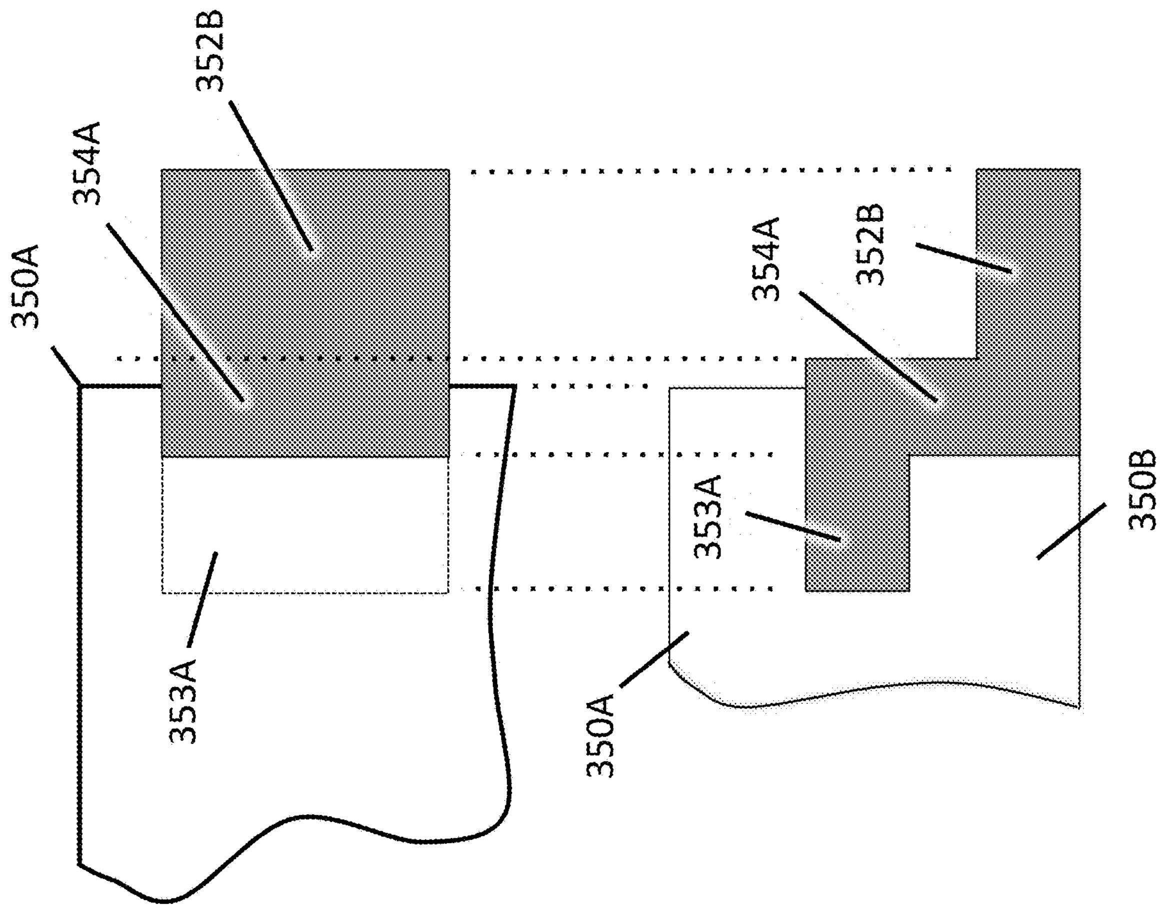
FIG. 19L comprises a cross sectional and bottom view a Z-shaped foot not connected to a die pad.

Lastly FIG. 19L illustrates a cross sectional and bottom view a Z-shaped conductor and foot not connected to a die pad comprising a cantilever portion 353A used for wire bonding, a vertical column 354A, and a foot 352B. From both bottom and cross sectional views the exposed metal on the backside of the package includes a portion overlapping plastic 350A and another portion protruding beyond the plastic's edge. Throughout subsequent drawings in this disclosure, the Z-shaped conductor and foot will be represented as a shaded foot depicting that portion of the connection viewable from the package's underside and a thin line extension representing the cantilever portion located inside plastic 350A and not discernable from the package's exterior, not visible from the package's underside, except through the use of X-ray inspection. The length of the dotted portion is subsequent illustrations may not be to scale but is included simply to remind the reader that the foot is part of a square Z-shaped conductor.

Examples of Dual USMP Footed Packages

The following illustrations depict a variety of dual-sided package constructions that can be fabricated with the USMP process and methods disclosed herein. A dual package is a package where leads or feet are present on opposing sides of the package. Dual packages may be square or rectangular. In a rectangular package, the longer dimension is referred to as the lengthwise direction of the package whether it has connections, i.e. leads or feet, on those edges or orthogonal to those edges. The drawings generally include a perspective illustration of the package and two underside illustrations—one using an exposed die pad, the other comprising an isolated version of the same package. In most cases the perspective view is identical for both the exposed die pad and isolated versions.

The relevant cross sectional cutlines from the previous section are identified on the underside views to unambiguously identify each package's construction. Moreover, using the USMP process any footed dual-sided package can be converted into a dual leadless package, i.e. a DFN equivalent footprint having no feet extending beyond the plastic body's edges, simply by aligning the laser cuts for the metal removal to the same regions and edges used to define plastic removal. For the sake of brevity, the USMP leadless versions of the following dual packages will be excluded from the drawings.

FIG. 20A through FIG. 31 illustrate the extremely diverse range of single-die and multi-die packages that can be fabricated using USMP methods and apparatus disclosed herein as depicted by topside, underside, and in some cases by perspective views. For the single-die-pad packages the labeled cross-sectional views correspond to the similarly labeled detailed cross-sectional constructions shown in FIG. 19A through FIG. 19G (i.e., cutlines A-A', B-B' . . . N-N'), and for the multi-die-pad packages the labeled cross-sectional views correspond to the similarly labeled detailed cross-sectional constructions in the detailed cross sectional constructions shown in FIG. 19H through FIG. 19K (i.e., cutlines P-P', Q-Q' . . . V-V') and in FIG. 24C through FIG. 24J (i.e., cutlines W1-W1', W2-W2' . . . Z4-Z4'). A detailed comparison of the topside and cross sectional view of a Z-shaped conductor and foot is also included in FIG. 19L.

The drawings included are schematic representations of the various USMP fabricated packages and their elements, not dimensionally precise CAD drawings. While the general dimensions of the drawings are intended to be accurate, in many cases the exact dimensions are not precisely consistent, e.g. the length of the cantilever section of the Z shaped conductor and foot may be longer than depicted by underside view drawings. As such these drawings are intended to illustrate USMP elemental components, e.g. a package's die pad, foot or feet, Z shaped conductors, cantilever extensions, and tie bars without limitation. It will be well known to those skilled in the art that dimensions may be increased or reduced without affecting the general features made possible by the USMP fabrication process.

Figure 20A:
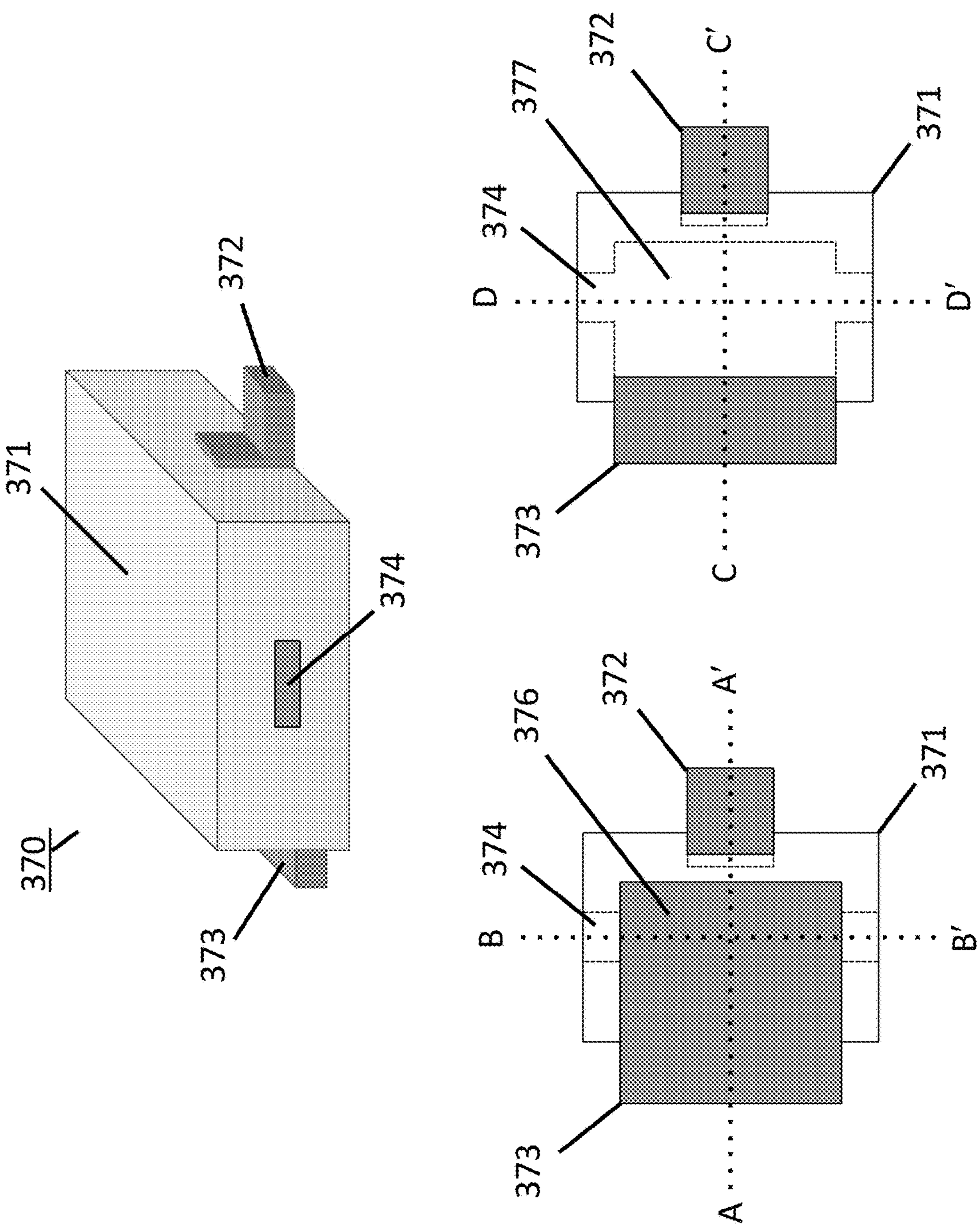
FIG. 20A comprises various views of a 2-footed USMP with isolated and exposed die pads.

As shown, FIG. 20A comprises various views of single-die-pad 2-footed USMP 370 compatible shown with either isolated or exposed die pads. Such packages are useful for packaging devices with two electrical connections such as semiconductor diodes including PN, zener, and Schottky diodes, transient voltage suppressors, voltage clamps, current limiters, and other two-terminal devices. The footed package as shown comprises plastic 371, foot 372, and wide foot 373. Tie bars 374 and the package feet connect to the leadframe matrix, holding the package securely in place during manufacturing.

In the illustration in the lower left, in order to maximize the available die size and to lower the package's thermal resistance, exposed die pad 376 is connected to wide foot 373 as depicted along cutline A-A' and illustrated previously in FIG. 19A. A cross section of the tie bar connection perpendicular to cutline A-A' is depicted along cutline B-B' corresponding to the cross-sectional view shown previously in FIG. 19B. Similarly, in the illustration in the lower right, to maximize the die size, wide foot 373 is connected to isolated die pad 377 as depicted along cutline C-C' and along tie bar cutline D-D' corresponding to the cross-sectional views shown previously in FIG. 19A and in FIG. 19B respectively. While the thermal resistance of the isolated package of the isolated die pad package is not as low as the exposed die pad version, substantial heat conduction flows through the cantilever die pad, down to die-pad connected foot, and into the PCB.

Figure 20B:
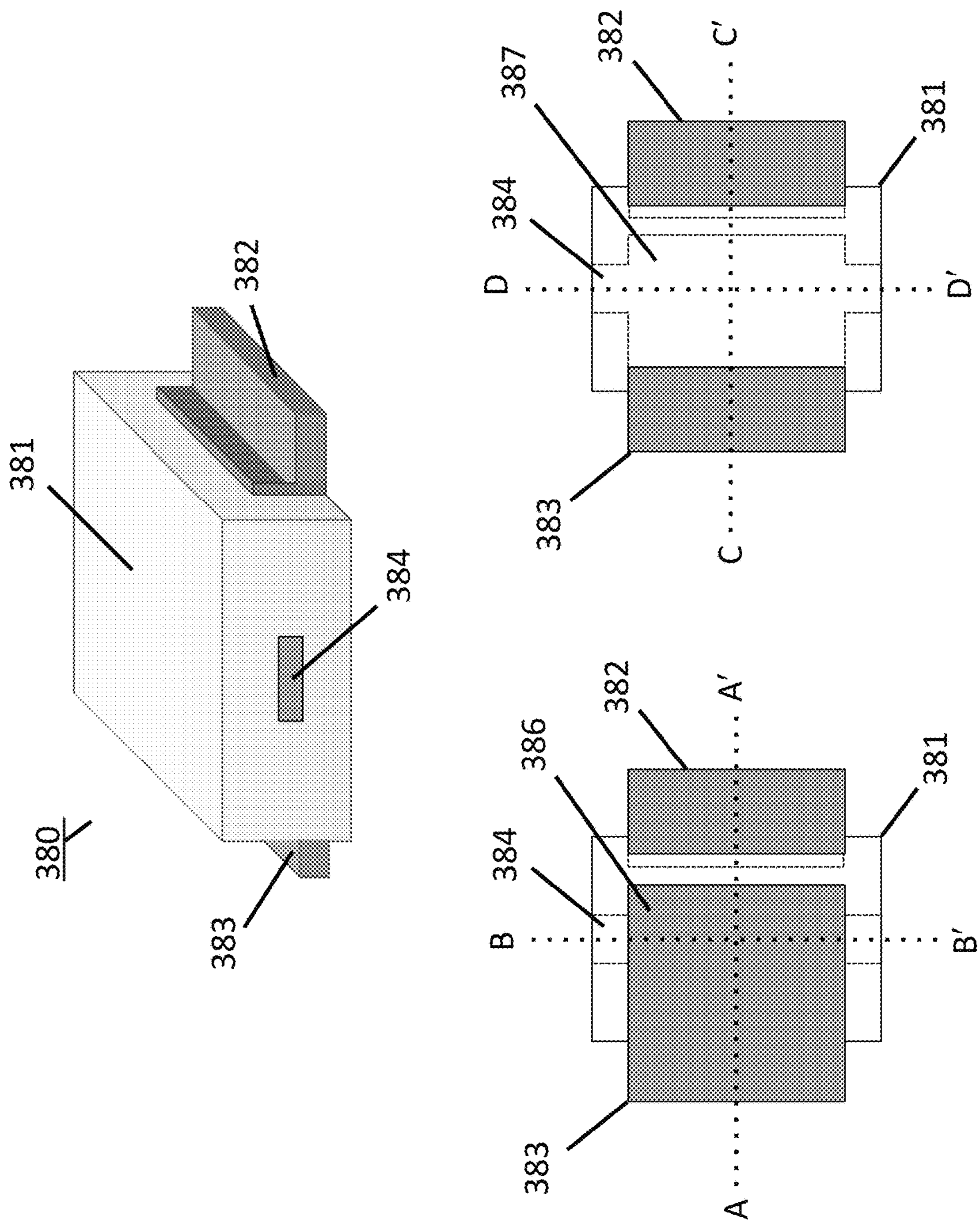
FIG. 20B comprises various views of an alternate embodiment of a 2-footed USMP with isolated and exposed die pads.
Figure 20C:
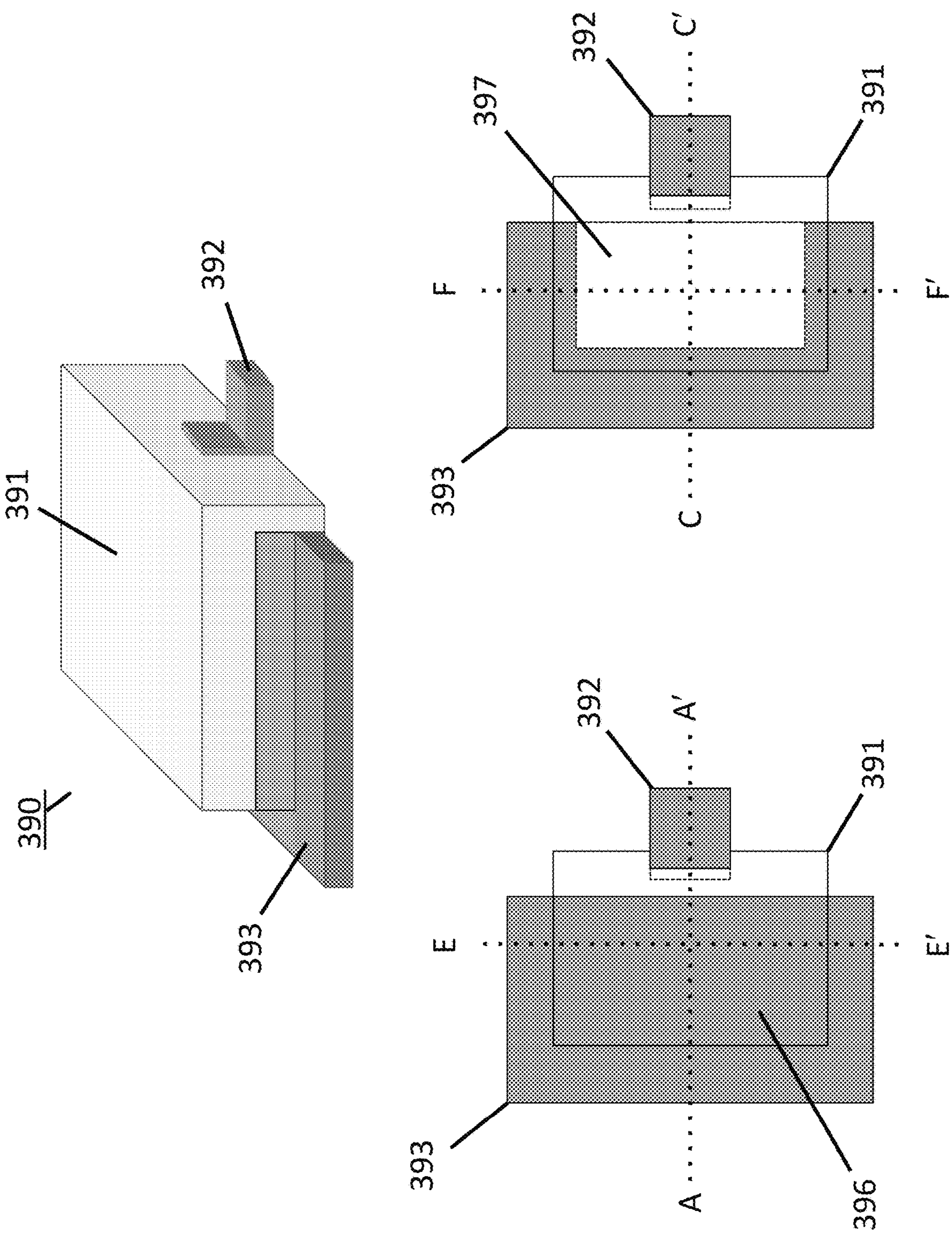
FIG. 20C comprises various views of a 2-footed USMP with isolated and exposed die pads and a three-sided foot.
Figure 20D:
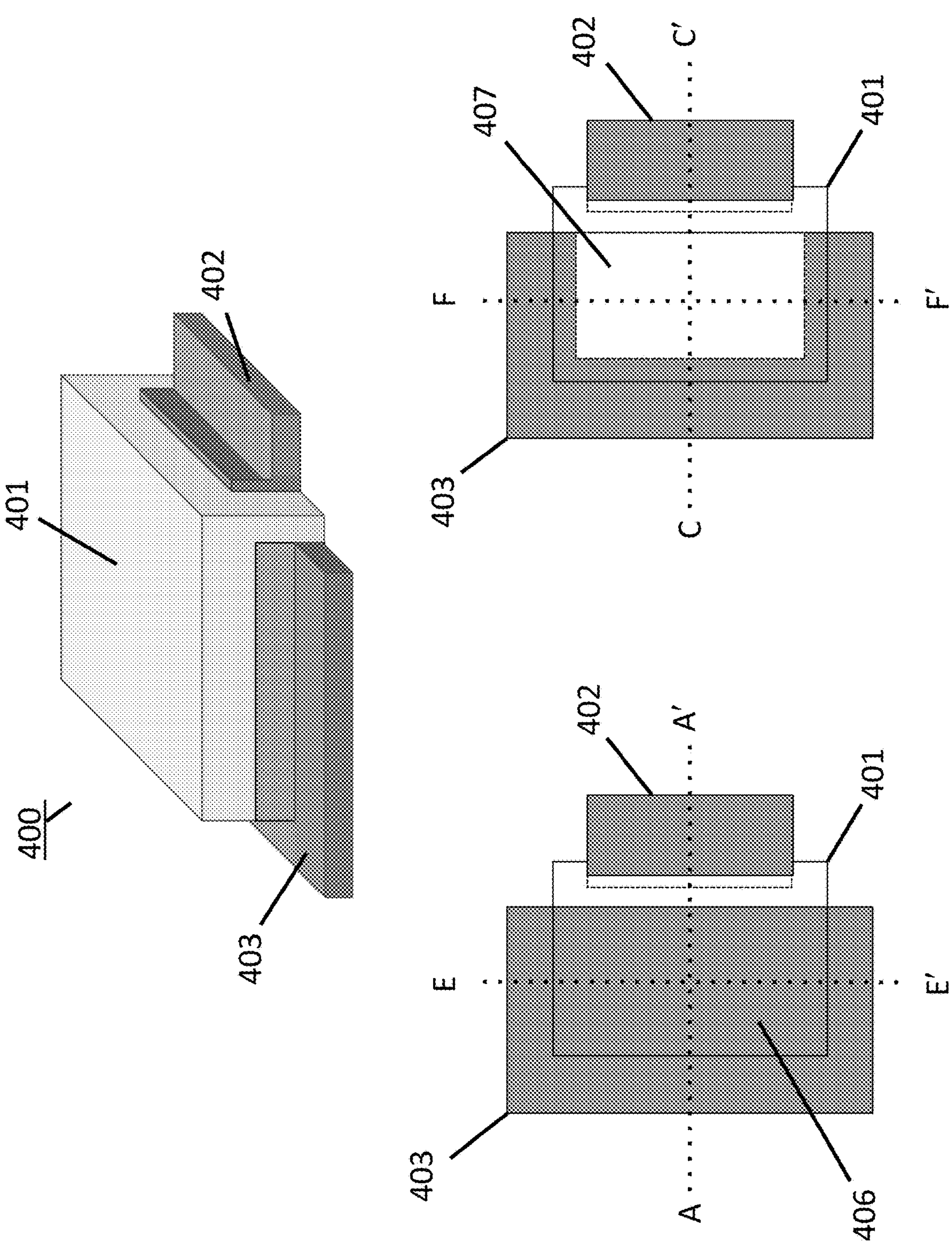
FIG. 20D comprises various views of an alternate embodiment of a 2-footed USMP with isolated and exposed die pads and a three-sided foot.

A variant of the previous single-die-pad 2-footed USMP 380 is illustrated in FIG. 20B where the second isolated foot 382 is made as wide as the die pad connected foot 383. The cross sections are identical to the previous illustration. FIG. 20C further expands the maximum die size of the package by extending the die pad connected foot onto three sides of the package, eliminating the tie bar by the three-side foot design. For example, in the exposed die-pad version shown in the lower left illustration, exposed die pad 396 connects to foot 393 on three sides.

Although the lengthwise cross section depicted by cutline A-A' remains unchanged from the prior versions, the widthwise cross section is different, as represented along cutline E-E' as depicted by the corresponding cross section shown previously in FIG. 19C. Similarly, the isolated die pad version of the same package is illustrated in the lower right drawing where three-sided foot 393 connects to isolated die pad 397. Although the lengthwise cross section depicted along cutline C-C' shown previously in the cross section of FIG. 19A remains unchanged from the prior versions, the widthwise cross section is different, as represented along cutline F-F' as depicted by the corresponding cross section shown previously in FIG. 19C. In another embodiment of the same 2-footed package the three-sided foot is combined with a wide foot 402 as shown in drawings of FIG. 20D.

The size of the aforementioned USMP footed packages with two electrical connections can be adjusted based on the current rating and die size of the product being packaged. For large area die conducting higher currents, multiple bond wires, flip chip assembly, or copper clip leads may be used to connect the die's topside to the other connection. For devices expected to dissipate substantial heat, the exposed die pad version is preferred because of its lower thermal resistance and better heat spreading capability.

Figure 21A:
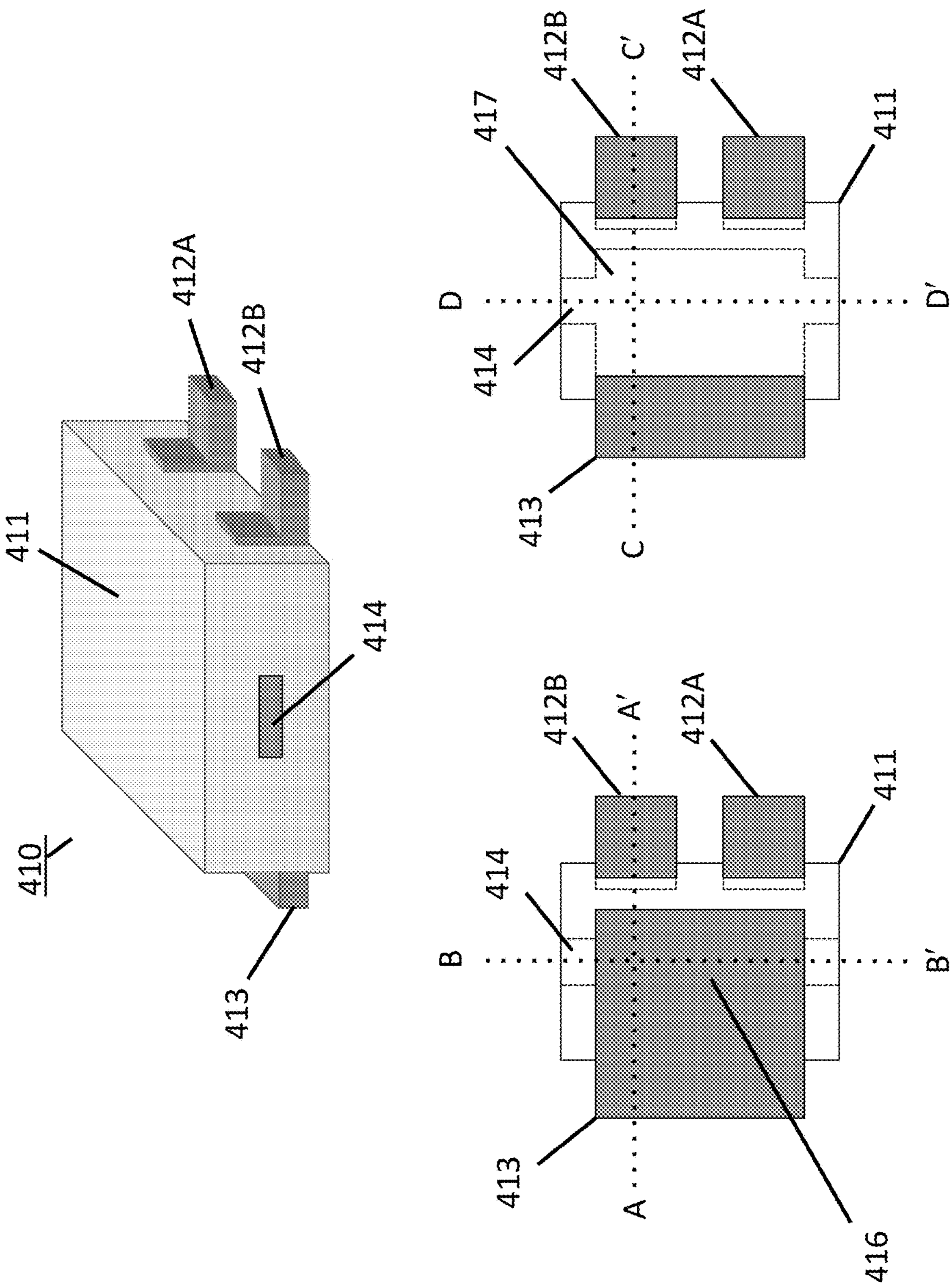
FIG. 21A comprises various views of a 3-footed USMP with isolated and exposed die pads.

FIG. 21A comprises various views of single die pad 3-footed USMP 410 compatible with either isolated or exposed die pads. Such packages are useful for packaging devices with three electrical connections such as bipolar transistors, small signal MOSFETs, JFETs, power MOS- FETs, high-voltage MOSFETs, three-terminal voltage regulator ICs, low-dropout linear voltage regulators or LDOs, and shunt regulators, or any three terminal device provided it does not exhibit excessive heat generation. High power devices such as thyristors and IGBTs generally require a power package with a heat tab and are therefore not candidates for using this particular class of footed USMPs.

The footed package as shown comprises plastic 411, feet 412A and 412B, and wide foot 413. Tie bars 414 and the package feet connect to the leadframe matrix, holding the package securely in place during manufacturing. In the illustration in the lower left, in order to maximize the available die size and to lower the package's thermal resistance, exposed die pad 416 is connected to wide foot 413 as depicted along cutline A-A' and shown previously in FIG. 19A. A cross section of the tie bar connection perpendicular to cutline A-A' is depicted along cutline B-B' as shown previously in FIG. 19B. Similarly, in the illustration in the lower right, to maximize the die size, wide foot 413 is connected to isolated die pad 417 as depicted along cutline C-C' and shown previously in FIG. 19A and along tie bar cutline D-D' as shown previously in FIG. 19B. While the thermal resistance of the isolated die pad package is not as low as the exposed die pad version, substantial heat conduction flows through the cantilever die pad, down to the die-pad connected foot, and into the PCB.

Figure 21B:
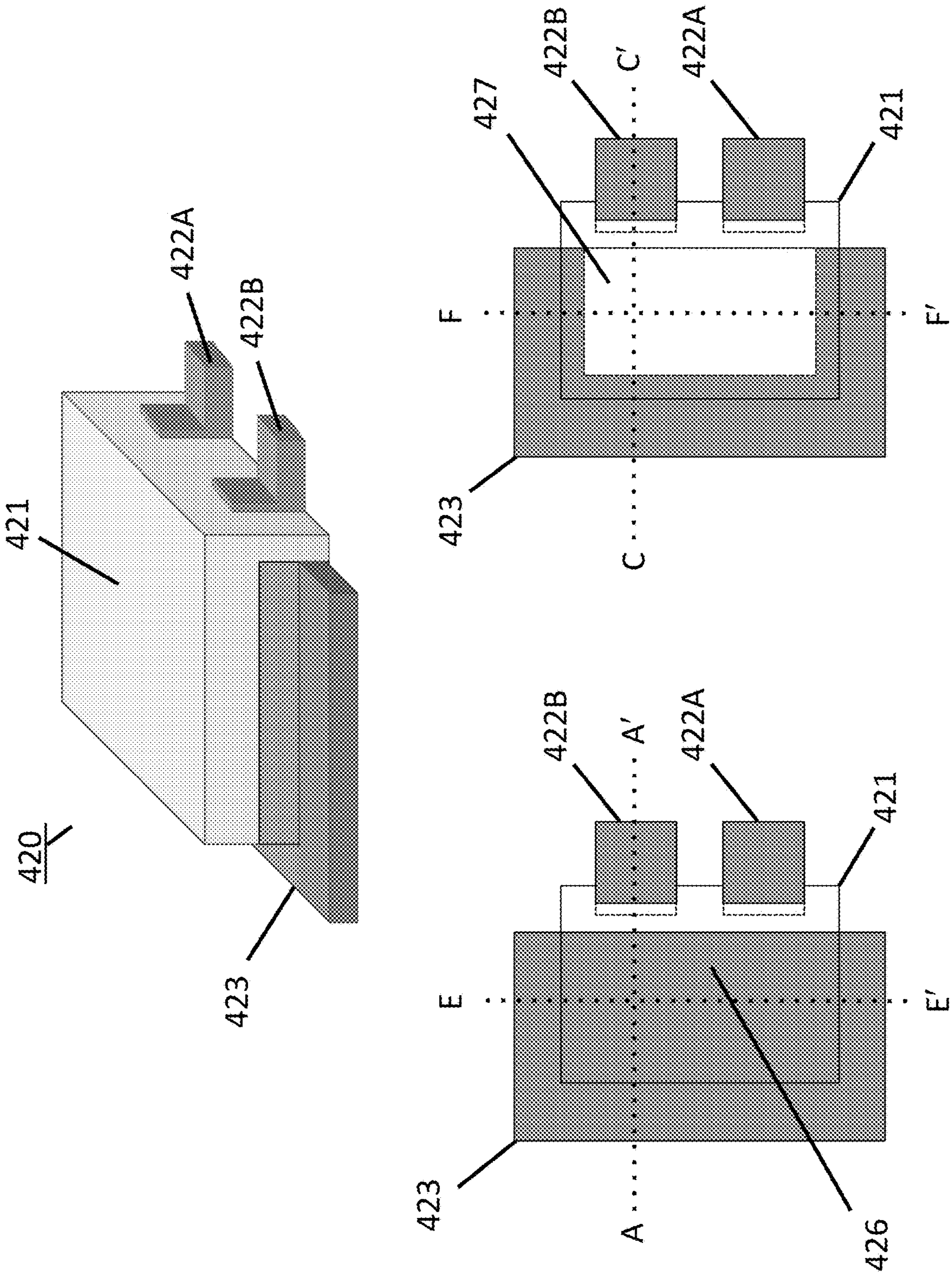
FIG. 21B comprises various views of a 3-footed USMP with isolated and exposed die pads and a three-sided foot.

An improved thermal performance can be achieved using a three-sided foot shown for USMP 420 in FIG. 21B. As shown, the maximum die size of the package is enlarged by extending the die pad to the package edge, eliminating the tie bar, and connecting the die pad to a foot on three sides of the package. For example in the exposed die-pad version shown in the lower left illustration, exposed die pad 426 connects to foot 423 on three sides.

Although the length of the die pad 426 along cutline A-A' shown previously in FIG. 19A remains unchanged from the prior versions, the width of the die pad 426 along cutline E-E' depicted in FIG. 19C is greater, i.e. wider. Similarly, the isolated die pad version of the same package is illustrated in the lower right drawing where three-sided foot 423 connects to isolated die pad 427. Although the length of the die pad 427 along cutline C-C' with a corresponding cross section shown in FIG. 19A remains unchanged from the prior versions, the width of the die pad 427 along cutline F-F' depicted in FIG. 19C is greater, i.e. wider.

Figure 21C:
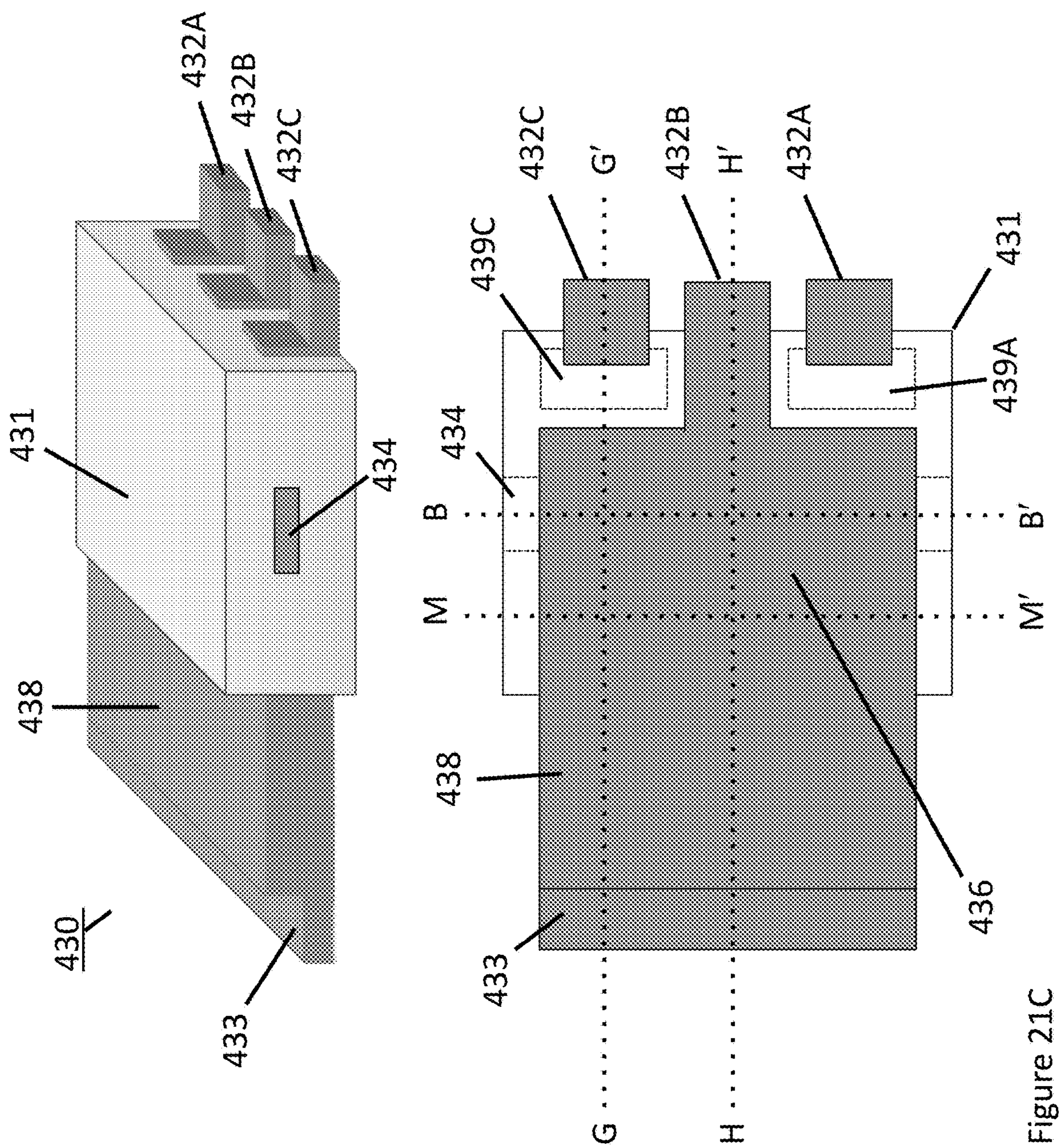
FIG. 21C comprises various views of a 3-footed power USMP with heat tab.

At higher power levels, a heat tab is required to further improve thermal conduction and convective cooling. For example, FIG. 21C illustrates 3-footed single die pad power USMP 430 with heat tab 438. The package includes four feet, namely 432A, 432B, 432C and 433; exposed die pad 436 with heat tab 438 and tie bar 434. To be consistent with conventional DPAK and D2PAK designs, center foot 432B is electrically shorted to exposed die pad as illustrated along cutline H-H' as depicted by the corresponding cross-sectional view shown previously in FIG. 19D. Feet 432A and 432C are electrically isolated from exposed die pad 436 as depicted along cutline G-G' as depicted by the corresponding cross section shown previously in FIG. 19D, with one terminal commonly employed as a gate signal and the other for a high current connection, e.g. the source connection of a power MOSFET. To accommodate additional bond wires for high current conduction, cantilever 439C connected to foot 442C is wider than its corresponding foot. Similarly, cantilever 439A is wider than its corresponding foot 432A. One unique feature of footed USMP power packages as disclosed is the addition of heat tab connected foot 433, enabling wave-solder assembly of a DPAK. In a power package variant 440 shown in FIG. 21D, the center foot may be replaced by tie bar 444B along cutline J-J' as depicted by the corresponding cross section shown previously in FIG. 19E.

Figure 22A:
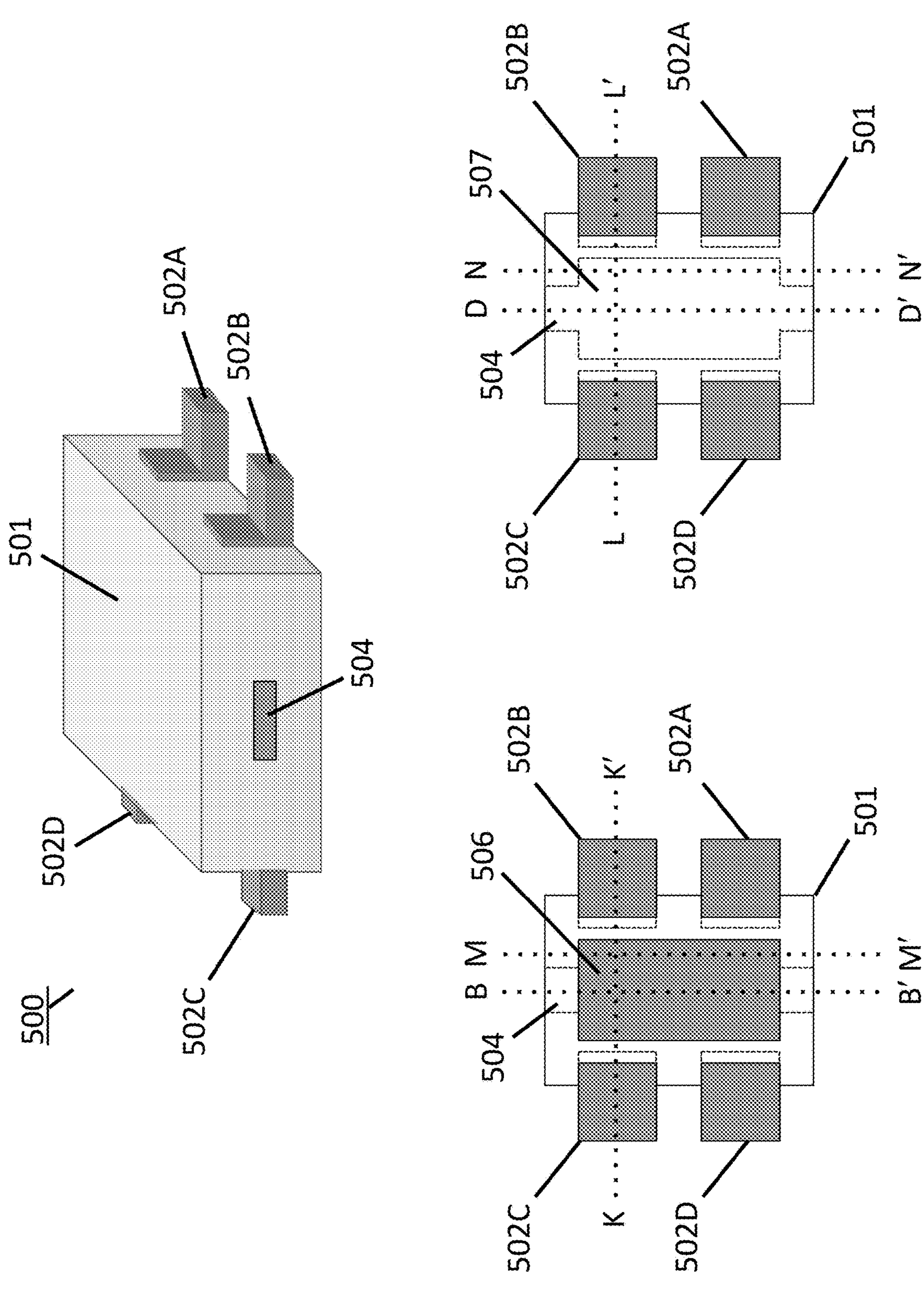
FIG. 22A comprises various views of a 4-footed USMP with isolated and exposed die pads.

For higher pin count dual sided packages applications vary. Packages with 4 to 8 electrical connections often contain linear ICs, power ICs, interface ICs, and even dual MOSFETs, e.g. one N-channel and one P-channel power MOSFET. For example, FIG. 22A illustrates a single die pad 4-footed USMP 500 comprising plastic body 501, feet 502A through 502D, and tie bar 504. The footed package may be realized using an exposed die pad 506 as depicted along widthwise cutline K-K' and lengthwise cutlines B-B' and M-M' as depicted by the corresponding cross-sectional views shown previously in FIG. 19F, FIG. 19B, and FIG. 19G respectively. The footed package may also be realized using a single isolated die pad 507 as depicted along widthwise cutline L-L' and lengthwise cutlines D-D' and N-N' as depicted by the corresponding cross-sectional views shown previously in FIG. 19F, FIG. 19B, and FIG. 19G respectively.

The terms "widthwise" and "lengthwise" are arbitrary descriptions of perpendicular directions and are not intended to restrict or limit the meaning of the invention. In general, the term "length" refers to whichever direction is longer but should not be construed to limit the package's construction flexibility on the orientation of the leadframe relative to the plastic's shape, or the number of feet on the package's longer or shorter edges so long that the design rules of the minimum foot-to-foot spacing and foot to corner spacing are maintained. The allowed foot-to-foot spacing, i.e. the pitch from the center of one foot to its neighbor, varies depending on the capabilities of the PCB factory mounting the USMP rather than on its fabrication.

Inter-feet pitches may vary as required, generally adopting industry standard lead pitch values used in today's gull wing leaded packages. Common center-to-center pitch dimensions may include 0.2 mm, 0.35 mm, 0.4 mm, 0.45 mm, 0.5 mm, 0.8 mm, 1.0 mm, 1.27 mm, and 1.5 mm. In some instances, e.g. in high voltage applications, a larger dimension may be achieved, not by introducing a new pitch, but by omitting one foot from the package while maintaining a standard pitch dimension for the remainder of the package's feet. For example, a USMP fabricated footed package with a standard foot pitch of 0.45 mm can be achieve a 0.9 mm pitch by omitting one foot from the package.

Figure 22B:
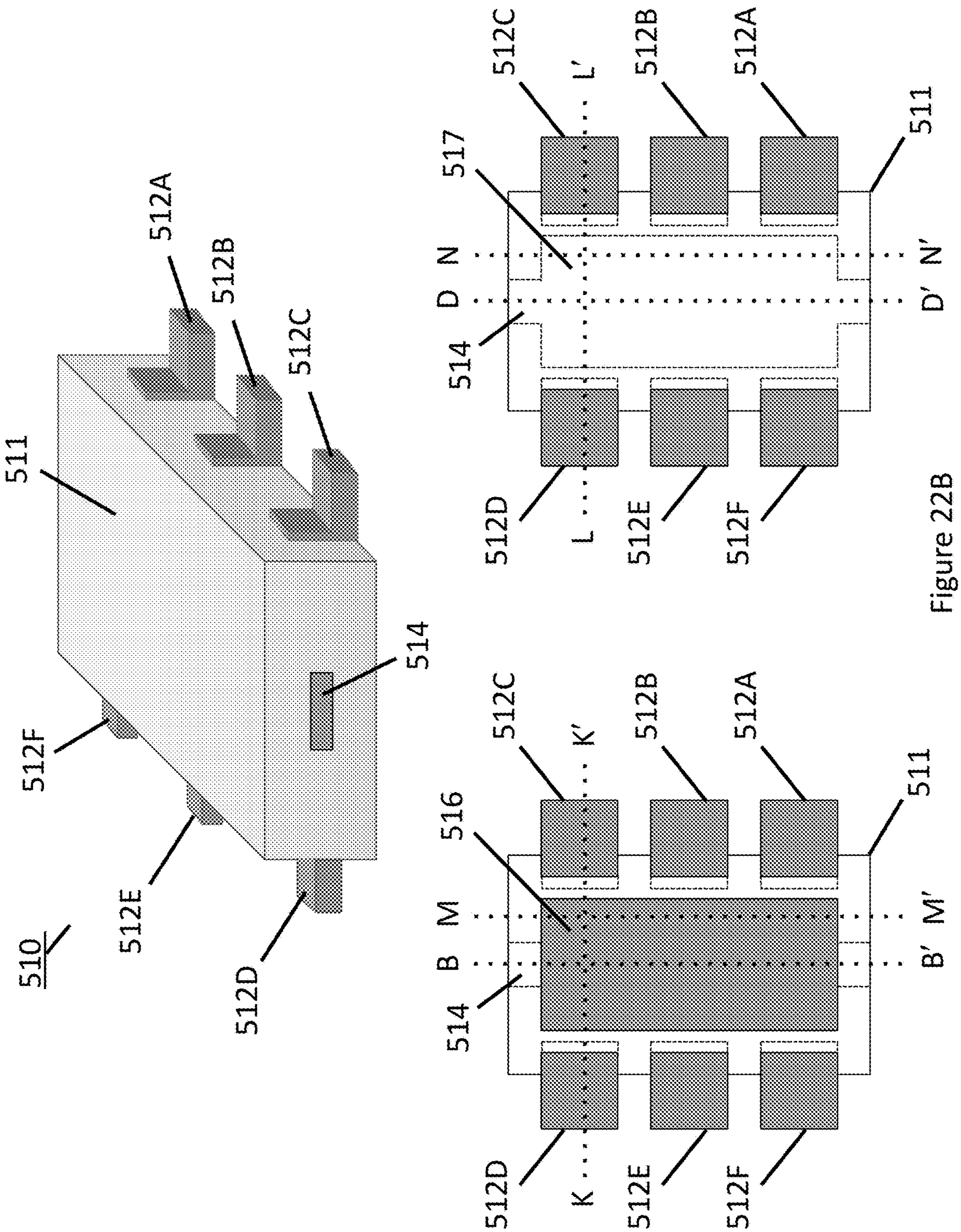
FIG. 22B comprises various views of a 6-footed USMP with isolated and exposed die pads.

FIG. 22B illustrates a single die pad 6-footed USMP 510 comprising plastic body 511, feet 512A through 512F, and tie bar 514. The footed package may be realized using an exposed die pad 516 as depicted along widthwise cutline K-K' and lengthwise cutlines B-B' and M-M' as depicted by the corresponding cross-sectional views shown previously in FIG. 19F, FIG. 19B, and FIG. 19G respectively or with an isolated die pad 517 as depicted along widthwise cutline L-L' and lengthwise cutlines D-D' and N-N' also shown in the same referenced figures.

Figure 22C:
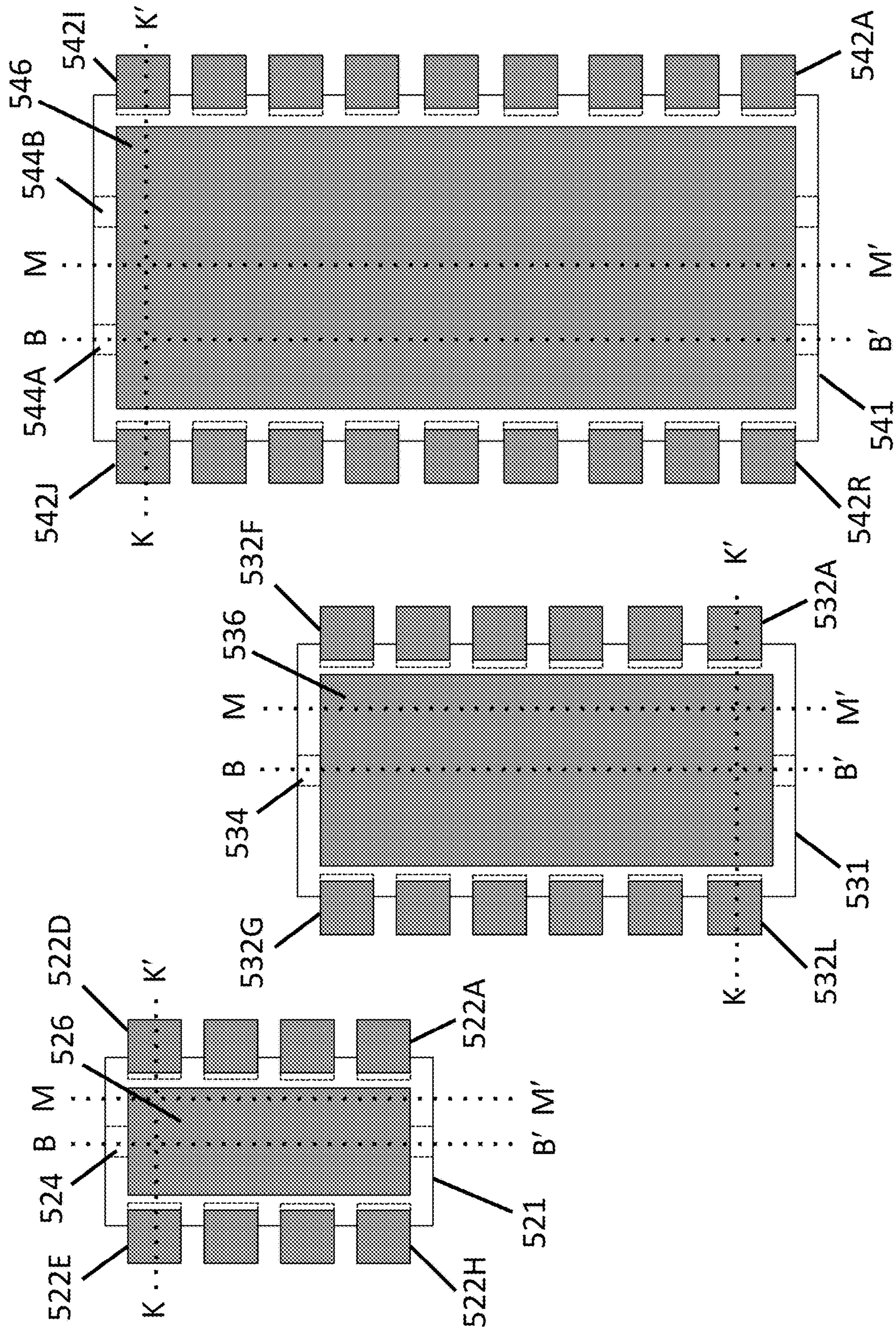
FIG. 22C comprises underside views of 8, 12, and 18-footed USMPs with exposed die pads.

FIG. 22C illustrates underside views of various single die pad USMPs with exposed die pads. An 8-footed package may be realized as shown comprising exposed die pad 526 as depicted along widthwise cutline K-K' and lengthwise cutlines B-B' and M-M' as depicted by the corresponding cross sections shown previously in FIG. 19F, FIG. 19B, and FIG. 19G respectively, with feet 522A through 522H, or similarly in a 12-footed package comprising exposed die pad 536 with feet 532A through 532H, or a 18-footed package comprising exposed die pad 546 with feet 542A through 542R. In the latter case where die pad widens in proportion to the package's length, more than one tie bar may be employed, e.g. tie bars 544A and 544B.

Figure 22D:
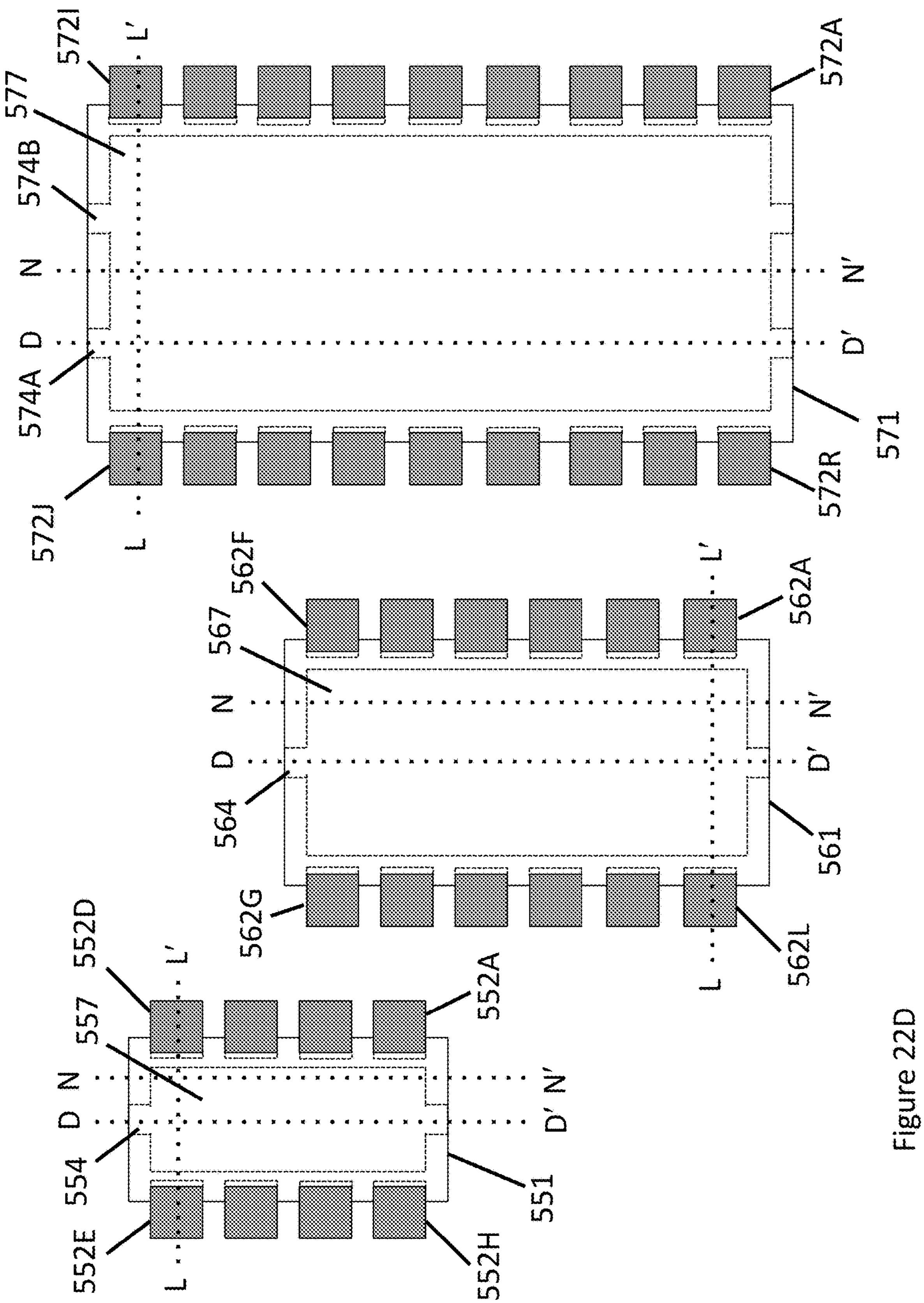
FIG. 22D comprises underside views of 8, 12, and 18-footed USMPs with isolated die pads.

FIG. 22D illustrates underside views of various USMPs with isolated die pads. An 8-footed package may be realized as shown comprising isolated die pad 557 as depicted widthwise along cutline L-L' and lengthwise along cutlines D-D' and N-N" as depicted by the corresponding cross sections shown previously in FIG. 19F, FIG. 19B, and FIG. 19G respectively, with feet 552A through 552H, or similarly in a 12-footed package comprising isolated die pad 567 with feet 562A through 562H, or a 18-footed package comprising isolated die pad 577 with feet 572A through 572R. As described previously, more than one tie bar may be employed to stabilize wide die pads, e.g. tie bars 574A and 574B.

Figure 23A:
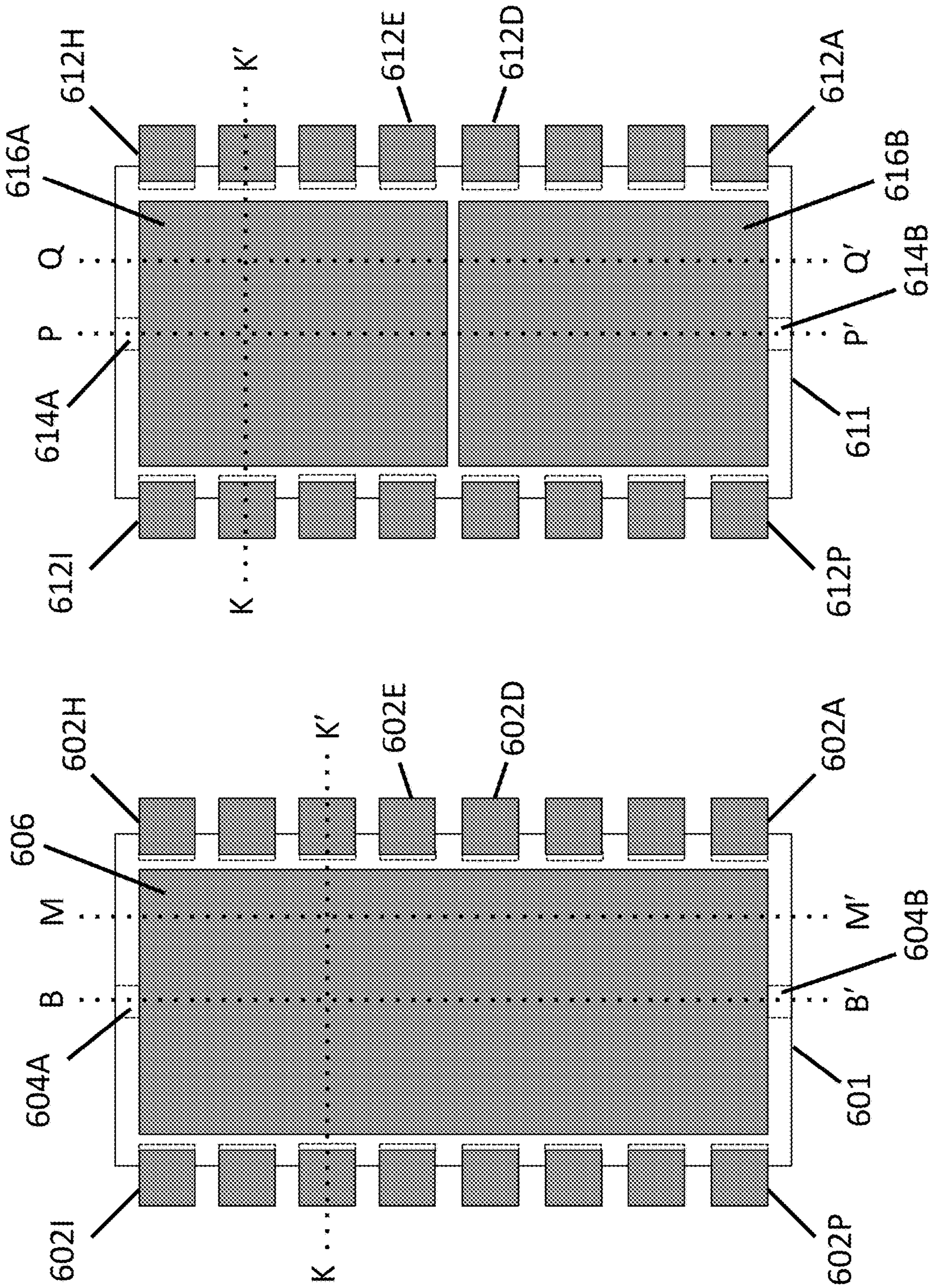
FIG. 23A comprises underside views of 16-footed USMPs with single and dual exposed die pads.

In USMP based technology as disclosed, a wide range of packages can be fabricated using a common fabrication sequence simply by changing the leadframe design. For example a 16-footed dual sided USMP can be used to realize numerous permutations of single or dual exposed, isolated, or mixed die pads of varying sizes and pin outs. FIG. 23A illustrates underside views of 16-footed USMPs with single and dual exposed die pads. The single die pad drawing shown on the left comprises an exposed die pad 606 with feet 602A through 602P. As depicted along widthwise cutline K-K' as depicted by the corresponding cross section shown previously in FIG. 19F, the feet are not connected to the die pad. Lengthwise construction is shown along cutline B-B' through tie bars 604A and 604B and along cutline M-M' transecting only exposed die pad 606 and plastic 601 consistent with the corresponding cross sections shown previously in FIG. 19B and FIG. 19G respectively.

The dual die pad version shown on the right side of FIG. 23A comprises two die pads, namely exposed die pad 616A held in place by tie bar 614A and exposed die pad 616B held in place by tie bar 614B. Lengthwise construction is shown along cutline P-P' through tie bars 614A and 614B and along cutline Q-Q' transecting only exposed die pad 606 and plastic 601 consistent with the corresponding cross sections both shown previously in FIG. 19H. While exposed die pads can be mechanically supported from underneath during wire bonding, the center most ends of die pads 616A and 616B have no tie bar connections and are prone to move during manufacturing, especially during molding. To prevent this problem, the die pads can be connected to any one of the feet, either by a vertical column or by a cantilever. Various combinations of die pad connected feet are shown in subsequent drawings. For example, in the left slide illustration of dual die pad package shown in FIG. 23B, exposed die pad 626A is held in place by tie bar 624 and die pad connected lead 622F. Exposed die pad 626B is held in place by tie bar 624B and die pad connected feet 622B, 622C and 622D, also serving as an electrical connection and a thermal path.

When leads are connected to a die pad, the maximum number of electrical connections of a package is reduced. For example, while the dual pad design of FIG. 23A has 16 distinct feet, it offers 18 electrical connections because die pads 616A and 616B can be electrically connected underneath the die pads through the PCB. In contrast, while the left side illustration of FIG. 23B also has 16 distinct feet, it offers only 14 distinct electrical connections because feet 622B, 622C, 622D and 622F are electrically shorted to the die pads.

Figure 23B:
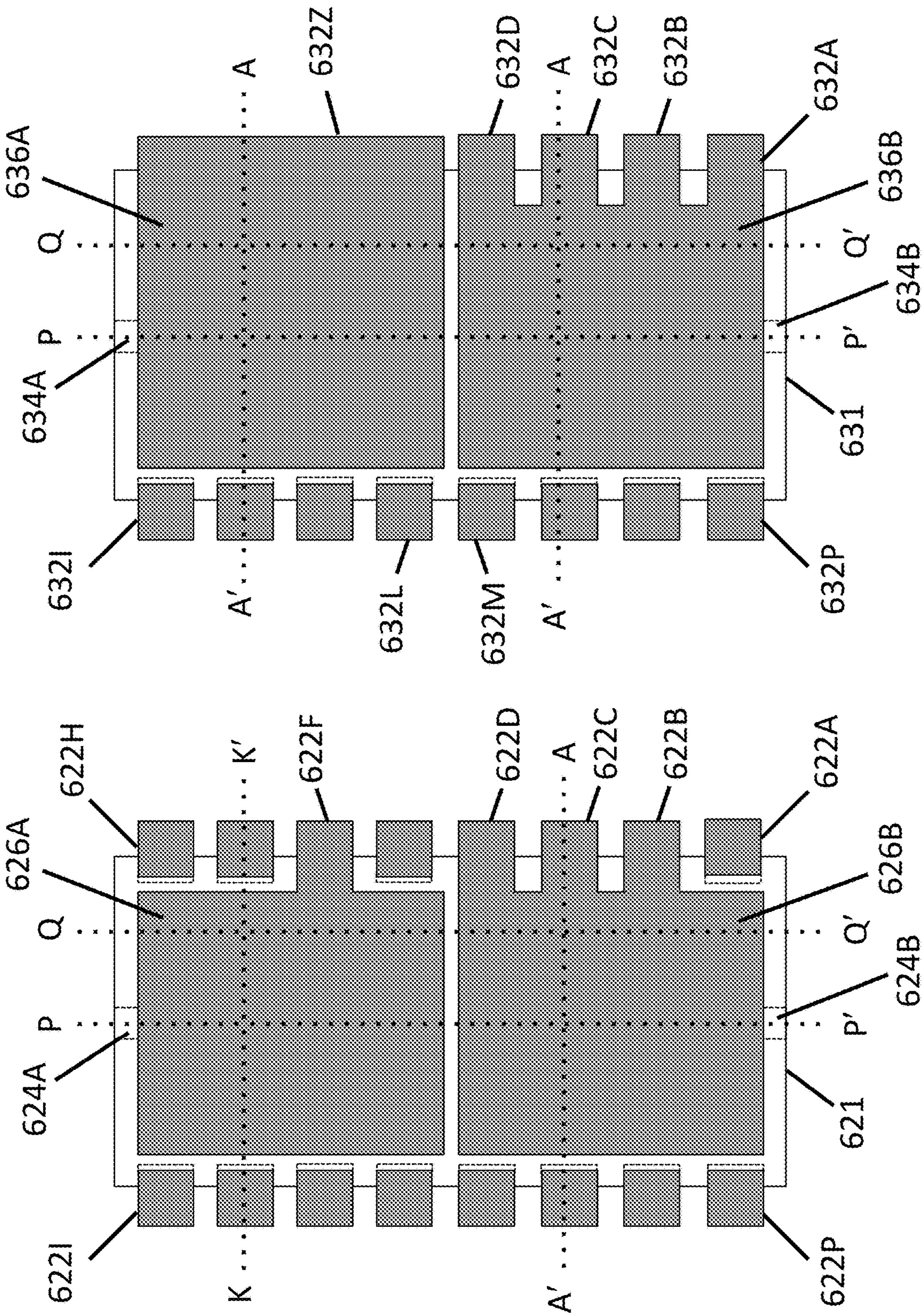
FIG. 23B comprises underside views of alternate embodiments of 16-footed USMPs with dual exposed die pads.
Figure 23C:
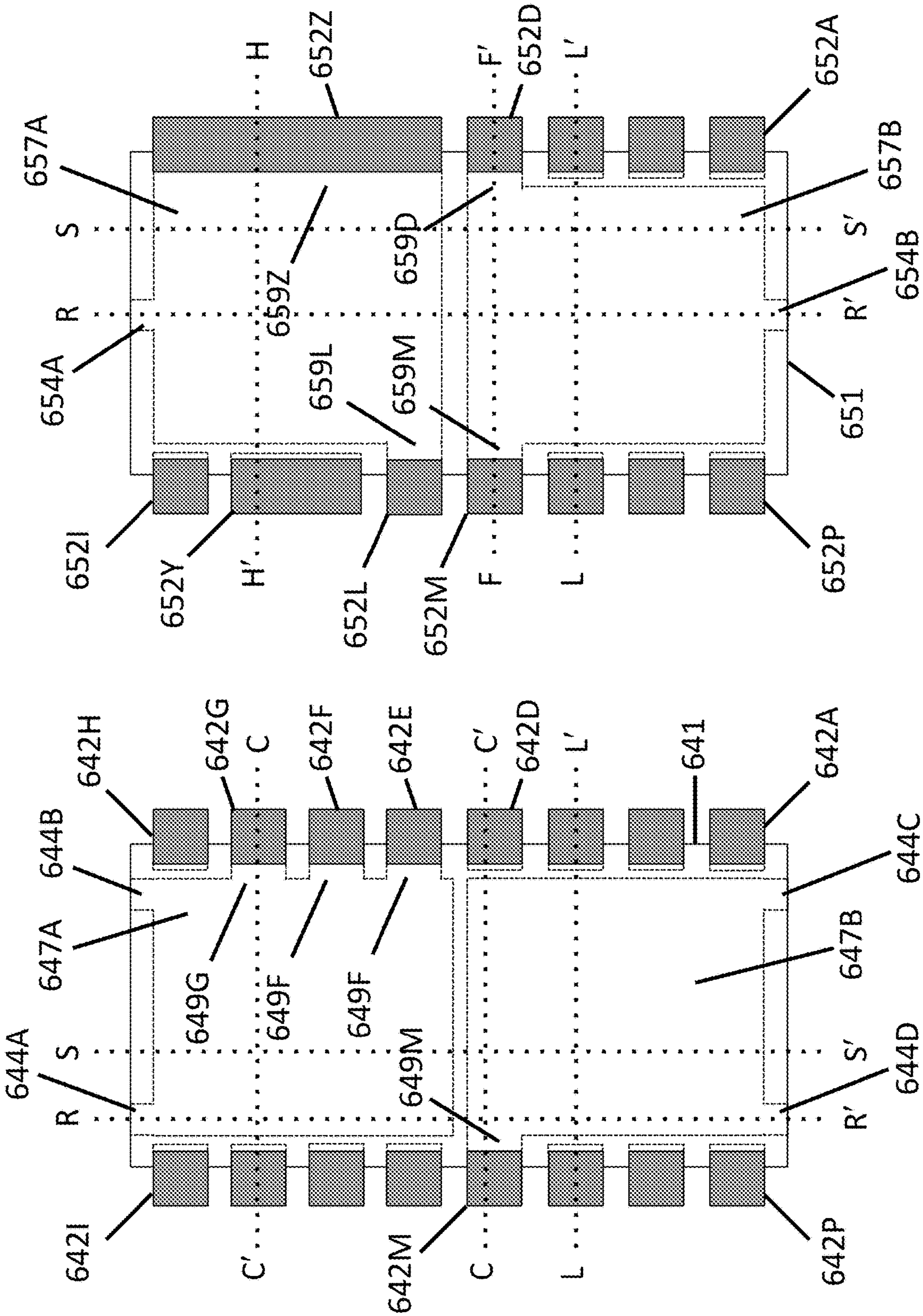
FIG. 23C comprises underside views of 16-footed USMPs with dual isolated die pads.

In the right side illustration of FIG. 23B four feet have merged into one long foot 632Z while die pad connected feet 632A through 632D remain distinct. The resulting package integrates two low thermal resistance die pads 636A and 636B into 13 distinct feet comprising only 10 separate electrical connections. Because of the extra wide foot 632Z, after wave-soldering exposed die pad 636A is capable of conducting higher current and slightly more heat than exposed die pad 636B.

Die pad connected feet may also be employed for USMP fabricated multi-pin packages with isolated pads, except that extra care must be taken in leadframe design to insure stability during wire bonding and during molding. Examples of 16-footed USMPs with dual isolated die pads are shown in the underside views of FIG. 23C. In the left side illustration isolated die pad 647A is stabilized by tie bar 644A and 644B and by die pad connected feet 642E, 642F, and 642G. As depicted along widthwise cutline C-C' or by its cross section in FIG. 19A, the feet connect to die pad 647A with corresponding cantilever sections 642E, 642F, and 642G. Similarly, cantilever section 649M connects foot 642M to isolated die pad 647B, together with tie bars 644C and 644D stabilizes isolated die pad 647B. The resulting USMP has 16 distinct feet supporting up to 14 unique electrical connections As shown in the right side illustration of FIG. 23C, added stability can be gained by utilizing opposing feet as depicted along widthwise cutline F-F' and shown by its corresponding cross section in FIG. 19C, where foot 652D and connecting cantilever 659D, foot 652M and connecting cantilever 659M, and tie bar 654B together form a triangle supporting isolated die pad 657B. The same concept is used for isolated die pad 657A comprising die pad connected wide foot 652Z, opposing foot 652L connected to the die pad by cantilever section 659L, which together with tie bar 654A stabilize isolated die pad 657A. Wide feet 652Z and 652Y are designed to accommodate integrating a vertical power device such as a power MOSFET where feet 652Z and 652L together conduct the die's backside drain current and heat while foot 652Y supports multiple bonding wires needed for bonding the die's topside high current source connection.

Figure 23D:
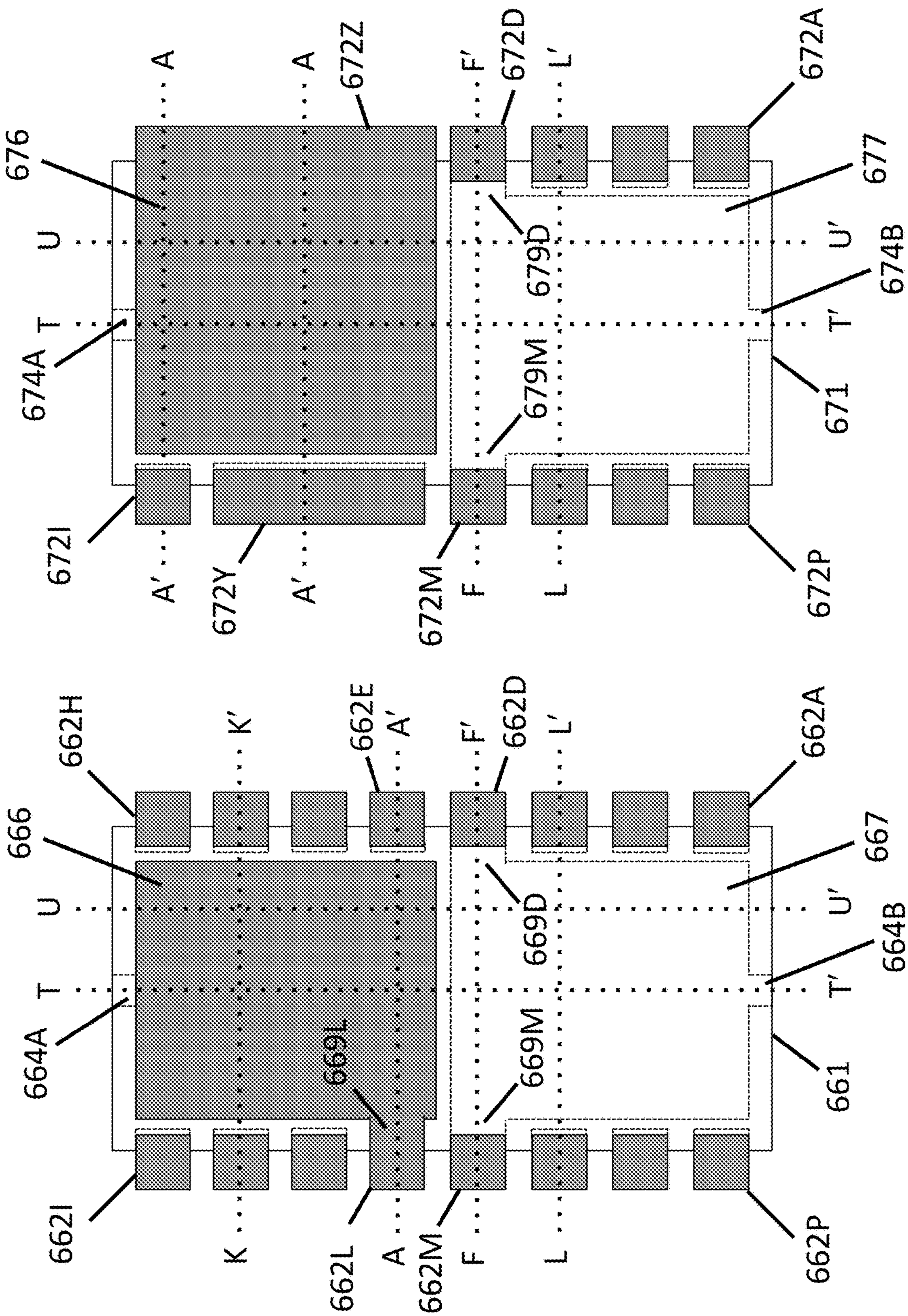
FIG. 23D comprises underside views of 16-footed USMPs integrating isolated and exposed die pads.

The aforementioned concepts for isolated and exposed die pads may be combined in dual die pad packages such as those shown underside views of 16-footed USMPs shown in FIG. 23D. In the left side illustration, exposed die pad 666 is connected to foot 662L with vertical column 669L and by tie bar 664A. Foot 662D with connecting cantilever 669D, opposing foot 662M with connecting cantilever 669M, and tie bar 664B together form a triangle supporting isolated die pad 667. The USMP comprises 16 distinct feet supporting 15 unique electrical connections.

In the right side illustration of FIG. 23D, exposed die pad 676 extends beyond plastic 671 to form wide foot 672Z. By merging wide foot 672Z with die pad 676 and eliminating the required clearance of the die pad within plastic 671, the maximum die size can be increased allowing lower resistance devices to be packaged. Wide foot 672Y is positioned on the opposing side of the package in order to facilitate multiple bond wires for high current connections.

Another consideration is the minimum allowable space between exposed die pads on a PCB. Some printed circuit board manufacturers restrict the minimum allowed space between PCB landing pads especially for die attaching components not suitable for optical inspection. This issue can be especially problematic for dual die pad packages. One solution is to locate the die attach locations for dual die pads at a sufficient distance that electrical shorts are highly improbable without restricting the dice's maximum available die sizes. As shown in the left side illustration of FIG. 24A, the space between exposed die pads 686A and 686B can be enhanced by separating the exposed die pads and replacing the unused space with cantilever extensions 689A and 689B.

As identified along lengthwise cutlines W1-W1' and W2-W2' in this manner the distance is increased without sacrificing the maximum die size. The construction of lengthwise cutlines W1-W1' and W2-W2' are shown in cross section in FIG. 24C where exposed die pad 686A is attached to a cantilever extension 689A spanning a portion of the intervening gap between it and the other exposed die pad. Similarly cantilever extension 689B spans a portion of the intervening gap between exposed die pad 686B and the exposed die pad 686A. The result of these changes increases the width of plastic 681 and reduces the risk of PCB shorts.

Figure 24A:
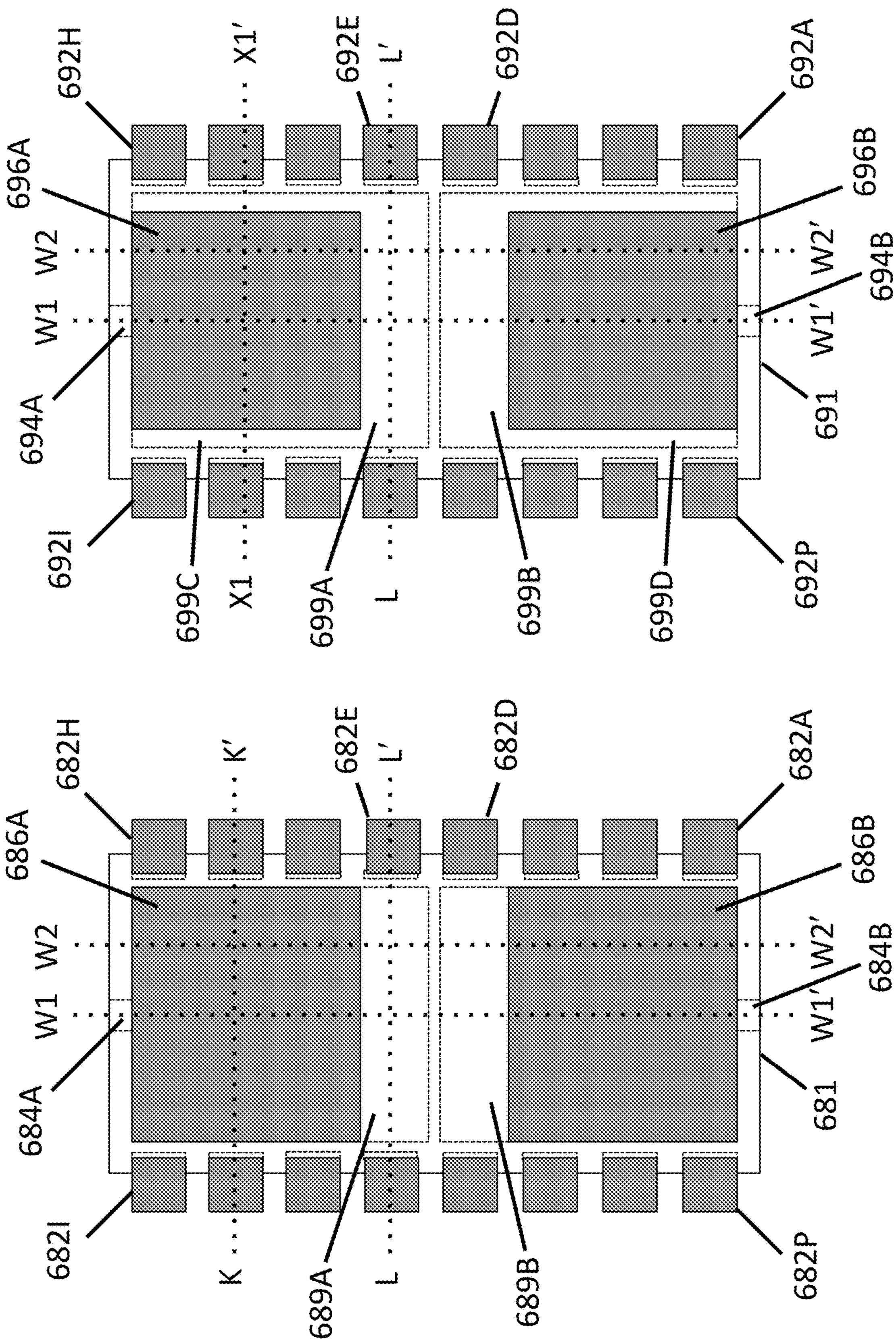
FIG. 24A comprises underside views of 16-footed USMPs integrating dual exposed die pads with enhanced pad-to-pad spacing.

As shown in the right side illustration of FIG. 24A, the space between the feet 692E through 692P and die pad 696L can also be increased in the same manner by surrounding exposed die pad 696A on three sides by cantilever extension 699A in the lengthwise direction and by cantilever extensions 699C in the widthwise direction. The space between exposed die pad 699D and its adjacent feet, i.e. feet 692A through 692D and 692M through 692P, can be increased in the same manner by surrounding exposed die pad 696B by cantilever extension 699B in the lengthwise direction and by cantilever extensions 699D in the widthwise directions as depicted along widthwise cutline X1-X1'. The construction at widthwise cutline X1-X1' shown in cross section in FIG. 24E where cantilever extensions 719C increase the width of plastic 711 and reduce the risk of a PCB short.

Figure 24B:
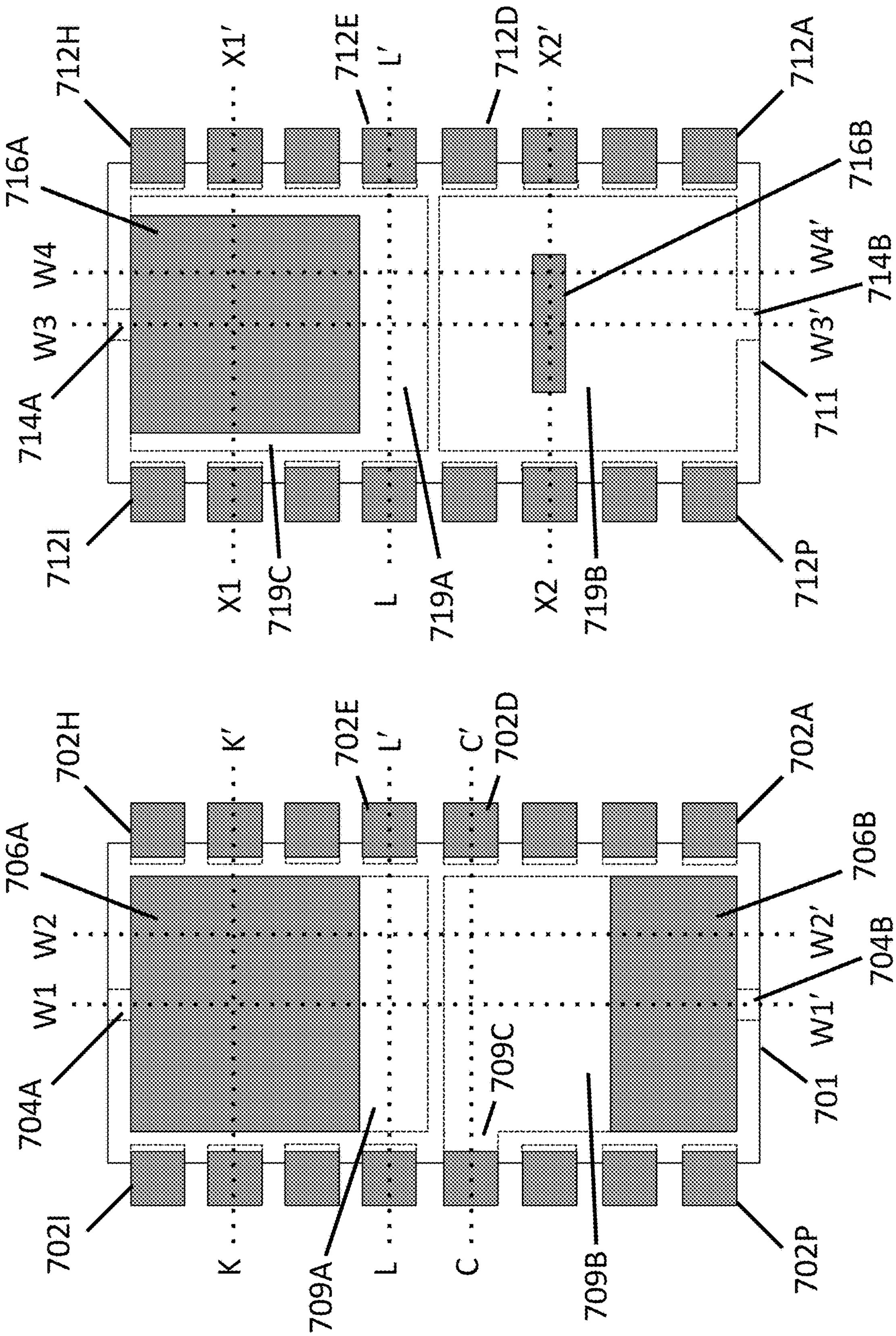
FIG. 24B comprises underside views of alternative embodiments of 16-footed USMPs integrating dual exposed die pads with enhanced pad-to-pad spacing.
Figure 24C:
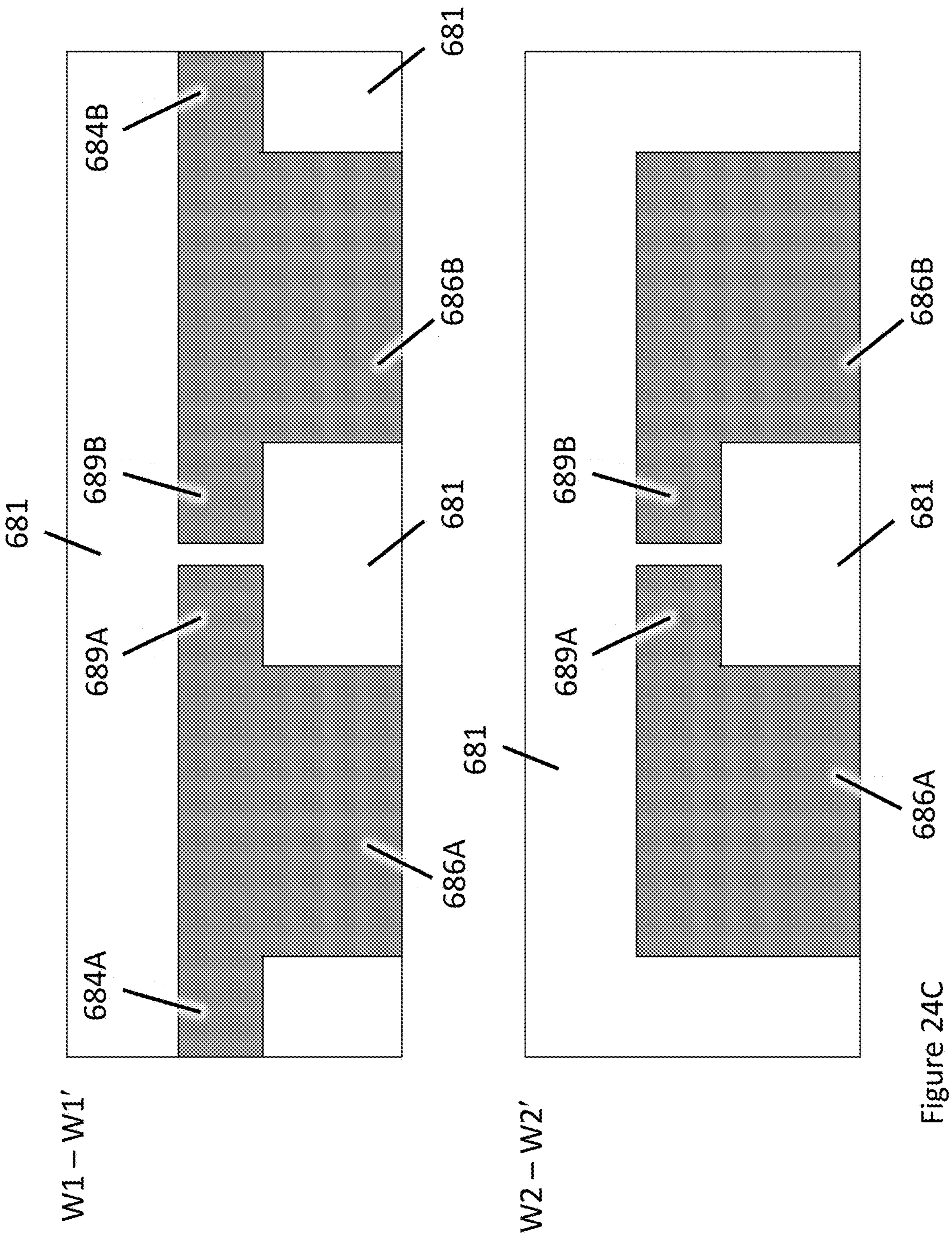
FIG. 24C comprises cross sectional views of 16-footed USMPs integrating dual exposed die pads with enhanced pad-to-pad spacing.
Figure 24D:
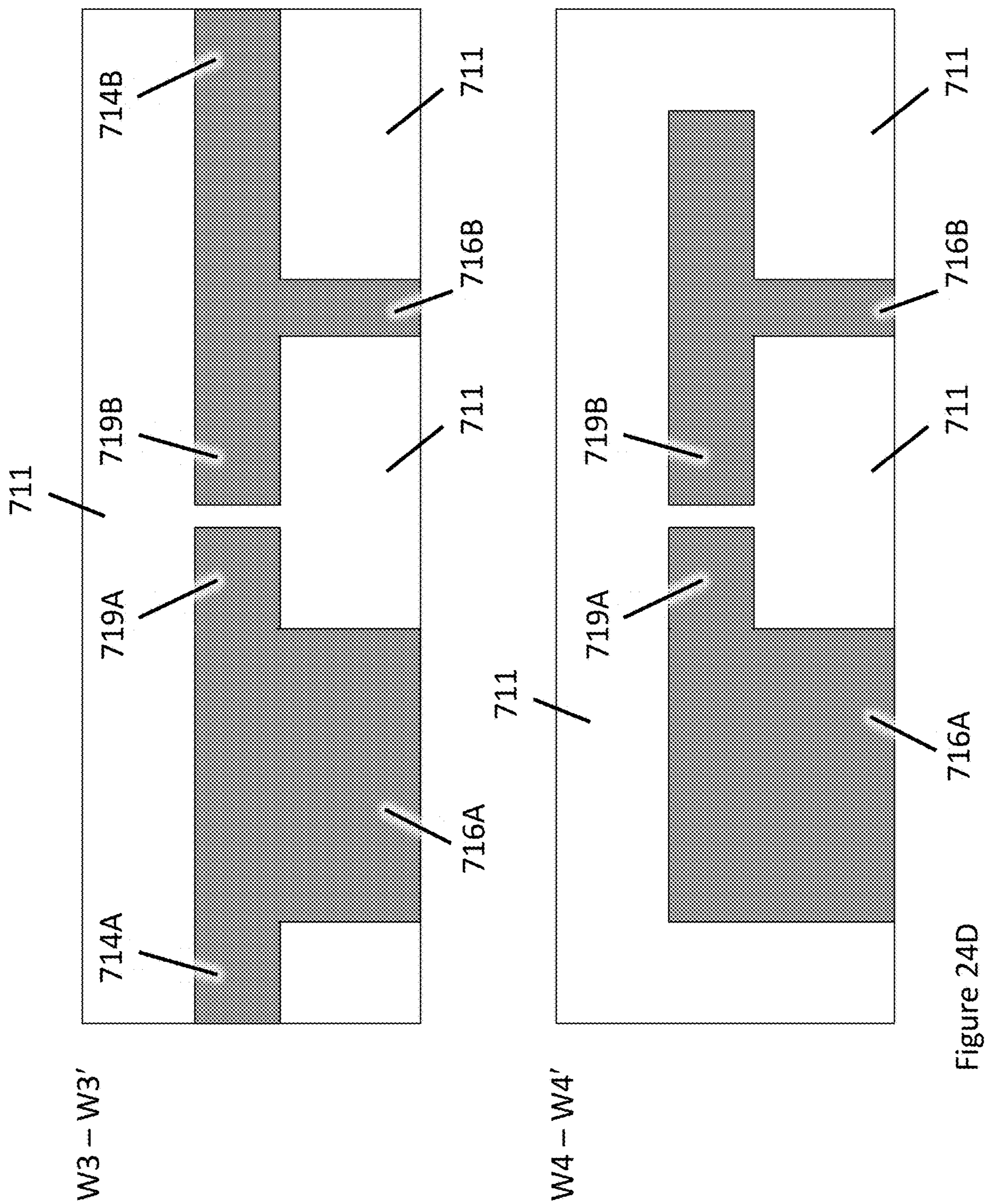
FIG. 24D comprises cross sectional views of alternative embodiments of 16-footed USMPs integrating dual exposed die pads with enhanced pad-to-pad spacing.
Figure 24E:
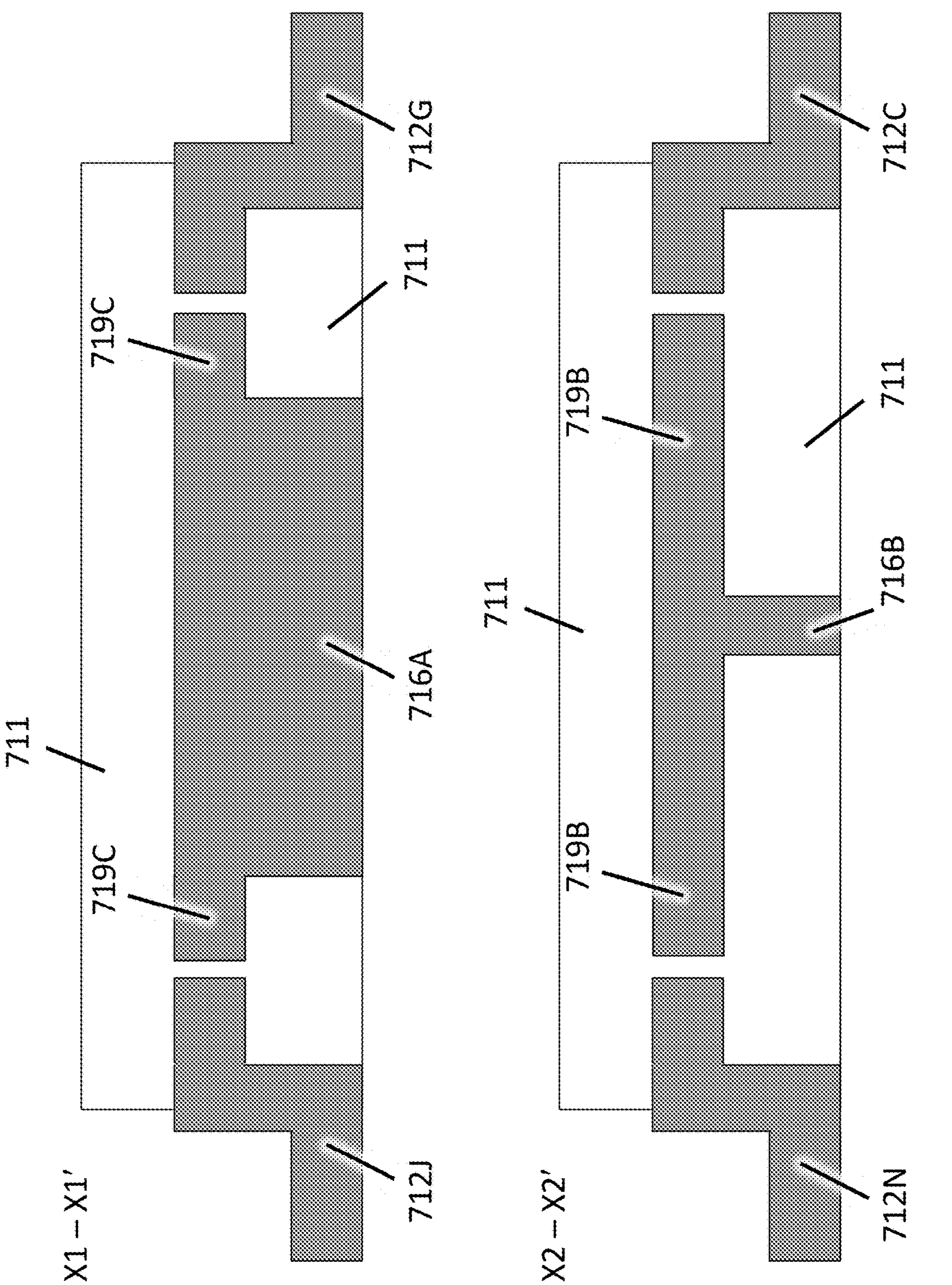
FIG. 24E comprises cross sectional views of alternative embodiments of 16-footed USMPs integrating dual exposed die pads with enhanced pad-to-pad spacing.

The left side drawing of FIG. 24B illustrates that the cantilever extensions can be asymmetric, where cantilever extension 709A connected to exposed die pad 706A is has a length shorter than cantilever extension 709B connected to exposed die pad 706B. To support its greater length, cantilever extension 709B connects to foot 702M with cantilever bridge 709C. The construction at cutlines W1-W1' and W2-W2' in FIG. 24B are depicted in the cross-sectional views in FIG. 24C except that the lengths of cantilever extensions 709A and 709B, referred to by corresponding cantilever extensions 689A and 689B at cutline W2-W2' in the cross section of FIG. 24C, have not been adjusted to have dissimilar lengths.

In an alternative embodiment shown the right side drawing of FIG. 24B enhanced cantilever extensions 719A and 719C surround three edges of exposed die pad 716A. Exposed die pad 716B is surrounded by cantilever extension 719B as depicted along widthwise cutline X2-X2' shown in cross section in FIG. 24E and by lengthwise cutlines W3-W3' and W4-W4 shown in FIG. 24D. In both drawings the distance of exposed die pad 716B to the nearest conductor, either to feet 712J and 712G or to the other exposed die pad 716A, is greatly increased and the width of plastic 711 is significantly widened.

Figure 24F:
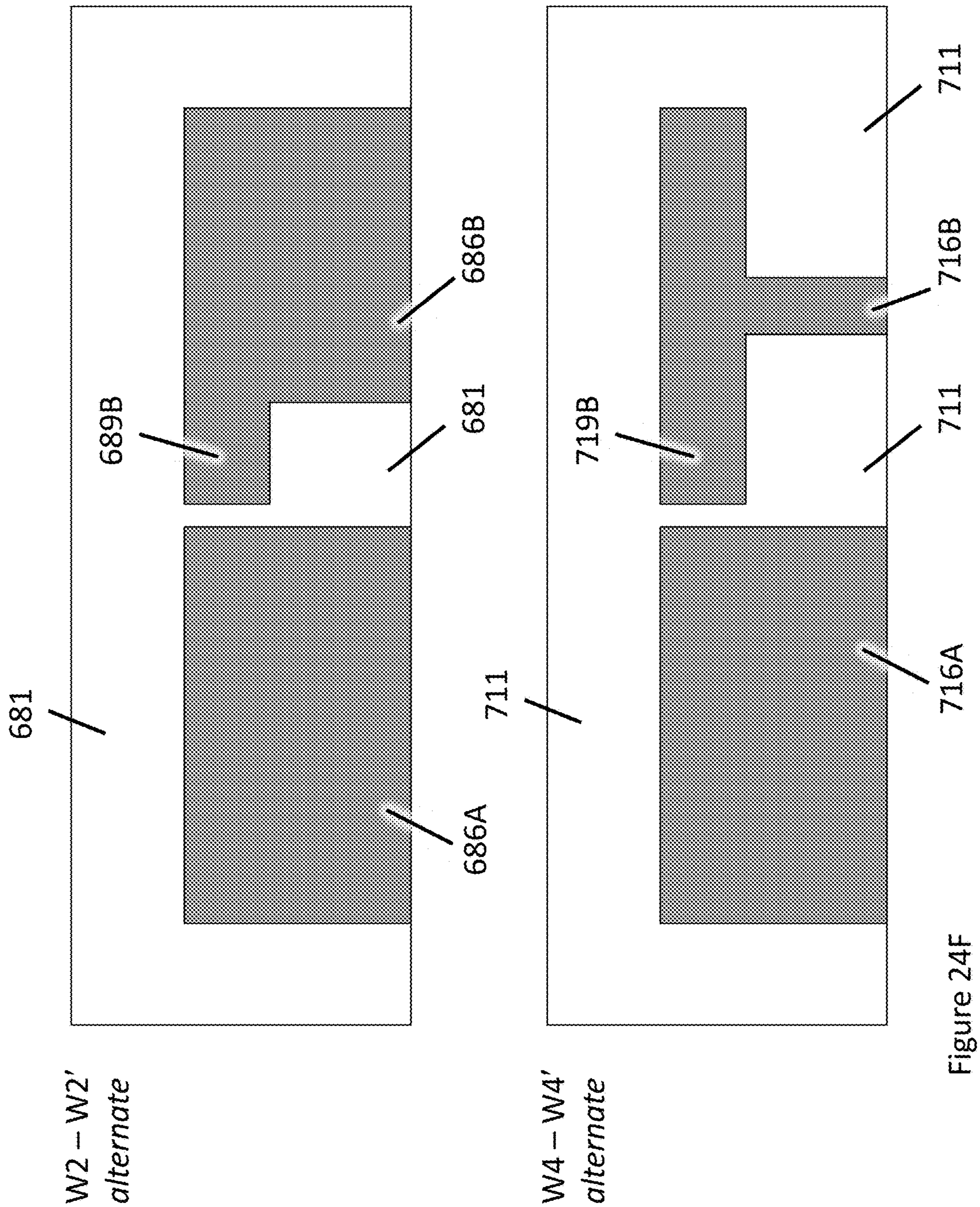
FIG. 24F comprises cross sectional views of alternative embodiments of 16-footed USMPs integrating dual exposed die pads with enhanced pad-to-pad spacing.

In an alternate embodiment, only one die pad is reduced in size and the other remains unchanged. Examples of this method are illustrated in FIG. 24F where in cross section W2-W2' exposed die pad 686A remains unchanged while exposed die pad 686B is reduced in size and connected on one edge to cantilever extension 698B increasing the width of plastic 681. In cross section W4-W4' exposed die pad 716A remains unchanged while exposed die pad 716B is reduced in size and surrounded by cantilever extension 719B increasing the width of plastic 711.

USMP fabricated dual packages can also include the use of cantilever extensions also referred to herein as cantilever interconnections, cantilever beams, or cantilever beam interconnections, to improve wire bonding and package to die interconnections. Cantilever beam interconnections facilitate improved access to hard-to-reach portions of an IC, circumventing bonding angle limitations, minimizing bond wire length, and reducing stray inductance and parasitic resistance. Examples of cantilever beam interconnections are illustrated in FIG. 25A for 16-footed USMPs integrating various combinations of exposed and isolated die pads with isolated cantilever extensions.

In the left side illustration, cantilever extensions 759A, 759H, 759I, and 759P surround die pad 756, expanding available wire bond locations to facilitate improved bonding angles. In this manner, wire bonding from all four sides of a semiconductor die can be achieved in a dual-sided package, facilitating product in a dual-sided package previously possible only in a quad package. To support stable wire bonding and prevent dislocation of an isolated cantilever beam during manufacturing the beams are secured in at least two points in the package. For example, cantilever beam 759A is supported by tie bar 754A on one side and connects to foot 752A on its other end. Wire bonds from cantilever beam 754A therefore can reach semiconductor die bonding pads located adjacent to the bottom edge of die pad 756 that were previously not connectible by a direct bond from foot 752A.

Figure 24G:
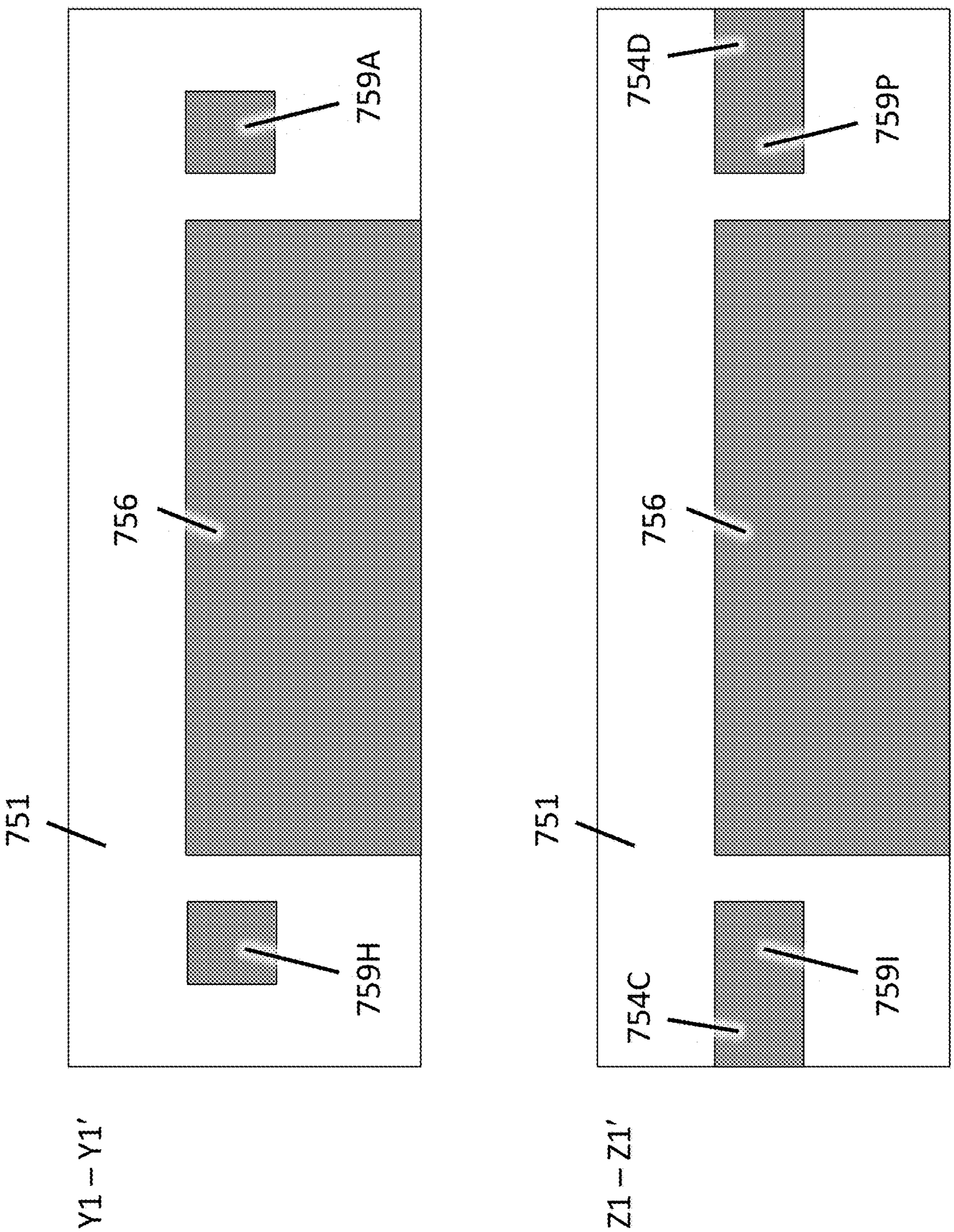
FIG. 24G comprises cross sectional views of a 16-footed USMPs integrating a single exposed die pad with cantilever lead extensions.
Figure 24H:
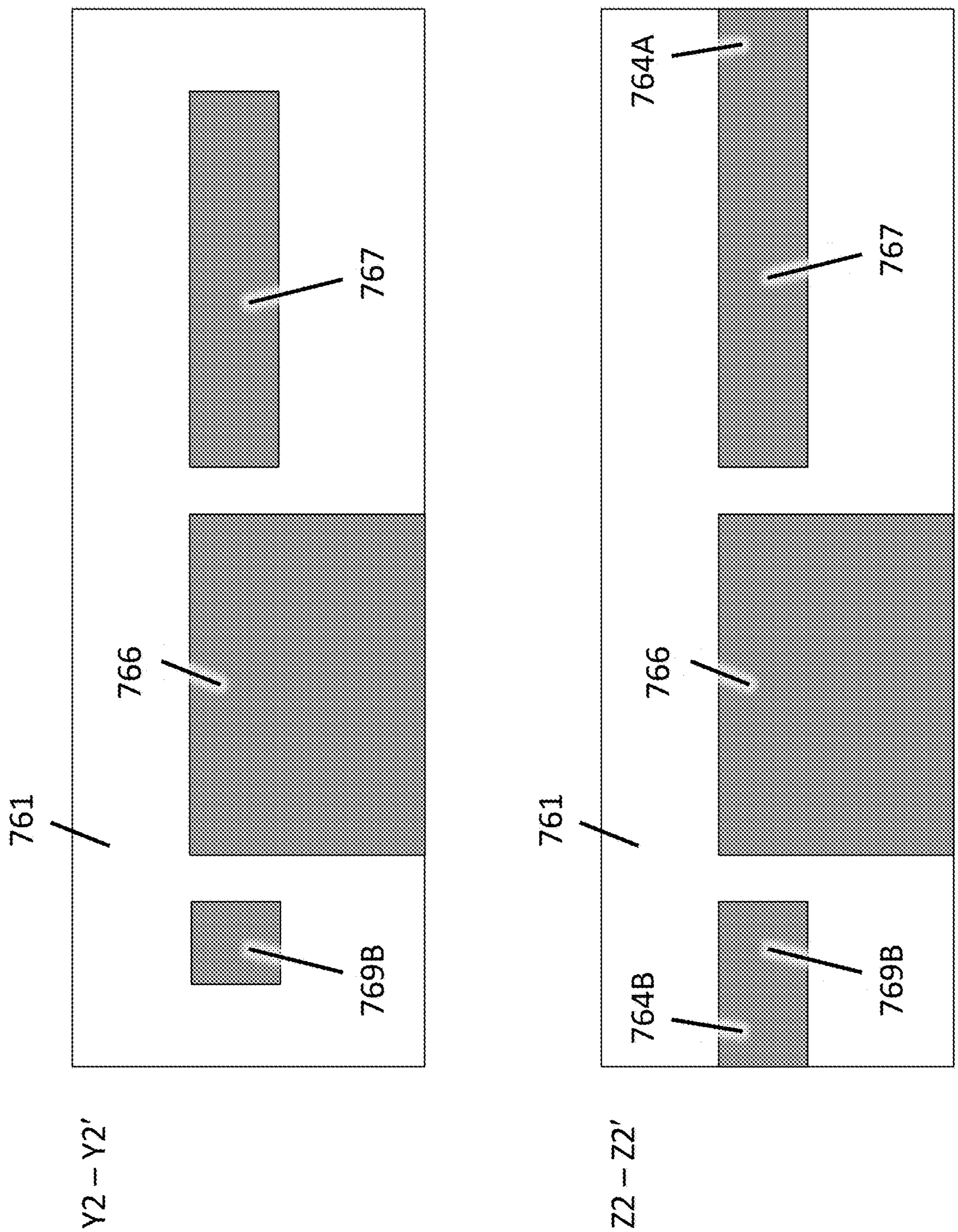
FIG. 24H comprises cross sectional views of a 16-footed USMPs integrating an exposed die pad, an isolated die pad, and a cantilever lead extension FIG. 24I comprises cross sectional views of an alternative embodiments of 16-footed USMPs integrating an exposed die pad, an isolated die pad, and a cantilever lead extension FIG. 24J comprises cross sectional views of other alternative embodiments of 16-footed USMPs integrating an exposed die pad, an isolated die pad, and a cantilever lead extension FIG. 25A comprises underside views of 16-footed USMPs integrating exposed die pads with isolated interconnections.
Figure 24I:
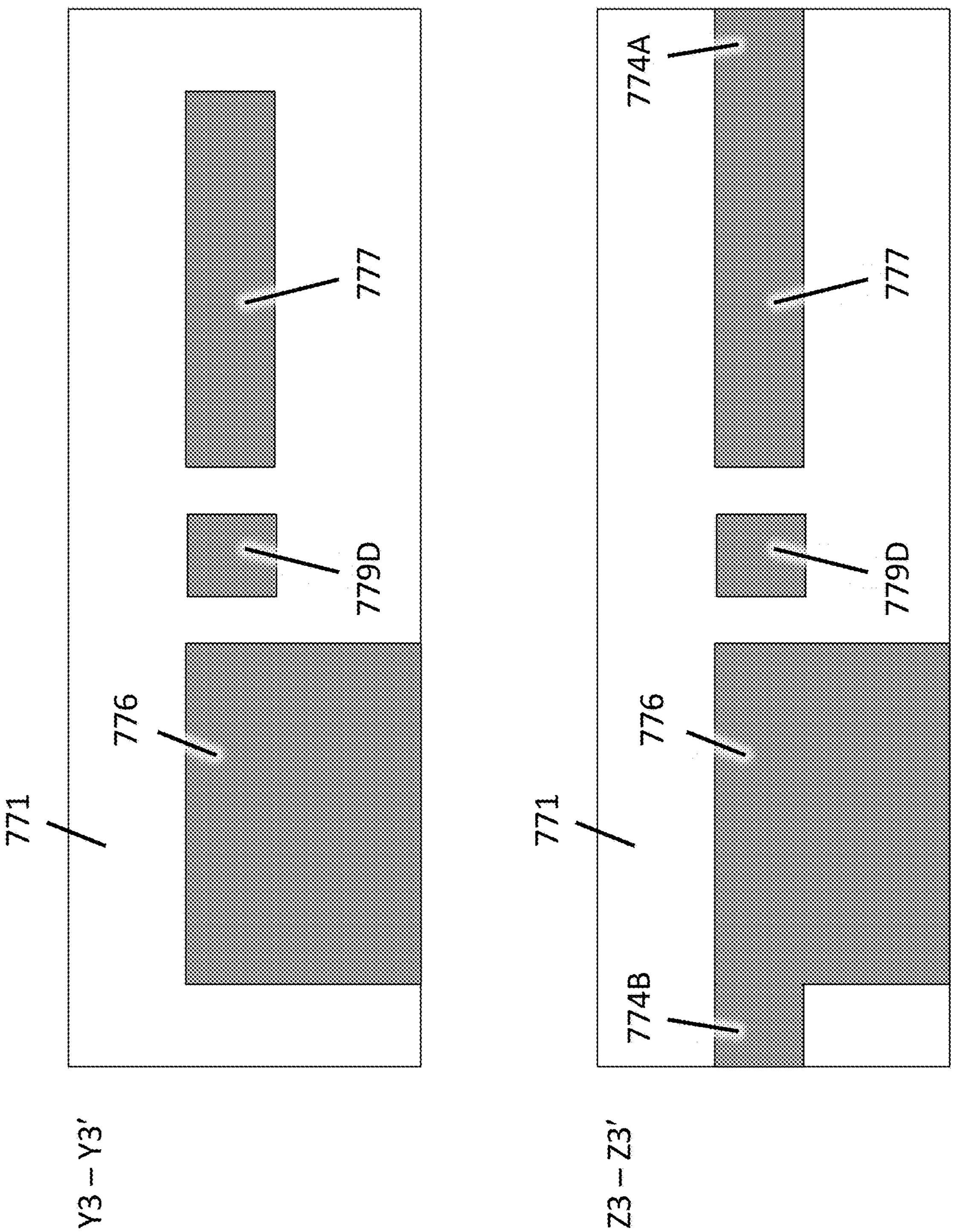
Figure 24J:
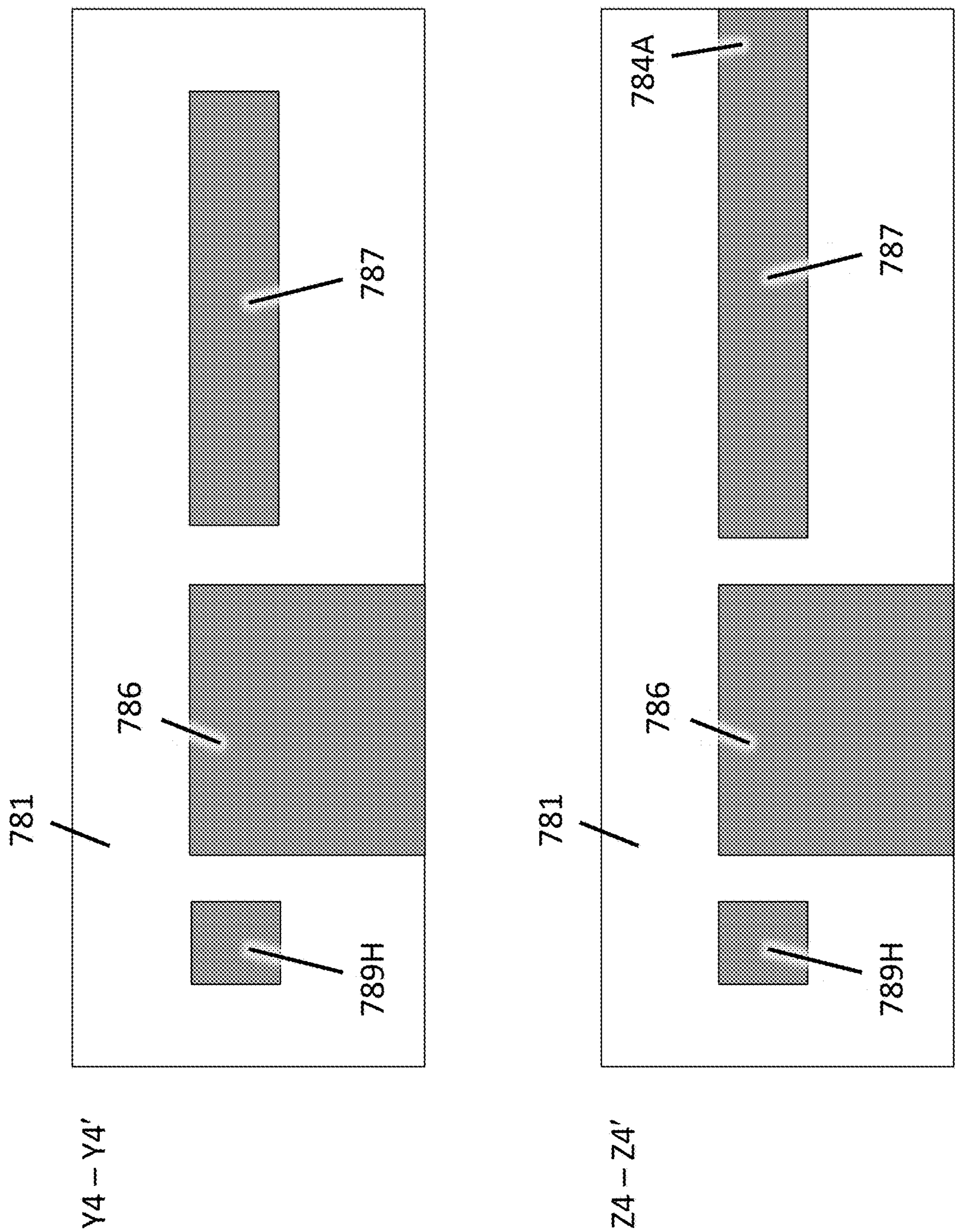

Similarly, cantilever beam 759H is supported by tie bar 754B on one side and by foot 752H on its other end, cantilever beam 759I is suspended between tie bar 754C and foot 752I, and cantilever beam 759P is suspended between tie bar 754D and foot 752P. Cutlines V-V' identify the widthwise structure of the package, while cutlines Z1-Z1' and Y1-Y1' identify the lengthwise structure transecting and transecting the tie bars, as depicted in FIG. 24G including cantilever beam extension 759H, exposed die pad 756, and cantilever beam extension 759A In cutline Z1-Z1', cantilever beam extension 759I is indistinguishable by cross section from tie bar 754C, and similarly cantilever beam extension 759P is indistinguishable by cross section from tie bar 754D. The cross section of cutline V-V' shown in FIG. 19L illustrates the widthwise cross section of dual cantilever beam structure, where cantilever extension 353L connects to foot 352A through vertical column 354A, and where cantilever extension 353M connects to foot 352B through vertical column 354B.

Figure 25A:
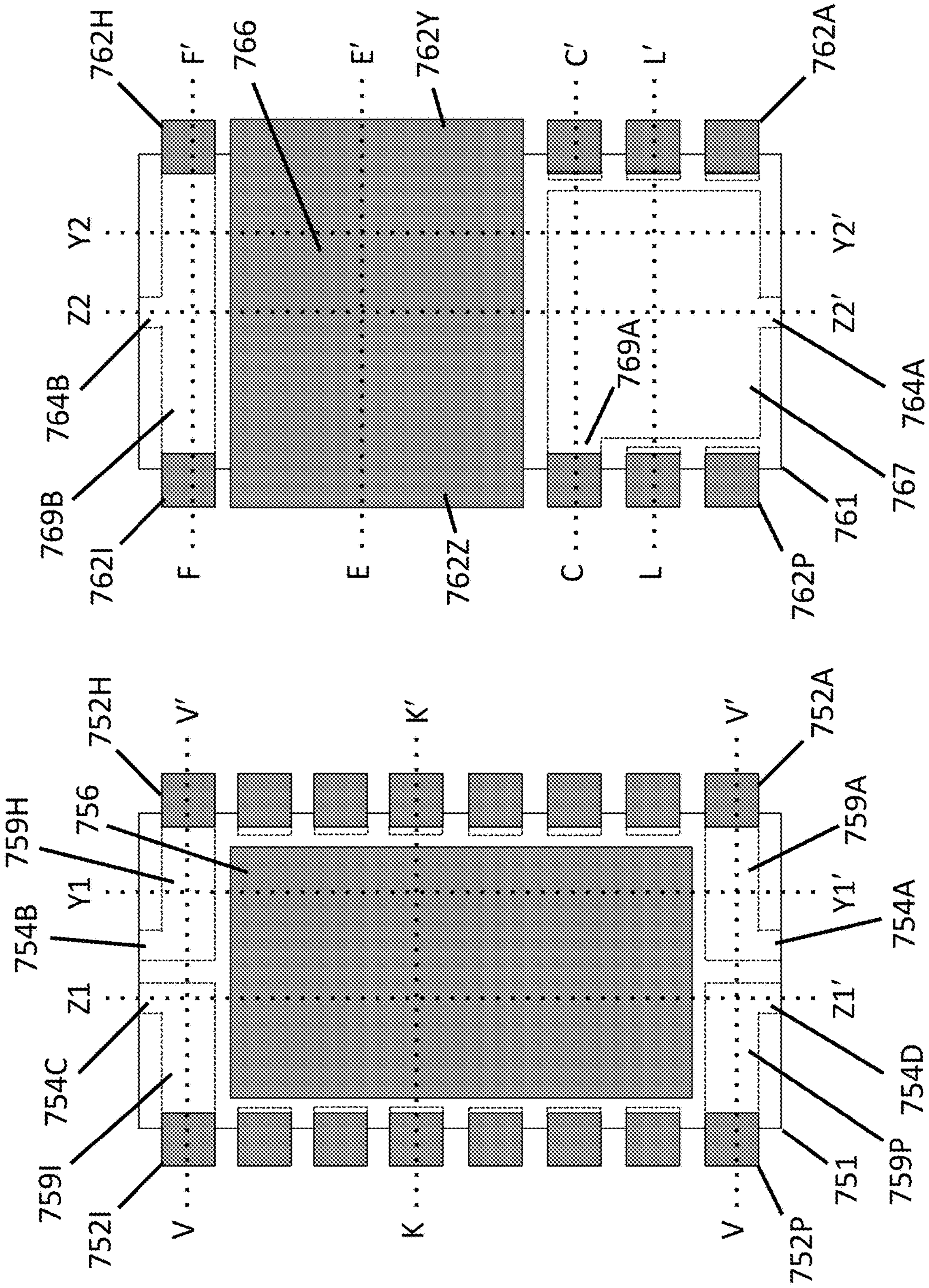
FIG. 25B comprises underside views of alternative embodiments of 16-footed USMPs integrating dual exposed die pads with isolated interconnections.

In the right side illustration of FIG. 25A, isolated cantilever beam extension 769B is suspended between feet 762H and 7621 and further supported by tie bar 764B in order to facilitate easy bonding wire access to any semiconductor die (not shown) mounted on exposed die pad 766. Although the identifying element numbers are different, the cross sectional structure of cutline F-F' is depicted in FIG. 19C. To facilitate improve thermal conduction and maximize die size die pad 766 is merged with feet 762Y and 762Z. Isolated die pad 767 is supported in two points—by cantilever bridge 769A connected to foot 762N and by tie bar 764A. The lengthwise cross sections of this package and leadframe identified by cutlines Y2-Y2' and Z2-Z2' are depicted in the cross sections of FIG. 24H including cantilever beam extension 769B, exposed die pad 766, and isolated die pad 767. In cutline Z2-Z2', cantilever beam extension 769B is indistinguishable by cross section from tie bar 764B, and isolated die pad 767 is indistinguishable by cross section from tie bar 764A.

A wide range of possible leadframes can be realized using isolated cantilever beam extensions. For example FIG. 25B comprises underside views of two alternative embodiments of 16-footed USMPs integrating dual exposed die pads with isolated interconnections. The illustration on the left comprises two die pads, i.e. exposed die pad 776 and isolated die pad 777, with an intervening isolated cantilever beam 779D suspended between feet 772D and 772M identified along cutline F-F' as depicted in FIG. 19C. The lengthwise cross sections of this package and leadframe identified by cutlines Y3-Y3' and Z3-Z3' are depicted in the cross sections of FIG. 24I.

Figure 25B:
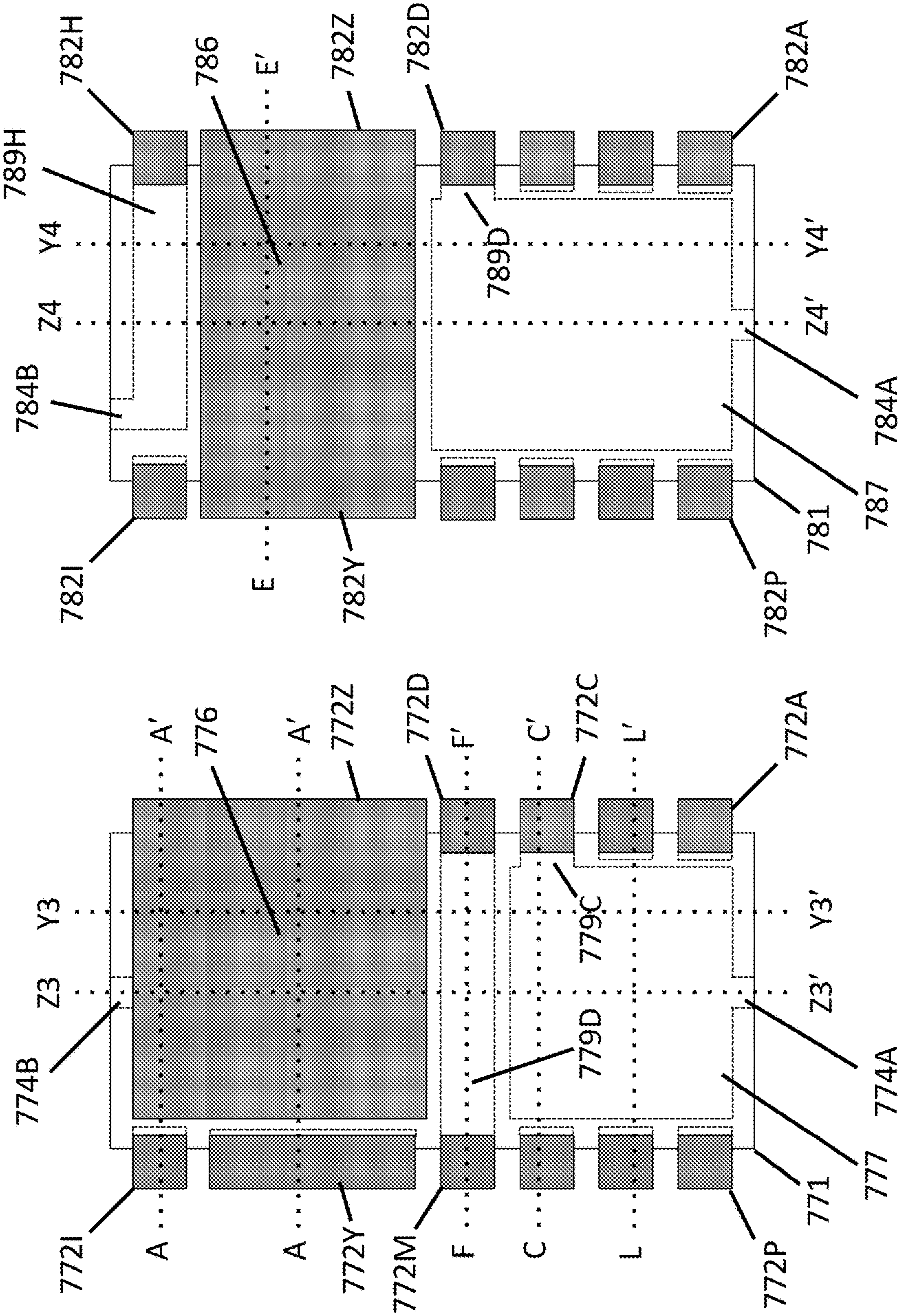

The illustration on the right side of FIG. 25B comprises two die pads, i.e. exposed die pad 786 and isolated die pad 787, with an isolated cantilever beam 789H suspended between foot 782H and tie bar 784B at the top of the package. A cross-sectional view of isolated cantilever beam 789H is depicted by cutline C-C' shown in FIG. 19A. The lengthwise cross sections of this package and leadframe identified by cutlines Y4-Y4' and Z4-Z4' are depicted in the cross sections of FIG. 24J.

While the examples and applications of isolated cantilever beam extensions shown are illustrated using 16-footed USMP designs, the concept and method can be extended to virtually any USMP with more than three feet, and as such, the number of electrical connections are not limited to the examples shown.

Examples of Quad USMP Footed Packages

The following illustrations depict a variety of four-sided, i.e. quad package constructions that can be fabricated with the USMP process and methods disclosed herein. A quad package is a package where leads or feet are present on three of four sides of the package. Quad packages may be square or rectangular. The drawings generally include a perspective illustration of the package and two underside illustrations—one using an exposed die pad version, the other comprising an isolated die pad version of the same package. In most cases the perspective view is identical for both the exposed die pad and isolated versions.

The relevant cross-sectional cutlines from the previous section are identified on the underside views to unambiguously identify each package's construction. Moreover, using the USMP process any footed quad package can be converted into a quad leadless package, i.e. a QFN equivalent footprint having no feet extending beyond the plastic body's edges, simply by aligning the laser cuts for the metal removal to the same regions and edges used to define plastic removal. For the sake of brevity, the USMP leadless versions of the following quad packages will be excluded from the drawings.

Figure 26A:
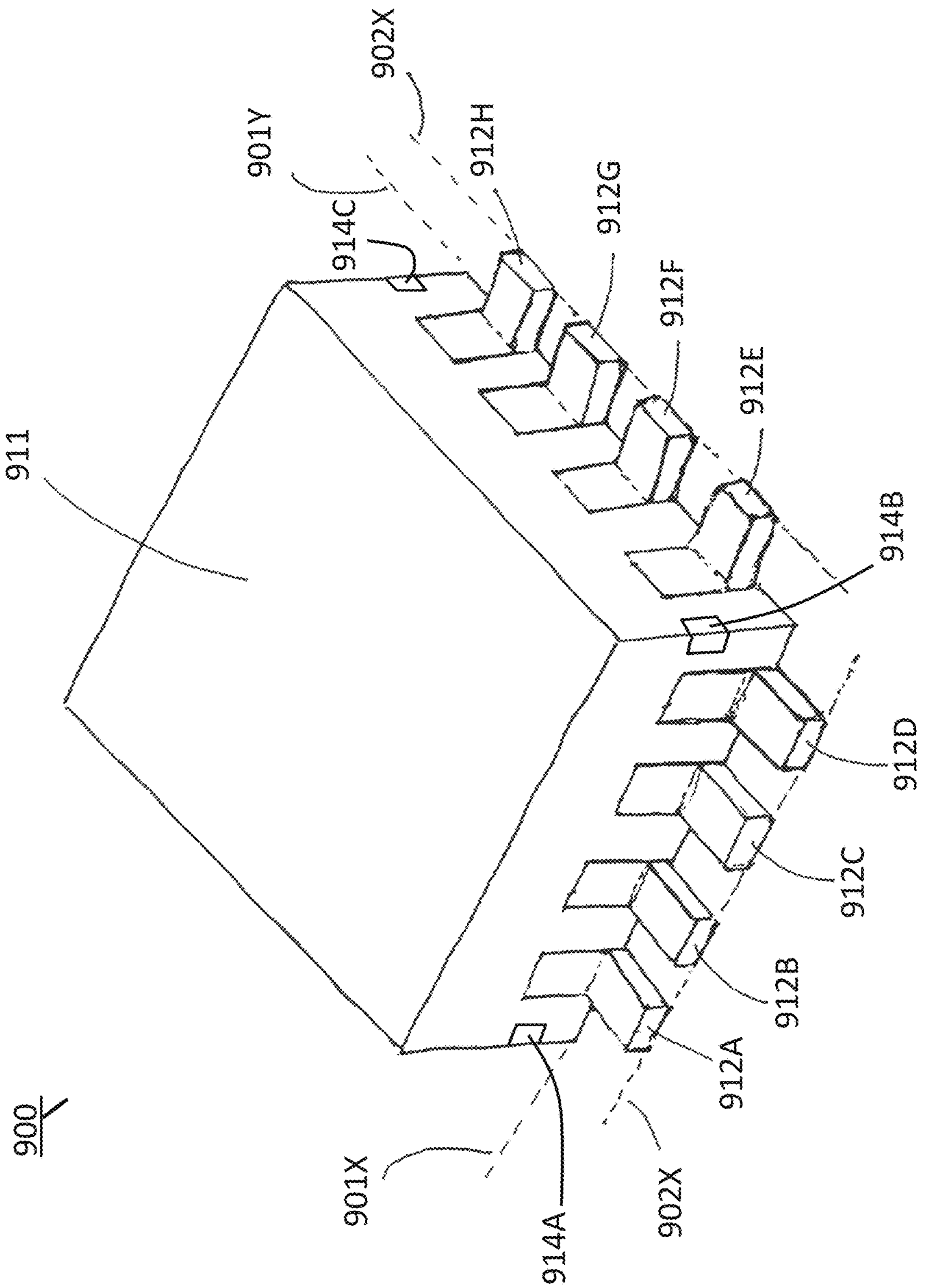
FIG. 26A comprises a perspective view of a 16-footed quad USMP.
Figure 26B:
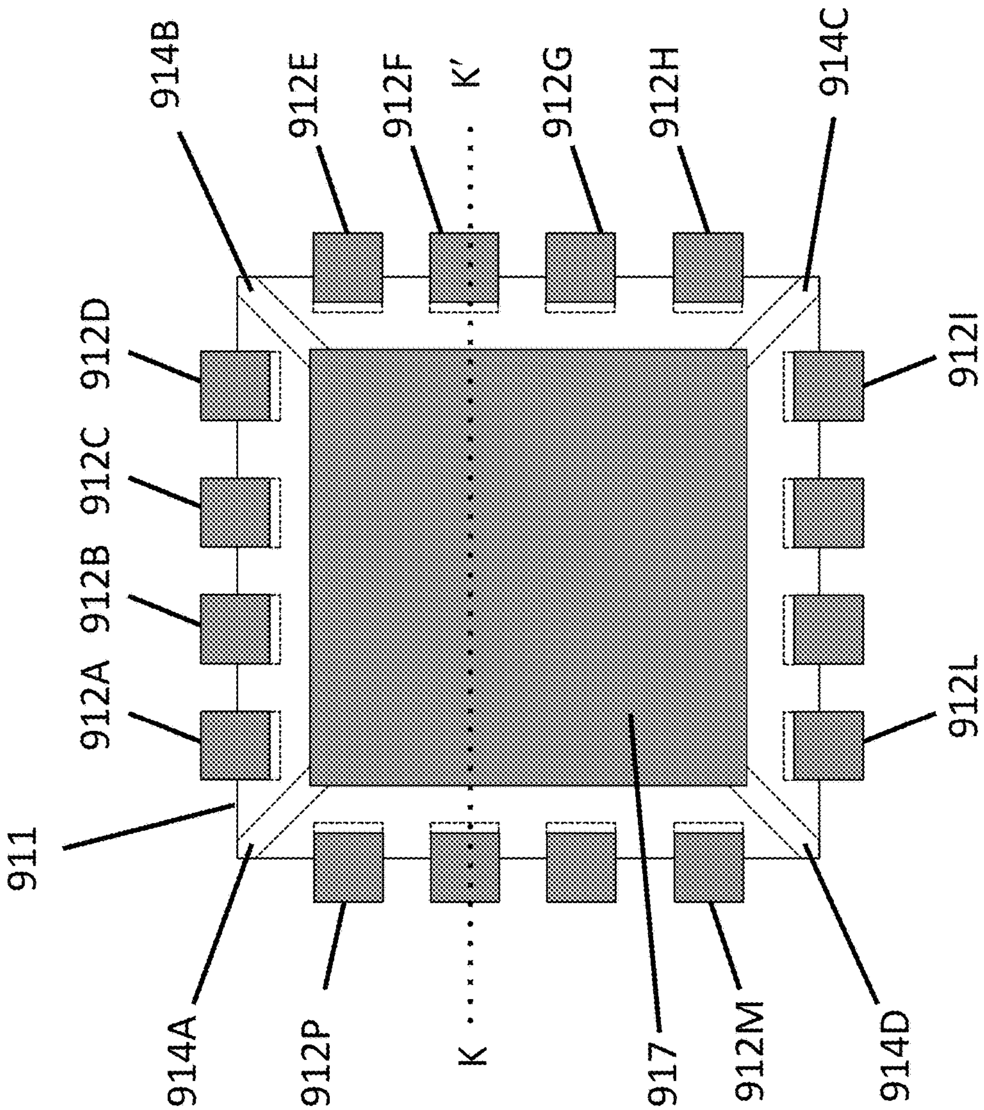
FIG. 26B comprises an underside view of a 16-footed quad USMP with an exposed die pad.
Figure 26C:
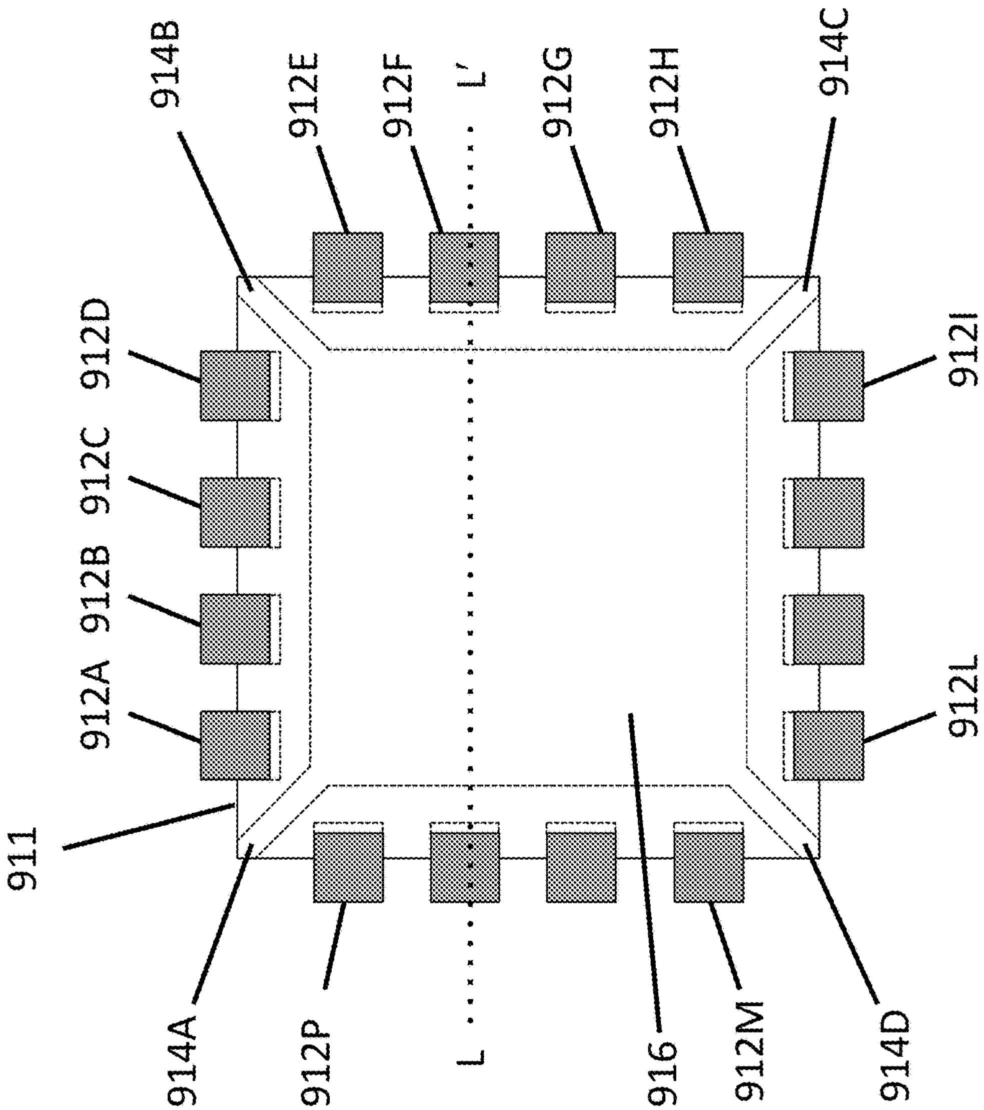
FIG. 26C comprises an underside view of a 16-footed quad USMP with an isolated die pad.

FIG. 26A illustrates a perspective view of a 16-footed quad USMP package 900 comprising plastic 911, tie bars 914A through 914C, and feet 912A through 912H. Inasmuch as package 900 is symmetrical, it will be understood that a similar tie bar and similar feet are located on the opposite, invisible sides of package 900. In short, in the square version shown the package feet are distributed four to a side. The tie bars are located in the corners. The package 900 may be fabricated with an isolated or exposed die pad. FIG. 26B illustrates the underside view of the 16-footed USMP package 900 with an exposed die pad 917 where the cross sectional construction in either the lengthwise or widthwise direction is illustrated by cutline K-K' as shown in FIG. 19F. In contrast, FIG. 26C illustrates the underside view of the 16-footed USMP with an isolated pad 917 where the cross sectional construction in either the lengthwise or widthwise direction is illustrated by cutline L-L' as shown in FIG. 19F.

FIG. 27A comprises underside views of various 4 and 6-footed quad USMPs with exposed die pads. In the illustration of the upper left corner plastic 921 comprises exposed die pad 926, tie bars 924, and four feet 922, located one per side. In its minimum dimension, a quad package with 4 feet is not area effective and is better implemented as a dual package shown previously. With 6 feet, the utility of a quad USMP design improves. In the upper right hand corner, for example, exposed die pad 936 is substantially larger than the previously described die pad 926. The resulting package comprising rectangular shaped plastic 931 has six feet 932, with two located on the package ends and two on each lengthwise edge. The die pad size can increased by connecting two feet 948 to die pad 946 shown in the lower left illustration of FIG. 27A as shown along cutline A-A' or alternatively as shown in the lower right illustration by connecting four feet 958A and 958A to die pad 956 as depicted along cutline E-E'.

Extending the footed quad USMP design to higher pin counts is straightforward as shown by the underside views of 8- and 10-footed quad USMPs with exposed and isolated die pads illustrated in FIG. 27B. In the upper left corner illustration of an 8-footed USMP, square quad footed USMP comprises plastic 961, exposed die pad 966, corner tie bars 964, and feet 962 located two to a side, having a cross section depicted along cutline K-K'. In its isolated-die-pad version shown in the lower left illustration of the same figure, square quad footed USMP comprises plastic 961, isolated die pad 967, corner tie bars 964, and feet 962 located two to a side, having a cross section depicted along cutline L-L'.

Extending the USMP design to rectangular 10-footed packages also shown in FIG. 27B, the upper left corner USMP comprises plastic 971, exposed die pad 976, corner tie bars 974, and feet 972 located two on teach end and three on each side. The package has a cross section depicted along cutline K-K'. In its isolated-die-pad version shown in the lower left illustration of the same figure, rectangular quad footed USMP comprises plastic 971, isolated die pad 977, corner tie bars 974, and feet 972 having a cross section depicted along cutline L-L'.

The thermal performance and maximum die area of the aforementioned USMPs can be improved using die pad attached feet as illustrated in FIG. 27C. The method is applicable both for exposed and isolated die pads. In the upper left illustration, an 8-footed quad USMP comprises an exposed die pad 986 surrounded by plastic 981 connected by vertical column 988 to two feet 982B as depicted along cross section of cutline A-A'. The remaining feet 982A are not connected to the die pad. In the lower left illustration of FIG. 27C, an 8-footed quad USMP comprises an isolated die pad 987 connected by cantilever 989 to two feet 982B as depicted along cross section of cutline C-C'. The remaining feet 982A are not connected to the die pad.

In the upper right illustration of FIG. 27C, the 8-footed quad USMP comprises seven feet 982 not connected to exposed die pad 996 and one wide foot 993 connected to exposed die pad 996. The corners of exposed die pad 996 on the opposing side not connected to foot 993 include tie bars 994. Similarly the lower right illustration of FIG. 27C shows a the isolated equivalent of a 8-footed quad USMP comprising seven feet 992 not connected to isolated die pad 997 and one wide foot 993 connected to isolated die pad 997. The corners of isolated die pad 997 on the opposing side not connected to foot 993 include tie bars 994.

FIG. 27D comprises underside views of 8- and 10-footed rectangular-shaped quad USMPs with exposed and isolated die pads. In the upper left illustration comprising plastic 1001, exposed die pad 1006 merges into four feet 1002B while the remaining feet 1002A are isolated from exposed die pad 1006. The lengthwise cross section is depicted along symmetric cutline E-E' while the widthwise cross section is depicted along symmetric cutline K-K'. The resulting USMP comprises 10 feet but only seven unique electrical connections. The package is the lower right is identical in construction except that isolated die pad 1007 replaces exposed die pad 1002B. In yet another minor variant of this package is shown in the upper right illustration of FIG. 27D, where four pad connected feet 1002B are replaced by with two wide feet 1003 on opposing edges of the package resulting in a 8-footed USMP with seven unique electrical connections.

While the aforementioned three versions of the package defined by plastic 1001 in FIG. 27D utilize a die pad connected to feet located on the narrow edges of the package, for the USMP shown in the lower left illustration isolated die pad 1007 is connected to three feet 1002B located instead on the longer edge of the package. The resulting USMP comprises 10 feet with 8 unique electrical connections.

FIG. 28A comprises underside views of 12-footed square quad USMPs with exposed and isolated die pads formed within plastic 1011. In both drawings the die pad is connected in all four corners by tie bars 1014 and surrounded by isolated feet 1012, three on each package edge. The left side illustration utilizes an exposed die pad 1016 while the right side package uses an isolated die pad 1017.

FIG. 28B comprises underside views of 16-footed rectangular-shaped quad USMPs with exposed and isolated die pads formed within plastic 1021. In both drawings the die pad is connected in all four corners by tie bars 1024 and surrounded by isolated feet 1022, five on each long edge of the package and three on each short edge. The top illustration utilizes an exposed die pad 1026 while the lower package uses an isolated die pad 1027.

FIG. 29A comprises an underside view of a 20-footed rectangular-shaped quad USMP formed in plastic 1031 with an exposed die pad 1036 a twenty isolated leads 1032 located with four on each end and six on each of the sides. FIG. 29B comprises an underside view of the same 20-footed rectangular-shaped quad USMP except that it utilizes an isolated die pad 1037.

FIG. 30A comprises an underside view of a 48-footed quad USMP with an exposed die pad 1046 comprising plastic 1041, four tie bars 1044 located in the package corners, and 48 feet 1042 located with 12 feet on each edge. FIG. 30B comprises an underside view of a 48-footed quad USMP identical to the prior package except that it employs an isolated die pad 1047. In another embodiment, the same package with isolated die pad 1047 includes four vertical columns or posts 1049A through 1049C to provide added stability to the leadframe. The posts are spaced sufficiently far apart to avoid any risk of unintended PCB shorts to isolated die pad 1047.

Lastly, FIG. 31 illustrates that any quad multi-footed USMP package can be integrated with an extended heat tab. As shown in perspective and underside views, USMP 1050 includes plastic 1051, die pad connected foot 1052F, eleven isolated feet 1052A through 1052E, and 1052G through 1052L, extended heat tab 1058, and heat tab connected foot 1053. The design marries the low inductance and high pin count capability of a USMP IC package with the thermal dissipation capability of a USMP power package, facilitating advanced power IC designs.

Advanced USMP Leadframe Designs

Using the USMP process, designs, and methods disclosed herein, leadframe features providing unique benefits unavailable in conventional packages can be realized.

One such unique benefit is selective tie bar removal. For example, the laser metal removal process shown in FIG. 12H is an example of a selective tie bar removal. In the example shown, rectilinear sawing of leads unavoidably leaves an unwanted tie bar artifact, tie bar 148, which cannot be selectively removed using mechanical means such as cutting, clipping, or sawing, without the risk of damaging the plastic mold and adjacent leads. Using USMP laser street fabrication, the unwanted metal protrusions can safely be removed by laser even between closely spaced adjacent feet or leads. Because the tie bar removal is an optical process, no space is required for clamping or holding the package of leads in place.

Another example of selective tie bar removal is illustrated in power packages such as the DPAK or D2PAK. For example, in FIG. 3E the center lead of DPAK 31Q is mechanically clipped after manufacturing, i.e. the center lead functions only as a tie bar and is not required by the customer for electrical connections. Because it is clipped mechanically, the tie bar lead unavoidably protrudes from the plastic body of the package. The length of this protrusion is determined by the clearance needed to mechanically clip the tie bar lead without damaging the package's plastic. The tie bar lead protrusion is connected electrically to the package's die pad, undesirably increasing the risk of electrical shorts between the tie bar lead and the adjacent leads.

Figure 21D:
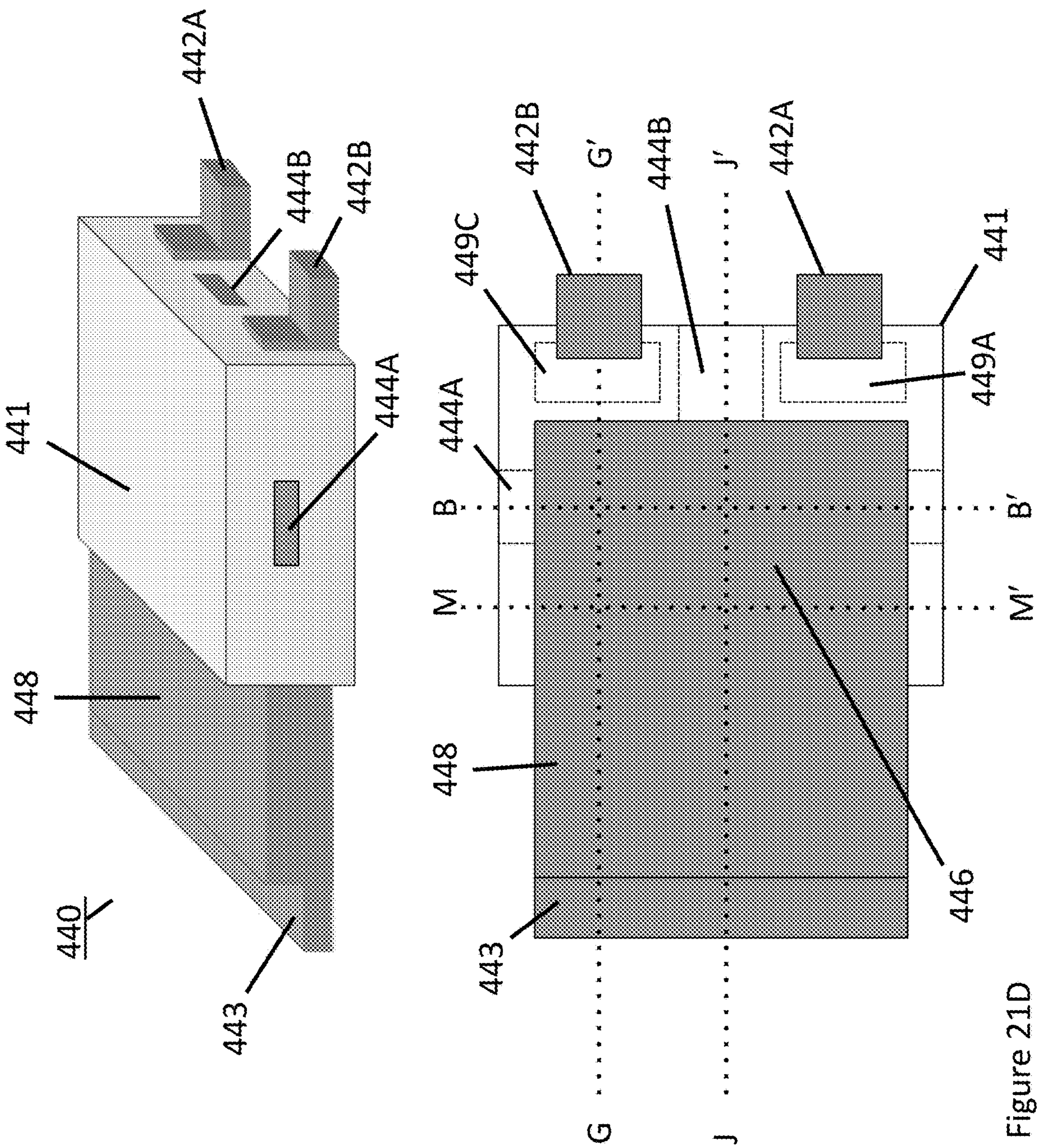
FIG. 21D comprises various views of an alternate embodiment of a 3-footed power USMP with heat tab.

Moreover, in power devices, the die pad and package leads often are required to sustain a high voltage between them, commonly supporting 600V and in some cases as high as 1,000 volts. Even a partial solder bridge between the electrodes can result in electrical leakage currents, circuit malfunction, and even dangerous failures. In contrast to the conventionally fabricated DPAK, using the USMP process FIG. 21D illustrates tie bar 444B can be cut precisely flush with the package body, i.e. plastic 441, without any risk of mechanical damage to the plastic or bending of feet 442A and 442B.

The benefit of selective tie bar removal can be extended to multi-lead packages enabling leadframe designs and features never before possible. For example, FIG. 32A illustrates a footed IC package made in accordance with the USMP process, where tie bar 1104A is positioned in between two feet 1102A and 1102B. Similarly tie bar 1104A is located between two adjacent feet. Together with die pad connected foot 1102E, tie bars 1104A and 1104B hold exposed die pad 1106 in place during manufacturing. The mechanical support during the package's fabrication is illustrated by the leadframe shown in FIG. 32B revealing tie bar 1114A connects to the leadframes main rail 1119 while tie bar 1114B and foot 1112E extend to connect with metal cross rails 1118, together holding exposed die pad 1106 in place, especially important during wire bonding and plastic molding.

After plastic removal defines the lateral extent of plastic 1101, the package is then cut from the leadframe, i.e. singulated. The package may be held temporarily in place by adhesive tape, often referred to as "blue tape," till the cutting is complete. The risk of the package twisting duration singulation from mechanical sawing or punching is completely eliminated by employing USMP laser metal removal. As a result, the sequence of cutting the feet or "dejunking", i.e. removing the tie bars is unimportant in the USMP process. In a dual pass USMP process, either sequence, cutting the feet then removing the tie bar protrusions or conversely removing the tie bars then cutting the feet, will provide the same result. Alternatively, both the feet and tie bars may be removed using a single pass laser process where the laser cuts feet, then removes tie bars, then cuts more feet in sequence based on whatever the laser scan reaches first.

An example of a USMP dual pass laser metal foot and tie bar cutting process is shown in FIG. 32C where horizontal laser scans 1121X cut and remove the metal leadframe connections across the street up to the package edge 1120X (i.e., the ends of the feet) and where transverse laser scans 1121Y in the vertical direction cut and remove the metal leadframe connections across the street up to the package edge defined by line 1120Y. The resulting package at this stage in the USMP process is shown in FIG. 32D where tie bars 1114A and 1114B protrude from plastic edge 1101 by the same length as feet 1102A and 1102B. In the second metal removing laser pass shown in FIG. 32E, the laser is rescanned in the horizontal direction by horizontal scans 1123X to selectively remove tie bar protrusion 1124B, and again by vertical scans 1123Y to selectively remove tie bar protrusion 1124A. In the dual scan process the laser spot 1120 can be adjusted by focus and power to cut a smaller spot than that used when clearing the street by laser scans 1221X and 1121Y in the previous figures.

The resulting package 1100 shown in FIG. 32A accommodates the use of tie bars between feet, i.e. intra-lead feet tie bars, enabling stabilization of the package's die pad without sacrificing a foot by connecting it to the die pad just for the sake of providing mechanical support during manufacturing. For example, in the left side illustration of FIG. 33A, isolated die pad 1147A is stabilized not only by die-pad-connected wide foot 1142C and conventional tie bar 1144A, but also by intra-lead tie bar 1144D. Were intra-lead tie bar 1144D not employed, the corner of isolated die pad 1147A would be unstable, exhibiting diving board effects during wire bonding and potentially suffering dislocation, i.e. unwanted movement and repositioning, during molding. In a similar manner, isolated die pad 1147B is held in place by three supports, namely by die pad connected foot 1142D, conventional tie bar 1144B, and by intra-lead tie bar 1144C.

In the right side illustration of FIG. 33A, isolated die pad 1145A is stabilized by die-pad-connected wide foot 1152C, conventional tie bar 1154A located on the end of the dual package having no feet, and by intra-lead tie bar 1154D located on the footed side of the package. Isolated die pad 1157B is supported by one conventional tie bar 1154B and by two intra-lead tie bars 1154C and 1154E on opposing sides, forming a stable triangle base.

Intra-lead tie bars also make advanced interconnections possible within a USMP implemented package. For example, in the lower left illustration of FIG. 33B a 10-footed USMP contains two die pads—one exposed and the other isolated, along with an isolated intra-package interconnection. Such interconnections are valuable when a customer's PCB design requires a specific pinout package not possible through wire bonding. As shown, exposed die pad 1166 is stabilized by conventional tie bar 1164B and intra-lead tie bar 1164C while isolated die pad 1167 is stabilized by the support triangle comprising conventional tie bar 1164A and intra-lead tie bars 1164D and 1164E. Isolated intra-package interconnection 1164G connects foot 1162H on one side of the package to foot 1162E on the opposite side of the package diagonally located near opposite corners of exposed die pad 1166.

Intra-lead tie bars are also applicable for quad USMPs. For example, in the upper right illustration of FIG. 33B a quad footed USMP contains exposed die pad 1176 stabilized by conventional corner tie bar 1174C and by intra-lead tie bar 1174D while isolated die pad 1177 is stabilized in four locations, namely with corner tie bars 1174A and 1174F and with intra-lead tie bars 1174B and 1174E. As described previously, even the removal of corner tie bars using mechanical means such as employed in LQFP packages is difficult, wasting space and risking damage to the package's plastic body.

Using the USMP process, leadframe geometries and package features can be flexibly determined in two different ways, namely

- The geometric feature can be created as part of the leadframe fabrication process
- The geometric feature can be created by laser ex post facto, i.e. performing patterning by laser after molding either before or during singulation An example of such a geometric leadframe feature is the thermal comb shown in FIG. 34A where a DPAK or D2PAK package includes plastic 1201, feet 1202A, 1202B an 1202C, tie bars 1204A, cantilever extensions 1209A and 1209C, and exposed die pad 1206. The exposed die pad 1206 merges into a heat tab 1208A with a thermal comb comprising metal fingers 1208B, 1208C, 208D, and 1208E. The fingers as shown are constructed using the full leadframe thickness, i.e. a vertical column 100A originally shown in FIG. 9A. The inner periphery of the fingers includes a wide serpentine foot 1203 for solder to wet onto. With its large periphery, the comb structure maximizes electrical thermal and electrical conduction between the package and the PCB, improving thermal conduction. The exposed solid metal portion of the heat tab, i.e. heat tab 1208A maximizes thermal convection into the air. By adjusting the relative area devoted to solid heat tab 1208A and the thermal comb, the amount of cooling through thermal conduction into the PCB and thermal convection into the air can be adjusted by design.

FIG. 34B illustrates the case where the thermal comb is prefabricated into the leadframe. As shown, thermal comb fingers 1218 and their associated serpentine foot 1213 are extended beyond the package edge into cross rails 1229Y, as are the extensions of feet 1212. On the perpendicular package edges tie bars 1214 connect to rails 1229X and 1229W. The package edges are defined in the lengthwise by laser cutlines 1220Y defining the length of package feet 1212 and thermal comb fingers 1218, and in the widthwise direction by laser cutlines 1220X cutting tie bars 1214 flush with plastic 1201. As shown in FIG. 34C, between the cutlines 1220Y numerous vertical laser scans 1221Y are employed to remove leadframe connections to the package feet and thermal comb fingers. Similarly, multiple horizontal laser scans 1221X are preformed to remove tie bars between cutlines 1220X.

In another embodiment of a DPAK or D2PAK package with a thermal comb, shown in FIG. 35A, the leadframe is modified where the thermal comb 1228B connected to heat-tab 1228A comprises thin metal, i.e. comprising the same thickness metal as feet 1212. This version facilitates easier wave soldering but contains less thermal mass than the prior version. More importantly, by employing thin "feet" metal for the thermal comb, the comb's features can be fabricated using a laser after package molding. The leadframe prior to singulation is illustrated in FIG. 35B illustrating extended thin metal foot 1228B. Prior to singulation, holes can be cut with the laser to form the thermal comb as shown in FIG. 35C where horizontal scans 1226 remove multiple areas 1225 within thin metal extended feet 1228B. The opening dimensions can be determined by the number of scans and using focus to control the laser spot size 1227.

In alternative embodiment shown in FIG. 36A, the thin metal extended foot 1228B is patterned using a laser to open bolt-hole 1225. In a manner similar to forming a thermal comb, the fabrication process shown in FIG. 36B involves multiple overlapping horizontal scans 1226 removing a circular area 1225 within thin metal extended foot 1228B.

Advanced USMP Leadframe Processes

As described previously, the USMP leadframe must be plated to improve solderability and to inhibit copper oxidation. In the USMP process, the plating may be performed at several different times and by several different methods, namely

- Prior to package manufacturing during leadframe fabrication, by "pre-plating" the leadframe over its entire surface
- Prior to package manufacturing during leadframe fabrication, by "pre-plating" the leadframe selectively over a portion of its surface, sometimes referred to as "patterned leadframe plating"
- After molding but prior to metal patterning and singulation The various manufacturing process sequences are represented in the flow chart of FIG. 37. For the first case, pre-plating the entire leadframe, the USMP process sequence comprises leadframe formation (step 1250A), leadframe pre-plating (step 1250B), molding (step 1250C), laser plastic removal (step 1250D) and metal patterning and singulation (step 1250E). In the second case, i.e. patterned leadframe plating (step 1252B) replaces step 1250B. In the third process option, leadframe pre-plating (step 12500B) is skipped, as indicated by dashed line 1251A, and leadframe formation (step 1250A) is immediately followed by molding (step 1250C) which is then followed by plastic removal (step 1250D). After plastic is removed from the street, the leadframe is then plated in what is referred to as "post-deflash leadframe plating" (step 1251B) followed by metal patterning and singulation 1250E. The term de-flash refers to the removal of stray bits of plastic resulting from sawing or punching but is not an issue with laser plastic removal.

An example of a pre-plated leadframe is shown in FIG. 38, where copper die pad 1261 is coated on all sides by plated metal 1269 and foot 1262 and cantilever 1263 as well as the vertical column connecting them are coated by the same plated metal 1269. While pre-plated leadframes are generally fine for small packages, for large and high pin count packages and power packages the packages may suffer poor adhesion and delamination between the plastic and the plated metal. For example plastic 1260A may delaminate in regions 1265A and 1265B. Surface 1265C may also delaminate from underside plastic 1260B. Delamination in any area may cause a reliability failure.

By using selective plating, delamination can be avoided by preventing plating in leadframe areas sensitive to delamination risk. As shown in the cross-sectional view of FIG. 39, regions 1269A, 1269B and 1269C are clear of selectively plated metal 1270 because plating in those regions was intentionally inhibited. Three methods may be used for selective plating. In one case, a seed layer such as titanium, platinum, palladium, nickel, or various refractory metals is deposited in the areas where plating is desired. Numerous methods may be employed to create a selective seed layer.

- The seed layer can be deposited locally through an intervening stencil mask so that it is present only where the plating is intended to occur. This method to form a patterned seed layer is referred to herein as a "patterned deposition" process
- The leadframe is coated or deposited uniformly with the seed layer metal, then is selectively coated with a photoresist through a patterned stencil mask, exposing only those areas where the seed layer should be removed. After baking the photoresist to harden it, the seed layer is then etched in an acid that attacks the specific metal but either does not etch or only slowly etches copper, thereby removing the exposed seed metal. After removing the photoresist and cleaning, the leadframe is ready for plating. This method to form a patterned seed layer is referred to herein as an "masked etch-back" process
- The leadframe is coated with a photoresist through a patterned stencil mask, depositing photoresist only on those areas where the seed layer is to be removed. The result is a patterned leadframe some areas open to the copper and others covered by photoresist. After baking, the seed layer metal is deposited atop the patterned leadframe, some metal being deposited directly onto the copper, while in other areas the metal is deposited atop the photoresist. Cleaning the photoresist "lifts off" and seed metal on top of it leaving the copper leadframe with seed metal present only where plating is intended to occur. This method to form a patterned seed layer is referred to herein as a "lift off" process.
- The seed layer could be printed onto the leadframe with a printer, dispensing seed metal in a solvent suspension that is dried during printing by a lamp, laser, or heating block then baked to completely evaporate the solvent. After baking the leadframe is heated to a high temperature to bond the seed layer metal to the copper leadframe. Only the printed areas retain the seed layer. This method to form a patterned seed layer is referred to herein as a "metal printing" process.

After forming the patterned seed layer, the leadframe is ready for selective plating. The plating chemistry must be adjusted so that in the absence of the seed layer plating does not occur on the bare copper.

In a second method, plating is performed everywhere and selectively removed by masking and etching. In a third method shown in FIG. 40, layers 1271A and 1271B of a plating inhibitor, i.e., a material that prevents plating, such as a glass or an organic compound, is silkscreened or printed onto leadframe 1261 prior to plating. After plating of plated metal 1273A the inhibitor layers 1271A and 1271B are chemically removed.

Aside from leadframe plating, another valuable feature of the USMP design relates to soldering a power package or an exposed die pad onto a PCB. Since wave-soldering only applies solder from above the component, then there is no way to get solder beneath a large metal area using the wave-soldering process. Conversely, as described previously, the reflow PCB is expensive compared to wave-soldering. A footed package, by itself does not address this issue and must instead rely on the same technique used for DPAK assembly today, i.e. to perform a dual-pass PCB assembly with one pass for attaching power devices or packages with exposed die pads and another pass for wave-soldering leads onto the board.

The first pass of a dual-pass PCB assembly is shown in FIG. 41A where in the top illustration PCB 1300 with copper traces 1301A, 1301B, and 1301C is coated with either conductive epoxy or solder paste, e.g. solder paste layer 1302A atop copper trace 1301A and solder paste layer 1302B atop copper trace 1301B. Copper trace 1301C, not used for a power device, is left uncoated, as are most of the PCB traces. The exposed die pad package is then positioned atop the epoxy or solder paste as illustrated in the middle figure. As such, exposed die pad 1305A sits atop solder paste layer 1302A and foot 1305B sits atop solder paste layer 1302B. After heating in an oven, the solder paste melts and exposed die pad 1305A sinks down into the solder paste layer 1302A, which turns into molten solder. Similarly, foot 1305B sinks down into solder paste layer 1302B, which melts into molten solder. After the solder hardens an electrical and thermal connection to the PCB copper conductors is formed as shown in the bottom illustration. Alternatively, if a conductive epoxy is used in place of solder paste, then the package is mechanically pushed down into the epoxy and the epoxy is left to cure. Fast set epoxies, can cure in 30 minutes to one hour.

After the solder or epoxy attach process, during wave-soldering, additional solder flows onto the top of the feet. Since the wave-soldering achieves a high-quality electrical connection between the PCB copper traces and the feet, the main purpose and benefit of the solder paste or epoxy is to facilitate improved thermal conduction into the PCB, not to act as the primary path for electrical conduction. In order to minimize the thermal resistance, the final thickness of the epoxy or solder layers 1302A and 1302B should be as thin as possible. If it is deposited too thick, excess solder paste or epoxy may "squeegee" out the sides from underneath the package and lead to PCB shorts. Such an issue is especially problematic for dual exposed die pad packages. Minimum distances of 1 mm to 1.5 mm or even greater may be required.

If the epoxy or solder paste layer is sufficiently thin, then solder paste layer 1302B under the package foot 1305B can be eliminated, as the electrical connection between foot 1305 and copper trace 1301B can be achieved using the subsequent wave-soldering process. If, however, the layer of solder paste applied under the exposed die pad 1305A is too thick, then, as shown in top illustration of FIG. 41B, foot 1305B may be separated from copper trace 1301B by gap 1307. During heating, the package may tilt, such that the package and exposed die pad 1305A are no longer parallel to PCB 1300. The result is that solder paste layer 1302A melts into a non-uniform wedge of solder 1302Z, making wave-soldering the foot 1305B to copper trace 1301B difficult. Moreover, foot 1305B my touch copper trace 1301B at only a single point 1308, making a uniform solder joint difficult to reproduce consistently.

One solution, shown in the modified USMP fabrication flow chart of FIG. 42A, is to insert an extra "solder printing" step (step 1250G) into the process flow, between plastic removal (step 1250D) and metal patterning and singulation (step 1250E). While this extra step appears to complicate the process, it completely eliminates the need for dual-pass PCB assembly. Using this process improvement, any USMP package with an exposed die pad can have an optionally thin solder coating on the bottom side of its feet and the exposed die pad. As shown in the top cross-sectional view of FIG. 42B, a power package with an exposed die pad 1315A is coated with a thin solder layer 1319A, including a thin solder layer 1319C under die pad-connected foot 1315C and a thin solder layer 1319B under foot 1315 B. Similarly, as shown in the lower cross-sectional view, in any USMP IC package with an exposed die pad, either dual- or quad-sided, the exposed die pad 1425A is coated with a thin solder layer 1329A. Likewise foot 1325C is coated with thin solder layer 1329C, foot 1325B is coated with thin solder layer 1329B, and other feet (not shown) are also coated with thin solder layers. The solder layer may be deposited or printed.

As illustrated in the process flow of FIG. 43A, attaching a power package with exposed die pad 1315A and an USMP footed IC package with exposed die pad 1325A to a PCB can be performed in a single step, bringing them in contact with the PCB and holding them in place to melt the solder paste, resulting in the structure shown in the cross-sectional view of FIG. 43B, where copper foot 1315B is melted into solder layer 1319B atop copper trace 1331B atop PCB 1330. After heating, non-power packages, such as a USMP IC package with plastic 1334, are attached by glue or held in position mechanically. Unlike the feet in power and exposed-die pad packages, copper foot 1335B sits directly atop copper trace 1331F on PCB 1330, with no intervening solder layer. After wave-soldering, as the cross-sectional views of PCB 1330 in FIG. 43C show, solder layers now cover all the copper feet, i.e. solder layer 1340C covers foot 1315C, solder layer 1340B covers foot 1315B, solder layer 1340C covers foot 1325C, solder layer 1340E covers foot 1325B, and solder layer 1340F covers foot 1335B. In this manner, all power and non-power packages are manufactured in a wave-solder flow without the need to coat the PCB with solder paste even to assemble the power devices.

The left side drawing in FIG. 44A illustrates the underside view of the solder plated DPAK. The solder paste is printed, with solder paste layer 1404C covering exposed die pad 1403 and die-pad attached foot 1402C, with solder paste layer 1404A covering foot 1402A, and with solder paste layer 1404B covering foot 1402B. After heating the solder paste changes into solder in the same locations.

In an improved embodiment of a solder-plated USMP package shown in the right side drawing of FIG. 44A, holes 1406 are in included in solder paste layer 1405C, and solder paste layers 1405A and 1405B are made in donut shapes so that some areas are devoid of solder even after the solder paste is melted into solder. The purpose of the holes devoid of solder is to facilitate locations for test probes to contact the package during manufacturing without gumming up the probe tips with solder.

This method is equally applicable for USMP IC packages. As shown in FIG. 44B, the package on the left utilizes uniform solder paste layer 1414C on exposed die pad 1413 and uniform solder paste layer 1414A on the package's feet 1412. In contrast, the package on the right employs donut-shaped solder paste layers 1415A on the packages feet 1412 and holes 1416 in the solder paste layer 1415C located on exposed die pad 1413.

As illustrated in the cross-sectional view of FIG. 44C, during manufacturing electrical tests, probes 1420 are positioned to contact exposed die pad 1403 and foot 1402 through openings 1406 in the solder layer 1405. In this manner, the probes do not scratch the solder and gum up the probe tips, compromising the probe's ability to achieve a good electrical contact to the device under test.

Another consideration in USMP leadframe design specially relates to isolated die pads. As shown in the cross-sectional view of FIG. 45, during wire-bonding of semiconductor die 1459 mounted atop an isolated die pad 1457 to the cantilever sections 1454A and 1454B connected to feet 1452A and 1452B, a custom heater block 1460 must be designed to prevented spring board effects and oscillations during the bonding process. While customization is possible, another alternative is to fill the void beneath the isolated die pad with an electrically insulating thermally conductive compound such as polyamide or epoxy filled with diamond dust, carbon nanotubes, or ceramic powder. Such a process, while similar to a pre-molded leadframe, does not use the same mold compound used to form the plastic but instead uses a material optimized for its good thermal conduction properties.

The resulting leadframe structures, shown in FIG. 46, comprise the thermal compound 1465 or 1466 permanently affixed to the underside of the leadframe during manufacturing and afterwards in the final product. In the top illustration, the thermal compound 1465 is coplanar with the top surface of isolated die pad 1457 and cantilever sections 1454A and 1454C. In the lower illustration, the thermal compound 1466 is coplanar with the bottom of isolated die pad 1457, and the gaps between the die pad and cantilever sections 1454A and 145B are filled during molding.

The fabrication sequences for the two versions are slightly different. In FIG. 47, the fabrication for the first case is illustrated, where the top of the leadframe elements 1454A, 1454B, and 1457 are covered with a temporary adhesive layer 1464, e.g., blue tape, before the thermal compound is 1465 is printed onto the backside of the leadframe. The thermal compound naturally fills the voids between the die pad 1457 and the cantilever sections 1454A and 1454B, making it coplanar with the top edge of isolated die pad 1457. After printing, the temporary adhesive layer 1464 is removed.

In the fabrication sequence of FIG. 48, the backside etch of leadframe 1468 is completed, forming a thinned section 1467, shown in the top illustration. Before preforming the frontside etch, however, thermal compound 1466 is printed or coated into the cavities created by the backside etch. The frontside etch is then performed, as described above, resulting in the leadframe shown in the bottom illustration, with thermal compound 1466 filling the region beneath isolated die pad 1457. The resulting package offers a benefit of enhanced thermal conduction and lower thermal resistance than conventional isolated die pad packages. Furthermore, the thermally conductive compound provides mechanical support during wire bonding while still allowing a flat heater block to heat the die and leadframe during the wire bonding process to improve bonding adhesion. Thus a specialized heater block, such as heater block 1460 shown in FIG. 45, is not required.

Practical examples of USMP Designs

As described, the USMP process may be employed to universally replace any leadless package or any leaded or gull wing package with either a leadless or a footed package equivalent simply by changing the leadframe design avoiding the need for new or custom mold tools. The flexibility and universality of the USMP process and design supports any number of manufacturing, design, product, and go-to-market strategies including,

- Reducing manufacturing cost and improving factory flexibility and throughput by converting the conventional saw type and punch type QFN manufacturing to the USMP process, thereby enabling multiple packages to be fabricated on one common line, i.e. improving package manufacturing through product line consolidation,
- Converting reflow PCB assembly to a lower cost wave solder PCB assembly by replacing an existing leadless package with a USMP footed package, using the existing die with no change in the PCB area or traces, i.e. a cost reduced pin-for-pin replacement,
- Maintaining the same PCB landing pad locations, design a new larger die with improved performance, e.g. high current, lower resistance, more functionality, etc., benefitting from the improved area efficiency of the USMP made package, i.e. a performance upgraded pin-for-pin replacement,
- Shrinking the PCB area, using the existing die package in a more area efficient USMP made package, i.e. a package-shrink,
- Shrinking the PCB area, using a customized die designed to fit in a smaller USMP made package, i.e. a die and package shrink, potentially compatible with a standard PCB trace of a smaller package, e.g. changing from a 3×3 DFN to a 2×3 DFN.

While, using the USMP manufacturing method, the PCB footprint for footed packages housing a die originally designed for a leaded package may be made smaller than their gull-wing equivalents, i.e. the package size may be reduced, in general it is commercially easier to adopt the fixed package footprints of industry-standard conventional packages and then maximize the die size. Comparatively, a footed USMP will be slightly less area-efficient than an etch type QFN or DFN leadless package occupying the same PCB space and PCB landing pad layout and slightly more area-efficient than a punch-type QFN or DFN leadless package occupying the same PCB space and PCB landing pad layout but significantly more area-efficient than any equivalent leaded, gull-wing, or bent-lead package. In the case of LQFP packages, the footed USMP version will be substantially more efficient. The definition of the area efficiency used herein is the maximum die area for a given package divided by the PCB area needed to mount the component as defined by the lateral extent of the plastic or the conductors used to mount the component, whichever is larger, i.e. area efficiency $\eta_{area}=A_{max\ die}/A_{PCB}$ FIG. 49A illustrates an example wherein a saw-type QFN3×3 package leadframe 1500 is converted into its wave-solder compatible footed equivalent leadframe 1510, whereby die pad 1506 is replaced by die pad 1516, leadless landing pads 1502 are replaced with wave solderable feet 1512, corner tie bar 1504 is replaced by corner tie bar 1514, and plastic 1501 is replaced by plastic 1511.

The conventional package shown is a saw-type QFN leadless package because a saw, not a mechanical punch, is used to cut the plastic and metal landing pads to their proper dimensions. As a leadless package, after singulation no metal protrudes past the edge of the plastic, where the package's conductive landing pads 1502 are located entirely beneath plastic body 1501. Each conductive landing pad is 0.4 mm long by 0.3 mm wide to enable reliable soldering. The landing pad or "pin" pitch, i.e. the spacing or repeated spacing periodicity of the conductive landing pads, is 0.8 mm. At this pin pitch, a 3 mm by 3 mm quad package contains 9 electrical connections, three on each edge. An exposed die pad 1506, held in place by tie bars 1504, can accommodate a maximum die size of 1.65 mm by 1.65 mm.

By converting a QFN package into a footed version of a QFN, i.e. a QFF, the USMP process can be used to eliminate the need for solder reflow based PCB assembly. Using the USMP process to convert a saw type QFN with leadframe 1520 into the footed QFN shown by leadframe 1530 in FIG. 49B without requiring a change in the PCB traces and solder points requires positioning feet 1532 in the same locations where the conventional QFN's landing pads 1522 are located. Feet 1532 must extend past plastic body 1531 by a distance sufficient to insure good solder coverage, i.e. the package's "outer lead length". As described in the corresponding table, a length of 0.125 mm was chosen as the "outer lead length". To maintain compatibility with conventional QFN assembly, feet 1532 comprise 0.4 mm-long by 0.3 mm-wide solderable areas, the same as a QFN, except that the feet protrude 0.125 mm beyond the edge of plastic 1531 with another 0.275 mm conductive "heel" portion of the foot, remaining beneath the package.

In this manner the footed package shown can be assembled onto a PCB using either wave-soldering or reflow solder assembly, without requiring any change in the PCB copper traces. Compatibility of the footed package with both wave-solder and reflow assembly is another beneficially "universal" aspect of the footed package, uniquely available using USMP designs and methods disclosed herein. No other such package is capable of replacing both leaded and leadless packages with the same design.

As mentioned previously, on an area basis the footed QFN is slightly less area efficient than an equivalently sized saw type QFN package. Because the standard QFN's footprint sets the outer dimension, allocating space for package feet reduces the available area for the die pad. Consequently, the area of exposed die pad 1536 necessarily smaller than QFN die pad 1526. The resulting footed package has a maximum die size of only 1.4 mm by 1.4 mm, a reduction of approximately 20% in die area compared to a saw-type QFN package.

To regain area lost by the solderable feet, a slightly larger package is required. For example, increasing the size of 3×3 footed USMP to a 3×4 form factor increases the maximum die size to 1.45 mm by 2.1 mm. Although the package is slightly larger, the resulting footed package is wave-solder compatible while the leadless package is not. Moreover, the footed package is significantly smaller than any wave-solderable leaded packages capable of packaging comparably sized die.

The same production line used to make a USMP footed package can also be used to fabricate leadless packages. Using the USMP process to convert a saw-type QFN having leadframe 1520 into a USMP-manufactured QFN of identical PCB footprint requires no changes in the die, die leadframe or PCB traces. By converting fabrication of a leadless package such as the QFN or DFN from a conventional saw-type singulation to the USMP process, package fabrication of leadless and footed packages can be performed on the same manufacturing lines without investment in package-specific equipment, specifically, eliminating the need for punch singulation machine tools and expensive leadframe-specific "machine tool die". (The machine tool die is a cutting tool and should not be confused with a semiconductor die). The resulting manufacturing is lower cost and more flexible. Lacking conductive feet, however, the leadless QFN package still requires expensive reflow-based PCB assembly, even using the USMP manufacturing process.

FIG. 49B illustrates the conversion of a 16-pin saw-type QFN4×4 package leadframe 1520 into its wave-solder compatible footed equivalent leadframe 1530. The impact of this change to accommodate the foot, is that plastic body 1521 is reduced slightly in size to form new plastic body 1531, and corner tie bar 1524 is in the final package shortened in size to form new tie bar 1534, cut by laser to be flush with the exterior surface of the plastic body 1531. Using a foot length of 125 μm and a total foot dimension of 400 μm, the same as a QFN landing pad width, the table describes that a saw-type QFN is capable of packaging a die up to 2.65 mm by 2.65 mm while the footed version accommodates a slightly smaller maximum die, in this example, 2.4 mm by 2.4 mm, representing a reduction of approximately 18% in die area.

If, however, we compare the 4×4 footed package to the "punch type" QFN leadframe 1540 shown in FIG. 49C, the equivalent area footed package 1550 offers a 25% larger die area, i.e. the footed package houses a semiconductor die 125% that of the punch type QFN maximum die size of 2.145 mm by 2.145 mm. The punch type QFN 1540 maximum die size is smaller because its conductive landing pads 1542 must extend deeper into the package than feet 1552 to prevent being ripped from the plastic 1541 during punch singulation, a mechanical process which imparts significant stress of the package's plastic and conductors.

The impact of converting a punch type QFN 1549 into an footed package 1559 with the same PCB dimensions, is that die pad 1546 increases in size to form larger die pad 1556, plastic body 1541 is increased in size to form new plastic body 1551, and corner tie bar 1544 is adjusted in size to form new tie bar 1554, cut by laser to be flush with the exterior surface of the plastic body 1541.

So the footed QFN designed for assembly on a PCB with a 4×4 trace has a maximum die size 18% smaller than a saw type QFN and 25% larger than a punch type QFN as summarized in the table shown in FIG. 49D. Considering that the PCB area required for mounting a 4×4 QFN on a PCB is actually 4.3 mm by 4.3 mm, the area efficiency $\eta_{area}$ of the three packages can be compared directly as 38% for either the saw type QFN or the USMP singulated QFN, 31% for the QFF (footed QFN), and 28% for the punch type QFN.

Note that the largest die size and highest area efficiency for a 4×4 package, the saw type QFN, can also be fabricated by the USMP process without any required change in leadframe design or the manufacturing process (except for reprogramming the laser scans). In fact, the USMP process involving laser metal removal and singulation can be used to interchangeably manufacture both the USMP leadless QFN44 and the footed QFN44. The footed package nomenclature QFF represents a simple modification for the acronym QFN meaning "quad flat no-lead" package into a QFF meaning "quad flat footed" package.

Another consideration in the leadframe design is the impact of pin pitch, i.e. foot-to-foot spacing on the number of electrical connections for a given package and its effect on PCB assembly. At a pin pitch of 0.5 mm, a 4×4 QFN or footed QFN package integrates 24 feet, six on each side. At small pin pitch dimensions, there is a risk of electrical shorts in a wave-soldering process. The resulting yield loss depends on the PCB assembly factory and the antiquity of its equipment. As shown previously, the same 4×4 package can be adjusted to 0.8 mm pitch as in leadframe 1530, where the number of feet is reduced to 16 in total, four on each side.

Alternatively, the package can utilize a 0.6 mm pitch resulting in 20 feet, five on a side. In extreme cases where very older factories are employed, the pin pitch can be increased to 1.0 mm with 12 feet, 3 on each side, or to a pin pitch of 1.27 mm in which case the number of feet is reduced to or 8 feet having 2 on each side. A summary of pin pitch versus number of leads for a 4×4 footed package is shown in table below:

| Package Size | # of Pins (Feet) | Pin Pitch | Leadless Name | Footed Pkg Name |
|---|---|---|---|---|
| 4 mm × 4 mm | 24 | 0.5 mm | QFN44-24 | QFF44-24 |
| | 20 | 0.6 mm | QFN44-20 | QFF44-20 |
| | 16 | 0.8 mm | QFN44-16 | QFF44-16 |

-continued

| Package Size | # of Pins (Feet) | Pin Pitch | Leadless Name | Footed Pkg Name |
|---|---|---|---|---|
| | 12 | 1.0 mm | QFN44-12 | QFF44-12 |
| | 8 | 1.27 mm | QFN44-8 | QFF44-8 |

As mentioned previously, the leadless package names described above apply to either QFN packages fabricated conventionally or using the USMP process disclosed herein. The footed package names represent a simple modification for the terminology QFN meaning "quad flat no-lead" package into a QFF meaning "quad flat footed" package.

While the USMP process can be used to fabricate leadless and footed quad packages, the disclosed method is equally applicable for producing dual-sided packages. FIG. 49E illustrates the conversion of a saw-type DFN5×6 package leadframe 1560 into its wave-solder compatible footed equivalent leadframe 1570. The impact of replacing leadless landing pads 1562 to wave-solder compatible feet 1672, is that plastic body 1561 is reduced slightly in one dimension to form new plastic body 1571, while in the other dimension the plastic body size does not change so that saw cut tie bar 1564 tie and laser cut bar 1564 remain identical in size. Considering that only one dimension changes, and using a foot length of 0.125 mm and a total foot dimension of 0.4 mm, the table reveals that the maximum die size of a saw type DFN package is 4.35 mm by 4.55 mm. The footed version, the footed DFN of "DFF" is nearly the same at 4.35 mm by 4.30 mm, a reduction of only approximately 6% in die area. The footed package is, however, wave-solder compatible while the leadless package is not. Moreover, the USMP process can fabricate both leadless QFN and footed QFF packages interchangeably even on the same manufacturing line and equipment.

FIG. 50A illustrates the conversion of a 2-lead DPAK or TO-252 package leadframe 1580 into its footed equivalent leadframe 1590A. Because of the area savings, a substantially larger package is achievable using the footed package using a 1.6 mm solderable foot length, the maximum die size of the conventional DPAK 1589 is 3.05 mm by 4.98 mm while the footed DPAK 1599A can house a die 4.05 mm×4.98 mm or 133% of the conventional maximum die size. To achieve this magnitude of improvement mechanically bent-leads 1582 are replaced by USMP fabricated feet 1592A, the dimension of plastic body 1581 is increased to form elongated plastic body 1591A, die pad and heat tab 1586 is increased in area to form larger die pad and heat tab 1596A, and mechanically-clipped tie bar 1584 protruding from plastic body 1581, is replaced by laser-trimmed tie bar 1594A cut flush with the vertical edge of plastic body 1591A.

In an alternative embodiment of the design, footed DPAK 1590B, shown in FIG. 50B comprises a modification to feet 1592B where the solderable portion of the foot remains 1.6 mm in length but only 0.25 mm of the foot extends laterally beyond the edge of plastic 1591B. This USMP design principle is further elaborated in the perspective views of FIG. 50D where conventional DPAK includes mechanically bent leads 1582 contacting the PCB for a distance L, in the prior example where L=1.6 mm. In design A of the USMP fabricated DPAK 1599A, feet 1592A extend beyond the vertical edge of plastic 1591 by a full distance of L=1.6 mm, while in design B of the USMP fabricated DPAK 1599B, feet 1592B extend beyond the vertical edge of plastic 1591 only by a length comprising a fraction of the total foot length L, e.g. 0.25 mm to 0.5 mm with remainder of the foot length L remaining under the package and not visible from above.

The benefit of footed DPAK 1599B design B is that plastic body 1591B is extended allowing die pad and heat tab 1596B to be further expanded, increasing the maximum allowable die size to 5.29 mm×4.98 mm, representing a substantial die size increase, i.e. offering the ability to package a die over 173% that of a conventional DPAK using the same PCB board space. Tie bar 1594B can also be laser trimmed flush with the vertical face of plastic 1591B, eliminating the unwanted protrusion of mechanically trimmed tie bar 1584 is conventional DPAK assembly.

A direct comparison of the two USMP footed DPAKs 1599A and 1599B to the conventional DPAK 1589 in FIG. 50C illustrates that in the USMP design, space saved reducing the exterior length ΔY, where $\Delta Y_3 < \Delta Y_2 < \Delta Y_1$ is used to increase area of die pad and tab 1586 to achieve larger area die pad and heat tabs 1596A and 1596B. As shown, the length "L" of the copper lead contacting the PCB, remains constant at L=1.6 mm while ΔY, the protruding length of the lead or the foot, varies from $\Delta Y_3$=2.7 mm for the DPAK to $\Delta Y_2$=1.6 mm and $\Delta Y_2$=0.25 mm for the footed designs. So although and the positions of the PCB landing pads 1587 and 1597 remains fixed, the die pad and maximum die size of the package increases. As another benefit, in footed DPAKs 1599A and 1599B, tie bars 1594A and 1594B can be completely enclosed within plastic body 1591A and plastic body 1591B respectively, while in the conventional DPAK 1589, tie bar 1584 unavoidably protrudes from the package and plastic 1581, increasing the risk of unwanted and potentially dangerous electrical shorts. As further illustrated in FIG. 50C and FIG. 50D, by avoiding mechanical lead bending the height of footed packages 1599A and 1599B can be made significantly thinner, typically 30% to 70% thinner than conventional DPAK 1589, depending on the thickness of the leadframe and the desired amount of heat spreading.

A comparison of the conventional DPAK 1589 to design-A footed DPAK 1599A and design-B footed DPAK 1599B is shown in FIG. 50E. As shown, the USMP-based packages are able to house maximum die sizes 33% and 74% larger than the conventional DPAK. In USMP manufacturing, singulation uses a laser instead of a mechanical tool, and does not require mechanical bending or forming. As such USMP-fabricated DPAKs can be produced in higher-throughput lower-cost matrix leadframes rather on single-package strips, reducing costs and improving manufacturability.

FIG. 51A illustrates the conversion of a SOT23 package leadframe 1600 into its footed equivalent leadframe 1610 where gull-wing leads 1602A, 1602B, and 1602C are replaced by wave-solder compatible feet 1612A, 162B and 1612C, lead extensions 1604 are replaced by cantilever extensions 1614, and the size of die pad 1607 is increased substantially to form new die pad 1617. In the conventional SOT23, isolated die pad 1607 connects to lead 1602C, while the other two leads 1602A and 1602B connect to isolated lead extensions 1604 for bonding. All the leads comprise mechanically bent gull wing leads requiring long lead lengths—in fact lead lengths longer than the die pad is wide. The maximum die size of the conventional SOT23 shown is approximately 0.765 mm by 1.706 mm. In sharp contrast to gull wing SOT23, the footed version shown by matrix leadframe 1610 comprises isolated die pad 1617 connected to foot 1612C, and two feet 1612A and 16B connected to cantilever extended beams 1614. If desired the beams can be further supported by tie bars (not shown).

By eliminating the wasted space consumed by the gull wing leads, the footed package allows the plastic and the isolated die pad 1617 to expand in the direction of the leads, increasing the maximum die size to 1.365 mm×1.706 mm, increasing the maximum die size to 178% that of present day SOT23s. A side-by-side comparison of the conventional SOT-23 1609 and the footed SOT-23 1619 and their corresponding leadframes 1600 and 1610 is shown in FIG. 51B illustrating that the PCB area efficiency of the conventional SOT-23 of only 13% can be improved by the USMP footed package to 24%, and the footed SOT-23 can house a die 78% larger than the conventional SOT-23 package.

In addition to offering the ability to improving transistor package area efficiency, i.e. putting a larger die in the same package, USMP design methods may also be applied to substantially reduce the size of gull wing IC packages. For example in FIG. 52A a TSSOP-8L package 1649 fabricated from leadframe 1640 and comprising dual tie bars 1644, gull wing leads 1642, and isolated die pad 1647, is converted into its footed equivalent package 1659A while preserving the same PCB layout for soldering. As shown, footed package leadframe 1650A comprises feet 1652A, a larger isolated die pad 1657A, and additional tie bars 1654A for greater stability. By designing the foot for the same solder length as the conventional gull wing package, namely 0.6 mm, but eliminating the wasted space devoted for lead bending and forming, the maximum die size of the footed package 1659A increases to 3.8 mm by 2.2 mm, a 49% increase over that of a conventional TSSOP8 maximum die size of 2.8 mm by 2 mm In an alternative embodiment shown in FIG. 52B, the same PCB layout can be used with footed equivalent package 1659B comprising leadframe 1650B, feet 1652B, an even larger isolated die pad 1657B, and tie bars 1654B.

FIG. 52C compares the three packages revealing the conventional TSSOP-8L package's PCB area efficiency of 27% can be improved to 40% or 45% using the USMP made footed package, with corresponding increases in die size of 49% and 69% respectively. In applications such as lithium battery protection where this package has become an industry standard, a 49% increase in die area for the same PCB space allows the protective power MOSFETs either to reduce their on-resistance or power dissipation or to increase their current rating for the same dissipated power. The performance boost is especially beneficial in high-end smart phones with rapid charge capability. The USMP fabricated footed package, also offers an option for either an isolated or exposed die pad providing added flexibility in thermal management.

In FIG. 53A, the ubiquitous SOP8 package 1669, comprising dual tie bars 1664, gull wing leads 1662, and isolated die pad 1666, and fabricated from leadframe 1660, is converted into its footed equivalent package 1679A while preserving the same PCB layout for soldering. As shown, the footed package 1679A, fabricated from leadframe 1670A, comprises feet 1672A, a larger isolated die pad 1676A, and additional tie bars 1674A for greater stability. The isolated die pad 1676A can be replaced with an exposed die pad as required, offering perfect co-planarity because the feet and the die pad are made from the same piece of copper. Similar co-planarity is not possible using conventional SOP8 1669 because mechanical lead bending is intrinsically imprecise. By designing the foot of the footed package 1679A for the same solder length as the conventional gull wing package 1669, namely 0.6 mm, but eliminating the wasted space devoted for lead bending and forming, the footed package's die pad 1676A increases to support a maximum die size of 3.285 mm by 4.102 mm, a 96% increase in die area over the 2.213 mm by 3.102 mm maximum die area of the conventional SOP8 package 1669. The maximum die size is calculated for an isolated die pad useful for ICs or discrete transistors, not limited only for packaging discrete power MOSFETs.

In an alternative embodiment shown in FIG. 53B, footed package 1679B, fabricated from leadframe 1670B, comprises feet 1672B, a larger isolated or alternatively an exposed die pad 1676B, and additional tie bars 1674B for greater stability. The alternate footed package's die pad 1676B increases to support a maximum die size of 3.792 mm by 4.102 mm, a 127% increase in die area over conventional SOP8 1669 This doubling in die area can be used to accommodate larger ICs with added functionality, or to increase the maximum die size of one or more power MOSFETs to lower on-resistance, reduce heating, improve efficiency or expand the current handling capability of a product. A comparison of conventional and USMP footed SOP8 package performance is summarized in the table of FIG. 53C.

The benefit of the USMP footed package technology becomes most pronounced in quad-leaded gull wing packages. As shown in FIG. 54A, industry standard and commercially available LQFP package 1709A fabricated from leadframe 1700A and having a 7 mm by 7 mm body, corner tie bars 1704A, gull wing leads 1702A, and isolated die pad 1706A is converted into its footed equivalent package 1719A while preserving the same PCB layout for soldering. As shown, footed package 1719A, fabricated from leadframe 1710A, comprises feet 1712A, a larger isolated die pad 1716A, and corner tie bars 1714A. The isolated die pad can be replaced with an exposed die pad as required.

By designing the foot for the same solder length as the conventional gull wing package, namely 0.6 mm, eliminating the wasted space devoted for lead bending and forming, and optimizing the leadframe, the footed package's die pad 1716A increases to support a maximum die size of 6.35 mm by 6.35 mm, a die area 318% that of a commercially available LQFP7×7 maximum die size of 3.56 mm by 3.56 mm. The larger die area means substantially higher functionality circuitry can now be integrated into wave-solderable packages. The beneficial tripling of area overstates the improvement achieved by the footed design because conventional leadframe 1700A does not illustrate the maximum possible die size. Considering the maximum possible size die pad for a conventional 7×7 LQFP package 1709B shown in FIG. 54B fabricated from leadframe 1700B, corner tie bars 1704B, gull wing leads 1702B, and isolated die pad 1706B, the size of the die pad (theoretically) increases to accommodate a maximum die size of 4.850 mm by 4.950 mm, nearly double the die size area of commercially available LQFP 1709A.

For the sake of completeness, in an alternative embodiment of the USMP fabricated footed package the maximum die size is also increased. Also shown in FIG. 54B footed package 1719B fabricated from leadframe 1710B and comprising feet 1712B, corner tie bars 1714B, and larger isolated die pad 1716B is able to increase the maximum die size to 6.750 mm by 6.750 mm.

A comparison of the two conventional LQFP packages against their USMP footed package equivalents is summarized in the table of FIG. 54C, where hypothetical gull wing LQFP leadframe 1700B is used as a reference, i.e. for a die area ratio defined as 1.00 and having a PCB area efficiency of 23%. In contrast, a commercially available 7×7 LQFP leadframe has a maximum die size 48% smaller than optimum and a paltry PCB area efficiency of only 18%. In contrast, footed replacements for the LQFP, QFF packages with leadframes 1719A and 1719B are capable of maximum die sizes 65% and 85% larger than the maximum die size for the hypothetical reference LQFP leadframe 1708, and over 200% larger than the maximum die size for the commercially available 7×7 LQFP packages.

In many cases, when a wave-solderable leaded package is required to package a die originally developed for a QFN leadless package, there is no area efficient and cost effective package alternative available. This point is illustrated in the following table, where a 2.65 mm by 2.65 mm semiconductor die designed for a 20-pin QFN needs to be packaged in a wave-solderable package. Considering the maximum die size and the number of pins required for a specific IC, only a few choices exist, many of which are too large or too expensive to meet the design targets of the system.

The potential options are summarized in the following table:

| Package | Maximum Die | Pkg Plastic Size | PCB Area | Cost |
|---|---|---|---|---|
| Conv. QFN44-20 | 2.65 mm × 2.65 mm | 4 mm × 4 mm | 100% | Low |
| QFF-20 (Footed) | 2.65 mm × 2.65 mm | 4.25 mm × 4.25 mm | 113% | Low |
| TSSOP-20 | 4.05 mm × 2.85 mm | 6.5 mm × 6.4 mm | 260% | Med |
| SOP-2 | 2.65 mm × 4.35 mm | 12.7 mm × 7.8 mm | 619% | High |
| LQFP55-32 | 2.3 mm × 2.3 mm | 5 mm × 5 mm | 156% | NA |
| LQFP66 | 3.0 mm × 3.0 mm | 6 mm × 6 mm | 225% | NA |
| LQFP77 | 3.67 mm × 3.67 mm | 7 mm × 7 mm | 306% | High |

While the footed version of the QFN, i.e. the QFF-20, can be used to replace the conventional package at low cost and in essentially the same PCB area, the TSSOP takes triple the area and the SOP requires six times the area. The LQFP55 has acceptable area efficiency except it cannot package a 2.65 mm by 2.65 mm die, so it is eliminated as an option. The LQFP66 is only double the PCB area, but it does not exist in production and it is unlikely any packaging company will pay the high cost to bring up an obsolete package with a limited market. The result is the commercially only available LQFP that fits the die is the 7 mm by 7 mm package, triple the size of what is needed. Any package more than double the size will have too high a cost to support the application.

As a result, the footed package uniquely solves a problem for which there are no real solutions available today, offering comparable performance to leadless packages in a cost-effective manner, yet compatible with low cost wave-solder based PCB assembly.

Interchangeable Fabrication Methods

The parent patent applications of this disclosure describe a variety of processes and elements not employed in conventional package manufacturing today. These include

- Coplanar conductive surfaces on the bottom and within the plastic package formed by etching or stamping a single piece of metal such as copper.
- One, two, or three different thickness conductors within the plastic package
- Vertical columnar conductors connecting conductor elements exposed on the bottom surface of the package to other conductor elements isolated within the plastic package.
- The ability to fully isolate a conductor within the package's plastic body.
- Extensions of metal (feet and tie bars) used to hold the package in place during fabrication and subsequently cut mechanically or by laser to separate (singulate) the package from the leadframe after fabrication.
- The ability to cut metal conductors flush with the sides of the package's plastic body by concurrently cutting both metal and plastic with a saw or sequentially cutting the plastic with a laser and then cutting the lead with a laser, stamp, or saw.
- The ability to cut metal conductors extending from the side planar surfaces of the package's plastic body and to cut exposed metal to any length needed or to produce extending leads (feet, tie-bars) of multiple lengths either using a laser, a saw, or a combination thereof.
- The ability to cut ties-bars flush with the package's plastic body on the same package edge where metal conductors (feet or leads) extend beyond the plastic body's edge.
- Fabricating leadless and footed packages within the same manufacturing line with no change in equipment required other than changing laser program operation.
- Fabricating power packages with thick metal het spreaders without the need to change production equipment.
- Package assembly employing either (or both) wire and clip-lead connections to a die's surface, or to otherwise enable flip chip assembly via conductive pillar bumps.

One unique feature of the USMP process and its subsets, is its unique "coplanar" leadframe and its fabrication method thereof. This process avoids bending or forming able to fabricate elements of differing thicknesses, the elements being intrinsically coplanar to other elements in the same package and throughout a leadframe. These coplanar surfaces include the bottom of the package's feet and the bottom of one or more exposed die pads, and the top of the die pad, the top of tie-bars extended beyond the plastic boundaries of the package, and the top of cantilevers (diving boards) within the plastic package.

The term intrinsically coplanar, means that multiple conductors' surfaces have the same height in the z-dimension, i.e. perpendicular distance from the bottom surface of the package, because they are fabricated from a common piece of metal having at least one surface not etched, stamped, coined, or otherwise mechanically deformed or altered. Intrinsic coplanarity is the packaging equivalent of self-alignment in wafer fabrication, meaning no process needs to be precisely controlled to align one physical feature to another.

The USMP process is therefore able to fabricate a wide range of packages simply by changing its leadframe design with no change needed in the manufacturing equipment. As shown in FIG. 55, USMP coplanar leadframes 1750 may comprise

- a conventional single-thickness fully etched leadframe 1750A used to produce exposed die pad QFN and DFN package types 1751A.
- a single-layer half-etch dual thickness leadframe 1750B used to produce non-exposed (isolated) die pad QFN and DFN package types 1751B.
- a dual-layer half-etch tri-thickness leadframe 1750C used to produced footed packages such as DFF and QFF having either exposed 1751C or isolated die pads (not shown).
- a bonded-metal multi-thickness leadframe 1750E used to produced 2 or 3-layer footed power packages such as DPAK or D2PAK.

The top illustration in FIG. 56A illustrates a (die free) exposed die-pad leadless package 1751A fabricated using the USMP process, comprising coplanar copper leadframe die pad 1760B and conductive feet 1760A and 1760C. A conductive foot that does not extend beyond the edges 1764 of the plastic body 1763 may is also referred to here as a conductive "heel". The heels 1760A and 1760C are isolated from and spaced apart from the die pad 1760B by a gap 1761 filled with plastic. Because all three conductors are exposed o the package's bottom side, the minimum dimension for gap 1761 is determined by PCB layout rules and cannot be reduced to increase the maximum allowable die size of the package.

As shown, the conductive heel 1760A and 1760C are flush with plastic 1763, edge 1764 can be defined by concurrently cutting a block bold with a saw, by sequentially cutting the plastic and copper with a laser, or by using a discrete package mold to define the edge of plastic 1763 and then using a laser to cut the metal heels flush with plastic afterword. In the bottom drawing of FIG. 56A, the exposed die pad 1760B is replaced by isolated die pad 1760D requiring a half etched dual-layer leadframe 1751B. The resulting packages include isolated die pad leadless packages QFN and DFN. Otherwise fabrication is identical to the exposed die pad device.

FIG. 56B illustrates two footed package cross sections, the exposed die pad leadframe 1751C and the isolated die pad leadframe 1751D. In these packages the lateral extent of the plastic body 1763 is determined either by a discrete mold, or by laser cutting of block mold. The lateral extent of exposed conductive metal foot 1765, is however determined by either a saw or by laser cutting along edge 1764. Since these two edges are not aligned, foot 1765 is able to extend laterally beyond the plastic edge 1763 facilitating wave solder PCB assembly and accommodating visual inspection. Z shaped lead comprising cantilever 1766, vertical column 1767, and foot 1765 allows the foot 1765 to be spaced apart from exposed die pad 1760B by a gap 1762 in accordance with PCB assembly requirements, allowing gap 1761 to be reduced accommodating a larger die pad area and a larger die for the same footprint package. Since the processes are identical, one manufacturing line ca therefore producing both footed packages DFF and QFF and leadless packages QFN and DFN with no change in equipment of the USMP production line. Using leadframe 1751D isolated die pad 1760D replaces exposed die pad 1760B to produced and isolated die pad footed package. Otherwise fabrication is identical.

Power packages can also use the same flow, however etching thick metal leadframes is slow. One way to reduce fabrication time and avoid thick metal etching is by employing metal boding of copper to copper. Although several methods are well known, thermocompression bonding is straightforward where two pieces of copper are forced together with high pressure at elevated temperature, and may be ultrasonically excited to improve molecular adhesion. Coplanar bonded copper leadframe construction may involve the thicker metal to be located on the bottom of the package or the top.

In FIG. 57A, a thick piece of copper 1773A of thickness 1 to 3 mm is stamped steel stamp 1770 and elements 1771A and 1771B with a force 1772 to create corresponding deformations 1774A and 1774B in copper 1773A. The resulting stamped copper comprises thick metal portion 1776A (the heat slug), feet 1776C and 1776D, vertical column 1776B and gap 1775. Gap 1775 may be formed using mechanical punching to avoid thick metal etching.

In FIG. 57B, a thinner etched leadframe comprising two thin leadframe pieces 1777A and 1777B is bonded using thermocompression or other methods to the thick metal with force 1781. The resulting structure shown in FIG. 57C includes metal bond 1779 bonding thin leadframe piece 1777A to thick copper 1776A. Similarly, thin leadframe piece 1777B is bolded 1779 to vertical column 1776B to form a cantilever electrically connected to foot 1776D. After molding of plastic body 1780 gaps 1775 and 1778 are filled with insulating plastic also enclosing the die (not shown). The dimension and location of plastic body 1780 may be defined by a discrete mold or may be defined by laser cutting and plastic removal of a block mold. A portion of the combined heat slug comprising thick metal 1776A and 1777A are not covered by plastic body 1780 to accommodate heat convection during use. Stamped metal feet 1776C and 1776D are then cut to a refined length along line 1764 using a saw or laser.

In an alternative embodiment shown in FIG. 58A, thick metal 1785A and 1785B with gap 1786 is bonded 1789 onto thinner bottom leadframe comprising metal 1787A and 1787B with gap 1788 being wider than gap 1786. Metal bonds 1791 electrically and mechanically bond thick leadframe 1785A to thin metal piece 1787A to form the die pad, heat slug, and foot, Thick metal 1785B bonds to thin metal 1787B to define the foot and columnar connection for wire bonding. The length of the feet are defined by edge 1764 either using laser cutting, sawing, or stamping.

In general, the USMP process combines the coplanar leadframe 1750 with either mechanical, or laser processing to produce a variety of packages able to replace conventional leaded packages. As shown in FIG. 59, using discrete package molding 1800, package fabrication may be mechanical involving deflash 1801A, lead cutting 1802A involving sawing or punching, and tie bar cutting 1803A. Alternatively package fabrication may comprise laser processing involving deflash 1801B, lead cutting 1802B, and tie bar cutting 1803B. Unlike mechanical processes, lasers avoid subjecting a package to mechanical stress during processing and reduce the risk of package cracking and delamination. Combinations of laser and mechanical steps are also possible.

In discrete package molding 1800, the mold shown in the upper cross section of FIG. 61 comprises multiple mold cavities 1811, one per package as defined by upper and lower steel mold tool chaises 1810A and 1810B. Plastic is transferred through small apertures called "sprues' into the mold cavities to form each individual packages. As such, the dimensions of a package are set by the mold and cannot be changed. In block molding shown in the lower drawing, a large area mold cavity 1812 is used to mold multiple packages together. The plastic has to be removed in subsequent steps either mechanically using a saw or a punch, or using lasers.

The process flow for producing footed and leadless packages using coplanar leadframes 1760 and block mold 1805 is shown in FIG. 60 where mechanical singulation using sawing 1806A and punching 1806B can only be used to make leadless packages like QFN and DFN because the metal and the plastic are cut the same time flush with the plastic body. Using laser plastic removal 1807 followed by laser lead cutting 1808 and laser tie bar cutting 1809, however, footed packages such as the QFF and DFF can be fabricated. The same laser process can also be used to produce leadless QFN and DFN packages simply by aligning the plastic and metal cutting lasers during processing.

The laser is also good for removing excess plastic such as the flash 1816 shown is package 1815 shown in FIG. 62. For example, removing plastic 1820A and 1820B in FIG. 63A and also in FIG. 63B. As shown in FIG. 63C this feature is made possible because carbon black 1822 absorbs infrared light but does not absorb UV wavelengths 1823.

The use of the laser also enables tie bar trimming separate from lead cutting and plastic removal. FIG. 64 illustrates the leadframe 2049A after die attach and wire bonding processes. Sequentially, a semiconductor die 2044 is first attached to die pad 2043A using solder or epoxy. The epoxy may be electrically conductive, using metal filling in the epoxy glue, or can be electrically insulating, as required. Wire bonding is then performed to form bond wires 2045B and 2045C between metal bond-pads located on the surface of semiconductor die 2044 and cantilever segments of leads 2043B and 2043C. The bond wires 2045B and 2045C may comprise gold, copper, aluminum or other metal alloys. Other leads, not visible in FIG. 64, may similarly be connected through corresponding bond wires to other leads. Die pad 2043A and leads 2043B and 2043C, along with other leads (not shown in FIG. 64), are held together during die attach and wire bonding operations in leadframe 2043, which comprises many similar die pads and leads that were fabricated contemporaneously with die pad 2043A and leads 2043B and 2043C.

Figure 5:
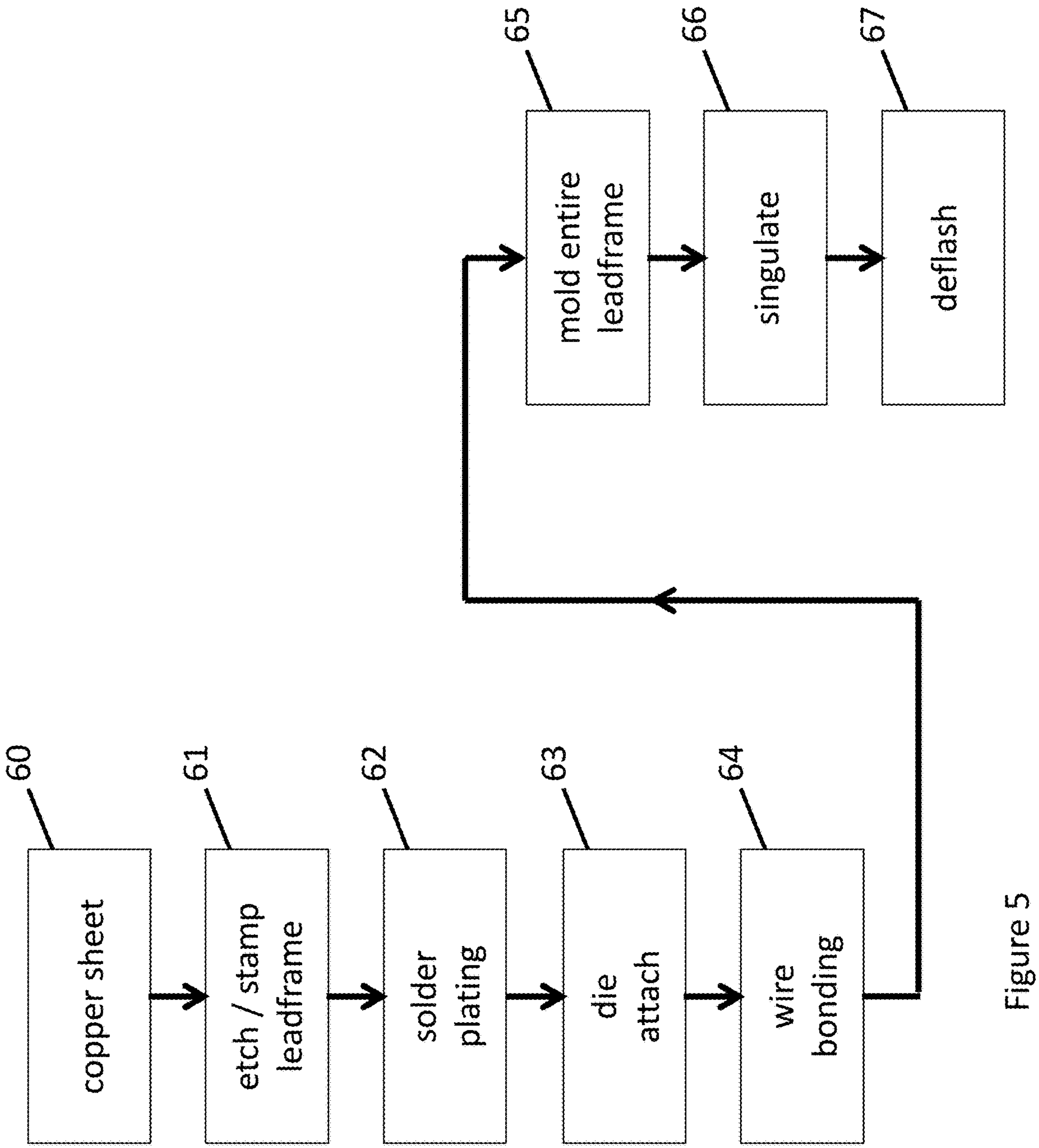
FIG. 5 is a flow chart for leadless surface mount package fabrication.
Figure 6A:
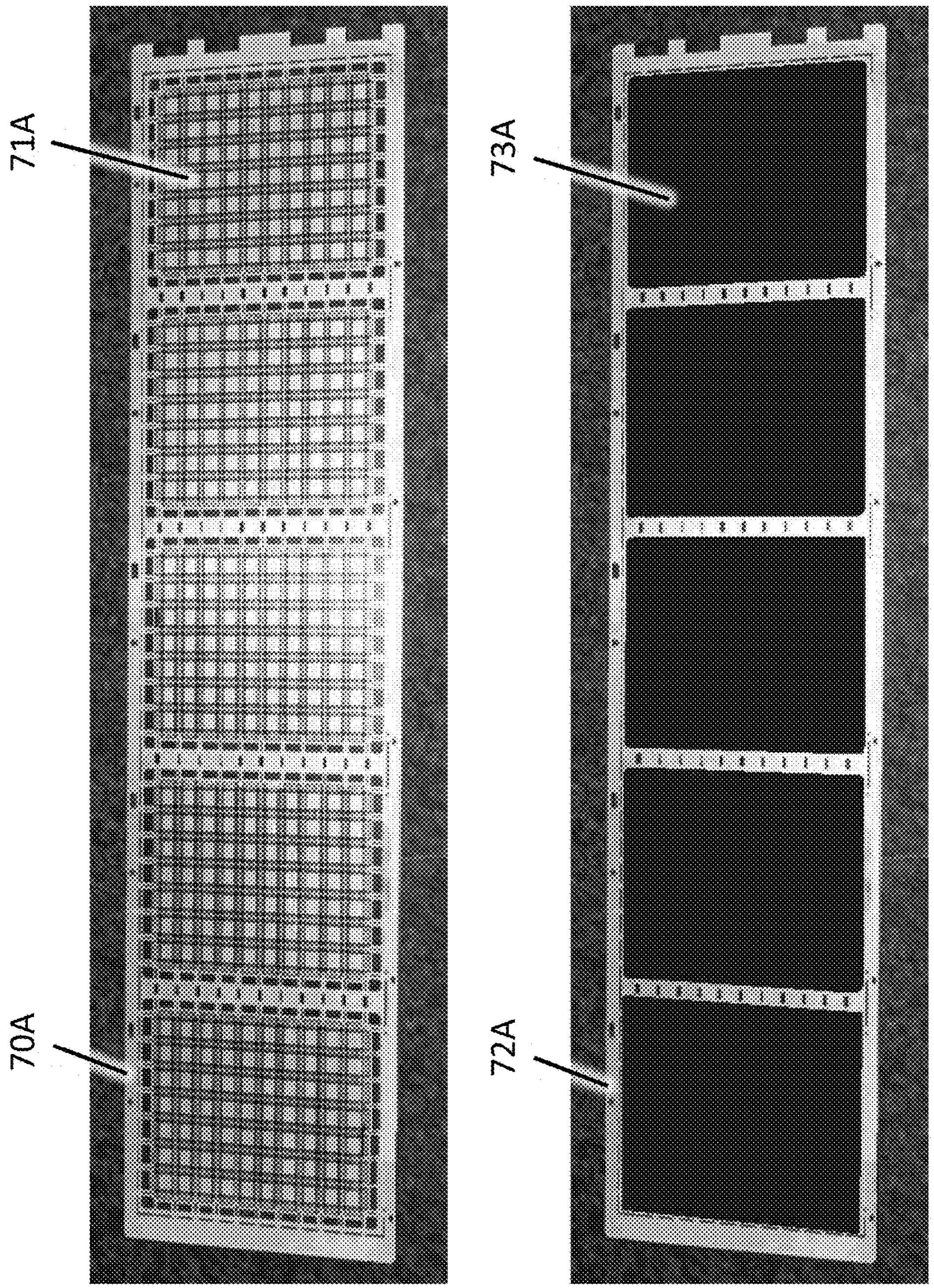
FIG. 6A comprises a topside view of leadless surface mount leadframe and package before and after molding.
Figure 6B:
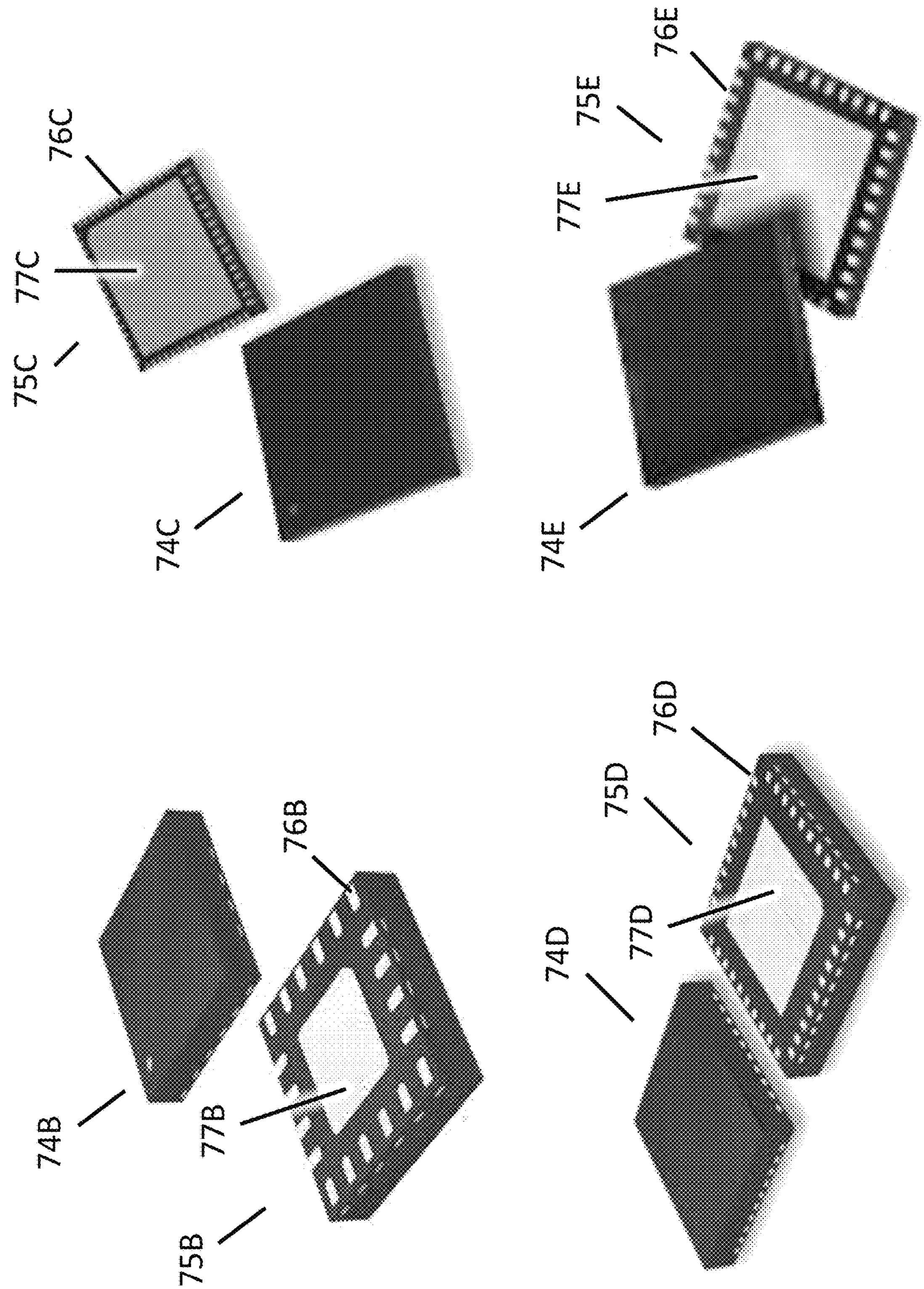
FIG. 6B comprises various topside and underside views of QFN four-sided leadless surface mount packages.
Figure 6C:
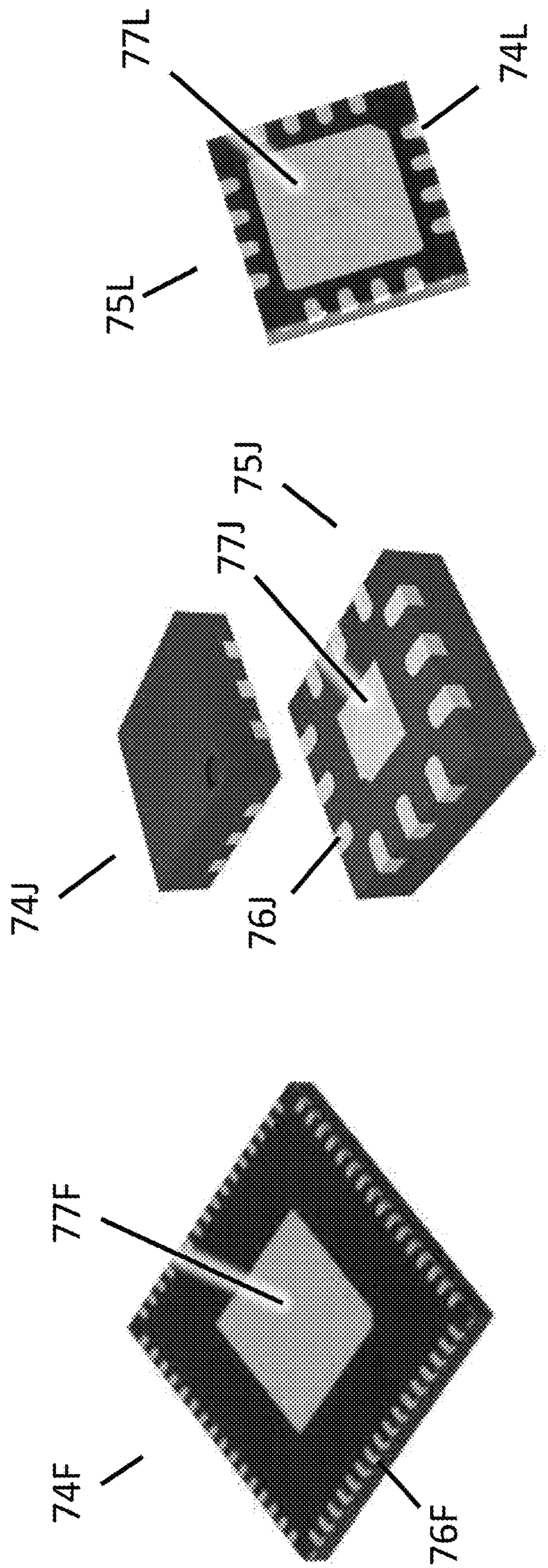
FIG. 6C comprises various alternate topside and underside views of QFN four-sided leadless surface mount packages.
Figure 6D:
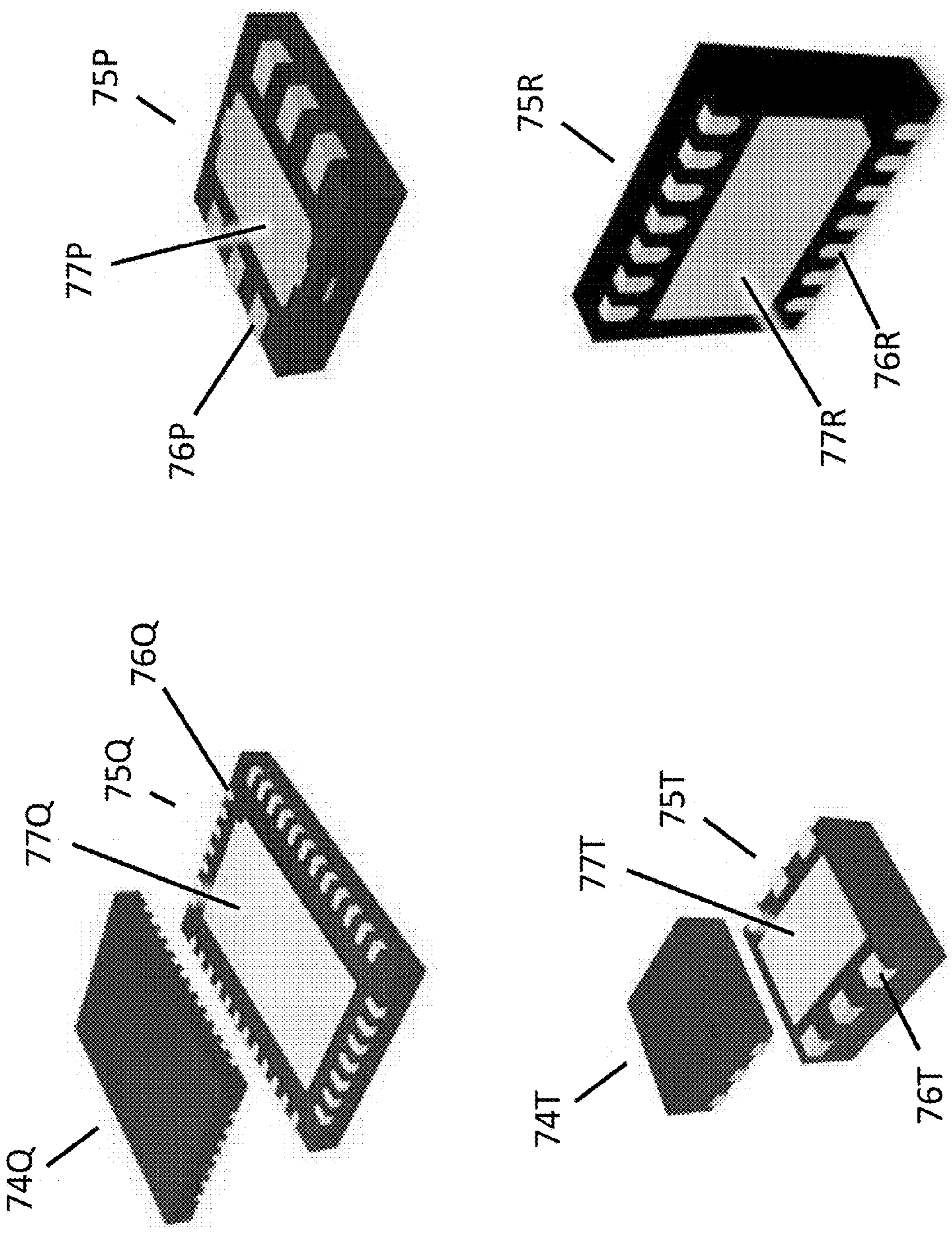
FIG. 6D comprises various alternate topside and underside views of elongated leadless surface mount packages.
Figure 6E:
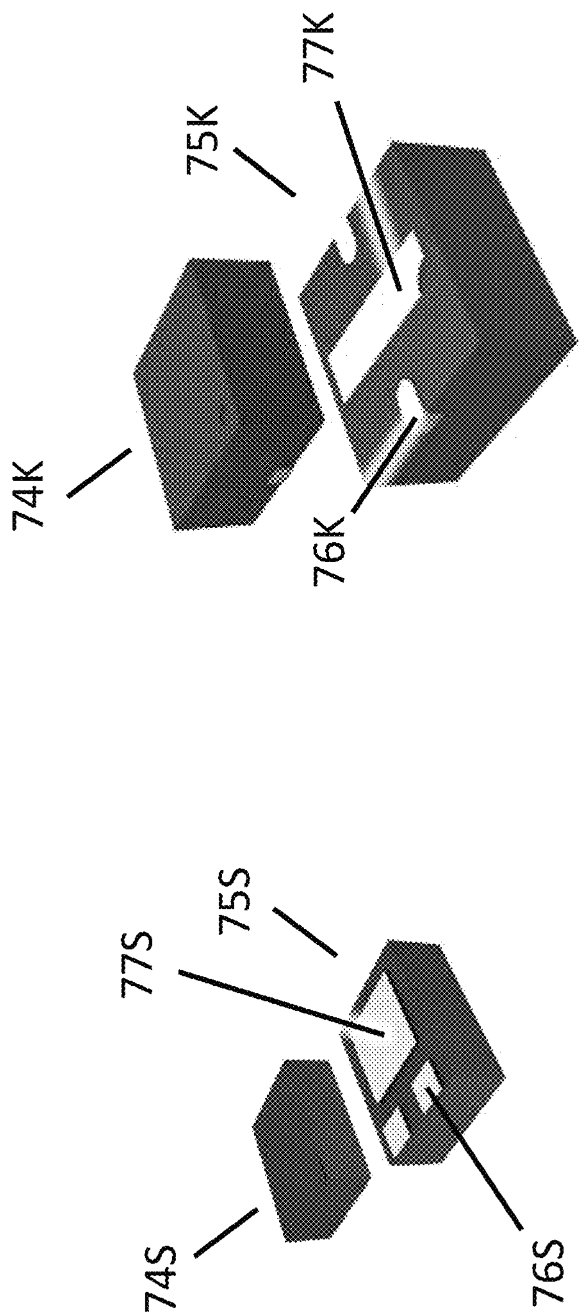
FIG. 6E comprises various alternate topside and underside views of low pin count leadless surface mount packages.
Figure 6F:
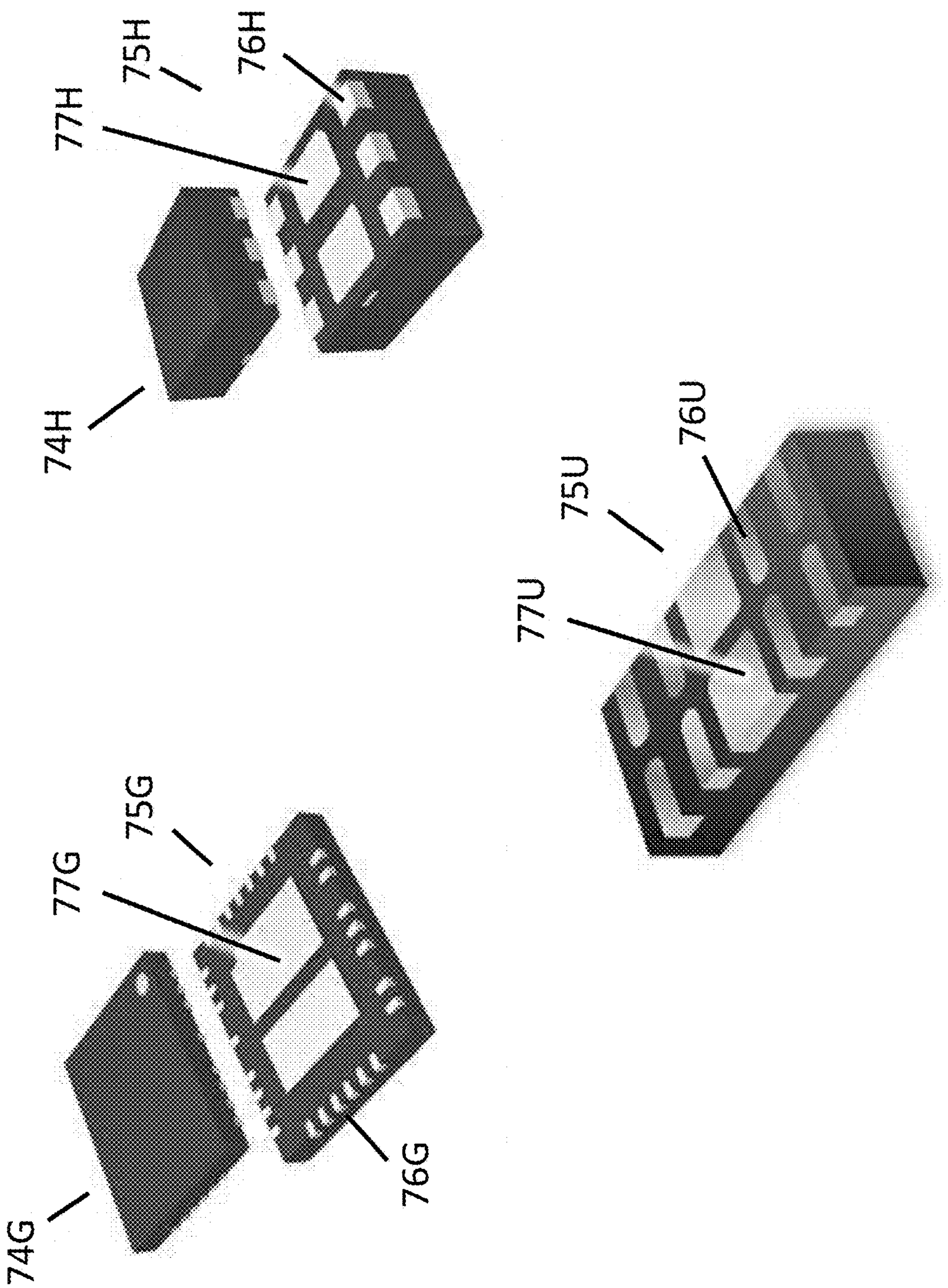
FIG. 6F comprises various alternate topside and underside views of leadless surface mount packages with multiple exposed die pads.
Figure 6G:
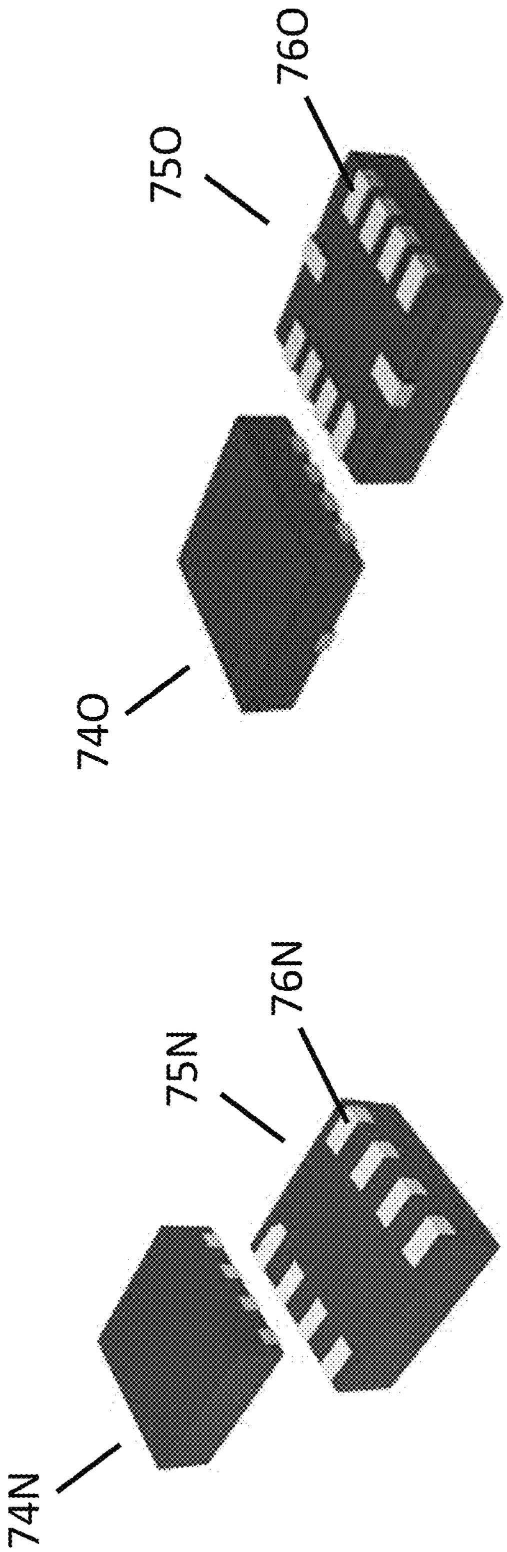
FIG. 6G comprises various alternate topside and underside views of DFN dual sided leadless surface mount packages.
Figure 6H:
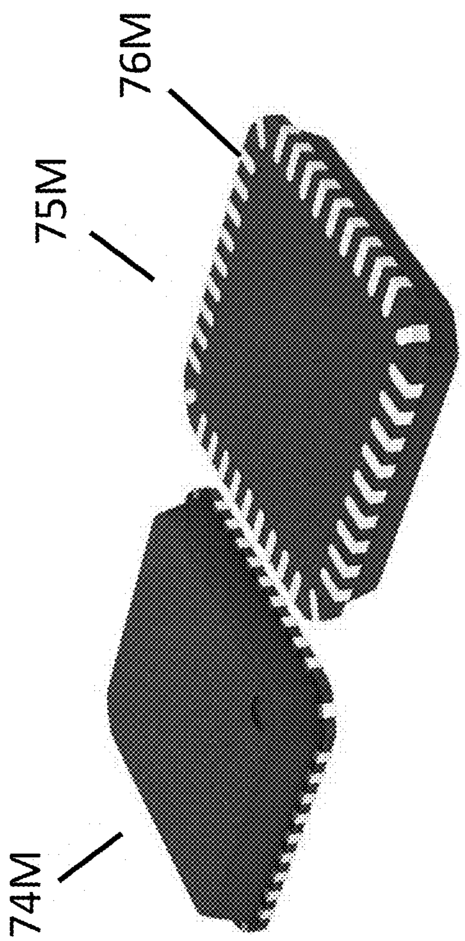
FIG. 6H is a topside and underside view of a leadless surface mount package using a dedicated QFN mold cavity tool.

Leadframe 2049 is next molded with plastic using plastic injection molding or mold transfer processes well known to those skilled in the art, forming a plastic body 2042 shown in FIG. 5F. Except for the small ledge 2052, plastic body 2042 covers the die pad 2043A and the elevated horizontal portions of leads 2043B and 2043C, i.e. the portions not touching horizontal line 46, filling in both above and below the leadframe 2049 to encapsulate die 2044. The ledge 2052 comprising a slight protrusion of leads 2043B and 2043C beyond plastic body 2042 occurs because the plastic body 2042 must be mechanically aligned to the leadframe 2049. Because any mechanical process must accommodate some tolerance for misalignment, the lateral sides of plastic body 2042 are slightly stepped back from the outside edges of the vertical column segments of leads 2043B and 2043C. The ledges 2052 are small, however, e.g. 0.1 mm in length, and therefore have a minimal impact on the size of the package's footprint. In a preferred embodiment, plastic body 2042 does not overlap onto the thin regions 2068.

Because the mold defining the location of the edge of plastic body 2042 is mechanically aligned to leadframe 2049, some tolerance for misalignment resulting from natural statistical variation in manufacturing must be included in the design of the lateral dimension of ledge 2052. To avoid the case where the plastic body 2042 overlaps onto thin regions 68 and in other cases forms a ledge 2052, the design length of the ledges 2052 should be sufficient to accommodate variations in the dimensions of the leadframe 2049 (whether formed by etching or stamping) and to accommodate variations in the mold-to-leadframe alignment. This design length (tolerance) depends on the processing equipment and its maintenance and may vary from 0.01 mm to 0.2 mm (preferably less than 0.1 mm).

In an alternative embodiment, plastic body 2042 extends beyond the vertical outside edges of leads 2043B and 2043C, such that die 2044 and leads 2043B and 2043C are sealed entirely within plastic body 2042 and plastic body 2042 overlaps slightly onto thin regions 2068. But since this method consumes a larger dimension for the same die width, the maximum size of die 2044 is adversely impacted compared to the embodiment shown in FIG. 64. If plastic body 2042 is to consistently overlap onto the thin portion 68 of leadframe 49, the design dimension of that overlap must be sufficient to account for dimensional variations in leadframe 2049 from etching or stamping and variations in the mold-to-leadframe alignment.

FIG. 65 illustrates a plan view of a leadframe 2079 for an 8-lead DFF footed package made in accordance with this invention prior to die attach and wire bonding. The leadframe 2079 comprises vertical and lateral bus bars 2070 and 2071 to provide mechanical rigidity to the structure supporting a multiplicity of identical packages arranged in an array of rows and columns. In this illustration, variations in the thickness of leadframe 2079 from etching or stamping are not shown except where openings have been formed in leadframe 79 in prior steps.

In FIG. 65, a dashed line indicates a unit cell 2073 defining one DFF package. Unit cell 73 is repeated multiple times within leadframe 2079 to produce multiple packages simultaneously. Within unit cell 2073, the DFF package includes die pad 2043A, leads 2043B through 2043I, and tie bars 2072. For clarity's sake, the location of the semiconductor die and its bond wires has been omitted. Plastic body 2042 is shown in dashed lines.

Plastic body 2042 intersects and laterally overlaps only a portion of leads 2043B through 2043H. Saw blade cut lines 2051Y intersect leads 2043B through 2043I but do not intersect plastic body 4202, thereby defining the length of the feet of leads 2043B through 2043I protruding beyond plastic body 2042. During singulation, saw cut 2051Y permanently separates leads 2043B through 2043H from metal bus bar 2070.

Plastic body 2042 entirely laterally encloses die pad 2043A and tie bars 2072. Thus, plastic body 2042 forms a continuous vertical stripe overlapping all of the die pads in one row along the length of the leadframe. During singulation, saw cut lines 2051X transect plastic body 2042 and tie bars 2072, separating die pad 2043A from bus bars 2071 and completely removing the package within unit cell 2073 from the other packages formed on leadframe 2079. Since saw cut 2051X cuts through both plastic body 2042 and metal tie bars 2072, the ends of tie bars 2072 after singulation are vertically flush with the lateral extent of plastic body 2042.

Adding detail to the prior figure, FIG. 66 illustrates both a plan view and a correlated cross-sectional view of the aforementioned DFF package through a section parallel to the x-direction. The cross-section shown is taken through the center of leads 2043B and 2043C, illustrating die 2044, bond wires 2043B and 2043C, die pad 2043A, leads 2043B and 2043C, package feet 2053B and 2053C and plastic body 42.

As shown, semiconductor die 2044 having a lateral edge (collinear with dashed line 2086) is positioned atop and laterally disposed within an edge of die pad 2043A (collinear with dashed line 2085). The underlap of die pad 2043A beyond die 2044, i.e. the distance between dashed lines 2086 and 2085, is beneficial to insure reliable and reproducible electrical and thermal contact between the die and the die pad. To insure that die 2044 never extends beyond the edge of die pad 2043A, the overlap needs to accommodate stochastic dimensional variations in die pad 43 as well as misalignment of die 2044 to the leadframe 2079 and die pad 2043A. The underlap of die pad 2043A beyond die 2044 may range from tens to hundreds of microns, but in preferred embodiment should not exceed 100 microns or be lower than 20 microns. While it is possible to for the underlap to be very small or even zero, it is not advisable since any overhang of die 2044 beyond the edge of die pad 2043A can subject the die 2044 to stress, cracking, and reliability failures.

The gap between the edge of die pad 2043A and the inner edges of leads 2043B through 2043I, i.e. the space between dashed line 2085 and dashed line 2084, is determined in the manufacturing of leadframe 2049, and may differ for etched and stamped leadframes. A gap of 100 microns can be manufactured with low risk of electrical shorts between die pad 2043A and leads 2043B through 2043I.

As shown in the cross-sectional view of FIG. 66, each of leads 2043B through 2043I is in the shape of a "Z," with a thin horizontal elevated region of the same thickness and at the same height as die pad 2043A, a thin horizontal "foot" coplanar with the bottom of the package and plane 2046, and a vertical column segment connecting the two horizontal regions. The vertical column segment located between dashed lines 2082 and 2081 intersects and is partially embedded in plastic body 2042, having an inside edge covered and enclosed by plastic body 2042 and having an exposed outer edge.

The minimum length of the leads within plastic body 2042, i.e. the length of leads 2043B through 2043I measured from dashed line 2084 to dashed line 2083, must be sufficient to accommodate the balls by which bond wires 2045B through 2045I are mounted to leads 2043B through 2043I, while ensuring these balls are contained entirely within plastic body 2042.

Dashed line 2082 defines the transition from the thin cantilever segment (diving board) of leads 2043B through 2043I, to a thicker vertical column segment having a vertical length equal to the original thickness of metal piece 2043, as shown in FIG. 56. In a preferred embodiment this edge defined by dashed line 2082 is laterally contained within plastic body 2042, with sufficient overlap to insure that stochastic variations in the dimensions of the leadframe 2049 and in the alignment of leadframe 2049 to plastic body 2042 do not occasionally allow the vertical column segments of any of leads 2043B through 2043I to be completely uncovered. Minimum overlap dimensions range from 100 microns to 20 microns.

Similarly, dashed line 2081 defines outer edges of the vertical column segments of leads 2043B through 2043 I and the transition of leads 2043B through 2043I from a vertical column segment to a thin horizontal foot region coplanar with the bottom of the package, i.e. the portion of leads 2043B through 2043I comprising feet 2053B through 2053I lying on plane 2046. In a preferred embodiment these outer edges coincident with dashed line 2081 are located outside the edge of plastic body 2042 with sufficient space for ledge 2052 to insure that stochastic variations in the dimensions of the leadframe 49 and in the alignment of leadframe 2049 to plastic body 2042 do not occasionally completely cover the outer edges of the vertical column segments of any of the leads 43B through 2043I. Minimum dimensions of ledge 2052 range from 100 microns to 20 microns.

The lateral length of feet 2053B through 2053I extending beyond plastic body 2042 is defined by saw blade cut 51Y, having minimum lengths of 100 microns to 20 microns.

FIG. 67 illustrates both a plan view and a correlated cross-sectional view of the aforementioned DFF package through a section parallel to the y-direction. The cross-section shown is taken through the center of tie bars 2072, illustrating die 2044, die pad 2043A, tie bars 2072, and plastic body 2042. The plan view additionally illustrates bond wires 2045B through 2045I, leads 2043B through 2043I and plastic body 2042. As shown, die 2044 has edges collinear with dashed line 86 and contained laterally within die pad 2043A and plastic body 2042. Saw blade cut lines 2051X transect tie bars 2072 and plastic body 2042, making the ends of tie bars 2072 flush with the lateral edges of plastic body 2042 at the ends of the DFF package, i.e. on the package edges where leads 2043B through 2043I are not located. FIG. 68 illustrates the tie bar cutting. Tie bar extends beyond plastic 2042 and is cut flush along line 2051X, as shown by example in the package 2041 in FIG. 69.

FIG. 70 and FIG. 71 illustrates a bond wire version of a DPAK package described in parent patent application entitled a low-profile power package. FIG. 72 illustrates how bond wires can be replaced by clip lead 2090. The problem is positioning the clip lead varies from die to die if each clip lead is assembled one-by-one using pick and place methods.

An improvement to this procedure involves the inventive feature of a clip-lead leadframe as shown in FIG. 74A. In such a case the clip lead involving area 1902A and lead extension 1902A are repeated multiple times and help in place by tie bars 1901 and attached to a rail 1901. The clip-lead leadframe is then aligned to package leadframe 1590B and all the die are soldered at one time. Since the clip lead leadframe is aligned to the package leadframe, then every clip lead will be precisely aligned to the package with no package to package variation. After molding and lead cutting, the clip lead tie bars 1900 are removed by laser, cut flush to the package plastic 2072 as shown in FIG. 73. Only the portion of tie-bar 1900 covered by plastic 2072 remains. The resulting package 1599B is shown for a D2PAK in FIG. 74C where only a portion of the tie bar 1901 is exposed on the side of the package. The concept can be extended to an entire matrix leadframe of clip leads as shown in FIG. 74B.

We claim:

1. A method of fabricating a leadframe for a semiconductor package from a metal sheet and a semiconductor package from said leadframe, the method comprising:

applying a first mask layer to a backside of the metal sheet, the first mask layer having first and second openings, the backside of the metal sheet being exposed in the first and second openings;

applying a second mask layer to a front side of the metal sheet, the second mask layer having third and fourth openings, the front side of the metal sheet being exposed in the third and fourth openings, at least a portion of the second opening being positioned directly opposite at least a portion of the fourth opening;

etching the metal sheet through the first opening in the first mask layer so as to form a cantilever segment, a thickness of said cantilever segment being less than a thickness of said metal sheet, a top of the cantilever segment being coplanar with the front side of the metal sheet;

etching the metal sheet through the third opening in the second mask layer so as to form a foot, a thickness of said foot being less than the thickness of said metal sheet, a bottom of the foot being coplanar with the backside of the metal sheet;

etching the metal sheet through the second opening in the first mask layer and etching the metal sheet through the fourth opening in the second mask layer so as to form an opening in the metal sheet;

wherein said etching processes leave a section of the metal sheet completely unetched, said completely unetched section lying between said first and second mask layers.

2. The method of claim 1 comprising performing said etching the metal sheet through the first opening in the first mask layer and said etching the metal sheet through the third opening in the second mask layer simultaneously.

3. The method of claim 1 comprising performing said etching the metal sheet through the first opening in the first mask layer and said etching the metal sheet through the third opening in the second mask layer such that said thickness of said cantilever section is greater than said thickness of said foot.

4. The method of claim 3 comprising performing said etching the metal sheet through the first opening in the first mask layer such that said thickness of said cantilever section is greater than one-half of said thickness of said metal sheet.

5. The method of claim 1 comprising performing said etching the metal sheet through the first opening in the first mask layer and said etching the metal sheet through the third opening in the second mask layer such that said thickness of said foot is greater than said thickness of said cantilever section.

6. The method of claim 5 comprising performing said etching the metal sheet through the third opening in the second mask layer such that said thickness of said foot is greater than one-half of said thickness of said metal sheet.

7. The method of claim 1 wherein said etching of the metal sheet leaves a die pad remaining under the second mask layer, the method further comprising:

attaching a semiconductor die to said die pad;

connecting a bonding wire between said semiconductor die and a lead, wherein a tie bar portion of said metal sheet holds said die pad in place while said semiconductor die is attached to said die pad and while said bonding wire is connected between said semiconductor die and said lead.

8. The method of claim 7 wherein the tie bar portion of said metal sheet comprises a foot of a lead.

9. The method of claim 7 comprising etching said metal sheet through a fifth opening in said first mask layer to form an isolated die pad.

10. The method of claim 9 wherein the tie bar portion of said metal sheet comprises a cantilever segment of a lead.

11. The method of claim 9 wherein the tie bar portion of said metal sheet comprises a tie bar that is neither a foot of a lead nor a cantilever segment of a lead.

12. The method of claim 7 wherein the die pad is an exposed die pad extending from said first surface to said second surface of said metal sheet.

13. The method of claim 12 wherein said foot extends laterally from said die pad.

14. The method of claim 13 comprising etching the front side of said metal sheet to form plurality of feet, each of said feet extending from a different side of said die pad.

15. The method of claim 14 where at least one of said feet extends from a side of said die pad where no leads are located.

16. The method of claim 14 where at least one of said feet extends from a side of said die pad where at least one lead is located.

17. The method of claim 13 wherein said tie bar portion of said metal sheet comprises said foot.

18. The method of claim 7 wherein said cantilever segment extends laterally from said die pad.

19. The method of claim 18 wherein said tie bar portion of said metal sheet comprises said cantilever segment.

20. The method of claim 19 wherein said unetched section of said metal sheet comprises a vertical column segment physically connected to said cantilever segment.

* * * * *